US012787634B2

(12) United States Patent
Li et al.

(10) Patent No.: US 12,787,634 B2
(45) Date of Patent: Nov. 3, 2026

(54) ORGANIC ELECTROLUMINESCENT MATERIAL AND DEVICE THEREOF

(71) Applicant: BEIJING SUMMER SPROUT TECHNOLOGY CO., LTD., Beijing (CN)

(72) Inventors: Hongbo Li, Beijing (CN); Ming Sang, Beijing (CN); Wei Cai, Beijing (CN); Zhen Wang, Beijing (CN); Chi Yuen Raymond Kwong, Beijing (CN); Chuanjun Xia, Beijing (CN)

(73) Assignee: Beijing Summer Sprout Technology Co., Ltd., Beijing (CN)

( * ) Notice: Subject to any disclaimer, the term of this patent is extended or adjusted under 35 U.S.C. 154(b) by 1204 days.

(21) Appl. No.: 17/660,058

(22) Filed: Apr. 21, 2022

(65) Prior Publication Data

US 2022/0393115 A1 Dec. 8, 2022

(30) Foreign Application Priority Data

Apr. 23, 2021 (CN) ........................ 202110442576.3

(51) Int. Cl.
*H01L 51/00* (2006.01)
*C07F 15/00* (2006.01)
(Continued)

(52) U.S. Cl.
CPC ....... *H10K 85/342* (2023.02); *C07F 15/0033* (2013.01); *C09K 11/06* (2013.01);
(Continued)

(58) Field of Classification Search
None
See application file for complete search history.

(56) References Cited

U.S. PATENT DOCUMENTS 5,703,436 A 12/1997 Forrest et al.
5,707,745 A 1/1998 Forrest et al.
(Continued)

FOREIGN PATENT DOCUMENTS

CN 111793093 A 10/2020
CN 112390826 A 2/2021
(Continued)

OTHER PUBLICATIONS

Chinese Search Report issued in CN Application No. 202110442576.3 on Apr. 23, 2021.
(Continued)

*Primary Examiner* — Tae H Yoon
(74) *Attorney, Agent, or Firm* — KDW Firm PLLC

(57) ABSTRACT

Provided are an organic electroluminescent material and a device thereof. The organic electroluminescent material is a metal complex comprising a ligand $L_a$ having a structure of Formula 1. The metal complex may be used as a light-emitting material in an electroluminescent device. These novel compounds may be applied to electroluminescent devices and can exhibit better performance, achieve higher device efficiency, and significantly improve the overall performance of the devices. Further provided are an electroluminescent device comprising the metal complex and a compound combination comprising the metal complex.

37 Claims, 1 Drawing Sheet

(51) Int. Cl.

| | |
|---|---|
| ***C09K 11/06*** | (2006.01) |
| ***H10K 85/30*** | (2023.01) |
| *H10K 50/11* | (2023.01) |
| *H10K 101/00* | (2023.01) |
| *H10K 101/30* | (2023.01) |

(52) U.S. Cl.

CPC .. *C07B 2200/05* (2013.01); *C09K 2211/1029* (2013.01); *C09K 2211/1033* (2013.01); *C09K 2211/185* (2013.01); *H10K 50/11* (2023.02); *H10K 2101/30* (2023.02); *H10K 2101/90* (2023.02)

(56) References Cited

U.S. PATENT DOCUMENTS

| | | | | |
|---|---|---|---|---|
| 5,844,363 | A | 12/1998 | Gu et al. | |
| 6,097,147 | A | 8/2000 | Baldo et al. | |
| 6,303,238 | B1 | 10/2001 | Thompson et al. | |
| 7,279,704 | B2 | 10/2007 | Walters et al. | |
| 7,968,146 | B2 | 6/2011 | Wagner et al. | |
| 2003/0230980 | A1 | 12/2003 | Forrest et al. | |
| 2004/0174116 | A1 | 9/2004 | Lu et al. | |
| 2013/0119354 | A1 | 5/2013 | Ma et al. | |
| 2015/0349273 | A1 | 12/2015 | Hung et al. | |
| 2016/0359122 | A1 | 12/2016 | Boudreault et al. | |
| 2018/0254417 | A1 | 9/2018 | Ma et al. | |
| 2020/0091442 | A1 | 3/2020 | Cai et al. | |
| 2020/0251666 | A1 | 8/2020 | Cai et al. | |
| 2020/0287144 | A1 | 9/2020 | Hwang et al. | |
| 2021/0047353 | A1 * | 2/2021 | Ma ...................... | H10K 85/6576 |
| 2021/0054010 | A1 | 2/2021 | Tsai et al. | |
| 2021/0403496 | A1 | 12/2021 | Cai et al. | |
| 2022/0002329 | A1 | 1/2022 | Cai et al. | |
| 2022/0162244 | A1 | 5/2022 | Sang et al. | |
| 2022/0165968 | A1 | 5/2022 | Sang et al. | |
| 2022/0384741 | A1 | 12/2022 | Cai et al. | |
| 2022/0393115 | A1 * | 12/2022 | Li ........................... | C09K 11/06 |

FOREIGN PATENT DOCUMENTS

| | | | | |
|---|---|---|---|---|
| CN | 114907412 | A | | 8/2022 |
| CN | 114907413 | A | | 8/2022 |
| CN | 115215906 | A | | 10/2022 |
| JP | 2020-143055 | A | * | 9/2020 |

OTHER PUBLICATIONS

First Office Action issued in CN Application No. 202110442576.3 on Feb. 23, 2024.

Second Office Action issued in CN Application No. 202110442576.3 on Sep. 24, 2024.

Tang et al., "Organic electroluminescent diodes," Appl. Phys. Lett. vol. 51, No. 12, pp. 913-915, 1987.

Uoyama et al., "Highly efficient organic light-emitting diodes from delayed fluorescence," Nature, vol. 492, pp. 234-240, 2012.

* cited by examiner

ORGANIC ELECTROLUMINESCENT MATERIAL AND DEVICE THEREOF

CROSS-REFERENCE TO RELATED APPLICATION(S)

This present disclosure claims priority to Chinese Patent Application No. CN 202110442576.3 filed on Apr. 23, 2021, the disclosure of which is incorporated herein by reference in its entirety.

TECHNICAL FIELD

The present disclosure relates to compounds for organic electronic devices such as organic light-emitting devices. More particularly, the present disclosure relates to a metal complex including a ligand $L_a$ having a structure of Formula 1 and an electroluminescent device and compound combination including the metal complex.

BACKGROUND

Organic electronic devices include, but are not limited to, the following types: organic light-emitting diodes (OLEDs), organic field-effect transistors (O-FETs), organic light-emitting transistors (OLETs), organic photovoltaic devices (OPVs), dye-sensitized solar cells (DSSCs), organic optical detectors, organic photoreceptors, organic field-quench devices (OFQDs), light-emitting electrochemical cells (LECs), organic laser diodes and organic plasmon emitting devices.

In 1987, Tang and Van Slyke of Eastman Kodak reported a bilayer organic electroluminescent device, which includes an arylamine hole transporting layer and a tris-8-hydroxy-quinolato-aluminum layer as the electron and emitting layer (Applied Physics Letters, 1987, 51 (12): 913-915). Once a bias is applied to the device, green light was emitted from the device. This device laid the foundation for the development of modern organic light-emitting diodes (OLEDs). State-of-the-art OLEDs may include multiple layers such as charge injection and transporting layers, charge and exciton blocking layers, and one or multiple emissive layers between the cathode and anode. Since the OLED is a self-emitting solid state device, it offers tremendous potential for display and lighting applications. In addition, the inherent properties of organic materials, such as their flexibility, may make them well suited for particular applications such as fabrication on flexible substrates.

The OLED can be categorized as three different types according to its emitting mechanism. The OLED invented by Tang and van Slyke is a fluorescent OLED. It only utilizes singlet emission. The triplets generated in the device are wasted through nonradiative decay channels. Therefore, the internal quantum efficiency (IQE) of the fluorescent OLED is only 25%. This limitation hindered the commercialization of OLED. In 1997, Forrest and Thompson reported phosphorescent OLED, which uses triplet emission from heavy metal containing complexes as the emitter. As a result, both singlet and triplets can be harvested, achieving 100% IQE. The discovery and development of phosphorescent OLED contributed directly to the commercialization of active-matrix OLED (AMOLED) due to its high efficiency. Recently, Adachi achieved high efficiency through thermally activated delayed fluorescence (TADF) of organic compounds. These emitters have small singlet-triplet gap that makes the transition from triplet back to singlet possible. In the TADF device, the triplet excitons can go through reverse intersystem crossing to generate singlet excitons, resulting in high IQE.

OLEDs can also be classified as small molecule and polymer OLEDs according to the forms of the materials used. A small molecule refers to any organic or organometallic material that is not a polymer. The molecular weight of the small molecule can be large as long as it has well defined structure. Dendrimers with well-defined structures are considered as small molecules. Polymer OLEDs include conjugated polymers and non-conjugated polymers with pendant emitting groups. Small molecule OLED can become the polymer OLED if post polymerization occurred during the fabrication process.

There are various methods for OLED fabrication. Small molecule OLEDs are generally fabricated by vacuum thermal evaporation. Polymer OLEDs are fabricated by solution process such as spin-coating, inkjet printing, and slit printing. If the material can be dissolved or dispersed in a solvent, the small molecule OLED can also be produced by solution process.

The emitting color of the OLED can be achieved by emitter structural design. An OLED may include one emitting layer or a plurality of emitting layers to achieve desired spectrum. In the case of green, yellow, and red OLEDs, phosphorescent emitters have successfully reached commercialization. Blue phosphorescent device still suffers from non-saturated blue color, short device lifetime, and high operating voltage. Commercial full-color OLED displays normally adopt a hybrid strategy, using fluorescent blue and phosphorescent yellow, or red and green. At present, efficiency roll-off of phosphorescent OLEDs at high brightness remains a problem. In addition, it is desirable to have more saturated emitting color, higher efficiency, and longer device lifetime.

US20200287144A1 discloses a metal complex including ligands having the following structures:

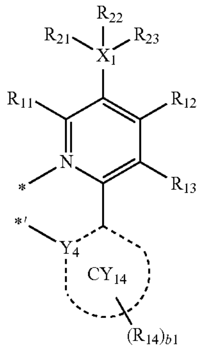

and

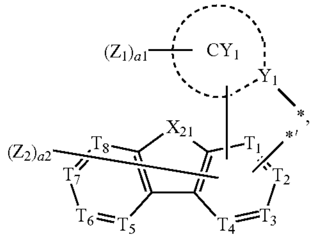

wherein $X_1$ is selected from Si or Ge. An iridium complex is further disclosed, which has a structure represented by the following general formula:

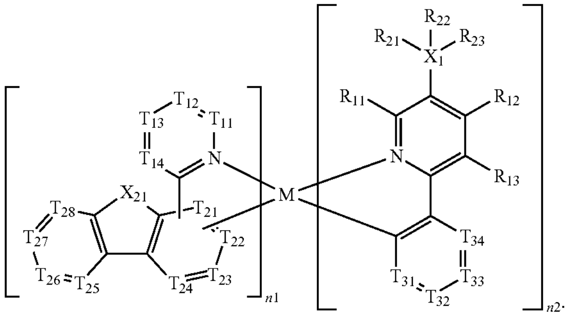

The disclosed specific structures include

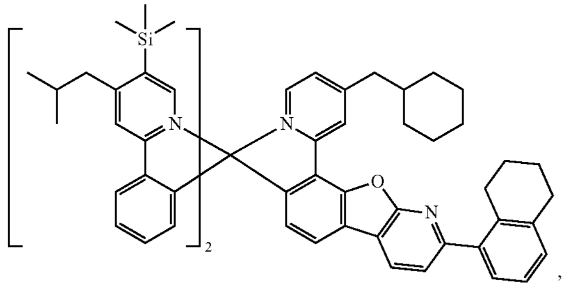

,

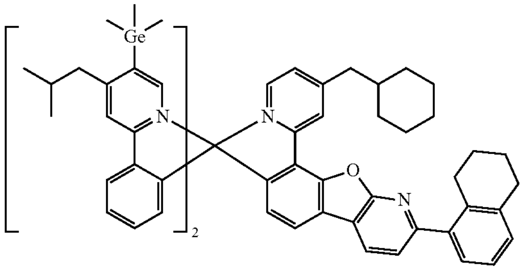

and

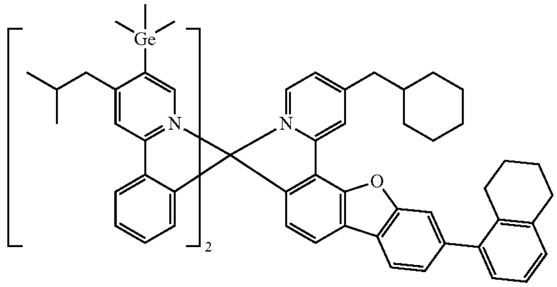

.

Although the above three metal complexes having substitutions of fused ring groups are disclosed in this application, this application focuses on the effect of substituent containing silyl or germanyl at a particular position of metal complex on device performance and has neither paid attention to an effect of a fused ring group on device performance nor disclosed and taught an effect of the fused ring group substituted at a particular position of metal complex on the device performance.

US2013119354A1 discloses an iridium complex having a structure represented by the following general formula:

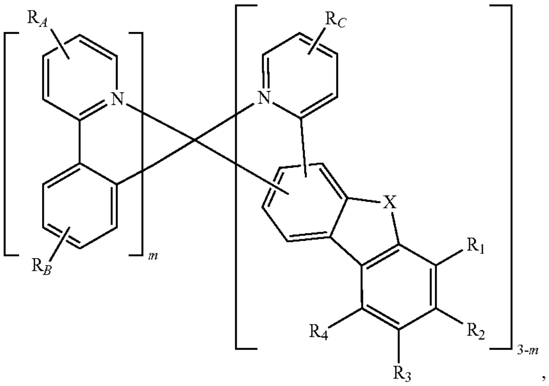

, wherein $R_1$ to $R_4$ are selected from hydrogen, deuterium, alkyl, cycloalkyl, aryl or heteroaryl. This application has not disclosed or taught an effect of $R_1$ being a fused ring group on device performance.

SUMMARY

The present disclosure aims to provide a series of metal complexes each comprising a ligand $L_a$ having a structure of Formula 1 to solve at least part of the above-mentioned problems.

According to an embodiment of the present disclosure, disclosed is a metal complex comprising a metal M and a ligand $L_a$ coordinated to the metal M, wherein the metal M is selected from a metal with a relative atomic mass greater than 40, and the ligand $L_a$ has a structure represented by Formula 1:

Formula 1

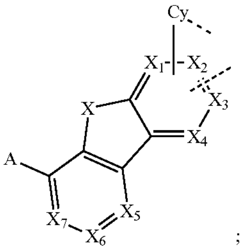

;

wherein in Formula 1,

Cy is, at each occurrence identically or differently, selected from a substituted or unsubstituted aromatic ring having 6 to 24 ring atoms, a substituted or unsubstituted heteroaromatic ring having 5 to 24 ring atoms or a combination thereof;

X is selected from the group consisting of O, S, Se, NR', CR'R', SiR'R' and GeR'R', wherein when two R' are present at the same time, the two R' are the same or different;

$X_1$ to $X_7$ are, at each occurrence identically or differently, selected from C, $CR_x$ or N, and at least one of $X_1$ to $X_4$ is C and joined to the Cy;

$X_1$, $X_2$, $X_3$ or $X_4$ is joined to the metal M by a metal-carbon bond or a metal-nitrogen bond;

A has a structure represented by Formula 2:

Formula 2

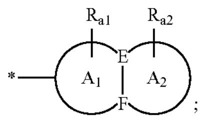

;

E and F are, at each occurrence identically or differently, selected from C, CR'', N, SiR'' or GeR'';

$R_{a1}$ and $R_{a2}$ represent, at each occurrence identically or differently, mono-substitution, multiple substitutions or non-substitution;

the ring $A_1$ and the ring $A_2$ are fused through E and F, and the ring $A_1$ and the ring $A_2$ satisfy one of the following two cases:

the first case: the ring $A_1$ is selected from an alicyclic ring having 3 to 30 ring atoms, a heterocyclic ring having 3 to 30 ring atoms or a combination thereof; and the ring $A_2$ is selected from an alicyclic ring having 3 to 30 ring atoms, an aromatic ring having 6 to 30 ring atoms, a heterocyclic ring having 3 to 30 ring atoms, a heteroaromatic ring having 5 to 30 ring atoms or a combination thereof;

the second case: the ring $A_1$ is selected from an aromatic ring having 6 to 30 ring atoms, a heteroaromatic ring having 5 to 30 ring atoms or a combination thereof; and the ring $A_2$ is selected from an alicyclic ring having 3 to 30 ring atoms, a heterocyclic ring having 3 to 30 ring atoms or a combination thereof;

R', R'', $R_x$, $R_{a1}$ and $R_{a2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R', R'', $R_x$, $R_{a1}$, $R_{a2}$ can be optionally joined to form a ring; and "*" represents a position where A is joined.

According to another embodiment of the present disclosure, further disclosed is an electroluminescent device. The electroluminescent device comprises:

an anode, a cathode, and an organic layer disposed between the anode and the cathode, wherein the organic layer comprises the metal complex in the preceding embodiment.

According to another embodiment of the present disclosure, further disclosed is a compound combination comprising the metal complex in the preceding embodiment.

The series of metal complexes each comprising the ligand $L_a$ having the structure of Formula 1, disclosed by the present disclosure, may be used as light-emitting materials in electroluminescent devices. These novel metal complexes may be applied to the electroluminescent devices and can improve device efficiency and significantly improve the overall performance of the devices.

DETAILED DESCRIPTION

Figure 1:
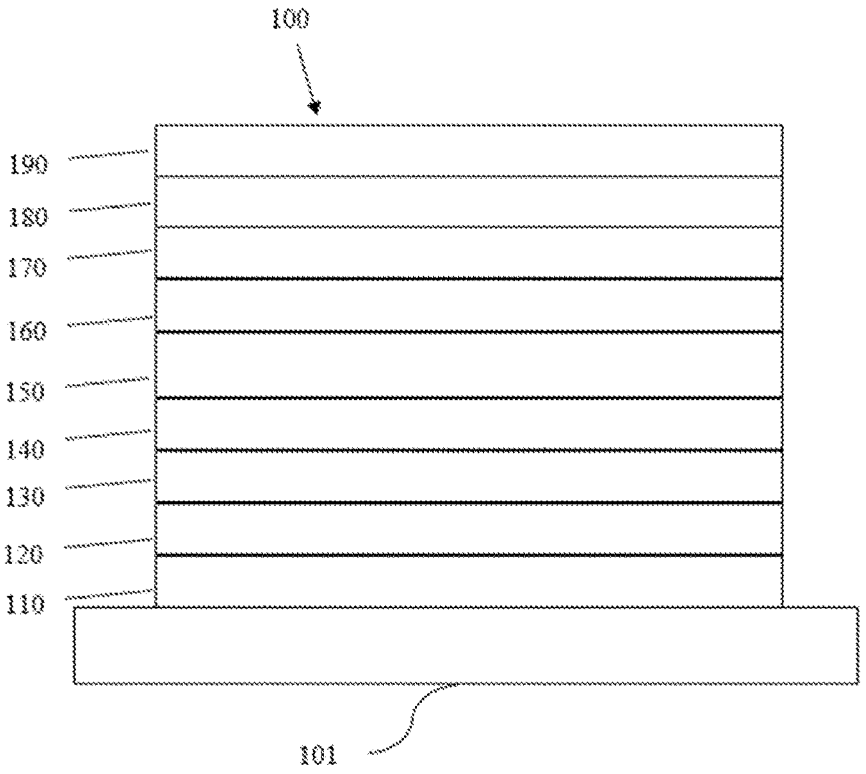
FIG. 1 is a schematic diagram of an electroluminescent device that may contain a metal complex and a compound combination disclosed herein.

OLEDs can be fabricated on various types of substrates such as glass, plastic, and metal foil. FIG. 1 schematically shows an organic light-emitting device 100 without limitation. The figures are not necessarily drawn to scale. Some of the layers in the figures can also be omitted as needed. Device 100 may include a substrate 101, an anode 110, a hole injection layer 120, a hole transport layer 130, an electron blocking layer 140, an emissive layer 150, a hole blocking layer 160, an electron transport layer 170, an electron injection layer 180 and a cathode 190. Device 100 may be fabricated by depositing the layers described in order. The properties and functions of these various layers, as well as example materials, are described in more detail in U.S. Pat. No. 7,279,704 at cols. 6-10, the contents of which are incorporated by reference herein in its entirety.

More examples for each of these layers are available. For example, a flexible and transparent substrate-anode combination is disclosed in U.S. Pat. No. 5,844,363, which is incorporated by reference herein in its entirety. An example of a p-doped hole transport layer is m-MTDATA doped with $F_4$-TCNQ at a molar ratio of 50:1, as disclosed in U.S. Patent Application Publication No. 2003/0230980, which is incorporated by reference herein in its entirety. Examples of host materials are disclosed in U.S. Pat. No. 6,303,238 to Thompson et al., which is incorporated by reference herein in its entirety. An example of an n-doped electron transport layer is BPhen doped with Li at a molar ratio of 1:1, as disclosed in U.S. Patent Application Publication No. 2003/0230980, which is incorporated by reference herein in its entirety. U.S. Pat. Nos. 5,703,436 and 5,707,745, which are incorporated by reference herein in their entireties, disclose examples of cathodes including composite cathodes having a thin layer of metal such as Mg:Ag with an overlying transparent, electrically-conductive, sputter-deposited ITO layer. The theory and use of blocking layers are described in more detail in U.S. Pat. No. 6,097,147 and U.S. Patent Application Publication No. 2003/0230980, which are incorporated by reference herein in their entireties. Examples of injection layers are provided in U.S. Patent Application Publication No. 2004/0174116, which is incorporated by reference herein in its entirety. A description of protective layers may be found in U.S. Patent Application Publication No. 2004/0174116, which is incorporated by reference herein in its entirety.

The layered structure described above is provided by way of non-limiting examples. Functional OLEDs may be achieved by combining the various layers described in different ways, or layers may be omitted entirely. It may also include other layers not specifically described. Within each layer, a single material or a mixture of multiple materials can be used to achieve optimum performance. Any functional layer may include several sublayers. For example, the emissive layer may have two layers of different emitting materials to achieve desired emission spectrum.

In one embodiment, an OLED may be described as having an "organic layer" disposed between a cathode and an anode. This organic layer may include a single layer or multiple layers.

Figure 2:
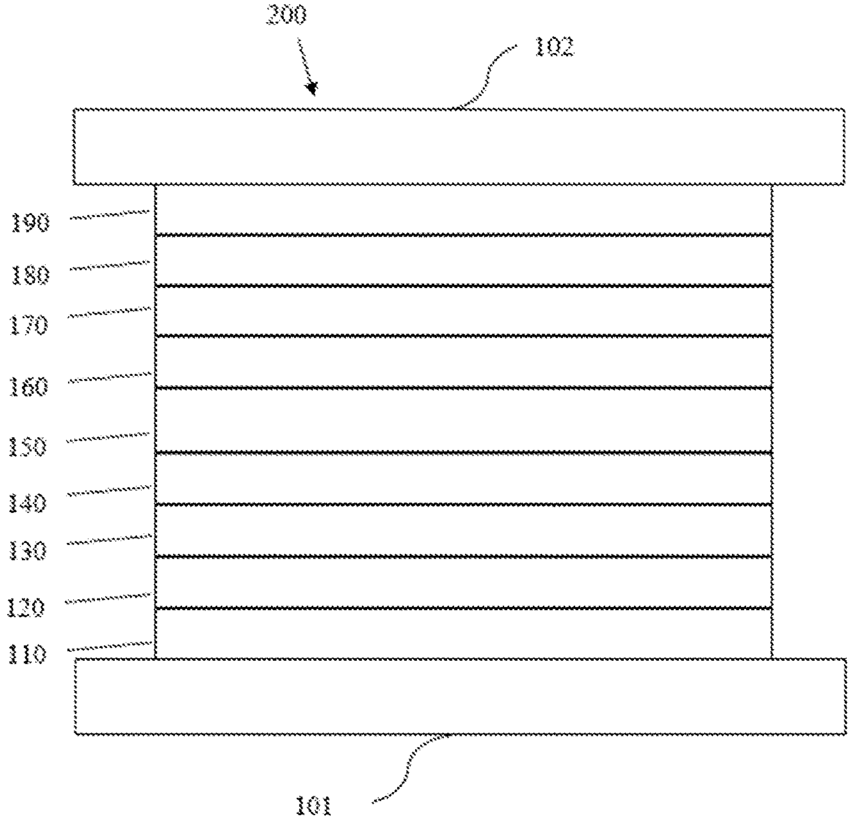
FIG. 2 is a schematic diagram of another electroluminescent device that may contain a metal complex and a compound combination disclosed herein.

An OLED can be encapsulated by a barrier layer. FIG. 2 schematically shows an organic light-emitting device 200 without limitation. FIG. 2 differs from FIG. 1 in that the organic light-emitting device include a barrier layer 102, which is above the cathode 190, to protect it from harmful species from the environment such as moisture and oxygen. Any material that can provide the barrier function can be used as the barrier layer such as glass or organic-inorganic hybrid layers. The barrier layer should be placed directly or indirectly outside of the OLED device. Multilayer thin film encapsulation was described in U.S. Pat. No. 7,968,146, which is incorporated by reference herein in its entirety.

Devices fabricated in accordance with embodiments of the present disclosure can be incorporated into a wide variety of consumer products that have one or more of the electronic component modules (or units) incorporated therein. Some examples of such consumer products include flat panel displays, monitors, medical monitors, televisions, billboards, lights for interior or exterior illumination and/or signaling, heads-up displays, fully or partially transparent displays, flexible displays, smart phones, tablets, phablets, wearable devices, smart watches, laptop computers, digital cameras, camcorders, viewfinders, micro-displays, 3-D displays, vehicles displays, and vehicle tail lights.

The materials and structures described herein may be used in other organic electronic devices listed above.

As used herein, "top" means furthest away from the substrate, while "bottom" means closest to the substrate. Where a first layer is described as "disposed over" a second layer, the first layer is disposed further away from the substrate. There may be other layers between the first and second layers, unless it is specified that the first layer is "in contact with" the second layer. For example, a cathode may be described as "disposed over" an anode, even though there are various organic layers in between.

As used herein, "solution processible" means capable of being dissolved, dispersed, or transported in and/or deposited from a liquid medium, either in solution or suspension form.

A ligand may be referred to as "photoactive" when it is believed that the ligand directly contributes to the photoactive properties of an emissive material. A ligand may be referred to as "ancillary" when it is believed that the ligand does not contribute to the photoactive properties of an emissive material, although an ancillary ligand may alter the properties of a photoactive ligand.

It is believed that the internal quantum efficiency (IQE) of fluorescent OLEDs can exceed the 25% spin statistics limit through delayed fluorescence. As used herein, there are two types of delayed fluorescence, i.e. P-type delayed fluorescence and E-type delayed fluorescence. P-type delayed fluorescence is generated from triplet-triplet annihilation (TTA).

On the other hand, E-type delayed fluorescence does not rely on the collision of two triplets, but rather on the transition between the triplet states and the singlet excited states. Compounds that are capable of generating E-type delayed fluorescence are required to have very small singlet-triplet gaps to convert between energy states. Thermal energy can activate the transition from the triplet state back to the singlet state. This type of delayed fluorescence is also known as thermally activated delayed fluorescence (TADF). A distinctive feature of TADF is that the delayed component increases as temperature rises. If the reverse intersystem crossing (RISC) rate is fast enough to minimize the non-radiative decay from the triplet state, the fraction of back populated singlet excited states can potentially reach 75%. The total singlet fraction can be 100%, far exceeding 25% of the spin statistics limit for electrically generated excitons.

E-type delayed fluorescence characteristics can be found in an exciplex system or in a single compound. Without being bound by theory, it is believed that E-type delayed fluorescence requires the luminescent material to have a small singlet-triplet energy gap (AES-T). Organic, non-metal containing, donor-acceptor luminescent materials may be able to achieve this. The emission in these materials is generally characterized as a donor-acceptor charge-transfer (CT) type emission. The spatial separation of the HOMO and LUMO in these donor-acceptor type compounds generally results in small AES-T. These states may involve CT states. Generally, donor-acceptor luminescent materials are constructed by connecting an electron donor moiety such as amino- or carbazole-derivatives and an electron acceptor moiety such as N-containing six-membered aromatic rings.

Definition of Terms of Substituents

Halogen or halide—as used herein includes fluorine, chlorine, bromine, and iodine.

Alkyl—as used herein includes both straight and branched chain alkyl groups. Alkyl may be alkyl having 1 to 20 carbon atoms, preferably alkyl having 1 to 12 carbon atoms, and more preferably alkyl having 1 to 6 carbon atoms. Examples of alkyl groups include a methyl group, an ethyl group, a propyl group, an isopropyl group, a n-butyl group, an s-butyl group, an isobutyl group, a t-butyl group, an n-pentyl group, an n-hexyl group, an n-heptyl group, an n-octyl group, an n-nonyl group, an n-decyl group, an n-undecyl group, an n-dodecyl group, an n-tridecyl group, an n-tetradecyl group, an n-pentadecyl group, an n-hexadecyl group, an n-heptadecyl group, an n-octadecyl group, a neopentyl group, a 1-methylpentyl group, a 2-methylpentyl group, a 1-pentylhexyl group, a 1-butylpentyl group, a 1-heptyloctyl group, and a 3-methylpentyl group. Of the above, preferred are a methyl group, an ethyl group, a propyl group, an isopropyl group, a n-butyl group, an s-butyl group, an isobutyl group, a t-butyl group, an n-pentyl group, a neopentyl group, and an n-hexyl group. Additionally, the alkyl group may be optionally substituted.

Cycloalkyl—as used herein includes cyclic alkyl groups. The cycloalkyl groups may be those having 3 to 20 ring carbon atoms, preferably those having 4 to 10 carbon atoms. Examples of cycloalkyl include cyclobutyl, cyclopentyl, cyclohexyl, 4-methylcyclohexyl, 4,4-dimethylcylcohexyl, 1-adamantyl, 2-adamantyl, 1-norbornyl, 2-norbornyl, and the like. Of the above, preferred are cyclopentyl, cyclohexyl, 4-methylcyclohexyl, and 4,4-dimethylcylcohexyl. Additionally, the cycloalkyl group may be optionally substituted.

Heteroalkyl—as used herein, includes a group formed by replacing one or more carbons in an alkyl chain with a hetero-atom(s) selected from the group consisting of a nitrogen atom, an oxygen atom, a sulfur atom, a selenium atom, a phosphorus atom, a silicon atom, a germanium atom, and a boron atom. Heteroalkyl may be those having 1 to 20 carbon atoms, preferably those having 1 to 10 carbon atoms, and more preferably those having 1 to 6 carbon atoms. Examples of heteroalkyl include methoxymethyl, ethoxymethyl, ethoxyethyl, methylthiomethyl, ethylthiomethyl, ethylthioethyl, methoxymethoxymethyl, ethoxymethoxymethyl, ethoxyethoxyethyl, hydroxymethyl, hydroxyethyl, hydroxypropyl, mercaptomethyl, mercaptoethyl, mercaptopropyl, aminomethyl, aminoethyl, aminopropyl, dimethylaminomethyl, trimethylgermanylmethyl, trimethylgermanylethyl, trimethylgermanylisopropyl, dimethylethylgermanylmethyl, dimethylisopropylgermanylmethyl, tert-butylmethylgermanylmethyl, triethylgermanylmethyl, triethylgermanylethyl, triisopropylgermanylmethyl, triisopropylgermanylethyl, trimethylsilylmethyl, trimethylsilylethyl, trimethylsilylisopropyl, triisopropylsilylmethyl, and triisopropylsilylethyl. Additionally, the heteroalkyl group may be optionally substituted.

Alkenyl—as used herein includes straight chain, branched chain, and cyclic alkene groups. Alkenyl may be those having 2 to 20 carbon atoms, preferably those having 2 to 10 carbon atoms. Examples of alkenyl include vinyl, 1-propenyl group, 1-butenyl, 2-butenyl, 3-butenyl, 1,3-butandienyl, 1-methylvinyl, styryl, 2,2-diphenylvinyl, 1,2-diphenylvinyl, 1-methylallyl, 1,1-dimethylallyl, 2-methylallyl, 1-phenylallyl, 2-phenylallyl, 3-phenylallyl, 3,3-diphenylallyl, 1,2-dimethylallyl, 1-phenyl-1-butenyl, 3-phenyl-1-butenyl, cyclopentenyl, cyclopentadienyl, cyclohexenyl, cycloheptenyl, cycloheptatrienyl, cyclooctenyl, cyclooctatetraenyl, and norbornenyl. Additionally, the alkenyl group may be optionally substituted.

Alkynyl—as used herein includes straight chain alkynyl groups. Alkynyl may be those having 2 to 20 carbon atoms, preferably those having 2 to 10 carbon atoms. Examples of alkynyl groups include ethynyl, propynyl, propargyl, 1-butynyl, 2-butynyl, 3-butynyl, 1-pentynyl, 2-pentynyl, 3,3-dimethyl-1-butynyl, 3-ethyl-3-methyl-1-pentynyl, 3,3-diisopropyl-1-pentynyl, phenylethynyl, phenylpropynyl, etc. Of the above, preferred are ethynyl, propynyl, propargyl, 1-butynyl, 2-butynyl, 3-butynyl, 1-pentynyl, and phenylethynyl. Additionally, the alkynyl group may be optionally substituted.

Aryl or an aromatic group or an aromatic ring—as used herein includes non-condensed and condensed systems. Aryl may be those having 6 to 30 carbon atoms, preferably those having 6 to 20 carbon atoms, and more preferably those having 6 to 12 carbon atoms. Examples of aryl groups include phenyl, biphenyl, terphenyl, triphenylene, tetraphenylene, naphthalene, anthracene, phenalene, phenanthrene, fluorene, pyrene, chrysene, perylene, and azulene, preferably phenyl, biphenyl, terphenyl, triphenylene, fluorene, and naphthalene. Examples of non-condensed aryl groups include phenyl, biphenyl-2-yl, biphenyl-3-yl, biphenyl-4-yl, p-terphenyl-4-yl, p-terphenyl-3-yl, p-terphenyl-2-yl, m-terphenyl-4-yl, m-terphenyl-3-yl, m-terphenyl-2-yl, o-tolyl, m-tolyl, p-tolyl, p-(2-phenylpropyl)phenyl, 4'-methylbiphenylyl, 4"-t-butyl-p-terphenyl-4-yl, o-cumenyl, m-cumenyl, p-cumenyl, 2,3-xylyl, 3,4-xylyl, 2,5-xylyl, mesityl, and m-quarterphenyl. Additionally, the aryl group may be optionally substituted.

Heterocyclic groups or heterocycle—as used herein include non-aromatic cyclic groups. Non-aromatic heterocyclic groups includes saturated heterocyclic groups having 3 to 20 ring atoms and unsaturated non-aromatic heterocyclic groups having 3 to 20 ring atoms, where at least one ring atom is selected from the group consisting of a nitrogen atom, an oxygen atom, a sulfur atom, a selenium atom, a silicon atom, a phosphorus atom, a germanium atom, and a boron atom. Preferred non-aromatic heterocyclic groups are those having 3 to 7 ring atoms, each of which includes at least one hetero-atom such as nitrogen, oxygen, silicon, or sulfur. Examples of non-aromatic heterocyclic groups include oxiranyl, oxetanyl, tetrahydrofuranyl, tetrahydropyranyl, dioxolanyl, dioxanyl, aziridinyl, dihydropyrrolyl, tetrahydropyrrolyl, piperidinyl, oxazolidinyl, morpholinyl, piperazinyl, oxepinyl, thiepinyl, azepinyl, and tetrahydrosilolyl. Additionally, the heterocyclic group may be optionally substituted.

Heteroaryl or a heteroaromatic ring—as used herein, includes non-condensed and condensed hetero-aromatic groups having 1 to 5 hetero-atoms, where at least one hetero-atom is selected from the group consisting of a nitrogen atom, an oxygen atom, a sulfur atom, a selenium atom, a silicon atom, a phosphorus atom, a germanium atom, and a boron atom. A hetero-aromatic group is also referred to as heteroaryl. Heteroaryl may be those having 3 to 30 carbon atoms, preferably those having 3 to 20 carbon atoms, and more preferably those having 3 to 12 carbon atoms. Suitable heteroaryl groups include dibenzothiophene, dibenzofuran, dibenzoselenophene, furan, thiophene, benzofuran, benzothiophene, benzoselenophene, carbazole, indolocarbazole, pyridoindole, pyrrolodipyridine, pyrazole, imidazole, triazole, oxazole, thiazole, oxadiazole, oxatriazole, dioxazole, thiadiazole, pyridine, pyridazine, pyrimidine, pyrazine, triazine, oxazine, oxathiazine, oxadiazine, indole, benzimidazole, indazole, indoxazine, benzoxazole, benzisoxazole, benzothiazole, quinoline, isoquinoline, cinnoline, quinazoline, quinoxaline, naphthyridine, phthalazine, pteridine, xanthene, acridine, phenazine, phenothiazine, benzofuropyridine, furodipyridine, benzothienopyridine, thienodipyridine, benzoselenophenopyridine, and selenophenodipyridine, preferably dibenzothiophene, dibenzofuran, dibenzoselenophene, carbazole, indolocarbazole, imidazole, pyridine, triazine, benzimidazole, 1,2-azaborine, 1,3-azaborine, 1,4-azaborine, borazine, and aza-analogs thereof. Additionally, the heteroaryl group may be optionally substituted.

Alkoxy—as used herein, is represented by —O-alkyl, —O-cycloalkyl, —O-heteroalkyl, or —O-heterocyclic group. Examples and preferred examples of alkyl, cycloalkyl, heteroalkyl, and heterocyclic groups are the same as those described above. Alkoxy groups may be those having 1 to 20 carbon atoms, preferably those having 1 to 6 carbon atoms. Examples of alkoxy groups include methoxy, ethoxy, propoxy, butoxy, pentyloxy, hexyloxy, cyclopropyloxy, cyclobutyloxy, cyclopentyloxy, cyclohexyloxy, tetrahydrofuranyloxy, tetrahydropyranyloxy, methoxypropyloxy, ethoxyethyloxy, methoxymethyloxy, and ethoxymethyloxy. Additionally, the alkoxy group may be optionally substituted.

Aryloxy—as used herein, is represented by —O-aryl or —O-heteroaryl. Examples and preferred examples of aryl and heteroaryl are the same as those described above. Aryloxy groups may be those having 6 to 30 carbon atoms, preferably those having 6 to 20 carbon atoms. Examples of aryloxy groups include phenoxy and biphenyloxy. Additionally, the aryloxy group may be optionally substituted.

Arylalkyl—as used herein, contemplates alkyl substituted with an aryl group. Arylalkyl may be those having 7 to 30 carbon atoms, preferably those having 7 to 20 carbon atoms, and more preferably those having 7 to 13 carbon atoms. Examples of arylalkyl groups include benzyl, 1-phenylethyl, 2-phenylethyl, 1-phenylisopropyl, 2-phenylisopropyl, phenyl-t-butyl, alpha-naphthylmethyl, 1-alpha-naphthylethyl, 2-alpha-naphthylethyl, 1-alpha-naphthylisopropyl, 2-alpha-naphthylisopropyl, beta-naphthylmethyl, 1-beta-naphthylethyl, 2-beta-naphthylethyl, 1-beta-naphthylisopropyl, 2-beta-naphthylisopropyl, p-methylbenzyl, m-methylbenzyl, o-methylbenzyl, p-chlorobenzyl, m-chlorobenzyl, o-chlorobenzyl, p-bromobenzyl, m-bromobenzyl, o-bromobenzyl, p-iodobenzyl, m-iodobenzyl, o-iodobenzyl, p-hydroxybenzyl, m-hydroxybenzyl, o-hydroxybenzyl, p-aminobenzyl, m-aminobenzyl, o-aminobenzyl, p-nitrobenzyl, m-nitrobenzyl, o-nitrobenzyl, p-cyanobenzyl, m-cyanobenzyl, o-cyanobenzyl, 1-hydroxy-2-phenylisopropyl, and 1-chloro-2-phenylisopropyl. Of the above, preferred are benzyl, p-cyanobenzyl, m-cyanobenzyl, o-cyanobenzyl, 1-phenylethyl, 2-phenylethyl, 1-phenylisopropyl, and 2-phenylisopropyl. Additionally, the arylalkyl group may be optionally substituted.

Alkylsilyl—as used herein, contemplates a silyl group substituted with an alkyl group. Alkylsilyl groups may be those having 3 to 20 carbon atoms, preferably those having 3 to 10 carbon atoms. Examples of alkylsilyl groups include trimethylsilyl, triethylsilyl, methyldiethylsilyl, ethyldimethylsilyl, tripropylsilyl, tributylsilyl, triisopropylsilyl, methyldiisopropylsilyl, dimethylisopropylsilyl, tri-t-butylsilyl, triisobutylsilyl, dimethyl t-butylsilyl, and methyldi-t-butylsilyl. Additionally, the alkylsilyl group may be optionally substituted.

Arylsilyl—as used herein, contemplates a silyl group substituted with an aryl group. Arylsilyl groups may be those having 6 to 30 carbon atoms, preferably those having 8 to 20 carbon atoms. Examples of arylsilyl groups include triphenylsilyl, phenyldibiphenylylsilyl, diphenylbiphenylsilyl, phenyldiethylsilyl, diphenylethylsilyl, phenyldimethylsilyl, diphenylmethylsilyl, phenyldiisopropylsilyl, diphenylisopropylsilyl, diphenylbutylsilyl, diphenylisobutylsilyl, diphenyl t-butylsilyl. Additionally, the arylsilyl group may be optionally substituted.

Alkylgermanyl—as used herein contemplates germanyl substituted with an alkyl group. The alkylgermanyl may be those having 3 to 20 carbon atoms, preferably those having 3 to 10 carbon atoms. Examples of alkylgermanyl include trimethylgermanyl, triethylgermanyl, tripropylgermanyl, tributylgermanyl, methyldiethylgermanyl, ethyldimethylgermanyl, triisopropylgermanyl, methyldiisopropylgermanyl, dimethylisopropylgermanyl, tri-t-butylgermanyl, triisobutylgermanyl, dimethyl-t-butylgermanyl, and methyldi-t-butylgermanyl. Additionally, the alkylgermanyl may be optionally substituted.

Arylgermanyl—as used herein contemplates germanyl substituted with at least one aryl group or heteroaryl group. Arylgermanyl may be those having 6 to 30 carbon atoms, preferably those having 8 to 20 carbon atoms. Examples of arylgermanyl include triphenylgermanyl, phenyldibiphenylylgermanyl, diphenylbiphenylgermanyl, phenyldiethylgermanyl, diphenylethylgermanyl, phenyldimethylgermanyl, diphenylmethylgermanyl, phenyldiisopropylgermanyl, diphenylisopropylgermanyl, diphenylbutylgermanyl, diphenylisobutylgermanyl, and diphenyl-t-butylgermanyl. Additionally, the arylgermanyl may be optionally substituted.

The term "aza" in azadibenzofuran, azadibenzothiophene, etc. means that one or more of C—H groups in the respective aromatic fragment are replaced by a nitrogen atom. For example, azatriphenylene encompasses dibenzo[f,h]quinoxaline, dibenzo[f,h]quinoline and other analogs with two or more nitrogens in the ring system. One of ordinary skill in the art can readily envision other nitrogen analogs of the aza-derivatives described above, and all such analogs are intended to be encompassed by the terms as set forth herein.

In the present disclosure, unless otherwise defined, when any term of the group consisting of substituted alkyl, substituted cycloalkyl, substituted heteroalkyl, substituted heterocyclic group, substituted arylalkyl, substituted alkoxy, substituted aryloxy, substituted alkenyl, substituted alkynyl, substituted aryl, substituted heteroaryl, substituted alkylsilyl, substituted arylsilyl, substituted alkylgermanyl, substituted arylgermanyl, substituted amino, substituted acyl, substituted carbonyl, a substituted carboxylic acid group, a substituted ester group, substituted sulfinyl, substituted sulfonyl, and substituted phosphino is used, it means that any group of alkyl, cycloalkyl, heteroalkyl, heterocyclic group, arylalkyl, alkoxy, aryloxy, alkenyl, alkynyl, aryl, heteroaryl, alkylsilyl, arylsilyl, amino, acyl, carbonyl, a carboxylic acid group, an ester group, sulfinyl, sulfonyl, and phosphino may be substituted with one or more moieties selected from the group consisting of deuterium, halogen, unsubstituted alkyl having 1 to 20 carbon atoms, unsubstituted cycloalkyl having 3 to 20 ring carbon atoms, unsubstituted heteroalkyl having 1 to 20 carbon atoms, an unsubstituted heterocyclic group having 3 to 20 ring atoms, unsubstituted arylalkyl having 7 to 30 carbon atoms, unsubstituted alkoxy having 1 to 20 carbon atoms, unsubstituted aryloxy having 6 to 30 carbon atoms, unsubstituted alkenyl having 2 to 20 carbon atoms, unsubstituted alkynyl having 2 to 20 carbon atoms, unsubstituted aryl having 6 to 30 carbon atoms, unsubstituted heteroaryl having 3 to 30 carbon atoms, unsubstituted alkylsilyl having 3 to 20 carbon atoms, unsubstituted arylsilyl group having 6 to 20 carbon atoms, unsubstituted alkylgermanyl having 3 to 20 carbon atoms, unsubstituted arylgermanyl having 6 to 20 carbon atoms, unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group, and combinations thereof.

It is to be understood that when a molecular fragment is described as being a substituent or otherwise attached to another moiety, its name may be written as if it were a fragment (e.g. phenyl, phenylene, naphthyl, dibenzofuryl) or as if it were the whole molecule (e.g. benzene, naphthalene, dibenzofuran). As used herein, these different ways of designating a substituent or an attached fragment are considered to be equivalent.

In the compounds mentioned in the present disclosure, hydrogen atoms may be partially or fully replaced by deuterium. Other atoms such as carbon and nitrogen may also be replaced by their other stable isotopes. The replacement by other stable isotopes in the compounds may be preferred due to its enhancements of device efficiency and stability.

In the compounds mentioned in the present disclosure, multiple substitution refers to a range that includes a di-substitution, up to the maximum available substitution. When substitution in the compounds mentioned in the present disclosure represents multiple substitution (including di-, tri-, and tetra-substitutions etc.), that means the substituent may exist at a plurality of available substitution positions on its linking structure, the substituents present at a plurality of available substitution positions may have the same structure or different structures.

In the compounds mentioned in the present disclosure, adjacent substituents in the compounds cannot be joined to form a ring unless otherwise explicitly defined, for example, adjacent substituents can be optionally joined to form a ring. In the compounds mentioned in the present disclosure, the expression that adjacent substituents can be optionally joined to form a ring includes a case where adjacent substituents may be joined to form a ring and a case where adjacent substituents are not joined to form a ring. When adjacent substituents can be optionally joined to form a ring, the ring formed may be monocyclic or polycyclic (including spirocyclic, endocyclic, fusedcyclic, and etc.), as well as alicyclic, heteroalicyclic, aromatic, or heteroaromatic. In such expression, adjacent substituents may refer to substituents bonded to the same atom, substituents bonded to carbon atoms which are directly bonded to each other, or substituents bonded to carbon atoms which are more distant from each other. Preferably, adjacent substituents refer to substituents bonded to the same carbon atom and substituents bonded to carbon atoms which are directly bonded to each other.

The expression that adjacent substituents can be optionally joined to form a ring is also intended to mean that two substituents bonded to the same carbon atom are joined to each other via a chemical bond to form a ring, which can be exemplified by the following formula:

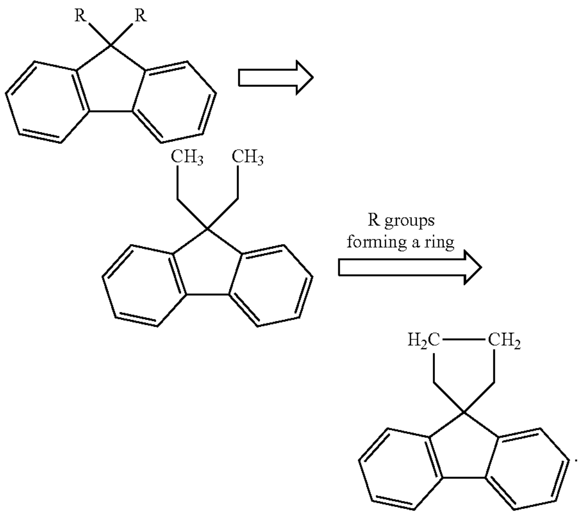

The expression that adjacent substituents can be optionally joined to form a ring is also intended to mean that two substituents bonded to carbon atoms which are directly bonded to each other are joined to each other via a chemical bond to form a ring, which can be exemplified by the following formula:

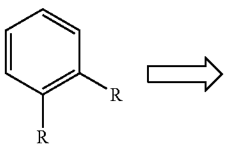

-continued

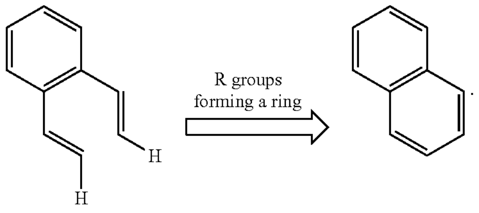

The expression that adjacent substituents can be optionally joined to form a ring is also intended to mean that two substituents bonded to a further distant carbon atom are joined to each other via a chemical bond to form a ring, which can be exemplified by the following formula:

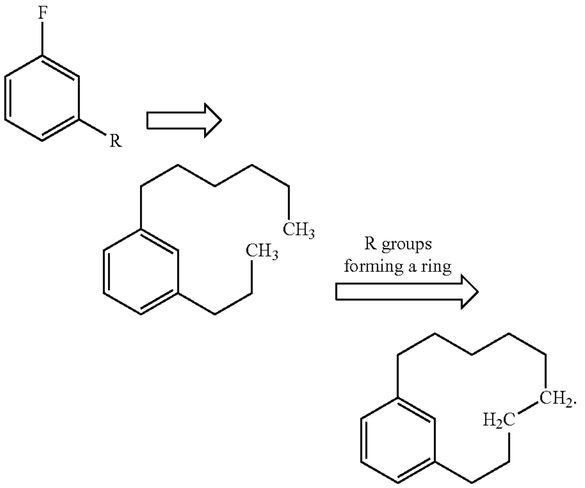

Furthermore, the expression that adjacent substituents can be optionally joined to form a ring is also intended to mean that, in the case where one of the two substituents bonded to carbon atoms which are directly bonded to each other represents hydrogen, the second substituent is bonded at a position at which the hydrogen atom is bonded, thereby forming a ring. This is exemplified by the following formula:

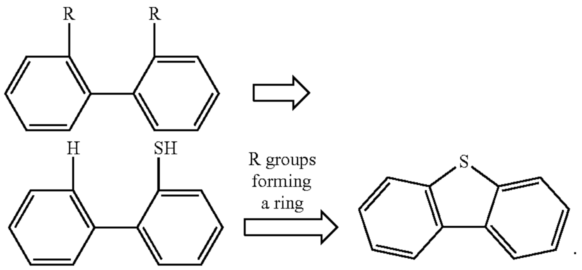

According to an embodiment of the present disclosure, disclosed is a metal complex comprising a metal M and a ligand $L_a$ coordinated to the metal M, wherein the metal M is selected from a metal with a relative atomic mass greater than 40, and the ligand $L_a$ has a structure represented by Formula 1:

Formula 1

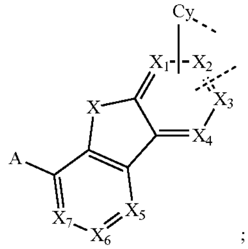

;

wherein in Formula 1,

Cy is, at each occurrence identically or differently, selected from a substituted or unsubstituted aromatic ring having 6 to 24 ring atoms, a substituted or unsubstituted heteroaromatic ring having 5 to 24 ring atoms or a combination thereof;

X is selected from the group consisting of O, S, Se, NR', CR'R', SiR'R' and GeR'R', wherein when two R' are present at the same time, the two R' are the same or different;

$X_1$ to $X_7$ are, at each occurrence identically or differently, selected from C, $CR_x$ or N, and at least one of $X_1$ to $X_4$ is C and joined to Cy;

$X_1$, $X_2$, $X_3$ or $X_4$ is joined to the metal M by a metal-carbon bond or a metal-nitrogen bond;

A has a structure represented by Formula 2:

Formula 2

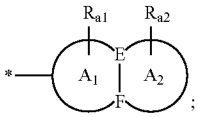

;

E and F are, at each occurrence identically or differently, selected from C, CR", N, SiR" or GeR";

$R_{a1}$ and $R_{a2}$ represent, at each occurrence identically or differently, mono-substitution, multiple substitutions or non-substitution;

the ring $A_1$ and the ring $A_2$ are fused through E and F;

the ring $A_1$ and the ring $A_2$ are, at each occurrence identically or differently, selected from an alicyclic ring having 3 to 30 ring atoms, a heterocyclic ring having 3 to 30 ring atoms, an aromatic ring having 6 to 30 ring atoms, a heteroaromatic ring having 5 to 30 ring atoms or a combination thereof;

R', R", $R_x$, $R_{a1}$ and $R_{a2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R', R", $R_x$, $R_{a1}$, $R_{a2}$ can be optionally joined to form a ring; and "*" represents a position where A is joined.

According to an embodiment of the present disclosure, disclosed is a metal complex comprising a metal M and a ligand $L_a$ coordinated to the metal M, wherein the metal M is selected from a metal with a relative atomic mass greater than 40, and the ligand $L_a$ has a structure represented by Formula 1:

Formula 1

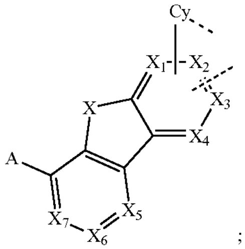

;

wherein in Formula 1,

Cy is, at each occurrence identically or differently, selected from a substituted or unsubstituted aromatic ring having 6 to 24 ring atoms, a substituted or unsubstituted heteroaromatic ring having 5 to 24 ring atoms or a combination thereof;

X is selected from the group consisting of O, S, Se, NR', CR'R', SiR'R' and GeR'R', wherein when two R' are present at the same time, the two R' are the same or different;

$X_1$ to $X_7$ are, at each occurrence identically or differently, selected from C, $CR_x$ or N, and at least one of $X_1$ to $X_4$ is C and joined to the Cy;

$X_1$, $X_2$, $X_3$ or $X_4$ is joined to the metal M by a metal-carbon bond or a metal-nitrogen bond;

A has a structure represented by Formula 2:

Formula 2

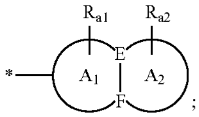

;

E and F are, at each occurrence identically or differently, selected from C, CR", N, SiR" or GeR";

$R_{a1}$ and $R_{a2}$ represent, at each occurrence identically or differently, mono-substitution, multiple substitutions or non-substitution;

the ring $A_1$ and the ring $A_2$ are fused through E and F, and the ring $A_1$ and the ring $A_2$ satisfy one of the following two cases:

a first case: the ring $A_1$ is selected from an alicyclic ring having 3 to 30 ring atoms, a heterocyclic ring having 3 to 30 ring atoms or a combination thereof; and the ring $A_2$ is selected from an alicyclic ring having 3 to 30 ring atoms, an aromatic ring having 6 to 30 ring atoms, a heterocyclic ring having 3 to 30 ring atoms, a heteroaromatic ring having 5 to 30 ring atoms or a combination thereof;

a second case: the ring $A_1$ is selected from an aromatic ring having 6 to 30 ring atoms, a heteroaromatic ring having 5 to 30 ring atoms or a combination thereof; and the ring $A_2$ is selected from an alicyclic ring having 3 to 30 ring atoms, a heterocyclic ring having 3 to 30 ring atoms or a combination thereof;

R', R", $R_x$, $R_{a1}$ and $R_{a2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R', R", $R_x$, $R_{a1}$, $R_{a2}$ can be optionally joined to form a ring; and "*" represents a position where A is joined.

In the present disclosure, the expression that "adjacent substituents R', R", $R_x$, $R_{a1}$, $R_{a2}$ can be optionally joined to form a ring" is intended to mean that any one or more of groups of adjacent substituents, such as two substituents R', two substituents $R_x$, two substituents $R_{a1}$, two substituents $R_{a2}$, substituents $R_{a1}$ and $R_{a2}$, substituents $R_{a1}$ and R", substituents $R_{a2}$ and R" and substituents R' and $R_x$, can be joined to form a ring. Obviously, it is possible that none of these substituents are joined to form a ring.

In the present disclosure, "an alicyclic ring" is meant to include saturated alicyclic rings and unsaturated alicyclic rings except aromatic rings, where the ring contains a carbocyclic ring formed by joining three or more carbon atoms, two adjacent carbon atoms in the ring may be joined by a single, double or triple bond, and the number of rings may be one or more. Examples of alicyclic rings include, but are not limited to, saturated alicyclic rings such as a cyclopropyl ring, a cyclopentyl ring, a cyclohexyl ring, a norbornyl ring and an adamantyl ring and unsaturated alicyclic rings such as a cyclopentenyl ring, a cyclopentadienyl ring and a cyclohexenyl ring.

In the present disclosure, "ring atoms" refer to those atoms that are bonded to form a cyclic structure (such as a monocyclic (hetero) aromatic, heterocyclic or alicyclic ring or a fused (hetero) aromatic, heterocyclic or alicyclic ring). Carbon atoms and heteroatoms in the ring (including, but not limited to, O, S, N, Se, Si or Ge, etc.) are counted as ring atoms. When the ring is substituted with a substituent, atoms included in the substituent are not included in the number of ring atoms. For example, the number of ring atoms in cyclopentane, cyclopentene, tetrahydrofuran, thiophene, furan, pyrrole, imidazole, oxazole and thiazole is 5; the number of ring atoms in cyclohexane, cyclohexene, benzene, pyridine, triazine and pyrimidine is 6; the number of ring atoms in benzothiophene, benzofuran and indene is 9; the number of ring atoms in naphthalene, quinoline, isoquinoline, quinazoline and quinoxaline is 10; the number of ring atoms in dibenzothiophene, dibenzofuran, fluorene, 9,9-diphenylfluorene, azadibenzothiophene, azadibenzofuran and azafluorene is 13. Various examples described here are merely illustrative, and the same is true in other cases.

In the present disclosure, E and F shown in Formula 2 are intended to represent two adjacent atoms or groups shared by "the ring $A_1$" and "the ring $A_2$" when they are fused, and Formula 2 merely illustratively shows that E and F are joined. However, based on different selections of "the ring $A_1$" and "the ring $A_2$", E and F may be joined by a single bond or a double bond. When E and F are joined by a double bond, E and F are both selected from C. "The ring $A_1$" and "the ring $A_2$" in A refer to rings including "E" and "F" in the formula, respectively, that is, when the ring $A_1$ is mentioned, the ring $A_1$ has the following structure:

when the ring $A_2$ is mentioned, the ring $A_2$ has the following structure:

For example, when A has the following structure:

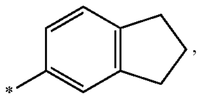 [SMILES: *c1ccc2c(c1)CCC2]

the ring $A_1$ is a benzene ring, the ring $A_2$ is cyclopentene, and E and F are joined by a double bond; when A has the following structure:

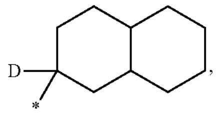

the ring $A_1$ is deuterated cyclohexane, the ring $A_2$ is cyclohexane, and E and F are joined by a single bond; when A has the following structure:

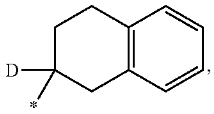, the ring $A_1$ is deuterated cyclohexene, the ring $A_2$ is a benzene ring, E and F are joined by a double bond. Various examples described here are merely illustrative, and the same is true in other cases.

According to an embodiment of the present disclosure, two adjacent substituents $R_{a2}$ are not joined to form a ring.

According to an embodiment of the present disclosure, when Formula 2 has the following structure:

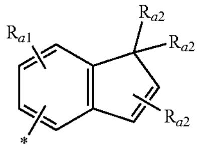

or

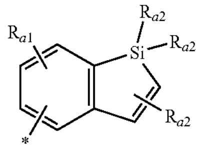

or

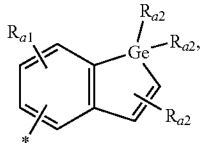

the ring formed by joined two adjacent substituents $R_{a2}$ is not an aromatic ring or a heteroaromatic ring, or two adjacent substituents $R_{a2}$ are not joined to form a ring.

According to an embodiment of the present disclosure, Cy is selected from any structure in the group consisting of the following:

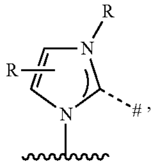,
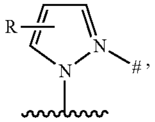,
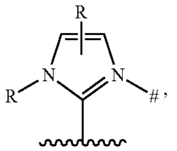,
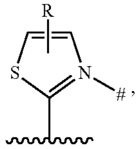,
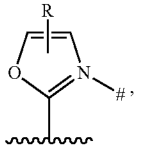,
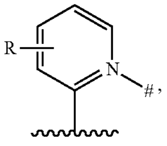,
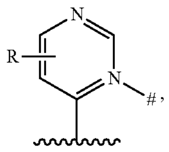,
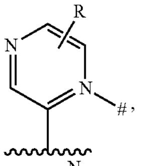,
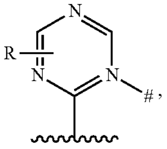,
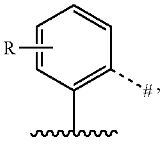,
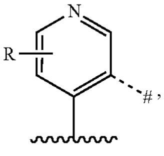,
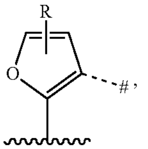, -continued

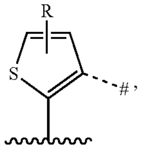,
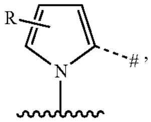,
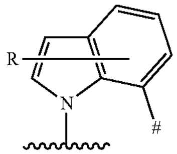,
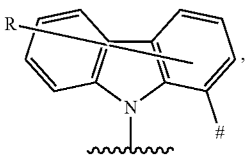, and
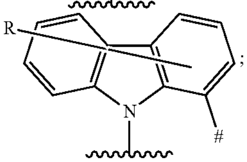;

wherein

R represents, at each occurrence identically or differently, mono-substitution, multiple substitutions or non-substitution; and when multiple R are present at the same time in any structure, the multiple R are the same or different;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R can be optionally joined to form a ring;

wherein "#" represents a position where Cy is joined to the metal M, and

represents a position where Cy is joined to $X_1$, $X_2$, $X_3$ or $X_4$.

In the present disclosure, the expression that "adjacent substituents R can be optionally joined to form a ring" is intended to mean that any one or more of groups of any two adjacent substituents R can be joined to form a ring. Obviously, it is possible that none of these substituents are joined to form a ring.

According to an embodiment of the present disclosure, $L_a$ is, at each occurrence identically or differently, selected from the group consisting of the following:
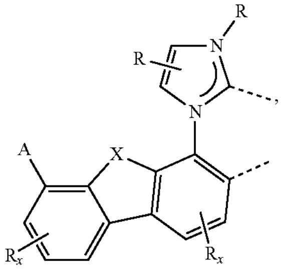
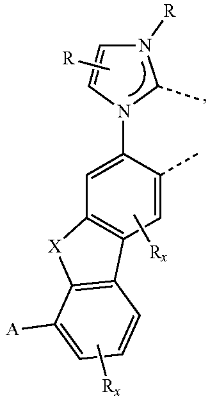
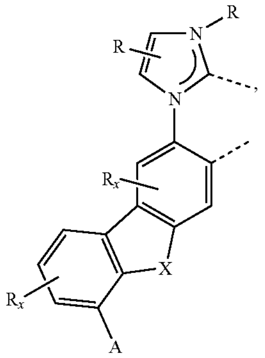
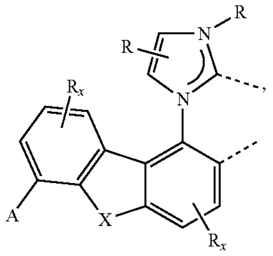
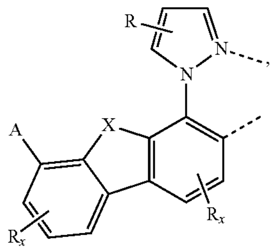
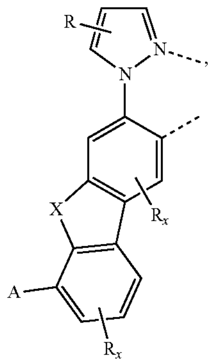
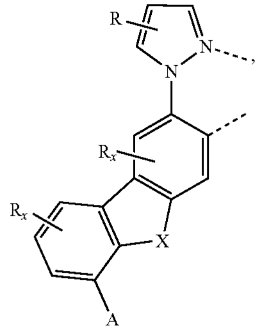
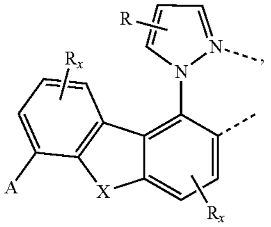
-continued
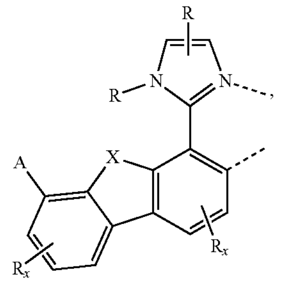
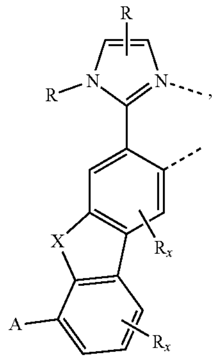
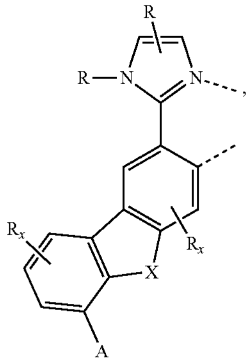
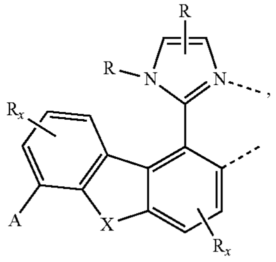
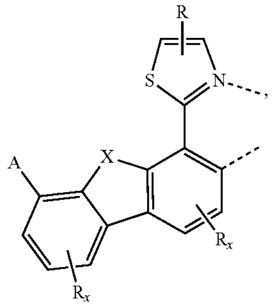
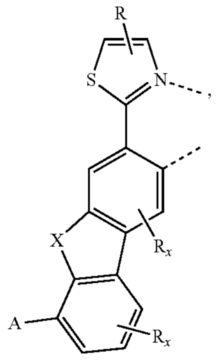
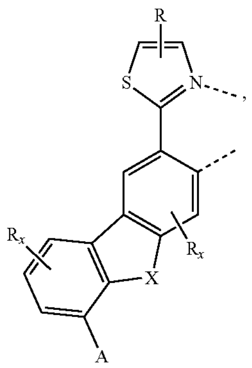
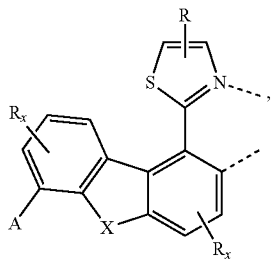

-continued
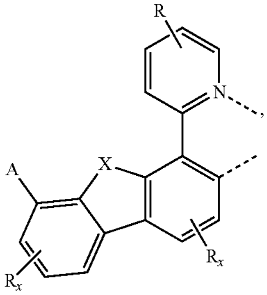
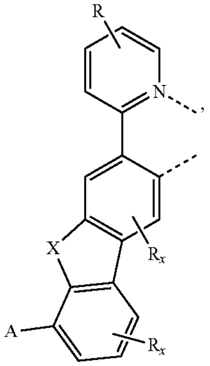
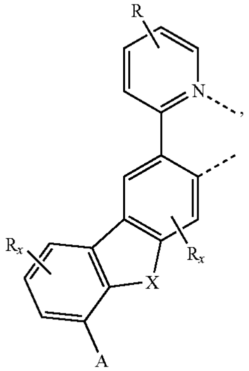
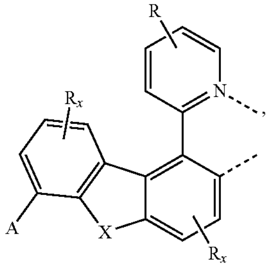
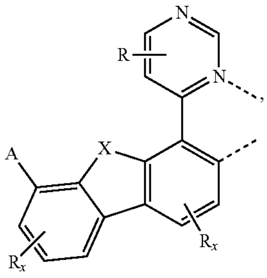
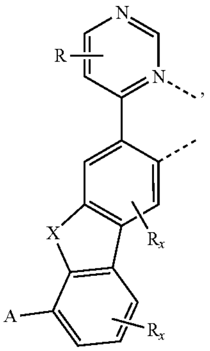
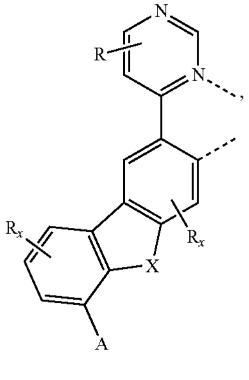
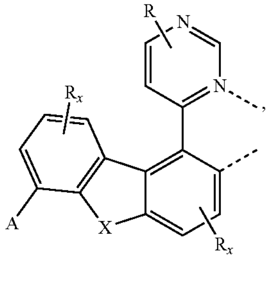
-continued
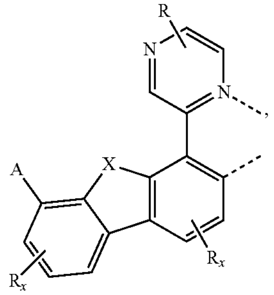
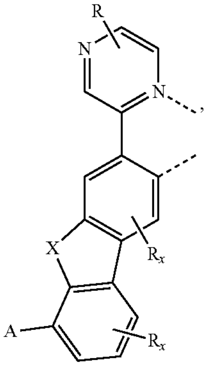
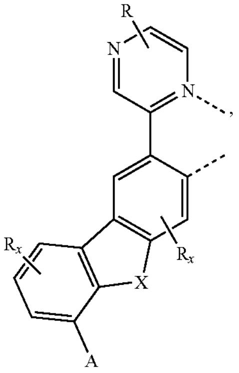
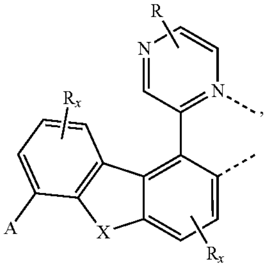
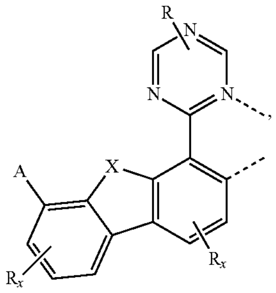
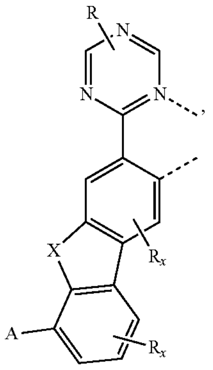
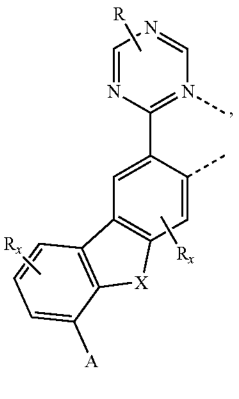
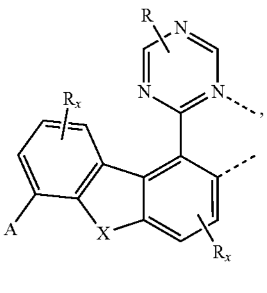

-continued
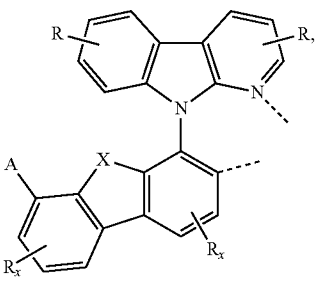
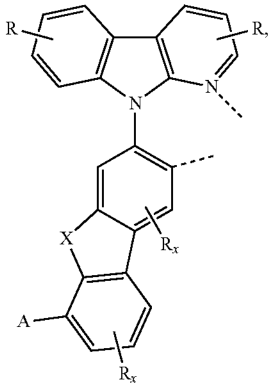
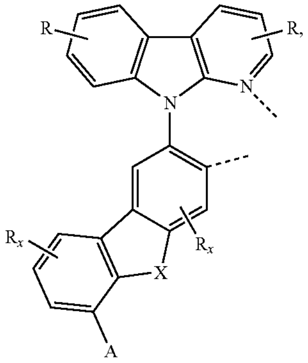
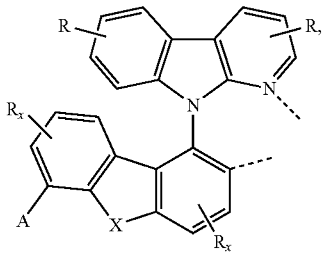
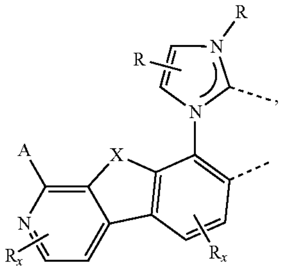
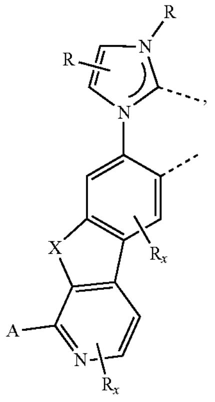
-continued
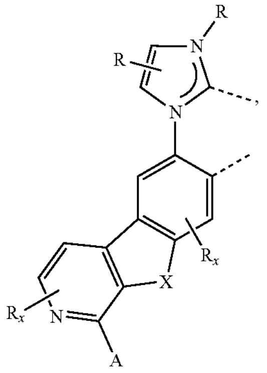
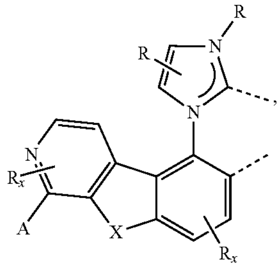
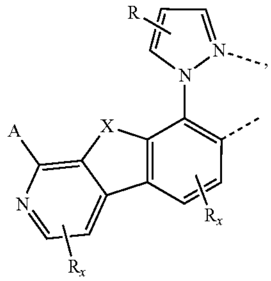
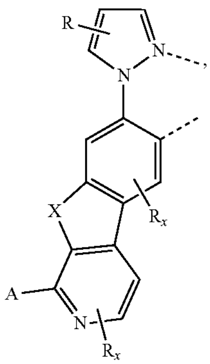
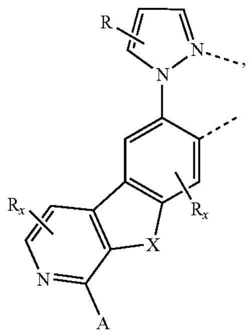
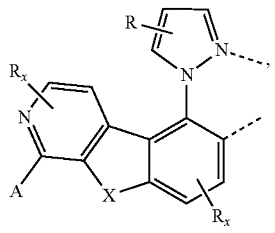
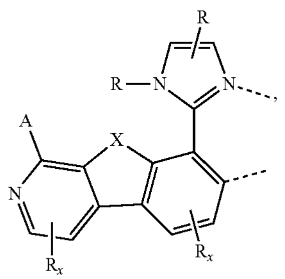
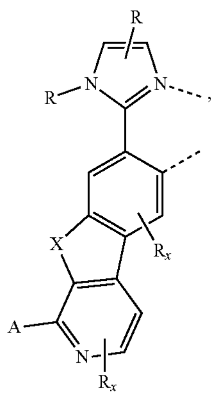

-continued
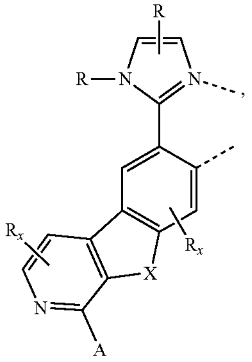
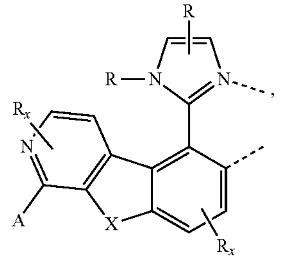
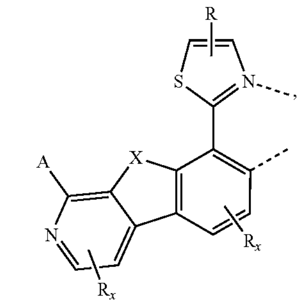
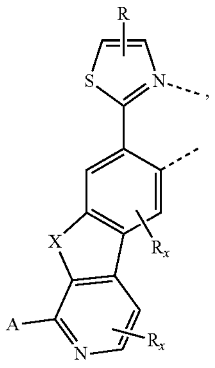
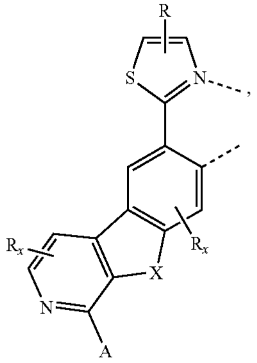
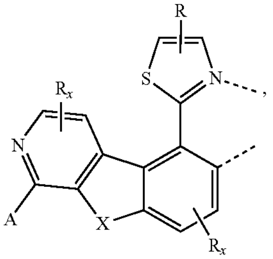
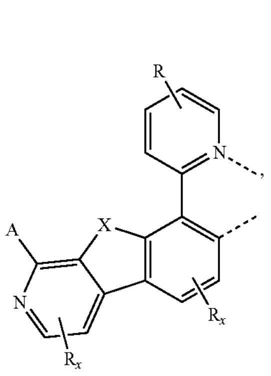
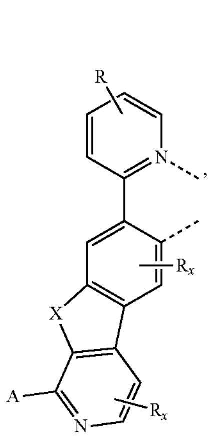
-continued
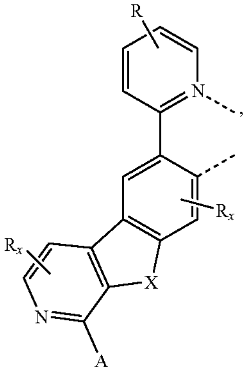
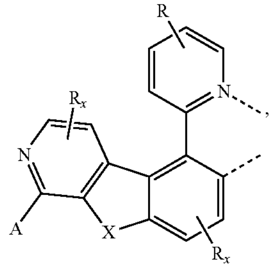
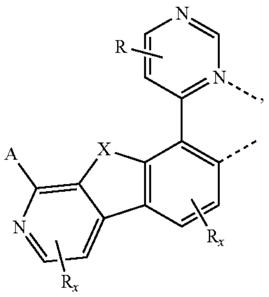
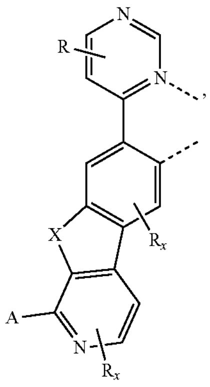
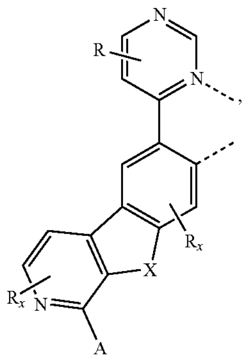
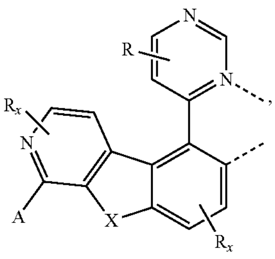
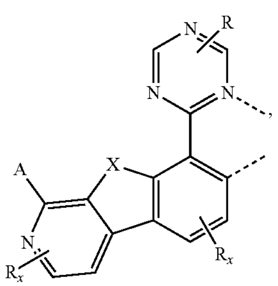
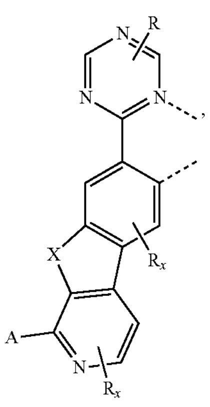

-continued
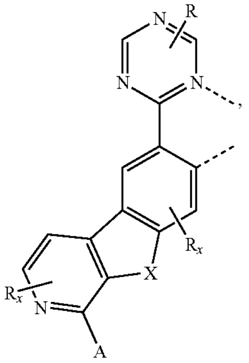
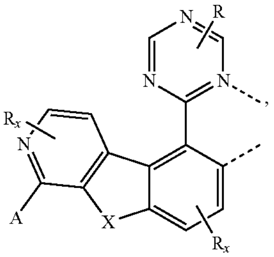
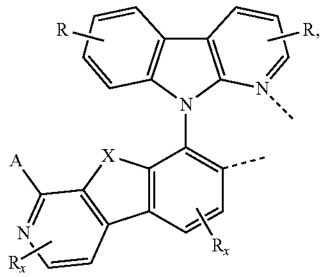
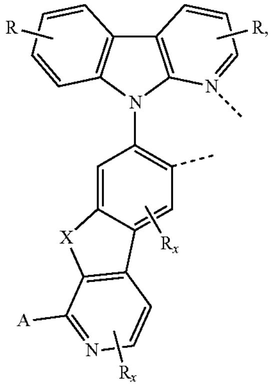
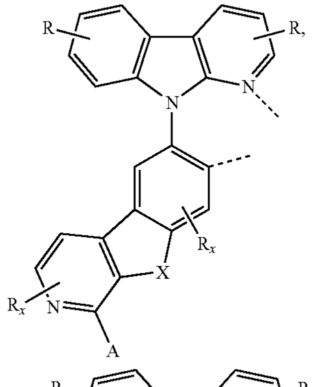
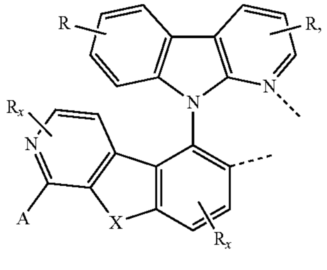
-continued
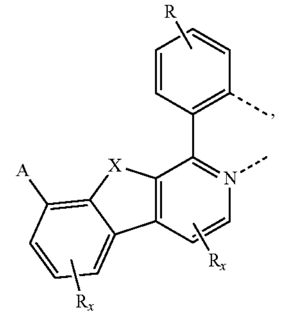
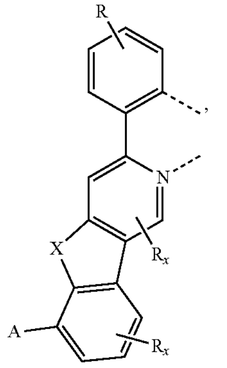
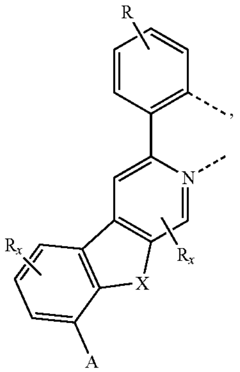
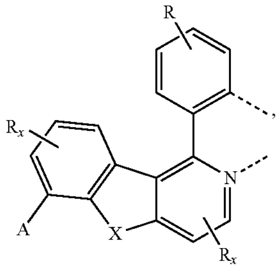
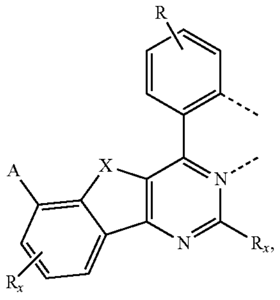
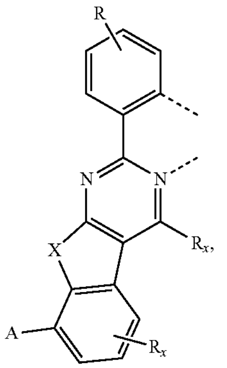
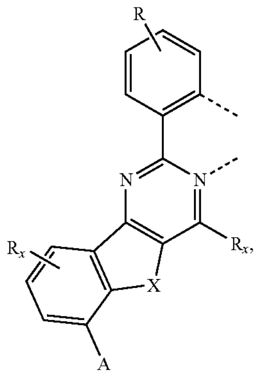
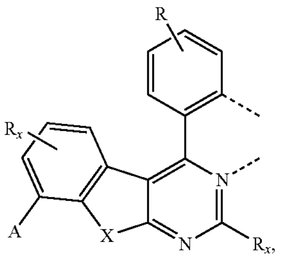

-continued

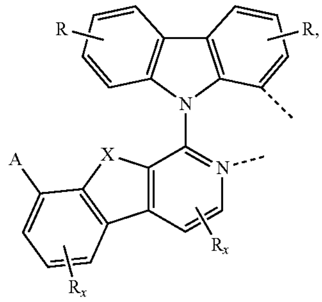

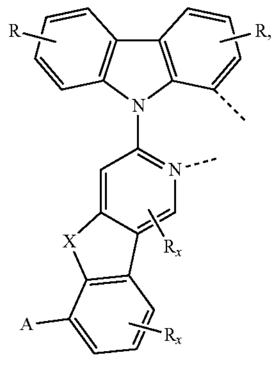

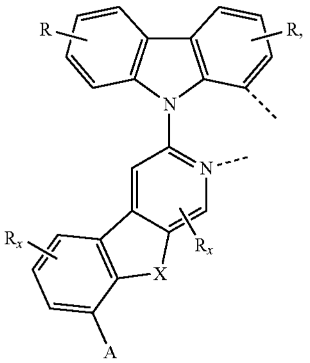

and

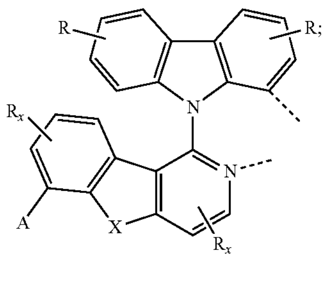

wherein

X is selected from the group consisting of O, S, Se, NR', CR'R', SiR'R' and GeR'R', wherein when two R' are present at the same time, the two R' are the same or different;

R and $R_x$ represent, at each occurrence identically or differently, mono-substitution, multiple substitutions or non-substitution;

A has a structure represented by Formula 2:

Formula 2

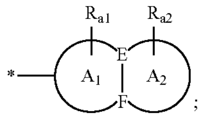

E and F are, at each occurrence identically or differently, selected from C, CR", N, SiR" or GeR";

$R_{a1}$ and $R_{a2}$ represent, at each occurrence identically or differently, mono-substitution, multiple substitutions or non-substitution;

the ring $A_1$ and the ring $A_2$ are fused through E and F, and the ring $A_1$ and the ring $A_2$ satisfy one of the following two cases:

the first case: the ring $A_1$ is selected from an alicyclic ring having 3 to 30 ring atoms, a heterocyclic ring having 3 to 30 ring atoms or a combination thereof; and the ring $A_2$ is selected from an alicyclic ring having 3 to 30 ring atoms, an aromatic ring having 6 to 30 ring atoms, a heterocyclic ring having 3 to 30 ring atoms, a heteroaromatic ring having 5 to 30 ring atoms or a combination thereof;

the second case: the ring $A_1$ is selected from an aromatic ring having 6 to 30 ring atoms, a heteroaromatic ring having 5 to 30 ring atoms or a combination thereof; and the ring $A_2$ is selected from an alicyclic ring having 3 to 30 ring atoms, a heterocyclic ring having 3 to 30 ring atoms or a combination thereof;

"*" represents a position where A is joined;

R, R', R", $R_x$, $R_{a1}$ and $R_{a2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R, R', R", $R_x$, $R_{a1}$, $R_{a2}$ can be optionally joined to form a ring.

In the present disclosure, the expression that "adjacent substituents R, R', R", $R_x$, $R_{a1}$, $R_{a2}$ can be optionally joined to form a ring" is intended to mean that any one or more of groups of adjacent substituents, such as two substituents R, two substituents R', two substituents $R_x$, two substituents $R_{a1}$, two substituents $R_{a2}$, substituents $R_{a1}$ and $R_{a2}$, substituents $R_{a1}$ and R", substituents $R_{a2}$ and R" and substituents R' and $R_x$, can be joined to form a ring. Obviously, it is possible that none of these substituents are joined to form a ring.

According to an embodiment of the present disclosure, the metal complex has a general formula of $M(L_a)_m(L_b)_n(L_c)_q$;

wherein

M is, at each occurrence identically or differently, selected from the group consisting of Cu, Ag, Au, Ru, Rh, Pd, Os, Ir and Pt;

$L_a$, $L_b$ and $L_c$ are a first ligand, a second ligand and a third ligand coordinated to the metal M, respectively, and $L_c$ is the same as or different from $L_a$ or $L_b$; wherein $L_a$, $L_b$ and $L_c$ can be optionally joined to form a multidentate ligand; for example, any two of $L_a$, $L_b$ and $L_c$ may be joined to form a tetradentate ligand; in another example, $L_a$, $L_b$ and $L_c$ may be joined to each other to form a hexadentate ligand; in another example, none of $L_a$, $L_b$ and $L_c$ are joined so that no multidentate ligand is formed;

m is selected from 1, 2 or 3, n is selected from 0, 1 or 2, q is selected from 0, 1 or 2, and m+n+q equals an oxidation state of the metal M; wherein when m is greater than or equal to 2, multiple $L_a$ are the same or different; when n is equal to 2, two $L_b$ are the same or different; when q is equal to 2, two $L_c$ are the same or different;

$L_b$ and $L_c$ are, at each occurrence identically or differently, selected from a structure represented by any one of the group consisting of the following:

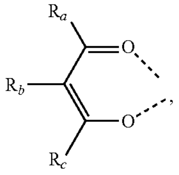
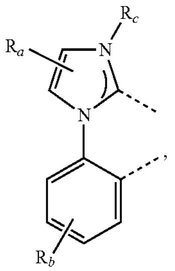
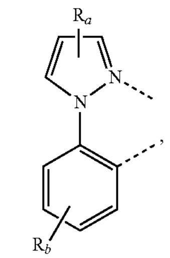
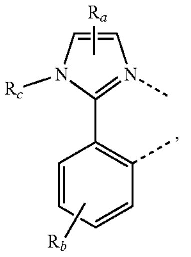
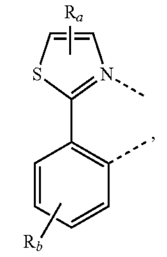
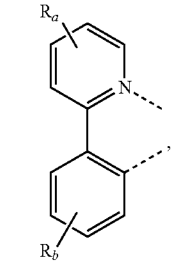
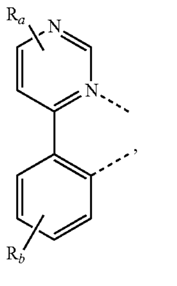
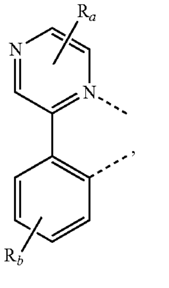
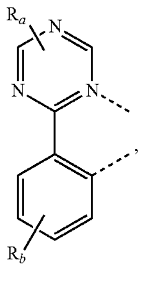

-continued

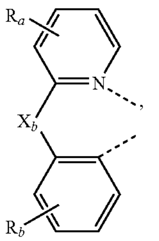
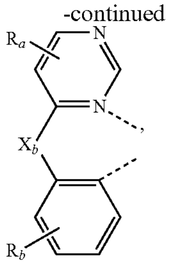
and
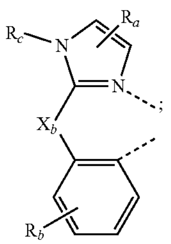

wherein $R_a$ and $R_b$ represent, at each occurrence identically or differently, mono-substitution, multiple substitutions or non-substitution;

$X_b$ is, at each occurrence identically or differently, selected from the group consisting of O, S, Se, $NR_{N1}$ and $CR_{C1}R_{C2}$;

$R_a$, $R_b$, $R_c$, $R_{N1}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_a$, $R_b$, $R_c$, $R_{N1}$, $R_{C1}$ and $R_{C2}$ can be optionally joined to form a ring.

In the present disclosure, the expression that "adjacent substituents $R_a$, $R_b$, $R_c$, $R_{N1}$, $R_{C1}$ and $R_{C2}$ can be optionally joined to form a ring" is intended to mean that any one or more of groups of adjacent substituents, such as two substituents $R_a$, two substituents $R_b$, substituents $R_a$ and $R_b$, substituents $R_a$ and $R_c$, substituents $R_b$ and $R_c$, substituents $R_a$ and $R_{N1}$, substituents $R_b$ and $R_{N1}$, substituents $R_a$ and $R_c$, substituents $R_a$ and $R_{C2}$, substituents $R_b$ and $R_{C1}$, substituents $R_b$ and $R_{C2}$ and substituents $R_{C1}$ and $R_{C2}$, can be joined to form a ring. Obviously, it is possible that none of these substituents are joined to form a ring.

According to an embodiment of the present disclosure, the metal M is, at each occurrence identically or differently, selected from the group consisting of Cu, Ag, Au, Ru, Rh, Pd, Os, Ir and Pt.

According to an embodiment of the present disclosure, the metal M is, at each occurrence identically or differently, selected from Pt or Ir.

According to an embodiment of the present disclosure, the metal complex $Ir(L_a)_m(L_b)_{3-m}$ has a structure represented by Formula 3:

Formula 3

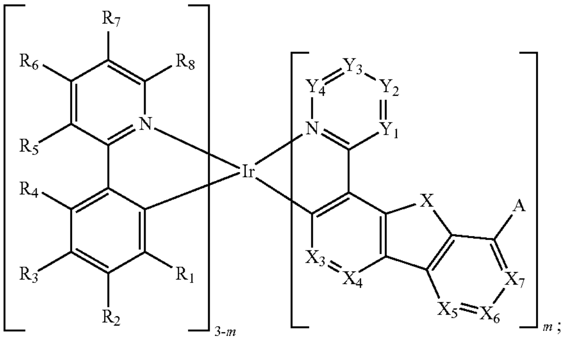

wherein m is selected from 1, 2 or 3; when m is selected from 1, two $L_b$ are the same or different;

when m is selected from 2 or 3, multiple $L_a$ are the same or different;

$Y_1$ to $Y_4$ are, at each occurrence identically or differently, selected from $CR_y$ or N;

X is selected from the group consisting of O, S, Se, NR', SiR'R' and GeR'R', wherein when two R' are present at the same time, the two R' are the same or different;

$X_3$ to $X_7$ are, at each occurrence identically or differently, selected from $CR_x$ or N;

A has a structure represented by Formula 2:

Formula 2

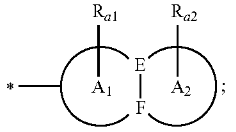

E and F are, at each occurrence identically or differently, selected from C, CR", N, SiR" or GeR";

$R_{a1}$ and $R_{a2}$ represent, at each occurrence identically or differently, mono-substitution, multiple substitutions or non-substitution;

the ring $A_1$ and the ring $A_2$ are fused through E and F, and the ring $A_1$ and the ring $A_2$ satisfy one of the following two cases:

the first case: the ring $A_1$ is selected from an alicyclic ring having 3 to 30 ring atoms, a heterocyclic ring having 3 to 30 ring atoms or a combination thereof; and the ring $A_2$ is selected from an alicyclic ring having 3 to 30 ring atoms, an aromatic ring having 6 to 30 ring atoms, a heterocyclic ring having 3 to 30 ring atoms, a heteroaromatic ring having 5 to 30 ring atoms or a combination thereof;

the second case: the ring $A_1$ is selected from an aromatic ring having 6 to 30 ring atoms, a heteroaromatic ring having 5 to 30 ring atoms or a combination thereof; and the ring $A_2$ is selected from an alicyclic ring having 3 to 30 ring atoms, a heterocyclic ring having 3 to 30 ring atoms or a combination thereof;

R', R", $R_x$, $R_y$, $R_{a1}$, $R_{a2}$ and $R_1$ to $R_8$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R', R", $R_x$, $R_y$, $R_{a1}$, $R_{a2}$ can be optionally joined to form a ring;

adjacent substituents $R_1$ to $R_8$ can be optionally joined to form a ring; and "*" represents a position where A is joined.

In the present disclosure, the expression that "adjacent substituents R', R", $R_x$, $R_y$, $R_{a1}$, $R_{a2}$ can be optionally joined to form a ring" is intended to mean that any one or at least two of groups of adjacent substituents, such as two substituents R', two substituents $R_x$, two substituents $R_y$, two substituents $R_{a1}$, two substituents $R_{a2}$, substituents R' and $R_x$, substituents $R_{a1}$ and $R_{a2}$, substituents $R_{a1}$ and R" and substituents $R_{a2}$ and R" can be joined to form a ring. Obviously, it is possible that none of these substituents are joined to form a ring.

In the present disclosure, the expression that "adjacent substituents $R_1$ to $R_8$ can be optionally joined to form a ring" is intended to mean that any one or at least two of groups of adjacent substituents, such as adjacent substituents $R_1$ and $R_2$, adjacent substituents $R_3$ and $R_2$, adjacent substituents $R_3$ and $R_4$, adjacent substituents $R_5$ and $R_4$, adjacent substituents $R_5$ and $R_6$, adjacent substituents $R_7$ and $R_6$ and adjacent substituents $R_7$ and $R_8$, can be joined to form a ring. Obviously, it is possible that none of these substituents are joined to form a ring.

According to an embodiment of the present disclosure, the metal complex $Ir(L_a)_m(L_b)_{3-m}$ has a structure represented by Formula 3A:

Formula 3A

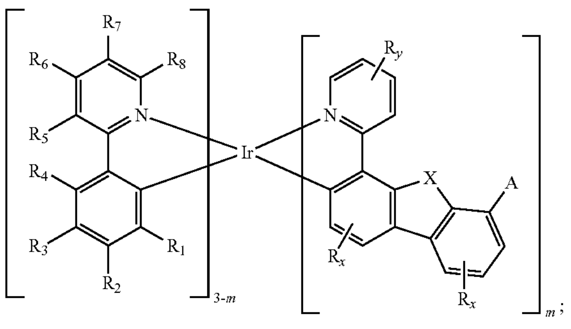

wherein m is selected from 1, 2 or 3; when m is selected from 1, two $L_b$ are the same or different; when m is selected from 2 or 3, multiple $L_a$ are the same or different;

X is selected from the group consisting of O, S, Se, NR', CR'R', SiR'R' and GeR'R', wherein when two R' are present at the same time, the two R' are the same or different;

$R_x$ and $R_y$ represent, at each occurrence identically or differently, mono-substitution, multiple substitutions or non-substitution;

A has a structure represented by Formula 2:

Formula 2

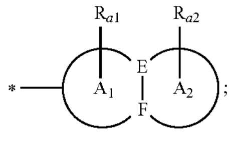

E and F are, at each occurrence identically or differently, selected from C, CR", N, SiR" or GeR";

$R_{a1}$ and $R_{a2}$ represent, at each occurrence identically or differently, mono-substitution, multiple substitutions or non-substitution;

the ring $A_1$ and the ring $A_2$ are fused through E and F, and the ring $A_1$ and the ring $A_2$ satisfy one of the following two cases:

the first case: the ring $A_1$ is selected from an alicyclic ring having 3 to 30 ring atoms, a heterocyclic ring having 3 to 30 ring atoms or a combination thereof; and the ring $A_2$ is selected from an alicyclic ring having 3 to 30 ring atoms, an aromatic ring having 6 to 30 ring atoms, a heterocyclic ring having 3 to 30 ring atoms, a heteroaromatic ring having 5 to 30 ring atoms or a combination thereof;

the second case: the ring $A_1$ is selected from an aromatic ring having 6 to 30 ring atoms, a heteroaromatic ring having 5 to 30 ring atoms or a combination thereof; and the ring $A_2$ is selected from an alicyclic ring having 3 to 30 ring atoms, a heterocyclic ring having 3 to 30 ring atoms or a combination thereof;

R', R", $R_x$, $R_y$, $R_{a1}$, $R_{a2}$ and $R_1$ to $R_8$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R', R", $R_x$, $R_y$, $R_{a1}$, $R_{a2}$ can be optionally joined to form a ring;

adjacent substituents $R_1$ to $R_8$ can be optionally joined to form a ring; and "*" represents a position where A is joined.

According to an embodiment of the present disclosure, wherein, X is selected from O or S.

According to an embodiment of the present disclosure, wherein, X is O.

According to an embodiment of the present disclosure, wherein, $X_1$ to $X_7$ are, at each occurrence identically or differently, selected from C or $CR_x$.

According to an embodiment of the present disclosure, wherein, at least one of $X_1$ to $X_7$ is N, for example, one of $X_1$ to $X_7$ is N or two of $X_1$ to $X_7$ are N.

According to an embodiment of the present disclosure, in Formula 3, $X_3$ to $X_7$ are, at each occurrence identically or differently, selected from $CR_x$.

According to an embodiment of the present disclosure, in Formula 3, at least one of $X_3$ to $X_7$ is N, for example, one of $X_3$ to $X_7$ is N or two of $X_3$ to $X_7$ are N.

According to an embodiment of the present disclosure, wherein, $Y_1$ to $Y_4$ are, at each occurrence identically or differently, selected from $CR_y$.

According to an embodiment of the present disclosure, wherein, at least one of $Y_1$ to $Y_4$ is N, for example, one of $Y_1$ to $Y_4$ is N or two of $Y_1$ to $Y_4$ are N.

According to an embodiment of the present disclosure, wherein, $R_x$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted alkylgermanyl having 3 to 20 carbon atoms, cyano and combinations thereof.

According to an embodiment of the present disclosure, wherein, $R_x$ is, at each occurrence identically or differently, selected from the group consisting of: hydrogen, deuterium, fluorine, substituted or unsubstituted alkyl having 1 to 6 carbon atoms, substituted or unsubstituted cycloalkyl having 3 to 6 ring carbon atoms, substituted or unsubstituted aryl having 6 to 12 carbon atoms, substituted or unsubstituted heteroaryl having 3 to 12 carbon atoms, substituted or unsubstituted alkylsilyl having 3 to 6 carbon atoms, substituted or unsubstituted alkylgermanyl having 3 to 6 carbon atoms, cyano and combinations thereof.

According to an embodiment of the present disclosure, wherein, $R_x$ is, at each occurrence identically or differently, selected from the group consisting of: hydrogen, deuterium, fluorine, cyano, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, phenyl, pyridyl, trimethylsilyl, trimethyl germanyl and combinations thereof.

According to an embodiment of the present disclosure, wherein, at least one of $X_1$ to $X_7$ is selected from $CR_x$, and the $R_x$ is cyano or fluorine.

According to an embodiment of the present disclosure, wherein, at least one of $X_3$ to $X_7$ is selected from $CR_x$, and the $R_x$ is cyano or fluorine.

According to an embodiment of the present disclosure, wherein, at least one of $X_5$ to $X_7$ is selected from $CR_x$, and the $R_x$ is cyano or fluorine.

According to an embodiment of the present disclosure, wherein, $X_7$ is selected from $CR_x$, and the $R_x$ is cyano or fluorine.

According to an embodiment of the present disclosure, wherein, the ring $A_1$ is selected from an alicyclic ring having 3 to 10 ring atoms, a heterocyclic ring having 3 to 10 ring atoms or a combination thereof; and the ring $A_2$ is selected from an alicyclic ring having 3 to 10 ring atoms, an aromatic ring having 6 to 18 ring atoms, a heterocyclic ring having 3 to 10 ring atoms, a heteroaromatic ring having 5 to 18 ring atoms or a combination thereof.

According to an embodiment of the present disclosure, wherein, the ring $A_1$ is selected from the group consisting of: cyclopentane, cyclopentene, cyclohexane, cyclohexene, cycloheptane, cycloheptene, and the following groups containing one heteroatom or at least two heteroatoms of nitrogen, oxygen, sulfur, selenium, silicon and germanium: heterocyclopentane, heterocyclopentene, heterocyclohexane, heterocyclohexene, heterocycloheptane and heterocycloheptene; and the ring $A_2$ is selected from the group consisting of: benzene, naphthalene, phenanthrene, triphenylene, pyridine, pyrimidine, pyrazine, pyridazine, triazine, pyrrole, furan, thiophene, imidazole, thiazole, oxazole, cyclopentane, cyclopentene, cyclohexane, cyclohexene, cycloheptane, cycloheptene and the following groups containing one heteroatom or at least two heteroatoms of nitrogen, oxygen, sulfur, selenium, silicon and germanium: heterocyclopentane, heterocyclopentene, heterocyclohexane, heterocyclohexene, heterocycloheptane and heterocycloheptene.

According to an embodiment of the present disclosure, wherein, the ring $A_1$ is selected from an aromatic ring having 6 to 18 ring atoms, a heteroaromatic ring having 5 to 18 ring atoms or a combination thereof; and the ring $A_2$ is selected from an alicyclic ring having 3 to 10 ring atoms, a heterocyclic ring having 3 to 10 ring atoms or a combination thereof.

According to an embodiment of the present disclosure, wherein, the ring $A_1$ is selected from benzene, naphthalene, phenanthrene, triphenylene, pyridine, pyrimidine, pyrazine, pyridazine, triazine, pyrrole, furan, thiophene, imidazole, thiazole or oxazole; and the ring $A_2$ is selected from cyclopentane, cyclopentene, cyclohexane, cyclohexene, cycloheptane, cycloheptene or the following groups containing one heteroatom or at least two heteroatoms of nitrogen, oxygen, sulfur, selenium, silicon and germanium: heterocyclopentane, heterocyclopentene, heterocyclohexane, heterocyclohexene, heterocycloheptane and heterocycloheptene.

According to an embodiment of the present disclosure, wherein, the ring $A_1$ is selected from benzene; and the ring $A_2$ is selected from cyclopentene, cyclohexene or cycloheptene.

According to an embodiment of the present disclosure, wherein, the ring $A_1$ is selected from cyclopentene, cyclohexene or cycloheptene; and the ring $A_2$ is selected from benzene.

According to an embodiment of the present disclosure, wherein, $R_{a1}$ and $R_{a2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, a hydroxyl group, a sulfanyl group, a cyano group and combinations thereof.

According to an embodiment of the present disclosure, wherein, $R_{a1}$ and $R_{a2}$ are, at each occurrence identically or differently, selected from the group consisting of: hydrogen, deuterium, fluorine, substituted or unsubstituted alkyl having 1 to 6 carbon atoms, substituted or unsubstituted cycloalkyl having 3 to 6 ring carbon atoms, substituted or unsubstituted aryl having 6 to 18 carbon atoms, substituted or unsubstituted heteroaryl having 3 to 18 carbon atoms, substituted or unsubstituted alkylsilyl having 3 to 15 carbon atoms, cyano and combinations thereof.

According to an embodiment of the present disclosure, wherein, $R_{a1}$ and $R_{a2}$ are, at each occurrence identically or differently, selected from the group consisting of: hydrogen, deuterium, substituted or unsubstituted alkyl having 1 to 6 carbon atoms, substituted or unsubstituted cycloalkyl having 3 to 6 ring carbon atoms, cyano and combinations thereof.

According to an embodiment of the present disclosure, wherein, $R_{a1}$ and $R_{a2}$ are, at each occurrence identically or differently, selected from the group consisting of: hydrogen, deuterium, fluorine, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, phenyl, pyridyl, trimethylsilyl, cyano and combinations thereof.

According to an embodiment of the present disclosure, wherein, A is, at each occurrence identically or differently, selected from the group consisting of A-1 to A-264, wherein the specific structures of A-1 to A-264 are referred to claim 13.

According to an embodiment of the present disclosure, hydrogens in A-1 to A-264 can be partially or fully deuterated, and the specific structures of A-1 to A-264 are referred to claim 13.

According to an embodiment of the present disclosure, in Formula 3 and Formula 3A, $R_y$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted arylalkyl having 7 to 30 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms and combinations thereof.

According to an embodiment of the present disclosure, wherein, in Formula 3 and Formula 3A, $R_y$ is, at each occurrence identically or differently, selected from the group consisting of: hydrogen, deuterium, fluorine, substituted or unsubstituted alkyl having 1 to 6 carbon atoms, substituted or unsubstituted cycloalkyl having 3 to 6 ring carbon atoms, substituted or unsubstituted aryl having 6 to 12 carbon atoms, substituted or unsubstituted heteroaryl having 3 to 11 carbon atoms, substituted or unsubstituted alkylsilyl having 3 to 6 carbon atoms, cyano and combinations thereof.

According to an embodiment of the present disclosure, wherein, in Formula 3 and Formula 3A, $R_y$ is, at each occurrence identically or differently, selected from the group consisting of: hydrogen, deuterium, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, phenyl, pyridyl, trimethylsilyl and combinations thereof.

According to an embodiment of the present disclosure, in Formula 3 and Formula 3A, at least one $R_y$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof.

According to an embodiment of the present disclosure, $R_7$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof.

According to an embodiment of the present disclosure, in Formula 3 and Formula 3A, at least one or at least two of $R_5$ to $R_8$ are selected from substituted or unsubstituted alkyl having 1 to 20 carbon atoms, substituted or unsubstituted cycloalkyl having 3 to 20 ring carbon atoms or a combination thereof, and the total number of carbon atoms in all of $R_5$ to $R_8$ is at least 4.

According to an embodiment of the present disclosure, in Formula 3 and Formula 3A, at least one or at least two of $R_6$ and $R_7$ are selected from substituted or unsubstituted alkyl having 1 to 20 carbon atoms, substituted or unsubstituted cycloalkyl having 3 to 20 ring carbon atoms or a combination thereof, and the total number of carbon atoms in both of $R_6$ and $R_7$ is at least 4.

According to an embodiment of the present disclosure, in Formula 3 and Formula 3A, at least one, at least two, at least three or all of $R_2$, $R_3$, $R_6$ and $R_7$ are selected from the group consisting of: deuterium, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof.

According to an embodiment of the present disclosure, in Formula 3 and Formula 3A, at least one, at least two, at least three or all of $R_2$, $R_3$, $R_6$ and $R_7$ are selected from the group consisting of: deuterium, substituted or unsubstituted alkyl having 1 to 20 carbon atoms, substituted or unsubstituted cycloalkyl having 3 to 20 ring carbon atoms and combinations thereof.

According to an embodiment of the present disclosure, in Formula 3 and Formula 3A, at least one, at least two, at least three or all of $R_2$, $R_3$, $R_6$ and $R_7$ are selected from the group consisting of: deuterium, methyl, ethyl, propyl, isopropyl, n-butyl, isobutyl, t-butyl, cyclopentyl, cyclohexyl and combinations thereof; optionally, hydrogens in the above groups can be partially or fully deuterated.

According to an embodiment of the present disclosure, R' is, at each occurrence identically or differently, selected from substituted or unsubstituted alkyl having 1 to 20 carbon atoms or substituted or unsubstituted cycloalkyl having 3 to 20 ring carbon atoms.

According to an embodiment of the present disclosure, R" is, at each occurrence identically or differently, selected from hydrogen, deuterium, substituted or unsubstituted alkyl having 1 to 20 carbon atoms or substituted or unsubstituted cycloalkyl having 3 to 20 ring carbon atoms.

According to an embodiment of the present disclosure, R' is, at each occurrence identically or differently, selected from methyl or deuterated methyl.

According to an embodiment of the present disclosure, $L_a$ is, at each occurrence identically or differently, selected from the group consisting of: $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$, wherein the specific structures of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$ are referred to claim 17.

According to an embodiment of the present disclosure, hydrogens in the structures of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$ can be partially or fully deuterated, wherein the specific structures of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$ are referred to claim 17.

According to an embodiment of the present disclosure, $L_b$ is, at each occurrence identically or differently, selected from the group consisting of $L_{b1}$ to $L_{b329}$, wherein the specific structures of $L_{b1}$ to $L_{b329}$ are referred to claim 18.

According to an embodiment of the present disclosure, hydrogens in the structures of $L_{b1}$ to $L_{b329}$ can be partially or fully deuterated, wherein the specific structures of $L_{b1}$ to $L_{b329}$ are referred to claim 18.

According to an embodiment of the present disclosure, $L_c$ is, at each occurrence identically or differently, selected from the group consisting of $L_{c1}$ to $L_{c360}$, wherein the specific structures of $L_{c1}$ to $L_{c360}$ are referred to claim 19.

According to an embodiment of the present disclosure, the metal complex has a structure of $Ir(L_a)_2(L_b)$, wherein $L_a$ is, at each occurrence identically or differently, selected from any one or any two of the group consisting of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$, and $L_b$ is selected from any one of the group consisting of $L_{b1}$ to $L_{b329}$, wherein the specific structures of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$ are referred to claim 17 and the specific structures of $L_{b1}$ to $L_{b329}$ are referred to claim 18.

According to an embodiment of the present disclosure, the metal complex has a structure of $Ir(L_a)(L_b)_2$, wherein $L_a$ is, at each occurrence identically or differently, selected from any one of the group consisting of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$, and $L_b$ is selected from any one or any two of the group consisting of $L_{b1}$ to $L_{b329}$, wherein the specific structures of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$ are referred to claim 17 and the specific structures of $L_{b1}$ to $L_{b329}$ are referred to claim 18.

According to an embodiment of the present disclosure, the metal complex has a structure of $Ir(L_a)_3$, wherein $L_a$ is, at each occurrence identically or differently, selected from any one or any two or any three of the group consisting of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$, wherein the specific structures of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$ are referred to claim 17.

According to an embodiment of the present disclosure, the metal complex has a structure of $Ir(L_a)_2(L_c)$, wherein $L_a$ is, at each occurrence identically or differently, selected from any one or any two of the group consisting of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$, and $L_c$ is selected from any one of the group consisting of $L_{c1}$ to $L_{c360}$, wherein the specific structures of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$ are referred to claim 17 and the specific structures of $L_{c1}$ to $L_{c360}$ are referred to claim 19.

According to an embodiment of the present disclosure, the metal complex has a structure of $Ir(L_a)(L_c)_2$, wherein $L_a$ is, at each occurrence identically or differently, selected from any one of the group consisting of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$, and $L_c$ is selected from any one or any two of the group consisting of $L_{c1}$ to $L_{c360}$, wherein the specific structures of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$ are referred to claim 17 and the specific structures of $L_{c1}$ to $L_{c360}$ are referred to claim 19.

According to an embodiment of the present disclosure, the metal complex has a structure of $Ir(L_a)(L_b)(L_c)$, wherein $L_a$ is, at each occurrence identically or differently, selected from any one of the group consisting of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$, $L_b$ is selected from any one of the group consisting of $L_{b1}$ to $L_{b329}$, and $L_c$ is selected from any one of the group consisting of $L_{c1}$ to $L_{c360}$, wherein the specific structures of $L_{a1-1}$ to $L_{a1-497}$, $L_{a2-1}$ to $L_{a2-485}$, $L_{a3-1}$ to $L_{a3-485}$ and $L_{a4-1}$ to $L_{a4-226}$ are referred to claim 17, the specific structures of $L_{b1}$ to $L_{b329}$ are referred to claim 18, and the specific structures of $L_{c1}$ to $L_{c360}$ are referred to claim 19.

According to an embodiment of the present disclosure, the metal complex is selected from the group consisting of Metal Complex 1 to Metal Complex 2454, wherein the specific structures of Metal Complex 1 to Metal Complex 2454 are referred to claim 20.

According to an embodiment of the present disclosure, hydrogens in the structures of Metal Complex 1 to Metal Complex 2454 can be partially or fully deuterated, wherein the specific structures of Metal Complex 1 to Metal Complex 2454 are referred to claim 20.

According to an embodiment of the present disclosure, disclosed is an electroluminescent device. The electroluminescent device comprises:

an anode, a cathode, and an organic layer disposed between the anode and the cathode, wherein the organic layer comprises the metal complex in any one of the preceding embodiments.

According to an embodiment of the present disclosure, in the electroluminescent device, the organic layer comprising the metal complex is a light-emitting layer.

According to an embodiment of the present disclosure, the electroluminescent device emits green light.

According to an embodiment of the present disclosure, the electroluminescent device emits white light.

According to an embodiment of the present disclosure, in the electroluminescent device, the light-emitting layer comprises a first host compound.

According to an embodiment of the present disclosure, in the electroluminescent device, the light-emitting layer comprises a first host compound and a second host compound.

According to an embodiment of the present disclosure, in the electroluminescent device, the first host compound and/or the second host compound comprise at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

According to an embodiment of the present disclosure, the first host compound has a structure represented by Formula 4:

Formula 4

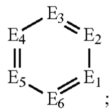

;

wherein $E_1$ to $E_6$ are, at each occurrence identically or differently, selected from C, $CR_c$ or N, at least two of $E_1$ to $E_6$ are N, and at least one of $E_1$ to $E_6$ is C and joined to Formula A;

Formula A

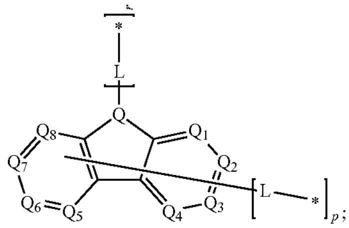

;

wherein

Q is, at each occurrence identically or differently, selected from the group consisting of O, S, Se, N, NR''', CR'''R''', SiR'''R''', GeR'''R''' and R'''C═CR'''; when two R''' are present at the same time, the two R''' may be the same or different;

p is 0 or 1; r is 0 or 1;

when Q is selected from N, p is 0 and r is 1;

when Q is selected from the group consisting of O, S, Se, NR''', CR'''R''', SiR'''R''', GeR'''R''' and R'''C═CR''', p is 1 and r is 0;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

$Q_1$ to $Q_8$ are, at each occurrence identically or differently, selected from C, $CR_q$ or N;

$R_c$, R''' and $R_q$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

"*" represents a position where Formula A is joined to Formula 4; and adjacent substituents $R_c$, R''', $R_q$ can be optionally joined to form a ring.

In the present disclosure, the expression that "adjacent substituents $R_c$, R''', $R_q$ can be optionally joined to form a ring" is intended to mean that any one or at least two of groups of adjacent substituents, such as two substituents $R_c$, two substituents R''', substituents $R_q$ and substituents R''' and $R_q$, can be joined to form a ring. Obviously, it is possible that none of these substituents are joined to form a ring.

According to an embodiment of the present disclosure, Q is, at each occurrence identically or differently, selected from O, S, N or NR'''.

According to an embodiment of the present disclosure, $E_1$ to $E_6$ are, at each occurrence identically or differently, selected from C, $CR_c$ or N, three of $E_1$ to $E_6$ are N, at least one of $E_1$ to $E_6$ is $CR_c$, and $R_c$ is, at each occurrence identically or differently, selected from the group consisting of: substituted or unsubstituted aryl having 6 to 30 carbon atoms, substituted or unsubstituted heteroaryl having 3 to 30 carbon atoms and combinations thereof.

According to an embodiment of the present disclosure, $E_1$ to $E_6$ are, at each occurrence identically or differently, selected from C, $CR_c$ or N, three of $E_1$ to $E_6$ are N, at least one of $E_1$ to $E_6$ is $CR_c$, and $R_c$ is, at each occurrence identically or differently, selected from substituted or unsubstituted phenyl, substituted or unsubstituted biphenyl, substituted or unsubstituted terphenyl, substituted or unsubstituted naphthyl, substituted or unsubstituted phenanthryl, substituted or unsubstituted triphenylene, substituted or unsubstituted fluorenyl, substituted or unsubstituted dibenzofuryl, substituted or unsubstituted dibenzothienyl, substituted or unsubstituted carbazolyl or a combination thereof.

According to an embodiment of the present disclosure, $R_c$ is, at each occurrence identically or differently, selected from the group consisting of: substituted or unsubstituted aryl having 6 to 30 carbon atoms, substituted or unsubstituted heteroaryl having 3 to 30 carbon atoms and combinations thereof.

According to an embodiment of the present disclosure, $R_c$ is, at each occurrence identically or differently, selected from substituted or unsubstituted phenyl, substituted or unsubstituted biphenyl, substituted or unsubstituted terphenyl, substituted or unsubstituted naphthyl, substituted or unsubstituted phenanthryl, substituted or unsubstituted triphenylene, substituted or unsubstituted fluorenyl, substituted or unsubstituted dibenzofuryl, substituted or unsubstituted dibenzothienyl, substituted or unsubstituted carbazolyl or a combination thereof.

According to an embodiment of the present disclosure, at least one or at least two of $Q_1$ to $Q_8$ are selected from $CR_q$, and $R_q$ is selected from substituted or unsubstituted aryl having 6 to 30 carbon atoms, substituted or unsubstituted heteroaryl having 5 to 30 carbon atoms or a combination thereof.

According to an embodiment of the present disclosure, at least one or at least two of $Q_1$ to $Q_8$ are selected from $CR_q$, and $R_q$ is selected from substituted or unsubstituted phenyl, substituted or unsubstituted naphthyl, substituted or unsubstituted biphenyl, substituted or unsubstituted terphenyl, substituted or unsubstituted pyridyl or a combination thereof.

According to an embodiment of the present disclosure, R''' is, at each occurrence identically or differently, selected from the group consisting of: substituted or unsubstituted aryl having 6 to 30 carbon atoms, substituted or unsubstituted heteroaryl having 3 to 30 carbon atoms and combinations thereof.

According to an embodiment of the present disclosure, R''' is, at each occurrence identically or differently, selected from substituted or unsubstituted phenyl, substituted or unsubstituted biphenyl, substituted or unsubstituted terphenyl, substituted or unsubstituted naphthyl, substituted or unsubstituted phenanthryl, substituted or unsubstituted triphenylene, substituted or unsubstituted fluorenyl, substituted or unsubstituted dibenzofuryl, substituted or unsubstituted dibenzothienyl, substituted or unsubstituted carbazolyl or a combination thereof.

According to an embodiment of the present disclosure, L is, at each occurrence identically or differently, selected from a single bond, substituted or unsubstituted arylene having 6 to 20 carbon atoms, substituted or unsubstituted heteroarylene having 3 to 20 carbon atoms or a combination thereof.

According to an embodiment of the present disclosure, L is, at each occurrence identically or differently, selected from a single bond, substituted or unsubstituted phenylene, substituted or unsubstituted biphenylene, substituted or unsubstituted carbazolylene, substituted or unsubstituted dibenzofurylene, substituted or unsubstituted dibenzothienylene or substituted or unsubstituted fluorenylidene.

According to an embodiment of the present disclosure, L is, at each occurrence identically or differently, selected from a single bond, substituted or unsubstituted phenylene or substituted or unsubstituted biphenylene.

According to an embodiment of the present disclosure, the first host compound is selected from the group consisting of H-1 to H-243, wherein the specific structures of H-1 to H-243 are referred to claim 25.

According to an embodiment of the present disclosure, in the electroluminescent device, the second host compound has a structure represented by Formula 5:

Formula 5

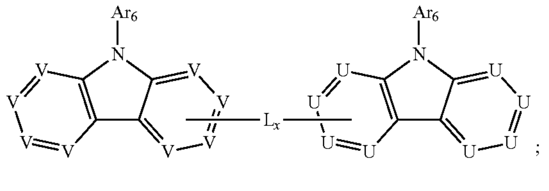

wherein $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

V is, at each occurrence identically or differently, selected from C, $CR_v$ or N, and at least one of V is C and joined to $L_x$;

U is, at each occurrence identically or differently, selected from C, $CR_u$ or N, and at least one of U is C and joined to $L_x$;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_6$ is, at each occurrence identically or differently, selected from substituted or unsubstituted aryl having 6 to 30 carbon atoms, substituted or unsubstituted heteroaryl having 3 to 30 carbon atoms or a combination thereof; and adjacent substituents $R_v$ and $R_u$ can be optionally joined to form a ring.

In this embodiment, the expression that "adjacent substituents $R_v$ and $R_u$ can be optionally joined to form a ring" is intended to mean that any one or more of groups of adjacent substituents, such as two substituents $R_v$, two substituents $R_u$ and substituents $R_v$ and $R_u$, can be joined to form a ring. Obviously, it is possible that none of these substituents are joined to form a ring.

According to an embodiment of the present disclosure, in the electroluminescent device, the second host compound has a structure represented by one of Formula 5-a to Formula 5-j:

5-a

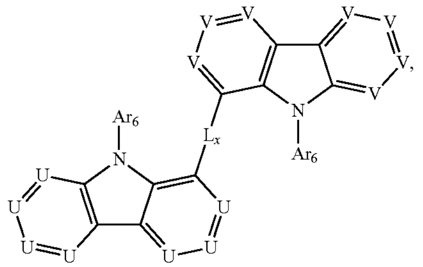

5-b

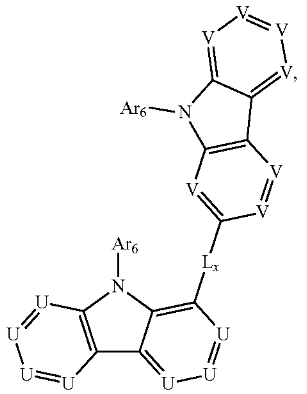

5-c

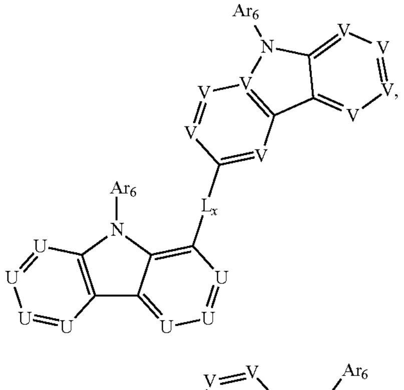

5-d

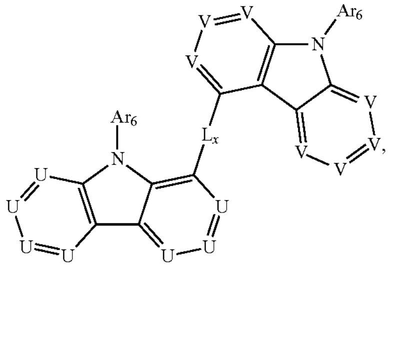

-continued 5-e

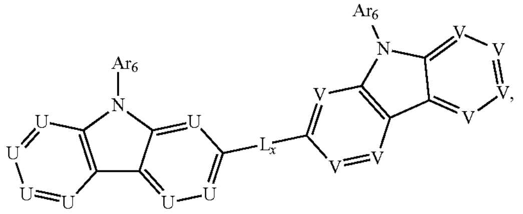

5-f

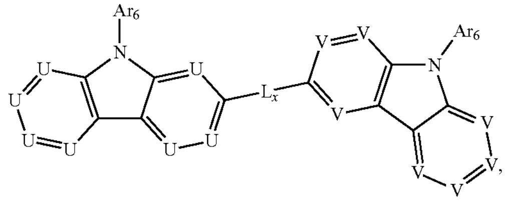

5-g

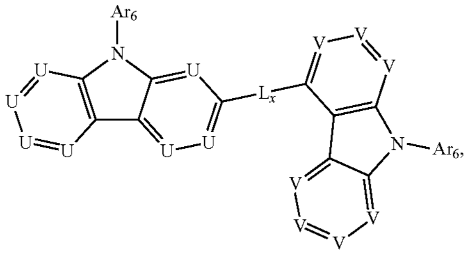

5-h

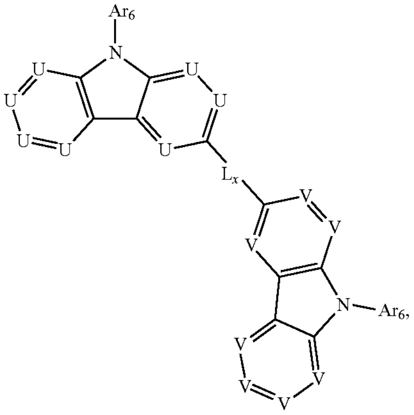

5-i

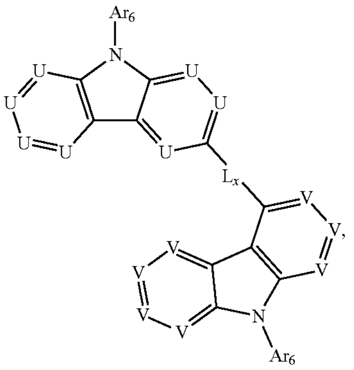

-continued 5-j

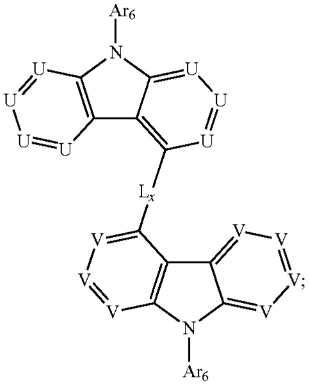

wherein $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

V is, at each occurrence identically or differently, selected from $CR_v$ or N;

U is, at each occurrence identically or differently, selected from $CR_u$ or N;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_6$ is, at each occurrence identically or differently, selected from substituted or unsubstituted aryl having 6 to 30 carbon atoms, substituted or unsubstituted heteroaryl having 3 to 30 carbon atoms or a combination thereof; and adjacent substituents $R_v$ and $R_u$ can be optionally joined to form a ring.

According to an embodiment of the present disclosure, the second host compound is selected from the group consisting of X-1 to X-150, wherein the specific structures of X-1 to X-150 are referred to claim 26.

According to an embodiment of the present disclosure, in the electroluminescent device, the metal complex is doped in the first host compound and the second host compound, and the weight of the metal complex accounts for 1% to 30% of the total weight of the light-emitting layer.

According to an embodiment of the present disclosure, in the electroluminescent device, the metal complex is doped in the first host compound and the second host compound, and the weight of the metal complex accounts for 3% to 13% of the total weight of the light-emitting layer.

According to another embodiment of the present disclosure, disclosed is a compound combination comprising the metal complex in any one of the preceding embodiments.

Combination with Other Materials

The materials described in the present disclosure for a particular layer in an organic light-emitting device can be used in combination with various other materials present in the device. The combinations of these materials are described in more detail in U.S. patent application No. 20160359122 at paragraphs 0132-0161, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

The materials described herein as useful for a particular layer in an organic light-emitting device may be used in combination with a variety of other materials present in the device. For example, dopants disclosed herein may be used in combination with a wide variety of hosts, transport layers, blocking layers, injection layers, electrodes and other layers that may be present. The combination of these materials is described in detail in paragraphs 0080-0101 of U.S. patent application No. 20150349273, which is incorporated by reference herein in its entirety. The materials described or referred to the disclosure are non-limiting examples of materials that may be useful in combination with the compounds disclosed herein, and one of skill in the art can readily consult the literature to identify other materials that may be useful in combination.

In the embodiments of material synthesis, all reactions were performed under nitrogen protection unless otherwise stated. All reaction solvents were anhydrous and used as received from commercial sources. Synthetic products were structurally confirmed and tested for properties using one or more conventional equipment in the art (including, but not limited to, nuclear magnetic resonance instrument produced by BRUKER, liquid chromatograph produced by SHIMADZU, liquid chromatograph-mass spectrometry produced by SHIMADZU, gas chromatograph-mass spectrometry produced by SHIMADZU, differential Scanning calorimeters produced by SHIMADZU, fluorescence spectrophotometer produced by SHANGHAI LENGGUANG TECH., electrochemical workstation produced by WUHAN CORRTEST, and sublimation apparatus produced by ANHUI BEQ, etc.) by methods well known to the persons skilled in the art. In the embodiments of the device, the characteristics of the device were also tested using conventional equipment in the art (including, but not limited to, evaporator produced by ANGSTROM ENGINEERING, optical testing system produced by SUZHOU FATAR, life testing system produced by SUZHOU FATAR, and ellipsometer produced by BEIJING ELLITOP, etc.) by methods well known to the persons skilled in the art. As the persons skilled in the art are aware of the above-mentioned equipment use, test methods and other related contents, the inherent data of the sample can be obtained with certainty and without influence, so the above related contents are not further described in this patent.

MATERIAL SYNTHESIS EXAMPLE

The method for preparing a compound in the present disclosure is not limited herein. Typically, the following compounds are used as examples without limitations, and synthesis routes and preparation methods thereof are described below.

Synthesis Example 1: Synthesis of Metal Complex 1493

Step 1:

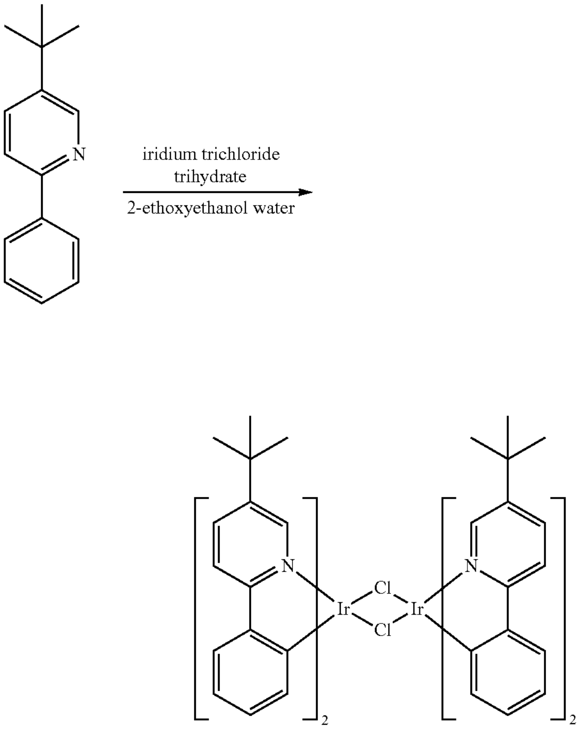

Intermediate 1

5-t-butyl-2-phenylpyridine (13.2 g, 62.9 mmol), iridium trichloride trihydrate (5.5 g, 15.7 mmol), 300 mL of 2-ethoxyethanol and 100 mL of water were sequentially added to a dry 500 mL round-bottom flask, purged with nitrogen three times, and heated and stirred for 24 h at 130° C. under nitrogen protection. The solution was cooled, filtered, washed three times with methanol and n-hexane respectively, and pumped to dryness to obtain 9.7 g of Intermediate 1 (with a yield of 97%).

Step 2:

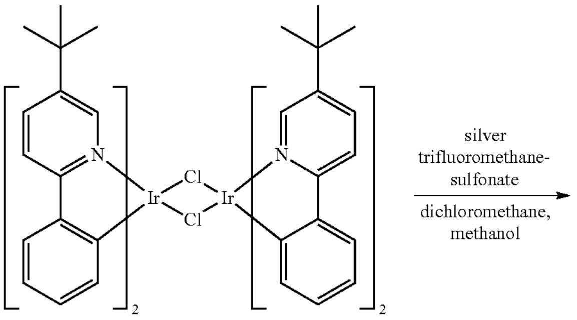

Intermediate 1

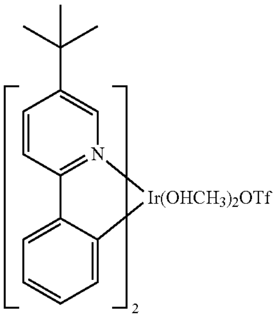

Intermediate 2

Intermediate 1 (9.7 g, 7.7 mmol), 250 mL of anhydrous dichloromethane, 10 mL of methanol and silver trifluoromethanesulfonate (4.3 g, 16.7 mmol) were sequentially added to a dry 500 mL round-bottom flask, purged with nitrogen three times, and stirred overnight at room temperature under nitrogen protection. The solution was filtered through Celite and washed twice with dichloromethane. The organic phases below were collected and concentrated under reduced pressure to obtain 13.2 g of Intermediate 2 as a yellow solid (with a yield of 93%).

Step 3:

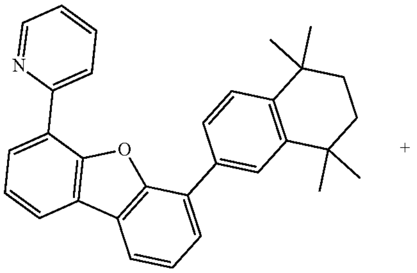

Intermediate 3

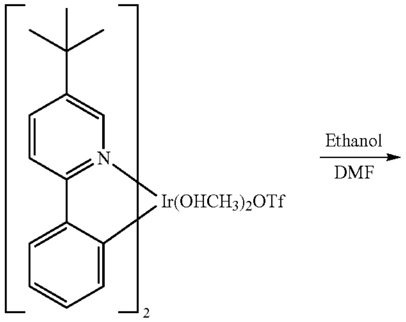

Intermediate 2

-continued

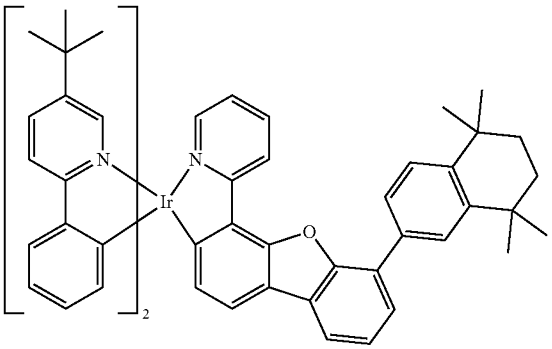

Metal Complex 1493

Intermediate 2 (1.4 g, 1.7 mmol), Intermediate 3 (1.0 g, 2.3 mmol) and 50 mL of ethanol and 50 mL of N,N-dimethylformamide were sequentially added to a dry 250 mL round-bottom flask, purged with nitrogen three times, and heated at 80° C. for 72 h under nitrogen protection. The reaction was cooled, filtered through Celite, and washed twice with methanol and n-hexane respectively. Yellow solids on the Celite were dissolved in dichloromethane. The organic phases were collected, concentrated under reduced pressure, and purified through column chromatography to obtain Metal Complex 1493 as a yellow solid (0.5 g with a yield of 28.4%). The product was confirmed as the target product with a molecular weight of 1043.4.

Synthesis Example 2: Synthesis of Metal Complex 1509

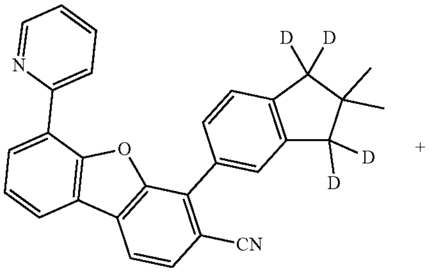

Intermediate 4

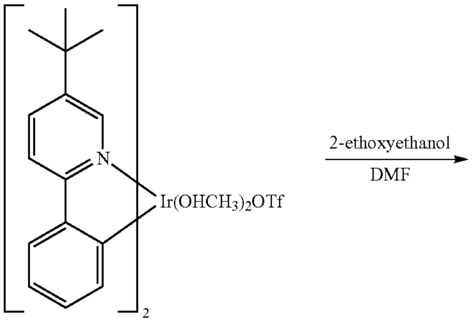

Intermediate 2

-continued

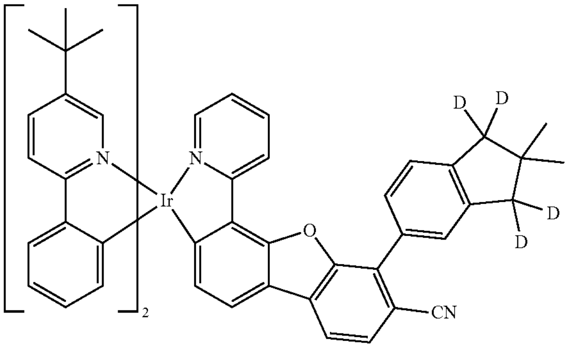

Metal Complex 1509

-continued

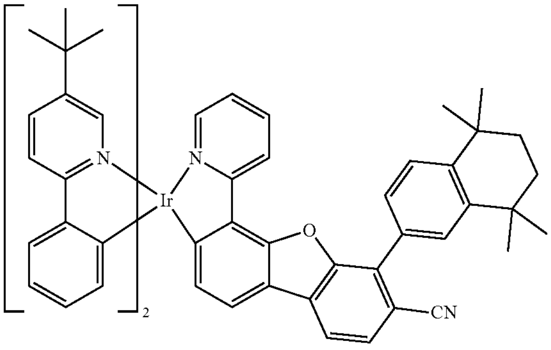

Metal Complex 1517

Intermediate 2 (1.8 g, 2.2 mmol), Intermediate 4 (1.0 g, 2.4 mmol), 50 mL of 2-ethoxyethanol and 50 mL of N,N-dimethylformamide were sequentially added to a dry 250 mL round-bottom flask, purged with nitrogen three times, and heated at 100° C. for 72 h under nitrogen protection. The reaction was cooled, filtered through Celite, and washed twice with methanol and n-hexane respectively. Yellow solids on the Celite were dissolved in dichloromethane. The organic phases were collected, concentrated under reduced pressure, and purified through column chromatography to obtain Metal Complex 1509 as a yellow solid (0.41 g with a yield of 18.4%). The product was confirmed as the target product with a molecular weight of 1030.4.

Synthesis Example 3: Synthesis of Metal Complex 1517

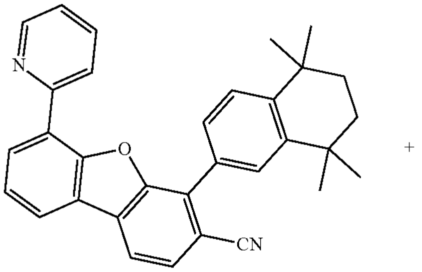

Intermediate 5

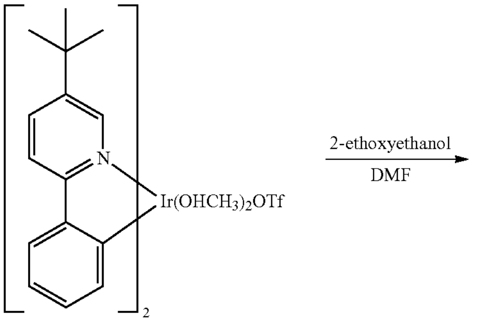

Intermediate 2

Intermediate 2 (1.8 g, 2.2 mmol), Intermediate 5 (1.3 g, 2.9 mmol), 50 mL of 2-ethoxyethanol and 50 mL of N,N-dimethylformamide were sequentially added to a dry 250 mL round-bottom flask, purged with nitrogen three times, and heated at 100° C. for 72 h under nitrogen protection. The reaction was cooled, filtered through Celite, and washed twice with methanol and n-hexane respectively. Yellow solids on the Celite were dissolved in dichloromethane. The organic phases were collected, concentrated under reduced pressure, and purified through column chromatography to obtain Metal Complex 1517 as a yellow solid (0.83 g with a yield of 35.4%). The product was confirmed as the target product with a molecular weight of 1068.4.

Synthesis Example 4: Synthesis of Metal Complex 1541

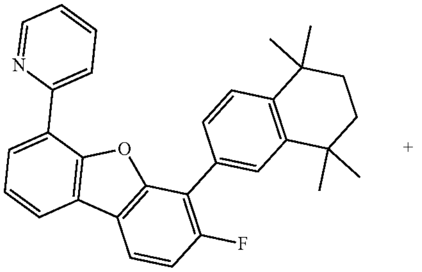

Intermediate 6

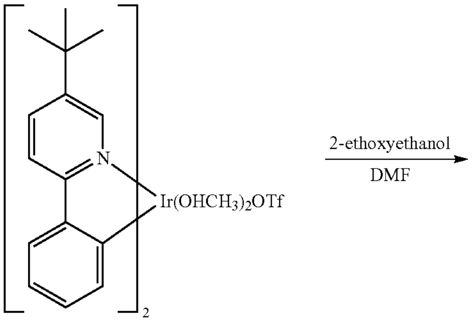

Intermediate 2

-continued

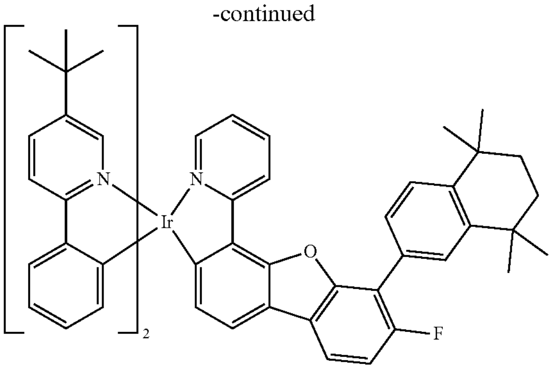

Metal Complex 1541

Intermediate 2 (2.5 g, 3.0 mmol), Intermediate 6 (1.8 g, 4.0 mmol), 50 mL of 2-ethoxyethanol and 50 mL of N,N-dimethylformamide were sequentially added to a dry 250 mL round-bottom flask, purged with nitrogen three times, and heated at 100° C. for 72 h under nitrogen protection. The reaction was cooled, filtered through Celite, and washed twice with methanol and n-hexane respectively. Yellow solids on the Celite were dissolved in dichloromethane. The organic phases were collected, concentrated under reduced pressure, and purified through column chromatography to obtain Metal Complex 1541 as a yellow solid (1.14 g with a yield of 35.8%). The product was confirmed as the target product with a molecular weight of 1061.4.

Synthesis Example 5: Synthesis of Metal Complex 113

Step 1:

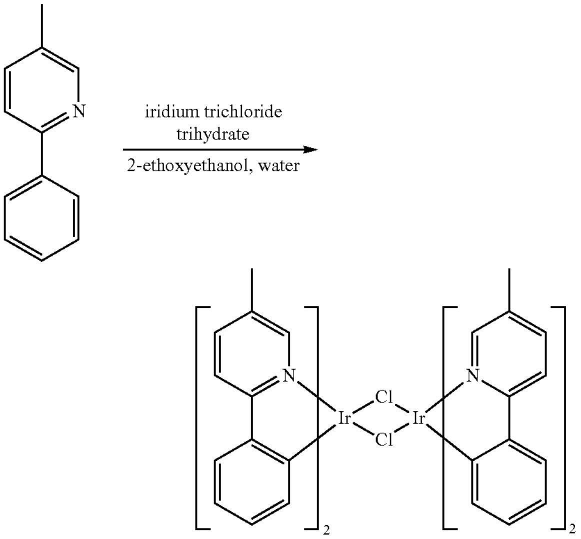

Intermediate 7

5-methyl-2-phenylpyridine (10.0 g, 59.2 mmol), iridium trichloride trihydrate (5.0 g, 14.2 mmol), 300 mL of 2-ethoxyethanol and 100 mL of water were sequentially added to a dry 500 mL round-bottom flask, purged with nitrogen three times, and heated and stirred for 24 h at 130° C. under nitrogen protection. The solution was cooled, filtered, washed three times with methanol and n-hexane respectively, and pumped to dryness to obtain 7.5 g of Intermediate 7 as a yellow solid (with a yield of 97%).

Step 2:

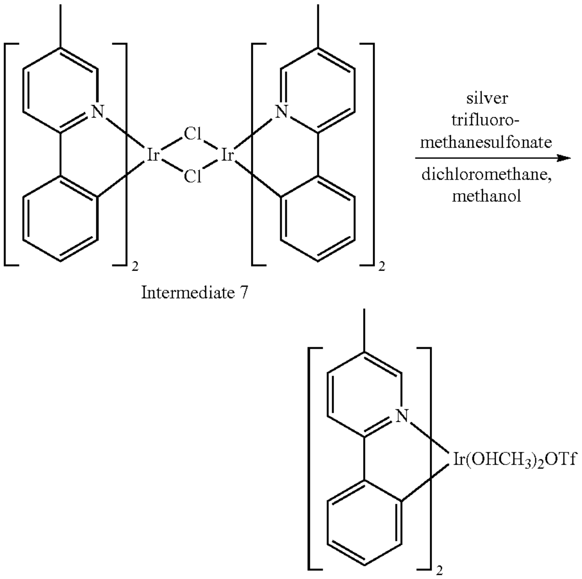

Intermediate 7

Intermediate 8

Intermediate 7 (7.5 g, 6.8 mmol), 250 mL of anhydrous dichloromethane, 10 mL of methanol and silver trifluoromethanesulfonate (3.8 g, 14.8 mmol) were sequentially added to a dry 500 mL round-bottom flask, purged with nitrogen three times, and stirred overnight at room temperature under nitrogen protection. The solution was filtered through Celite and washed twice with dichloromethane. The organic phases below were collected and concentrated under reduced pressure to obtain 9.2 g of Intermediate 8 (with a yield of 93%).

Step 3:

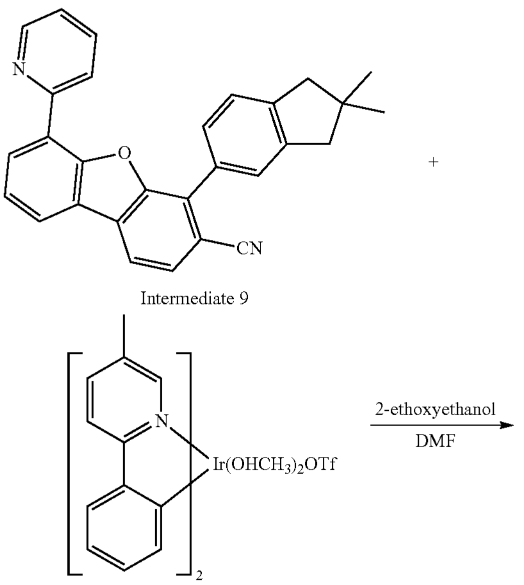

Intermediate 9

Intermediate 8

-continued

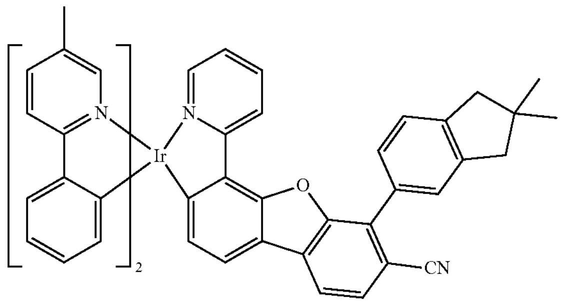

Metal Complex 113

Intermediate 8 (2.0 g, 2.7 mmol), Intermediate 9 (1.7 g, 4.1 mmol), 50 mL of 2-ethoxyethanol and 50 mL of N,N-dimethylformamide were sequentially added to a dry 250 mL round-bottom flask, purged with nitrogen three times, and heated at 100° C. for 96 h under nitrogen protection. The reaction was cooled, filtered through Celite, and washed twice with methanol and n-hexane respectively. Yellow solids on the Celite were dissolved in dichloromethane. The organic phases were collected, concentrated under reduced pressure, and purified through column chromatography to obtain Metal Complex 113 as a yellow solid (0.8 g with a yield of 31.4%). The product was confirmed as the target product with a molecular weight of 942.3.

Synthesis Example 6: Synthesis of Metal Complex 123

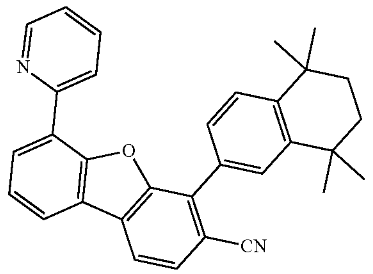

Intermediate 10

+

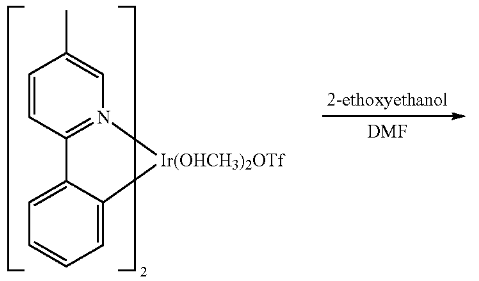

Intermediate 8

-continued

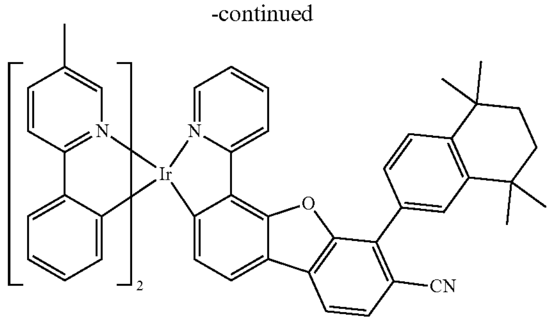

Metal Complex 123

Intermediate 8 (1.47 g, 1.9 mmol), Intermediate 10 (1.0 g, 2.2 mmol), 50 mL of 2-ethoxyethanol and 50 mL of N,N-dimethylformamide were sequentially added to a dry 250 mL round-bottom flask, purged with nitrogen three times, and heated at 100° C. for 120 h under nitrogen protection. The reaction was cooled, filtered through Celite, and washed twice with methanol and n-hexane respectively. Yellow solids on the Celite were dissolved in dichloromethane. The organic phases were collected, concentrated under reduced pressure, and purified through column chromatography to obtain Metal Complex 123 as a yellow solid (0.71 g with a yield of 37.9%). The product was confirmed as the target product with a molecular weight of 984.2.

Those skilled in the art will appreciate that the above preparation methods are merely exemplary. Those skilled in the art can obtain other compound structures of the present disclosure through the modifications of the preparation methods.

Device Example 1

First, a glass substrate having an indium tin oxide (ITO) anode with a thickness of 80 nm was cleaned and then treated with oxygen plasma and UV ozone. After the treatment, the substrate was dried in a glovebox to remove moisture. Then, the substrate was mounted on a substrate holder and placed in a vacuum chamber. Organic layers specified below were sequentially deposited through vacuum thermal evaporation on the ITO anode at a rate of 0.2 to 2 Angstroms per second and a vacuum degree of about 10-8 torr. Compound H1 was used as a hole injection layer (HIL). Compound HT was used as a hole transporting layer (HTL). Compound H1 was used as an electron blocking layer (EBL). Metal Complex 1493 of the present disclosure was doped in Compound H1 and Compound H2 as a dopant, and the resulting mixture was deposited for use as an emissive layer (EML). On the EML, Compound HB was used as a hole blocking layer (HBL). On the HBL, Compound ET and 8-hydroxyquinolinolato-lithium (Liq) were co-deposited for use as an electron transporting layer (ETL). Finally, 8-hydroxyquinolinolato-lithium (Liq) was deposited as an electron injection layer with a thickness of 1 nm and Al was deposited as a cathode with a thickness of 120 nm. The device was transferred back to the glovebox and encapsulated with a glass lid to complete the device.

Device Comparative Example 1

The implementation in Device Comparative Example 1 was the same as that in Device Example 1, except that in the EML, Metal Complex 1493 of the present disclosure was replaced with Compound GD1.

Device Comparative Example 2

The implementation in Device Comparative Example 2 was the same as that in Device Example 1, except that in the EML, Metal Complex 1493 of the present disclosure was replaced with Compound GD2.

Detailed structures and thicknesses of layers of the devices are shown in the following table. A layer using more than one material is obtained by doping different compounds at their weight ratio as recorded.

TABLE 1

Device structures of Example 1 and Comparative Examples 1 and 2

| Device ID | HIL | HTL | EBL | EML | HBL | ETL |
|---|---|---|---|---|---|---|
| Example 1 | Compound HI (100 Å) | Compound HT (350 Å) | Compound H1 (50 Å) | Compound H1:Compound H2:Metal Complex 1493(63:31:6) (400 Å) | Compound HB (50 Å) | Compound ET:Liq (40:60) (350 Å) |
| Comparative Example 1 | Compound HI (100 Å) | Compound HT (350 Å) | Compound H1 (50 Å) | Compound H1:Compound H2:GD1 (63:31:6) (400 Å) | Compound HB (50 Å) | Compound ET:Liq (40:60) (350 Å) |
| Comparative Example 2 | Compound HI (100 Å) | Compound HT (350 Å) | Compound H1 (50 Å) | Compound H1:Compound H2:GD2 (63:31:6) (400 Å) | Compound HB (50 Å) | Compound ET:Liq (40:60) (350 Å) |

The structures of the materials used in the devices are shown as follows:

Compound HI

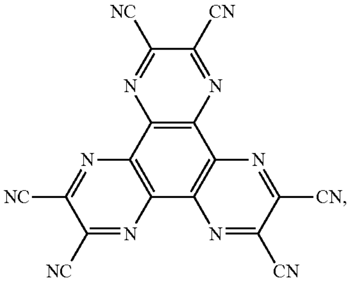

,

Compound HT

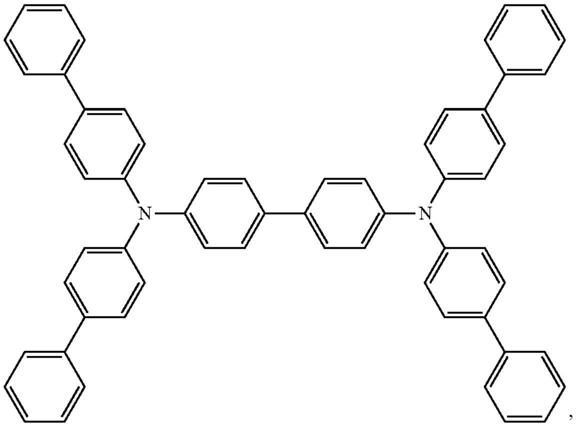

,

-continued

Compound H1

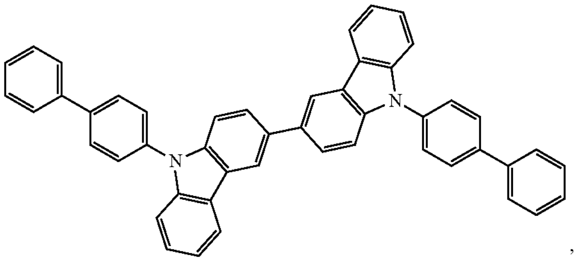

,

Compound H2

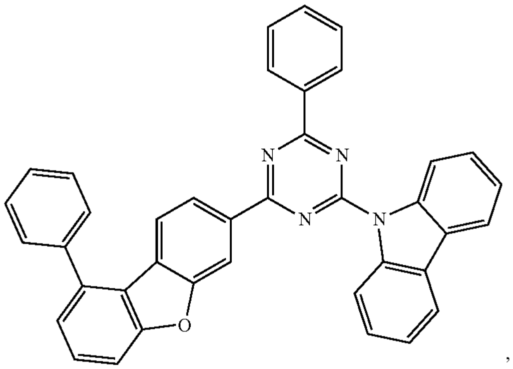

,

-continued

Compound HB

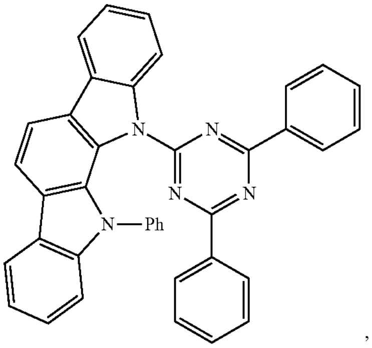

,

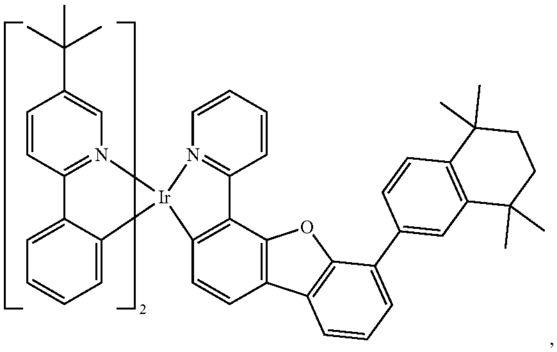

,

Metal Complex 1493

GD1

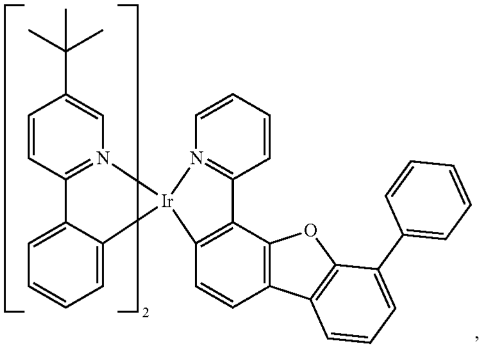

,

GD2

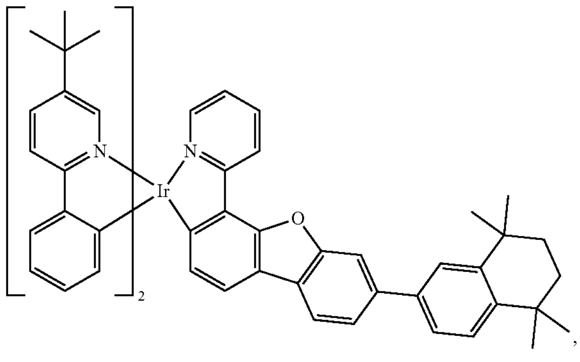

,

-continued

Compound ET

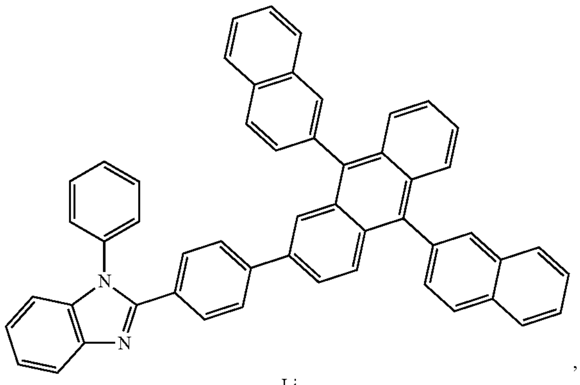

,

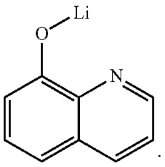

.

Liq

Current-voltage-luminance (IVL) characteristics of the devices were measured. The CIE data, maximum emission wavelength $\lambda_{max}$, voltage (V), current efficiency (CE), power efficiency (PE) and external quantum efficiency (EQE) of each device were measured at 1000 cd/m$^2$. The data was recorded and shown in Table 2.

TABLE 2

Device data of Example 1 and Comparative Examples 1 and 2

| Device ID | CIE (x, y) | $\lambda_{max}$ (nm) | Voltage (V) | CE (cd/A) | PE (lm/W) | EQE (%) |
|---|---|---|---|---|---|---|
| Example 1 | (0.357, 0.620) | 531 | 2.94 | 102 | 109 | 26.47 |
| Comparative Example 1 | (0.353, 0.623) | 531 | 3.11 | 94 | 95 | 24.37 |
| Comparative Example 2 | (0.368, 0.614) | 534 | 2.98 | 89 | 94 | 23.11 |

DISCUSSION

Table 2 shows the device performance of the metal complex of the present disclosure and the comparative compounds. Compared with Comparative Example 1, Example 1, where the metal complex has a substitution of a fused ring group A at a particular position of the ligand $L_a$, has basically the same color coordinate and maximum emission wavelength, the voltage reduced by 0.17 V, the CE improved by 8.51%, the PE improved by 14.74%, and the EQE improved by 8.61%. As can be seen from the data, after a particular position of the ligand $L_a$ is substituted by a fused ring group, the device example has a reduced device voltage and improved efficiency compared with the comparative example with a substitution including no fused ring group. The metal complex has significantly better overall device performance than the metal complex in the comparative example and can significantly improve the overall performance of the device.

Compared with Comparative Example 2, Example 1, where the metal complex has the substitution of the fused ring group A at a different position of the ligand $L_a$, has basically the same color coordinate, the slightly reduced voltage, the maximum emission wavelength blue-shifted by 3 nm, the CE improved by 14.61%, the PE improved by 15.96%, and the EQE improved by 14.54%. As can be seen from the data, the metal complex having the substitution of the fused ring group A at the particular position of the ligand $L_a$, which is disclosed in the present disclosure, has significantly improved efficiency and has significantly better overall device performance than the metal complex in the comparative example.

The above data indicates that the metal complex having the substitution of the fused ring group A at the particular position of the ligand $L_a$ in the present disclosure has significantly better device performance than the metal complexes in the comparative examples and can significantly improve the overall performance of the device.

Device Example 2

The implementation in Device Example 2 was the same as that in Device Example 1, except that in the EML, Metal Complex 1493 of the present disclosure was replaced with Metal Complex 113 of the present disclosure.

Device Example 3

The implementation in Device Example 3 was the same as that in Device Example 1, except that in the EML, Metal Complex 1493 of the present disclosure was replaced with Metal Complex 123 of the present disclosure.

Device Example 4

The implementation in Device Example 4 was the same as that in Device Example 1, except that in the EML, Metal Complex 1493 of the present disclosure was replaced with Metal Complex 1517 of the present disclosure.

Device Example 5

The implementation in Device Example 5 was the same as that in Device Example 1, except that in the EML, Metal Complex 1493 of the present disclosure was replaced with Metal Complex 1541 of the present disclosure.

Device Comparative Example 3

The implementation in Device Comparative Example 3 was the same as that in Device Example 1, except that in the EML, Metal Complex 1493 of the present disclosure was replaced with Compound GD3.

Device Comparative Example 4

The implementation in Device Comparative Example 4 was the same as that in Device Example 1, except that in the EML, Metal Complex 1493 of the present disclosure was replaced with Compound GD4.

Device Comparative Example 5

The implementation in Device Comparative Example 5 was the same as that in Device Example 1, except that in the EML, Metal Complex 1493 of the present disclosure was replaced with Compound GD5.

Detailed structures and thicknesses of layers of the devices are shown in the following table. A layer using more than one material is obtained by doping different compounds at their weight ratio as recorded.

TABLE 3

Device structures of Examples 2 to 5 and Comparative Examples 3 to 5

| Device ID | HIL | HTL | EBL | EML | HBL | ETL |
|---|---|---|---|---|---|---|
| Example 2 | Compound HI (100 Å) | Compound HT (350 Å) | Compound H1 (50 Å) | Compound H1:Compound H2:Metal Complex 113 (63:31:6) (400 Å) | Compound HB (50 Å) | Compound ET:Liq (40:60) (350 Å) |
| Example 3 | Compound HI (100 Å) | Compound HT (350 Å) | Compound H1 (50 Å) | Compound H1:Compound H2:Metal Complex 123 (63:31:6) (400 Å) | Compound HB (50 Å) | Compound ET:Liq (40:60) (350 Å) |
| Example 4 | Compound HI (100 Å) | Compound HT (350 Å) | Compound H1 (50 Å) | Compound H1:Compound H2:Metal Complex 1517 (63:31:6) (400 Å) | Compound HB (50 Å) | Compound ET:Liq (40:60) (350 Å) |
| Example 5 | Compound HI (100 Å) | Compound HT (350 Å) | Compound H1 (50 Å) | Compound H1:Compound H2:Metal Complex 1541 (63:31:6) (400 Å) | Compound HB (50 Å) | Compound ET:Liq (40:60) (350 Å) |
| Comparative Example 3 | Compound HI (100 Å) | Compound HT (350 Å) | Compound H1 (50 Å) | Compound H1:Compound H2:Compound GD3 (63:31:6) (400 Å) | Compound HB (50 Å) | Compound ET:Liq (40:60) (350 Å) |

TABLE 3-continued

| Device structures of Examples 2 to 5 and Comparative Examples 3 to 5 | | | | | | |
|---|---|---|---|---|---|---|
| Device ID | HIL | HTL | EBL | EML | HBL | ETL |
| Comparative Example 4 | Compound HI (100 Å) | Compound HT (350 Å) | Compound H1 (50 Å) | Compound H1:Compound H2:Compound GD4 (63:31:6) (400 Å) | Compound HB (50 Å) | Compound ET:Liq (40:60) (350 Å) |
| Comparative Example 5 | Compound HI (100 Å) | Compound HT (350 Å) | Compound H1 (50 Å) | Compound H1:Compound H2:Compound GD5 (63:31:6) (400 Å) | Compound HB (50 Å) | Compound ET:Liq (40:60) (350 Å) |

The structures of the new materials used in the devices are shown as follows:

Metal Complex 113

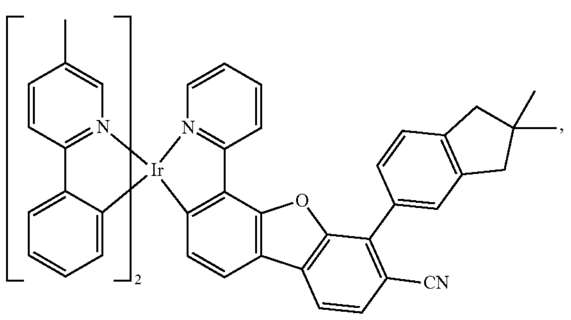

Metal Complex 123

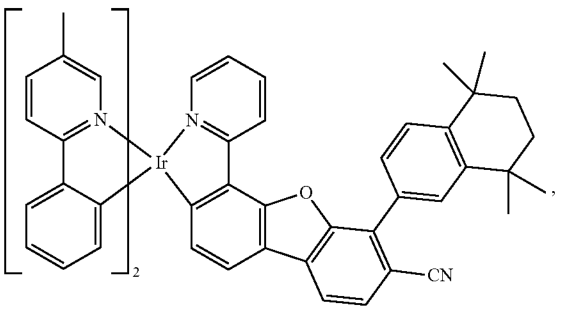

Metal Complex 1517

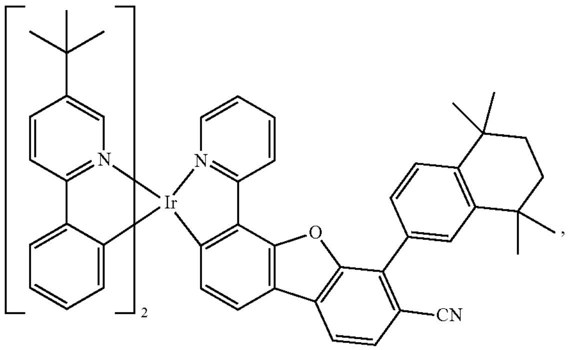

-continued

Metal Complex 1541

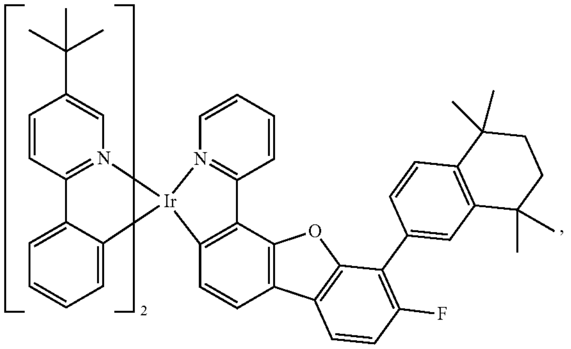

GD3

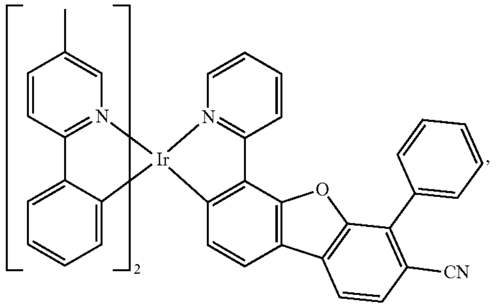

GD4

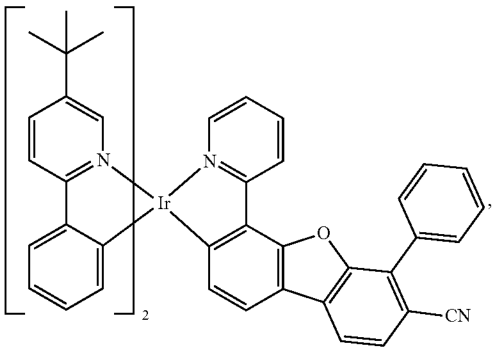

-continued

GD5

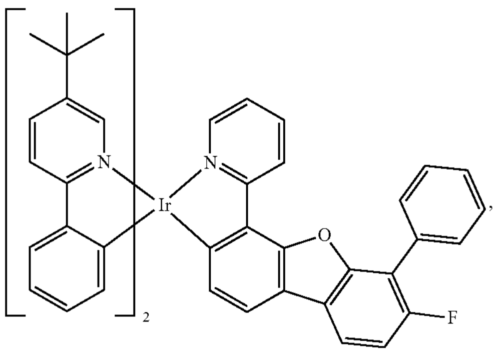

IVL characteristics of the devices were measured. The CIE data, maximum emission wavelength $\lambda_{max}$, voltage (V), current efficiency (CE), power efficiency (PE) and external quantum efficiency (EQE) of each device were measured at 1000 cd/m$^2$. The data was recorded and shown in Table 4.

TABLE 4

Device data of Examples 2 to 5 and Comparative Examples 3 to 5

| Device ID | CIE (x, y) | $\lambda_{max}$ (nm) | Voltage (V) | CE (cd/A) | PE (lm/W) | EQE (%) |
|---|---|---|---|---|---|---|
| Example 2 | (0.341, 0.635) | 530 | 2.63 | 109 | 131 | 28.11 |
| Example 3 | (0.343, 0.633) | 530 | 2.62 | 109 | 131 | 28.03 |
| Example 4 | (0.348, 0.630) | 531 | 2.70 | 109 | 126 | 27.54 |
| Example 5 | (0.359, 0.619) | 532 | 2.85 | 101 | 112 | 26.35 |
| Comparative Example 3 | (0.342, 0.634) | 529 | 2.68 | 105 | 123 | 26.56 |
| Comparative Example 4 | (0.342, 0.635) | 531 | 2.70 | 104 | 121 | 26.21 |
| Comparative Example 5 | (0.352, 0.624) | 530 | 3.06 | 96 | 98 | 24.75 |

DISCUSSION

Table 4 shows the device performance of the metal complexes of the present disclosure and the comparative compounds. Compared with Comparative Example 3, Example 2 and Example 3, where the ligand $L_a$ of the metal complex have both a cyano substituent and a substitution of a fused ring group A at a particular position, have basically the same color coordinates and maximum emission wavelengths, the slightly reduced voltages, the CE improved by 3.81%, the PE improved by 6.50%, and the EQE improved by 5.84% and 5.53% respectively. Based on the very good performance of Comparative Example 3, such performance improvements of the above examples are very rare.

Similarly, compared with Comparative Example 4, Example 4, where the ligand $L_a$ of the metal complex has both a cyano substituent and a substitution of a fused ring group A at a particular position, has basically the same color coordinate, maximum emission wavelength and voltage, the CE improved by 4.81%, the PE improved by 4.13%, and the EQE improved by 5.07%. Based on the very good performance of Comparative Example 4, such performance improvements of the above example are very rare.

Compared with Comparative Example 5, Example 5, where the ligand $L_a$ of the metal complex has both a fluorine substituent and a substitution of a fused ring group A at a particular position, has basically the same color coordinate, the voltage reduced by 0.21 V, the CE improved by 5.21%, the PE improved by 14.29%, and the EQE improved by 6.46%.

To sum up, the metal complex of the present disclosure having a substitution of a fused ring group A at a particular position of the ligand $L_a$, when a substitution is further included in the ligand $L_a$, also has significantly better overall device performance than the metal complexes in the comparative examples and can significantly improve the overall performance of the device.

As can be seen from the discussion of the above examples and comparative examples, the metal complex of the present disclosure having a substitution of a particular fused ring A at a particular position of the ligand $L_a$ may be used as a light-emitting material in a light-emitting layer of an electroluminescent device and can significantly improve the overall performance of the device.

It should be understood that various embodiments described herein are merely examples and not intended to limit the scope of the present disclosure. Therefore, it is apparent to the persons skilled in the art that the present disclosure as claimed may include variations from specific embodiments and preferred embodiments described herein. Many of materials and structures described herein may be substituted with other materials and structures without departing from the spirit of the present disclosure. It should be understood that various theories as to why the present disclosure works are not intended to be limitative.

What is claimed is:

1. A metal complex, comprising a metal M and a ligand $L_a$ coordinated to the metal M, wherein the metal M is selected from a metal with a relative atomic mass greater than 40, and the ligand $L_a$ has a structure represented by Formula 1:

Formula 1

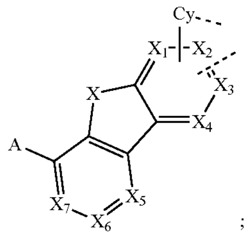

;

wherein in Formula 1,

Cy is, at each occurrence identically or differently, selected from a substituted or unsubstituted aromatic ring having 6 to 24 ring atoms, a substituted or unsubstituted heteroaromatic ring having 5 to 24 ring atoms or a combination thereof;

X is selected from the group consisting of O, S, Se, NR', CR'R', SiR'R' and GeR'R', wherein when two R' are present at the same time, the two R' are the same or different;

$X_1$ to $X_7$ are, at each occurrence identically or differently, selected from C, $CR_x$ or N, and at least one of $X_1$ to $X_4$ is C and joined to the Cy;

$X_1$, $X_2$, $X_3$ or $X_4$ is joined to the metal M by a metal-carbon bond or a metal-nitrogen bond;

A has a structure represented by Formula 2:

Formula 2

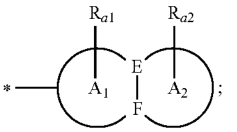

E and F are, at each occurrence identically or differently, selected from C, CR", N, SiR" or GeR";

$R_{a1}$ and $R_{a2}$ represent, at each occurrence identically or differently, mono-substitution, multiple substitutions or non-substitution;

the ring $A_1$ and the ring $A_2$ are fused through E and F, the ring $A_1$ is selected from an aromatic ring having 6 to 30 ring atoms, a heteroaromatic ring having 5 to 30 ring atoms or a combination thereof; and the ring $A_2$ is selected from an alicyclic ring having 3 to 30 ring atoms;

R', R", $R_x$, $R_{a1}$ and $R_{a2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R', R", $R_x$, $R_{a1}$, $R_{a2}$ can be optionally joined to form a ring; and "*" represents a position where A is joined.

2. The metal complex of claim 1, wherein Cy is selected from any structure in the group consisting of the following:

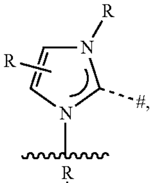
,
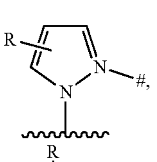
,
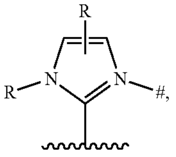
,
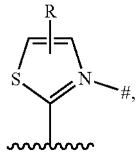
,
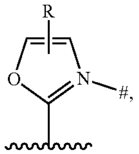
,
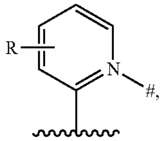
, -continued

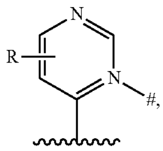
,
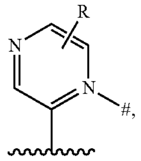
,
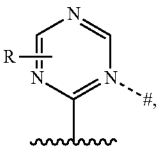
,
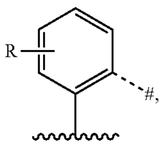
,
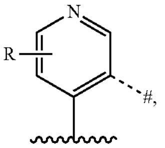
,
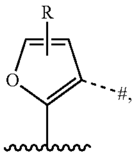
,
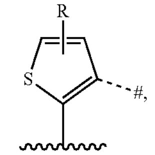
,
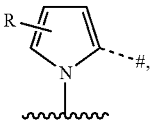
,
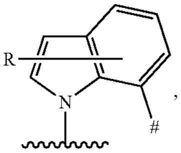
,
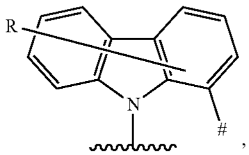
, and
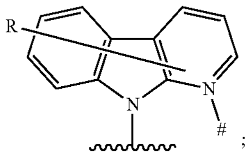
;

wherein

R represents, at each occurrence identically or differently, mono-substitution, multiple substitutions or non-substitution; and when multiple R are present at the same time in any structure, the multiple R are the same or different;

R is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R can be optionally joined to form a ring;

wherein "#" represents a position where Cy is joined to the metal M, and

represents a position where Cy is joined to $X_1$, $X_2$, $X_3$ or $X_4$.

3. The metal complex of claim 1, wherein the metal complex has a general formula of $M(L_a)_m(L_b)_n(L_c)_q$;

wherein

M is, at each occurrence identically or differently, selected from the group consisting of Cu, Ag, Au, Ru, Rh, Pd, Os, Ir and Pt;

$L_a$, $L_b$ and $L_c$ are a first ligand, a second ligand and a third ligand coordinated to the metal M, respectively, and $L_c$ is the same as or different from $L_a$ or $L_b$; wherein $L_a$, $L_b$ and $L_c$ can be optionally joined to form a multidentate ligand;

m is selected from 1, 2 or 3, n is selected from 0, 1 or 2, q is selected from 0, 1 or 2, and m+n+q equals an oxidation state of the metal M; wherein when m is greater than or equal to 2, a plurality of $L_a$ are the same or different; when n is equal to 2, two $L_b$ are the same or different;

when q is equal to 2, two $L_c$ are the same or different;

$L_a$ is, at each occurrence identically or differently, selected from the group consisting of the following:

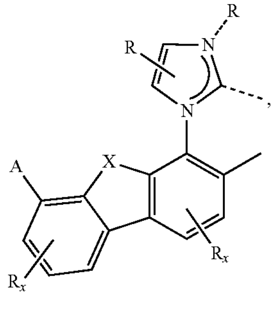

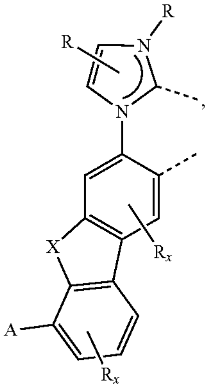

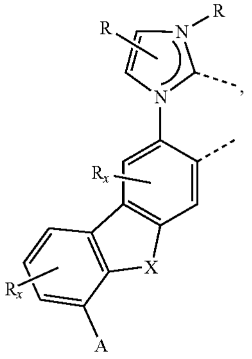

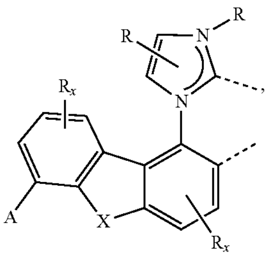

-continued

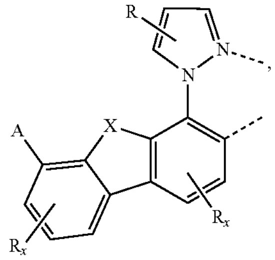

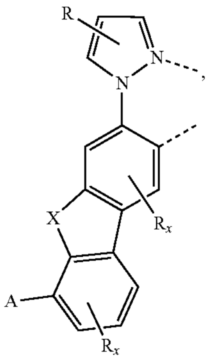

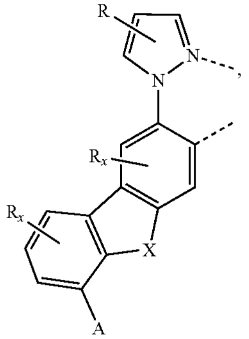

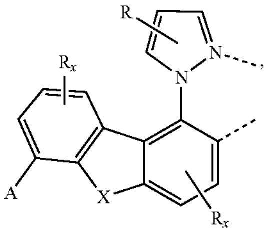

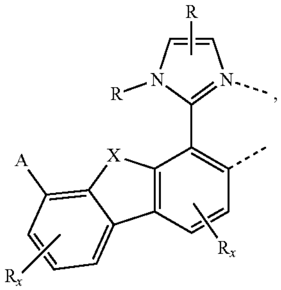

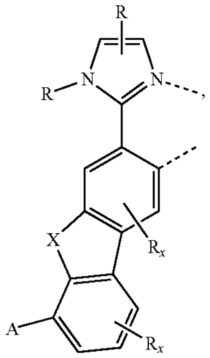

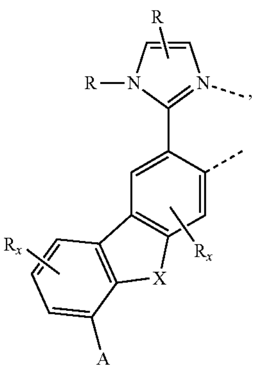

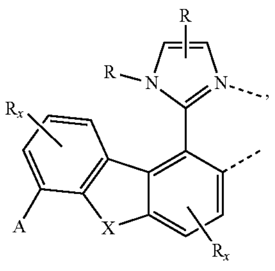

-continued
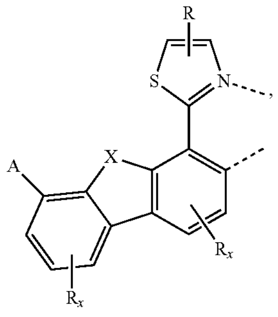
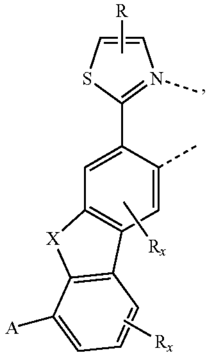
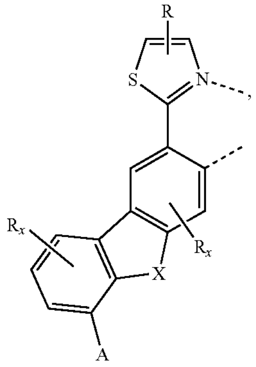
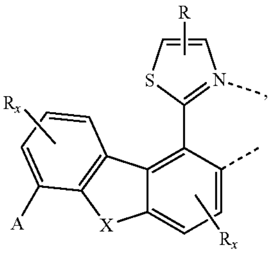
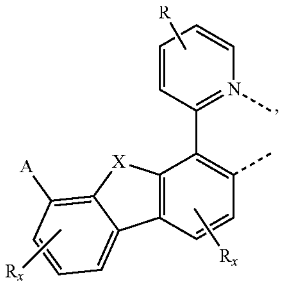
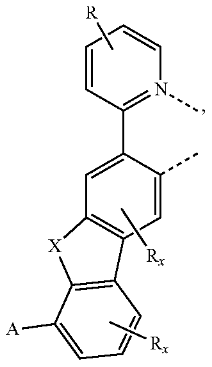
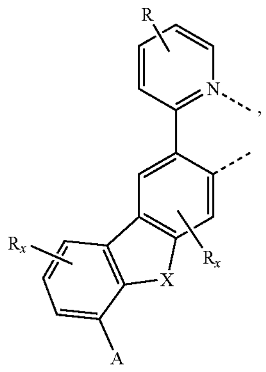
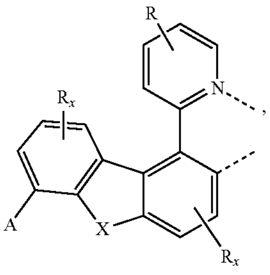
-continued
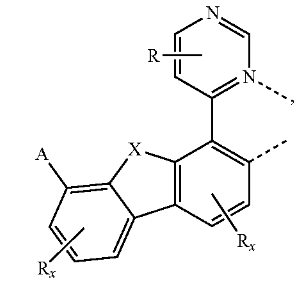
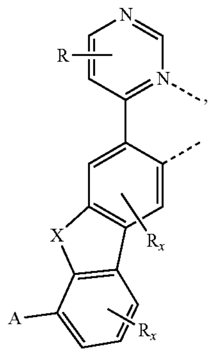
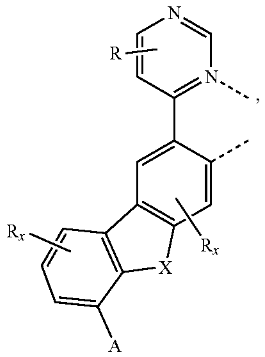
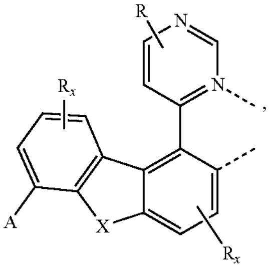
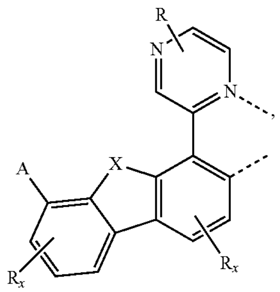
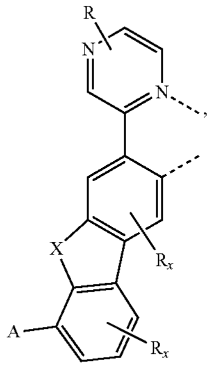
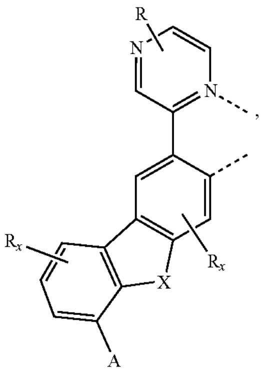
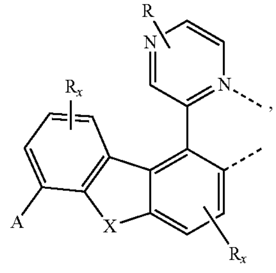

-continued
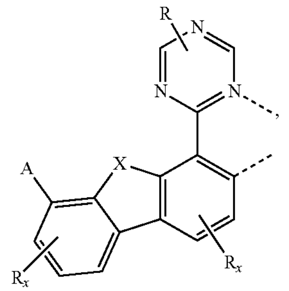
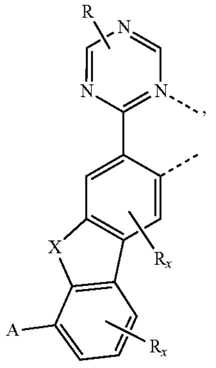
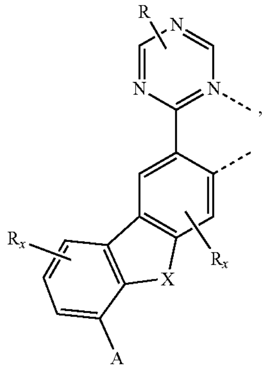
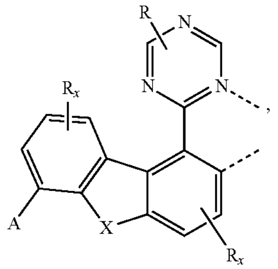
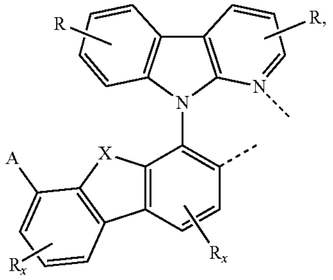
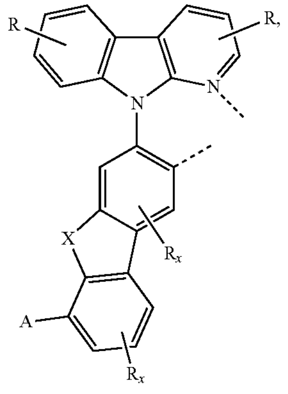
-continued
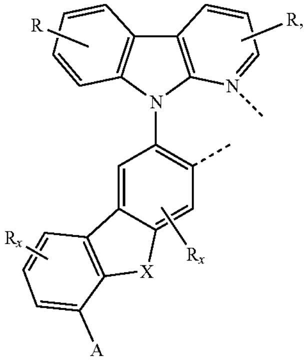
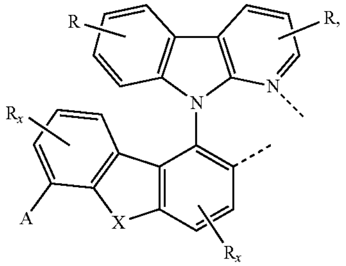
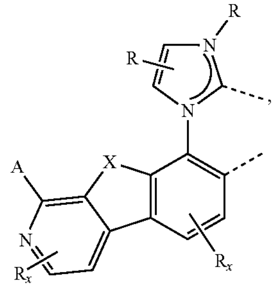
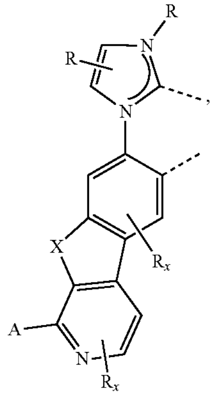
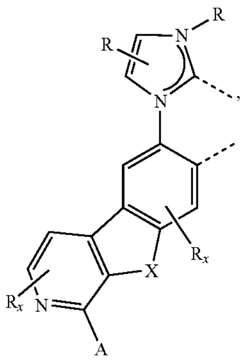
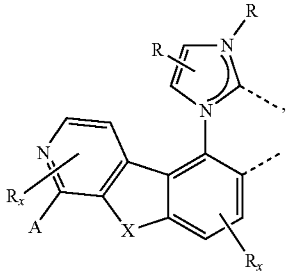

-continued
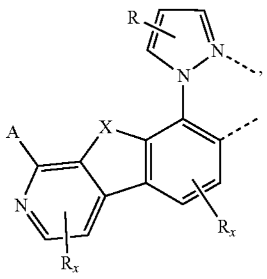
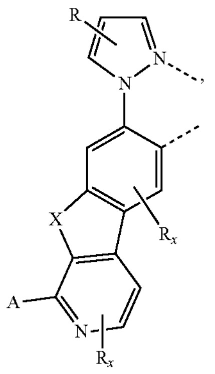
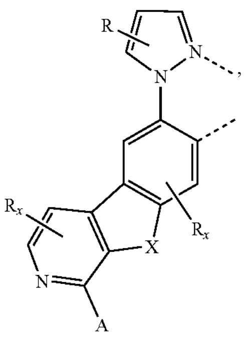
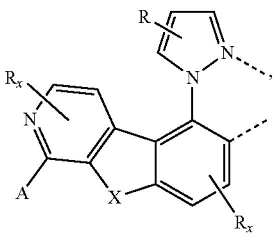
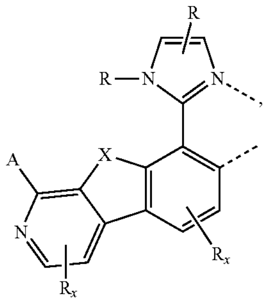
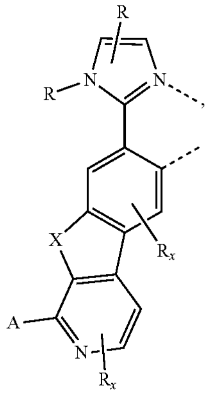
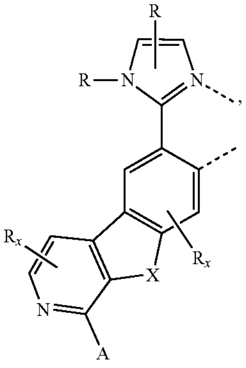
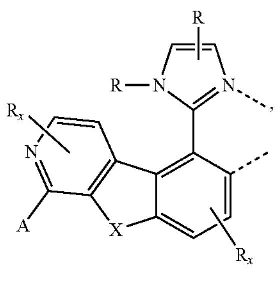
-continued
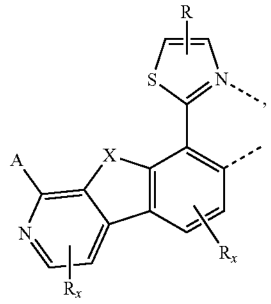
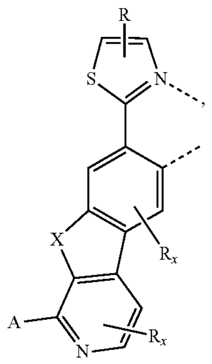
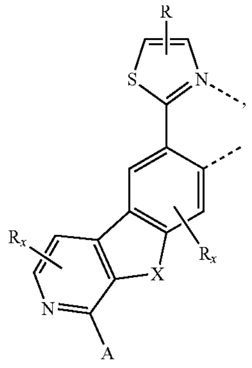
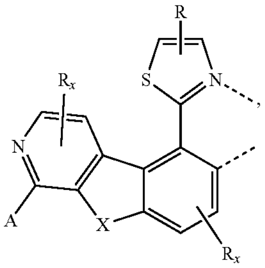
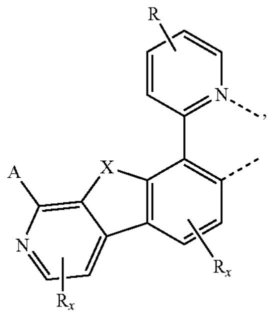
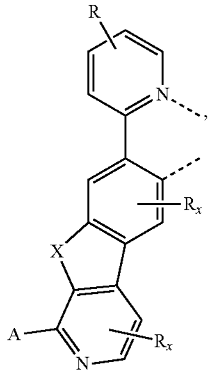
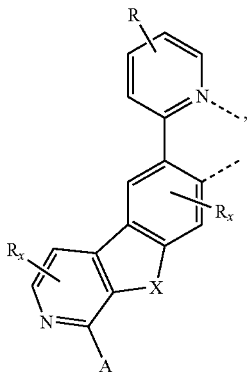
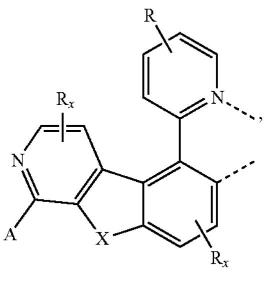

-continued
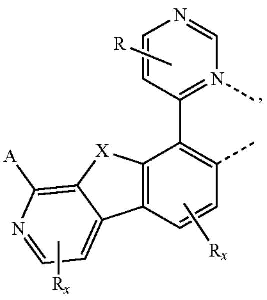
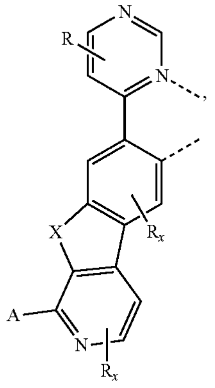
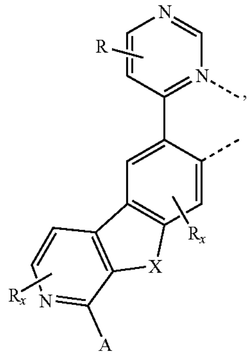
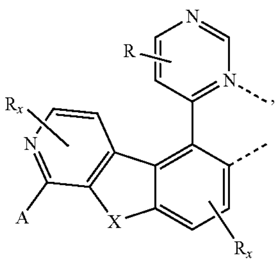
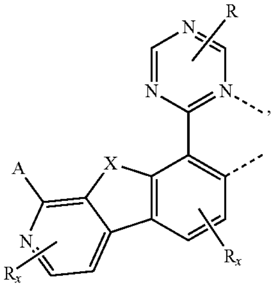
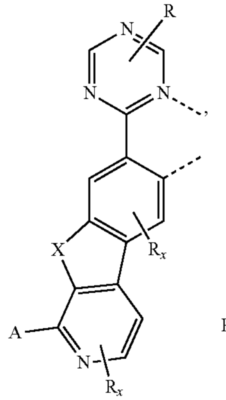
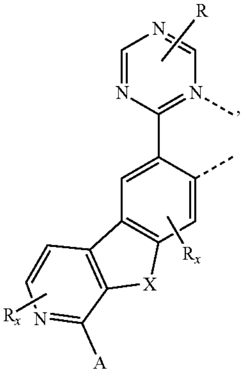
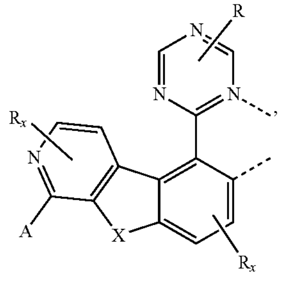
-continued
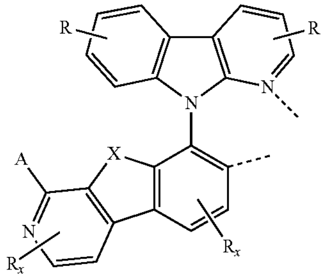
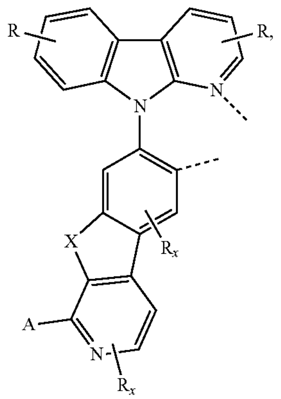
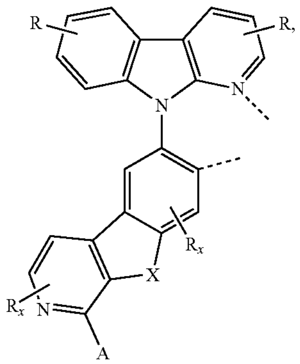
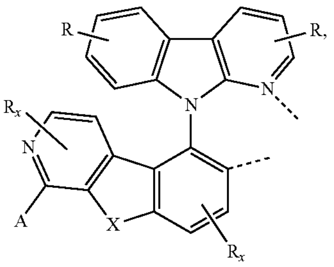
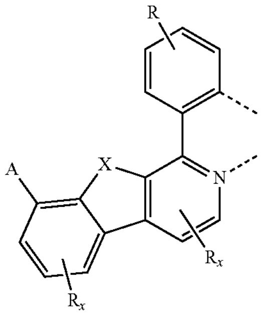
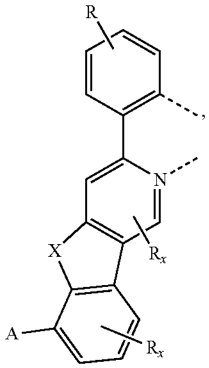
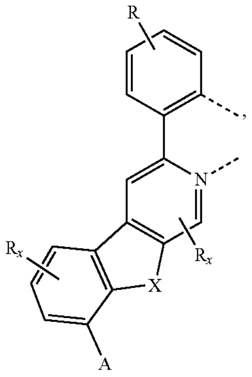
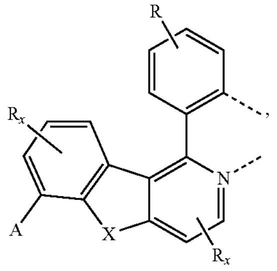

-continued

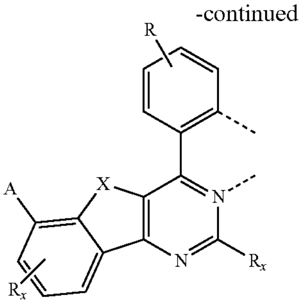

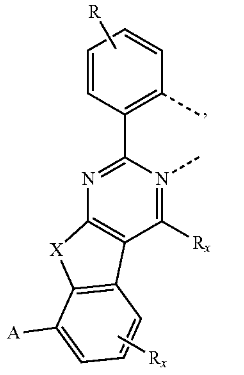

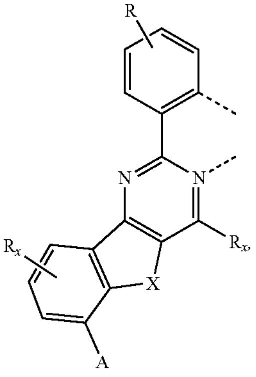

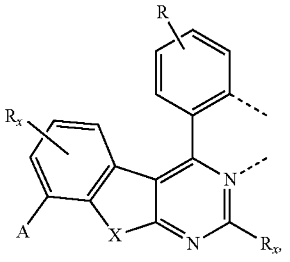

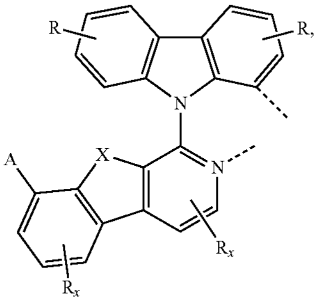

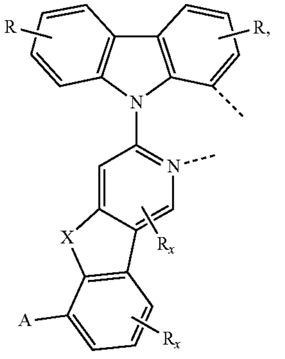

-continued

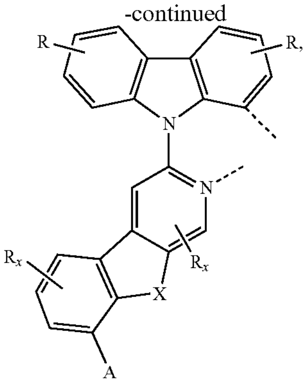

and

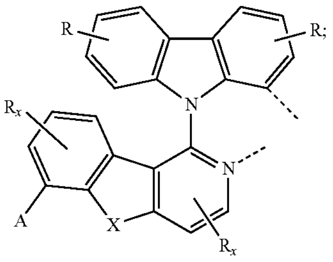

X is selected from the group consisting of O, S, Se, NR', CR'R', SiR'R' and GeR'R', wherein when two R' are present at the same time, the two R' are the same or different;

R and $R_x$ represent, at each occurrence identically or differently, mono-substitution, multiple substitutions or non-substitution;

A has a structure represented by Formula 2:

Formula 2

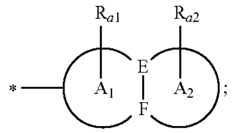

E and F are, at each occurrence identically or differently, selected from C, CR'', N, SiR'' or GeR'';

$R_{a1}$ and $R_{a2}$ represent, at each occurrence identically or differently, mono-substitution, multiple substitutions or non-substitution;

the ring $A_1$ and the ring $A_2$ are fused through E and F, the ring $A_1$ is selected from an aromatic ring having 6 to 30 ring atoms, a heteroaromatic ring having 5 to 30 ring atoms or a combination thereof; and the ring $A_2$ is selected from an alicyclic ring having 3 to 30 ring atoms;

"*" represents a position where A is joined;

adjacent substituents R, R', R'', $R_x$, $R_{a1}$, $R_{a2}$ can be optionally joined to form a ring;

$L_b$ and $L_c$ are, at each occurrence identically or differently, selected from a structure represented by any one of the group consisting of the following:

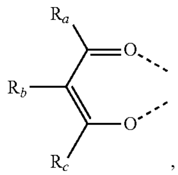 , 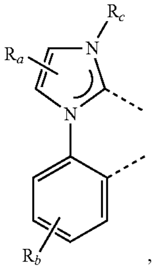 , 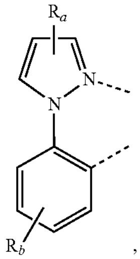 ,

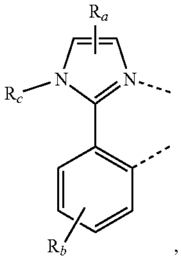 , 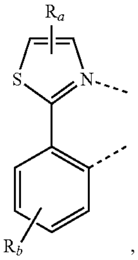 , 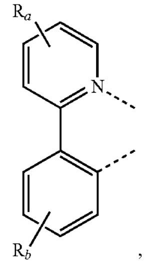 ,

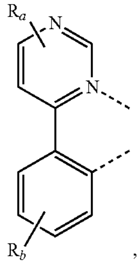 , 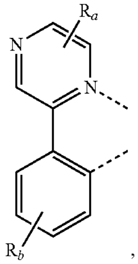 , 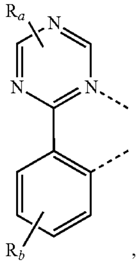 ,

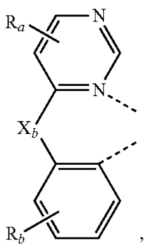 , 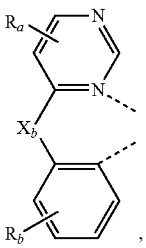 , and 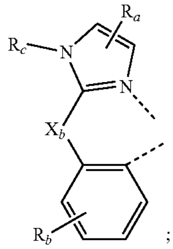 ;

wherein $X_b$ is, at each occurrence identically or differently, selected from the group consisting of O, S, Se, $NR_{N1}$ and $CR_{c1}R_{c2}$;

$R_a$ and $R_b$ represent, at each occurrence identically or differently, mono-substitution, multiple substitutions or non-substitution;

R, R', R'', $R_x$, $R_{a1}$, $R_{a2}$, $R_a$, $R_b$, $R_c$, $R_{N1}$, $R_{C1}$ and $R_{C2}$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof; and adjacent substituents $R_a$, $R_b$, $R_c$, $R_{N1}$, $R_{C1}$ and $R_{C2}$ can be optionally joined to form a ring.

4. The metal complex of claim 1, wherein the metal complex $Ir(L_a)_m(L_b)_{3-m}$ has a structure represented by Formula 3:

Formula 3

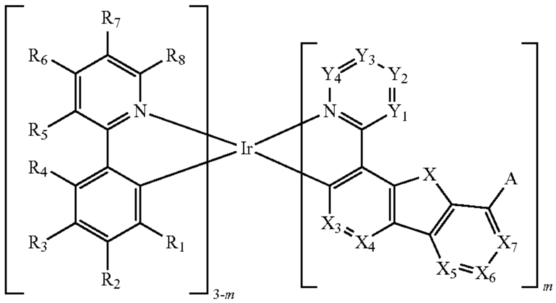 ;

wherein m is selected from 1, 2 or 3; when m is selected from 1, two $L_b$ are the same or different;

when m is selected from 2 or 3, a plurality of $L_a$ are the same or different;

$Y_1$ to $Y_4$ are, at each occurrence identically or differently, selected from $CR_y$ or N;

X is selected from the group consisting of O, S, Se, NR', SiR'R' and GeR'R', wherein when two R' are present at the same time, the two R' are the same or different;

$X_3$ to $X_7$ are, at each occurrence identically or differently, selected from $CR_x$ or N;

A has a structure represented by Formula 2:

Formula 2

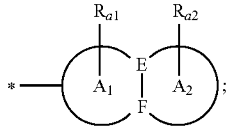 ;

E and F are, at each occurrence identically or differently, selected from C, CR'', N, SiR'' or GeR'';

$R_{a1}$ and $R_{a2}$ represent, at each occurrence identically or differently, mono-substitution, multiple substitutions or non-substitution;

the ring $A_1$ and the ring $A_2$ are fused through E and F, the ring $A_1$ is selected from an aromatic ring having 6 to 30 ring atoms, a heteroaromatic ring having 5 to 30 ring atoms or a combination thereof; and the ring $A_2$ is selected from an alicyclic ring having 3 to 30 ring atoms;

R', R", $R_x$, $R_y$, $R_{a1}$, $R_{a2}$ and $R_1$ to $R_8$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

adjacent substituents R', R", $R_x$, $R_y$, $R_{a1}$, $R_{a2}$ can be optionally joined to form a ring;

adjacent substituents $R_1$ to $R_8$ can be optionally joined to form a ring; and "*" represents a position where A is joined.

5. The metal complex of claim 4, wherein $X_3$ to $X_7$ are, at each occurrence identically or differently, selected from $CR_x$, and/or $Y_1$ to $Y_4$ are, at each occurrence identically or differently, selected from $CR_y$.

6. The metal complex of claim 4, wherein at least one of $X_3$ to $X_7$ is N, and/or at least one of $Y_1$ to $Y_4$ is N.

7. The metal complex of claim 1, wherein X is selected from O or S.

8. The metal complex of claim 1, wherein $R_x$ is, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted alkylgermanyl having 3 to 20 carbon atoms, cyano and combinations thereof.

9. The metal complex of claim 4, wherein at least one of $X_5$ to $X_7$ is selected from $CR_x$, and $R_x$ is cyano or fluorine.

10. The metal complex of claim 1, wherein the ring $A_1$ is selected from an aromatic ring having 6 to 18 ring atoms, a heteroaromatic ring having 5 to 18 ring atoms or a combination thereof, and the ring $A_2$ is selected from an alicyclic ring having 3 to 10 ring atoms.

11. The metal complex of claim 1, wherein $R_{a1}$ and $R_{a2}$ are, at each occurrence identically or differently, selected from the group consisting of: hydrogen, deuterium, substituted or unsubstituted alkyl having 1 to 6 carbon atoms, substituted or unsubstituted cycloalkyl having 3 to 6 ring carbon atoms, cyano and combinations thereof.

12. The metal complex of claim 1, wherein A is, at each occurrence identically or differently, selected from the group consisting of the following structures:

A-7

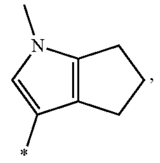

,

A-8

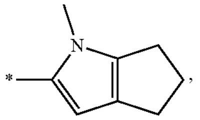

,

A-9

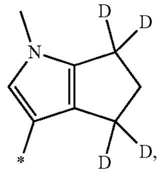

,

A-10

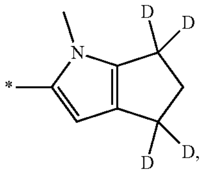

,

A-11

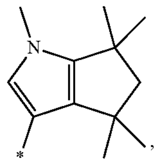

,

A-12

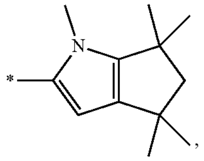

,

A-13

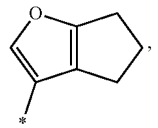

,

A-14

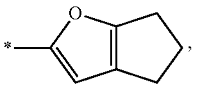

,

A-15

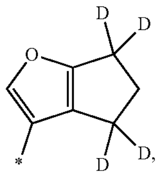

,

-continued
A-16
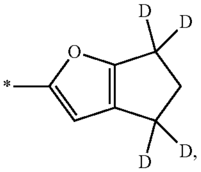
A-17
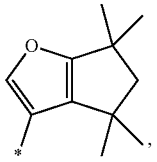
A-18
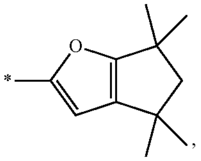
A-19
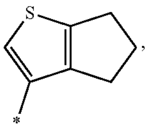
A-20
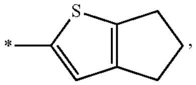
A-21
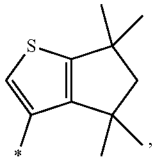
A-22
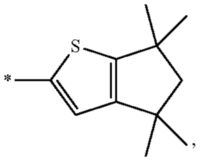
A-23
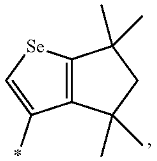
A-24
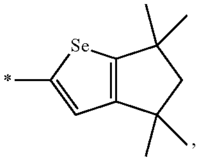
A-25
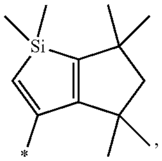
-continued
A-26
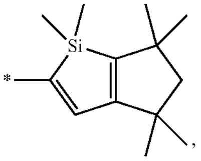
A-27
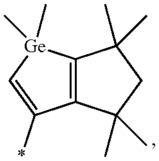
A-28
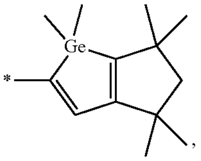
A-36
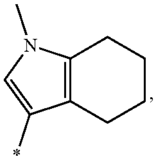
A-37
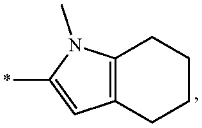
A-38
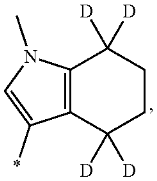
A-39
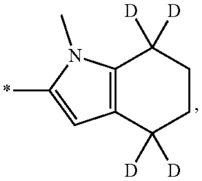
A-40
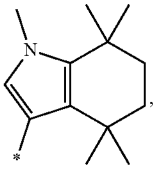
A-41
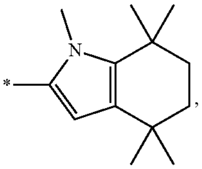

-continued
A-42
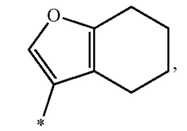
A-43
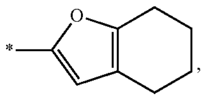
A-44
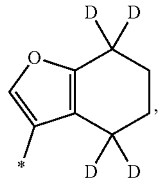
A-45
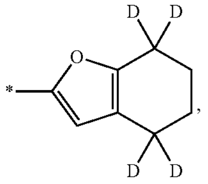
A-46
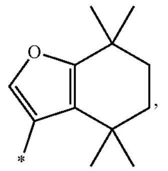
A-47
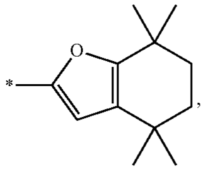
A-48
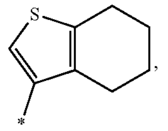
A-49
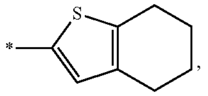
A-50
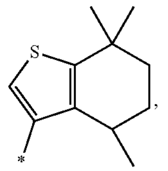
A-51
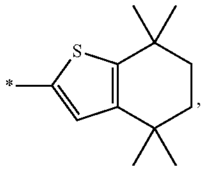
-continued
A-52
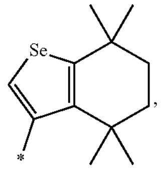
A-53
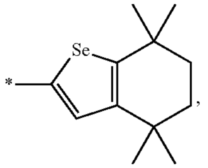
A-54
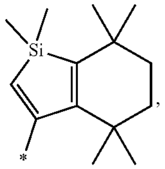
A-55
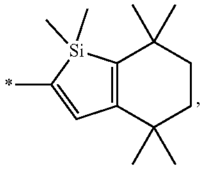
A-56
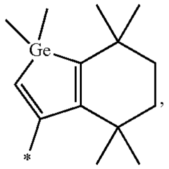
A-57
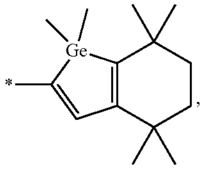
A-70
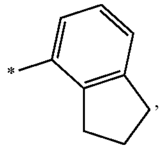
A-71
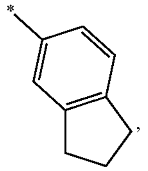
A-72
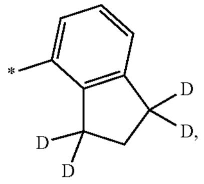

-continued
A-73
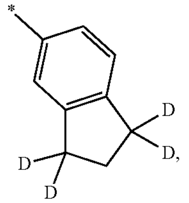
A-74
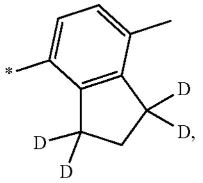
A-75
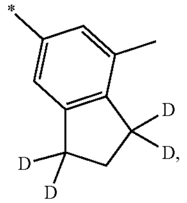
A-76
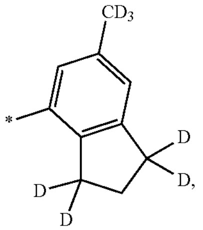
A-77
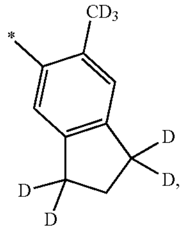
A-78
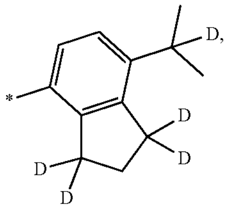
A-79
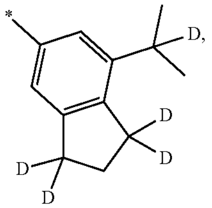
-continued
A-80
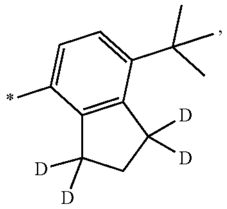
A-81
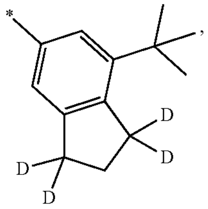
A-82
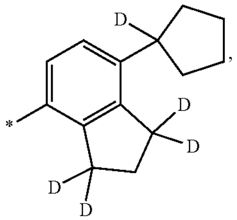
A-83
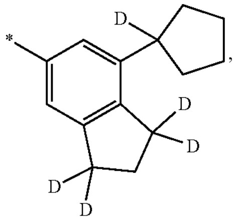
A-84
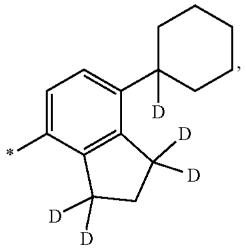
A-85
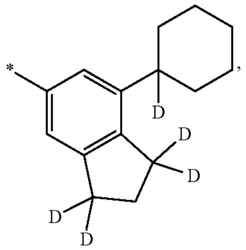
A-86
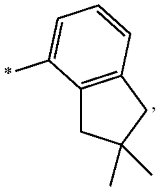

-continued
A-87
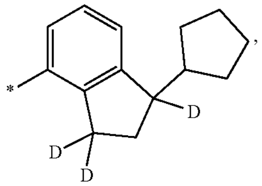
A-88
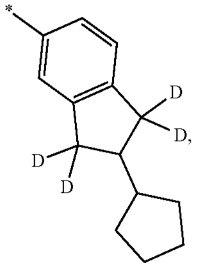
A-89
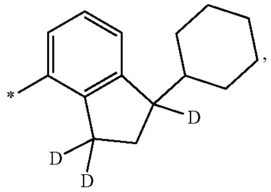
A-90
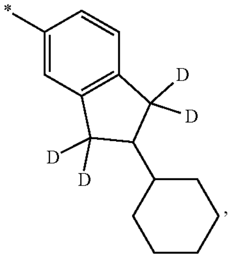
A-91
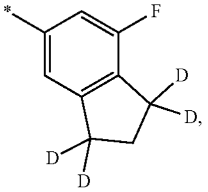
A-92
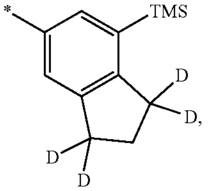
A-93
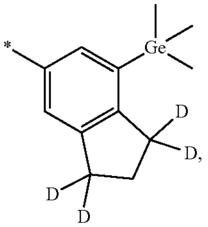
-continued
A-94
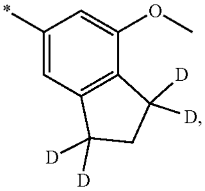
A-95
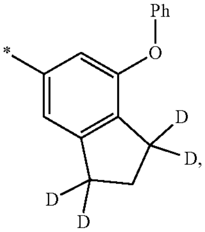
A-96
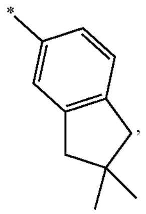
A-97
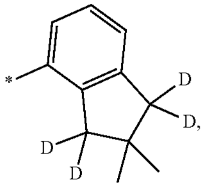
A-98
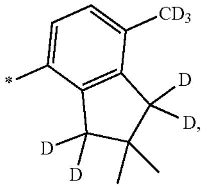
A-99
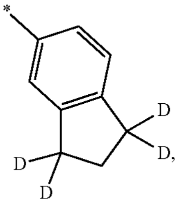
A-100
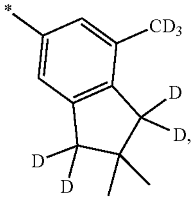

-continued
A-101
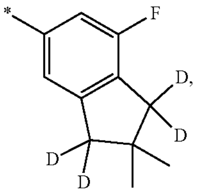
A-102
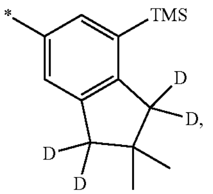
A-103
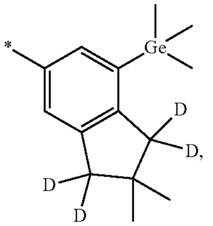
A-104
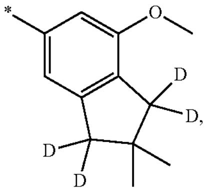
A-105
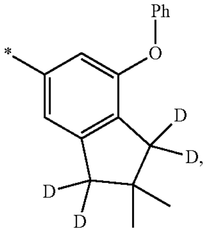
A-106
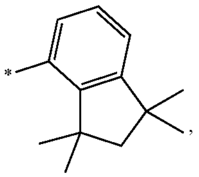
A-107
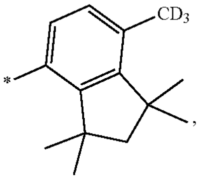
-continued
A-108
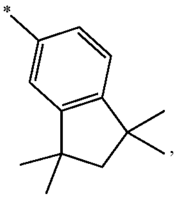
A-109
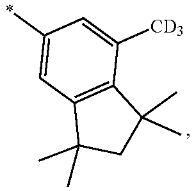
A-110
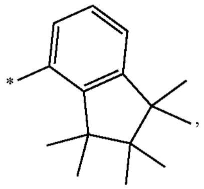
A-111
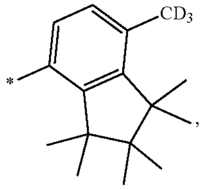
A-112
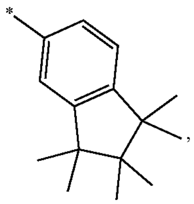
A-113
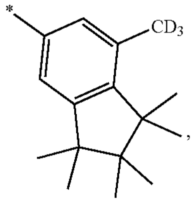
A-114
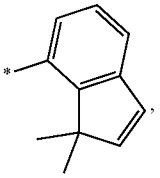
A-115
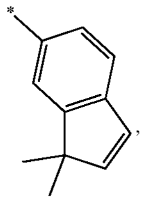

-continued
A-116
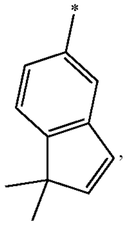
A-117
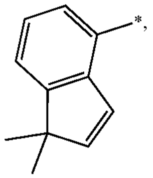
A-120
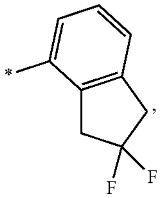
A-121
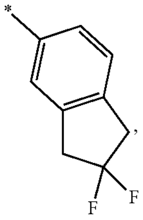
A-122
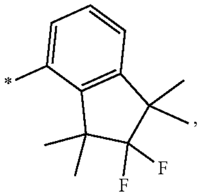
A-123
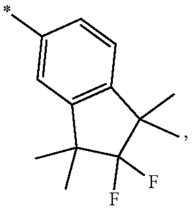
A-148
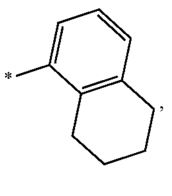
-continued
A-149
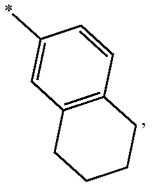
A-150
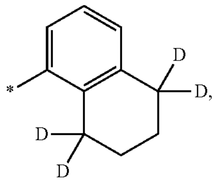
A-151
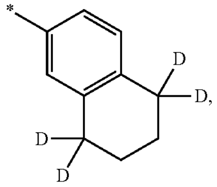
A-152
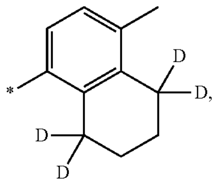
A-153
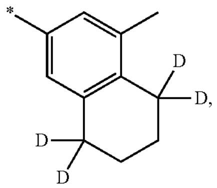
A-154
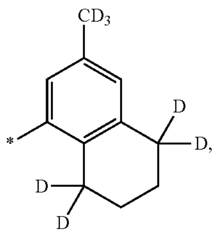
A-155
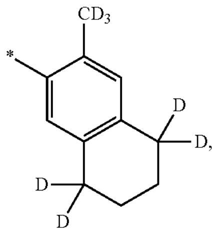

-continued
A-156
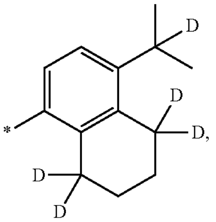
A-157
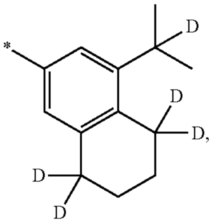
A-158
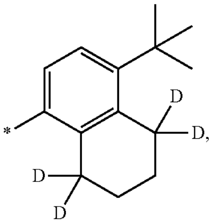
A-159
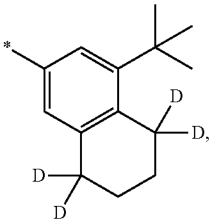
A-160
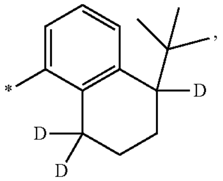
A-161
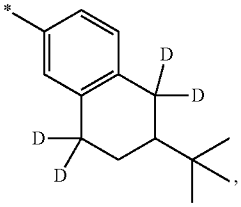
A-162
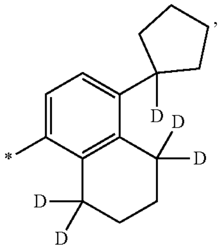
-continued
A-163
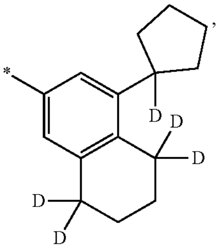
A-164
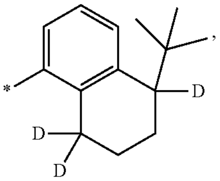
A-165
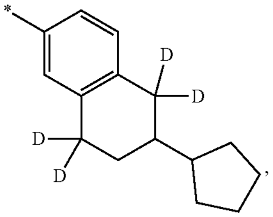
A-166
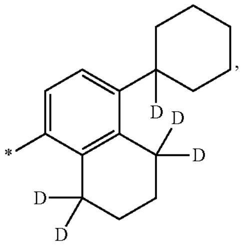
A-167
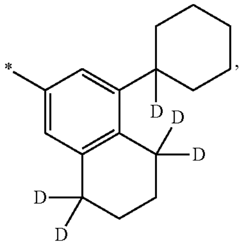
A-168
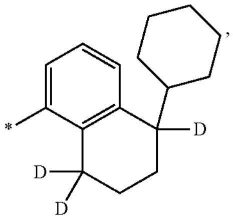

-continued
A-169
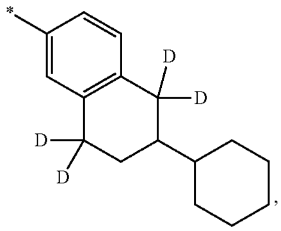
A-170
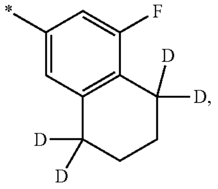
A-171
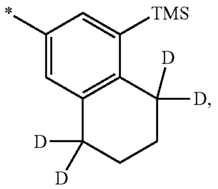
A-172
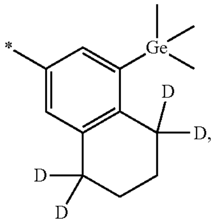
A-173
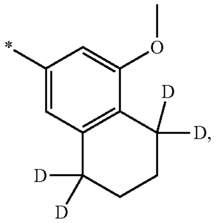
A-174
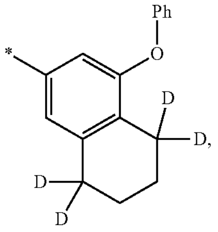
A-175
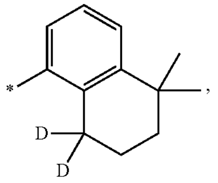
-continued
A-176
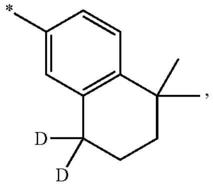
A-177
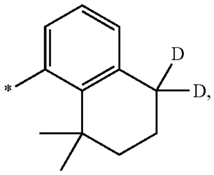
A-178
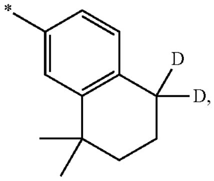
A-179
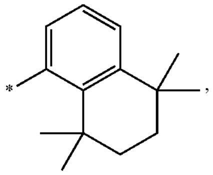
A-180
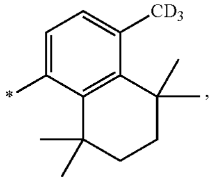
A-181
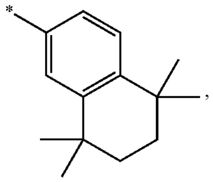
A-182
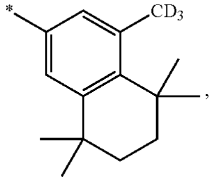
A-183
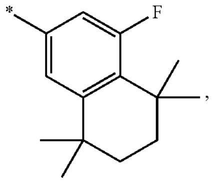

-continued
A-184
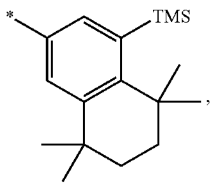
A-185
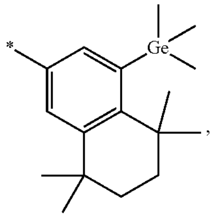
A-186
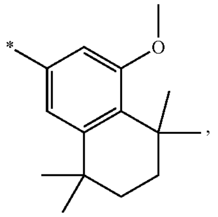
A-187
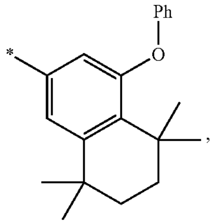
A-186
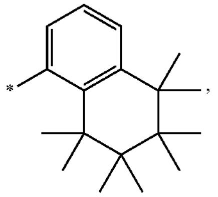
A-187
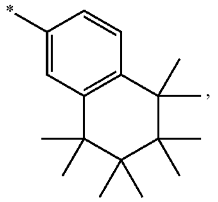
A-215
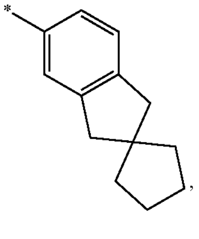
-continued
A-216
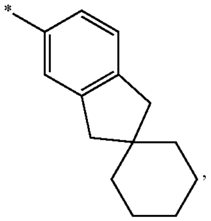
A-217
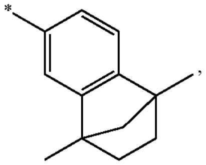
A-218
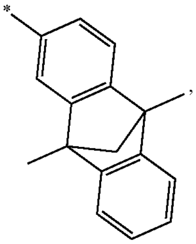
A-219
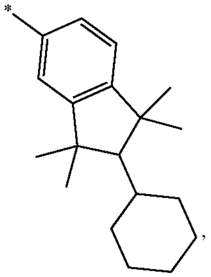
A-220
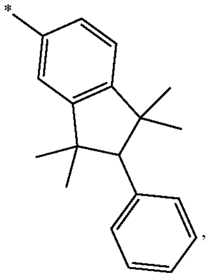
A-221
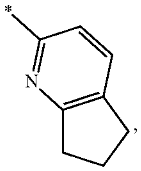
A-222
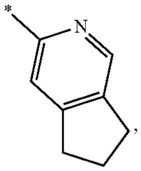

-continued

A-223

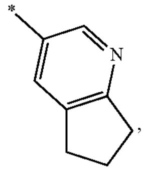

A-224

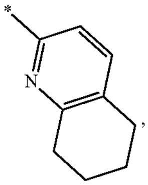

A-225

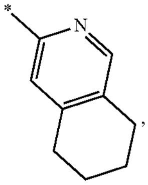

A-226

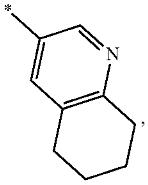

A-227

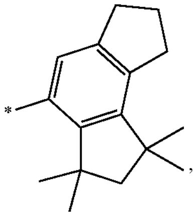

A-228

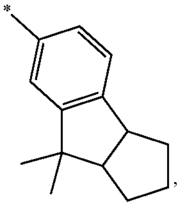

A-229

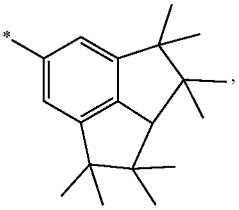

-continued

A-230

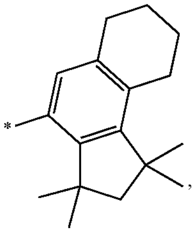

A-231

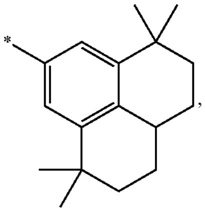

A-233

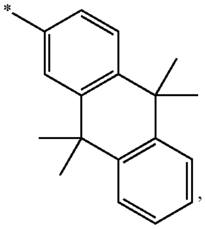

A-234

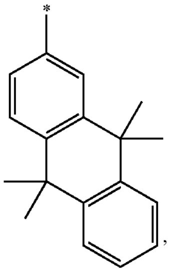

A-263

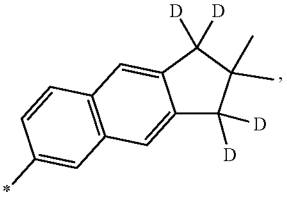

and

A-264

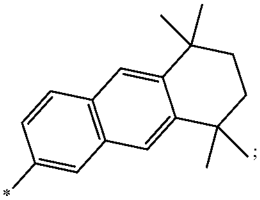

wherein optionally, hydrogens in the above groups can be partially or fully deuterated; and "*" represents a position where A is joined.

13. The metal complex of claim 4, at least one $R_y$ is selected from the group consisting of: deuterium, halogen, substituted or unsubstituted alkyl having 1 to 20 carbon atoms, substituted or unsubstituted cycloalkyl having 3 to 20 ring carbon atoms, substituted or unsubstituted aryl having 6 to 30 carbon atoms, substituted or unsubstituted heteroaryl having 3 to 30 carbon atoms and combinations thereof.

14. The metal complex of claim 4, wherein at least one or at least two of $R_5$ to $R_8$ are selected from substituted or unsubstituted alkyl having 1 to 20 carbon atoms, substituted or unsubstituted cycloalkyl having 3 to 20 ring carbon atoms or a combination thereof, and the total number of carbon atoms in all of $R_5$ to $R_8$ is at least 4.

15. The metal complex of claim 4, wherein at least one, at least two, at least three or all of $R_2$, $R_3$, $R_6$ and $R_7$ are selected from the group consisting of: deuterium, substituted or unsubstituted alkyl having 1 to 20 carbon atoms, substituted or unsubstituted cycloalkyl having 3 to 20 ring carbon atoms and combinations thereof.

16. The metal complex of claim 3, wherein $L_a$ is, at each occurrence identically or differently, selected from any one of the group consisting of the following:

$L_{a1}$-5

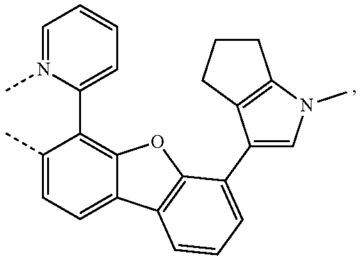

$L_{a1}$-6

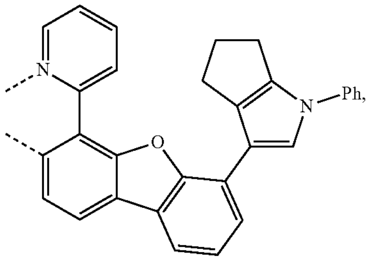

$L_{a1}$-7

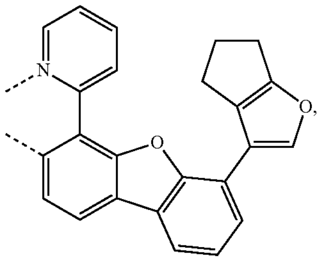

$L_{a1}$-8

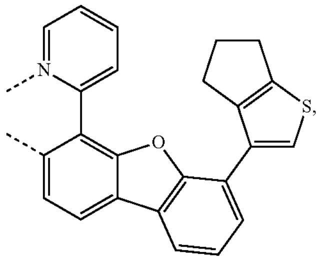

-continued $L_{a1}$-9

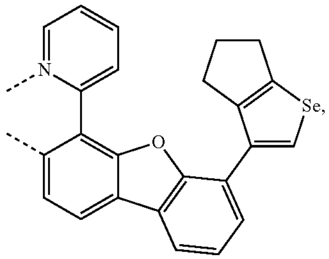

$L_{a1}$-10

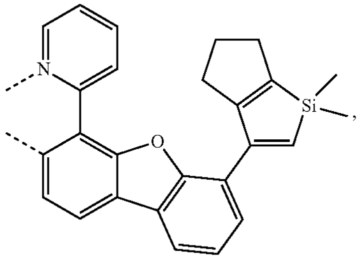

$L_{a1}$-11

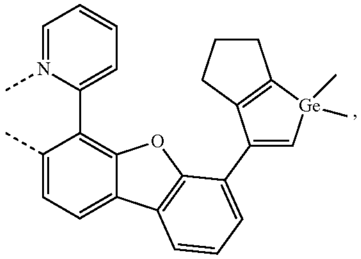

$L_{a1}$-16

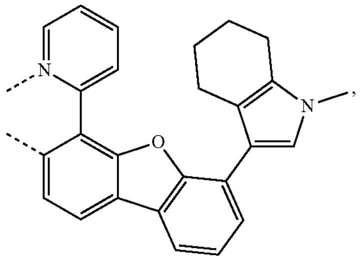

$L_{a1}$-17

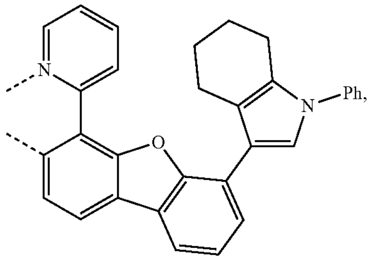

$L_{a1}$-18

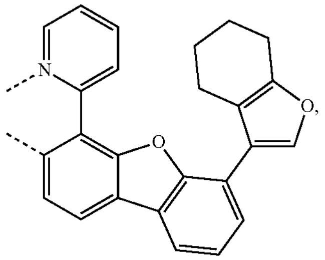

-continued
$L_{a1-19}$
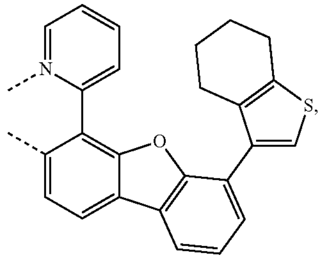
$L_{a1-20}$
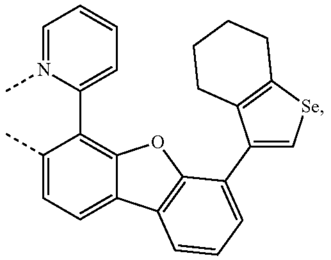
$L_{a1-21}$
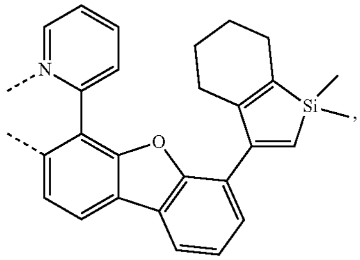
$L_{a1-22}$
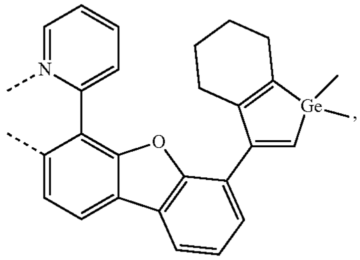
$L_{a1-27}$
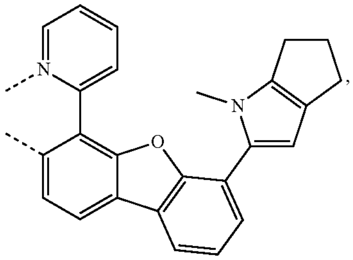
$L_{a1-28}$
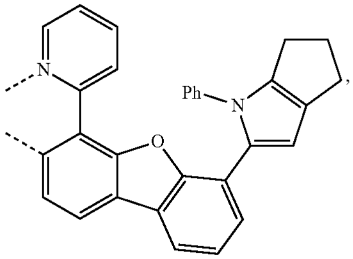
-continued
$L_{a1-29}$
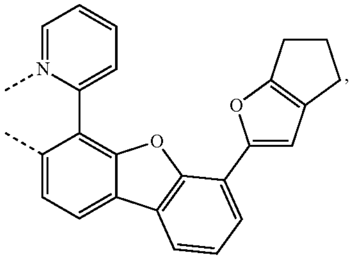
$L_{a1-30}$
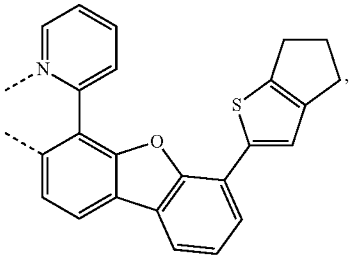
$L_{a1-31}$
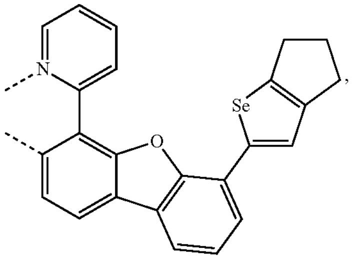
$L_{a1-32}$
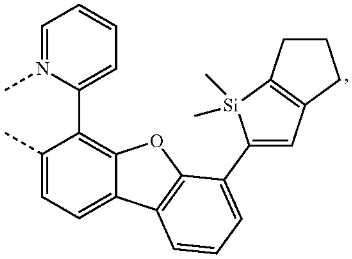
$L_{a1-33}$
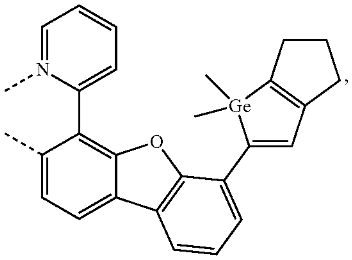
$L_{a1-38}$
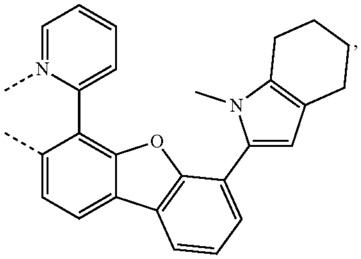

-continued
$L_{a1-39}$
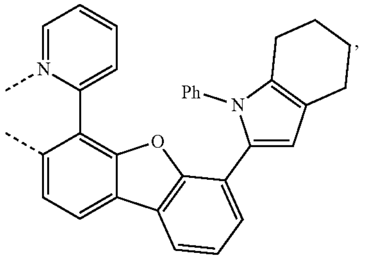
$L_{a1-40}$
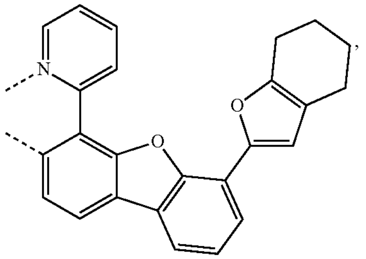
$L_{a1-41}$
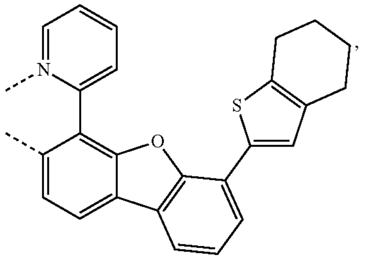
$L_{a1-42}$
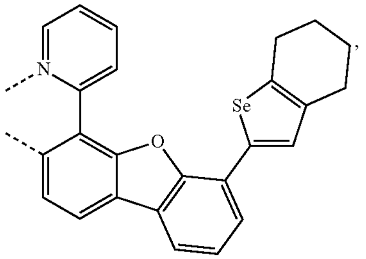
$L_{a1-43}$
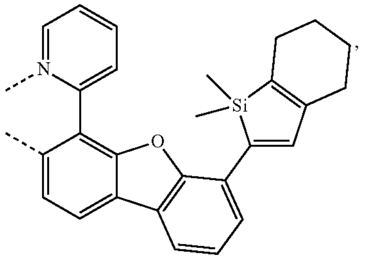
$L_{a1-44}$
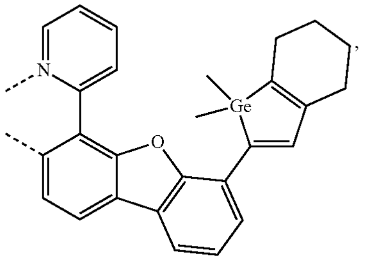
-continued
$L_{a1-45}$
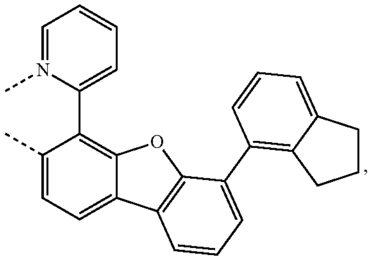
$L_{a1-46}$
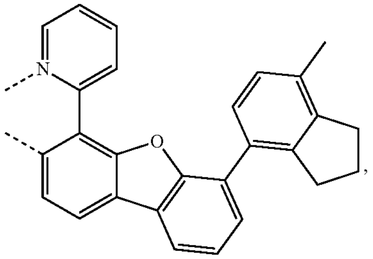
$L_{a1-47}$
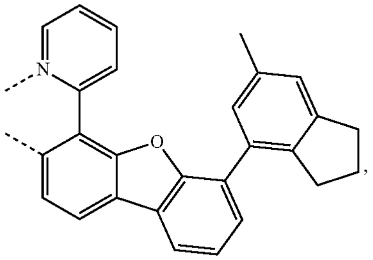
$L_{a1-48}$
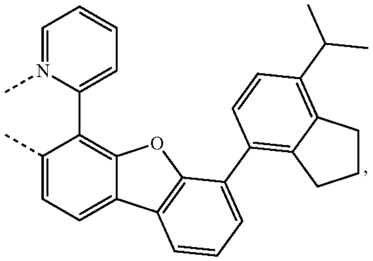
$L_{a1-49}$
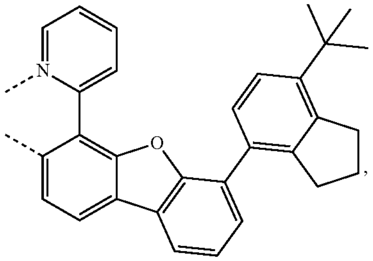

-continued
$L_{a1-50}$
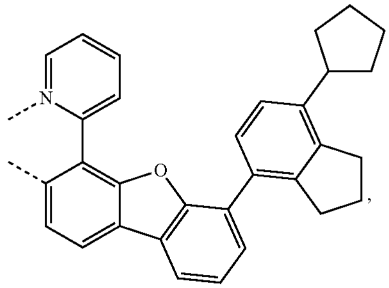
$L_{a1-51}$
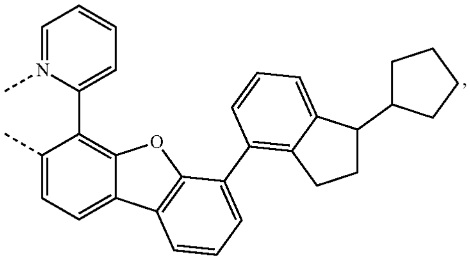
$L_{a1-52}$
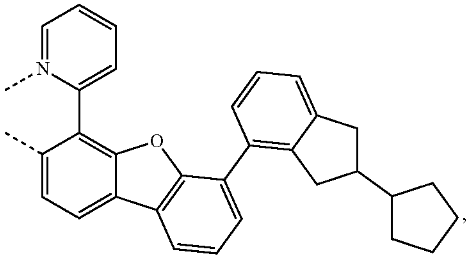
$L_{a1-53}$
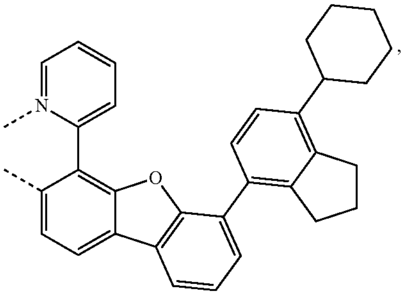
$L_{a1-54}$
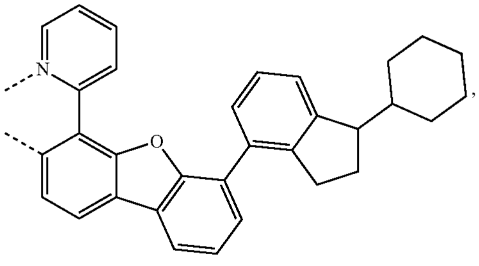
-continued
$L_{a1-55}$
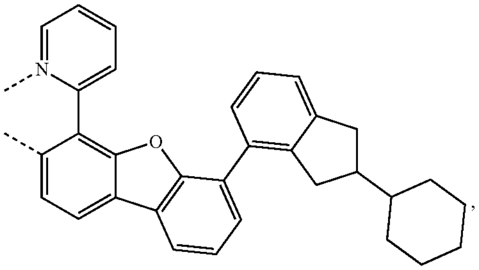
$L_{a1-56}$
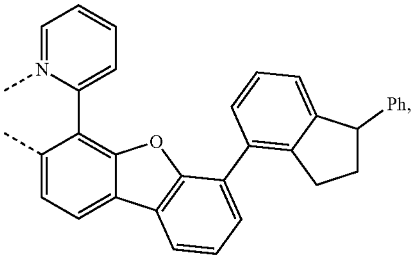
$L_{a1-57}$
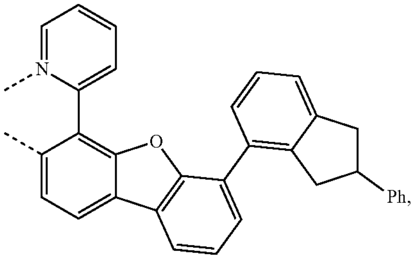
$L_{a1-58}$
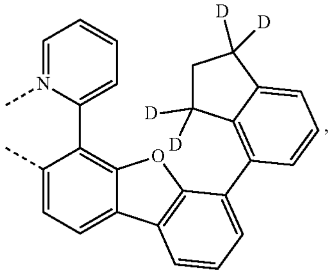
$L_{a1-59}$
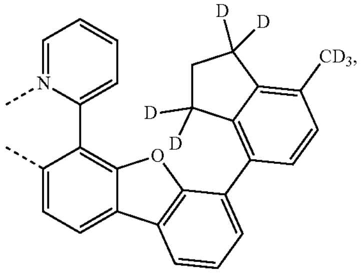

$L_{a1-60}$
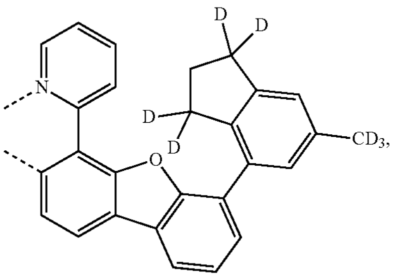
$L_{a1-61}$
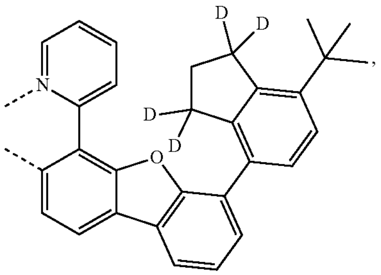
$L_{a1-62}$
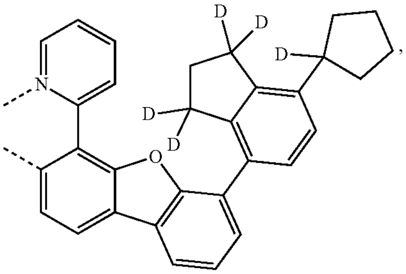
$L_{a1-63}$
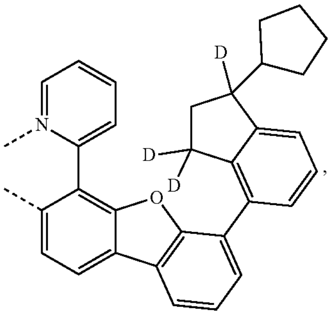
$L_{a1-64}$
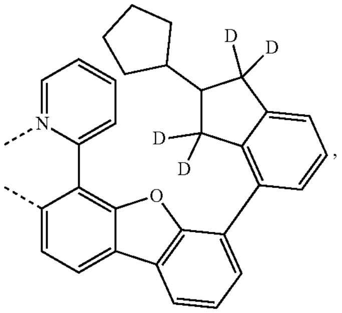
$L_{a1-65}$
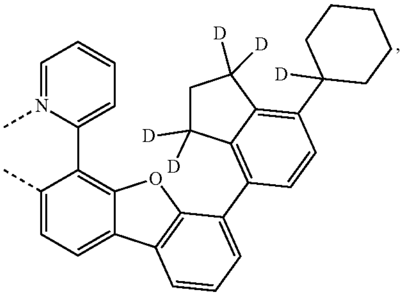
$L_{a1-66}$
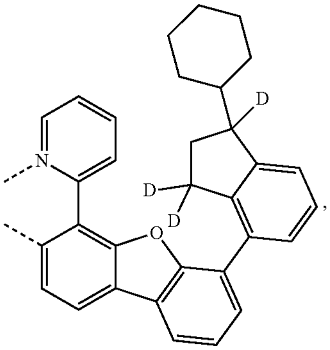
$L_{a1-67}$
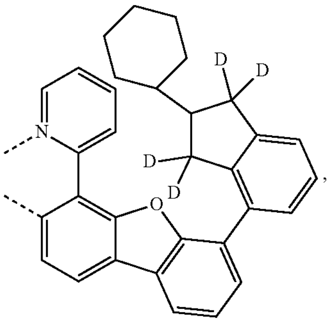
$L_{a1-68}$
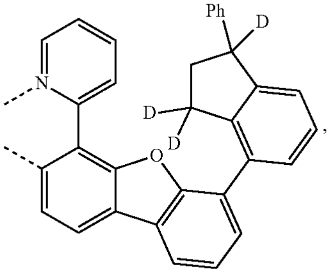
$L_{a1-69}$
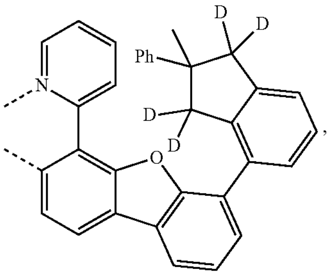

-continued
$L_{a1\text{-}70}$
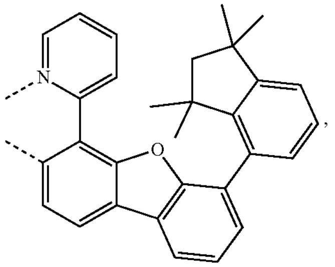
$L_{a1\text{-}71}$
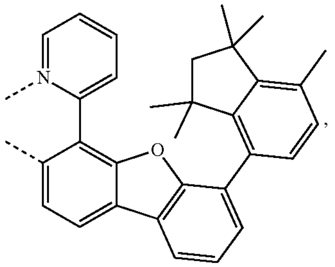
$L_{a1\text{-}72}$
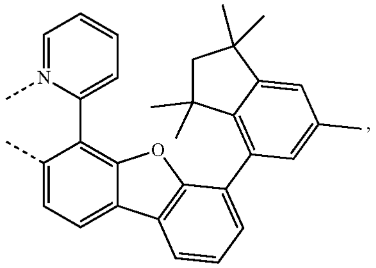
$L_{a1\text{-}73}$
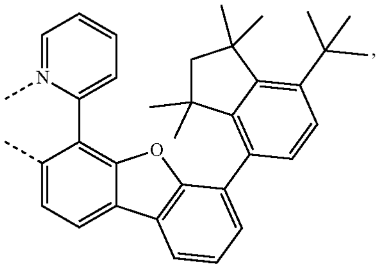
$L_{a1\text{-}74}$
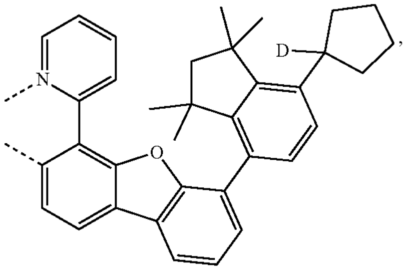
-continued
$L_{a1\text{-}75}$
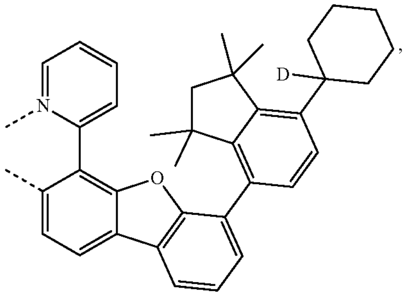
$L_{a1\text{-}76}$
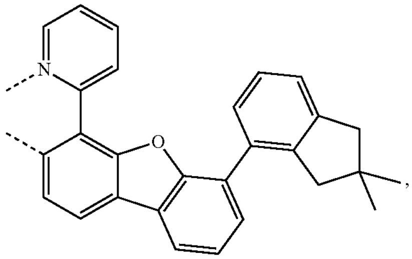
$L_{a1\text{-}77}$
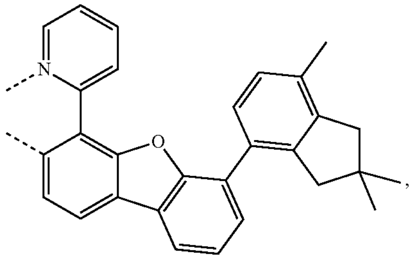
$L_{a1\text{-}78}$
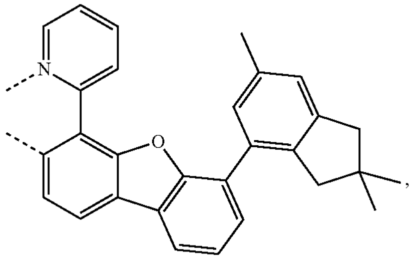
$L_{a1\text{-}79}$
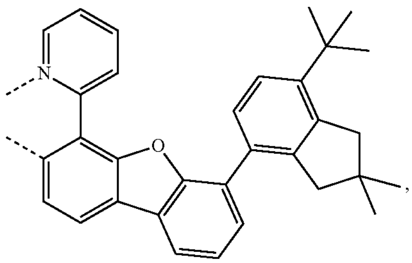

$L_{a1\text{-}80}$
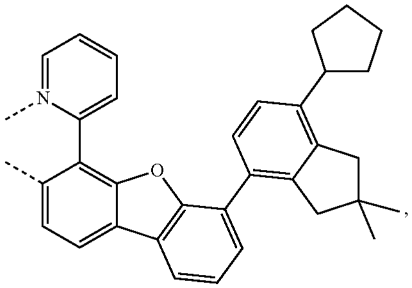
$L_{a1\text{-}81}$
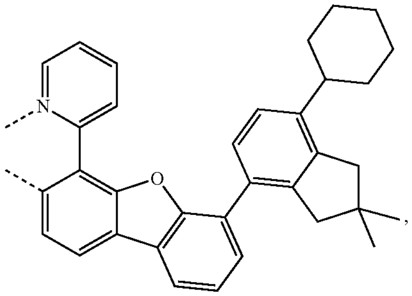
$L_{a1\text{-}82}$
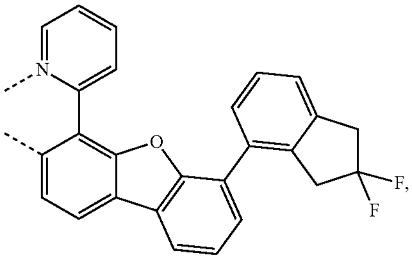
$L_{a1\text{-}83}$
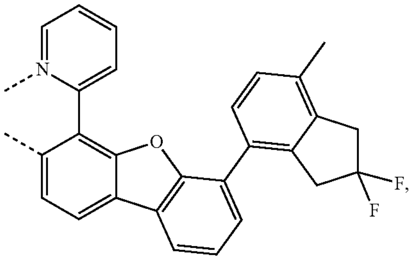
$L_{a1\text{-}84}$
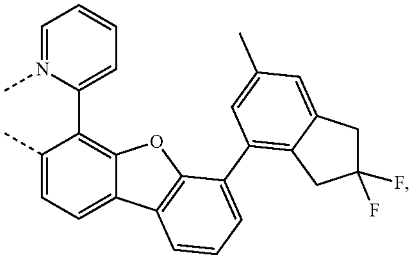
$L_{a1\text{-}85}$
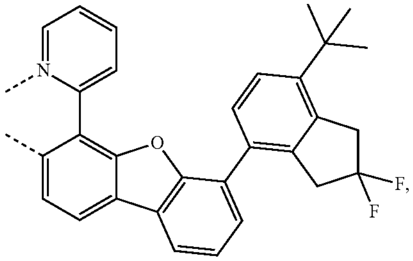
$L_{a1\text{-}86}$
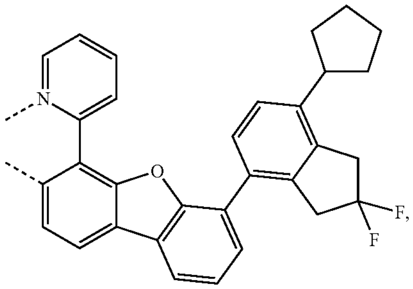
$L_{a1\text{-}87}$
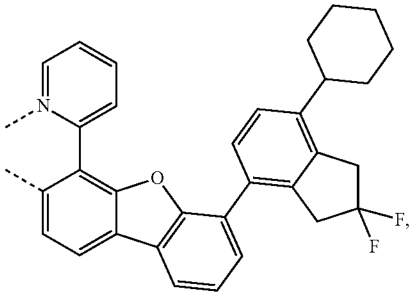
$L_{a1\text{-}88}$
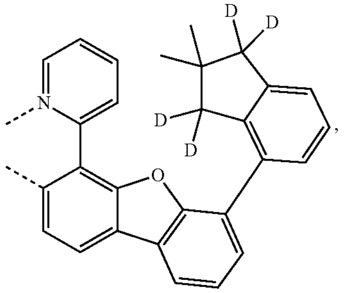
$L_{a1\text{-}89}$
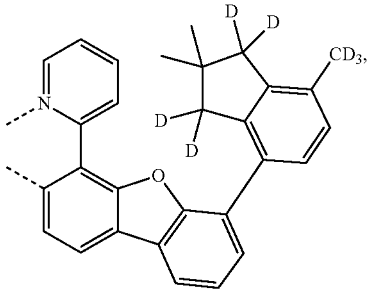

-continued
$L_{a1-90}$
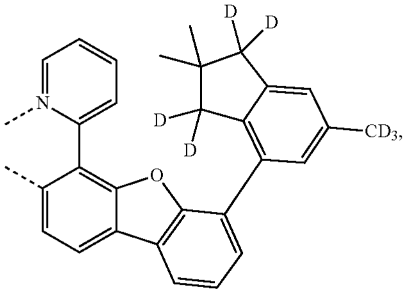
$L_{a1-91}$
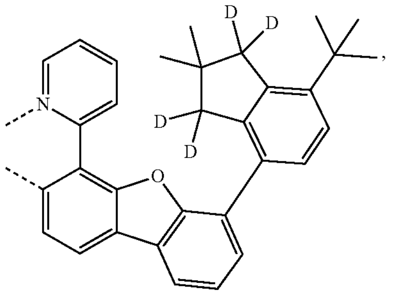
$L_{a1-92}$
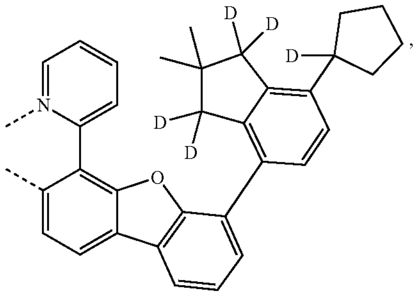
$L_{a1-93}$
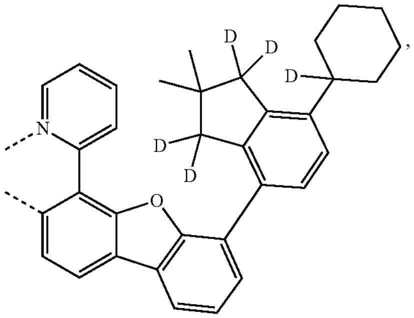
$L_{a1-94}$
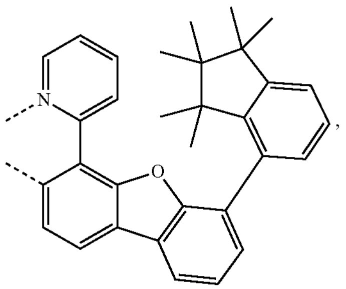
-continued
$L_{a1-95}$
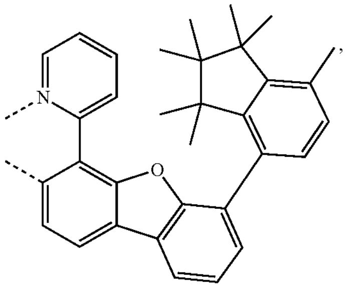
$L_{a1-96}$
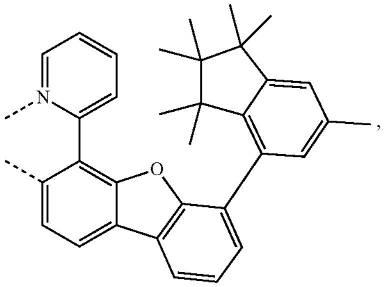
$L_{a1-97}$
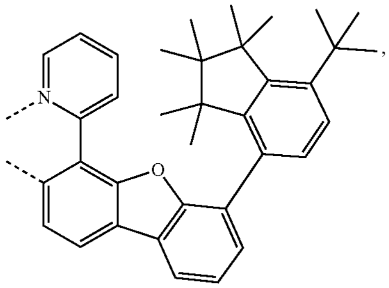
$L_{a1-98}$
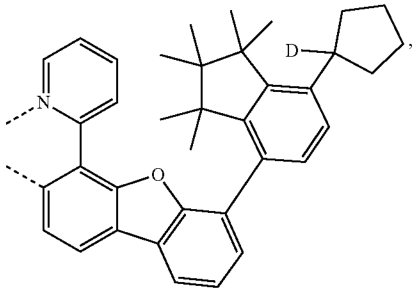
$L_{a1-99}$
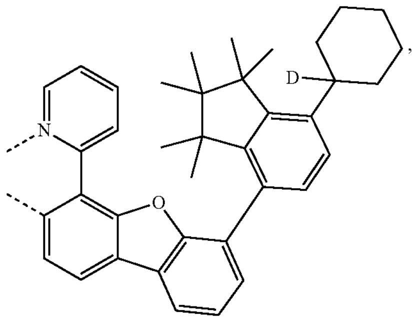

-continued
$L_{a1}$-133
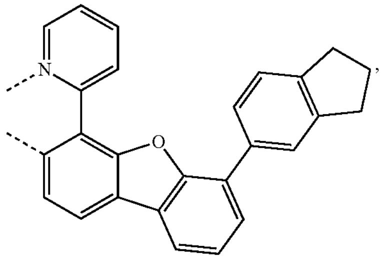,
$L_{a1}$-134
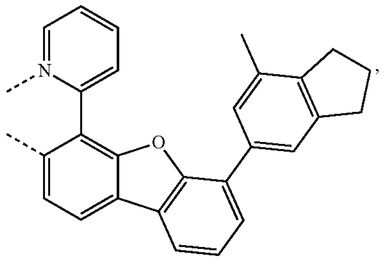,
$L_{a1}$-135
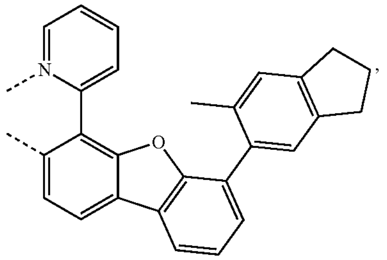,
$L_{a1}$-136
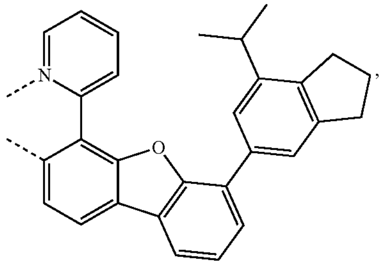,
$L_{a1}$-137
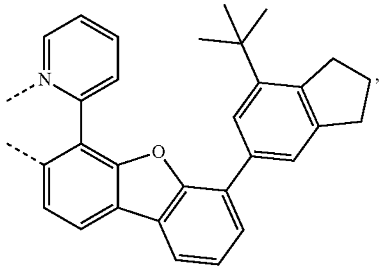,
-continued
$L_{a1}$-38
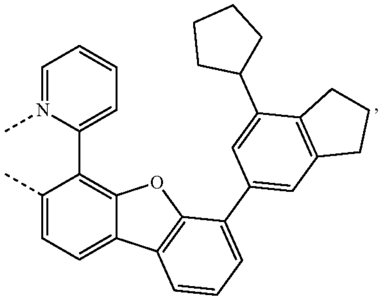,
$L_{a1}$-139
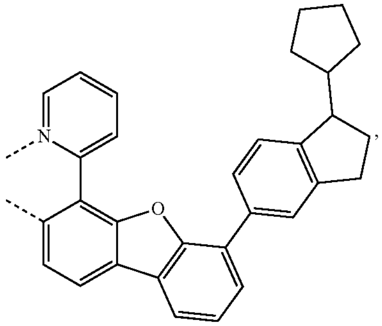,
$L_{a1}$-140
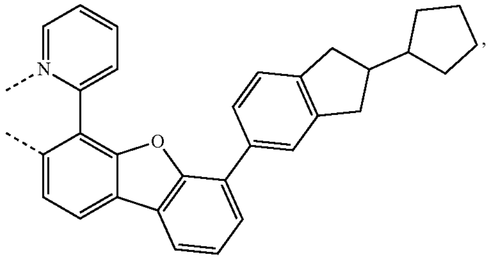,
$L_{a1}$-141
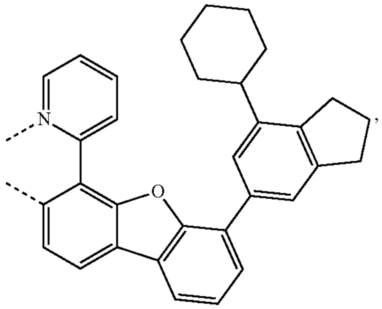,
$L_{a1}$-142
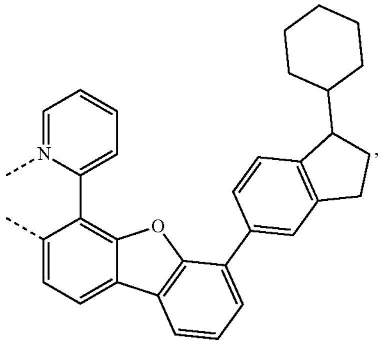, -continued
L$_{a1}$-143
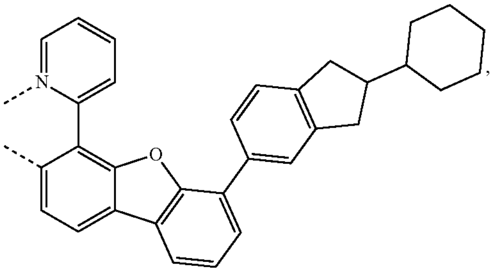
L$_{a1}$-144
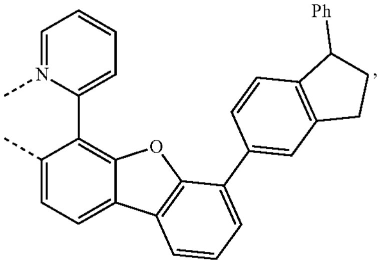
L$_{a1}$-145
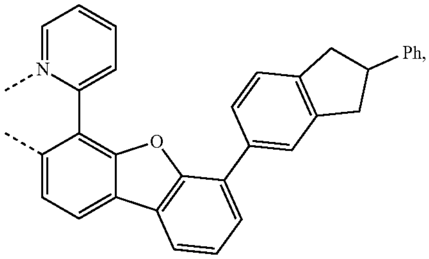
L$_{a1}$-146
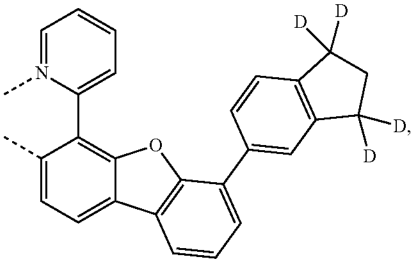
L$_{a1}$-147
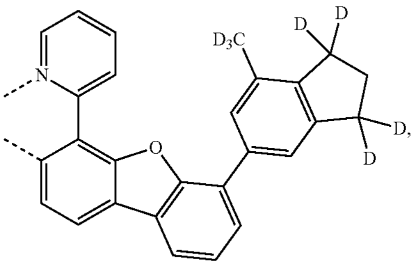
-continued
L$_{a1}$-148
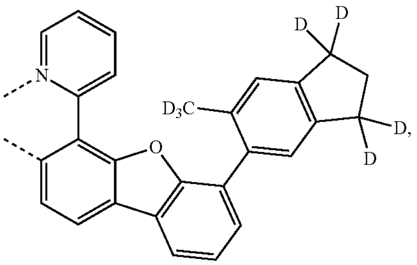
L$_{a1}$-149
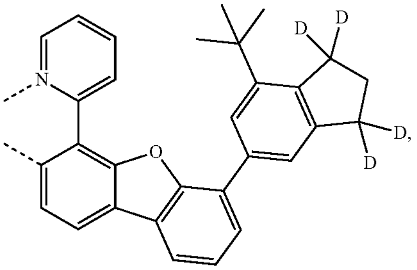
L$_{a1}$-150
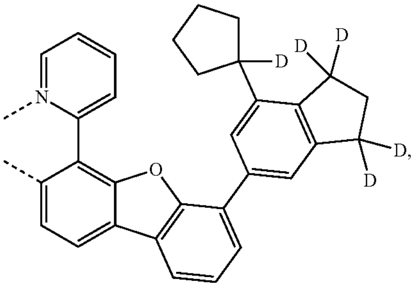
L$_{a1}$-151
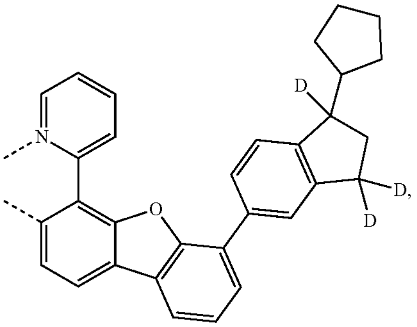
L$_{a1}$-152
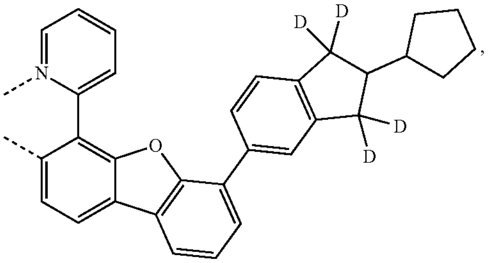

-continued
$L_{a1}$-153
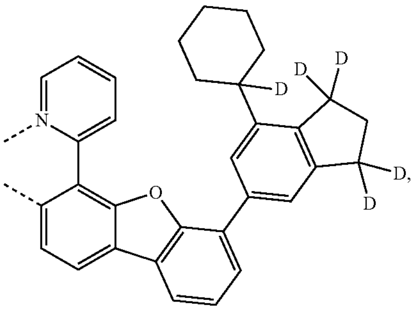
$L_{a1}$-154
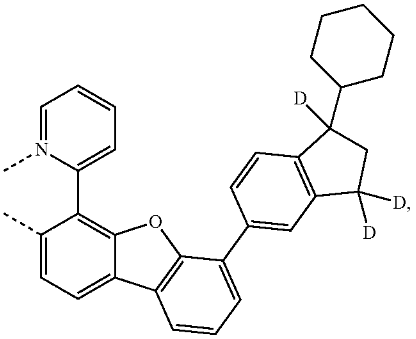
$L_{a1}$-155
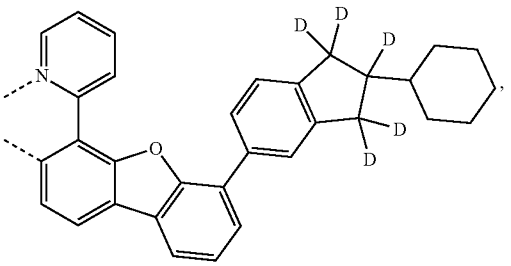
$L_{a1}$-156
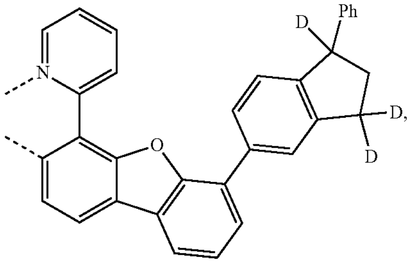
$L_{a1}$-157
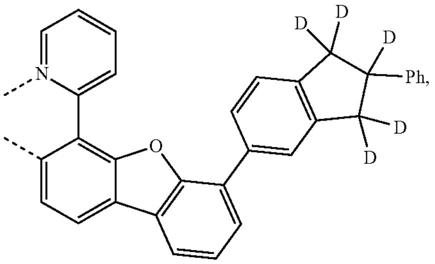
-continued
$L_{a1}$-158
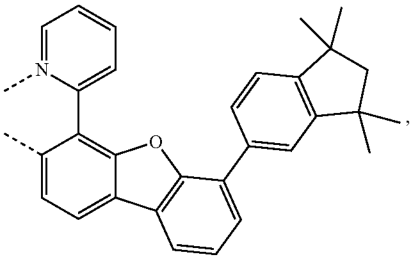
$L_{a1}$-159
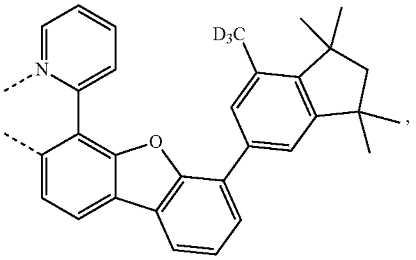
$L_{a1}$-160
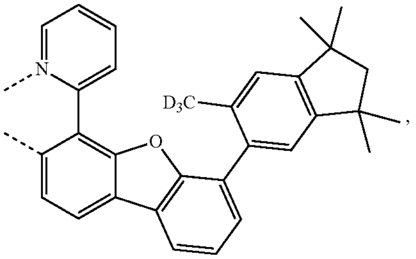
$L_{a1}$-161
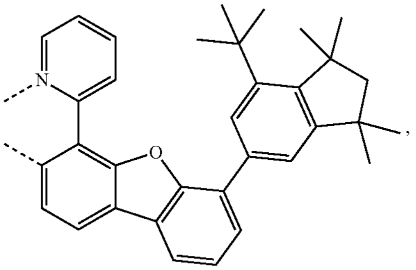
$L_{a1}$-162
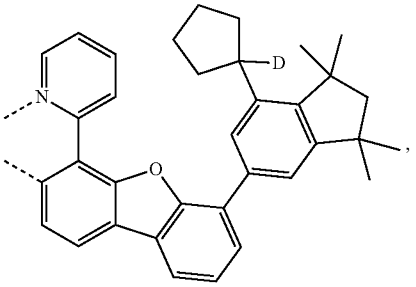

-continued
$L_{a1-163}$
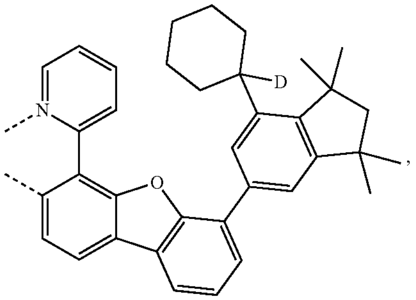
$L_{a1-164}$
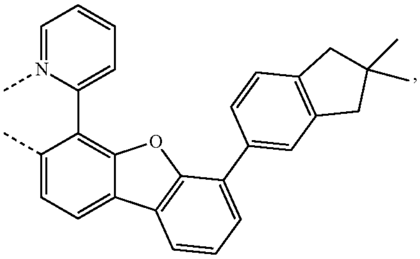
$L_{a1-165}$
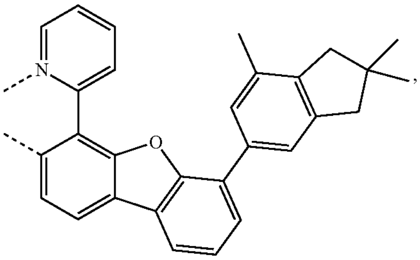
$L_{a1-166}$
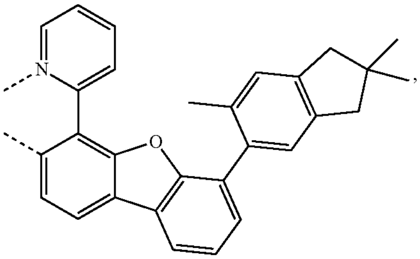
$L_{a1-167}$
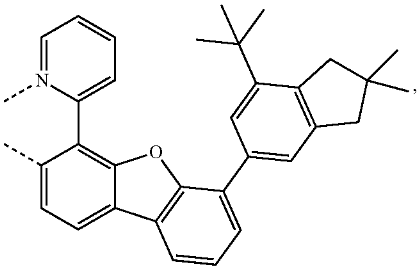
-continued
$L_{a1-168}$
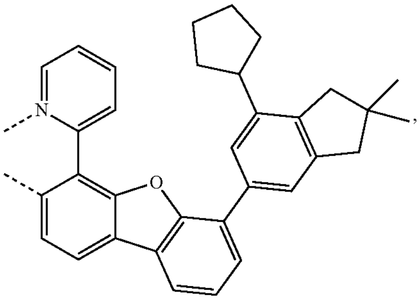
$L_{a1-169}$
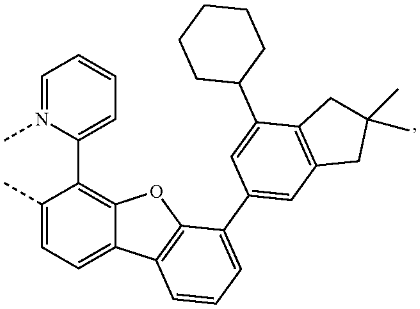
$L_{a1-170}$
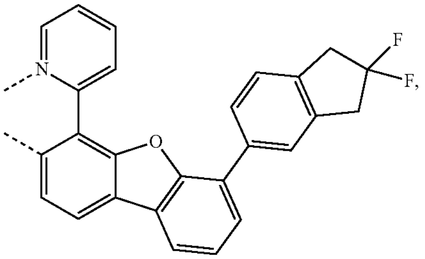
$L_{a1-171}$
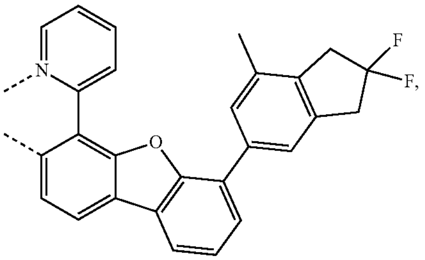
$L_{a1-172}$
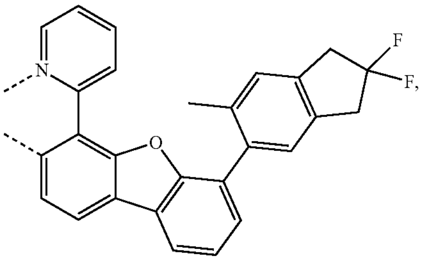

-continued
$L_{a1}$-173
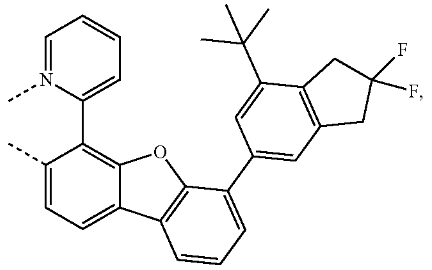
$L_{a1}$-174
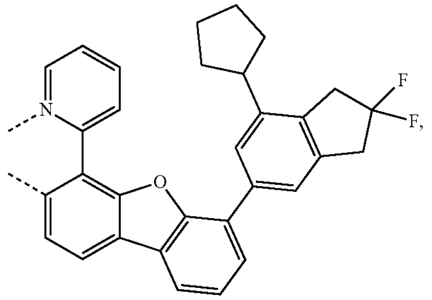
$L_{a1}$-175
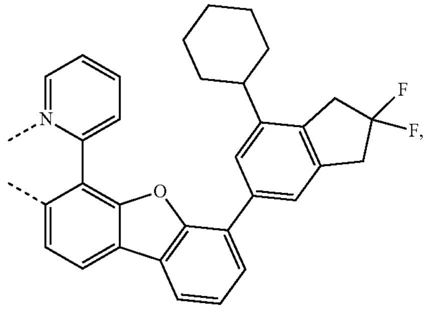
$L_{a1}$-176
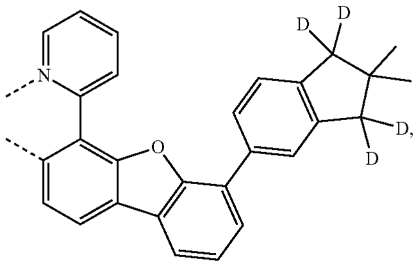
$L_{a1}$-177
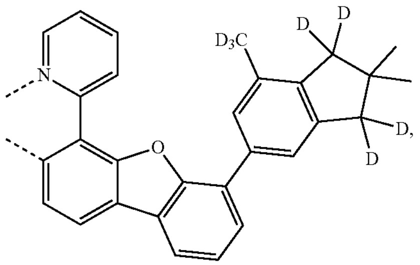
$L_{a1}$-178
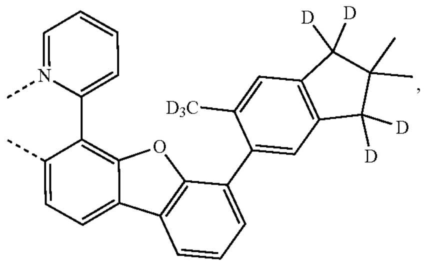
$L_{a1}$-179
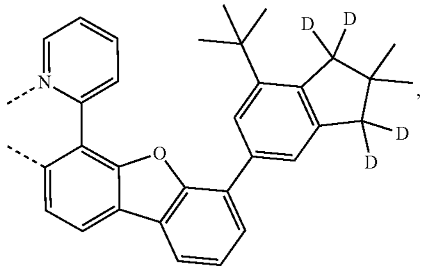
$L_{a1}$-180
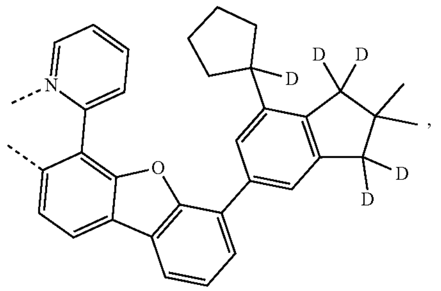
$L_{a1}$-181
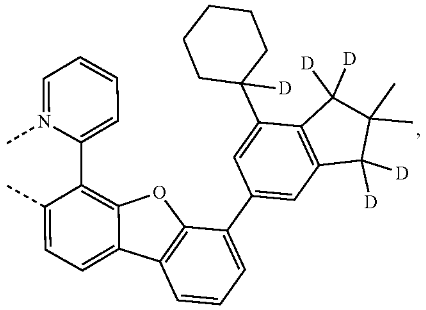
$L_{a1}$-182
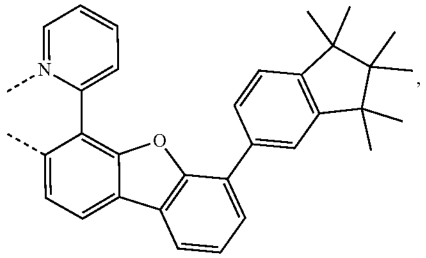

-continued
$L_{a1-183}$
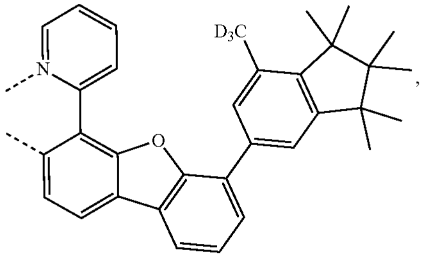
$L_{a1-184}$
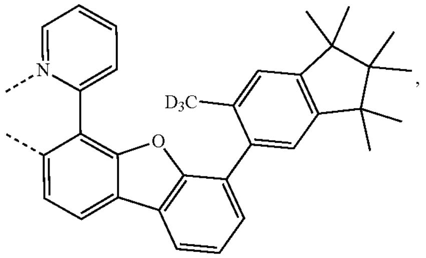
$L_{a1-185}$
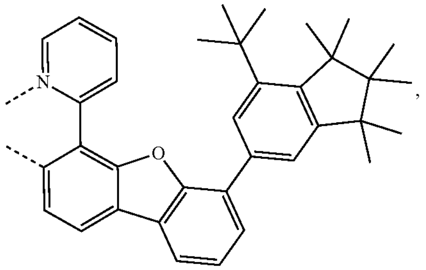
$L_{a1-186}$
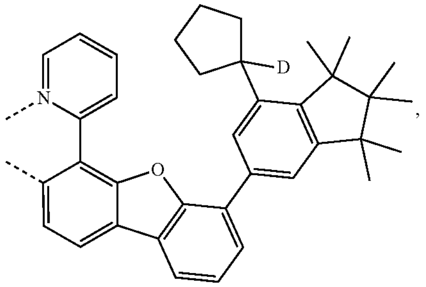
$L_{a1-187}$
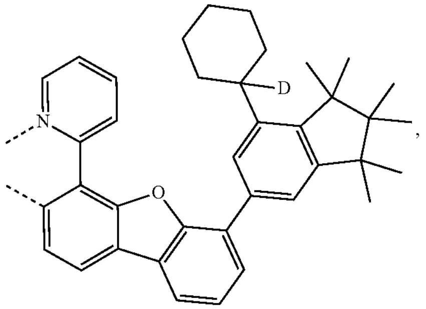
-continued
$L_{a1-221}$
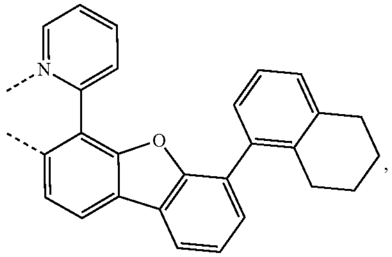
$L_{a1-222}$
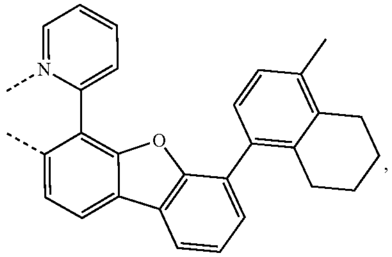
$L_{a11-223}$
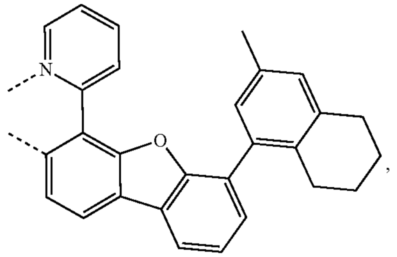
$L_{a1-224}$
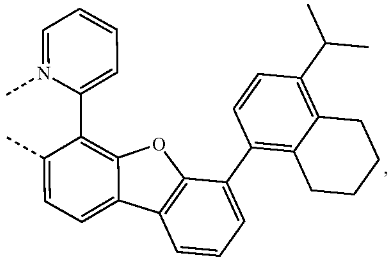
$L_{a1-225}$
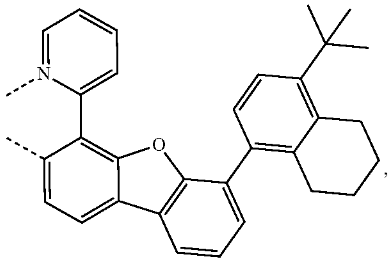

-continued
$L_{a1-226}$
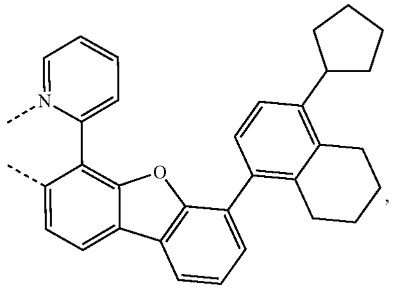
$L_{a1-227}$
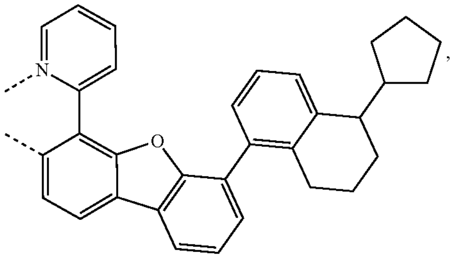
$L_{a1-228}$
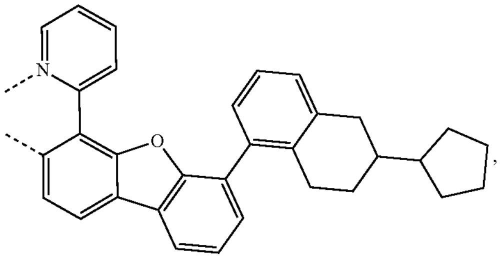
$L_{a1-229}$
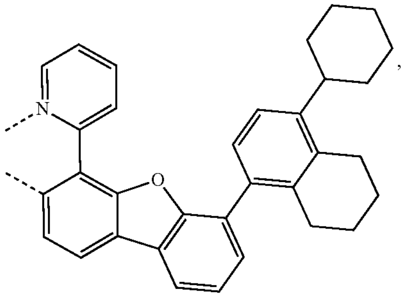
$L_{a1-230}$
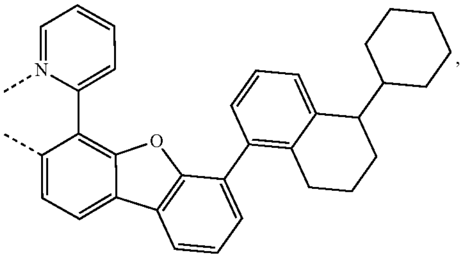
-continued
$L_{a1-231}$
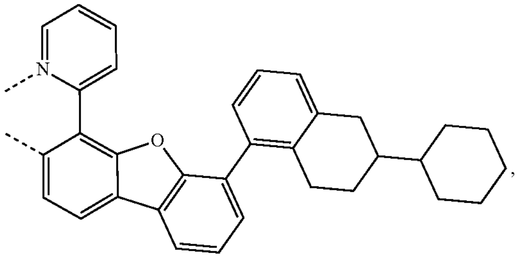
$L_{a1-232}$
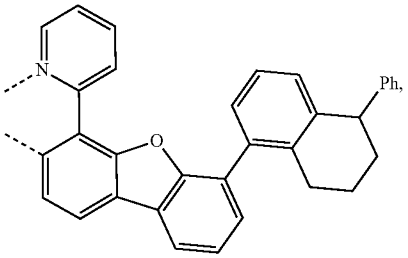
$L_{a1-233}$
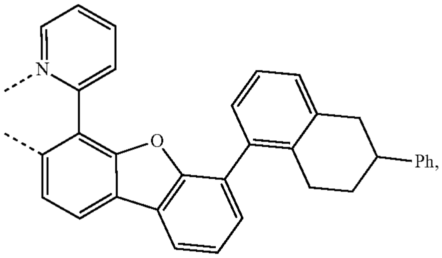
$L_{a1-234}$
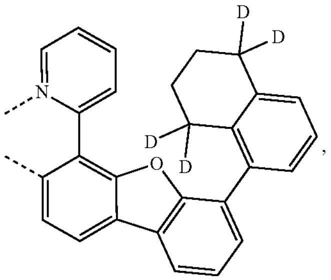
$L_{a1-235}$
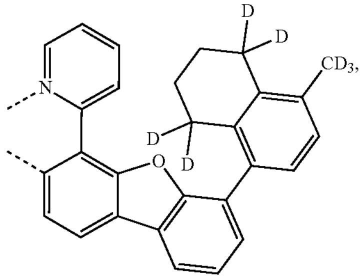

-continued
L$_{a1}$-236
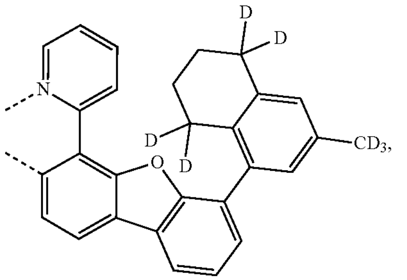
L$_{a1}$-237
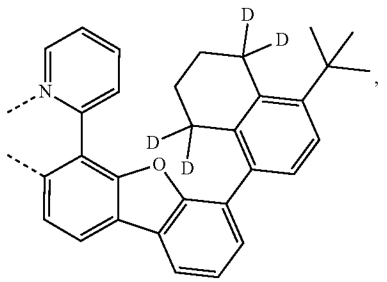
L$_{a1}$-238
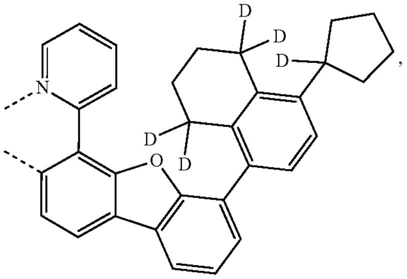
L$_{a11}$-239
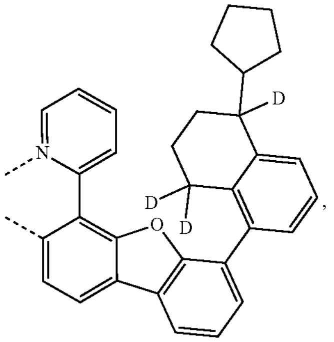
L$_{a1}$-240
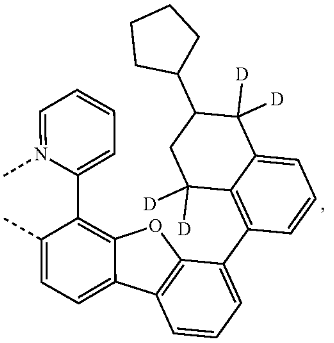
-continued
L$_{a1}$-241
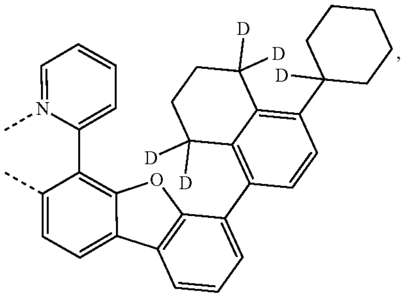
L$_{a1}$-242
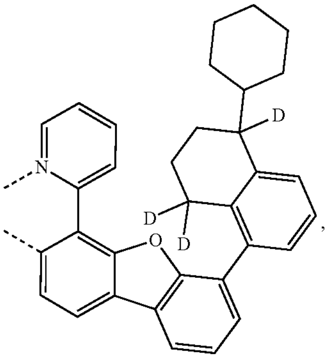
L$_{a1}$-243
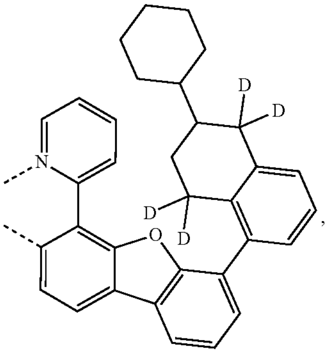
L$_{a1}$-244
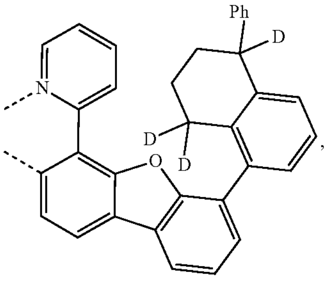
L$_{a1}$-245
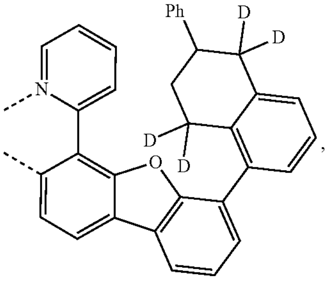

142
-continued
$L_{a1\text{-}246}$
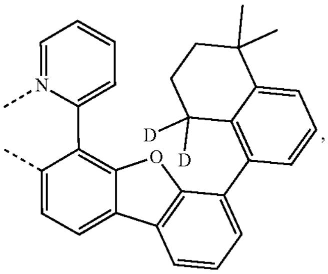
,
$L_{a1\text{-}247}$
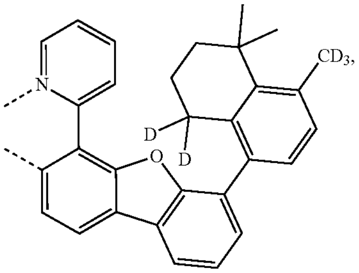
$L_{a1\text{-}248}$
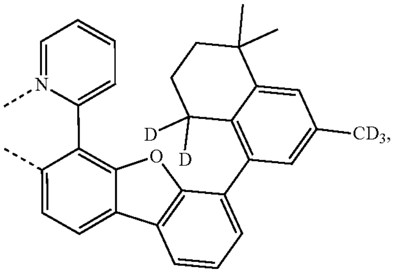
$L_{a1\text{-}249}$
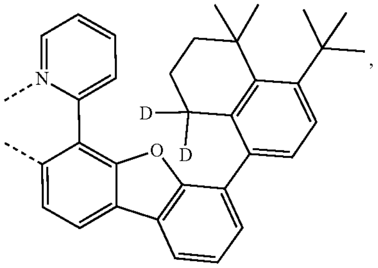
,
$L_{a1\text{-}250}$
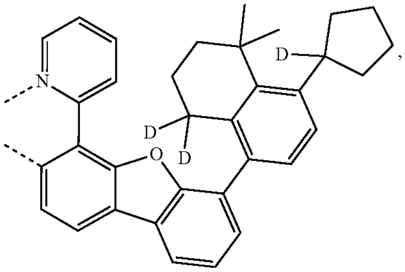
,
$L_{a1\text{-}251}$
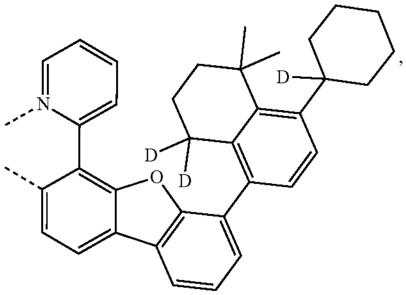
,
$L_{a1\text{-}252}$
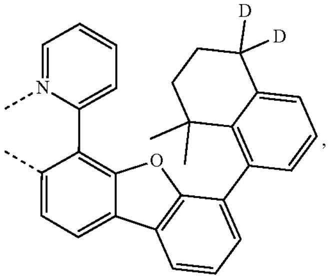
,
$L_{a1\text{-}253}$
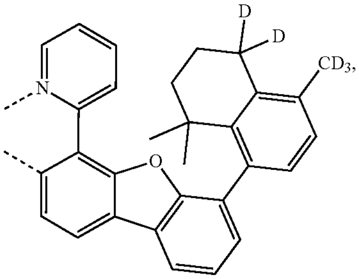
$L_{a1\text{-}254}$
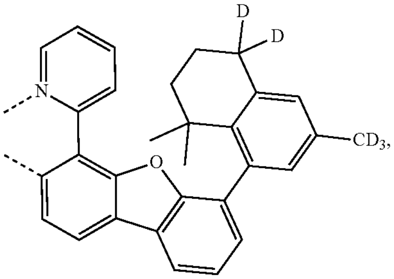
$L_{a1\text{-}255}$
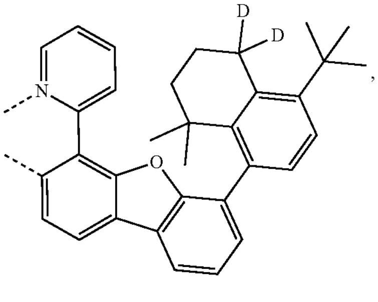
, -continued
$L_{a1-256}$
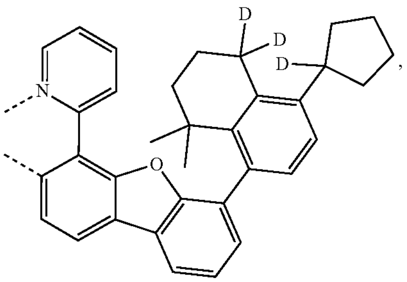
$L_{a1-257}$
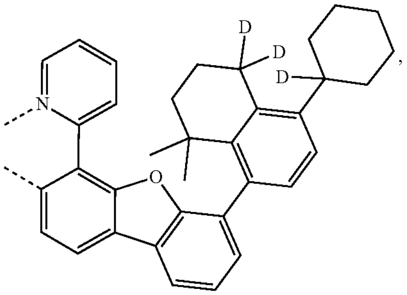
$L_{a1-258}$
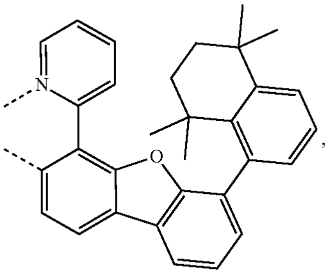
$L_{a1-259}$
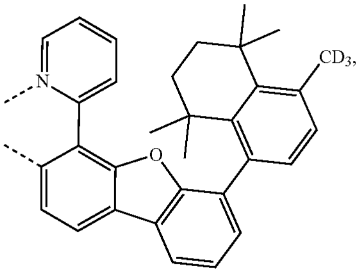
$L_{a1-260}$
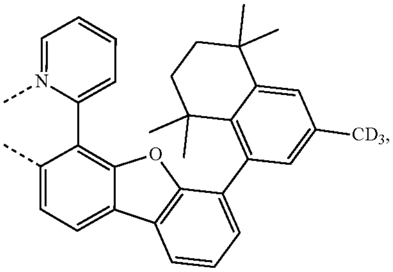
-continued
$L_{a1-261}$
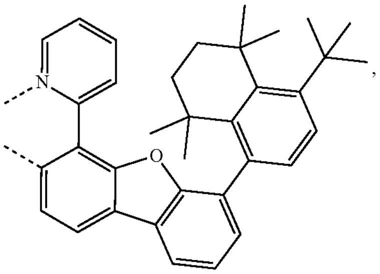
$L_{a1-262}$
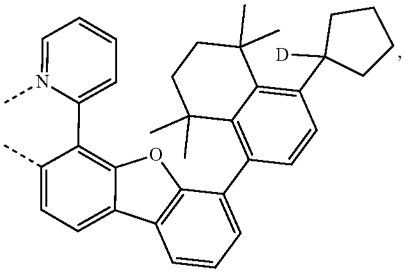
$L_{a1-263}$
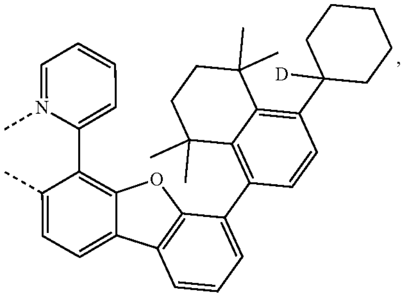
$L_{a1-264}$
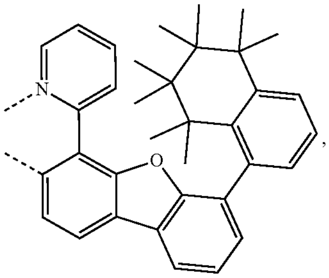
$L_{a1-265}$
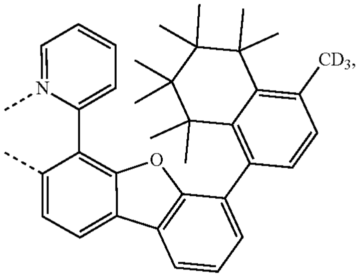

-continued
$L_{a1}$-266
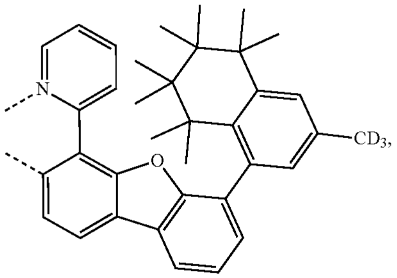
$L_{a1}$-267
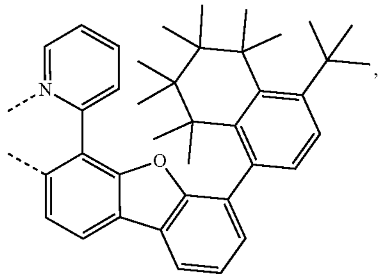
$L_{a1}$-268
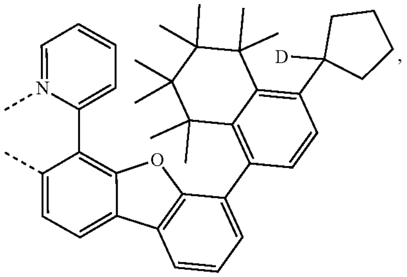
$L_{a1}$-269
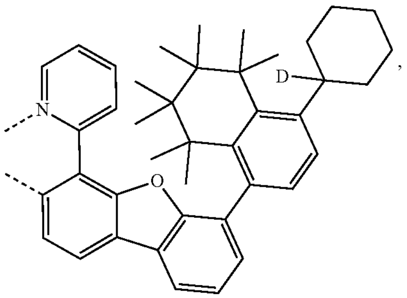
$L_{a1}$-270
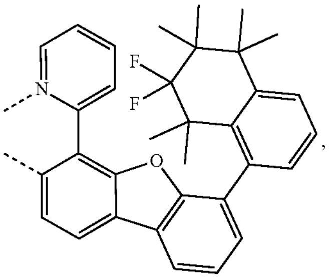
-continued
$L_{a1}$-271
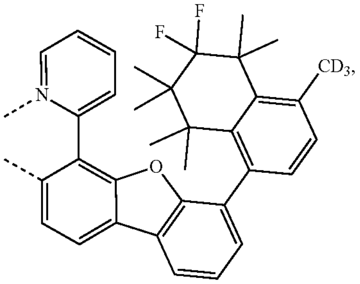
$L_{a1}$-272
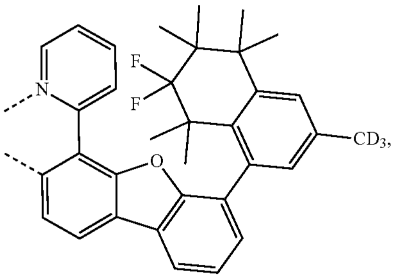
$L_{a1}$-273
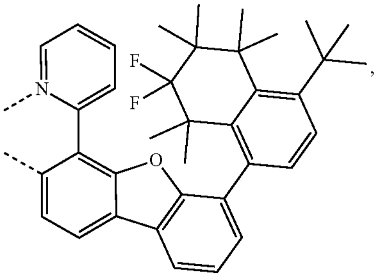
$L_{a1}$-274
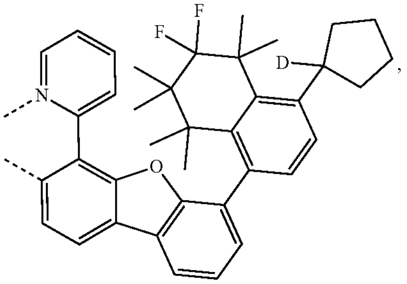
$L_{a1}$-275
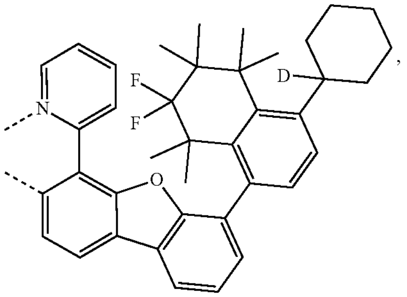

-continued
$L_{a1\text{-}308}$
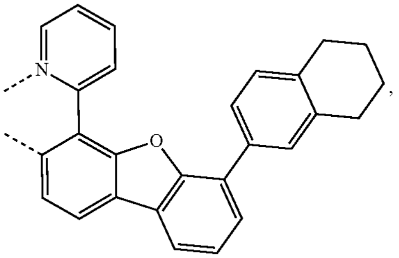
$L_{a1\text{-}309}$
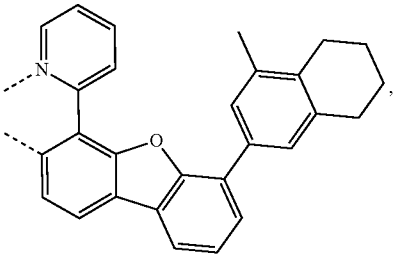
$L_{a1\text{-}310}$
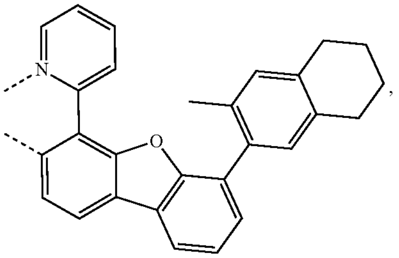
$L_{a1\text{-}311}$
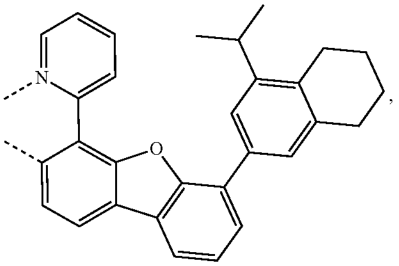
$L_{a1\text{-}312}$
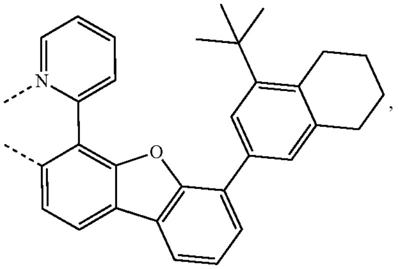
-continued
$L_{a1\text{-}313}$
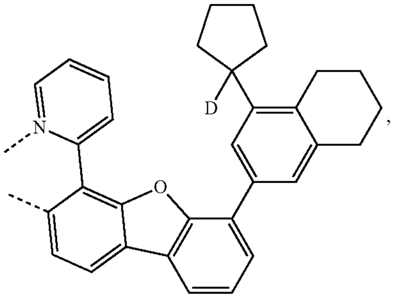
$L_{a1\text{-}314}$
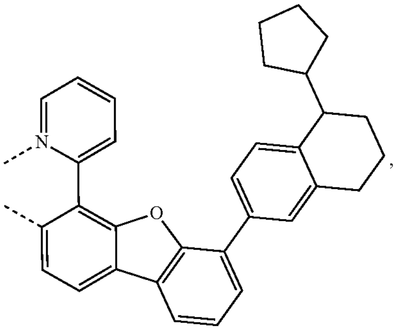
$L_{a1\text{-}315}$
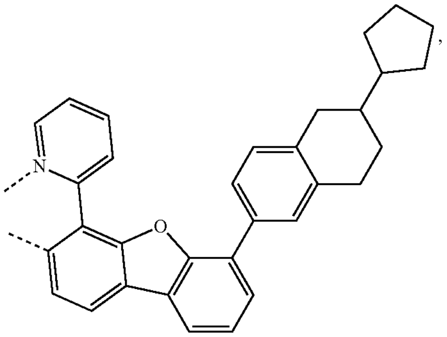
$L_{a1\text{-}316}$
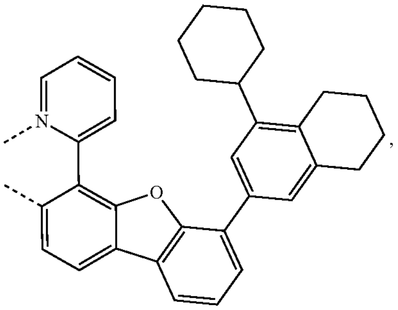

-continued
$L_{a1\text{-}317}$
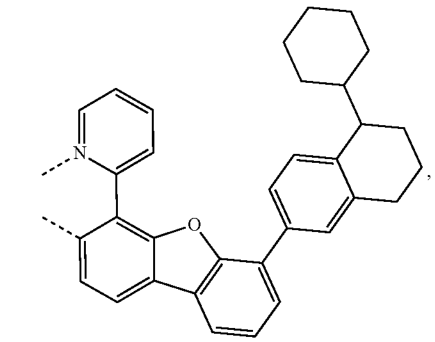
$L_{a1\text{-}318}$
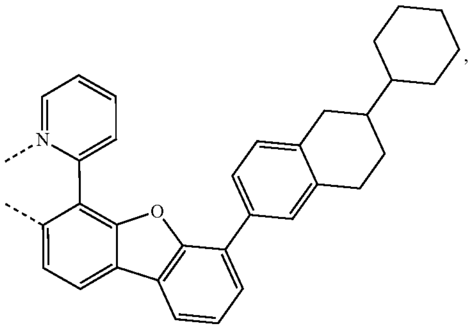
$L_{a1\text{-}319}$
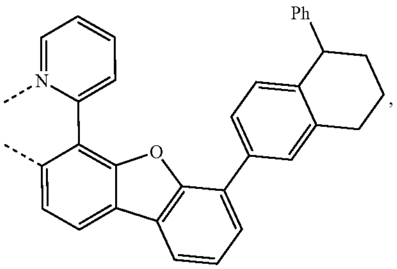
$L_{a1\text{-}320}$
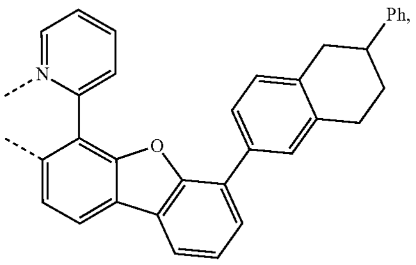
$L_{a1\text{-}321}$
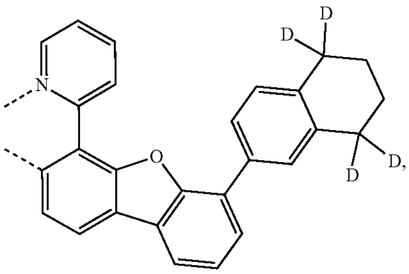
-continued
$L_{a1\text{-}326}$
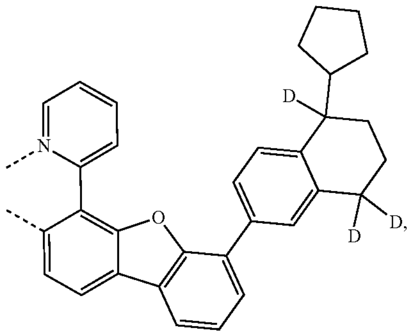
$L_{a1\text{-}327}$
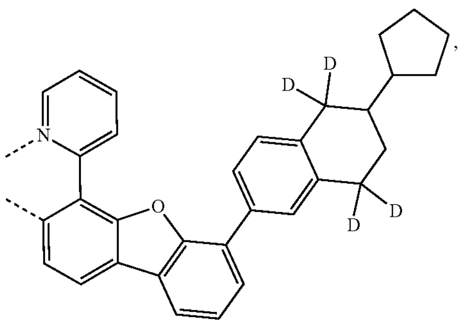
$L_{a1\text{-}328}$
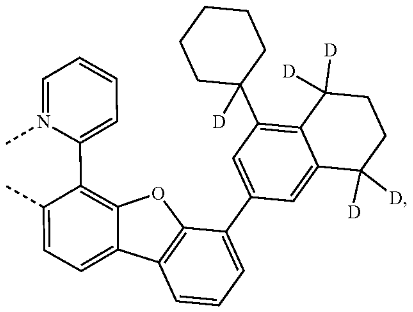
$L_{a1\text{-}329}$
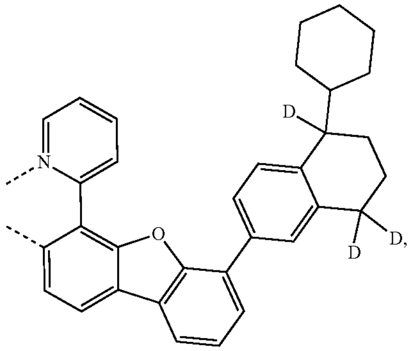

-continued
$L_{a1-330}$
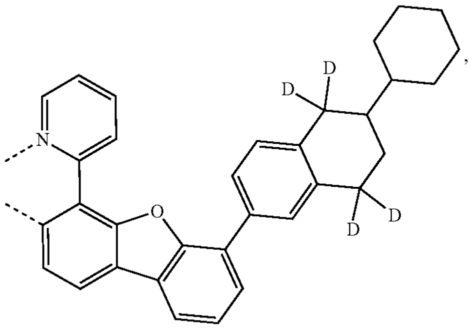
$L_{a1-331}$
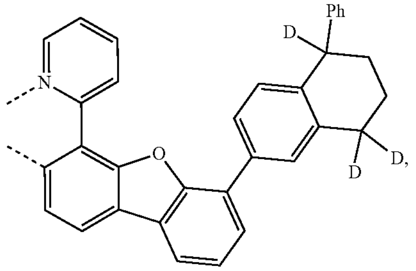
$L_{a1-332}$
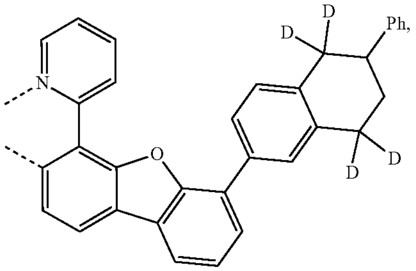
$L_{a1-333}$
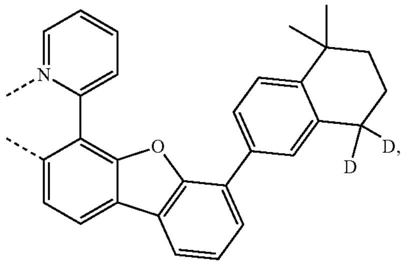
$L_{a1-334}$
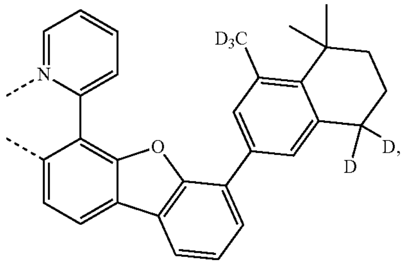
-continued
$L_{a1-335}$
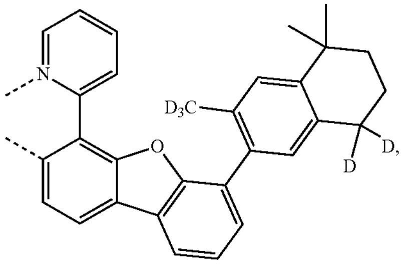
$L_{a1-336}$
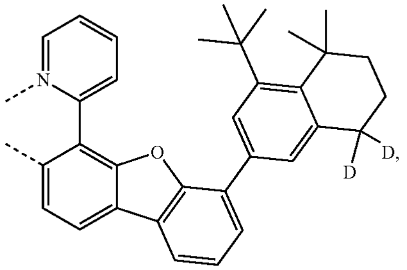
$L_{a1-337}$
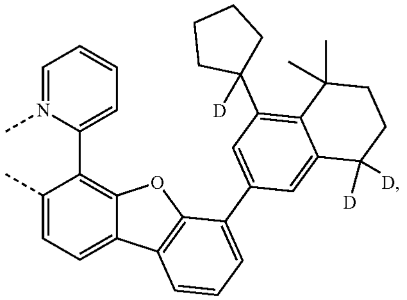
$L_{a1-338}$
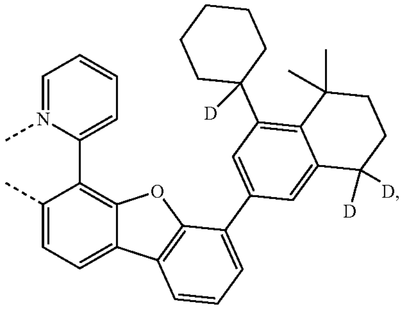
$L_{a1-339}$
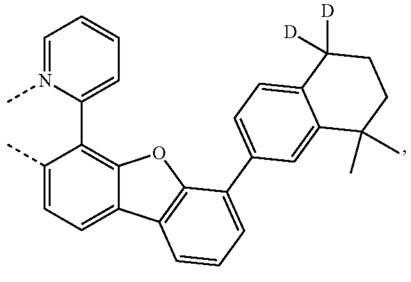

-continued
$L_{a1}$-340
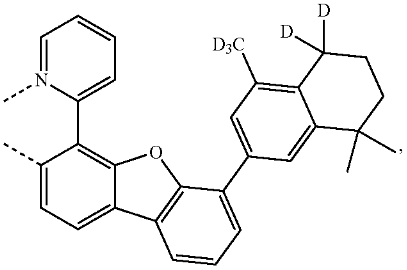
$L_{a1}$-341
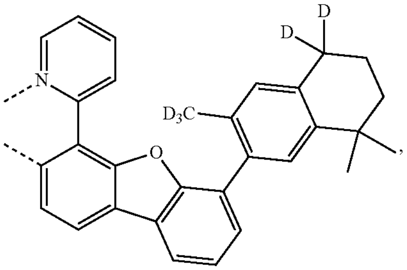
$L_{a1}$-342
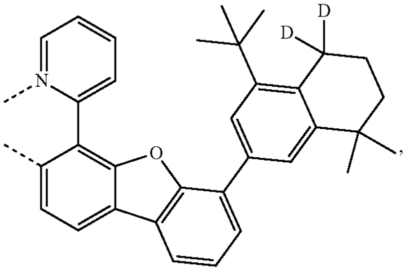
$L_{a1}$-343
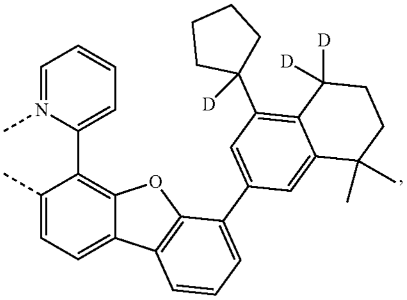
$L_{a1}$-344
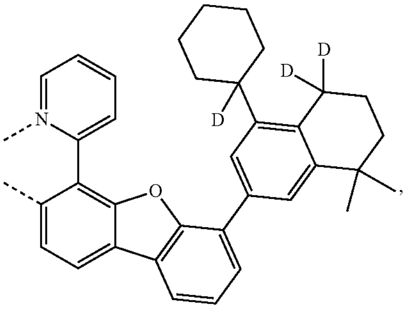
-continued
$L_{a1}$-345
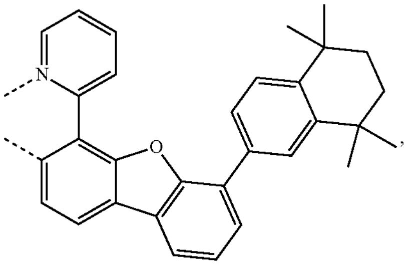
$L_{a1}$-346
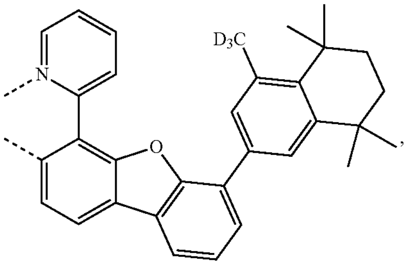
$L_{a1}$-347
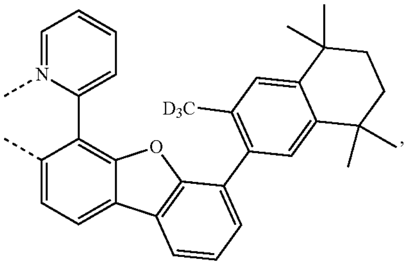
$L_{a1}$-348
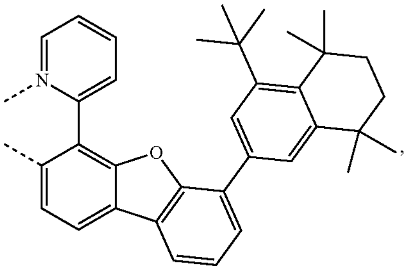
$L_{a1}$-349
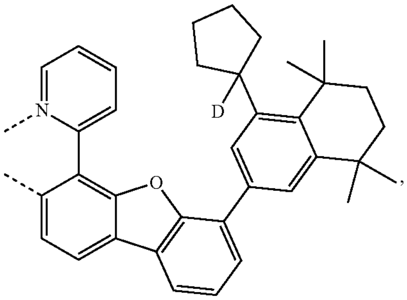

-continued
$L_{a1}$-350
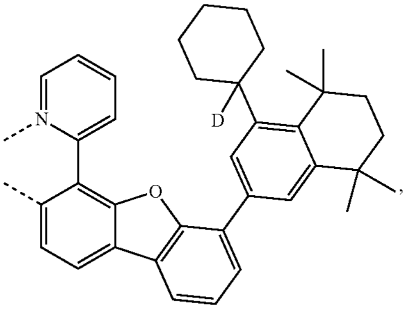
$L_{a1}$-351
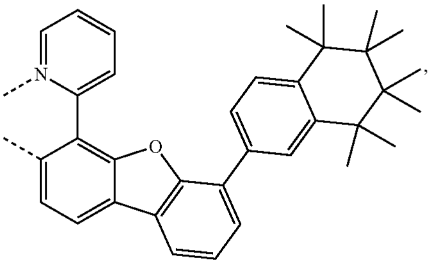
$L_{a1}$-352
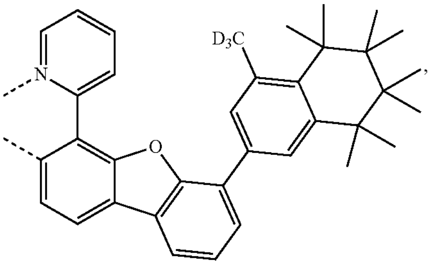
$L_{a1}$-353
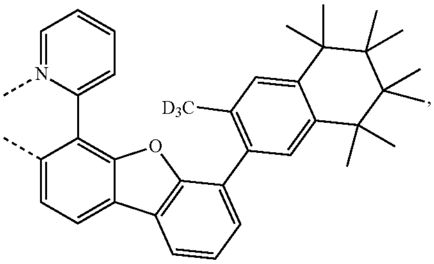
$L_{a1}$-354
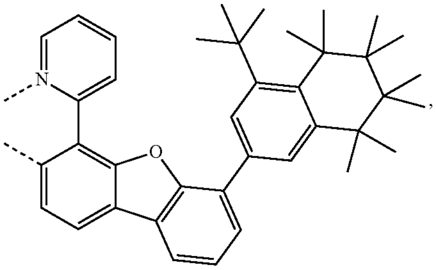
-continued
$L_{a1}$-355
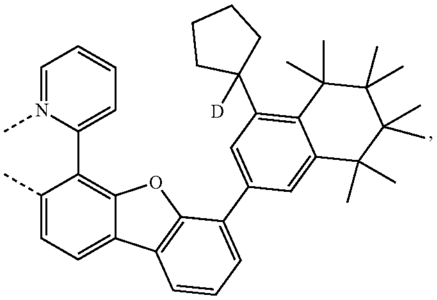
$L_{a1}$-356
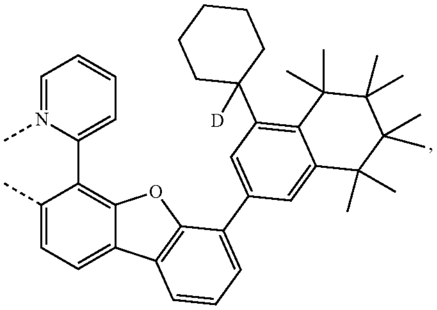
$L_{a1}$-359
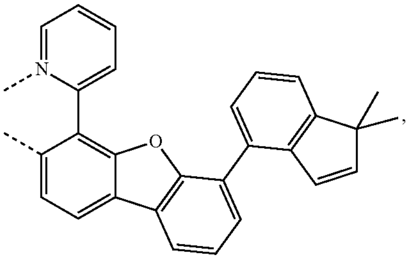
$L_{a1}$-360
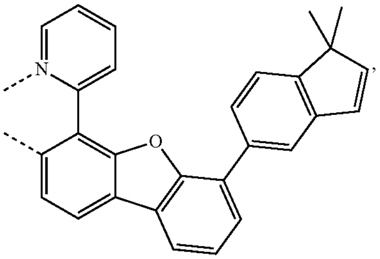
$L_{a1}$-361
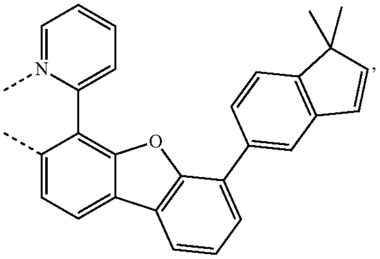

$L_{a1}$-362
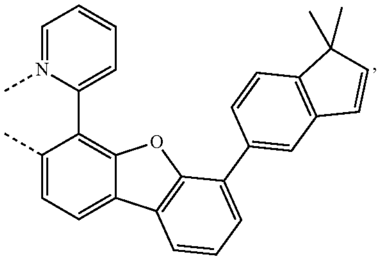
$L_{a1}$-395
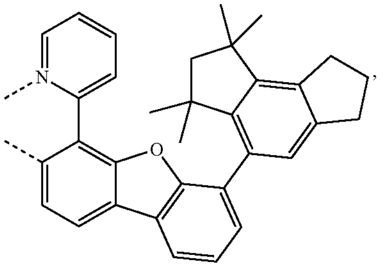
$L_{a1}$-398
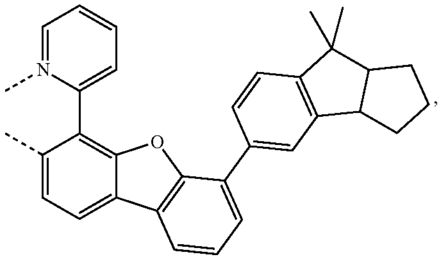
$L_{a1}$-400
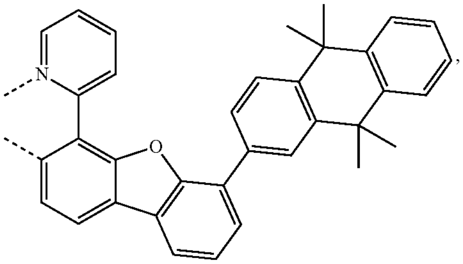
$L_{a1}$-414
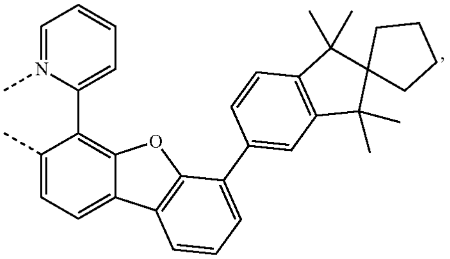
$L_{a1}$-415
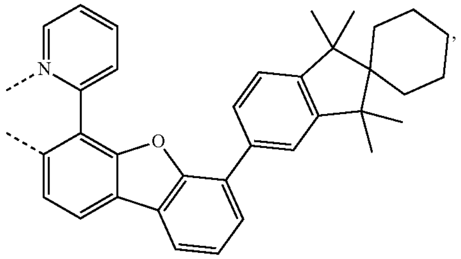
$L_{a1}$-416
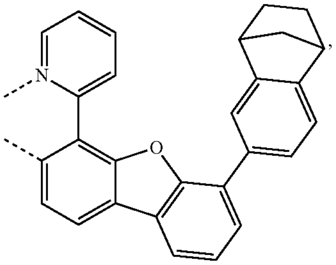
$L_{a1}$-417
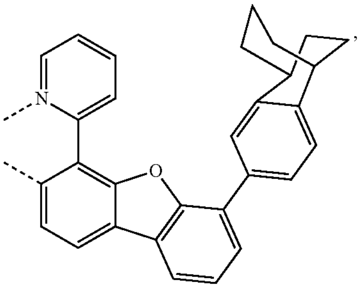
$L_{a1}$-418
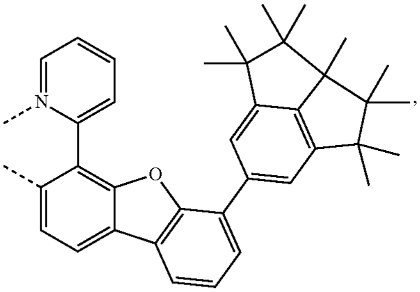
$L_{a1}$-419
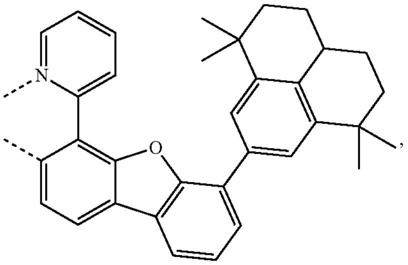
$L_{a1}$-438
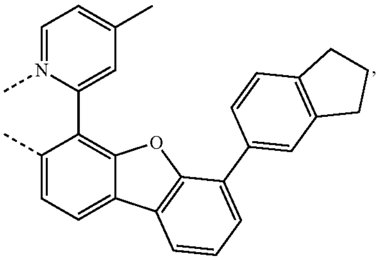

-continued
$L_{a1}$-439
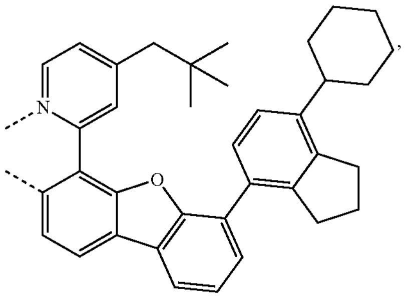
$L_{a1}$-440
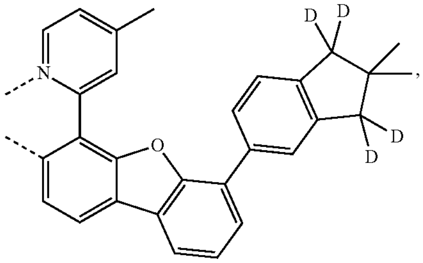
$L_{a1}$-441
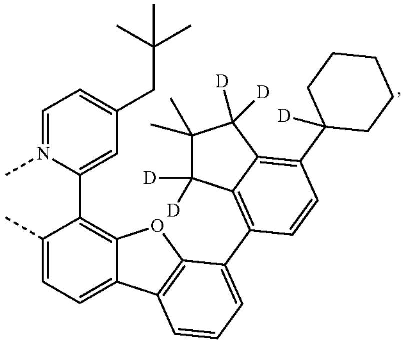
$L_{a1}$-442
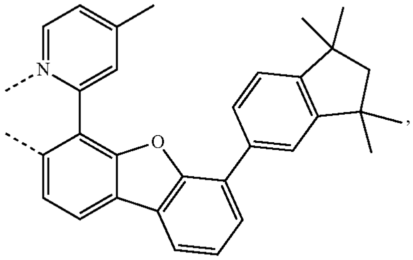
$L_{a1}$-443
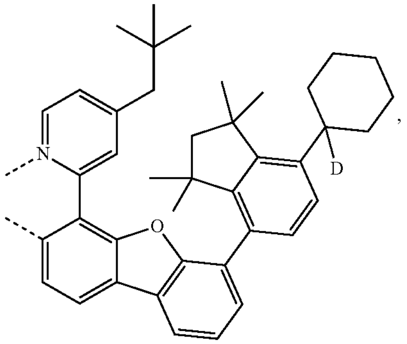
-continued
$L_{a1}$-444
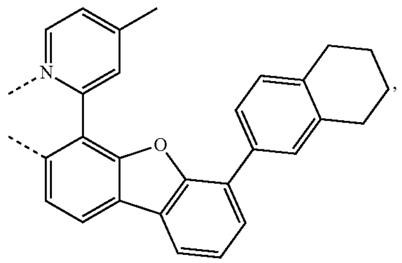
$L_{a1}$-445
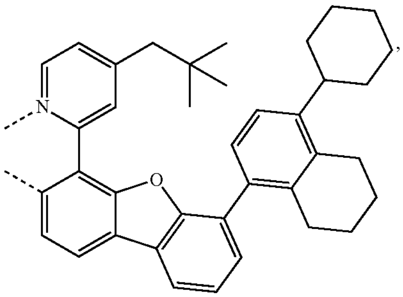
$L_{a1}$-446
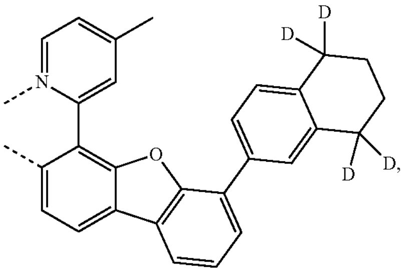
$L_{a1}$-447
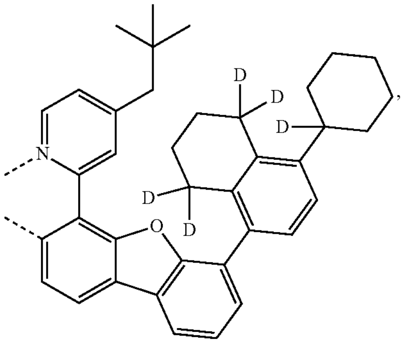
$L_{a1}$-448
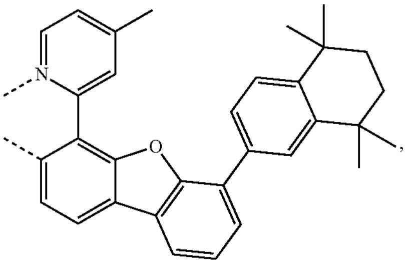

-continued
$L_{a1}$-449
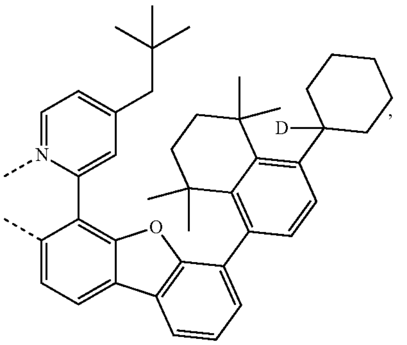
$L_{a1}$-450
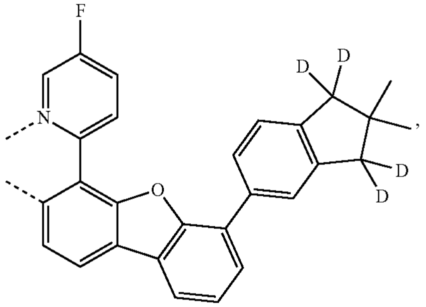
$L_{a1}$-451
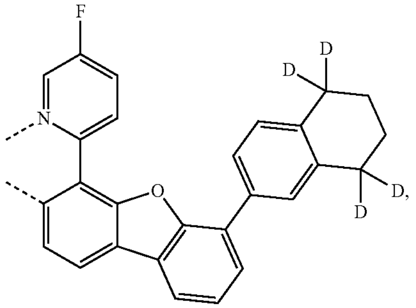
$L_{a1}$-452
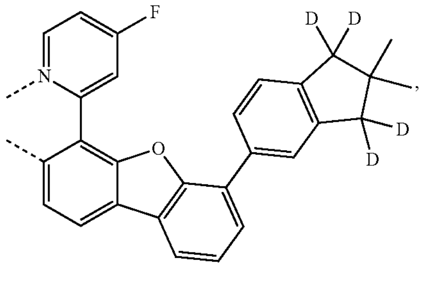
$L_{a1}$-453
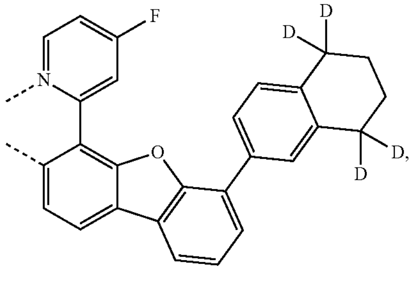
-continued
$L_{a1}$-454
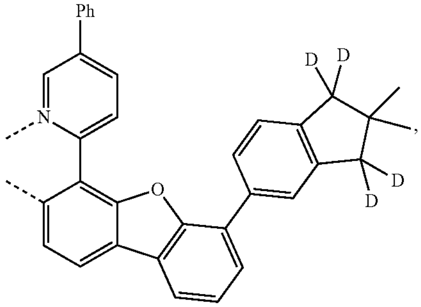
$L_{a1}$-455
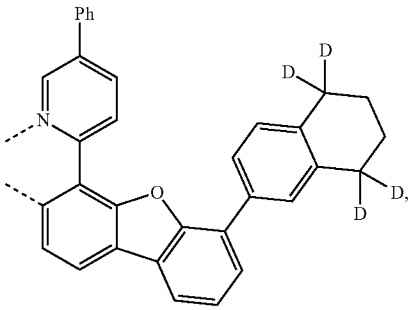
$L_{a1}$-456
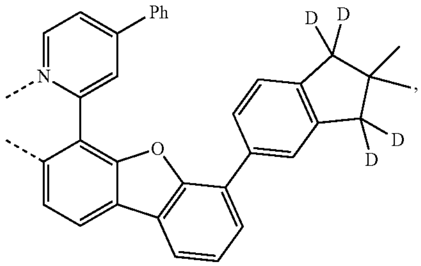
$L_{a1}$-457
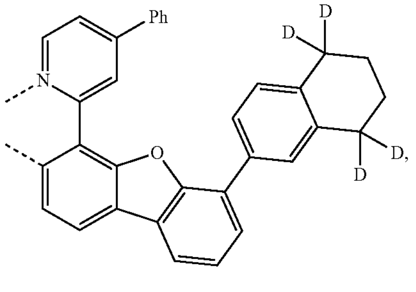
$L_{a1}$-458
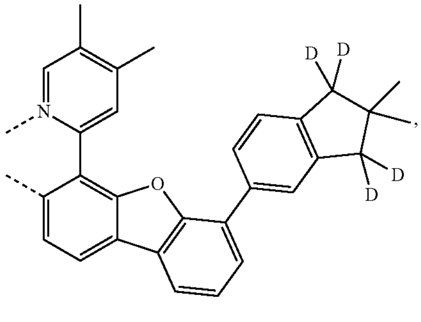

-continued
L$_{a1-459}$
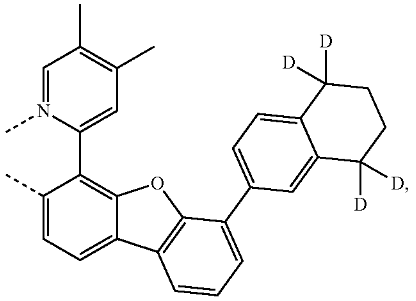
L$_{a1-460}$
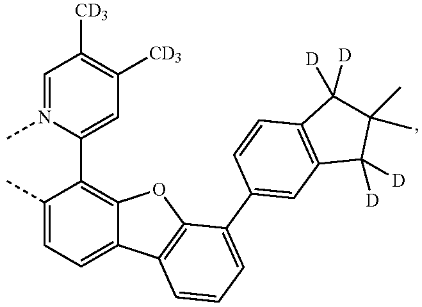
L$_{a1-461}$
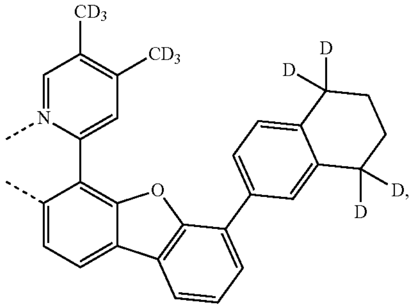
L$_{a1-462}$
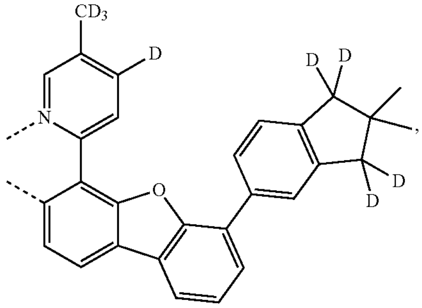
L$_{a1-463}$
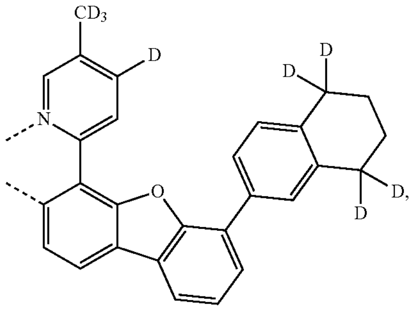
-continued
L$_{a1-464}$
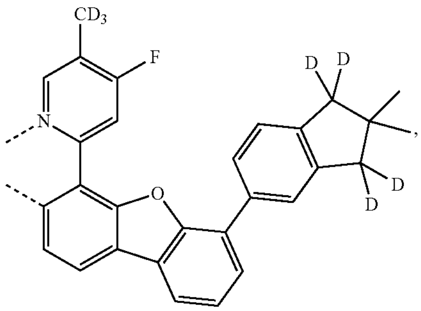
L$_{a1-465}$
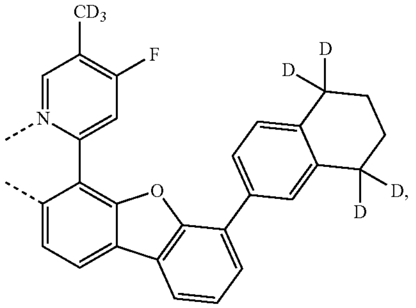
L$_{a1-466}$
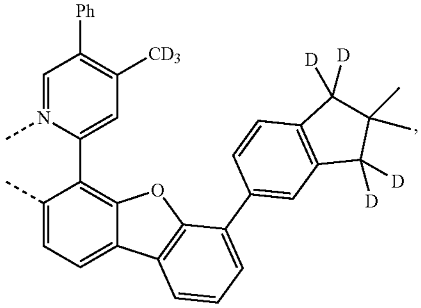
L$_{a1-467}$
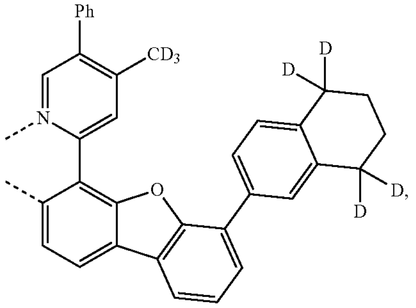
L$_{a1-468}$
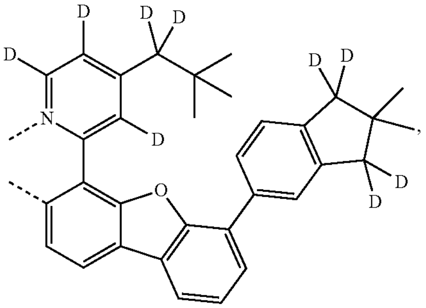

-continued
$L_{a1}$-469
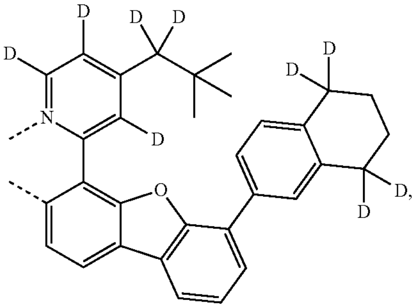
$L_{a1}$-470
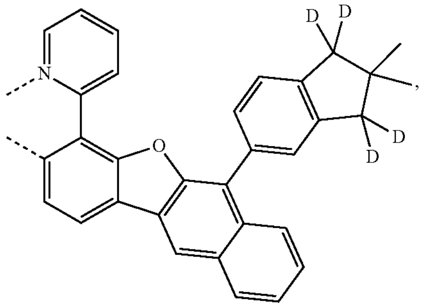
$L_{a1}$-471
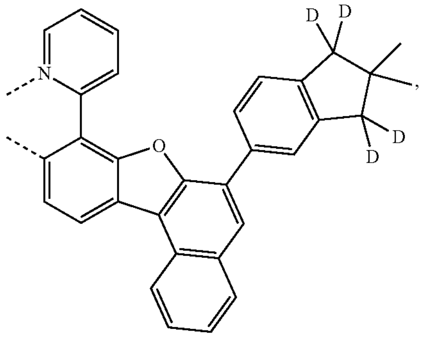
$L_{a1}$-472
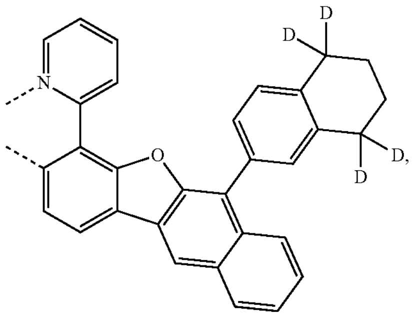
$L_{a1}$-473
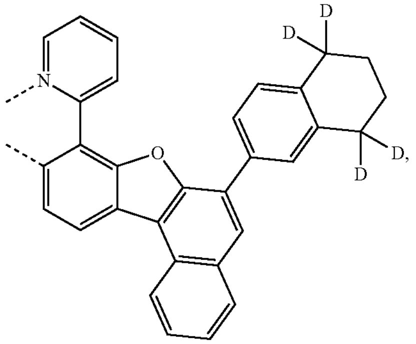
-continued
$L_{a1}$-474
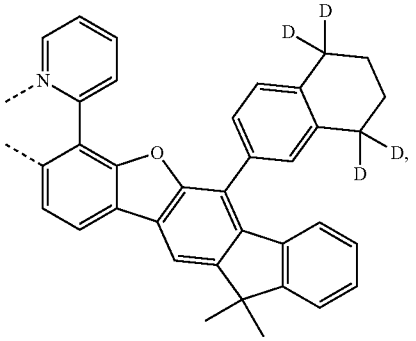
$L_{a1}$-475
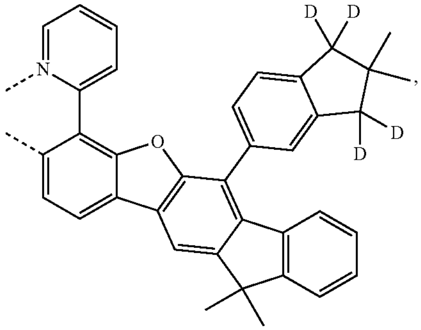
$L_{a1}$-476
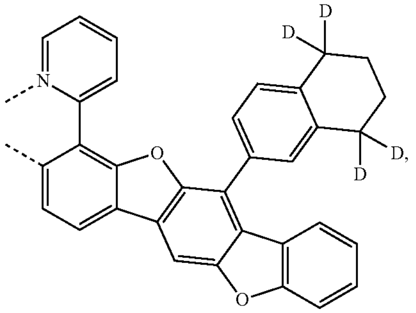
$L_{a1}$-477
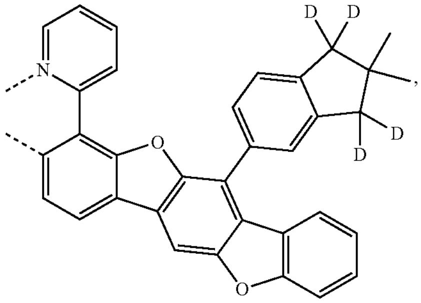
$L_{a1}$-478
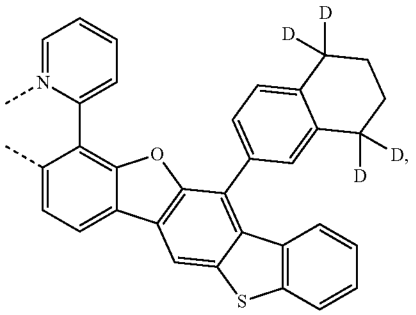

-continued
$L_{a1}$-479
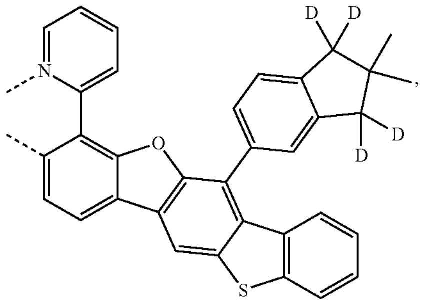
$L_{a1}$-480
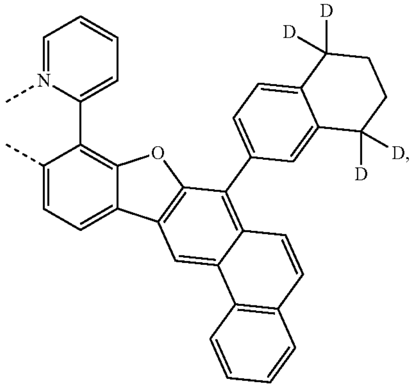
$L_{a1}$-481
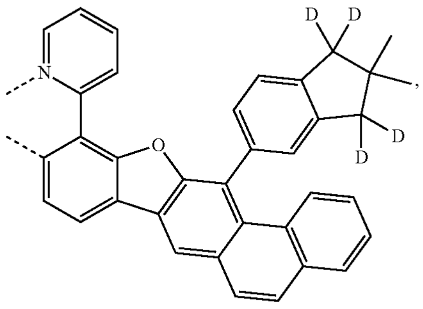
$L_{a1}$-482
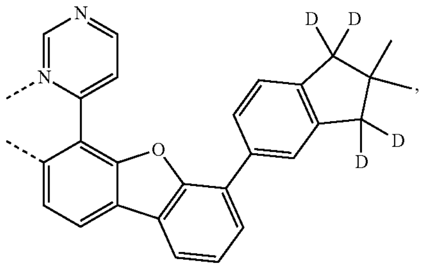
$L_{a1}$-483
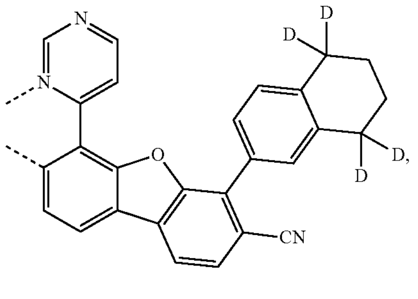
-continued
$L_{a1}$-484
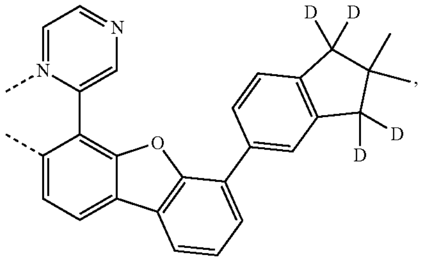
$L_{a1}$-485
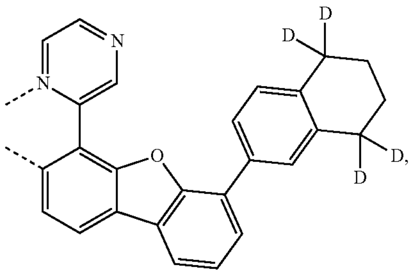
$L_{a1}$-486
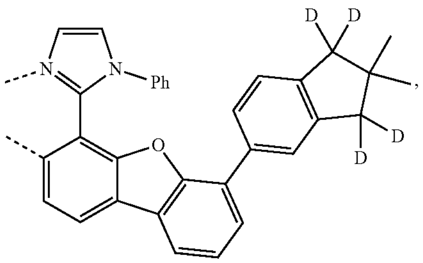
$L_{a1}$-487
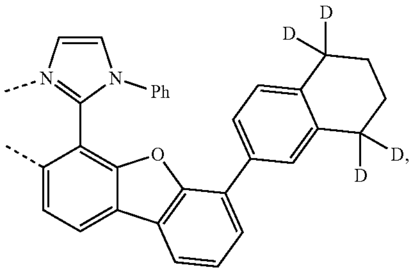
$L_{a1}$-488
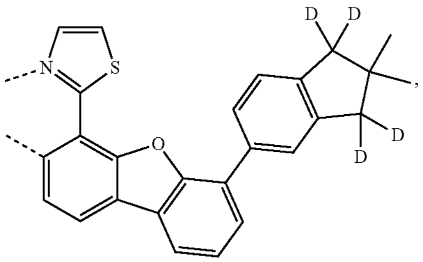
$L_{a1}$-489
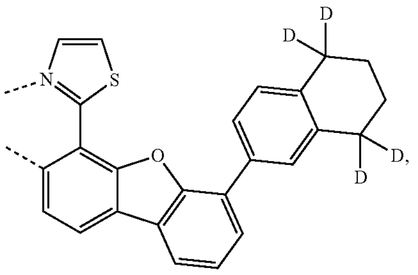

-continued
$L_{a1-490}$
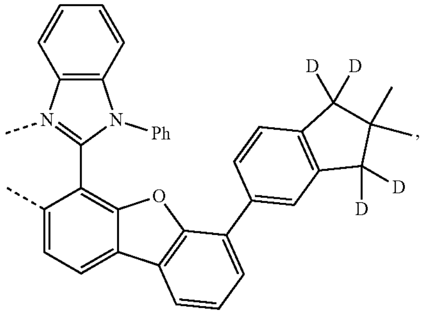
$L_{a1-491}$
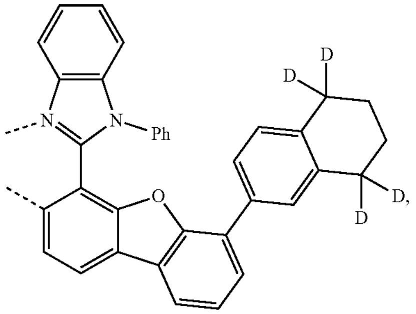
$L_{a1-492}$
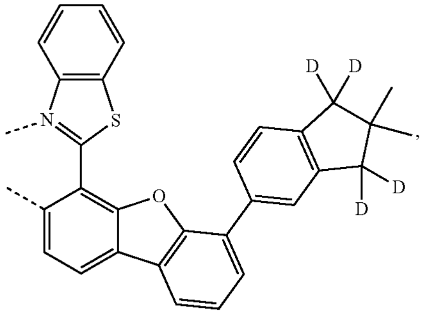
$L_{a1-493}$
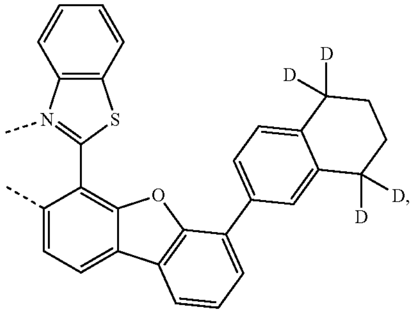
$L_{a1-494}$
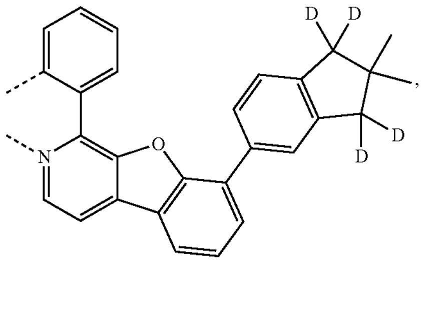
-continued
$L_{a1-495}$
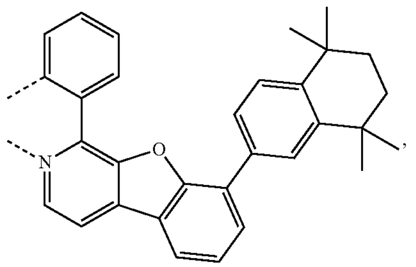
$L_{a1-496}$
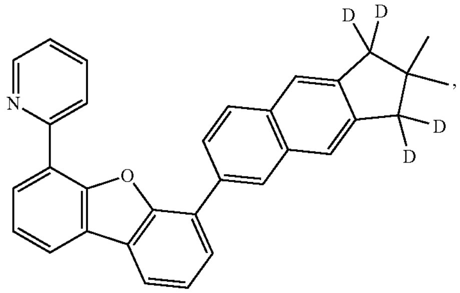
$L_{a1-497}$
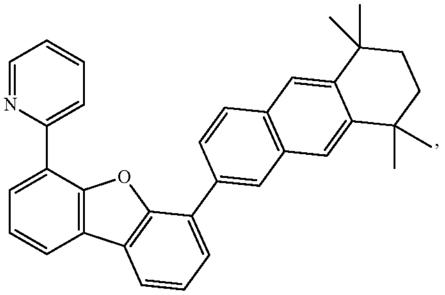
$L_{a2-5}$
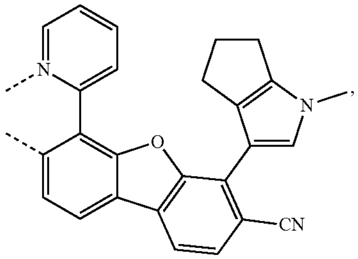
$L_{a2-6}$
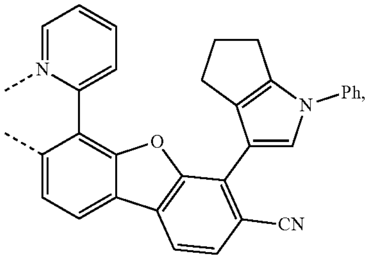

-continued
$L_{a2-7}$
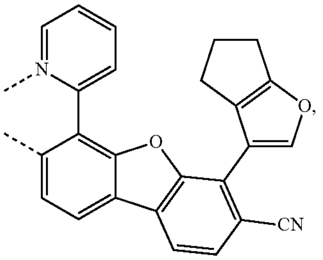
$L_{a2-8}$
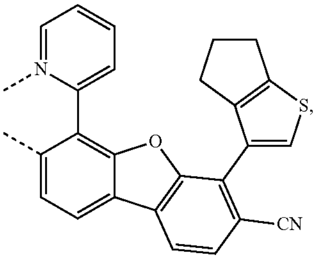
$L_{a2-9}$
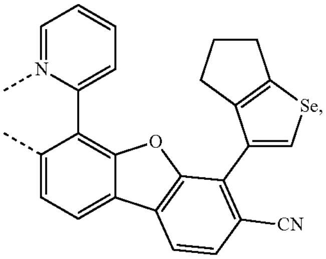
$L_{a2-10}$
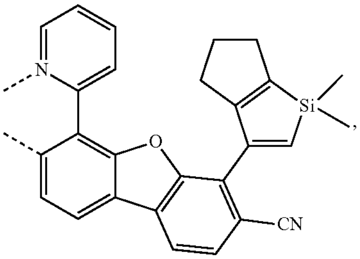
$L_{a2-11}$
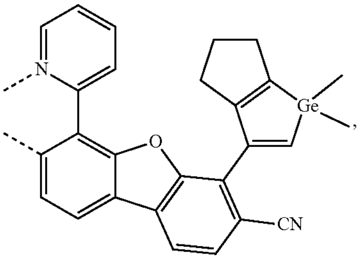
$L_{a2-16}$
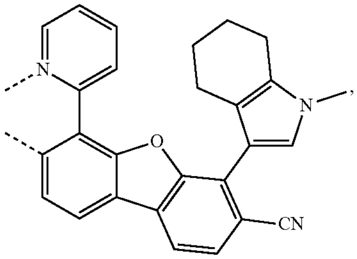
-continued
$L_{a2-17}$
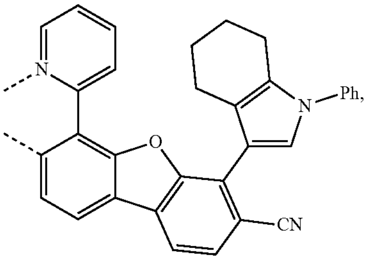
$L_{a2-18}$
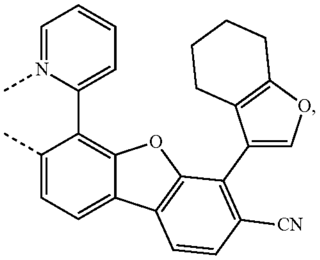
$L_{a2-19}$
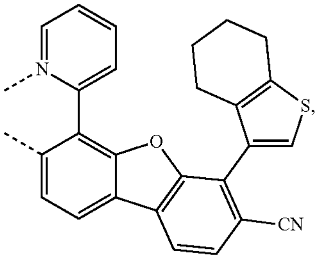
$L_{a2-20}$
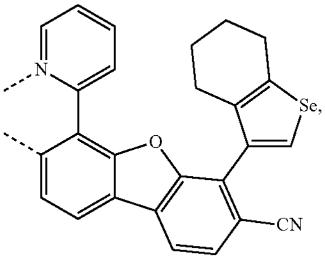
$L_{a2-21}$
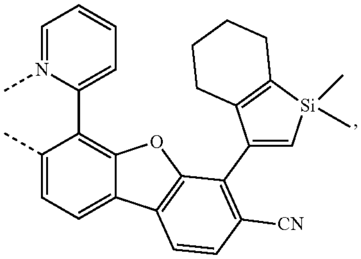
$L_{a2-22}$
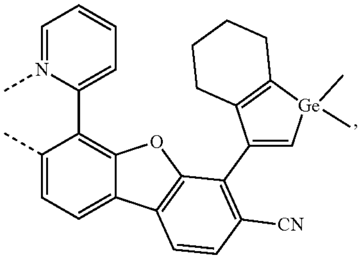

-continued
$L_{a2-27}$
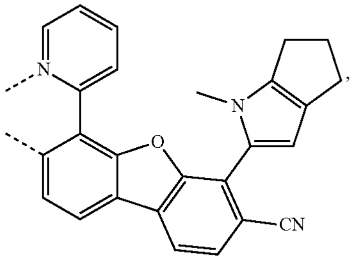
$L_{a2-28}$
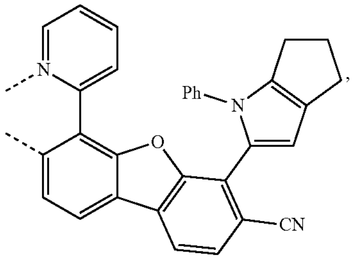
$L_{a2-29}$
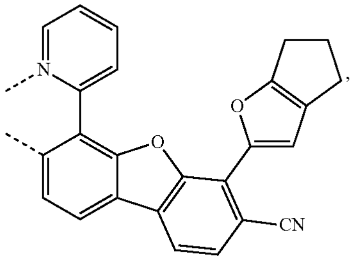
$L_{a2-30}$
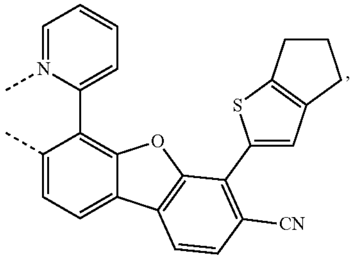
$L_{a2-31}$
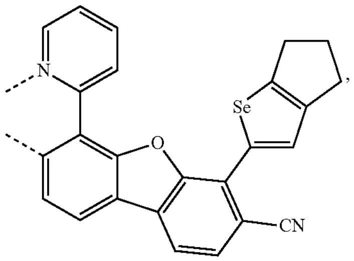
$L_{a2-32}$
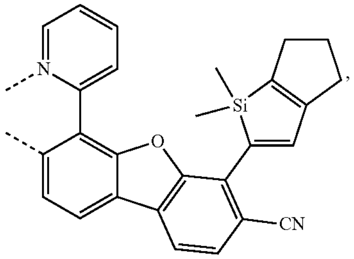
-continued
$L_{a2-33}$
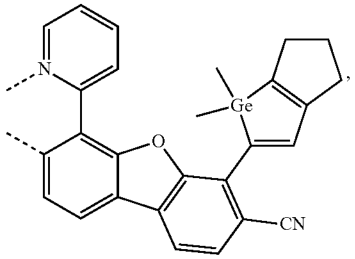
$L_{a2-38}$
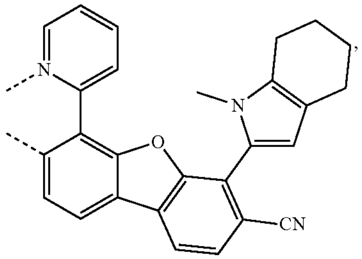
$L_{a2-39}$
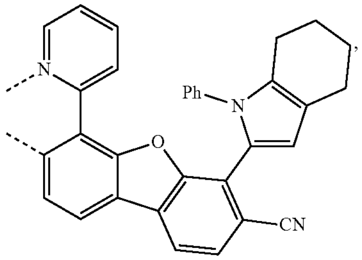
$L_{a2-40}$
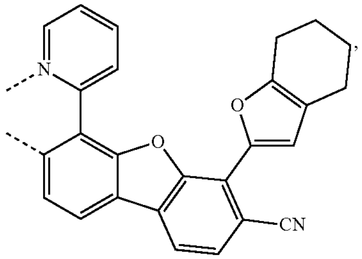
$L_{a2-41}$
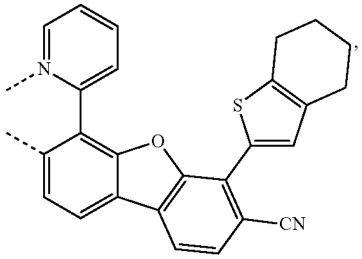
$L_{a2-42}$
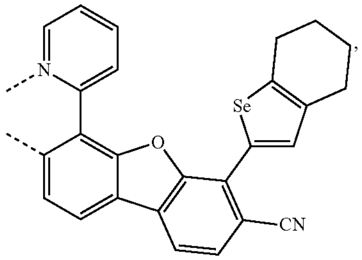

$L_{a2-43}$
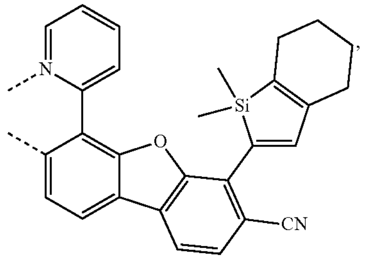
$L_{a2-44}$
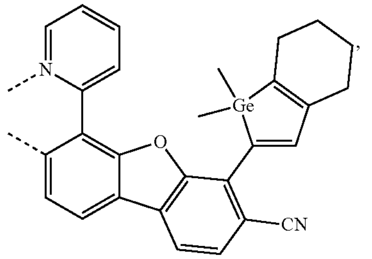
$L_{a2-45}$
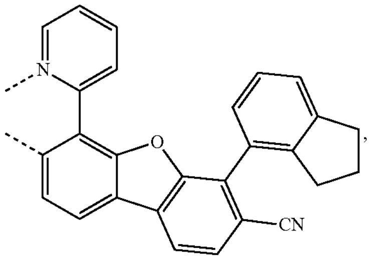
$L_{a2-46}$
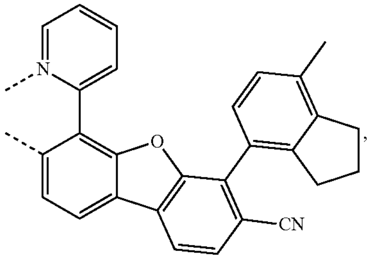
$L_{a2-47}$
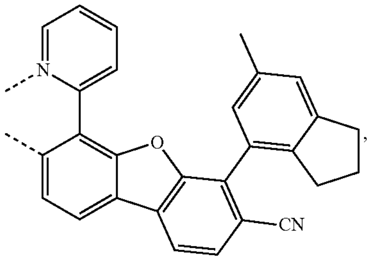
$L_{a2-48}$
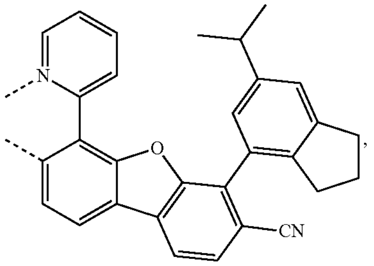
$L_{a2-49}$
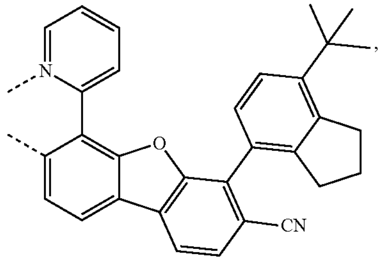
$L_{a2-50}$
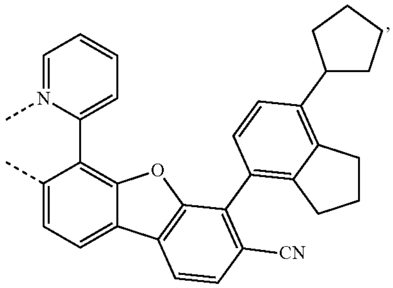
$L_{a2-51}$
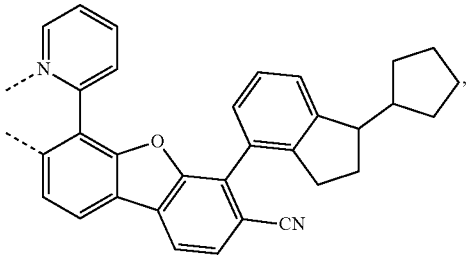
$L_{a2-52}$
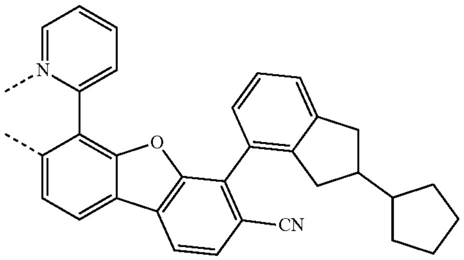
$L_{a2-53}$
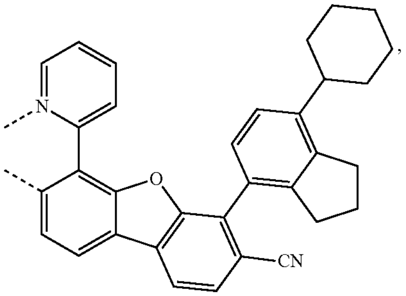

-continued
$L_{a2-54}$
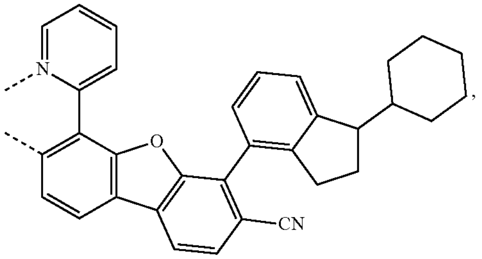
$L_{a2-55}$
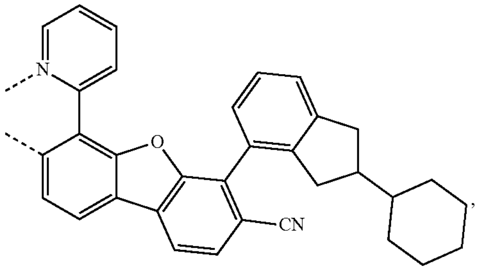
$L_{a2-56}$
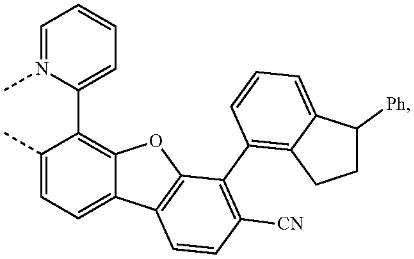
$L_{a2-57}$
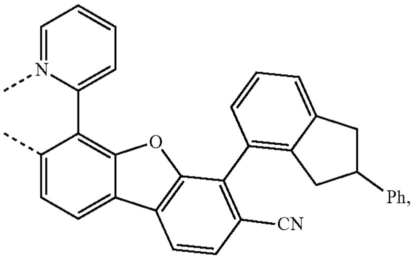
$L_{a2-58}$
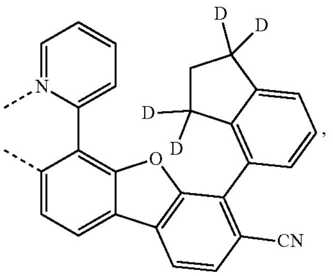
-continued
$L_{a2-59}$
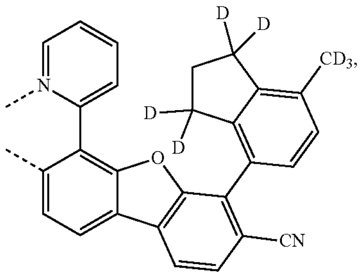
$L_{a2-60}$
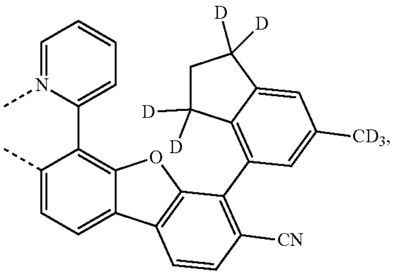
$L_{a2-61}$
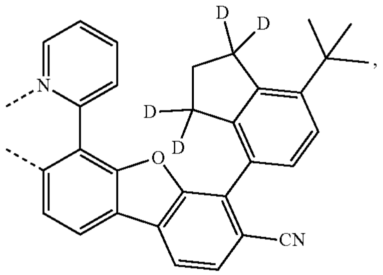
$L_{a2-62}$
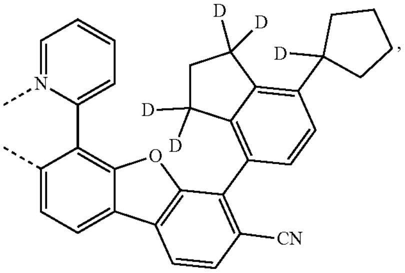
$L_{a2-63}$
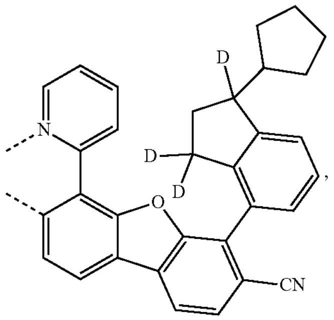

L$_{a2-64}$
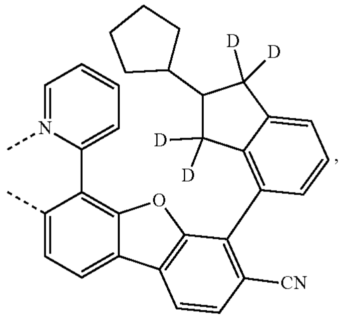
L$_{a2-65}$
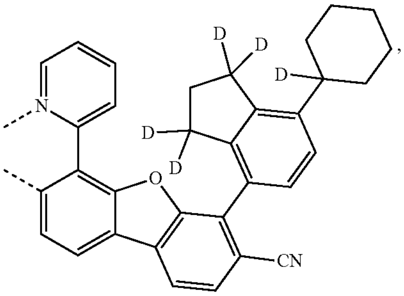
L$_{a2-66}$
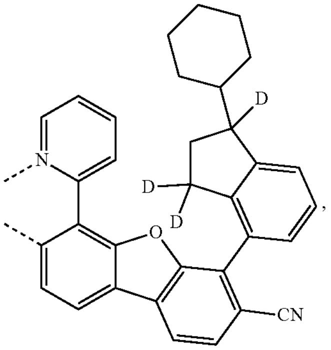
L$_{a2-67}$
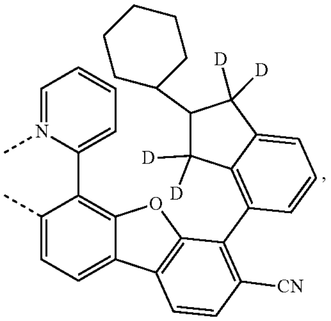
L$_{a2-68}$
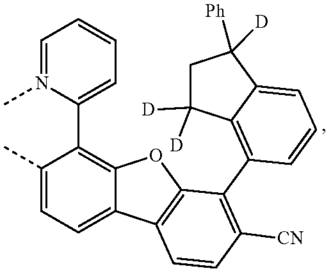
L$_{a2-69}$
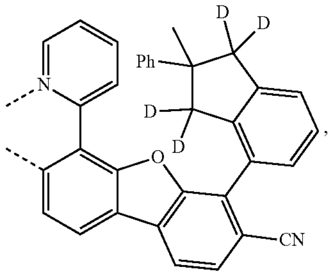
L$_{a2-70}$
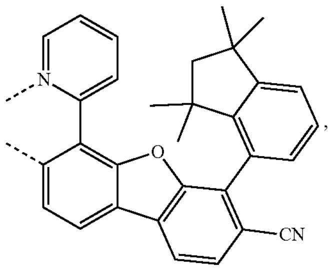
L$_{a2-71}$
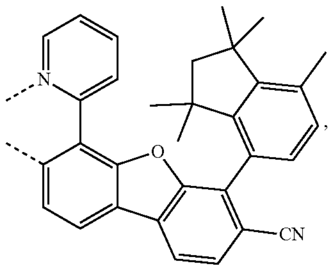
L$_{a2-72}$
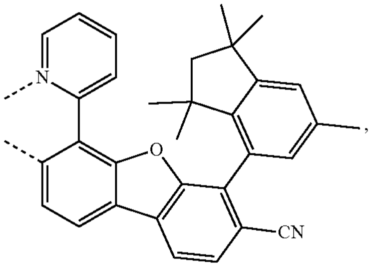
L$_{a2-73}$
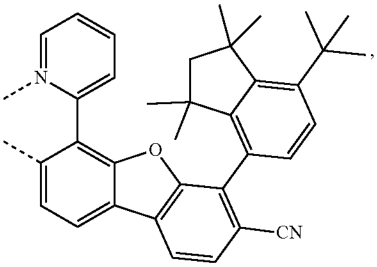

-continued
L$_{a2}$-74
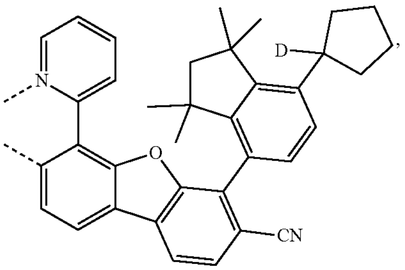
L$_{a2}$-75
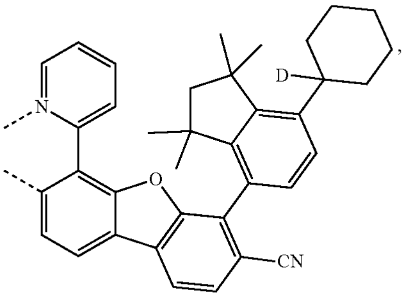
L$_{a2}$-76
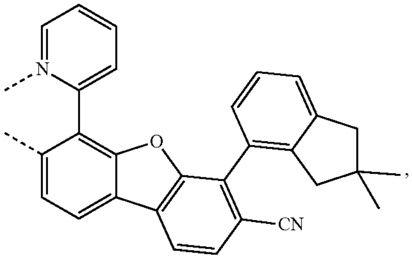
L$_{a2}$-77
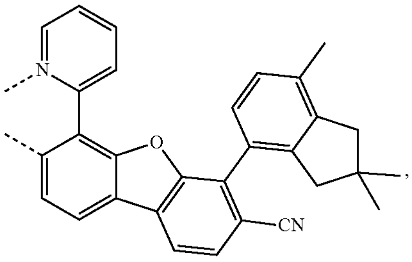
L$_{a2}$-78
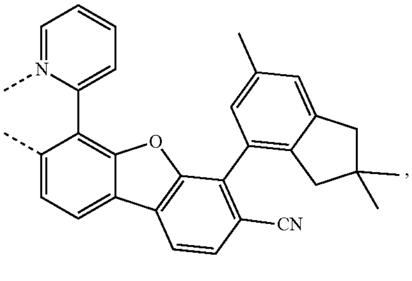
-continued
L$_{a2}$-79
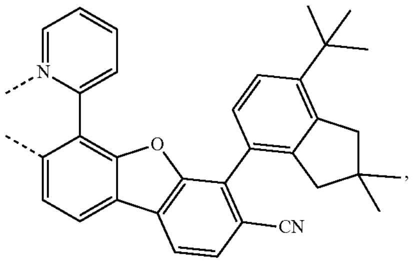
L$_{a2}$-80
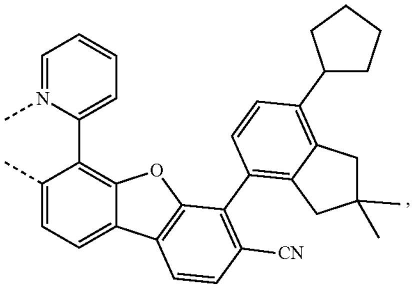
L$_{a2}$-81
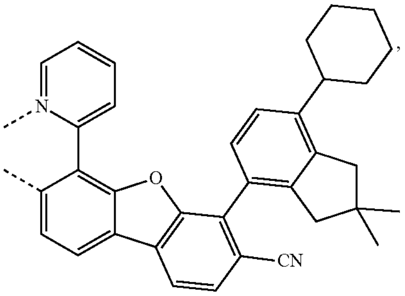
L$_{a2}$-82
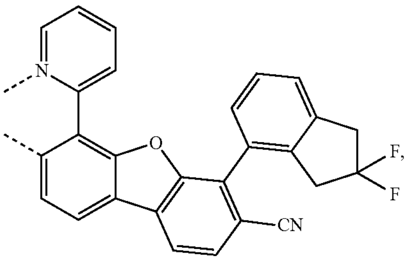
L$_{a2}$-83
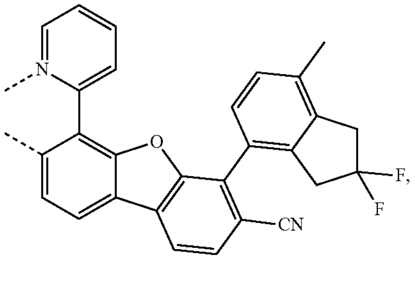

-continued
L$_{a2-84}$
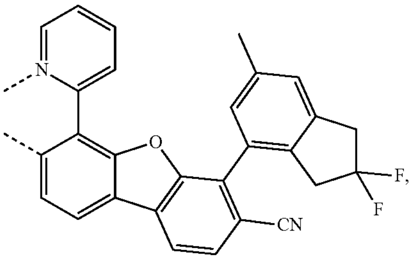
L$_{a2-85}$
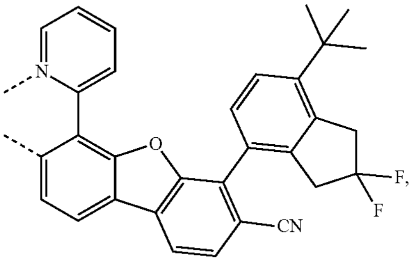
L$_{a2-86}$
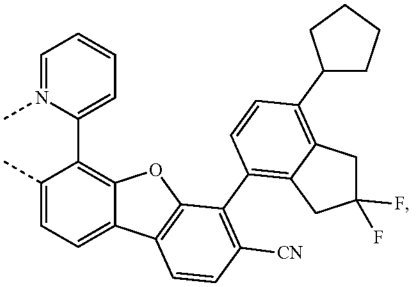
L$_{a2-87}$
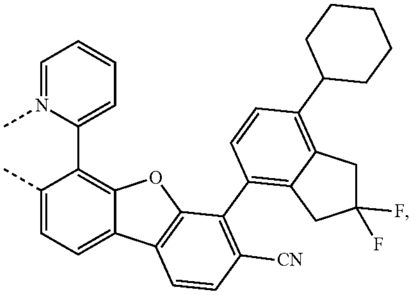
L$_{a2-88}$
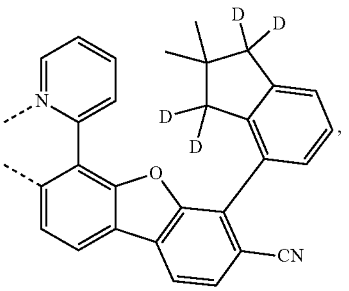
-continued
L$_{a2-89}$
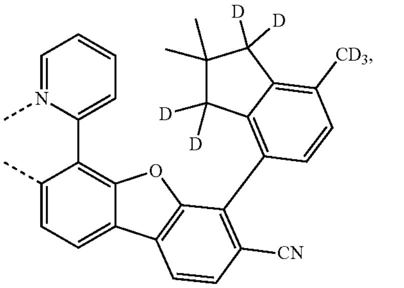
L$_{a2-90}$
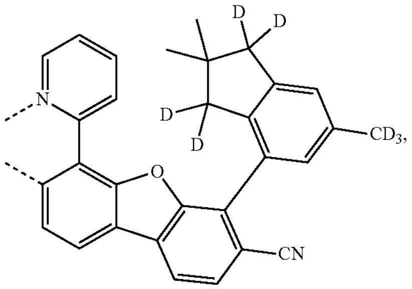
L$_{a2-91}$
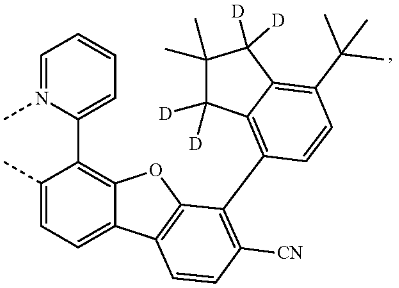
L$_{a2-92}$
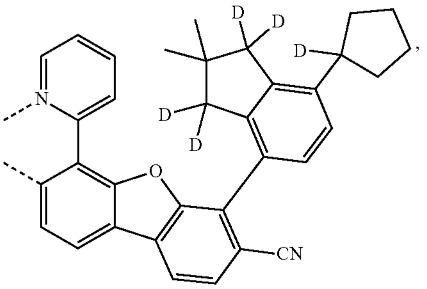
L$_{a2-93}$
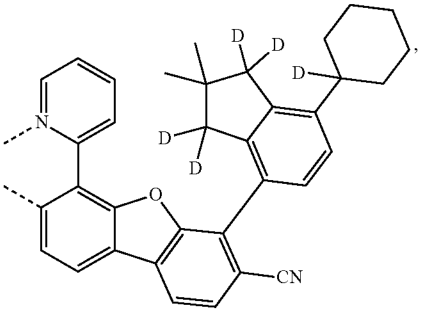

-continued
$L_{a2-94}$
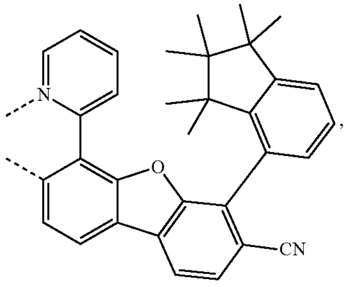
$L_{a2-95}$
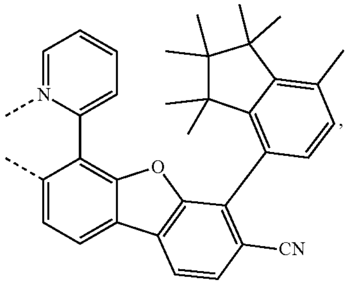
$L_{a2-96}$
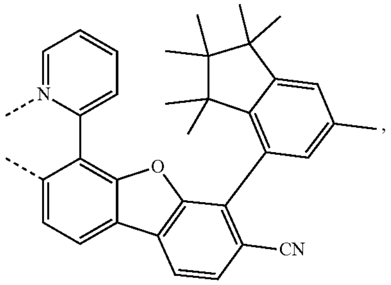
$L_{a2-97}$
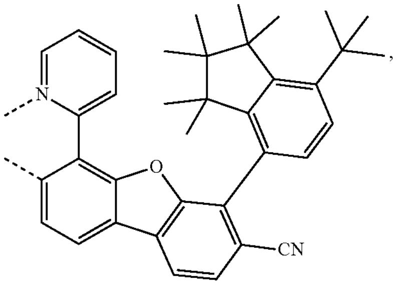
$L_{a2-98}$
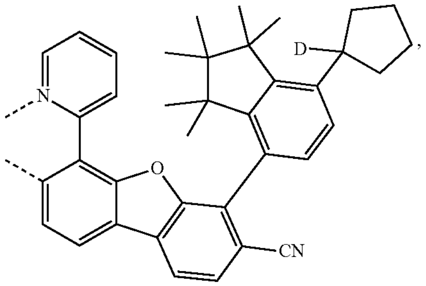
-continued
$L_{a2-99}$
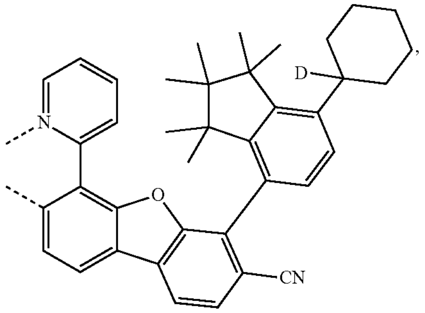
$L_{a2-133}$
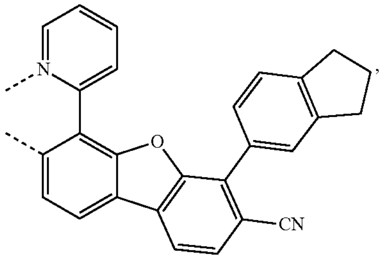
$L_{a2-134}$
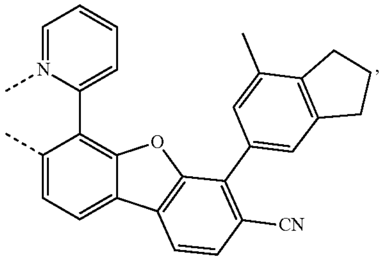
$L_{a2-135}$
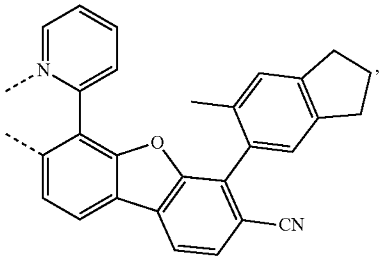
$L_{a2-136}$
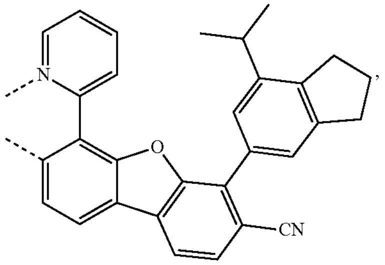

-continued
$L_{a2-137}$
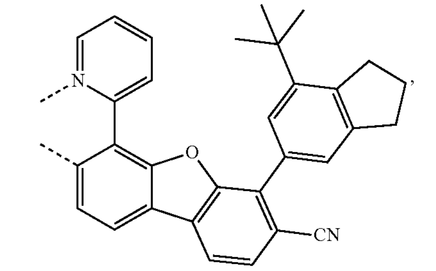
$L_{a2-138}$
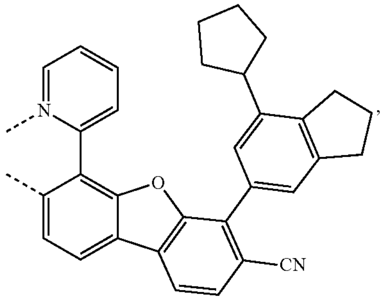
$L_{a2-139}$
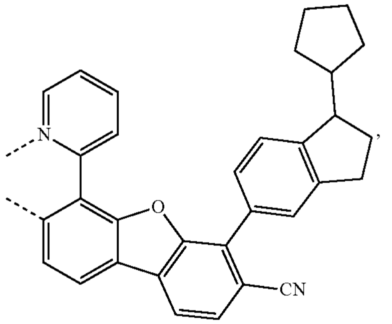
$L_{a2-140}$
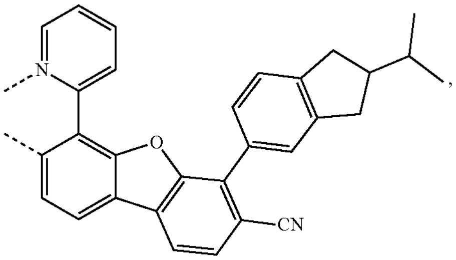
$L_{a2-141}$
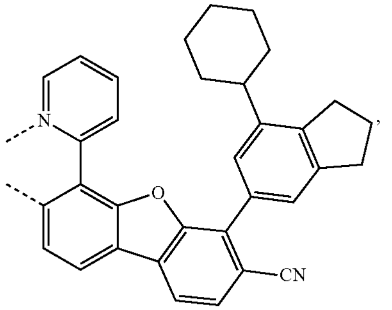
-continued
$L_{a2-142}$
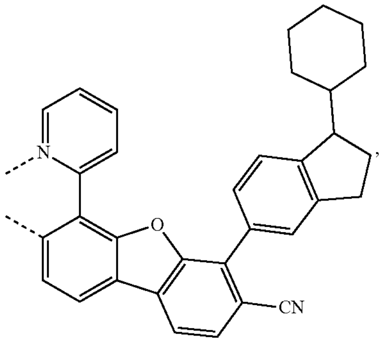
$L_{a2-143}$
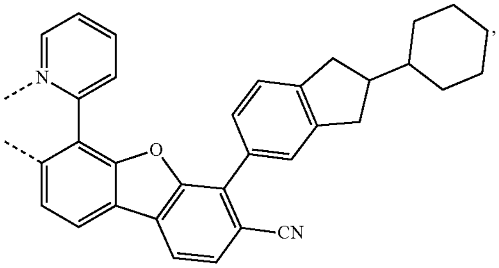
$L_{a2-144}$
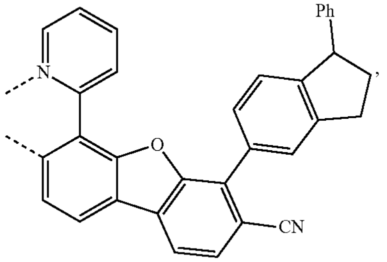
$L_{a2-145}$
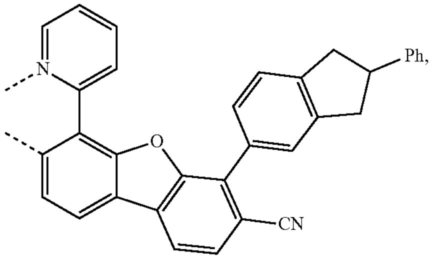
$L_{a2-146}$
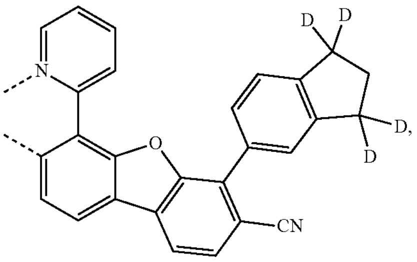

L$_{a2}$-147
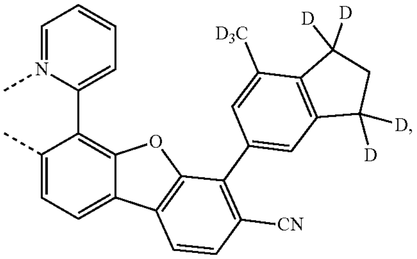
L$_{a2}$-148
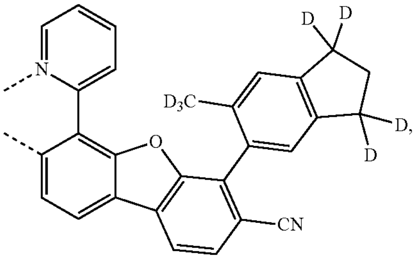
L$_{a2}$-149
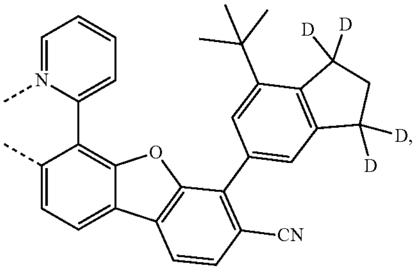
L$_{a2}$-150
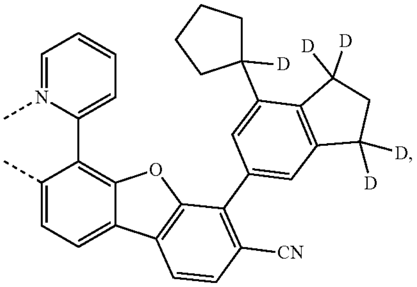
L$_{a2}$-151
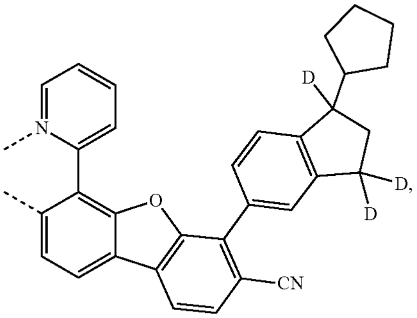
L$_{a2}$-152
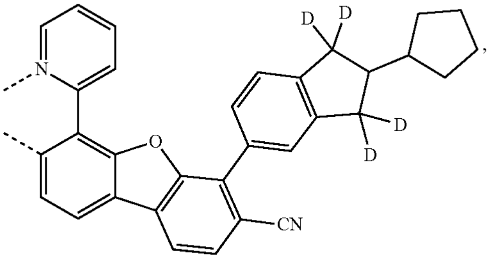
L$_{a2}$-153
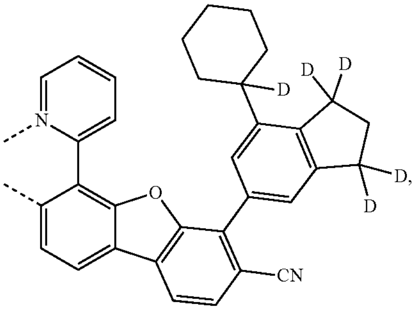
L$_{a2}$-154
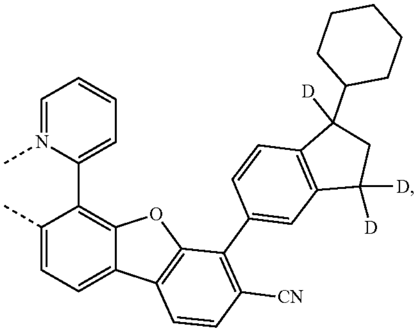
L$_{a2}$-155
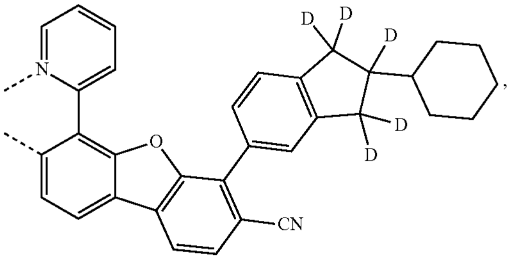
L$_{a2}$-156
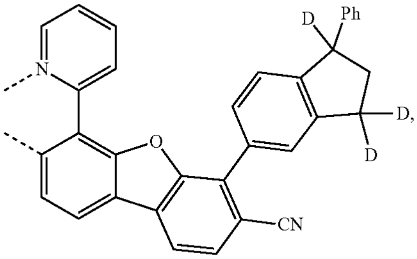

-continued
L$_{a2}$-157
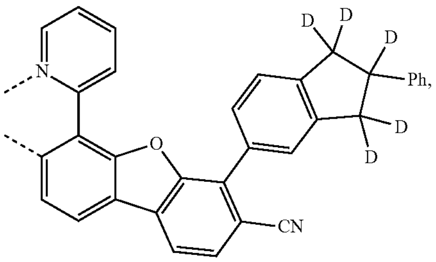
L$_{a2}$-158
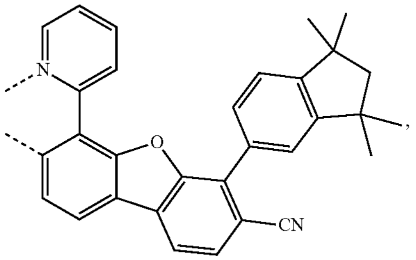
L$_{a2}$-159
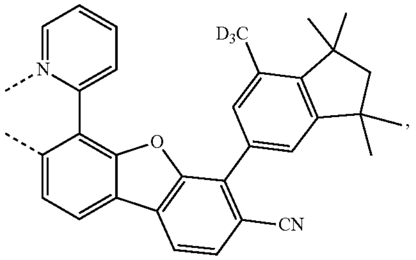
L$_{a2}$-160
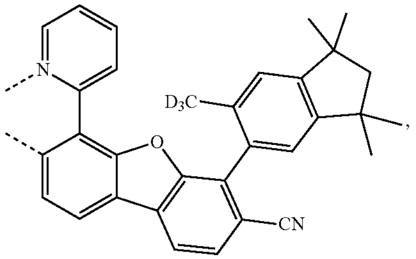
L$_{a2}$-161
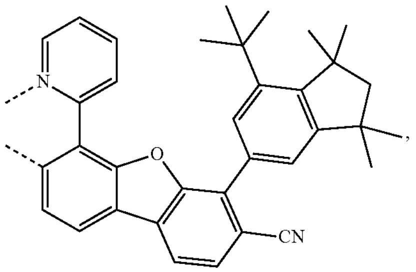
-continued
L$_{a2}$-162
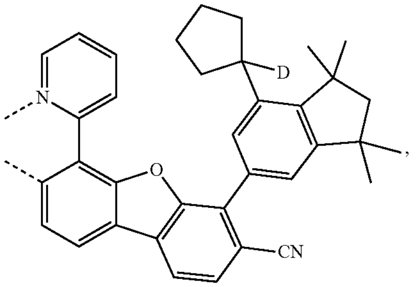
L$_{a2}$-163
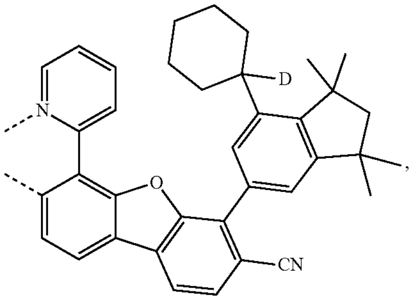
L$_{a2}$-164
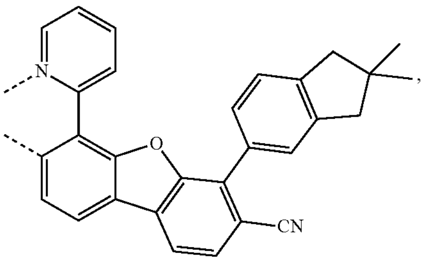
L$_{a2}$-165
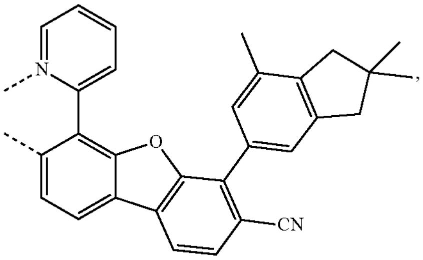
L$_{a2}$-166
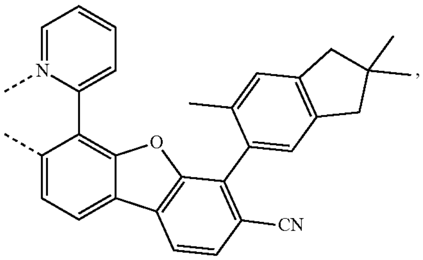

$L_{a2-167}$
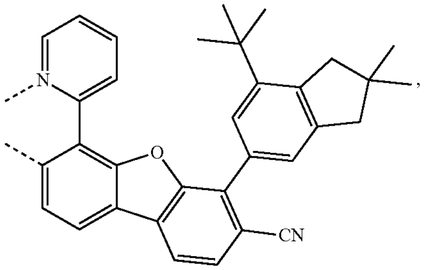
$L_{a2-168}$
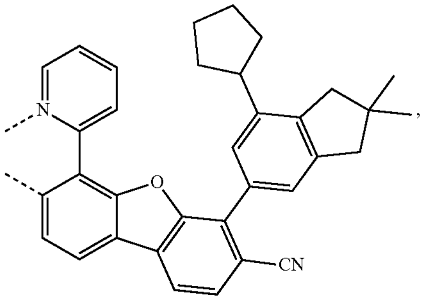
$L_{a2-169}$
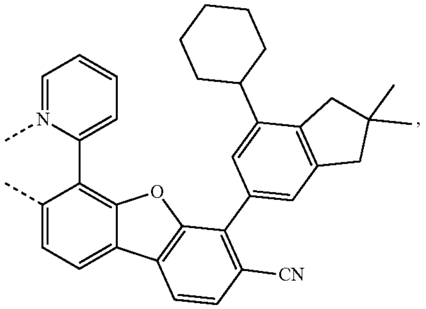
$L_{a2-170}$
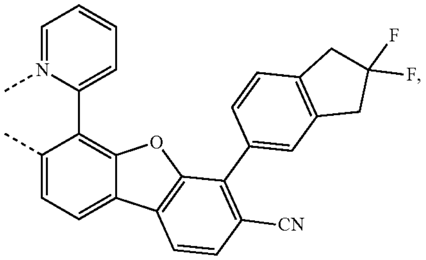
$L_{a2-171}$
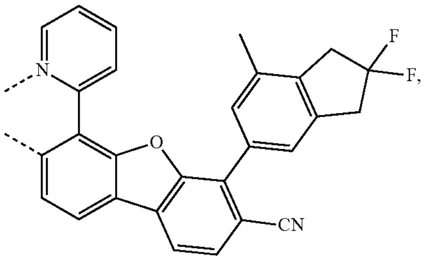
$L_{a2-172}$
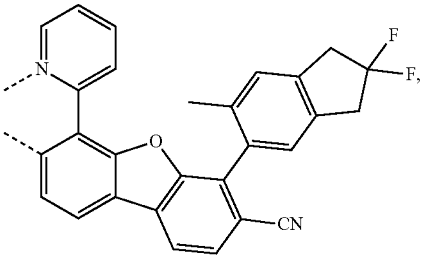
$L_{a2-173}$
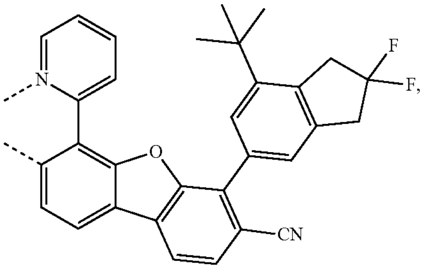
$L_{a2-174}$
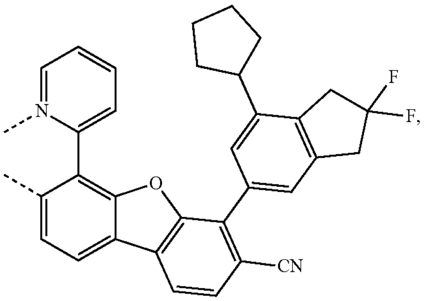
$L_{a2-175}$
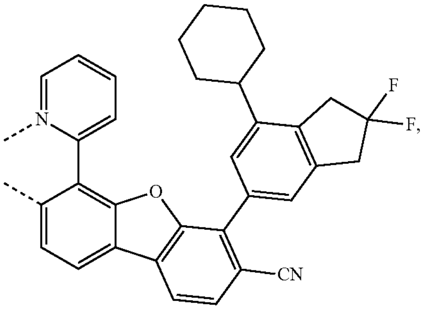
$L_{a2-176}$
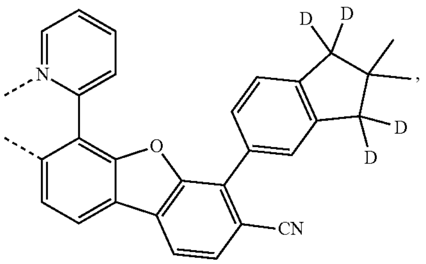

-continued
$L_{a2}$-177
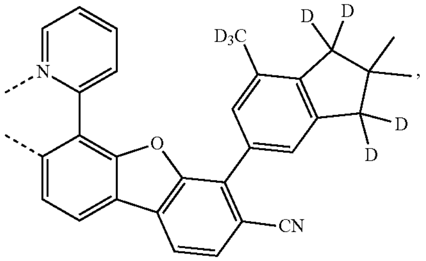
$L_{a2}$-178
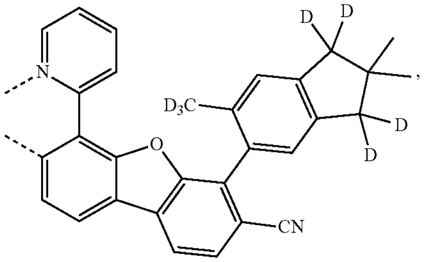
$L_{a2}$-179
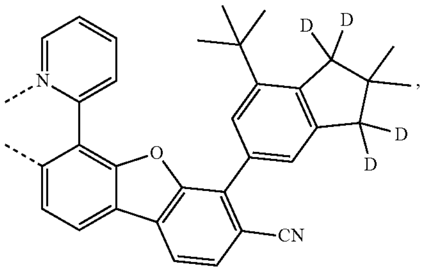
$L_{a2}$-180
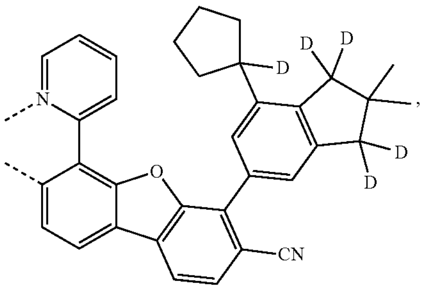
$L_{a2}$-181
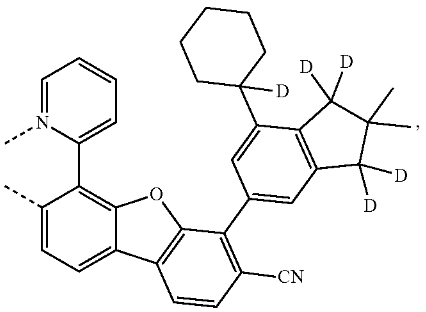
-continued
$L_{a2}$-182
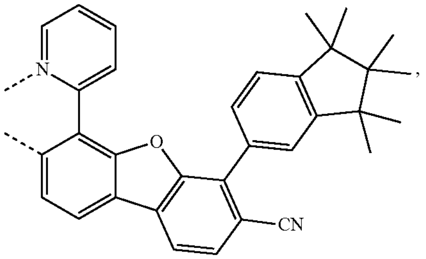
$L_{a2}$-183
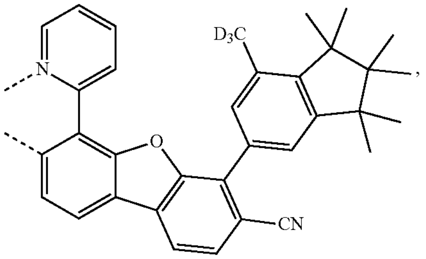
$L_{a2}$-184
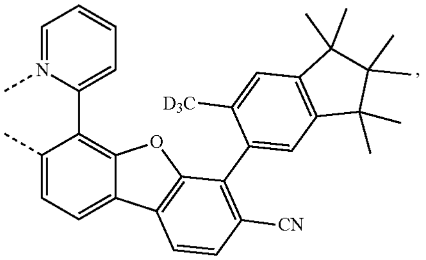
$L_{a2}$-185
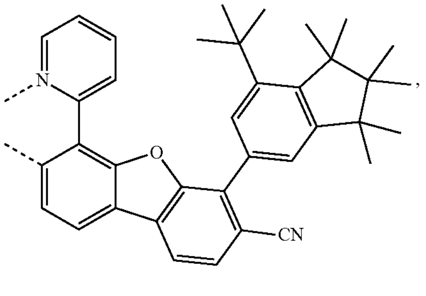
$L_{a2}$-186
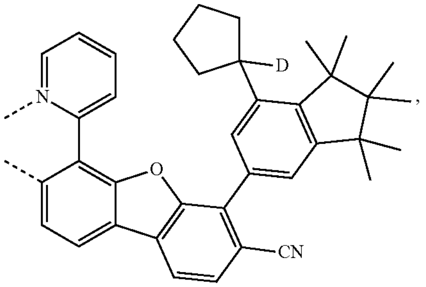

-continued
$L_{a2}$-187
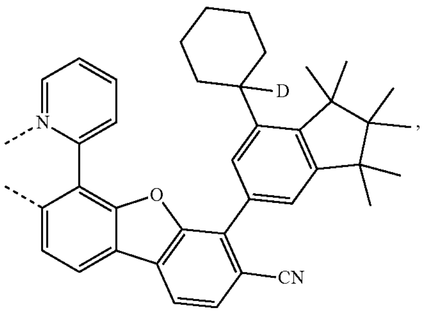
$L_{a2}$-221
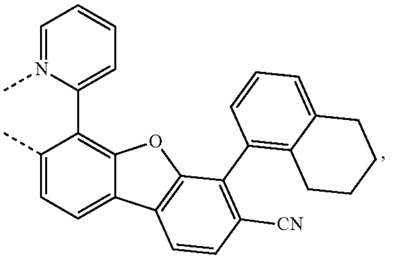
$L_{a2}$-222
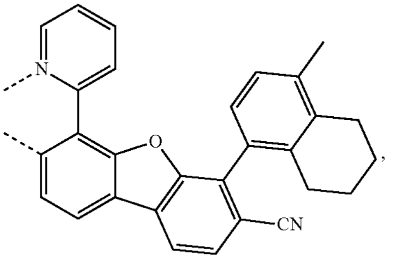
$L_{a2}$-223
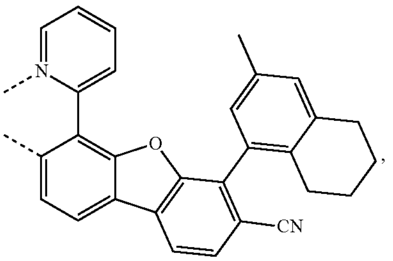
$L_{a2}$-224
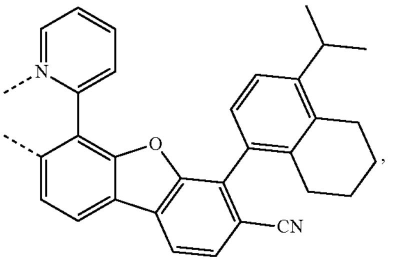
-continued
$L_{a2}$-225
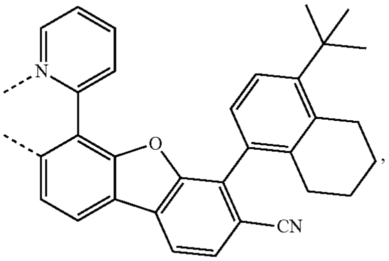
$L_{a2}$-226
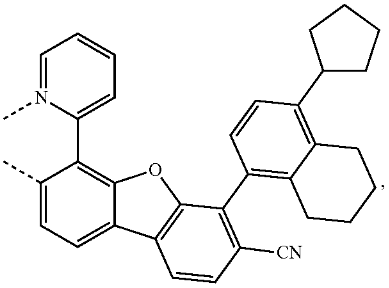
$L_{a2}$-227
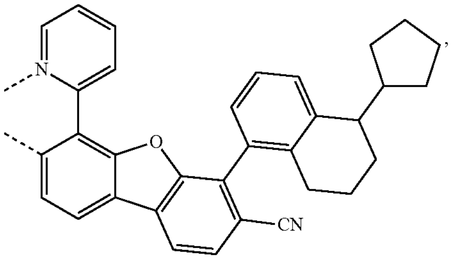
$L_{a2}$-228
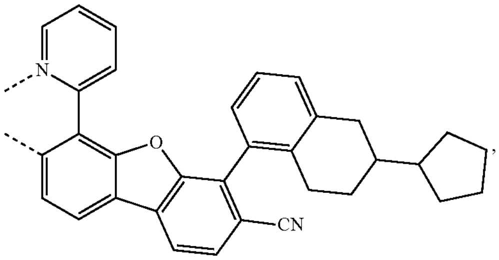
$L_{a2}$-229
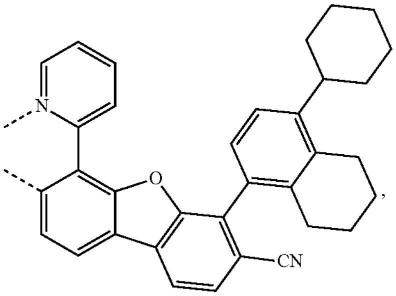

-continued
$L_{a2\text{-}230}$
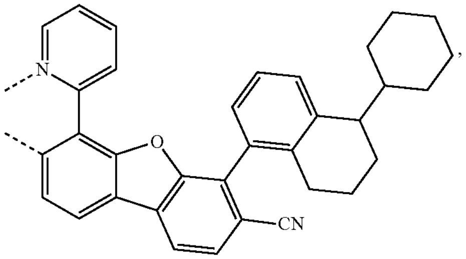
$L_{a2\text{-}231}$
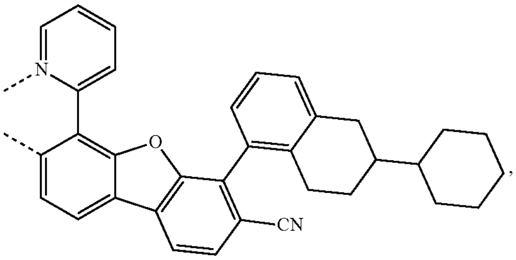
$L_{a2\text{-}232}$
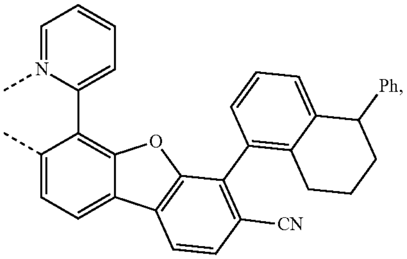
$L_{a2\text{-}233}$
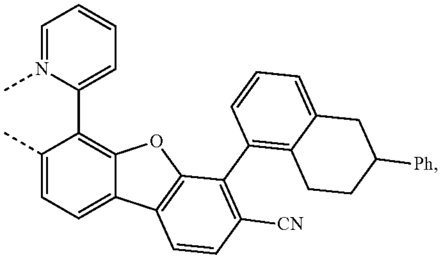
$L_{a2\text{-}234}$
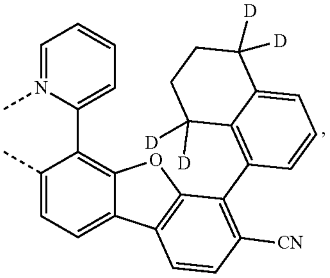
-continued
$L_{a2\text{-}235}$
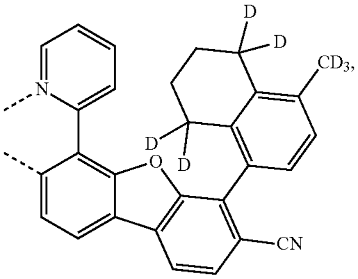
$L_{a2\text{-}236}$
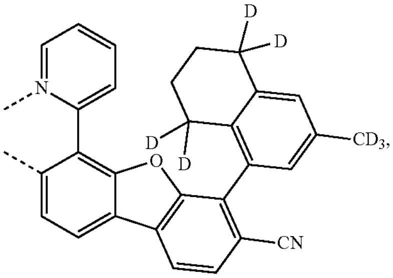
$L_{a2\text{-}237}$
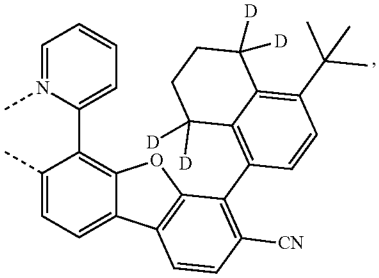
$L_{a2\text{-}238}$
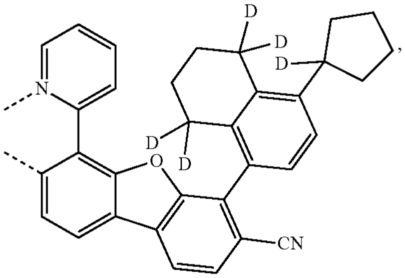
$L_{a2\text{-}239}$
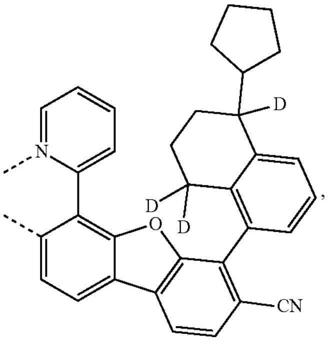

-continued
L$_{a2\text{-}240}$
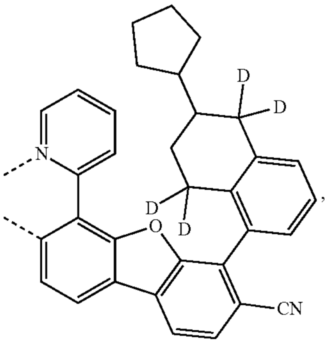
L$_{a2\text{-}241}$
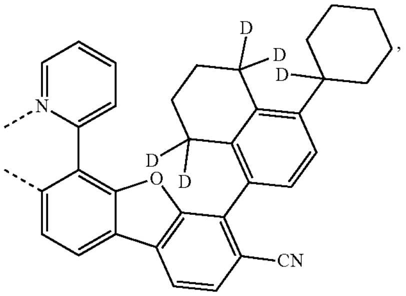
L$_{a2\text{-}242}$
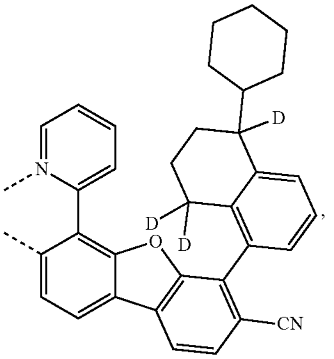
L$_{a2\text{-}243}$
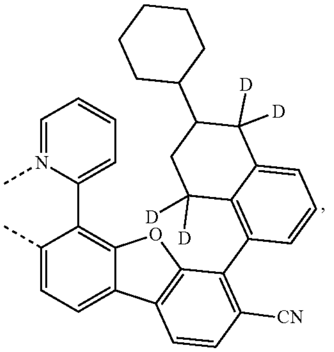
-continued
L$_{a2\text{-}244}$
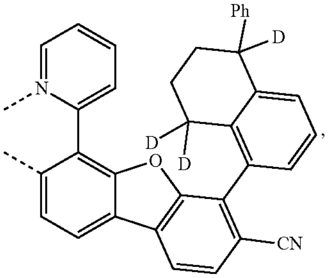
L$_{a2\text{-}245}$
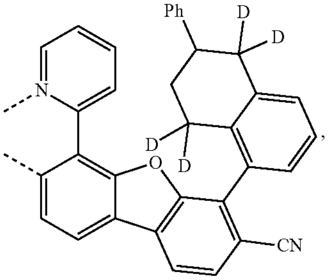
L$_{a2\text{-}246}$
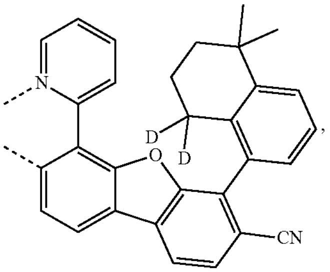
L$_{a2\text{-}247}$
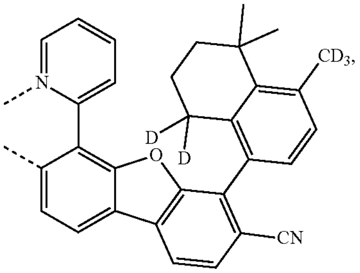
L$_{a2\text{-}248}$
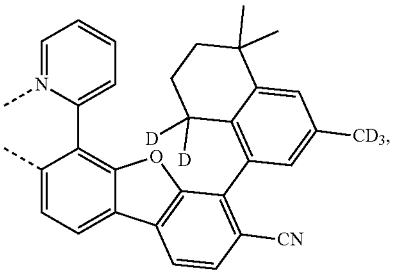

-continued
$L_{a2-249}$
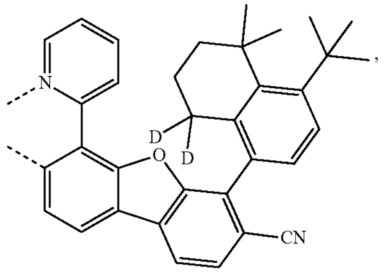
$L_{a2-250}$
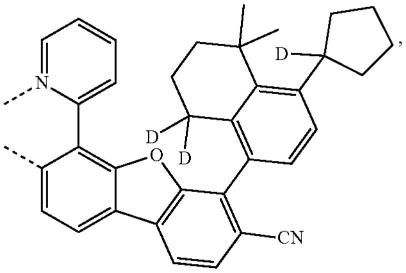
$L_{a2-251}$
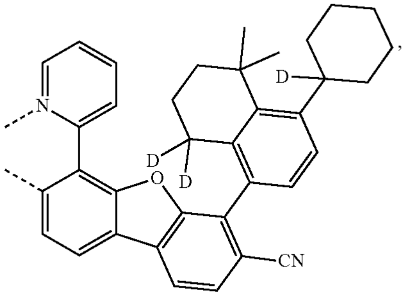
$L_{a2-252}$
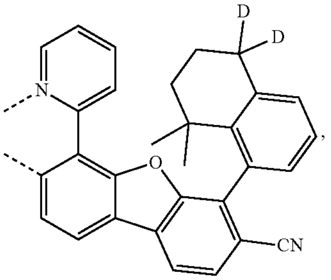
$L_{a2-253}$
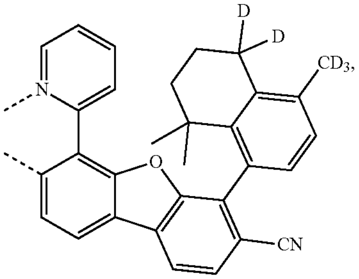
-continued
$L_{a2-254}$
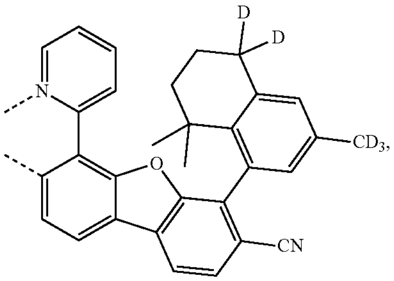
$L_{a2-255}$
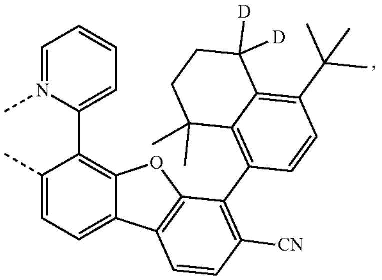
$L_{a2-256}$
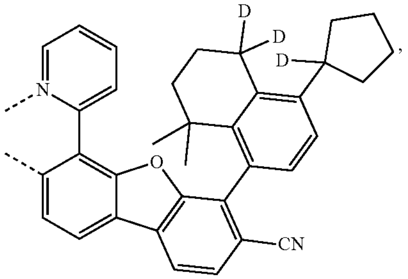
$L_{a2-257}$
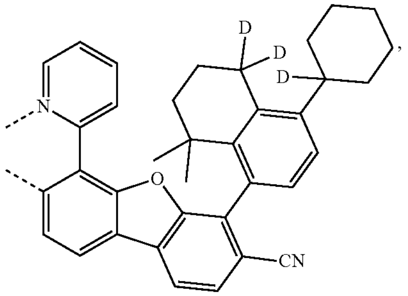
$L_{a2-258}$
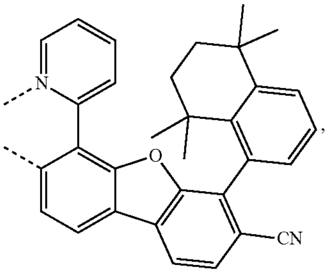

-continued
$L_{a2\text{-}259}$
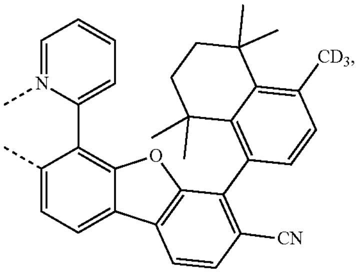
$L_{a2\text{-}260}$
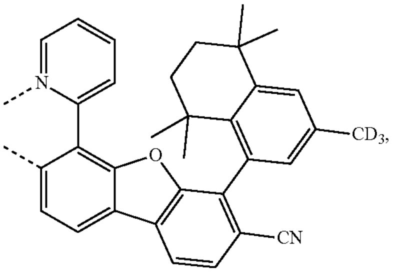
$L_{a2\text{-}261}$
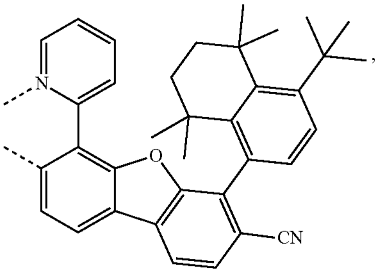
$L_{a2\text{-}262}$
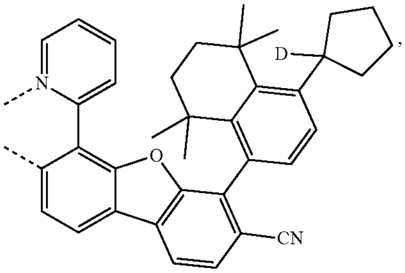
$L_{a2\text{-}263}$
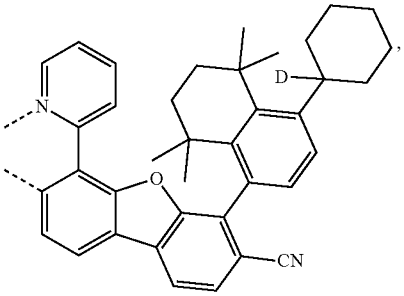
-continued
$L_{a2\text{-}264}$
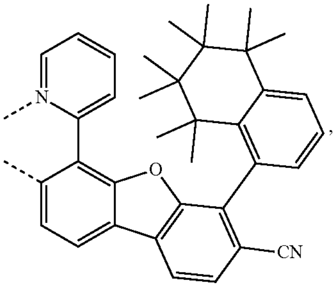
$L_{a2\text{-}265}$
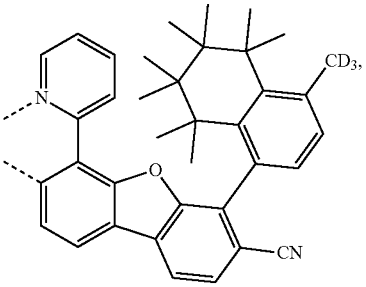
$L_{a2\text{-}266}$
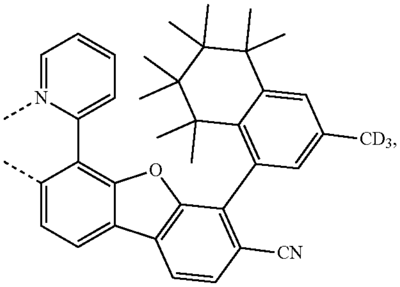
$L_{a2\text{-}267}$
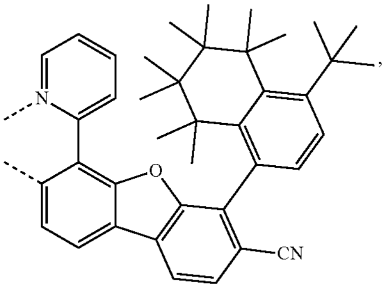
$L_{a2\text{-}268}$
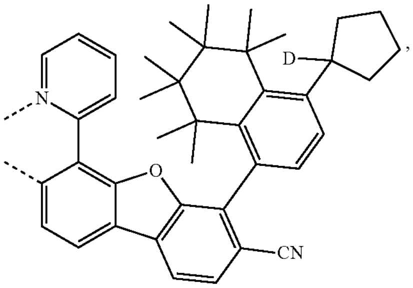

-continued
$L_{a2-269}$
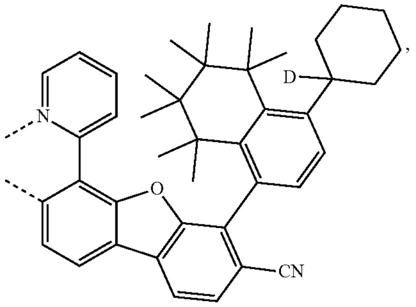
$L_{a2-270}$
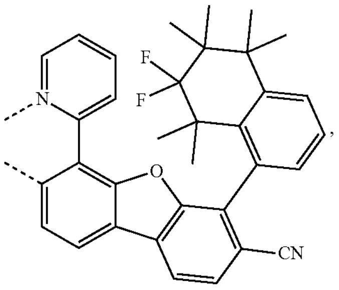
$L_{a2-271}$
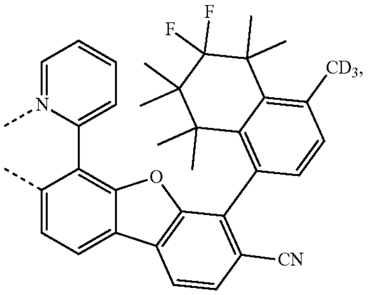
$L_{a2-272}$
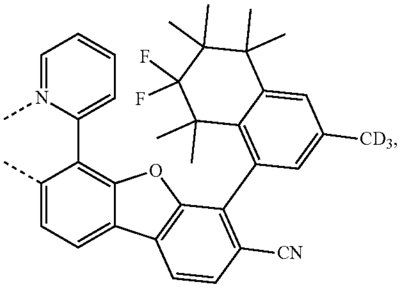
$L_{a2-273}$
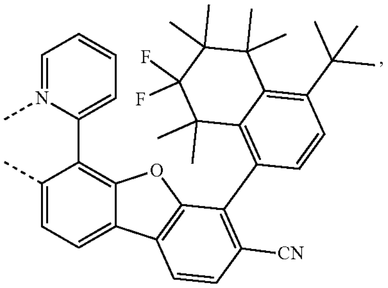
-continued
$L_{a2-274}$
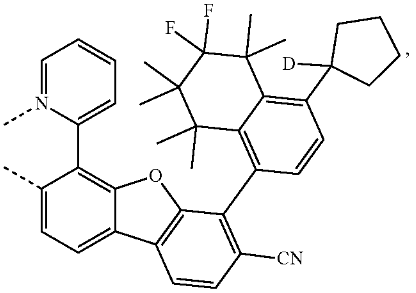
$L_{a2-275}$
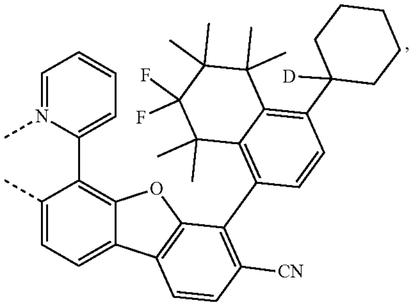
$L_{a2-308}$
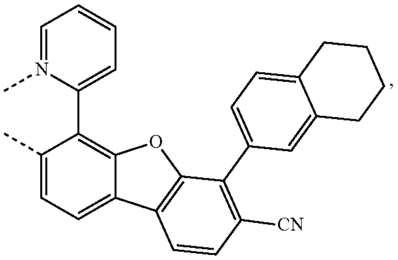
$L_{a2-309}$
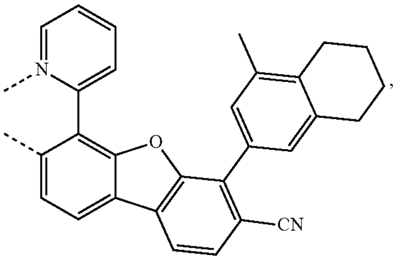
$L_{a2-310}$
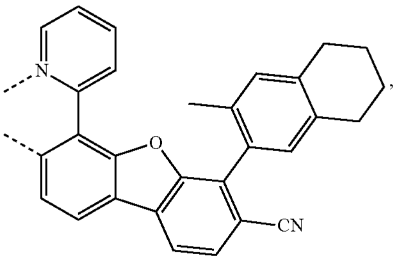

-continued
$L_{a2-311}$
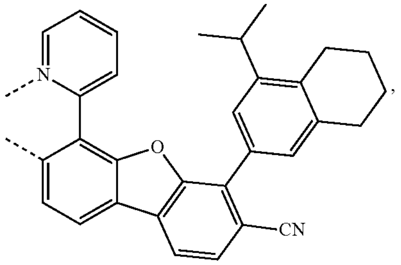
$L_{a2-312}$
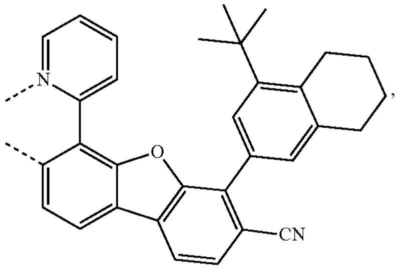
$L_{a2-313}$
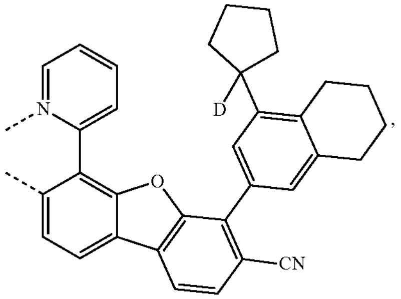
$L_{a2-314}$
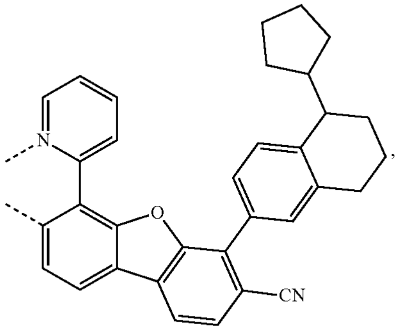
$L_{a2-315}$
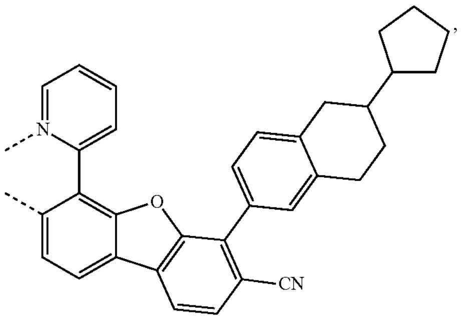
-continued
$L_{a2-316}$
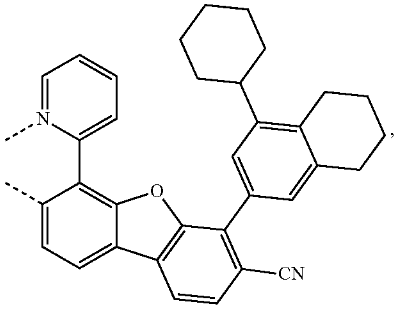
$L_{a2-317}$
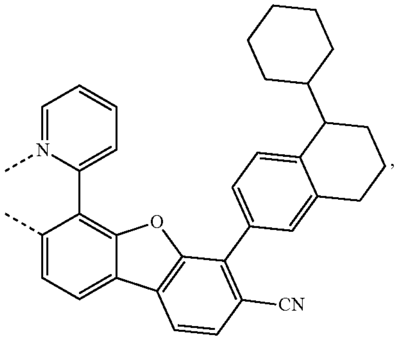
$L_{a2-318}$
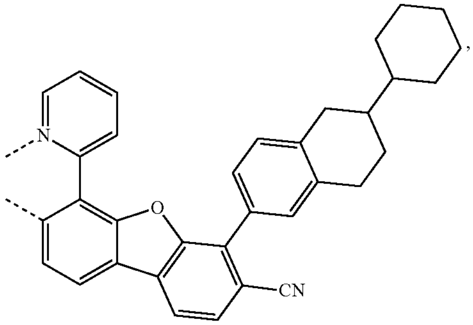
$L_{a2-319}$
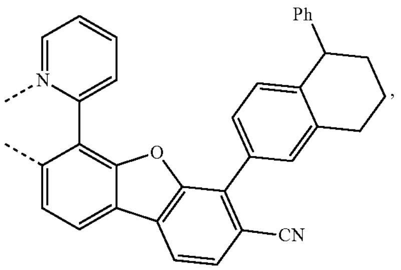
$L_{a2-320}$
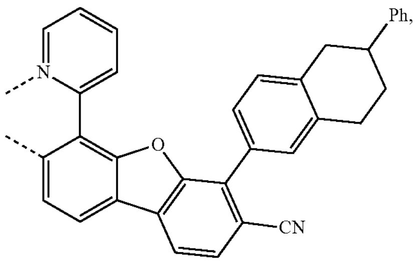

-continued
La2-321
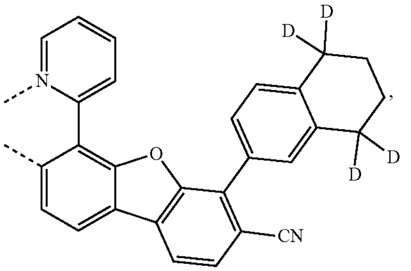
La2-322
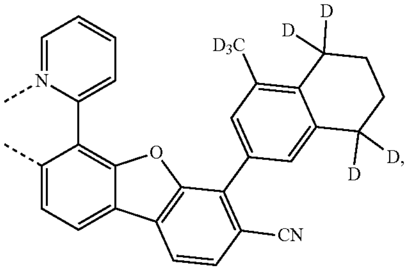
La2-323
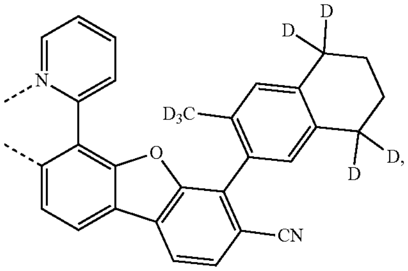
La2-324
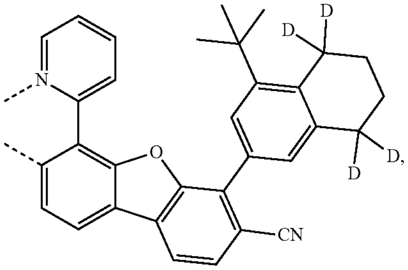
La2-325
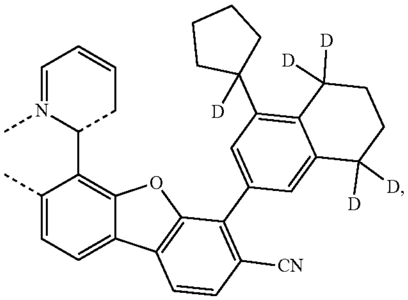
-continued
La2-326
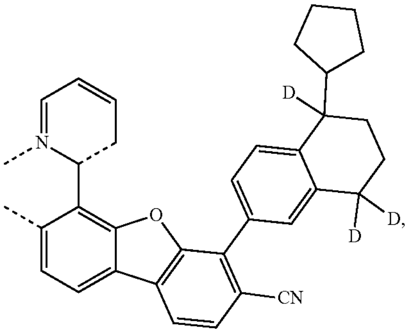
La2-327
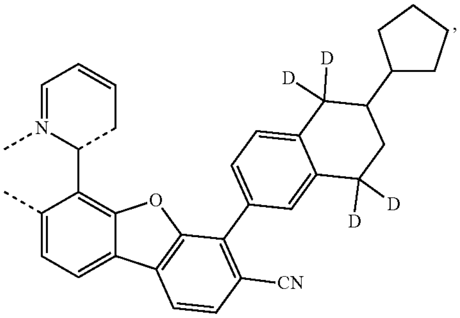
La2-328
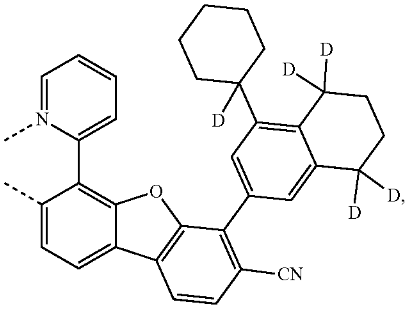
La2-329
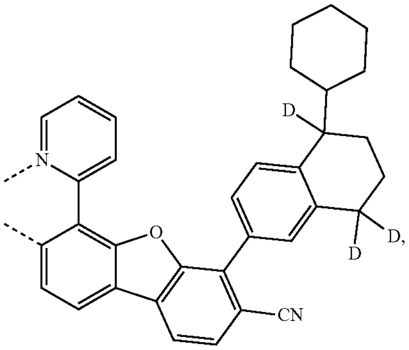

-continued
$L_{a2-330}$
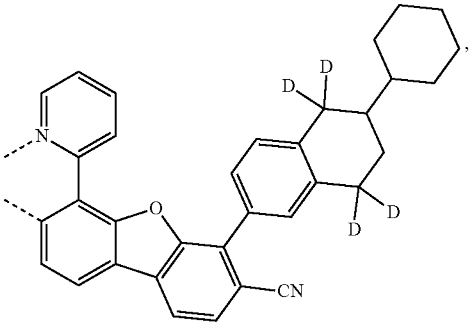
$L_{a2-331}$
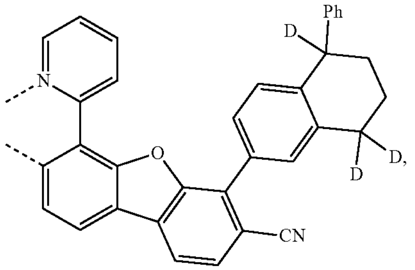
$L_{a2-332}$
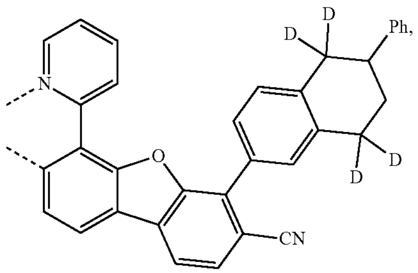
$L_{a2-333}$
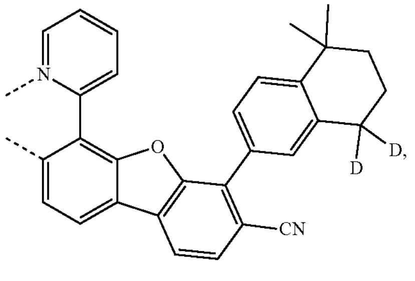
$L_{a2-334}$
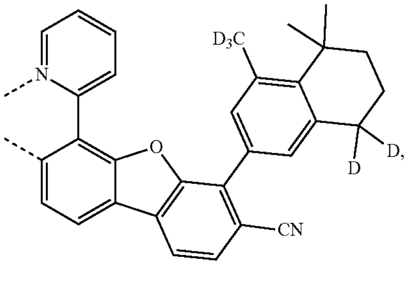
-continued
$L_{a2-335}$
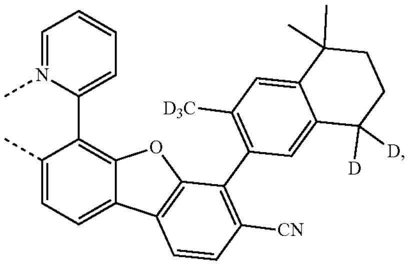
$L_{a2-336}$
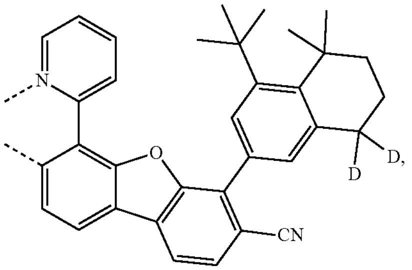
$L_{a2-337}$
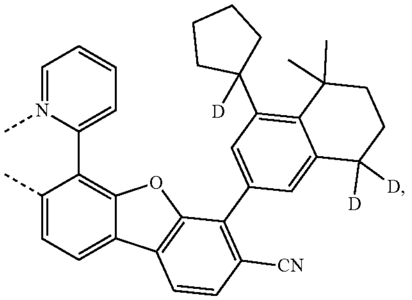
$L_{a2-338}$
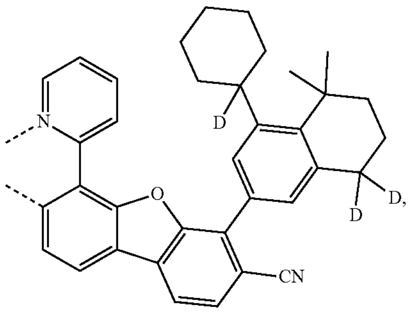
$L_{a2-339}$
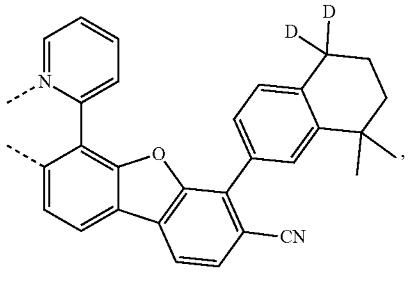

-continued
$L_{a2}$-340
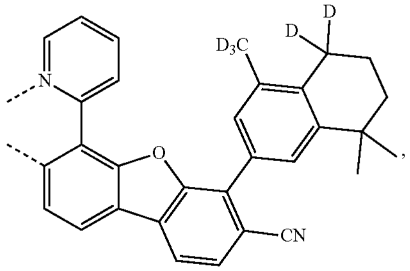
$L_{a2}$-341
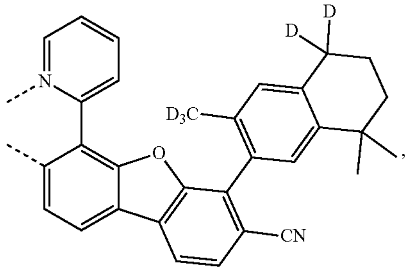
$L_{a2}$-342
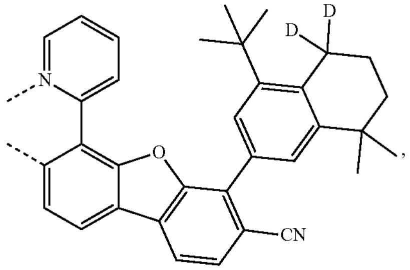
$L_{a2}$-343
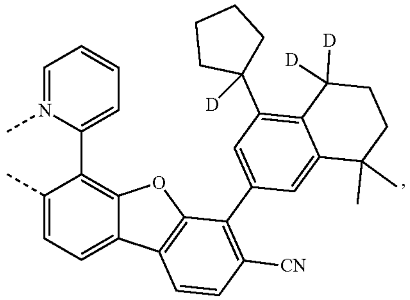
$L_{a2}$-344
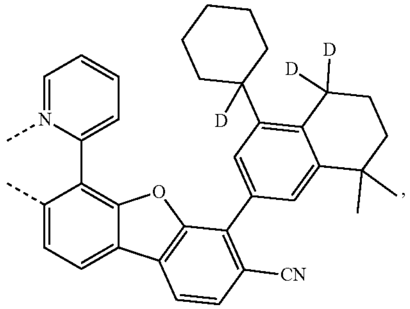
-continued
$L_{a2}$-345
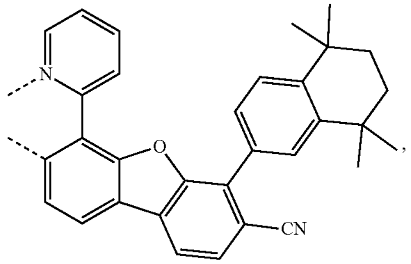
$L_{a2}$-346
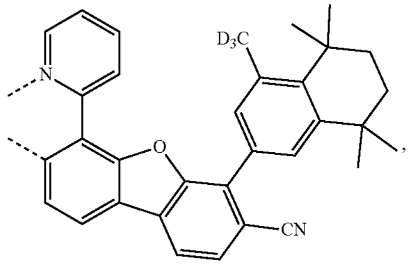
$L_{a2}$-347
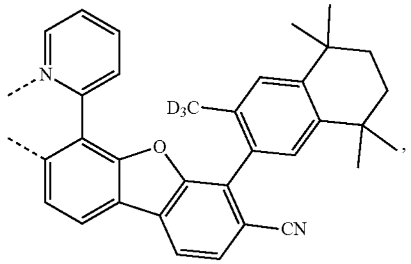
$L_{a2}$-348
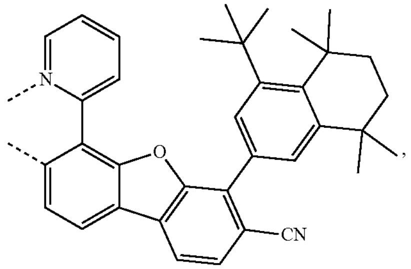
$L_{a2}$-349
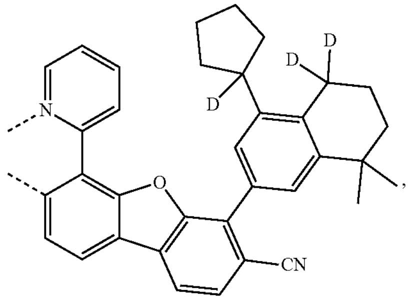

-continued
$L_{a2\text{-}350}$
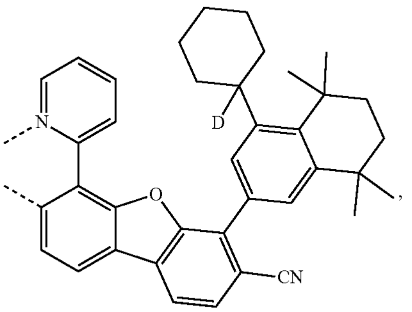
$L_{a2\text{-}351}$
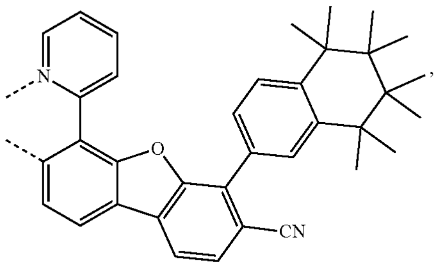
$L_{a2\text{-}352}$
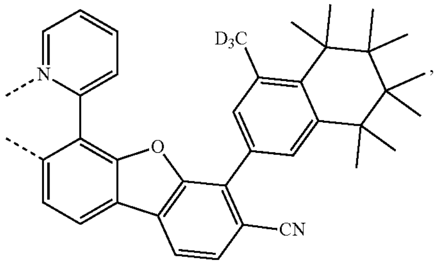
$L_{a2\text{-}353}$
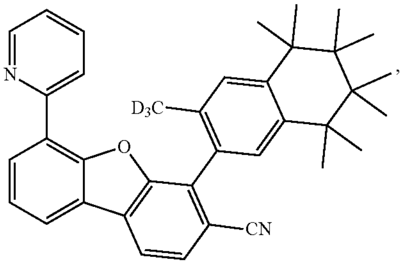
$L_{a2\text{-}354}$
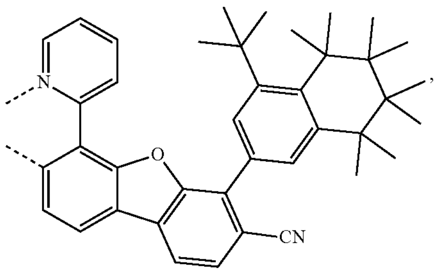
-continued
$L_{a2\text{-}355}$
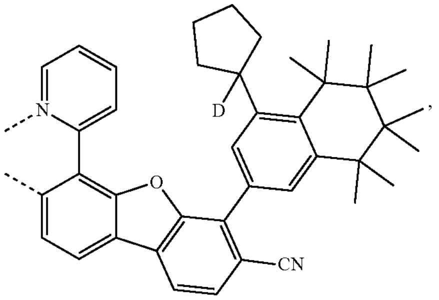
$L_{a2\text{-}356}$
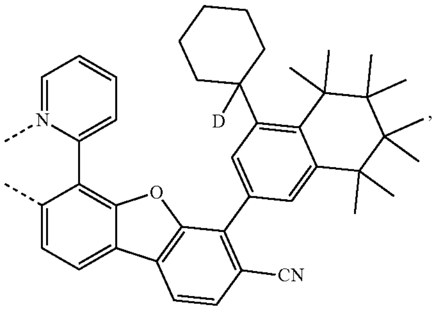
$L_{a2\text{-}359}$
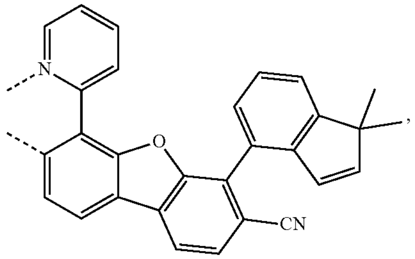
$L_{a2\text{-}360}$
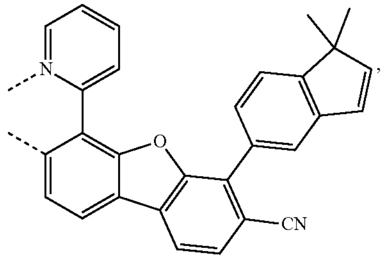
$L_{a2\text{-}361}$
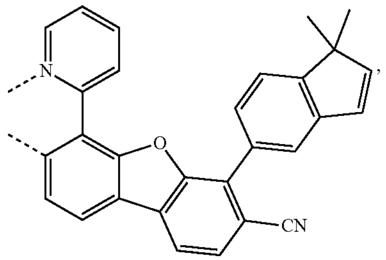

-continued
$L_{a2-362}$
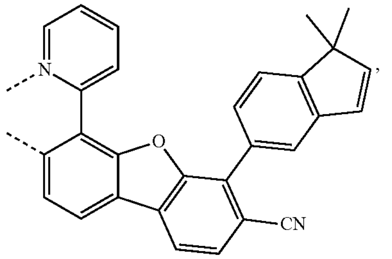
$L_{a2-395}$
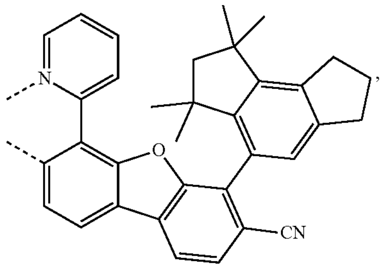
$L_{a2-398}$
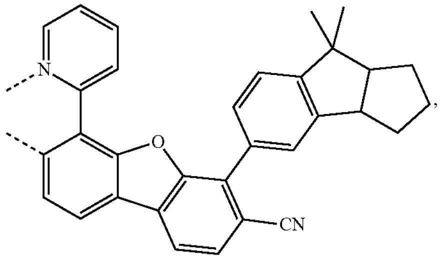
$L_{a2-400}$
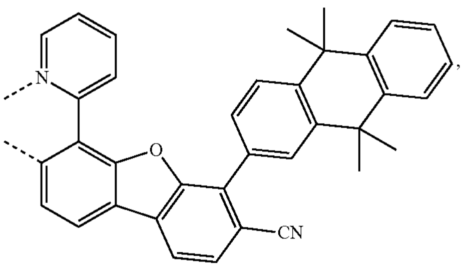
$L_{a2-414}$
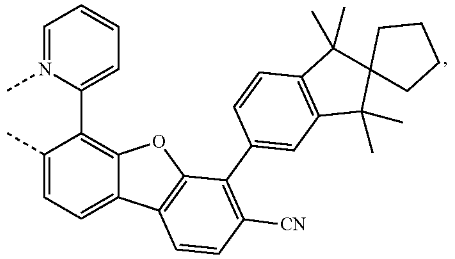
-continued
$L_{a2-415}$
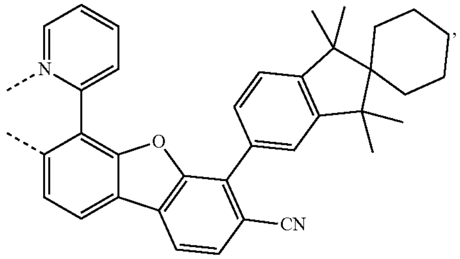
$L_{a2-416}$
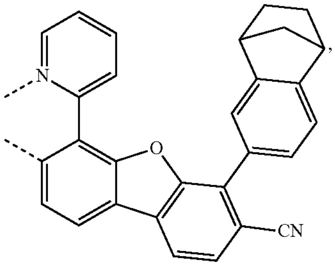
$L_{a2-417}$
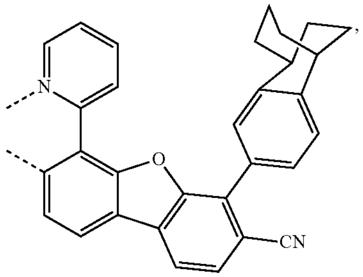
$L_{a2-418}$
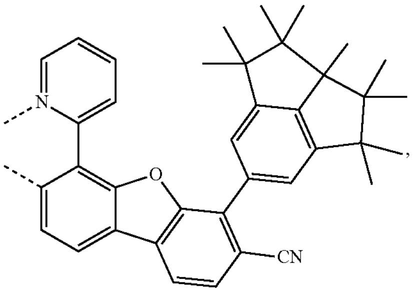
$L_{a2-419}$
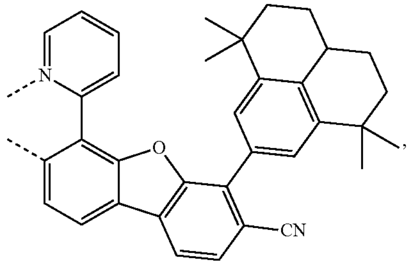

-continued
$L_{a2}$-438
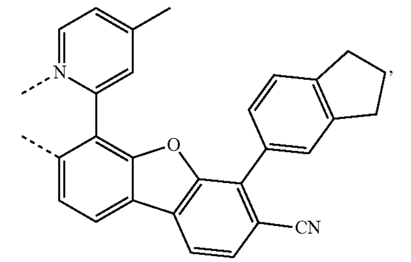
$L_{a2}$-439
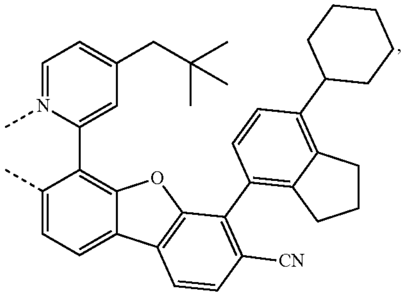
$L_{a2}$-440
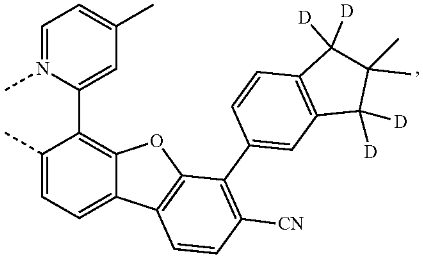
$L_{a2}$-441
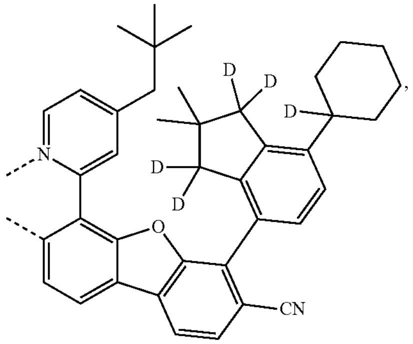
$L_{a2}$-442
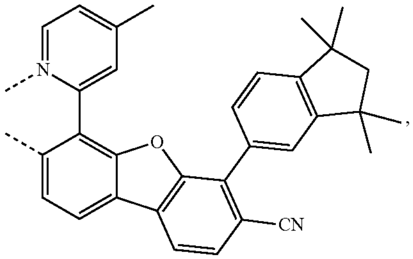
-continued
$L_{a2}$-443
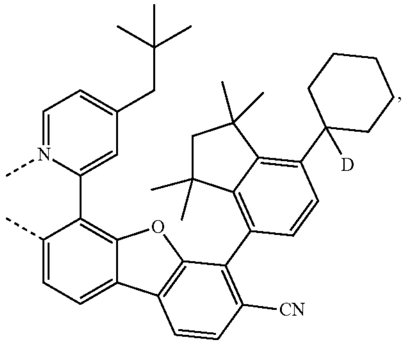
$L_{a2}$-444
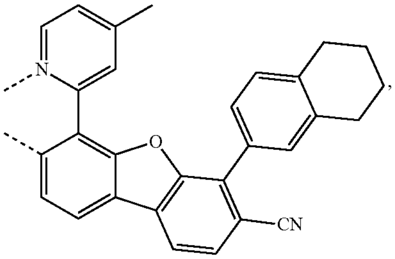
$L_{a2}$-445
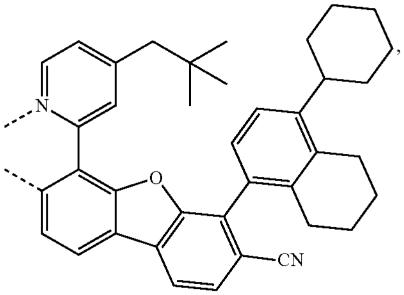
$L_{a2}$-446
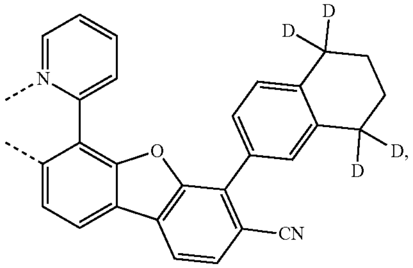
$L_{a2}$-447
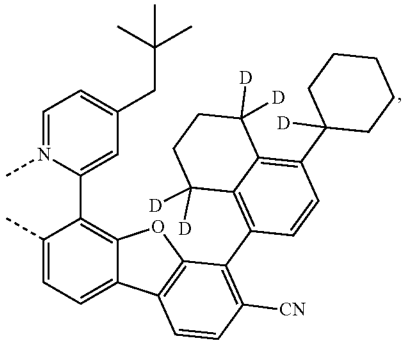

-continued
$L_{a2}$-448
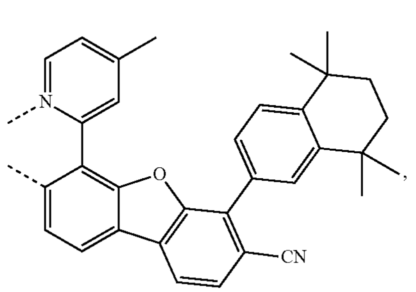
$L_{a2}$-449
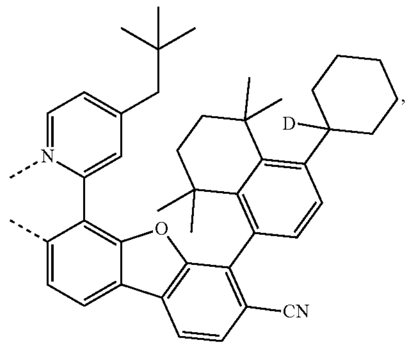
$L_{a2}$-450
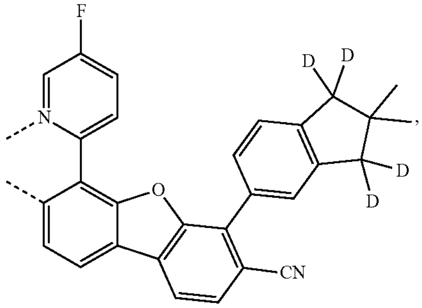
$L_{a2}$-451
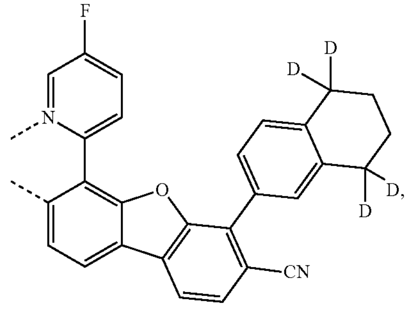
$L_{a2}$-452
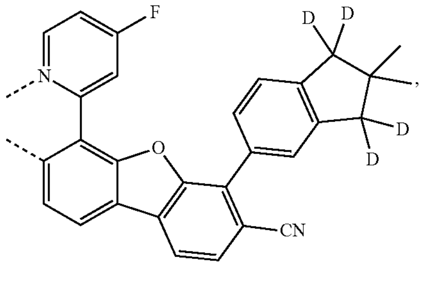
-continued
$L_{a2}$-453
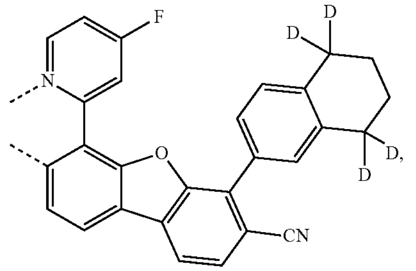
$L_{a2}$-454
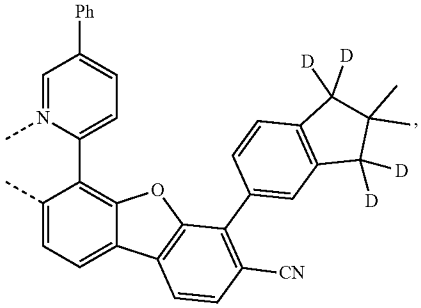
$L_{a2}$-455
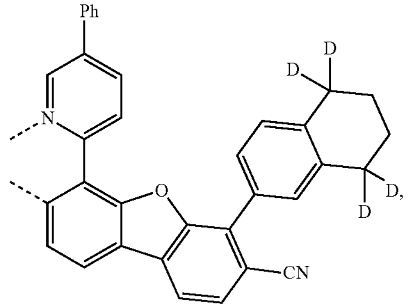
$L_{a2}$-456
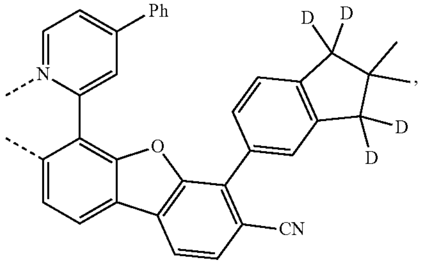
$L_{a2}$-457
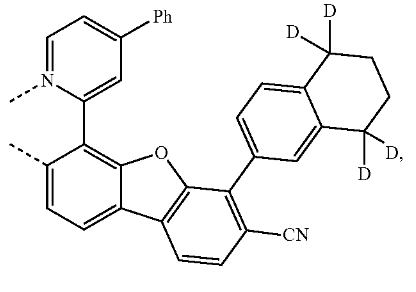

-continued
$L_{a2-458}$
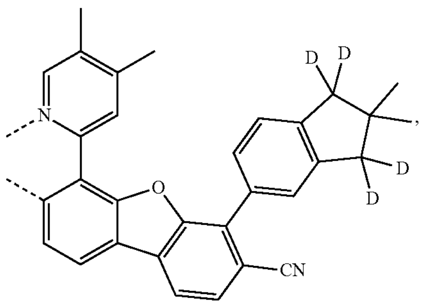
$L_{a2-459}$
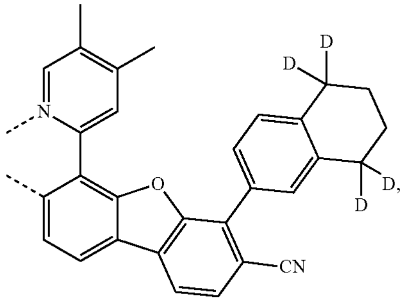
$L_{a2-460}$
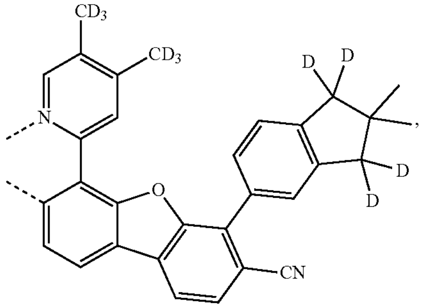
$L_{a2-461}$
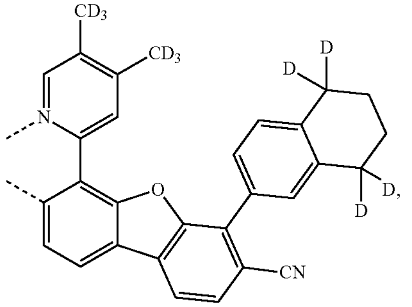
$L_{a2-462}$
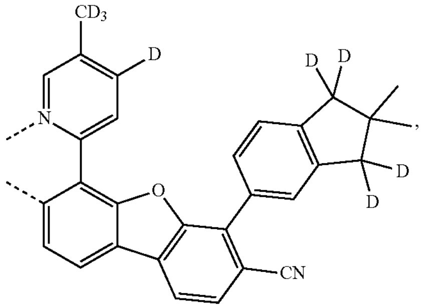
-continued
$L_{a2-463}$
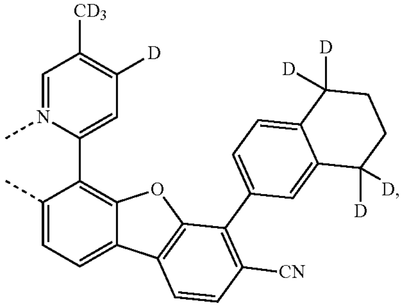
$L_{a2-464}$
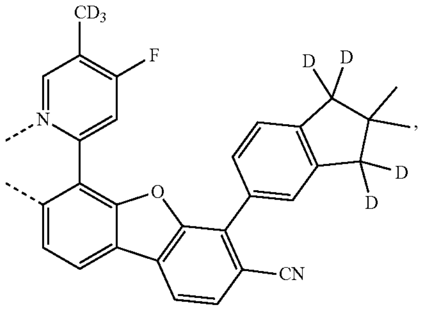
$L_{a2-465}$
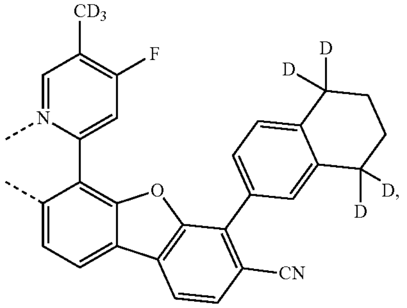
$L_{a2-466}$
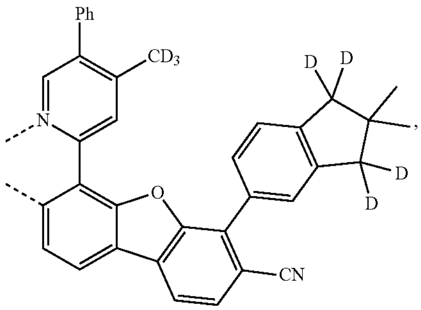
$L_{a2-467}$
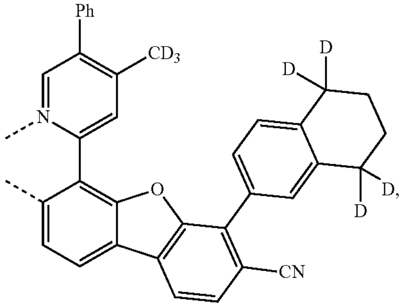

-continued
La2-468
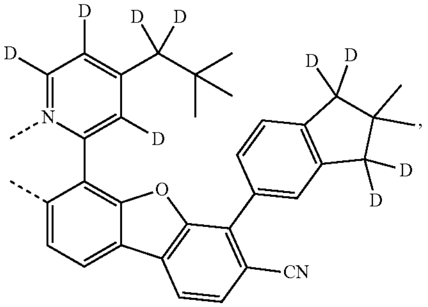
La2-469
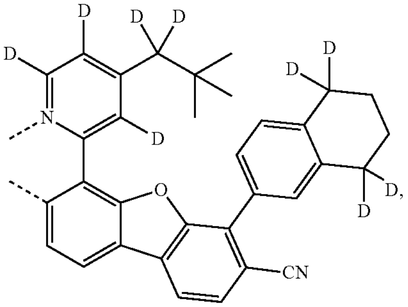
La2-470
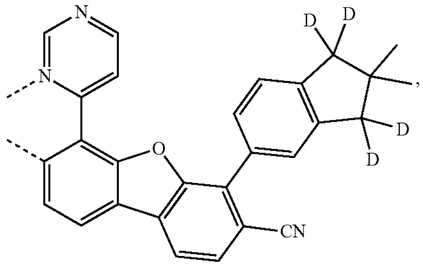
La2-471
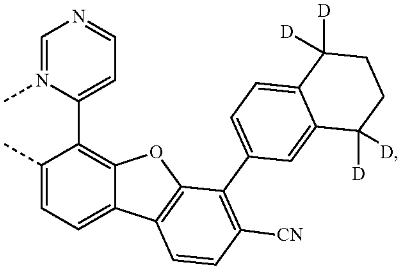
La2-472
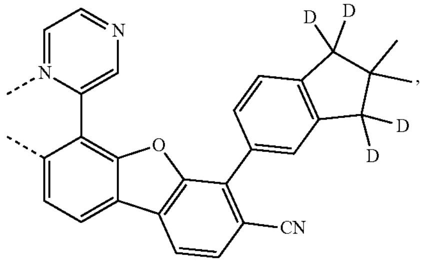
-continued
$L_{a2\text{-}473}$
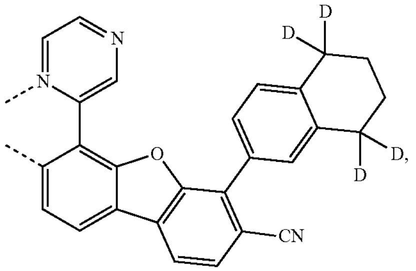
$L_{a2\text{-}475}$
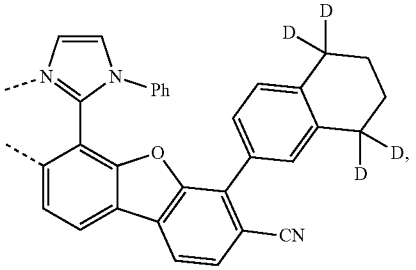
$L_{a2\text{-}476}$
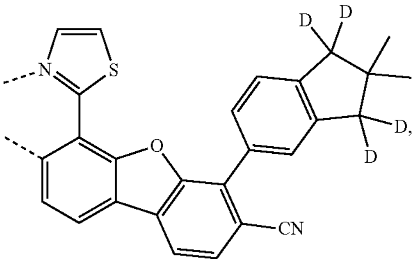
$L_{a2\text{-}477}$
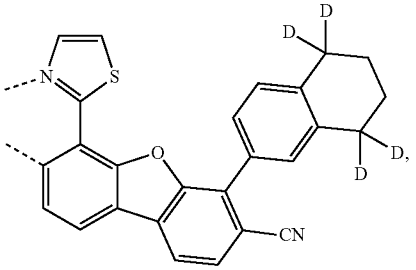
$L_{a2\text{-}478}$
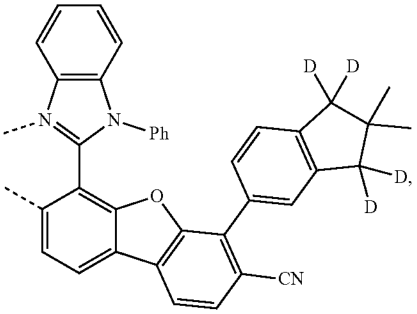

-continued
$L_{a2\text{-}479}$
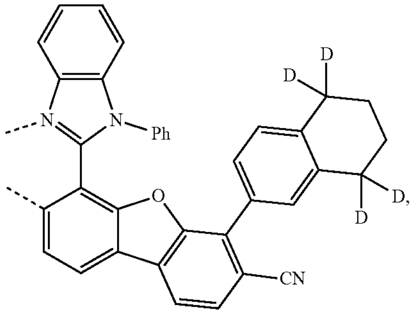
$L_{a2\text{-}480}$
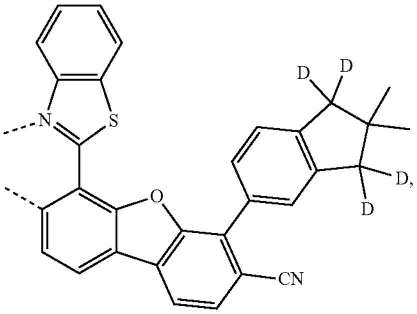
$L_{a2\text{-}481}$
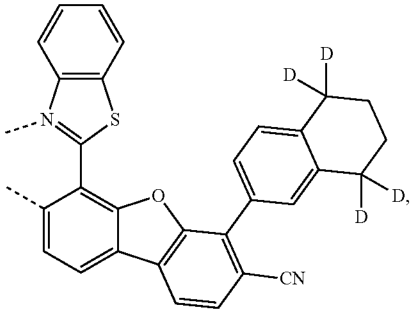
$L_{a2\text{-}482}$
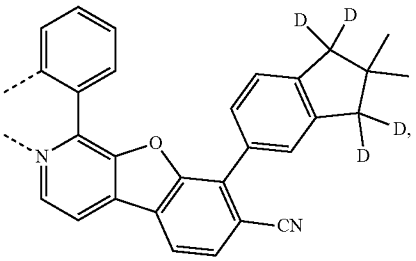
$L_{a2\text{-}483}$
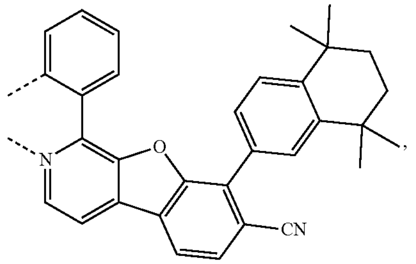
-continued
$L_{a2\text{-}484}$
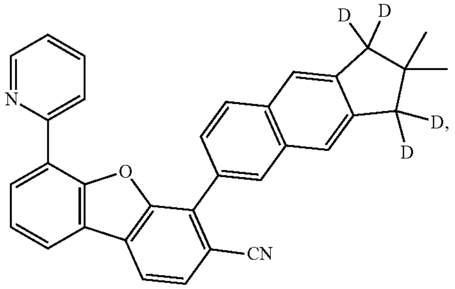
$L_{a2\text{-}485}$
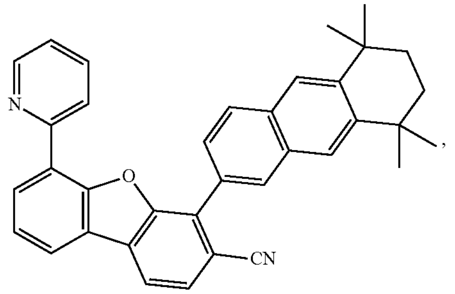
$L_{a3\text{-}5}$
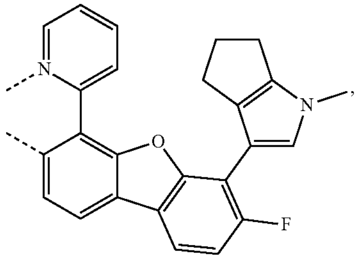
$L_{a3\text{-}6}$
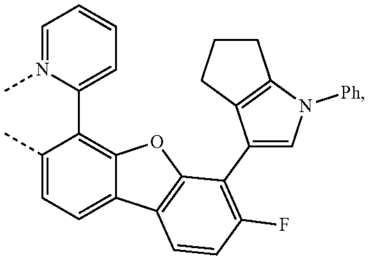
$L_{a3\text{-}7}$
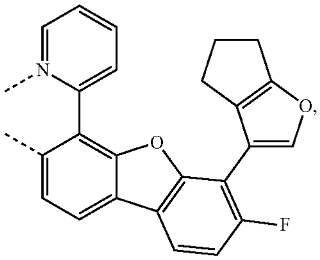

-continued
$L_{a3\text{-}8}$
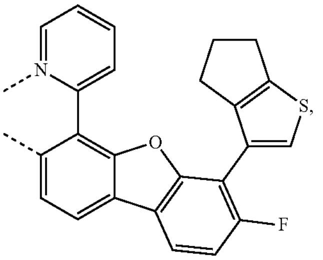
$L_{a3\text{-}9}$
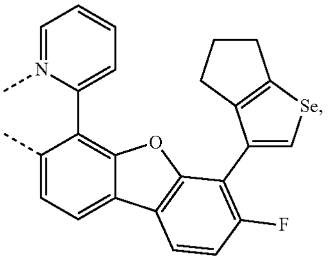
$L_{a3\text{-}10}$
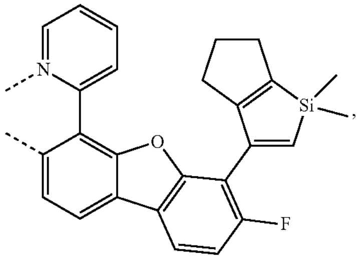
$L_{a3\text{-}11}$
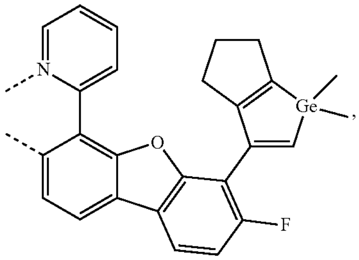
$L_{a3\text{-}16}$
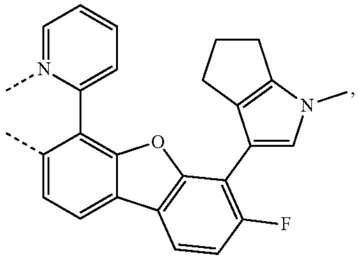
$L_{a3\text{-}17}$
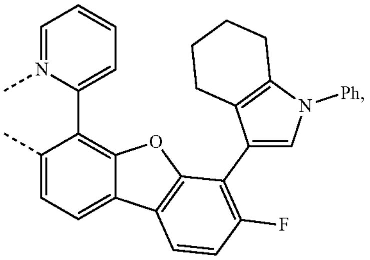
-continued
$L_{a3\text{-}18}$
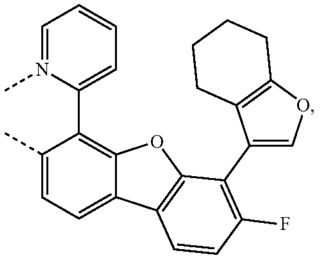
$L_{a3\text{-}19}$
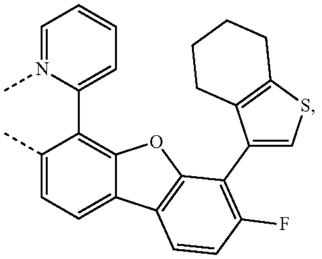
$L_{a3\text{-}20}$
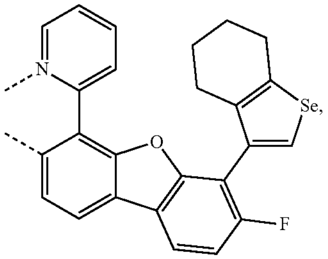
$L_{a3\text{-}21}$
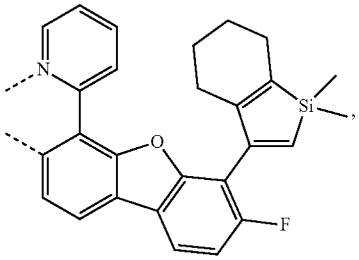
$L_{a3\text{-}22}$
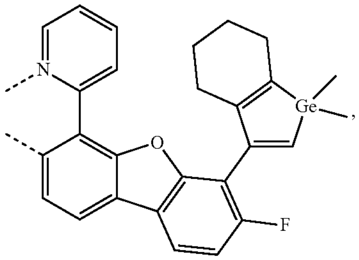
$L_{a3\text{-}27}$
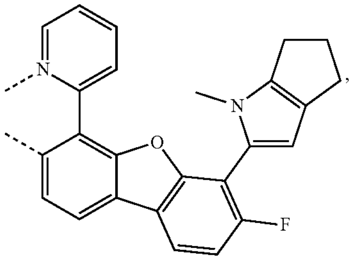

$L_{a3-28}$
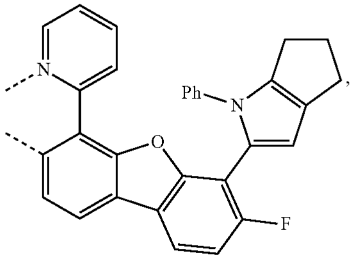
$L_{a3-29}$
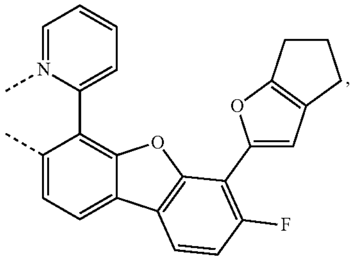
$L_{a3-30}$
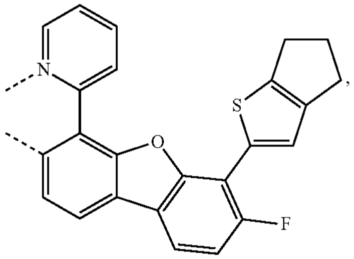
$L_{a3-31}$
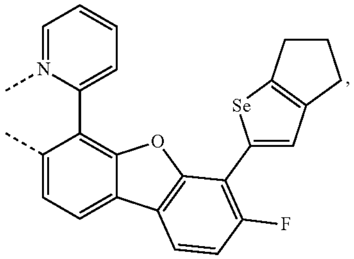
$L_{a3-32}$
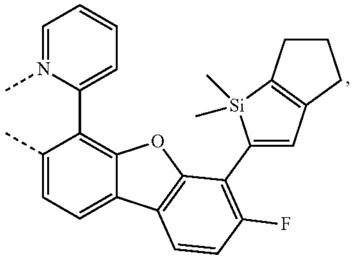
$L_{a3-33}$
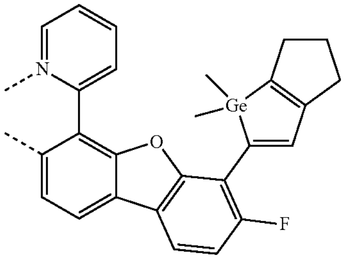
$L_{a3-38}$
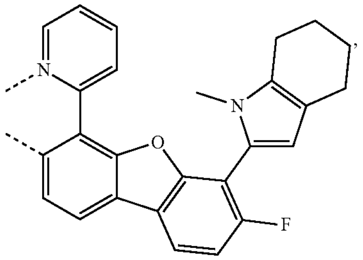
$L_{a3-39}$
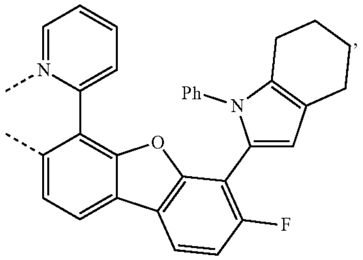
$L_{a3-40}$
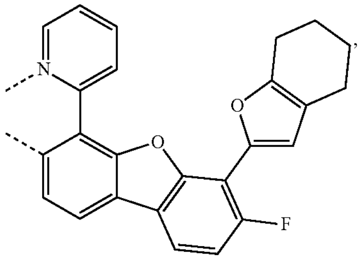
$L_{a3-41}$
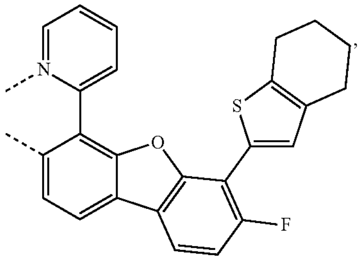
$L_{a3-42}$
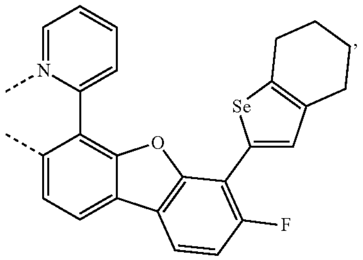
$L_{a3-43}$
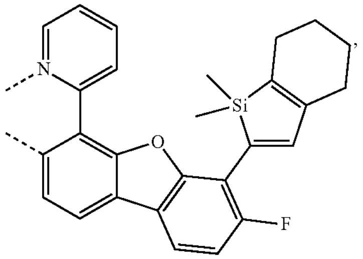

-continued
$L_{a3-44}$
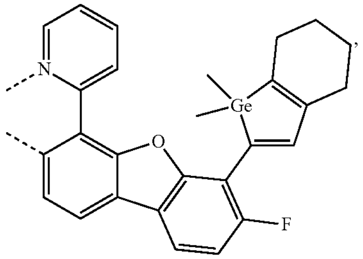
$L_{a3-45}$
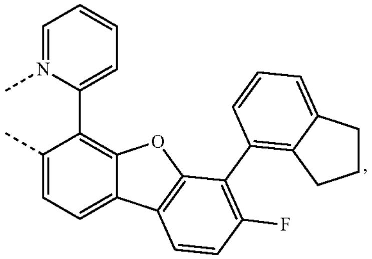
$L_{a3-46}$
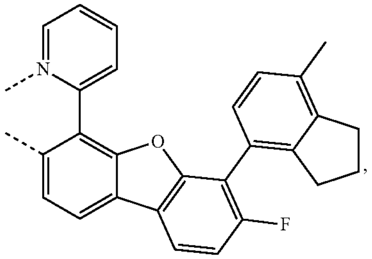
$L_{a3-47}$
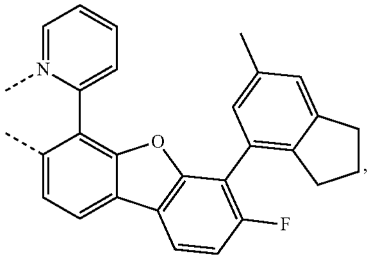
$L_{a3-48}$
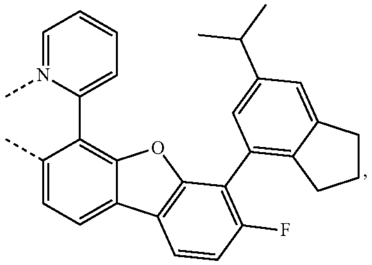
-continued
$L_{a3-49}$
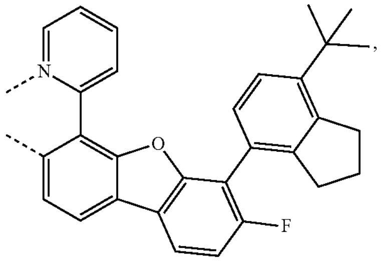
$L_{a3-50}$
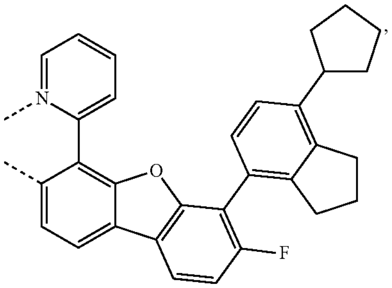
$L_{a3-51}$
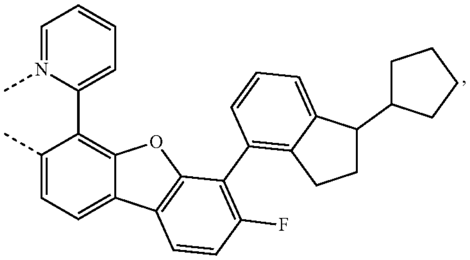
$L_{a3-52}$
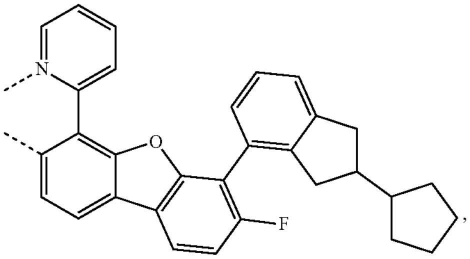
$L_{a3-53}$
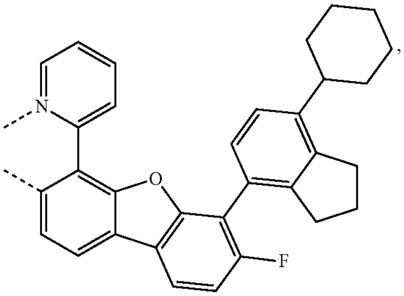

-continued
$L_{a3-54}$
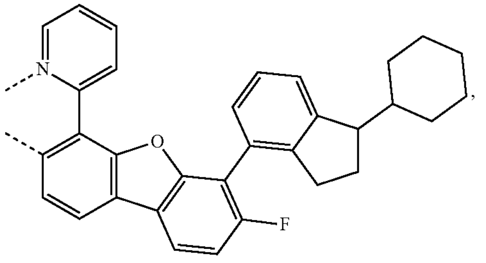
$L_{a3-55}$
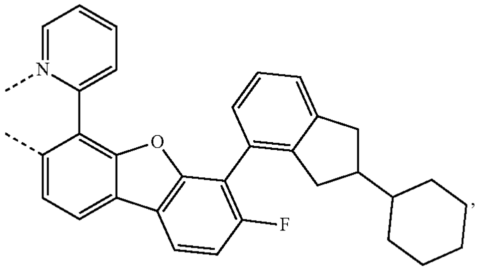
$L_{a3-56}$
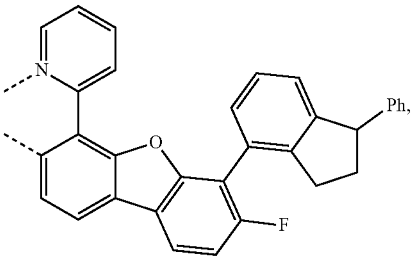
$L_{a3-57}$
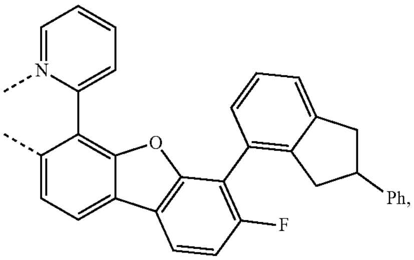
$L_{a3-58}$
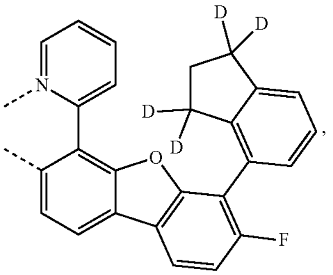
-continued
$L_{a3-59}$
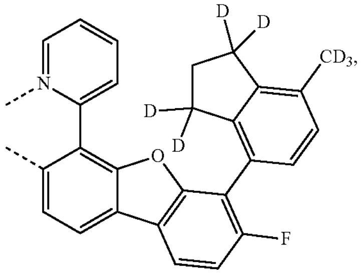
$L_{a3-60}$
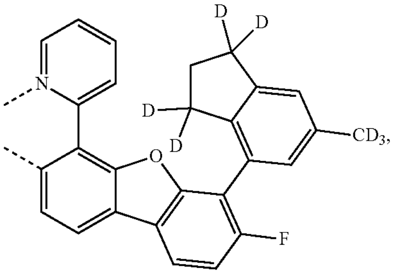
$L_{a3-61}$
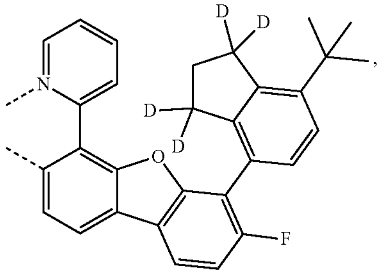
$L_{a3-62}$
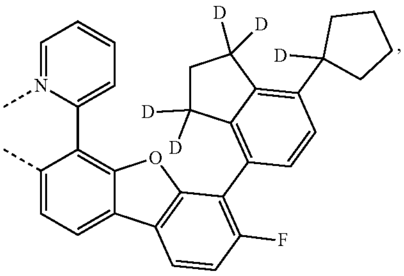
$L_{a3-63}$
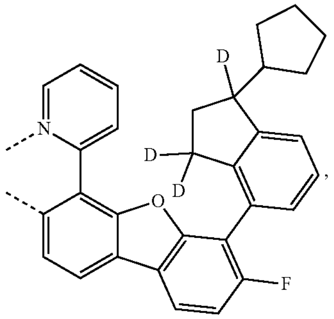

$L_{a3-64}$
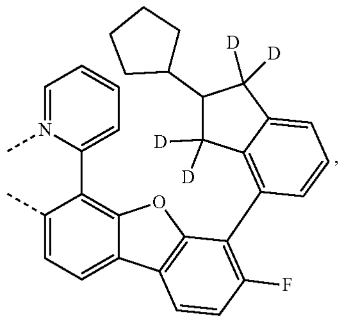
$L_{a3-65}$
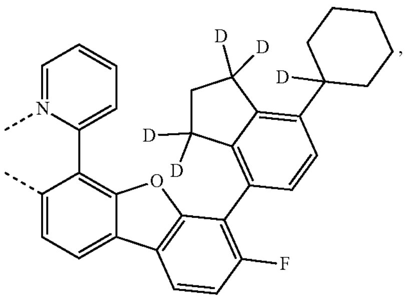
$L_{a3-66}$
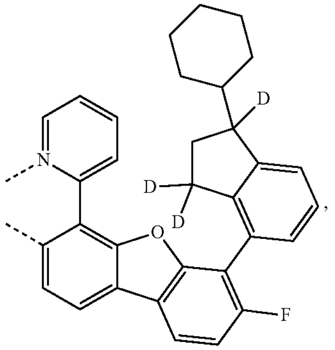
$L_{a3-67}$
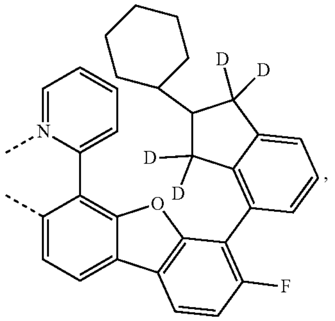
$L_{a3-68}$
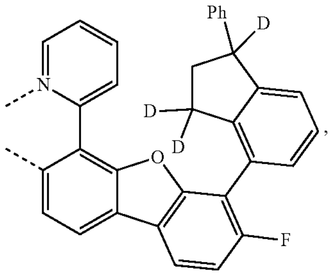
$L_{a3-69}$
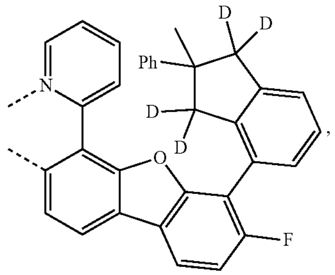
$L_{a3-70}$
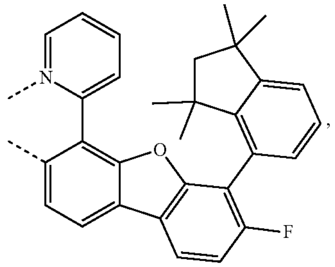
$L_{a3-71}$
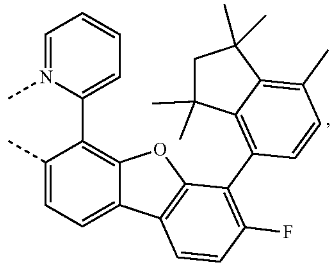
$L_{a3-72}$
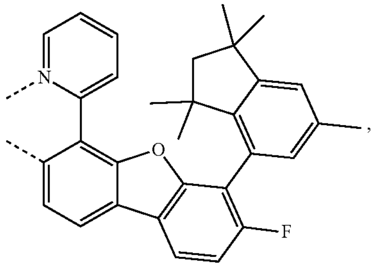
$L_{a3-73}$
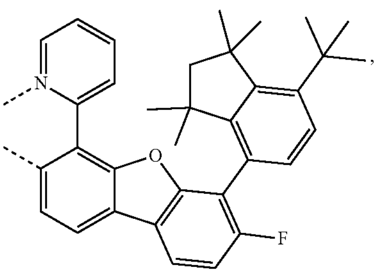

-continued
$L_{a3-74}$
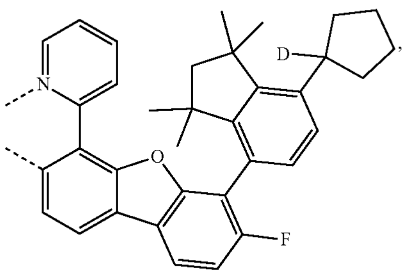
$L_{a3-75}$
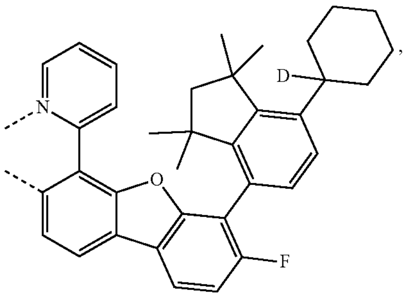
$L_{a3-76}$
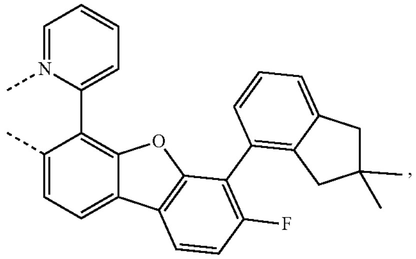
$L_{a3-77}$
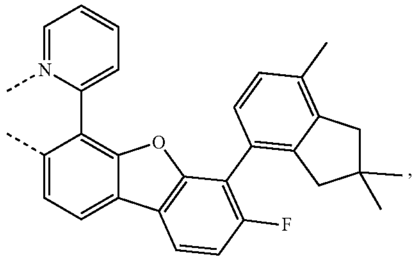
$L_{a3-78}$
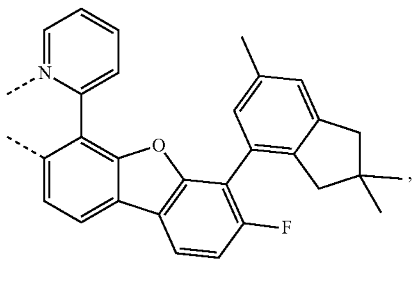
-continued
$L_{a3-79}$
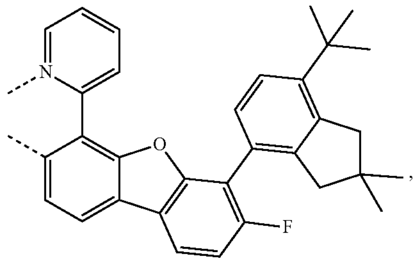
$L_{a3-80}$
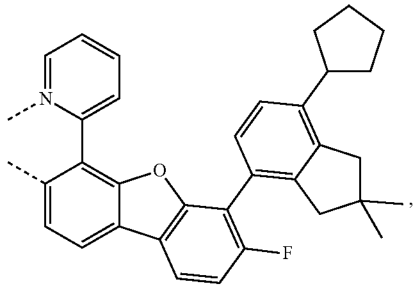
$L_{a3-81}$
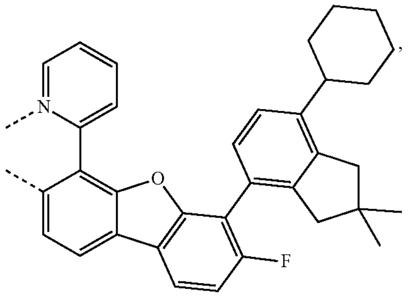
$L_{a3-82}$
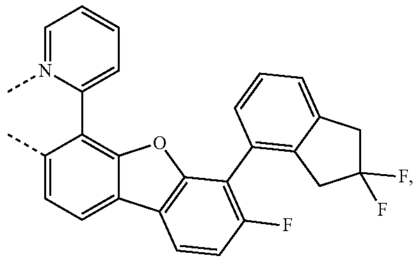
$L_{a3-83}$
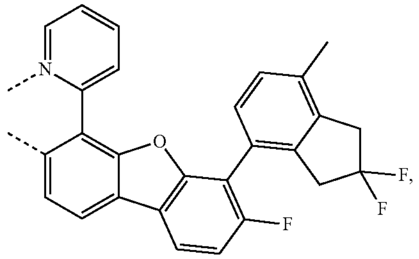

-continued
$L_{a3}$-84
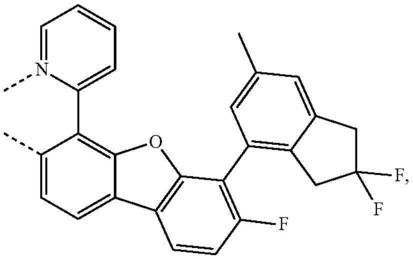
$L_{a3}$-85
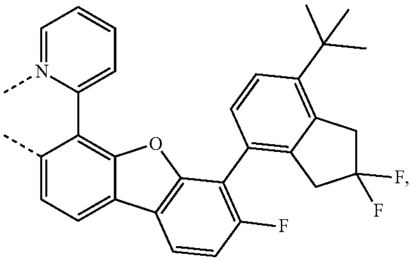
$L_{a3}$-86
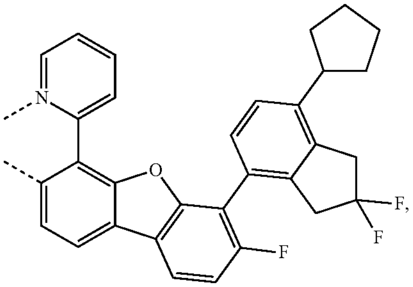
$L_{a3}$-87
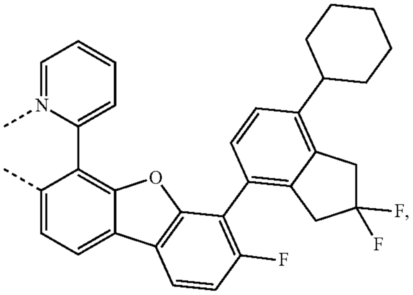
$L_{a3}$-88
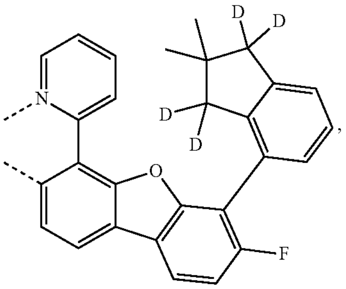
-continued
$L_{a3}$-89
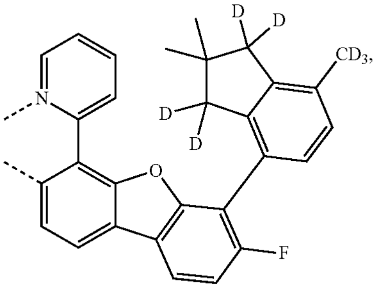
$L_{a3}$-90
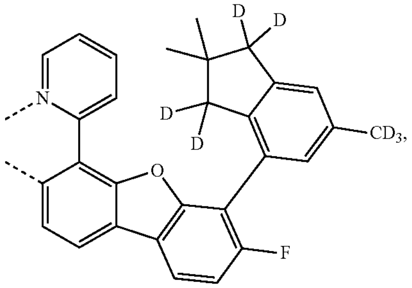
$L_{a3}$-91
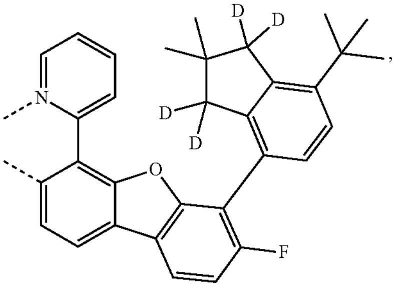
$L_{a3}$-92
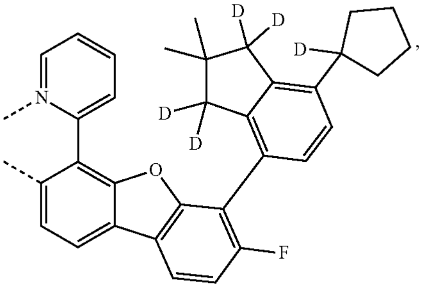
$L_{a3}$-93
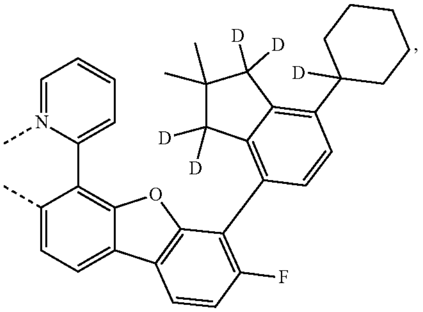

-continued
$L_{a3-94}$
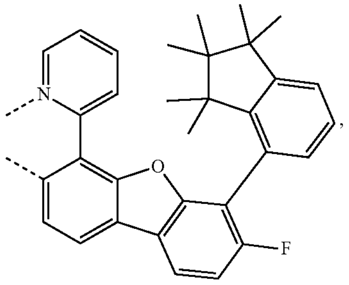
$L_{a3-95}$
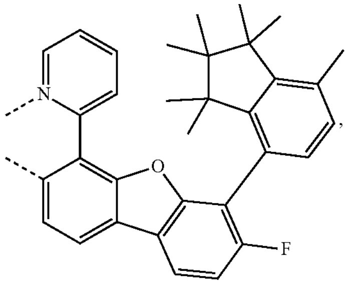
$L_{a3-96}$
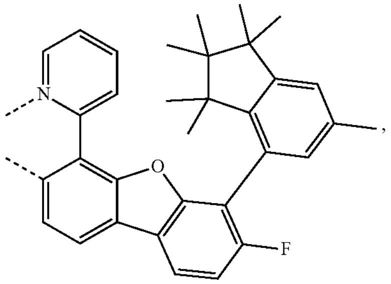
$L_{a3-97}$
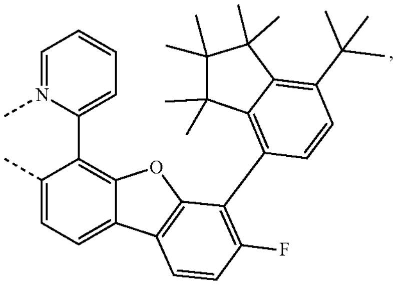
$L_{a3-98}$
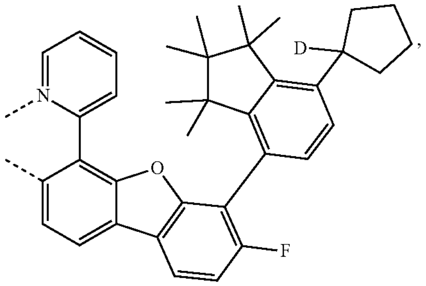
-continued
$L_{a3-99}$
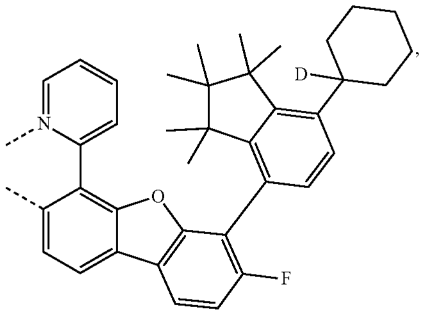
$L_{a3-133}$
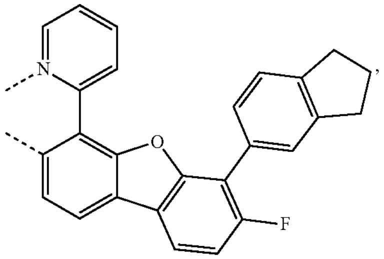
$L_{a3-134}$
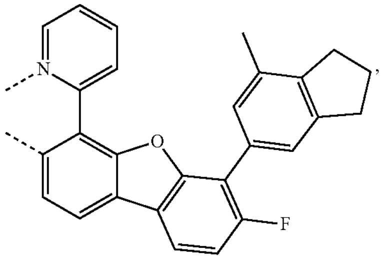
$L_{a3-135}$
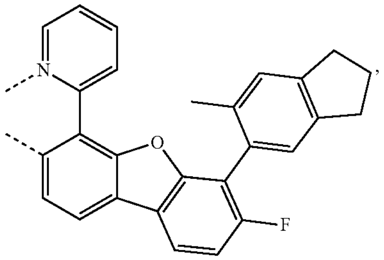
$L_{a3-136}$
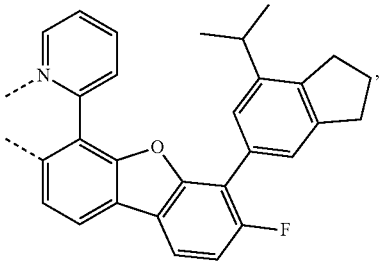

-continued
$L_{a3}$-137
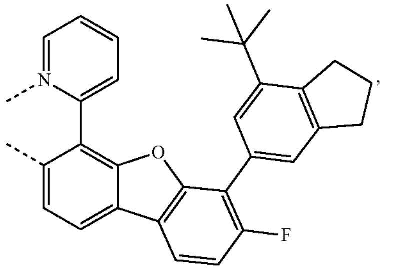
$L_{a3}$-138
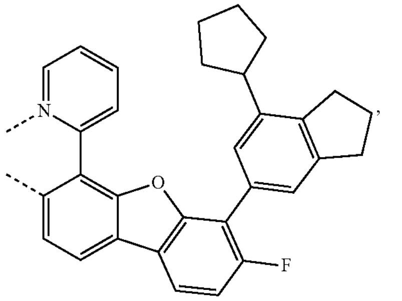
$L_{a3}$-139
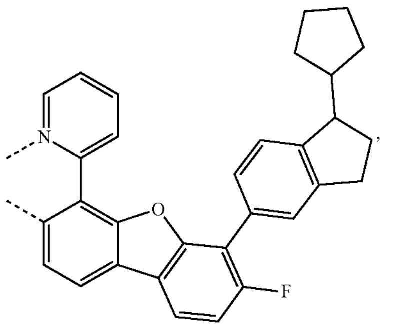
$L_{a3}$-140
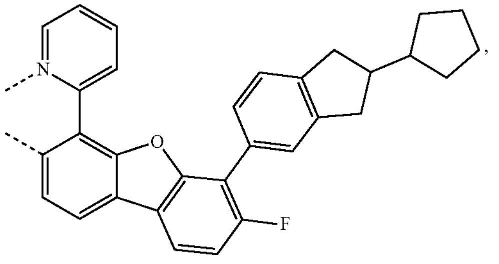
$L_{a3}$-141
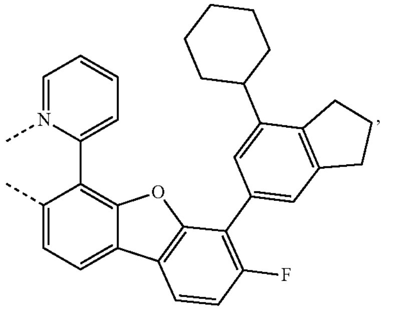
-continued
$L_{a3}$-142
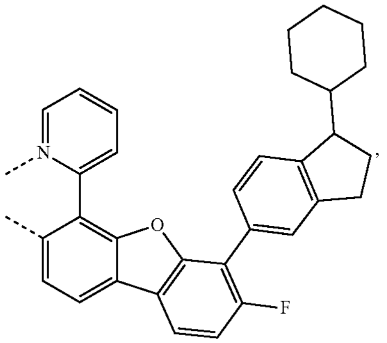
$L_{a3}$-143
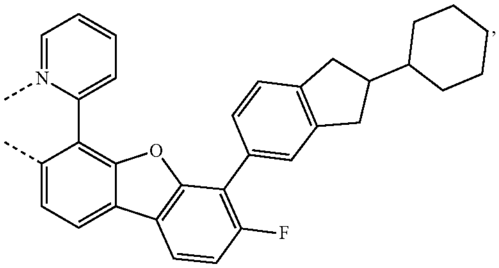
$L_{a3}$-144
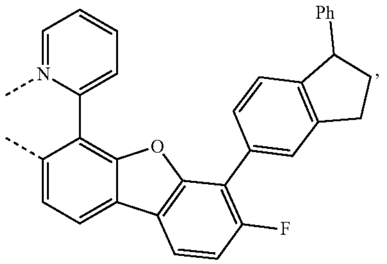
$L_{a3}$-145
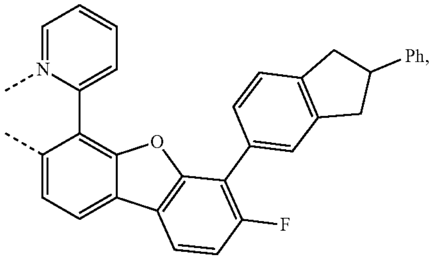
$L_{a3}$-146
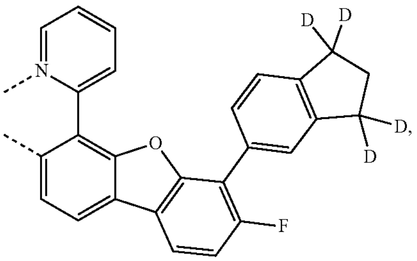

-continued
L$_{a3}$-147
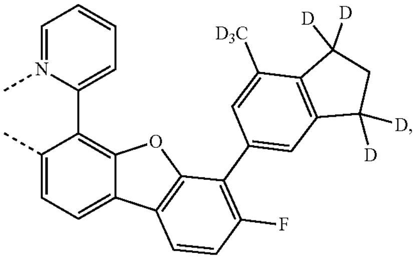
L$_{a3}$-148
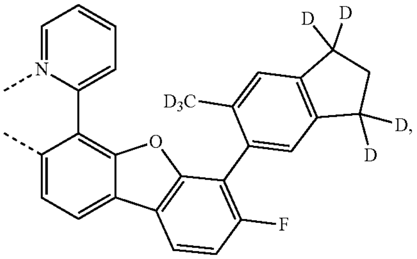
L$_{a3}$-149
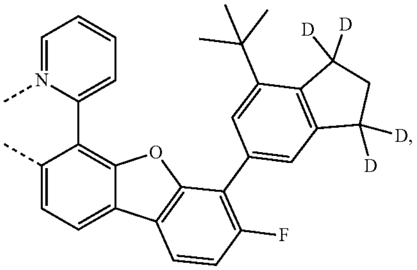
L$_{a3}$-150
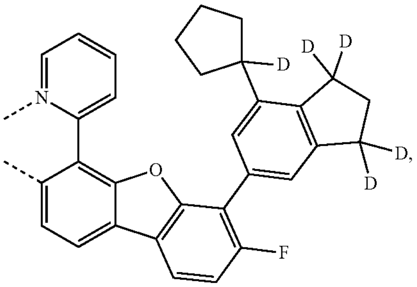
L$_{a3}$-151
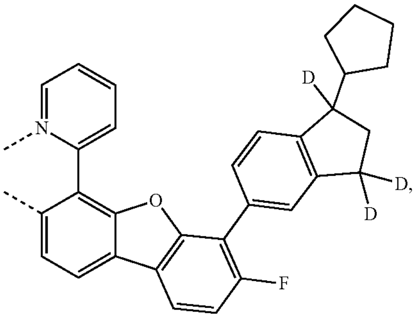
-continued
L$_{a3}$-152
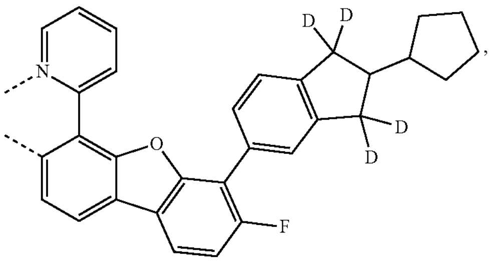
L$_{a3}$-153
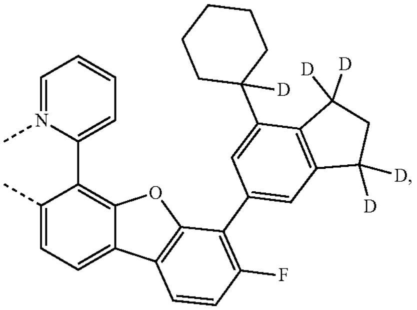
L$_{a3}$-154
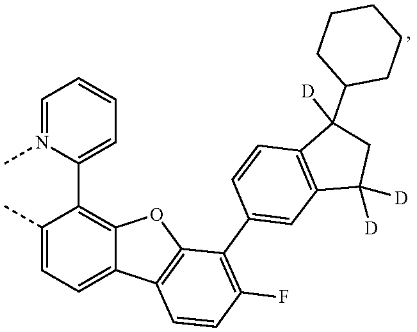
L$_{a3}$-155
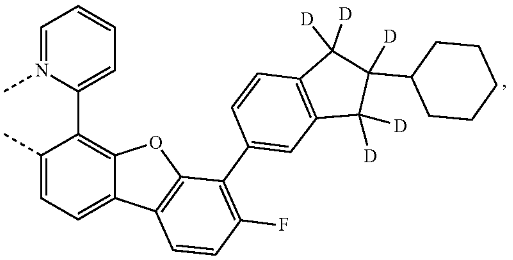
L$_{a3}$-156
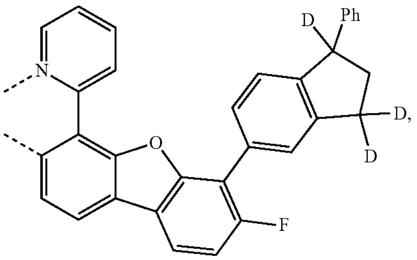

$L_{a3}$-157
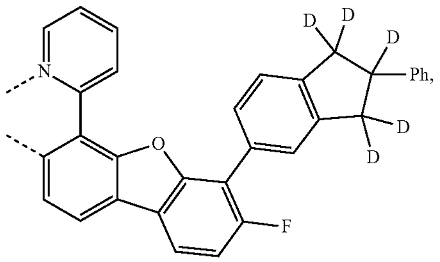
$L_{a3}$-158
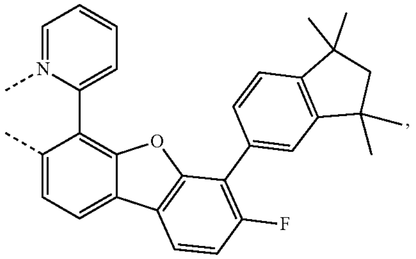
$L_{a3}$-159
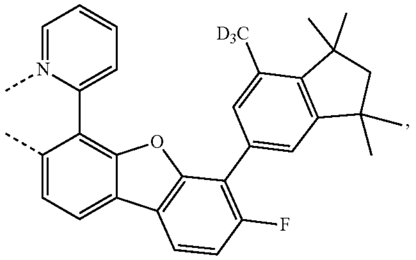
$L_{a3}$-160
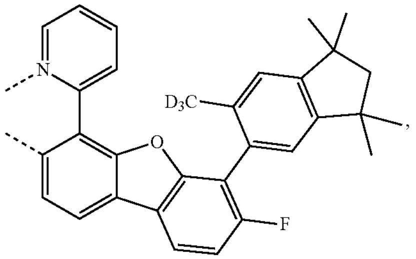
$L_{a3}$-161
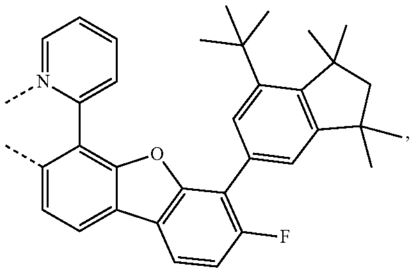
$L_{a3}$-162
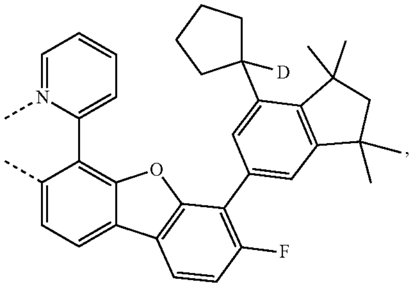
$L_{a3}$-163
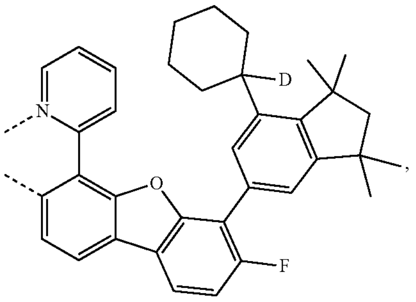
$L_{a3}$-164
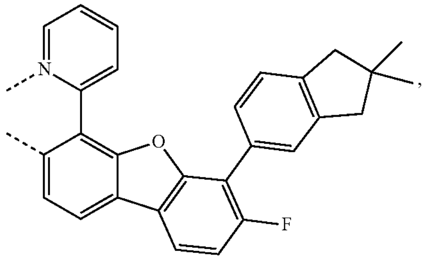
$L_{a3}$-165
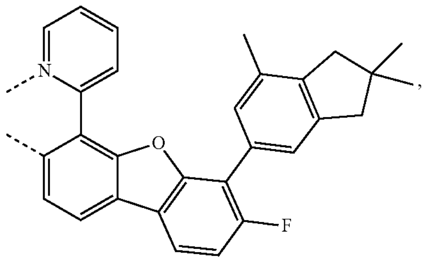
$L_{a3}$-166
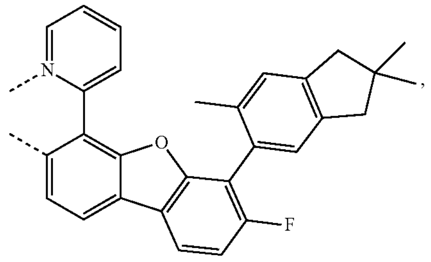

-continued
$L_{a3}$-167
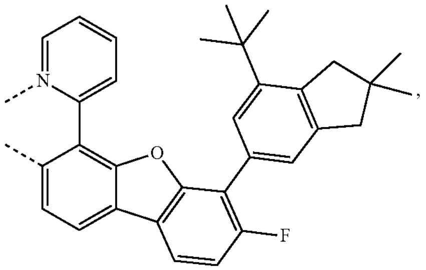
$L_{a3}$-168
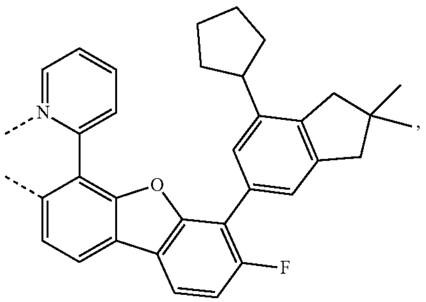
$L_{a3}$-169
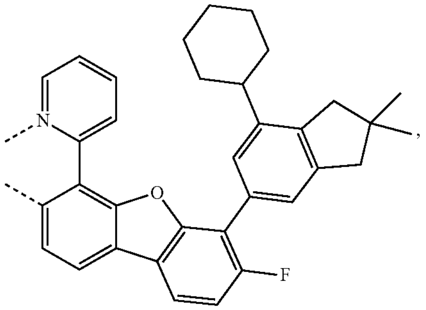
$L_{a3}$-170
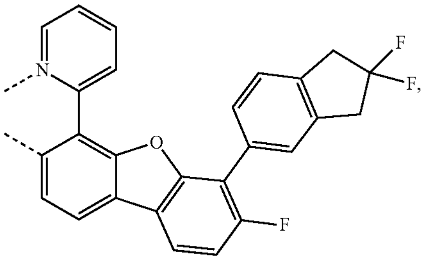
$L_{a3}$-171
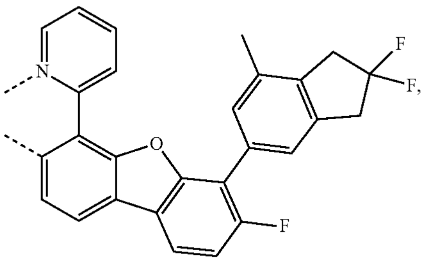
-continued
$L_{a3}$-172
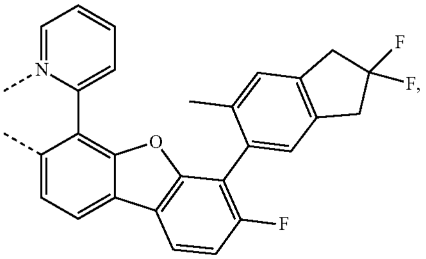
$L_{a3}$-173
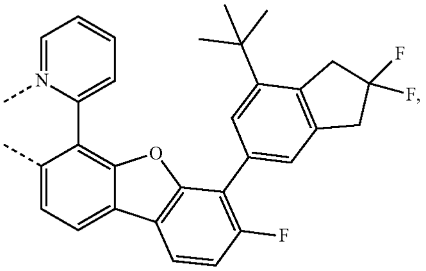
$L_{a3}$-174
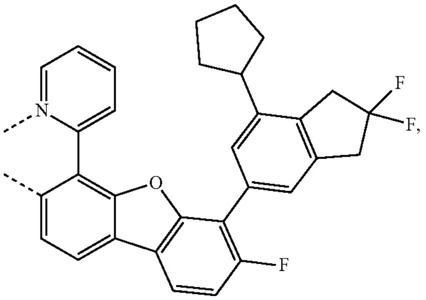
$L_{a3}$-175
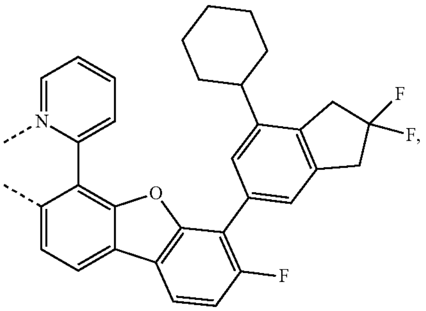
$L_{a3}$-176
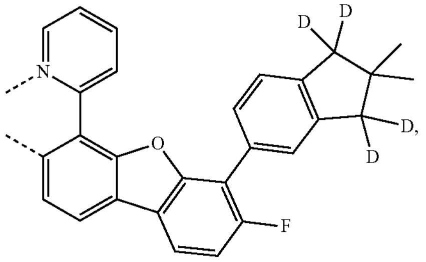

-continued
$L_{a3}$-177
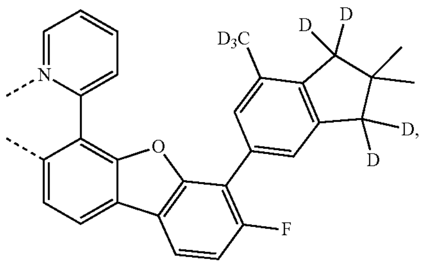
$L_{a3}$-178
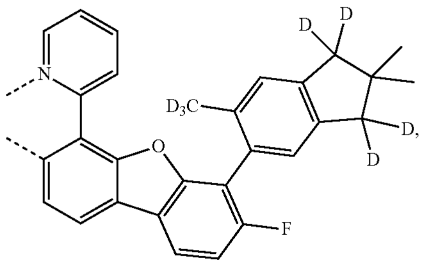
$L_{a3}$-179
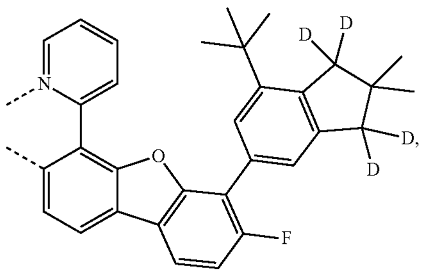
$L_{a3}$-180
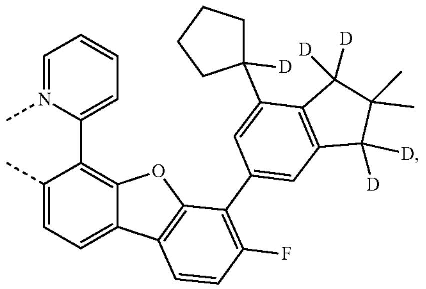
$L_{a3}$-181
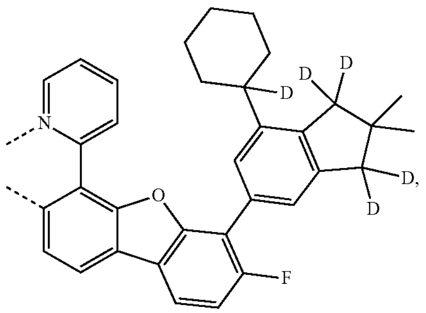
-continued
$L_{a3}$-182
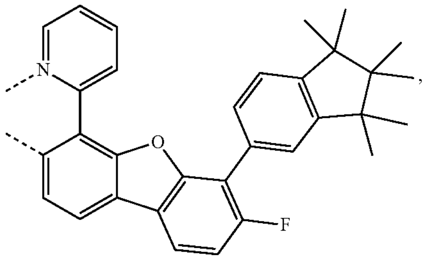
$L_{a3}$-183
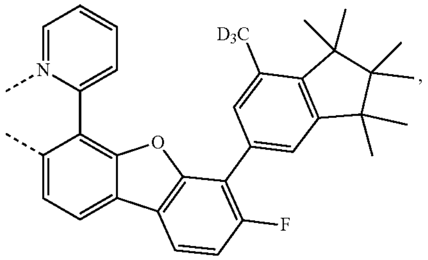
$L_{a3}$-184
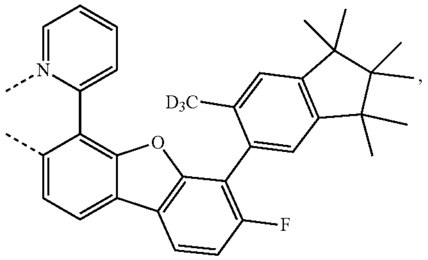
$L_{a3}$-185
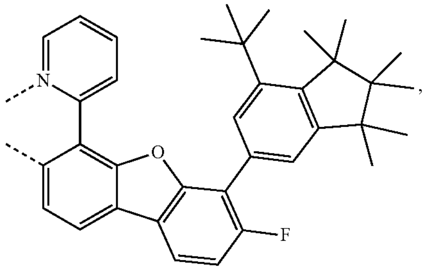
$L_{a3}$-186
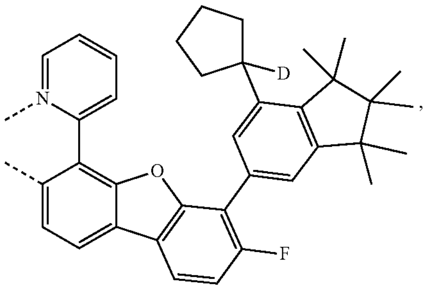

-continued
$L_{a3}$-187
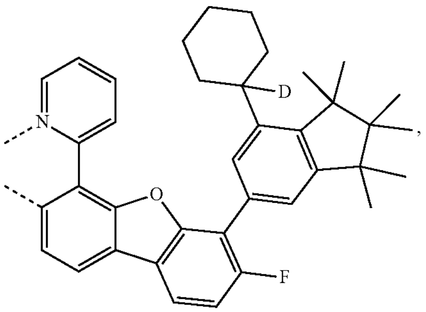
$L_{a3}$-221
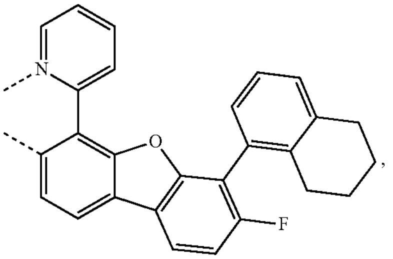
$L_{a}$-222
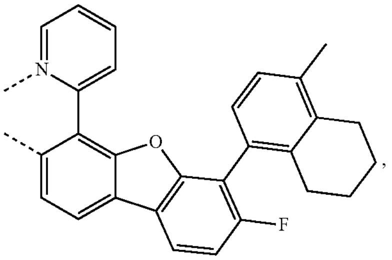
$L_{a3}$-223
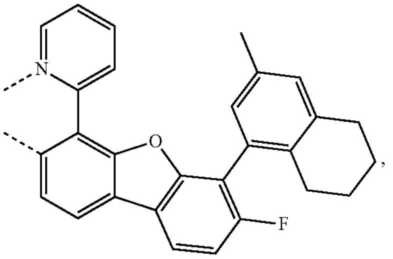
$L_{a3}$-224
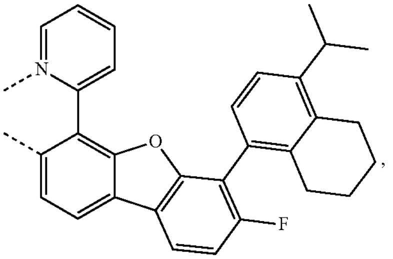
-continued
$L_{a3}$-225
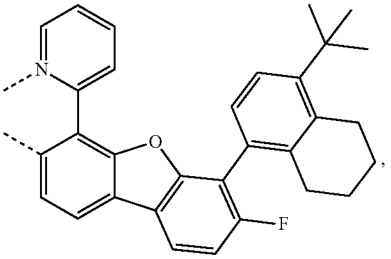
$L_{a3}$-226
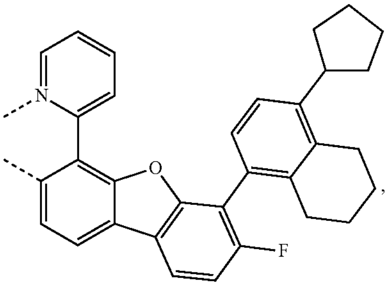
$L_{a3}$-227
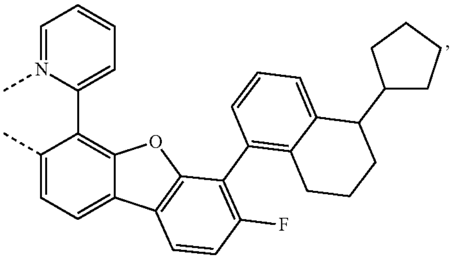
$L_{a3}$-228
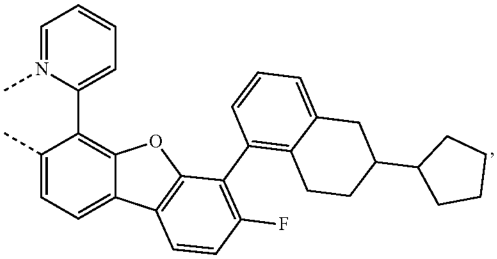
$L_{a3}$-229
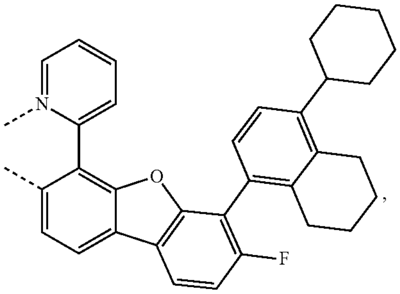

-continued
$L_{a3-230}$
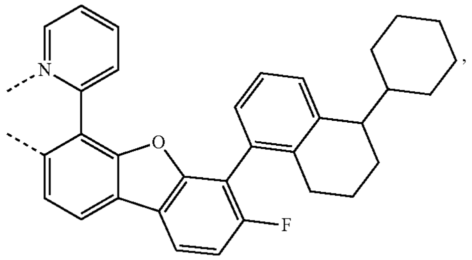
$L_{a3-231}$
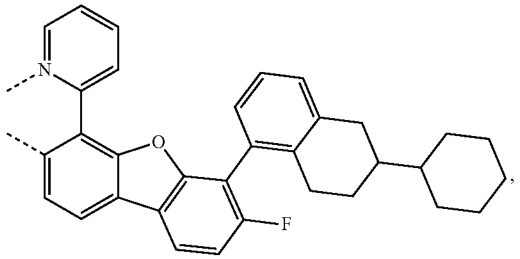
$L_{a3-232}$
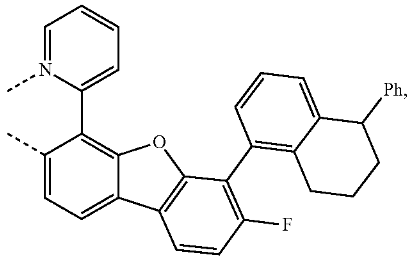
$L_{a3-233}$
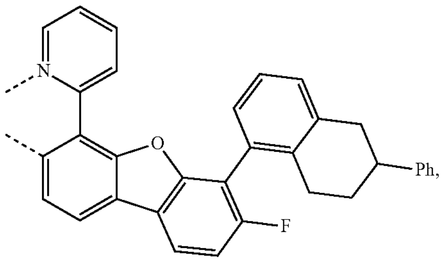
$L_{a3-234}$
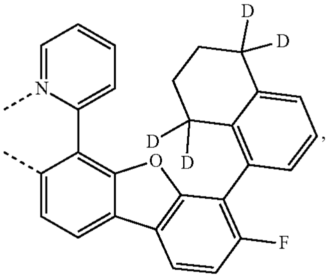
-continued
$L_{a3-235}$
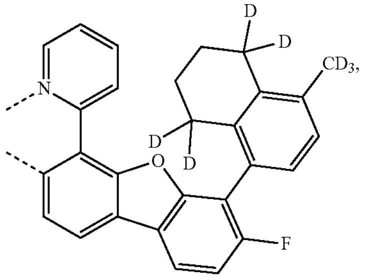
$L_{a3-236}$
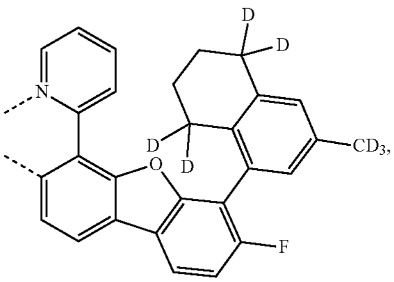
$L_{a3-237}$
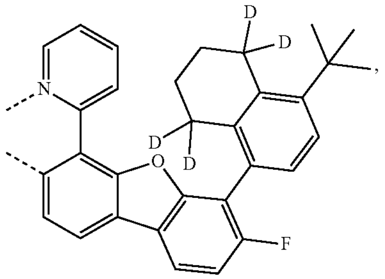
$L_{a3-238}$
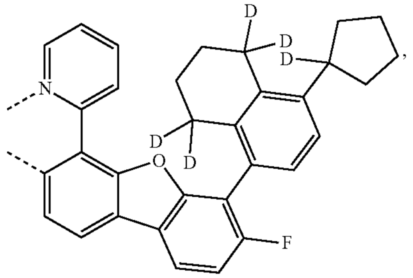
$L_{a3-239}$
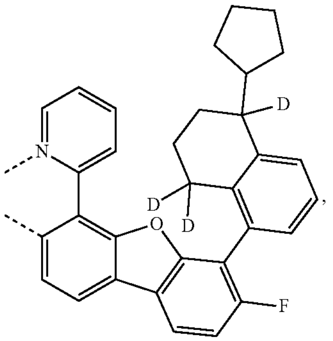

-continued
$L_{a3}$-240
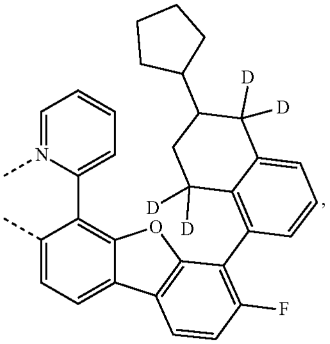
$L_{a3}$-241
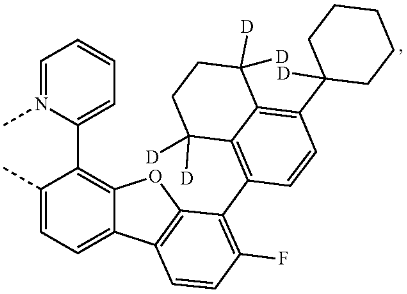
$L_{a3}$-242
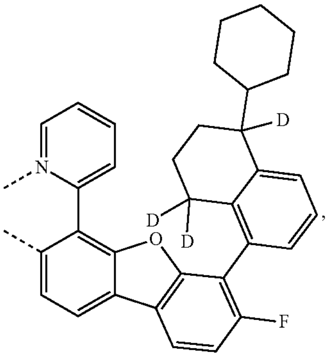
$L_{a3}$-243
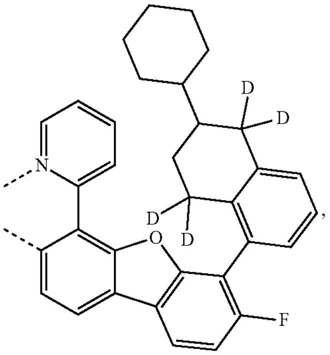
-continued
$L_{a3}$-244
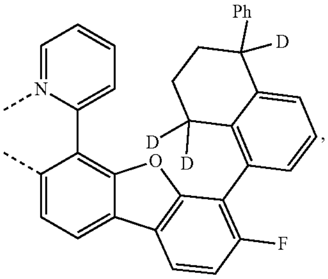
$L_{a3}$-245
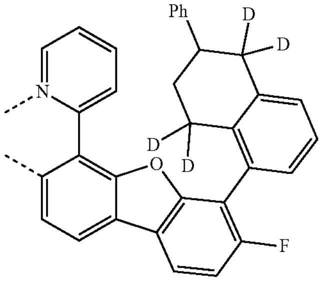
$L_{a3}$-246
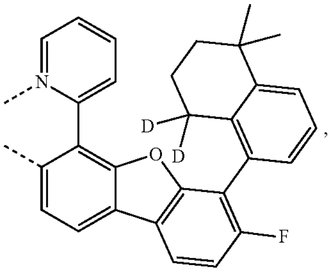
$L_{a3}$-247
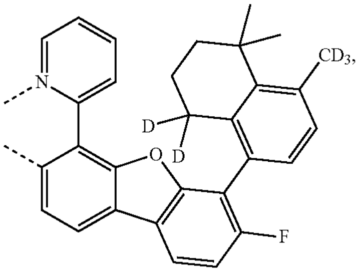
$L_{a3}$-248
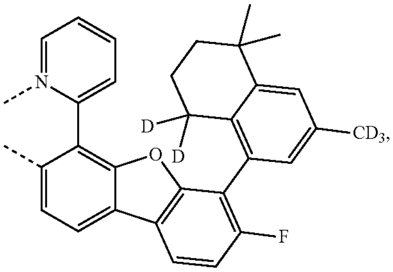

-continued
$L_{a3-249}$
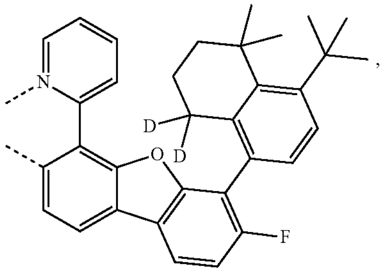
$L_{a3-250}$
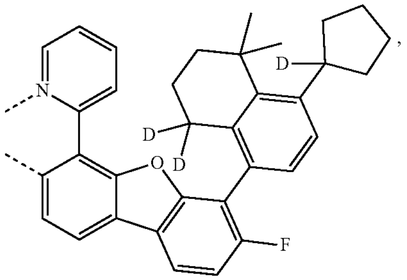
$L_{a3-251}$
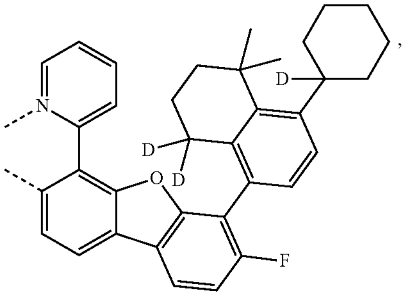
$L_{a3-252}$
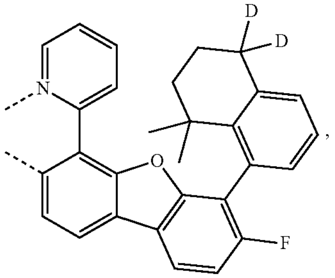
$L_{a3-253}$
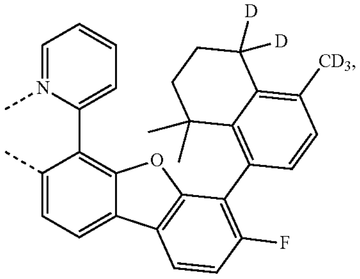
-continued
$L_{a3-254}$
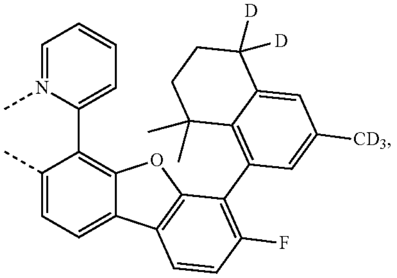
$L_{a3-255}$
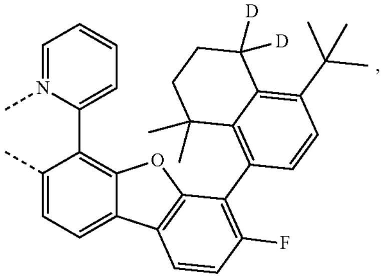
$L_{a3-256}$
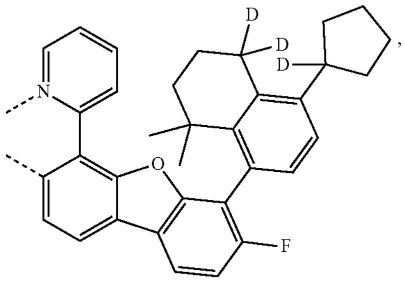
La3-257
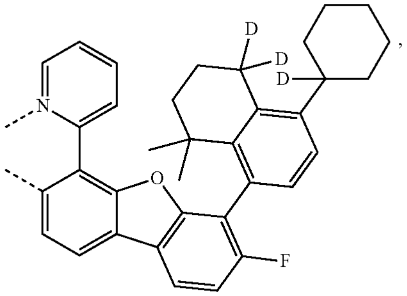
La3-258
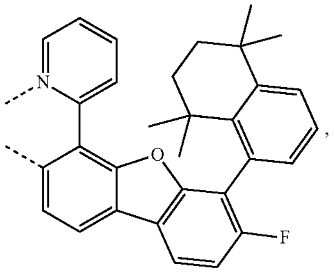

-continued
La3-259
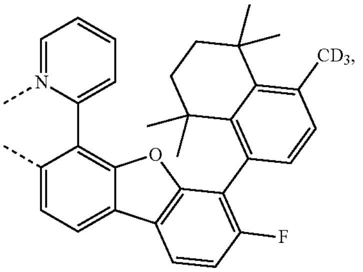
La3-260
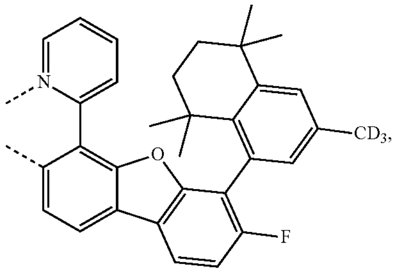
La3-261
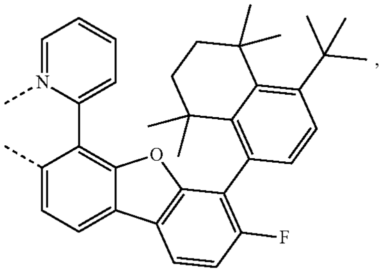
La3-262
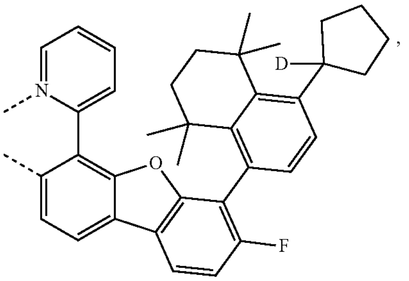
La3-263
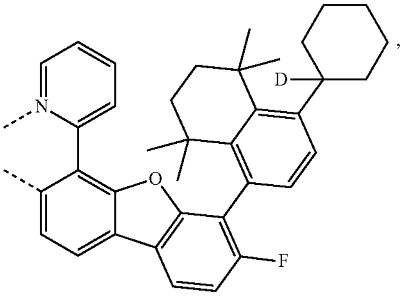
-continued
La3-264
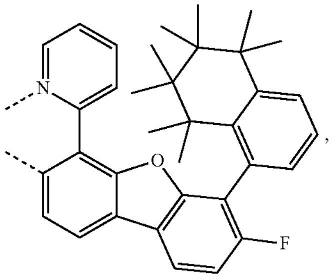
La3-265
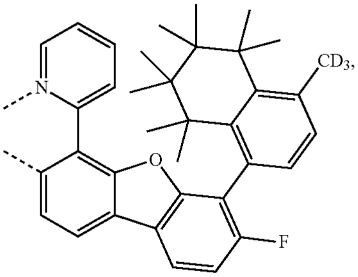
La3-266
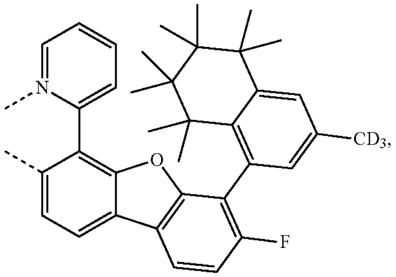
La3-267
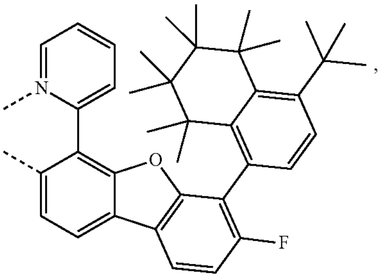
La3-268
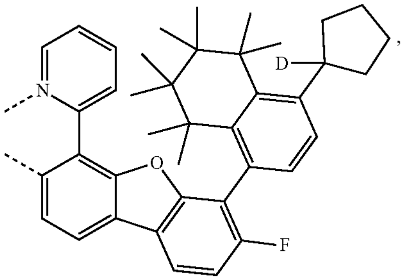

-continued
La3-269
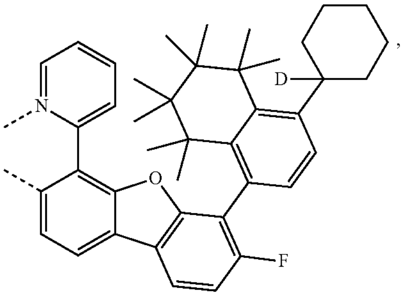
La3-270
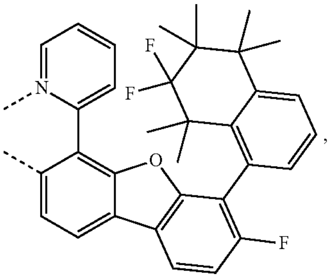
La3-271
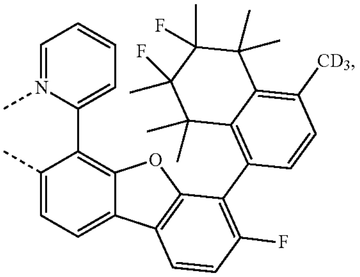
$L_{a3}$-272
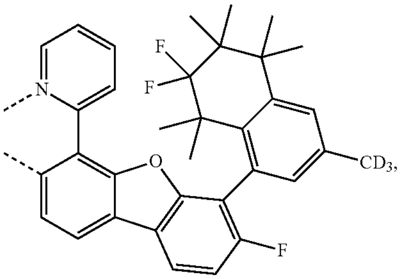
$L_{a3}$-273
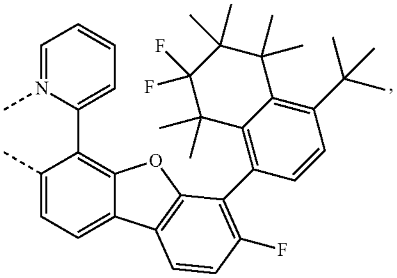
-continued
$L_{a3}$-274
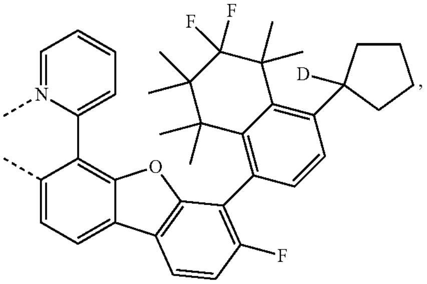
$L_{a3}$-275
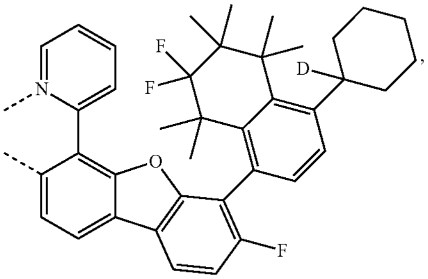
$L_{a3}$-308
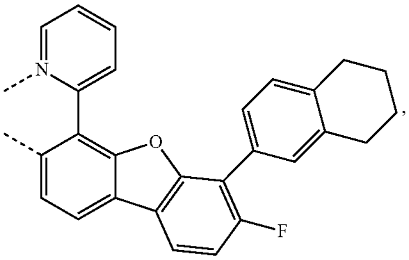
$L_{a3}$-309
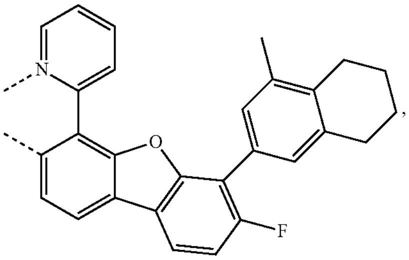
$L_{a3}$-310
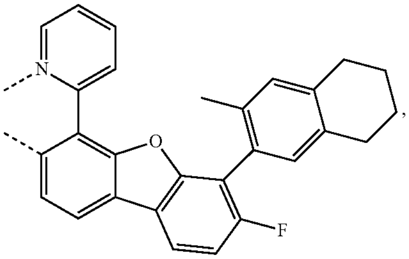

-continued
$L_{a3-311}$
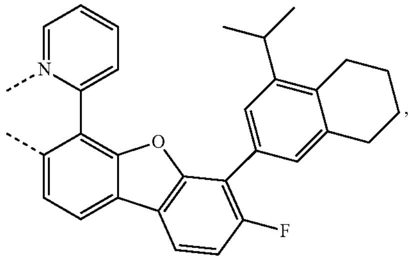
$L_{a3-312}$
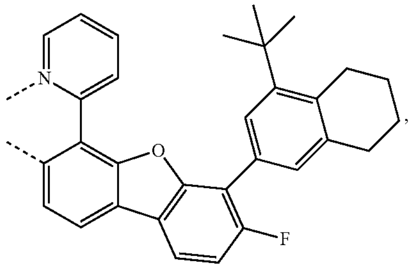
$L_{a3-313}$
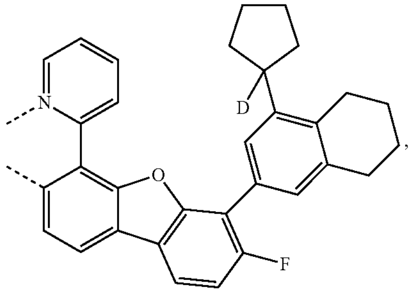
$L_{a3-314}$
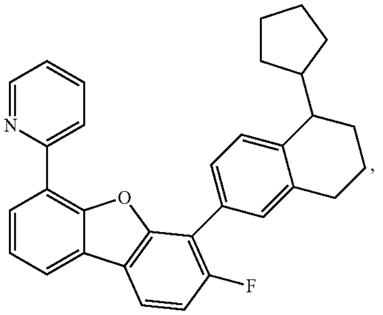
$L_{a3-315}$
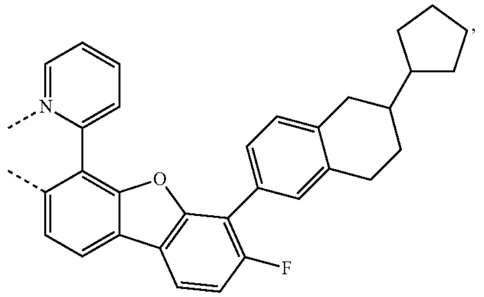
-continued
$L_{a3-316}$
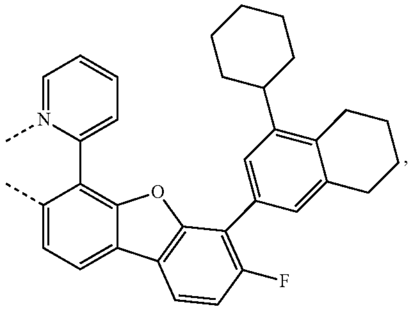
$L_{a3-317}$
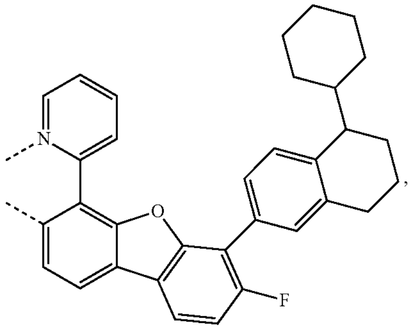
$L_{a3-318}$
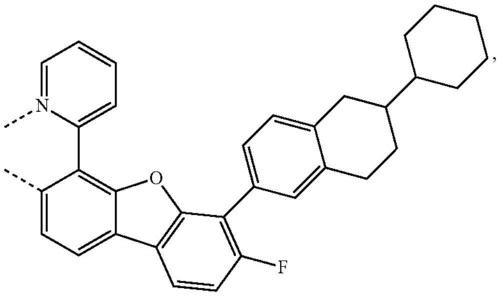
$L_{a3-319}$
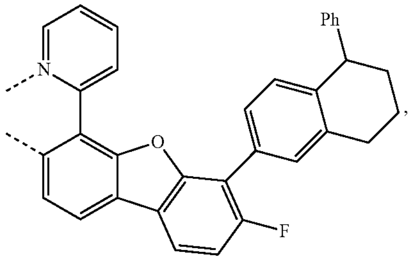
$L_{a3-320}$
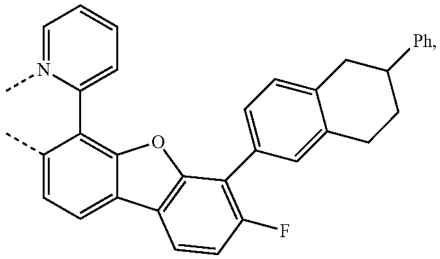

-continued
$L_{a3}$-321
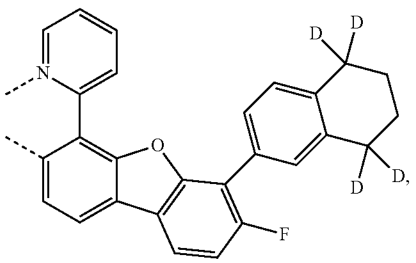
$L_{a3}$-322
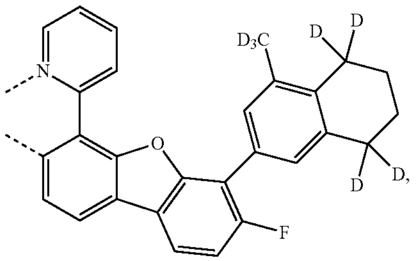
$L_{a3}$-323
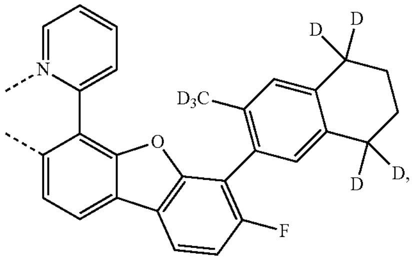
$L_{a3}$-324
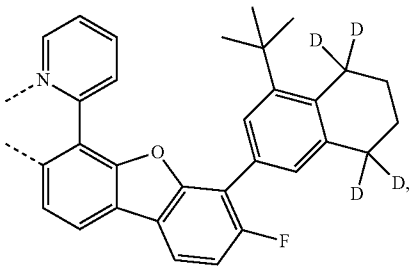
$L_{a3}$-325
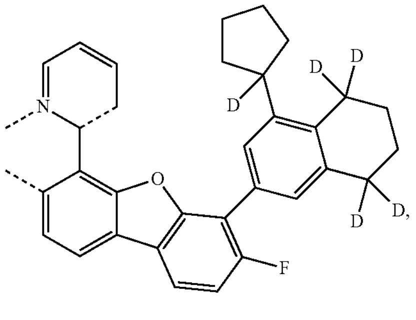
-continued
$L_{a3}$-326
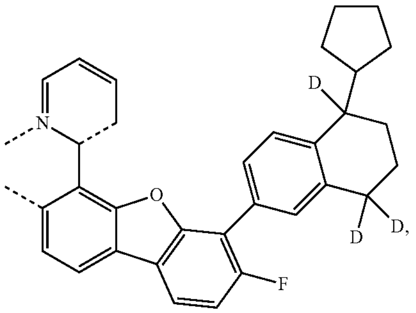
$L_{a3}$-327
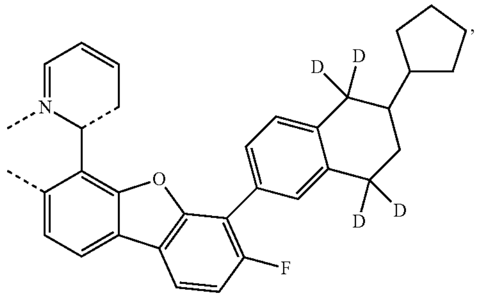
$L_{a3}$-328
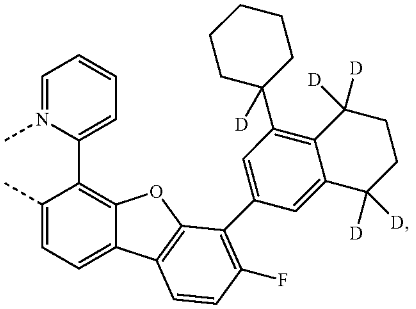
$L_{a3}$-329
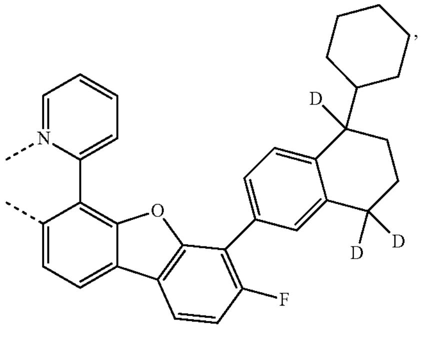
$L_{a3}$-330
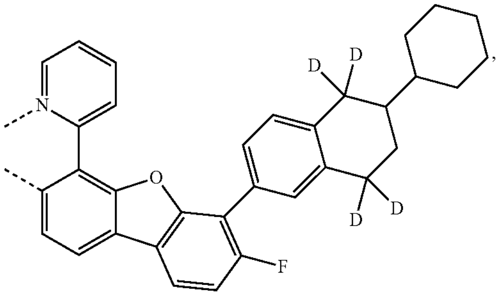

-continued
$L_{a3}$-331
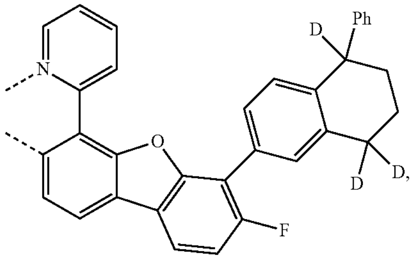
$L_{a3}$-332
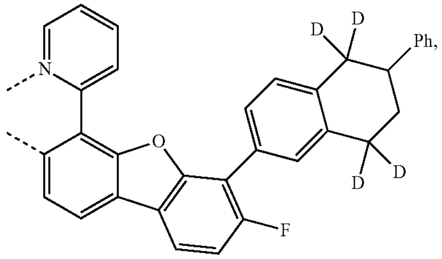
$L_{a3}$-333
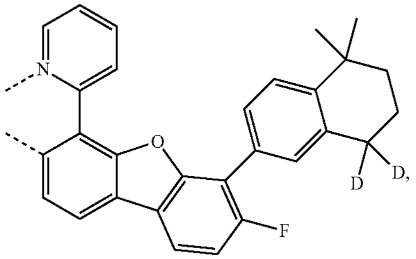
$L_{a3}$-334
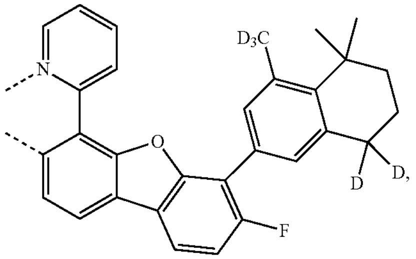
$L_{a3}$-335
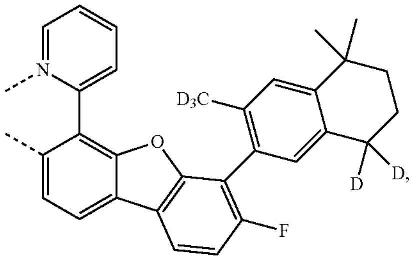
$L_{a3}$-336
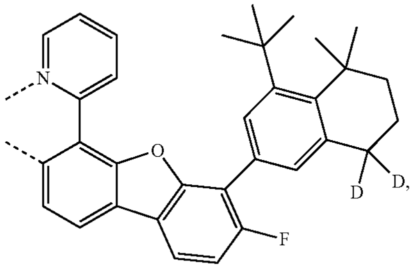
-continued
$L_{a3}$-337
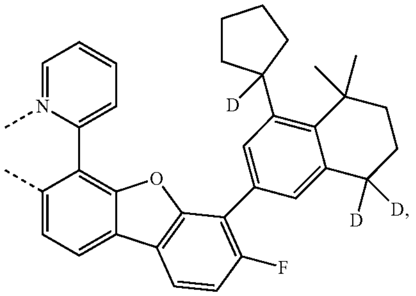
$L_{a3}$-338
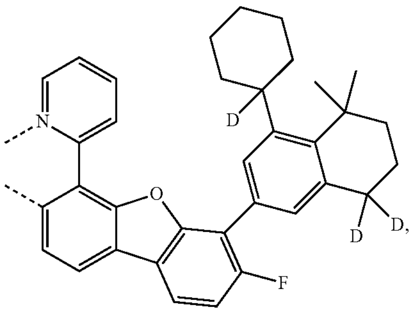
$L_{a3}$-339
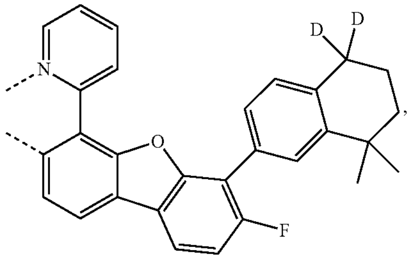
$L_{a3}$-340
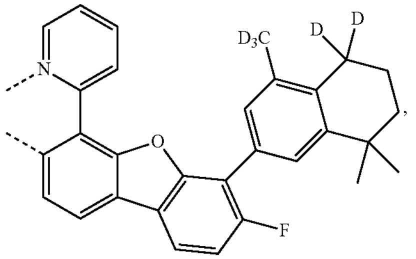
$L_{a3}$-341
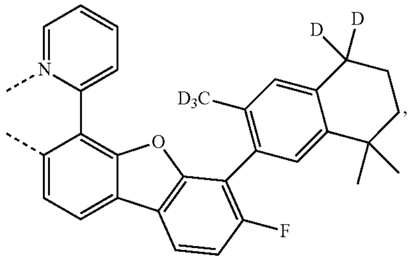

-continued
L$_{a3}$-342
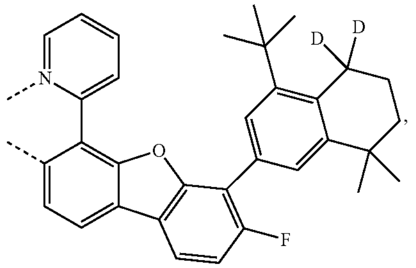
L$_{a3}$-343
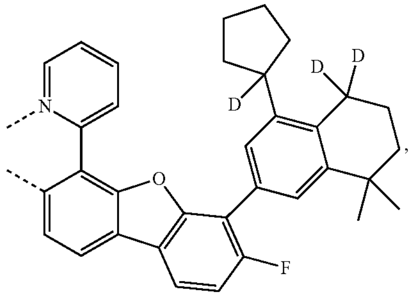
L$_{a3}$-344
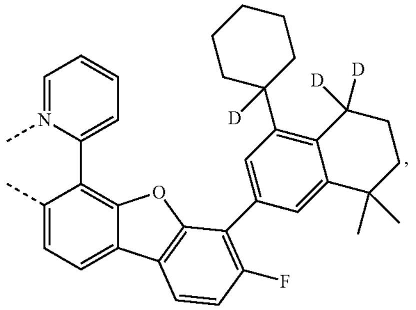
L$_{a3}$-345
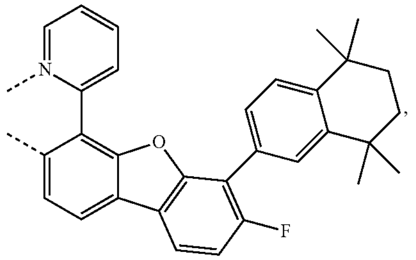
L$_{a3}$-346
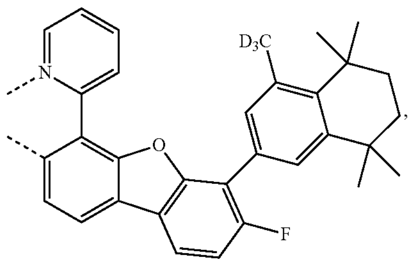
-continued
L$_{a3}$-347
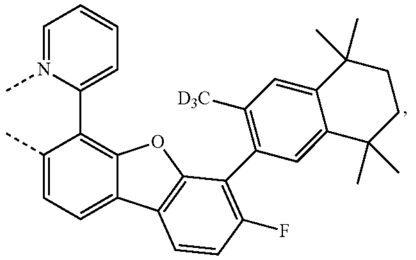
L$_{a3}$-348
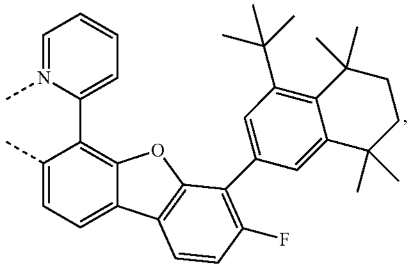
L$_{a3}$-349
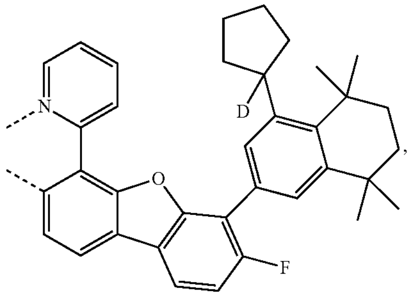
L$_{a3}$-350
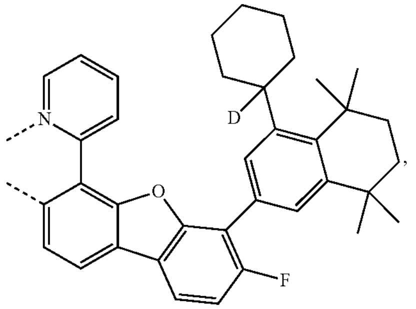
L$_{a3}$-351
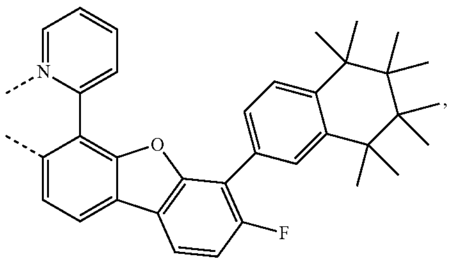

$L_{a3-352}$
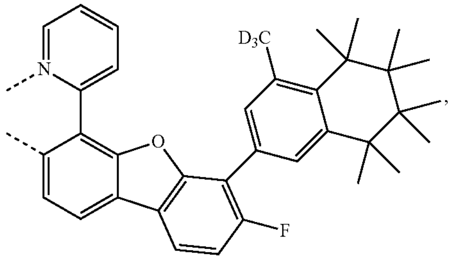
$L_{a3-353}$
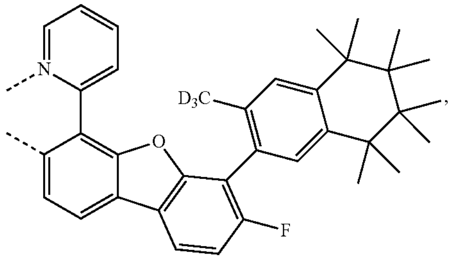
$L_{a3-354}$
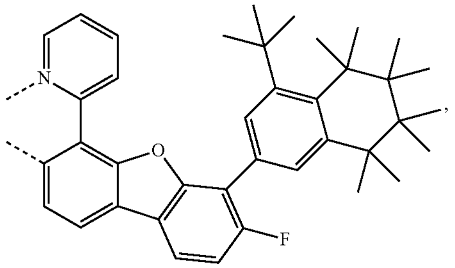
$L_{a3-355}$
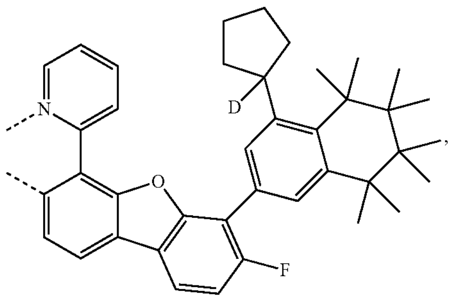
$L_{a3-356}$
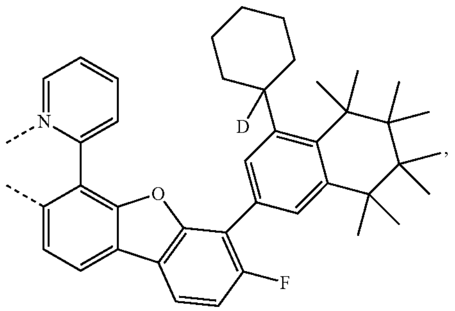
$L_{a3-357}$
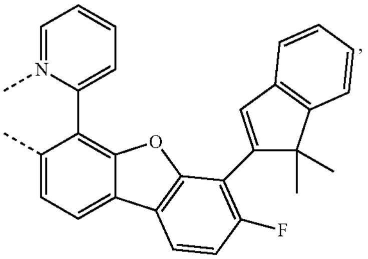
$L_{a3-358}$
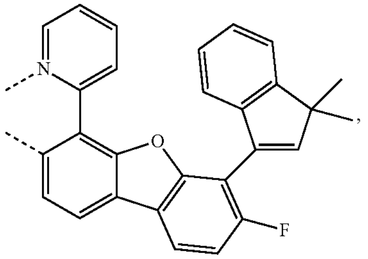
$L_{a3-359}$
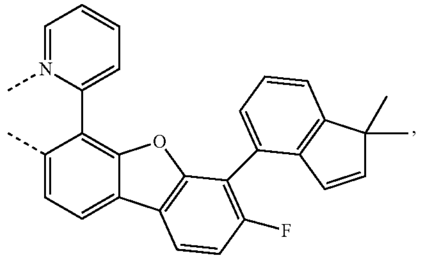
$L_{a3-360}$
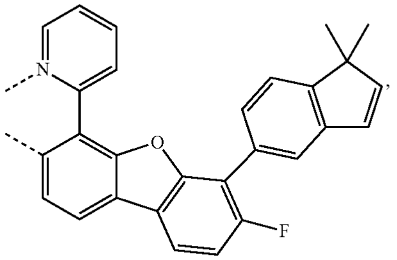
$L_{a3-361}$
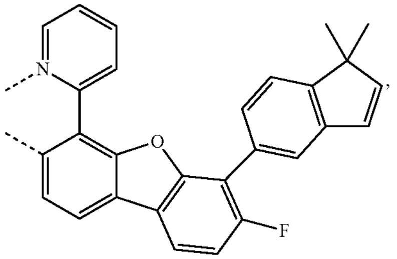
$L_{a3-362}$
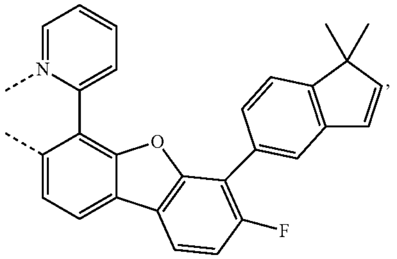

-continued
L$_{a3}$-395
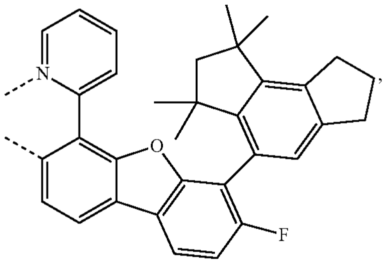
L$_{a3}$-398
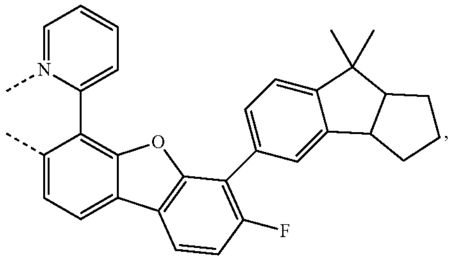
L$_{a3}$-400
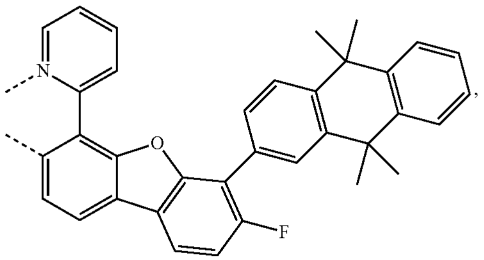
L$_{a3}$-414
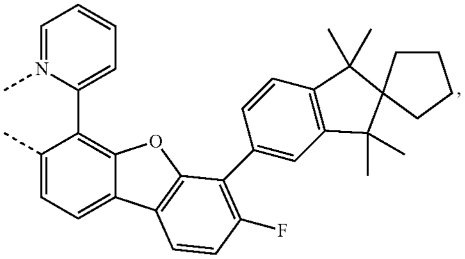
L$_{a3}$-415
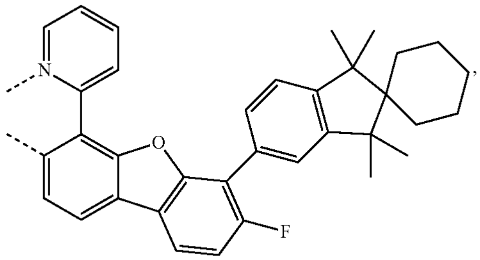
L$_{a3}$-416
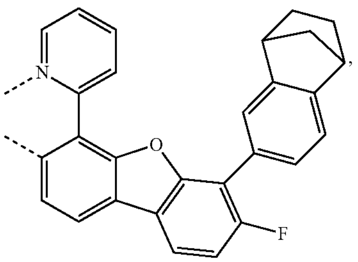
-continued
L$_{a3}$-417
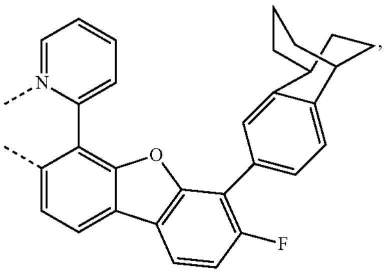
L$_{a3}$-418
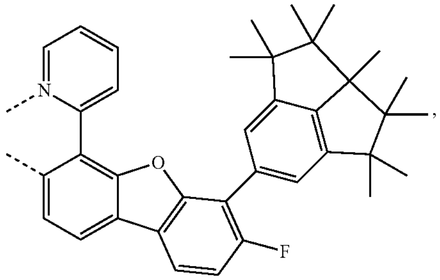
L$_{a3}$-419
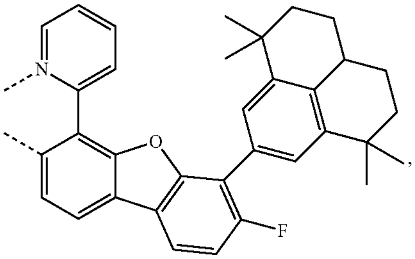
L$_{a3}$-438
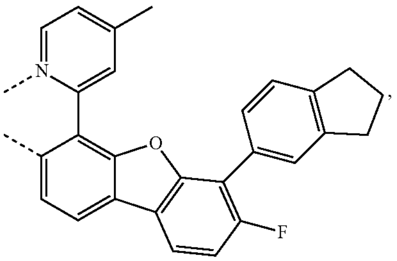
L$_{a3}$-439
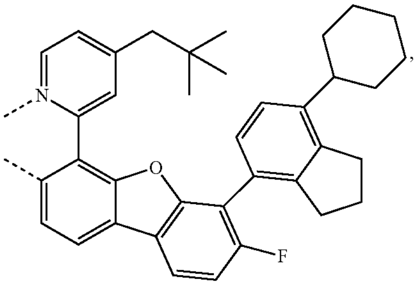

L_{a3-440}
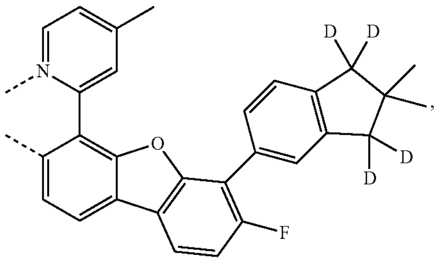
L_{a3-441}
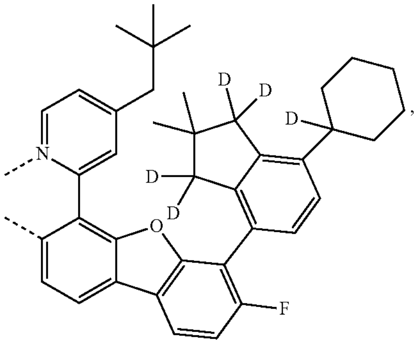
L_{a3-442}
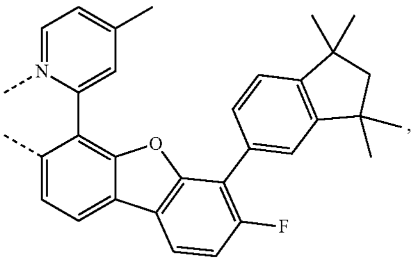
L_{a3-443}
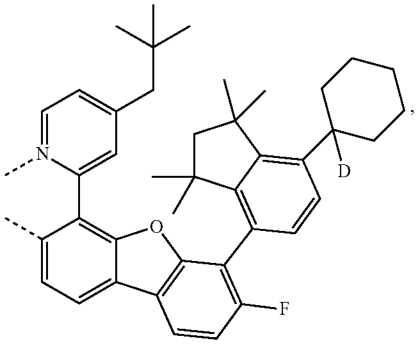
L_{a3-444}
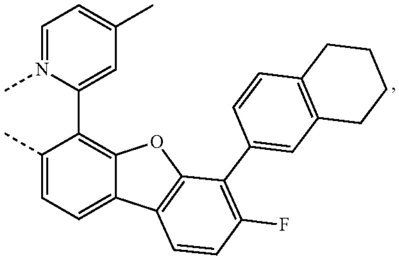
L_{a3-445}
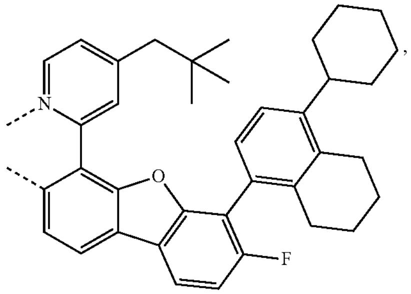
L_{a3-446}
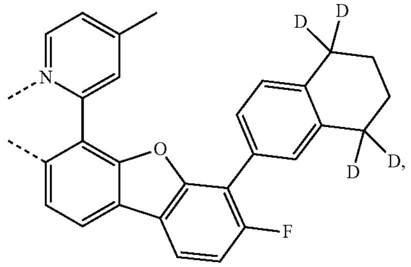
L_{a3-447}
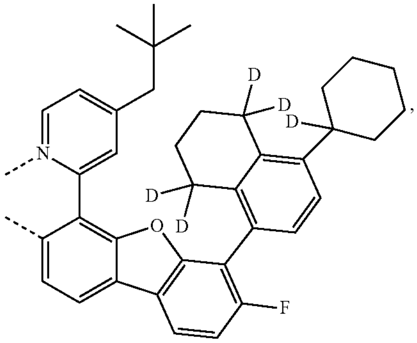
L_{a3-448}
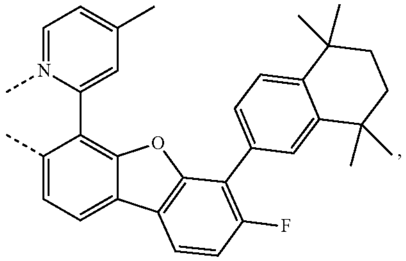
L_{a3-449}
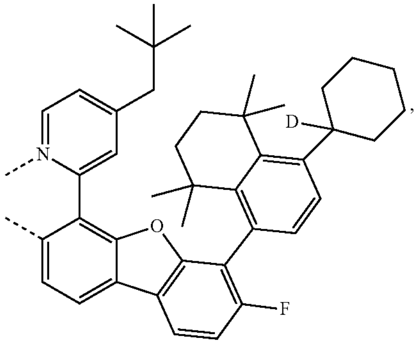

-continued
$L_{a3}$-450
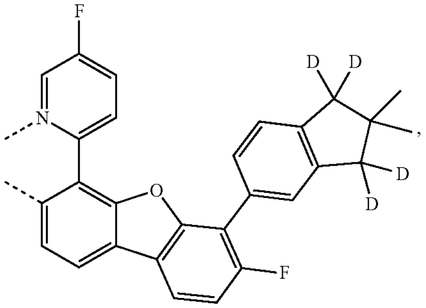
$L_{a3}$-451
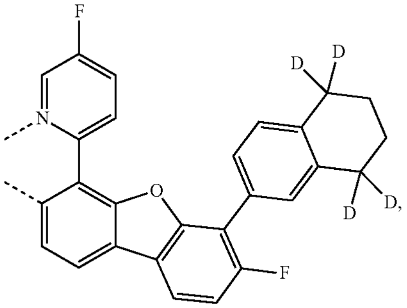
$L_{a3}$-452
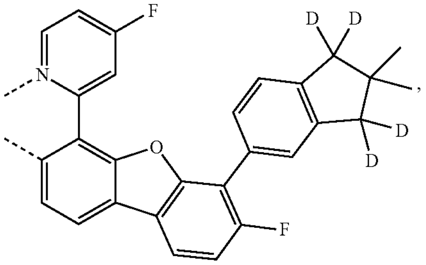
$L_{a3}$-453
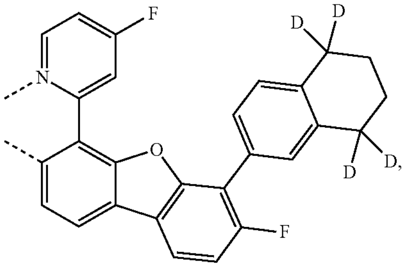
$L_{a3}$-454
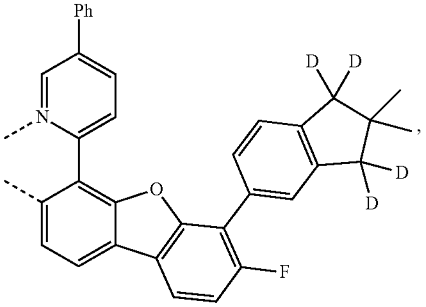
-continued
$L_{a3}$-455
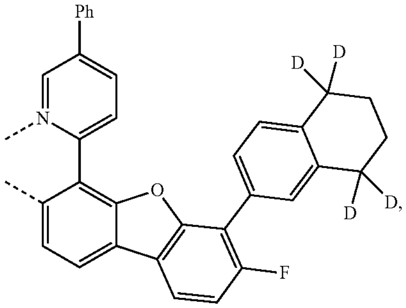
$L_{a3}$-456
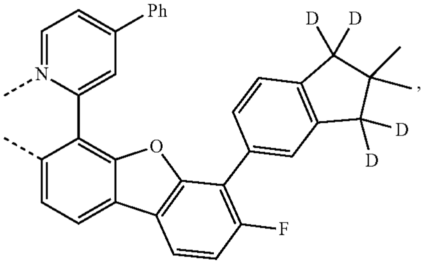
$L_{a3}$-457
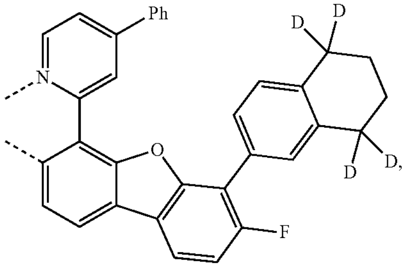
$L_{a3}$-458
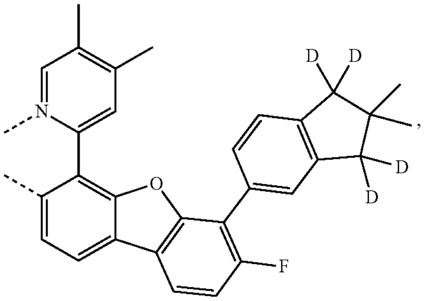
$L_{a3}$-459
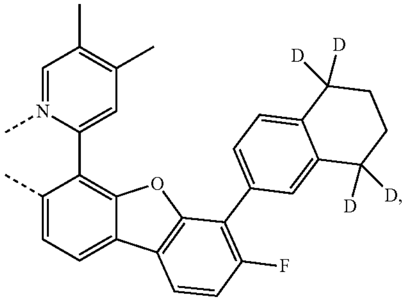

-continued
$L_{a3}$-460
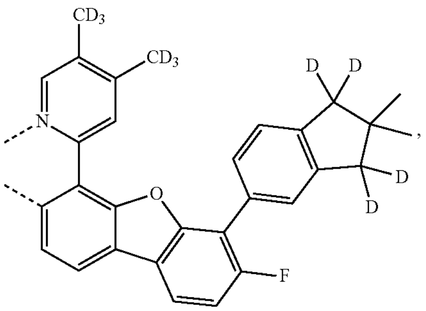
$L_{a3}$-461
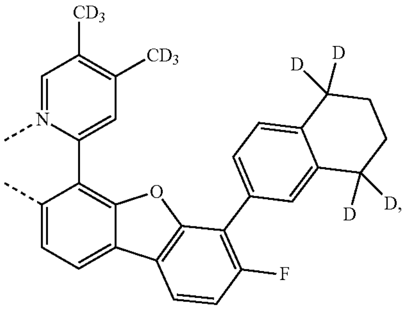
$L_{a3}$-462
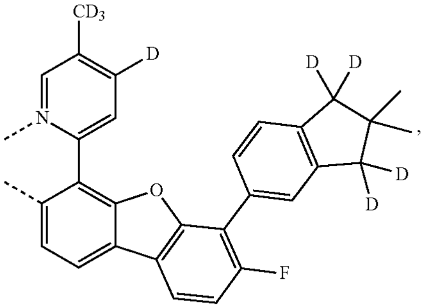
$L_{a3}$-463
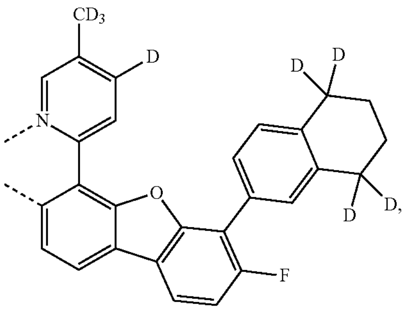
$L_{a3}$-464
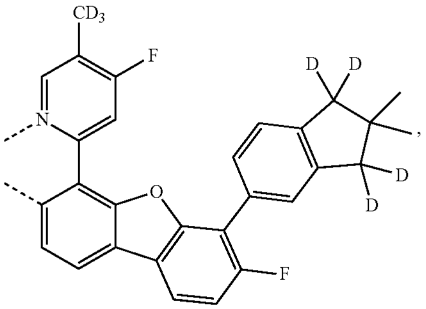
-continued
$L_{a3}$-465
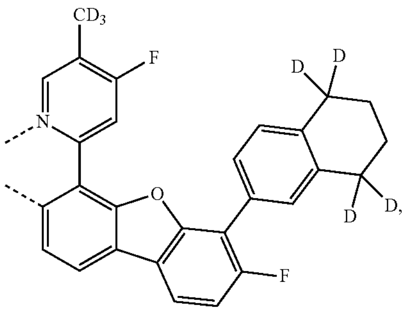
$L_{a3}$-466
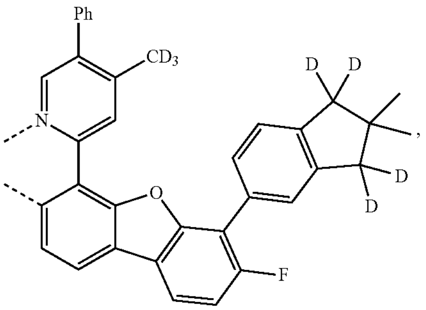
$L_{a3}$-467
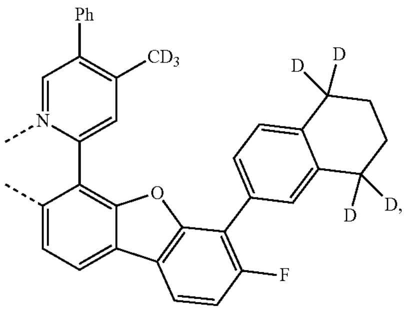
$L_{a3}$-468
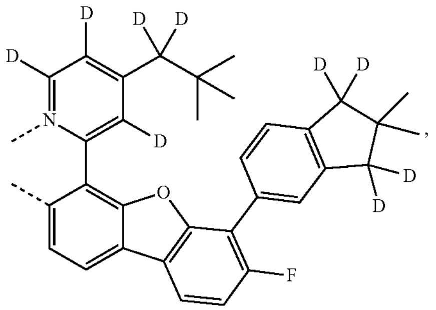
$L_{a3}$-469
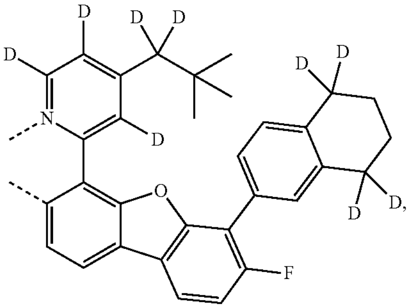

-continued
$L_{a3}$-470
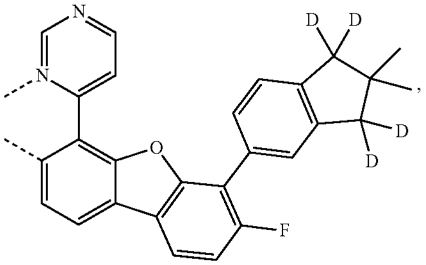
$L_{a3}$-471
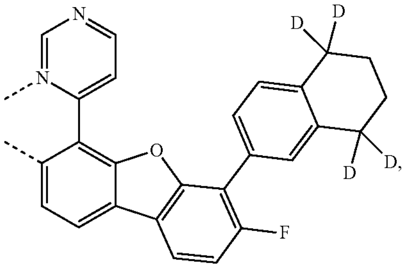
$L_{a3}$-472
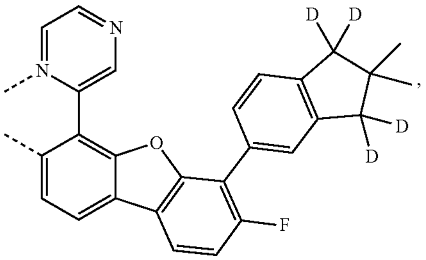
$L_{a3}$-473
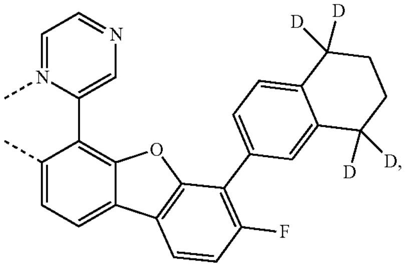
$L_{a3}$-474
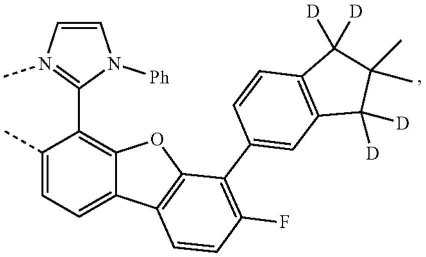
$L_{a3}$-475
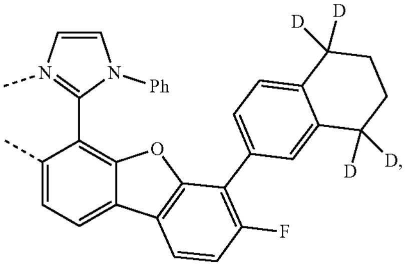
-continued
$L_{a3}$-476
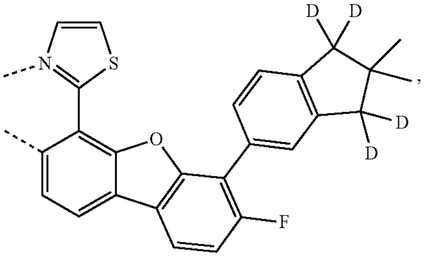
$L_{a3}$-477
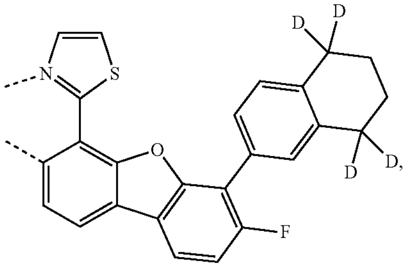
$L_{a3}$-478
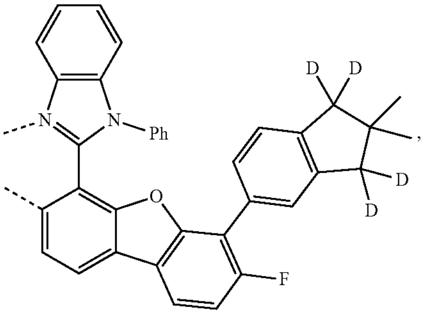
$L_{a3}$-479
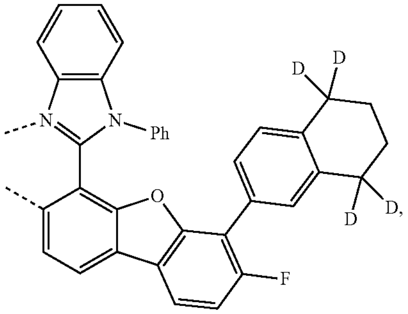
$L_{a3}$-480
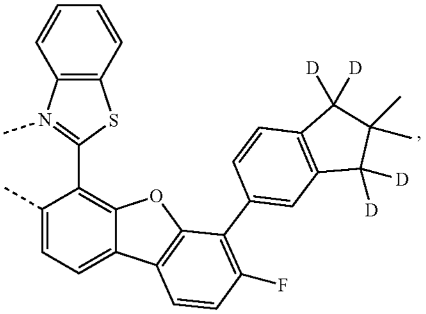

-continued
$L_{a3}$-481
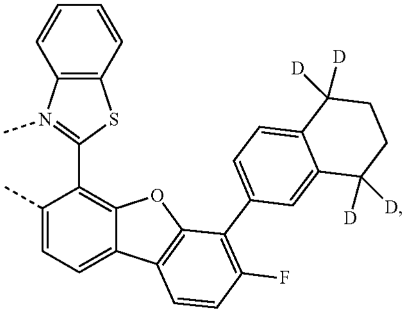
$L_{a3}$-482
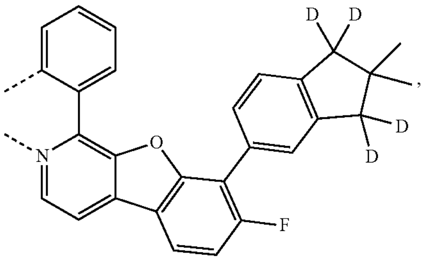
$L_{a3}$-483
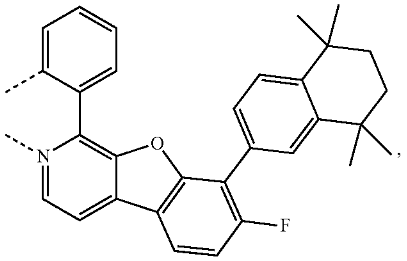
$L_{a3}$-484
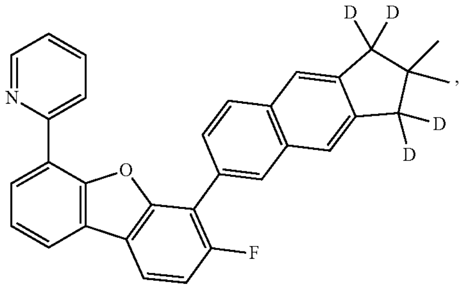
$L_{a3}$-485
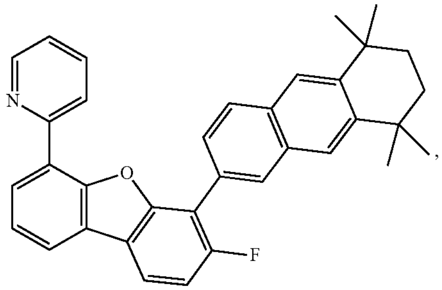
-continued
$L_{a4}$-1
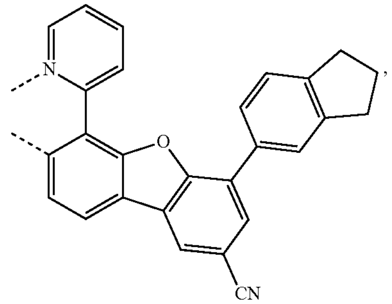
$L_{a4}$-2
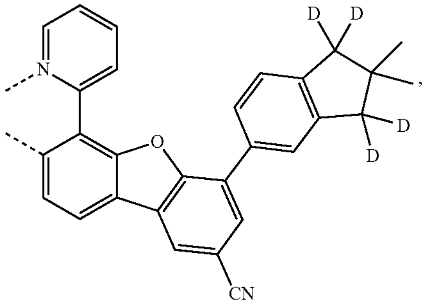
$L_{a4}$-3
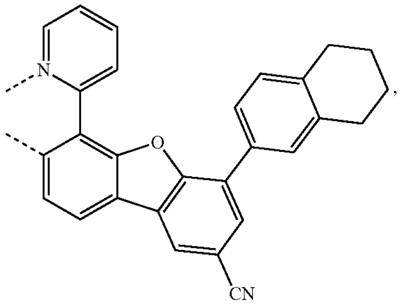
$L_{a4}$-4
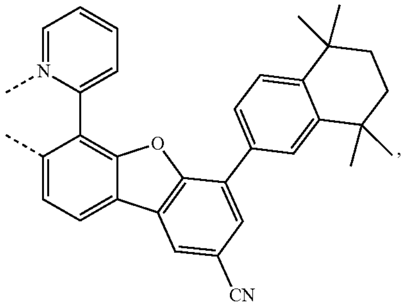
$L_{a4}$-5
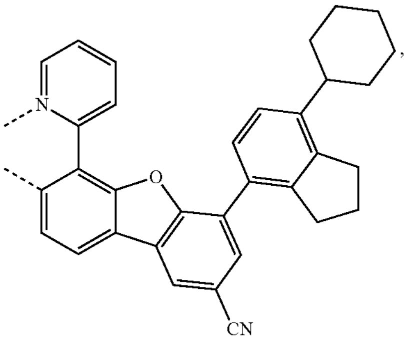

-continued
$L_{a4-6}$
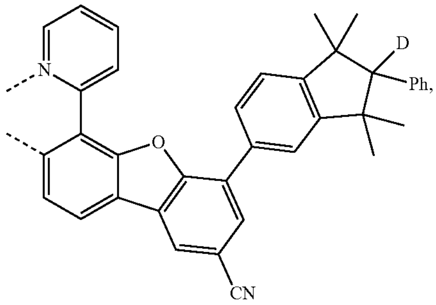
$L_{a4-7}$
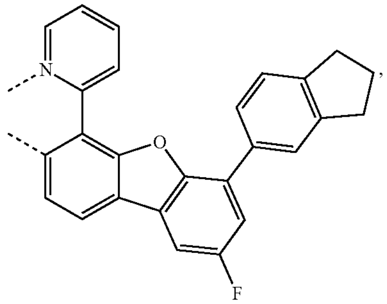
$L_{a4-8}$
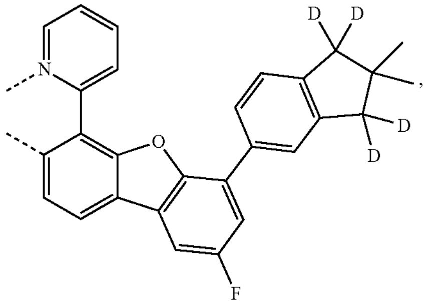
$L_{a4-9}$
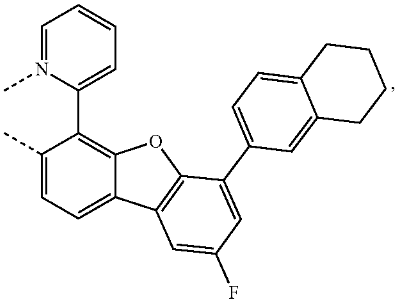
$L_{a4-10}$
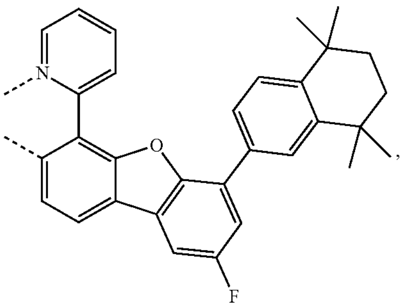
-continued
$L_{a4-11}$
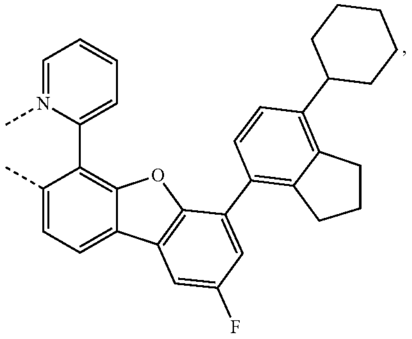
$L_{a4-12}$
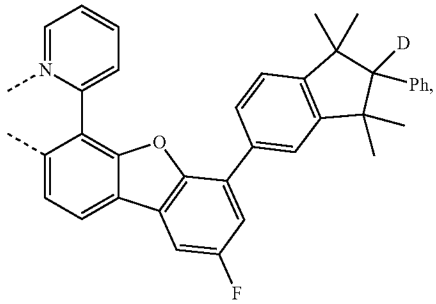
$L_{a4-13}$
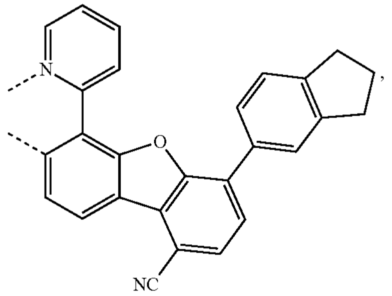
$L_{a4-14}$
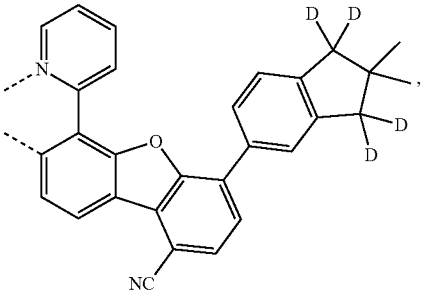
$L_{a4-15}$
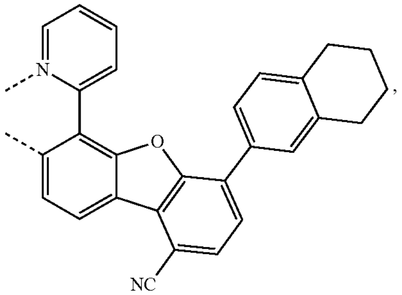

$L_{a4-16}$
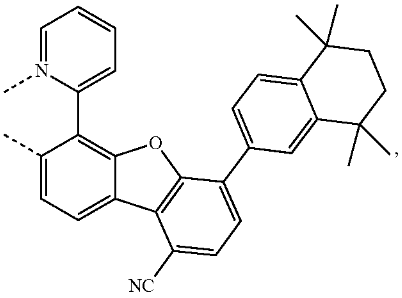
$L_{a4-17}$
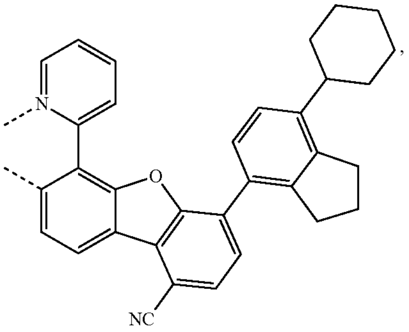
$L_{a4-18}$
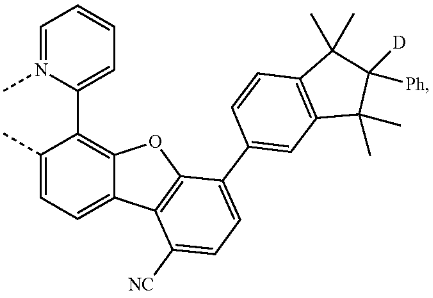
$L_{a4-19}$
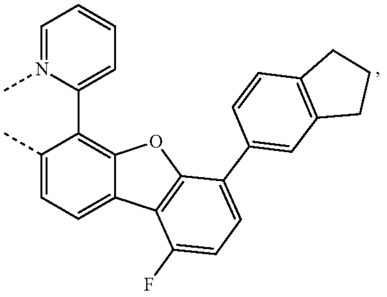
$L_{a4-20}$
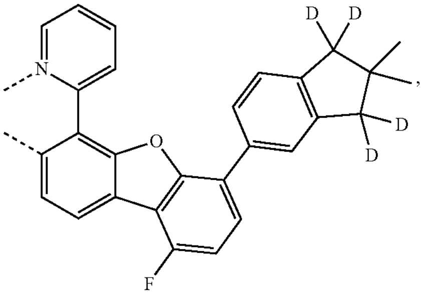
$L_{a4-21}$
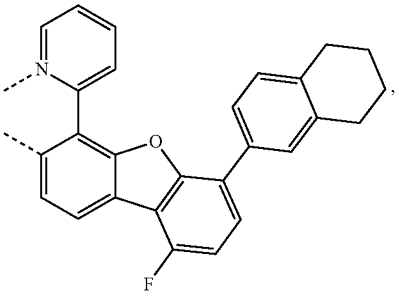
$L_{a4-22}$
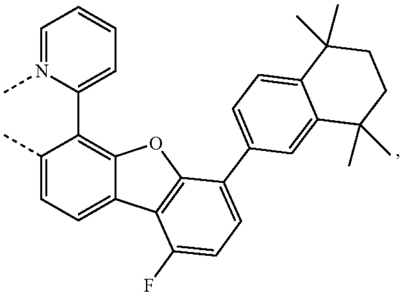
$L_{a4-23}$
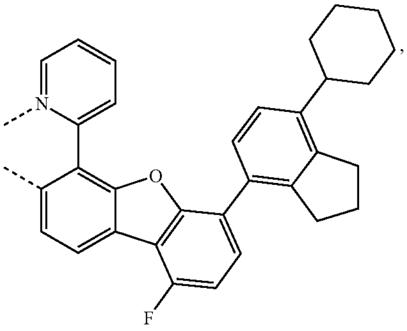
$L_{a4-24}$
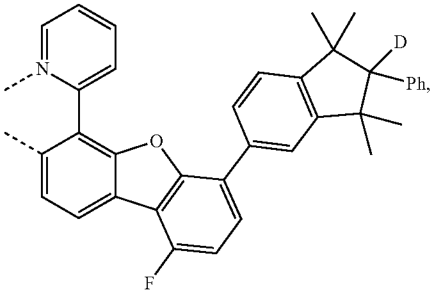
$L_{a4-25}$
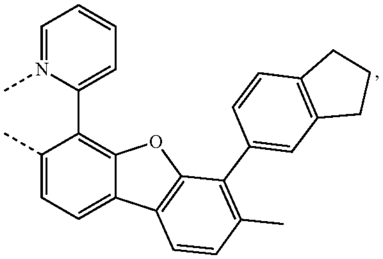

-continued
L$_{a4-26}$
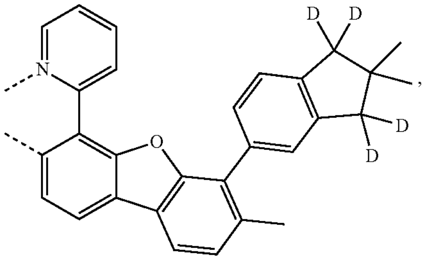
L$_{a4-27}$
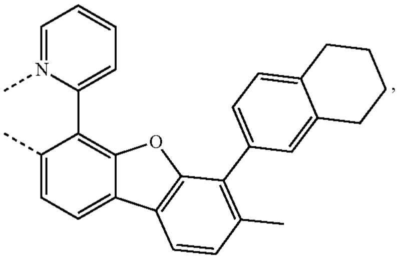
L$_{a4-28}$
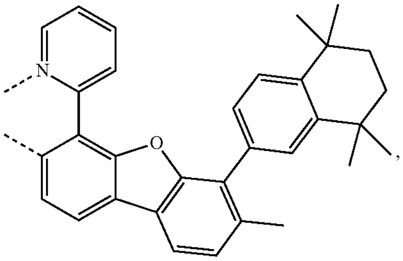
L$_{a4-29}$
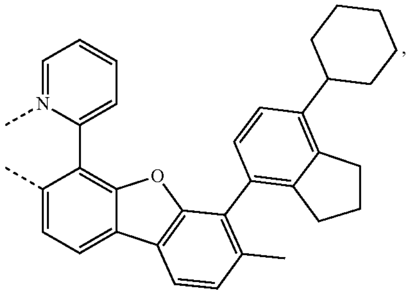
L$_{a4-30}$
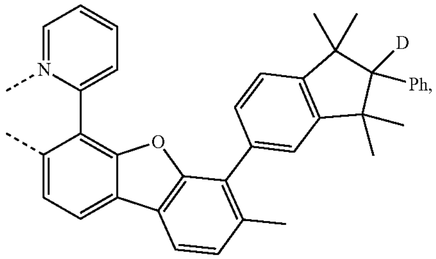
-continued
L$_{a4-31}$
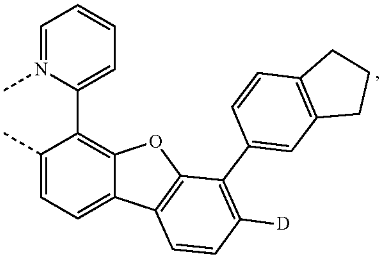
L$_{a4-32}$
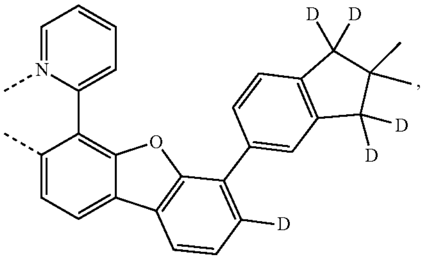
L$_{a4-33}$
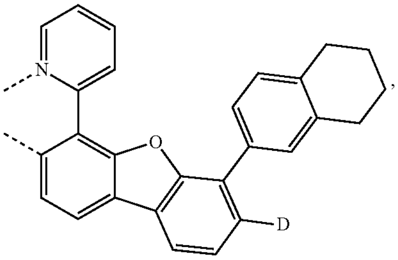
L$_{a4-34}$
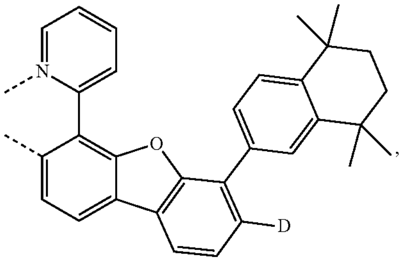
L$_{a4-35}$
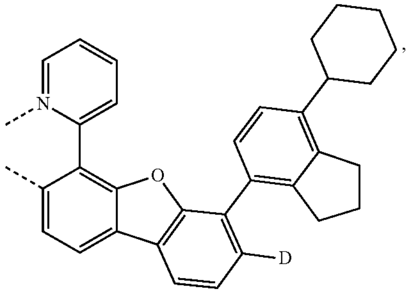

$L_{a4\text{-}36}$
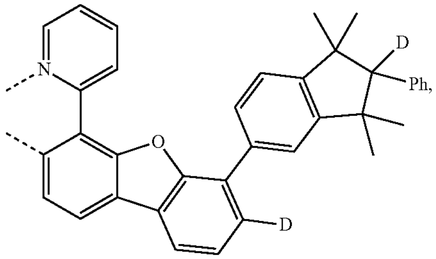
$L_{a4\text{-}37}$
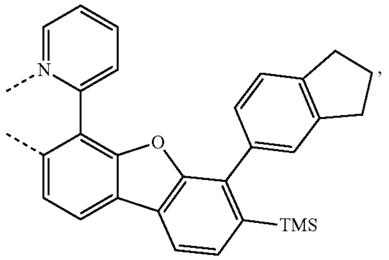
$L_{a4\text{-}38}$
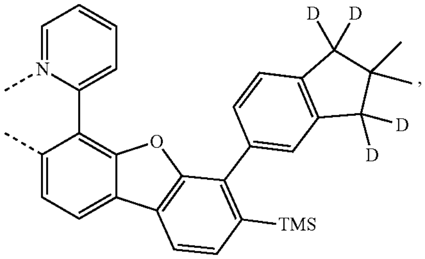
$L_{a4\text{-}39}$
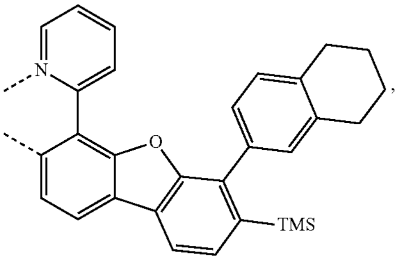
$L_{a4\text{-}40}$
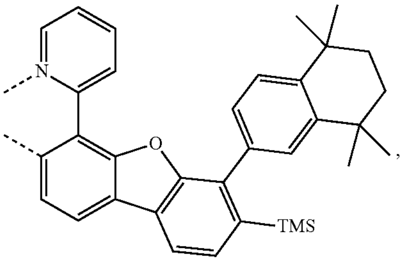
$L_{a4\text{-}41}$
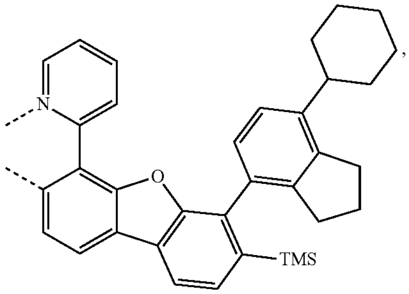
$L_{a4\text{-}42}$
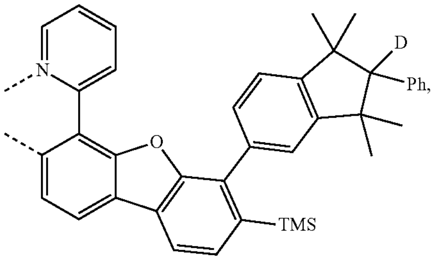
$L_{a4\text{-}43}$
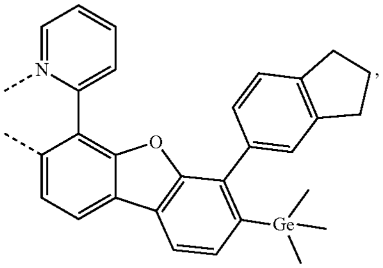
$L_{a4\text{-}44}$
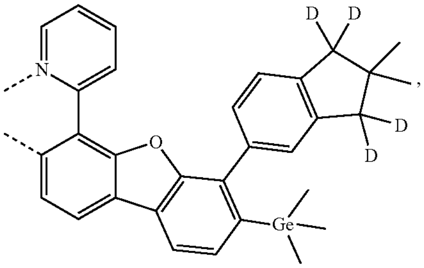
$L_{a4\text{-}45}$
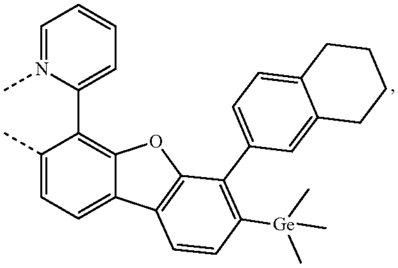

-continued
$L_{a4-46}$
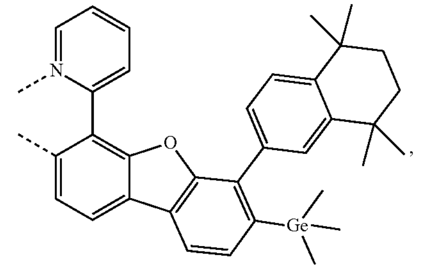
$L_{a4-47}$
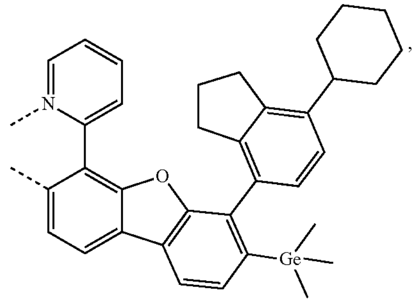
$L_{a4-48}$
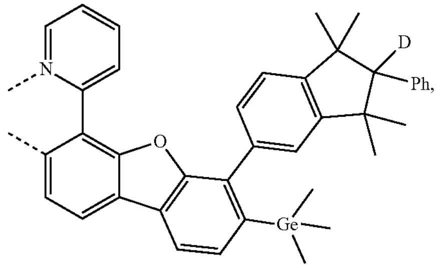
$L_{a4-49}$
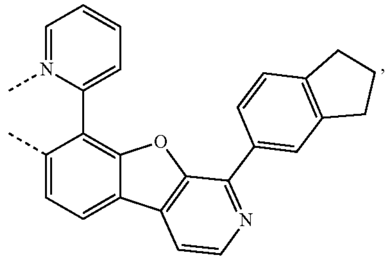
$L_{a4-50}$
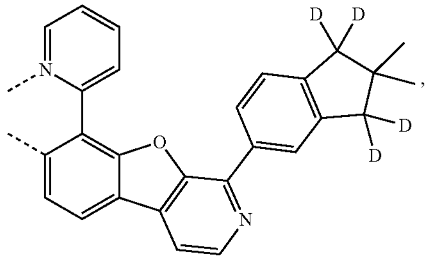
-continued
$L_{a4-51}$
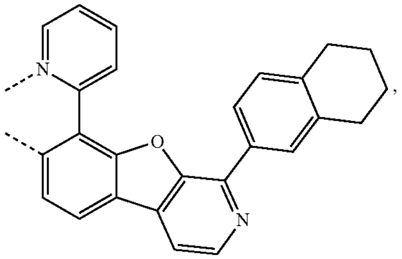
$L_{a4-52}$
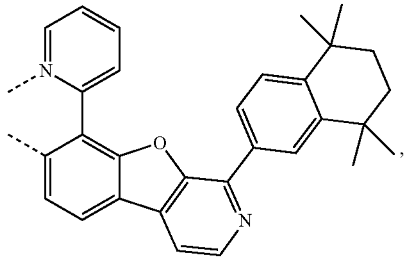
$L_{a4-53}$
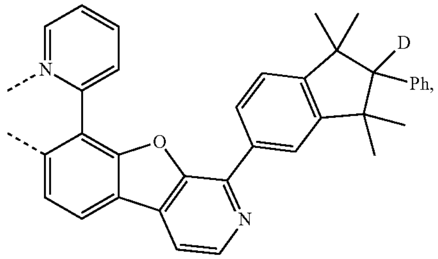
$L_{a4-54}$
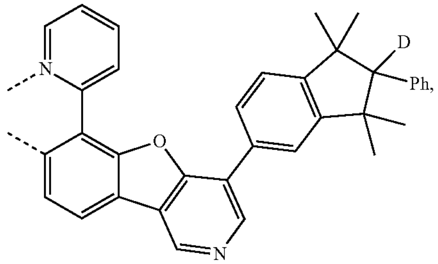
$L_{a4-55}$
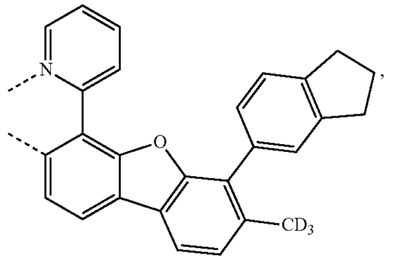
$L_{a4-56}$
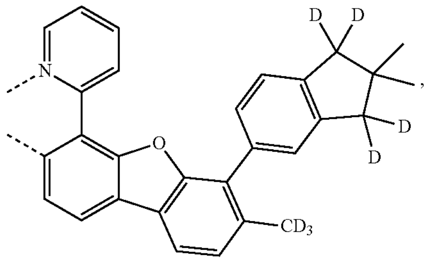

-continued
$L_{a4\text{-}57}$
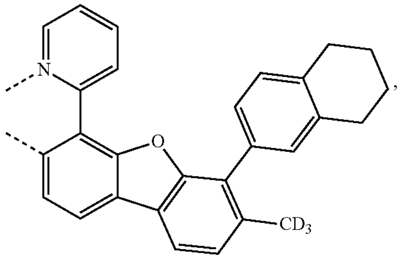
$L_{a4\text{-}58}$
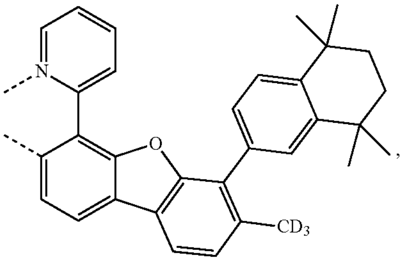
$L_{a4\text{-}59}$
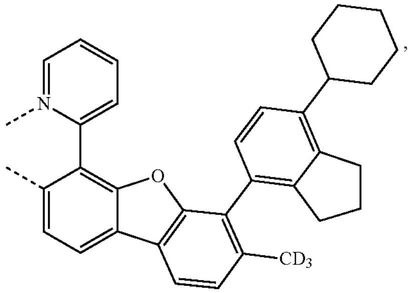
$L_{a4\text{-}60}$
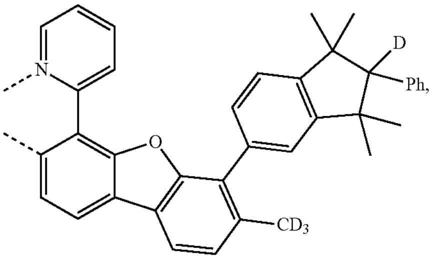
$L_{a4\text{-}61}$
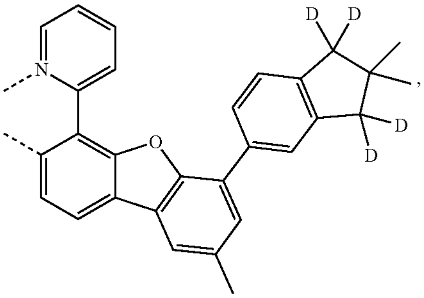
-continued
$L_{a4\text{-}62}$
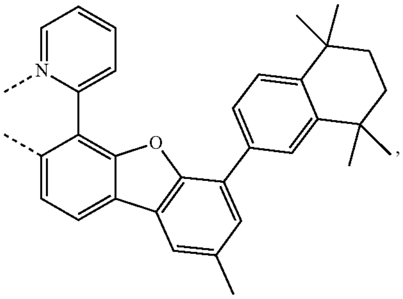
$L_{a4\text{-}63}$
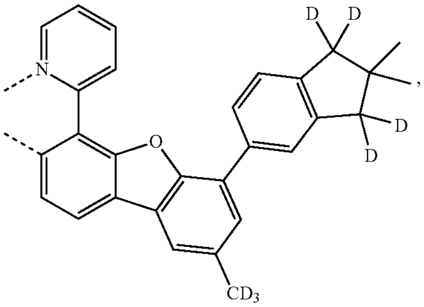
$L_{a4\text{-}64}$
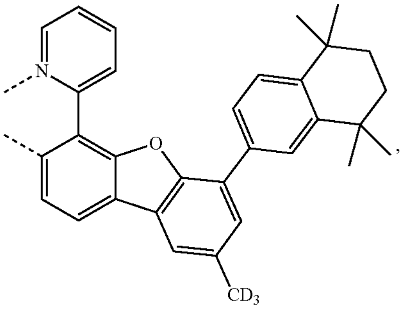
$L_{a4\text{-}65}$
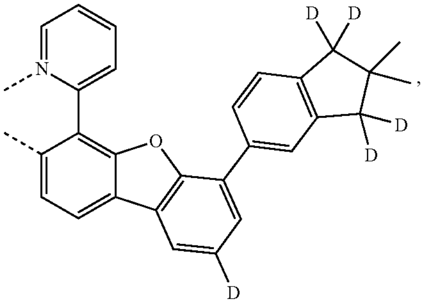
$L_{a4\text{-}66}$
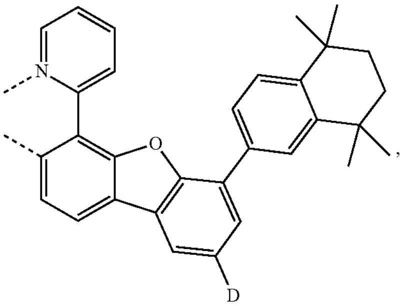

-continued
$L_{a4\text{-}67}$
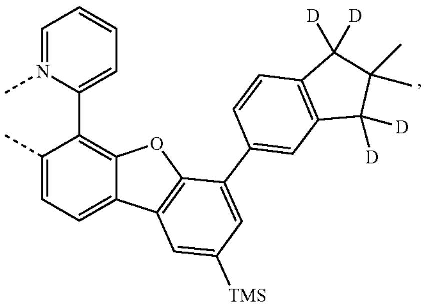
$L_{a4\text{-}68}$
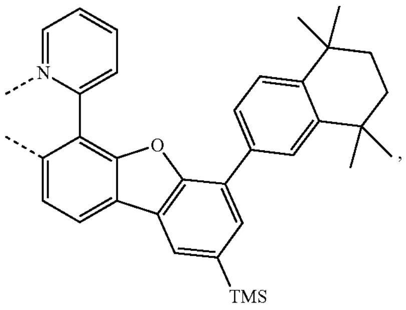
$L_{a4\text{-}69}$
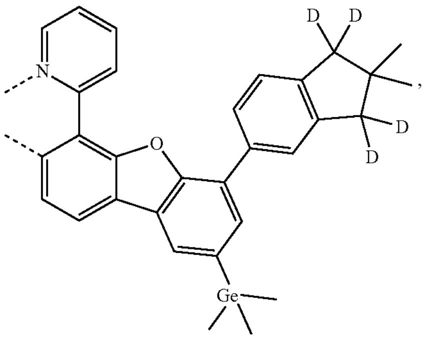
$L_{a4\text{-}70}$
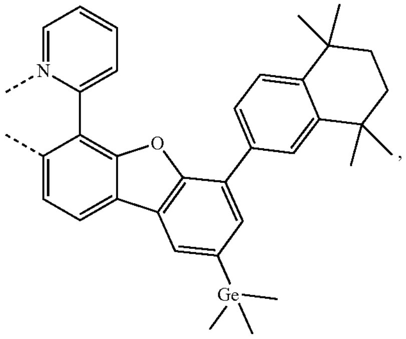
$L_{a4\text{-}71}$
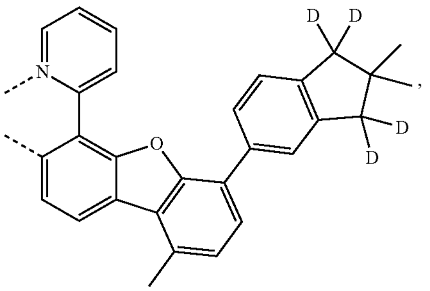
-continued
$L_{a4\text{-}72}$
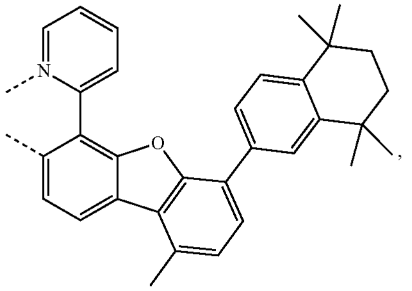
$L_{a4\text{-}73}$
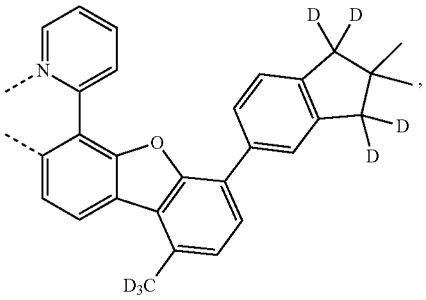
$L_{a4\text{-}74}$
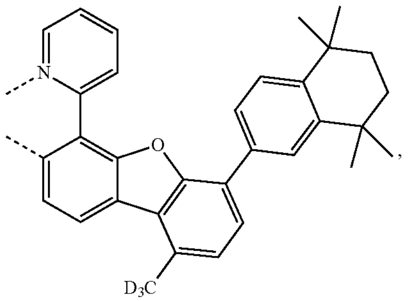
$L_{a4\text{-}75}$
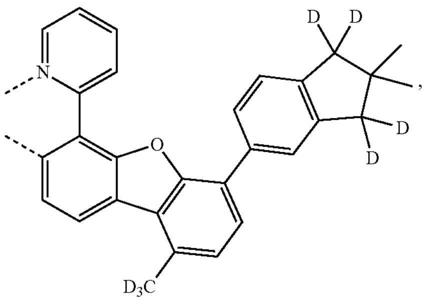
$L_{a4\text{-}76}$
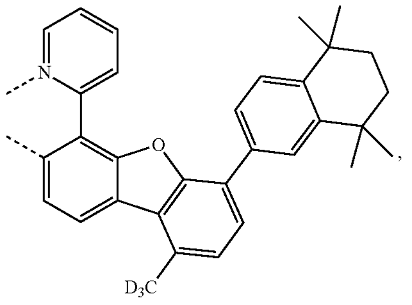

-continued
$L_{a4-77}$
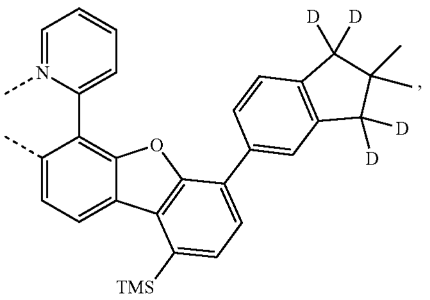
$L_{a4-78}$
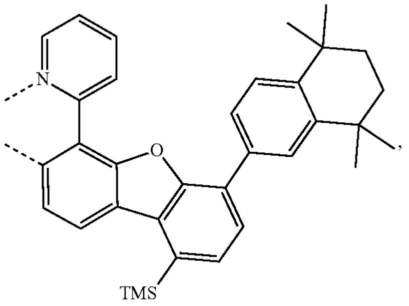
$L_{a4-79}$
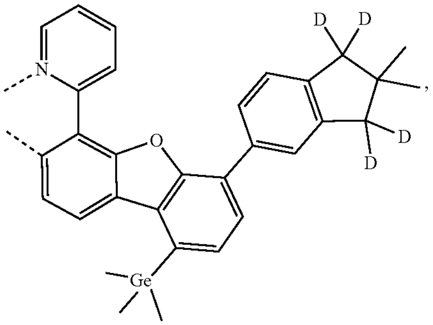
$L_{a4-80}$
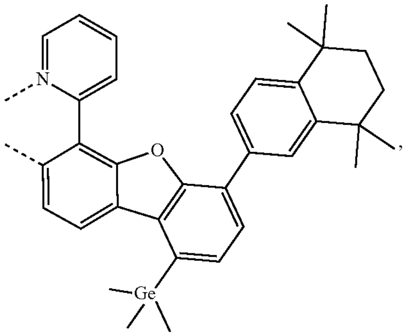
-continued
$L_{a4-81}$
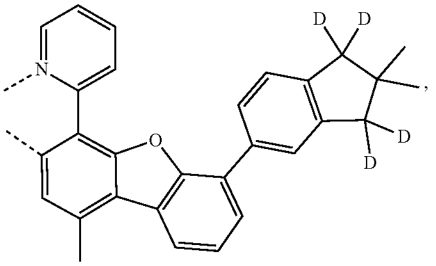
$L_{a4-82}$
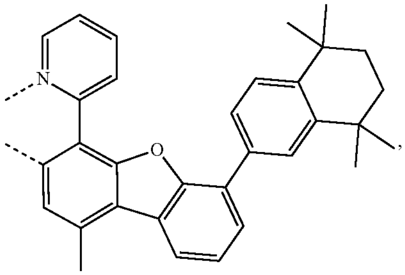
$L_{a4-83}$
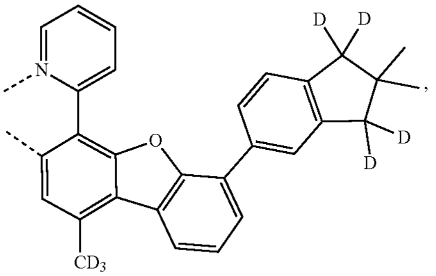
$L_{a4-84}$
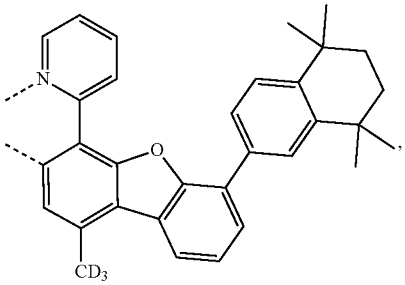
$L_{a4-85}$
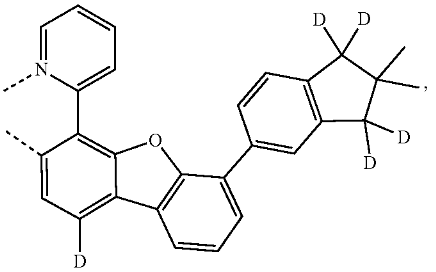

-continued
$L_{a4-86}$
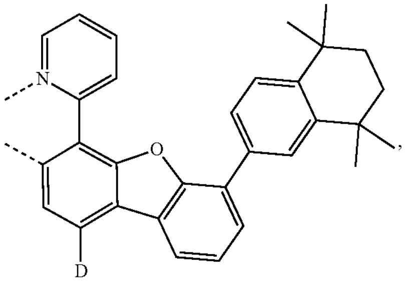
$L_{a4-87}$
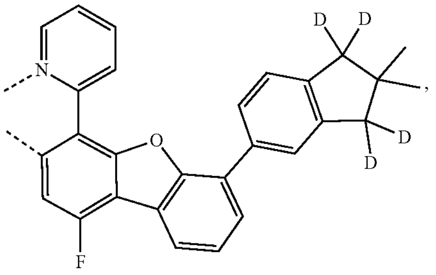
$L_{a4-88}$
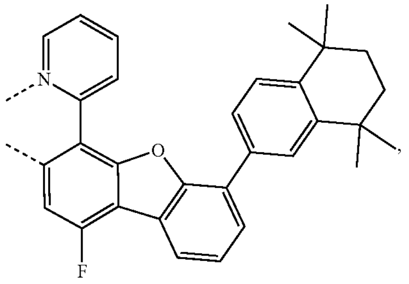
$L_{a4-89}$
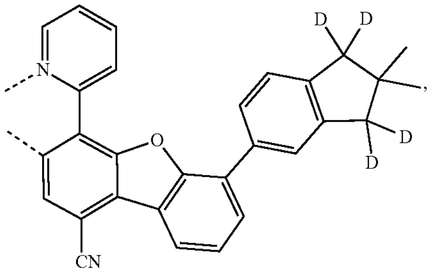
$L_{a4-90}$
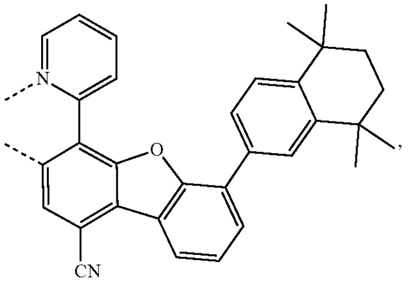
-continued
$L_{a4-91}$
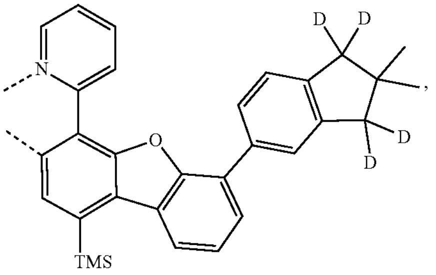
$L_{a4-92}$
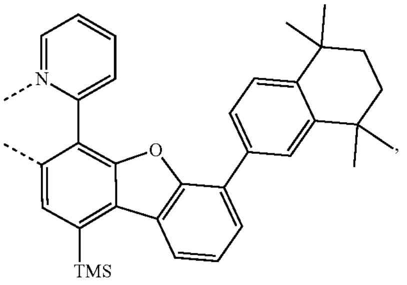
$L_{a4-93}$
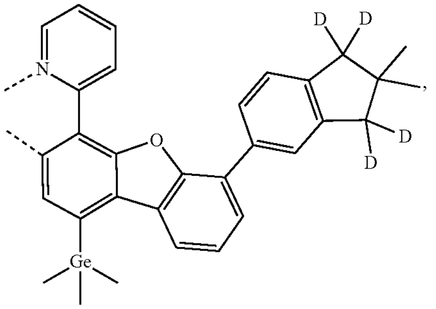
$L_{a4-94}$
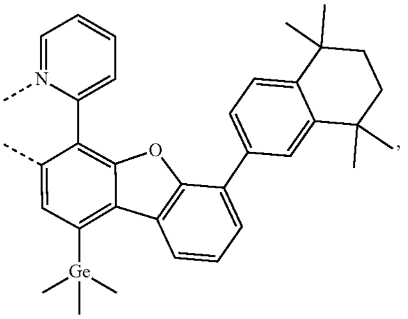
$L_{a4-95}$
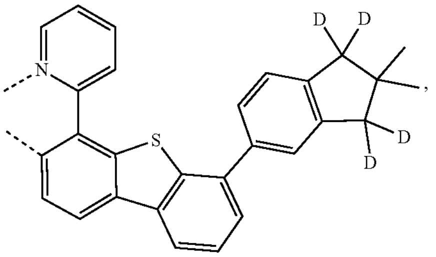

-continued
$L_{a4\text{-}96}$
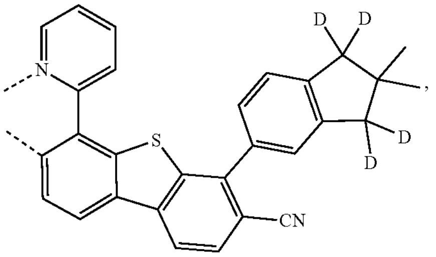
$L_{a4\text{-}97}$
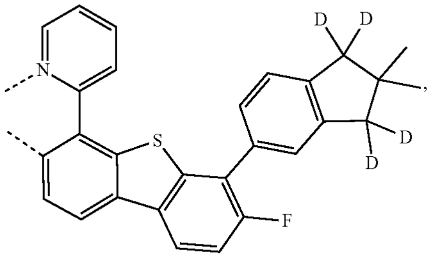
$L_{a4\text{-}98}$
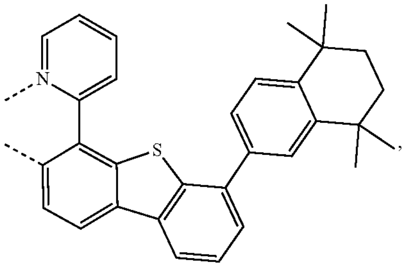
$L_{a4\text{-}99}$
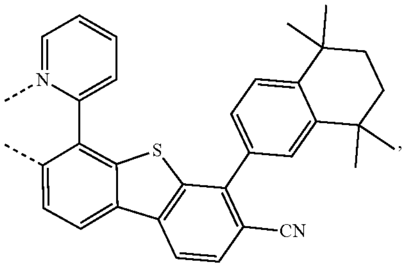
$L_{a4\text{-}100}$
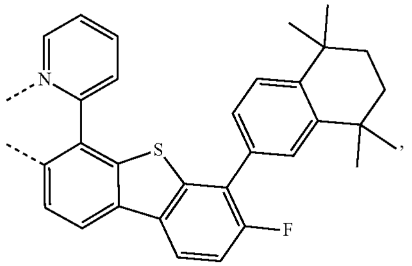
-continued
$L_{a4\text{-}101}$
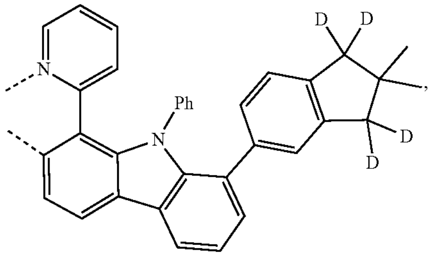
$L_{a4\text{-}102}$
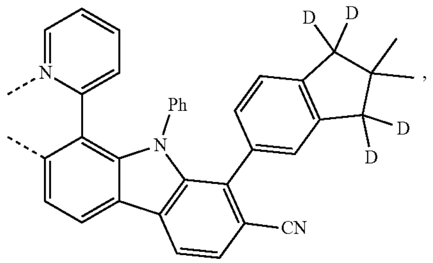
$L_{a4\text{-}103}$
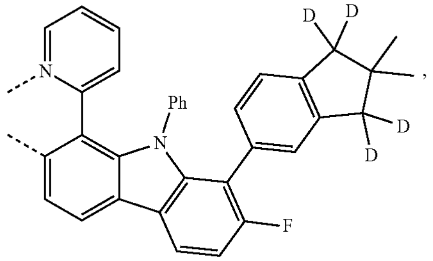
$L_{a4\text{-}104}$
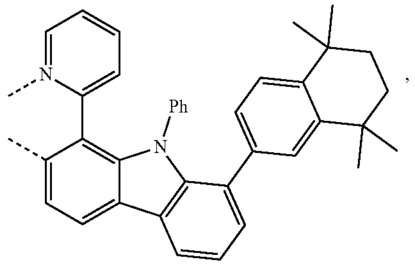
$L_{a4\text{-}105}$
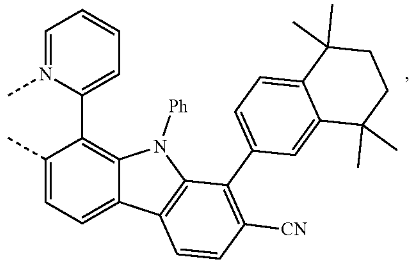

-continued
$L_{a4-106}$
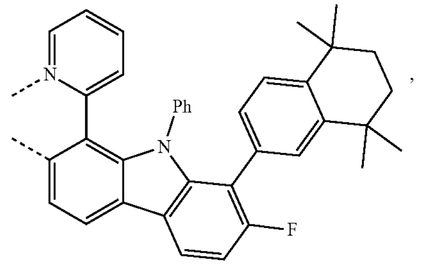
$L_{a4-107}$
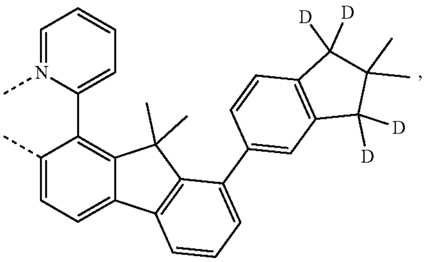
$L_{a4-108}$
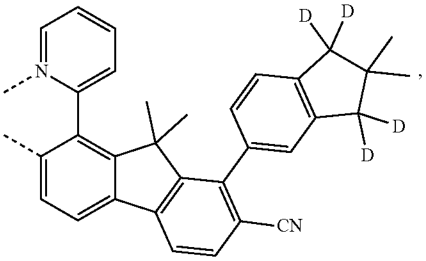
$L_{a4-109}$
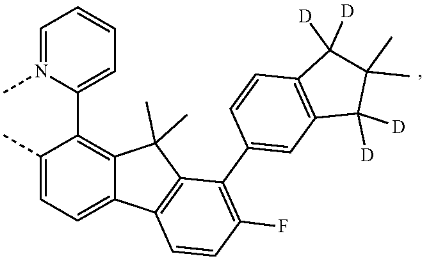
$L_{a4-110}$
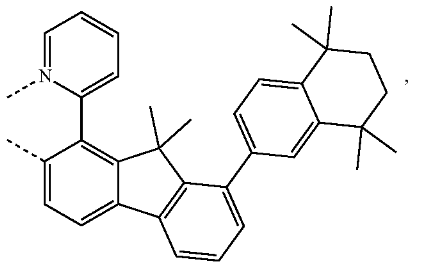
$L_{a4-111}$
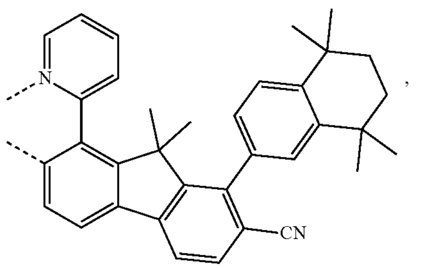
-continued
$L_{a4-112}$
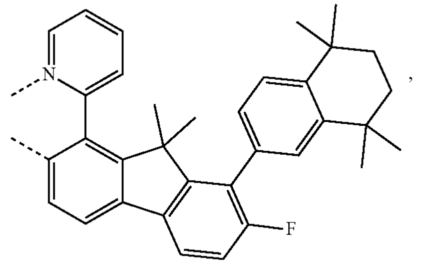
$L_{a4-113}$
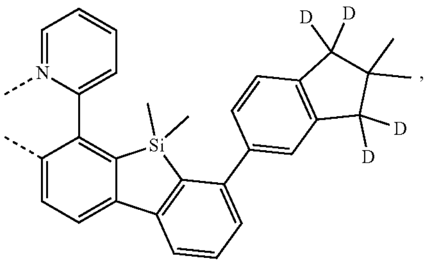
$L_{a4-114}$
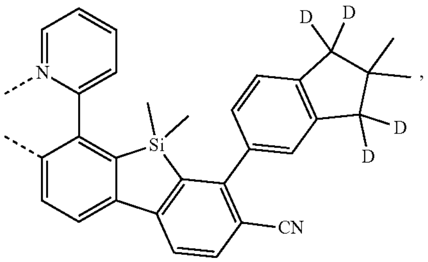
$L_{a4-115}$
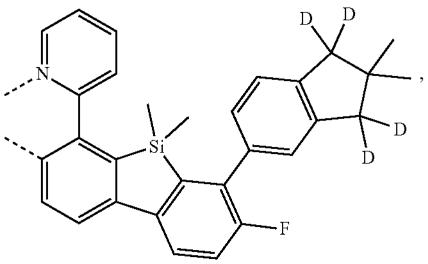
$L_{a4-116}$
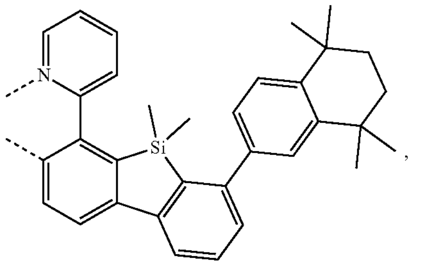
$L_{a4-117}$
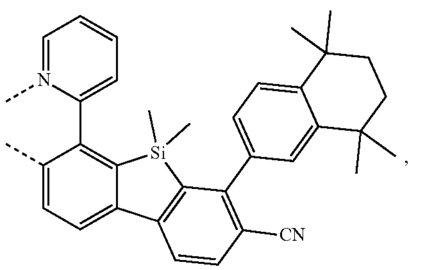

-continued
$L_{a4\text{-}118}$
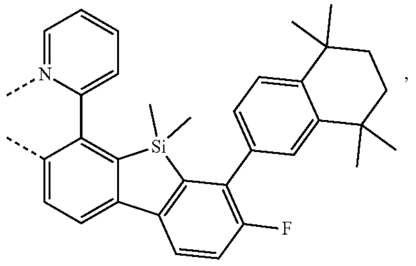
$L_{a4\text{-}119}$
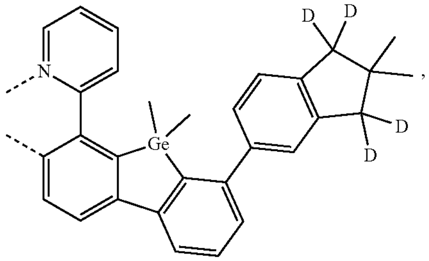
$L_{a4\text{-}120}$
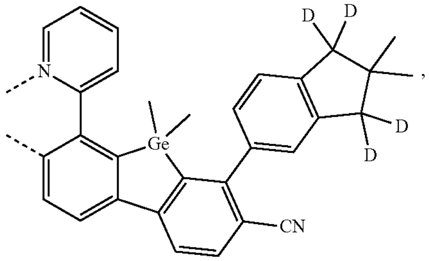
$L_{a4\text{-}121}$
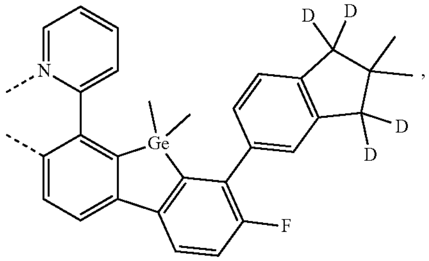
$L_{a4\text{-}122}$
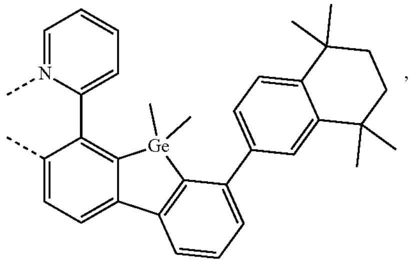
$L_{a4\text{-}123}$
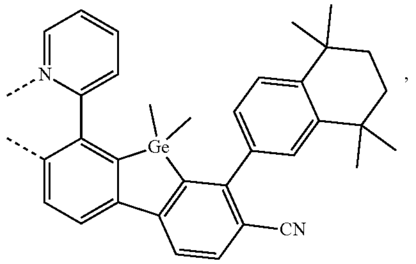
-continued
$L_{a4\text{-}124}$
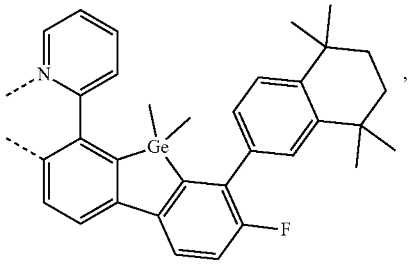
$L_{a4\text{-}125}$
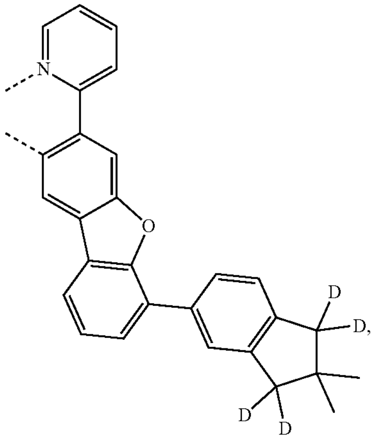
$L_{a4\text{-}126}$
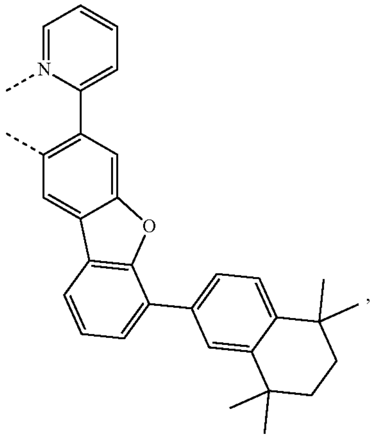
$L_{a4\text{-}127}$
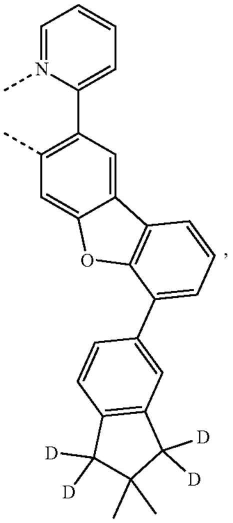

-continued
$L_{a4-128}$
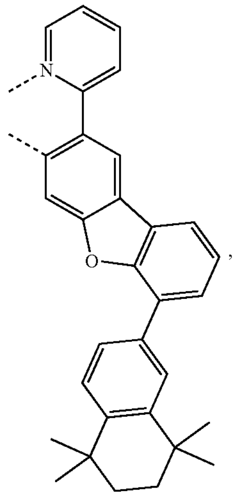
$L_{a4-129}$
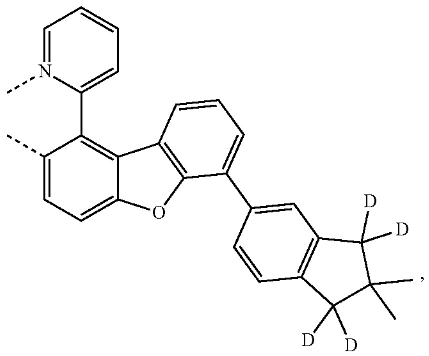
$L_{a4-130}$
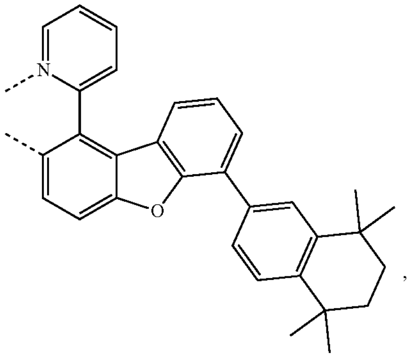
$L_{a4-131}$
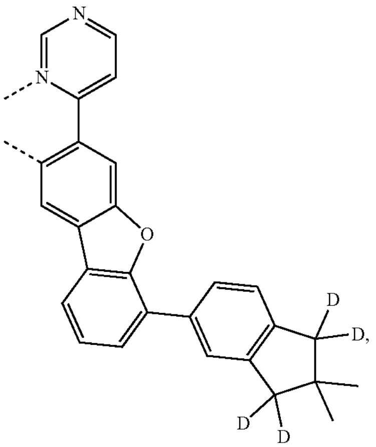
-continued
$L_{a4-132}$
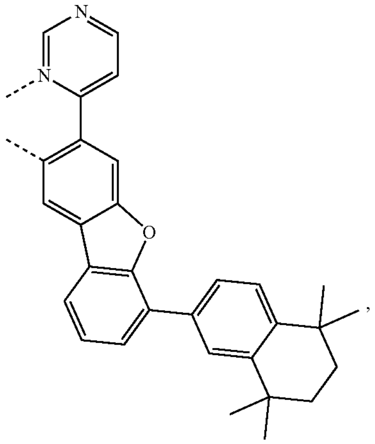
$L_{a4-133}$
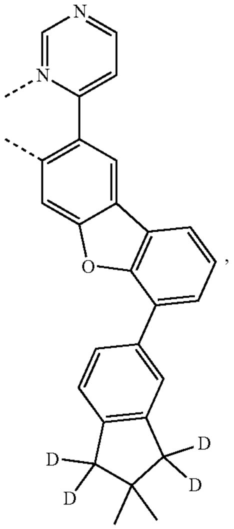
$L_{a4-134}$
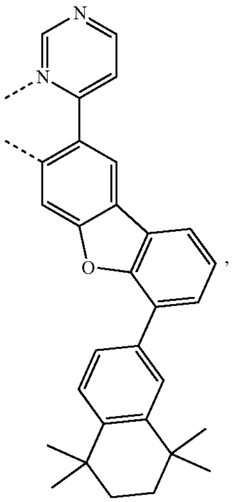

-continued
$L_{a4\text{-}135}$
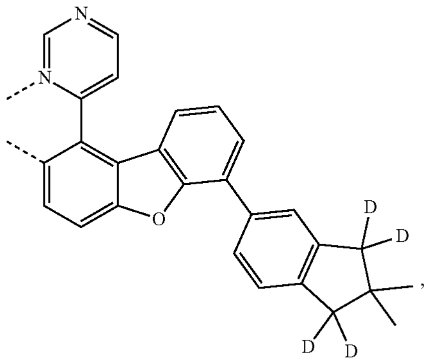
$L_{a4\text{-}136}$
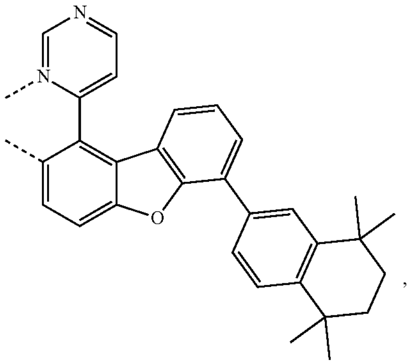
$L_{a4\text{-}137}$
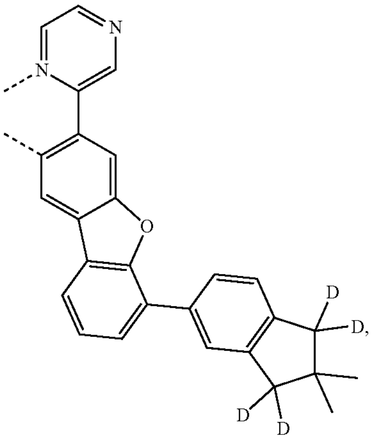
$L_{a4\text{-}138}$
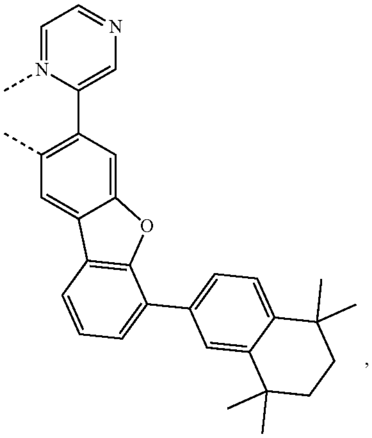
-continued
$L_{a4\text{-}139}$
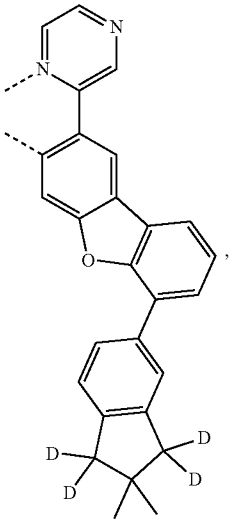
$L_{a4\text{-}140}$
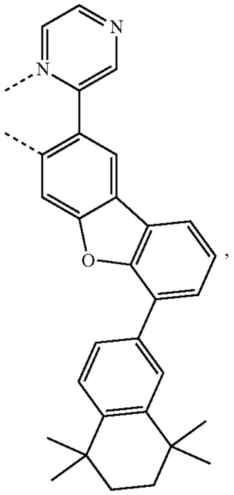
$L_{a4\text{-}141}$
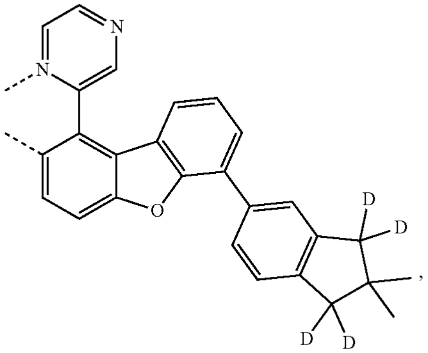

-continued
$L_{a4-142}$
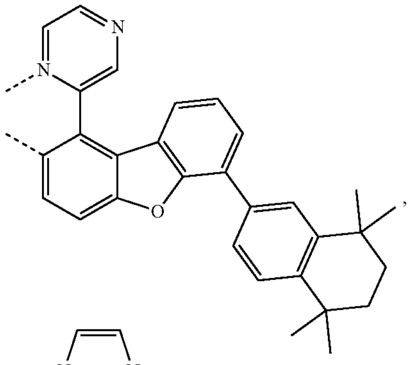
$L_{a4-143}$
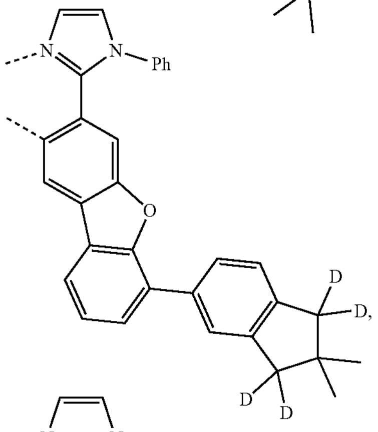
$L_{a4-144}$
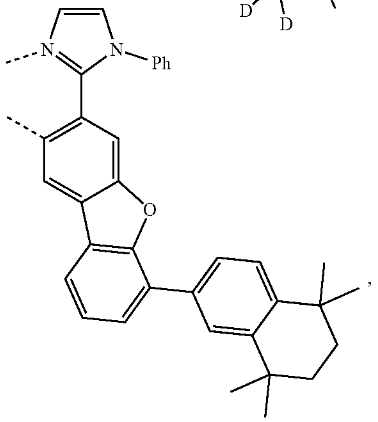
$L_{a4-145}$
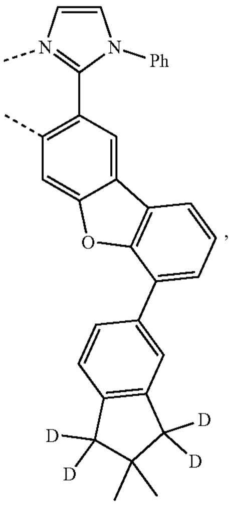
-continued
$L_{a4-146}$
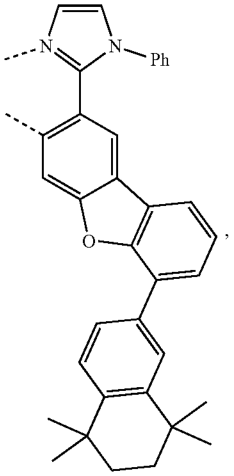
$L_{a4-147}$
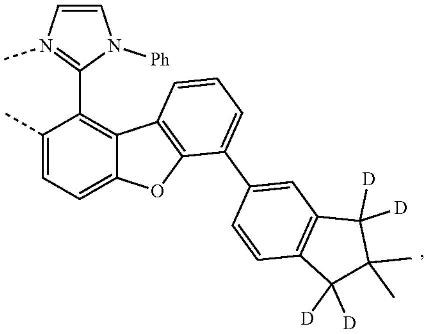
$L_{a4-148}$
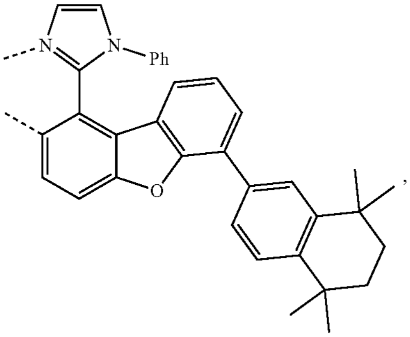
$L_{a4-149}$
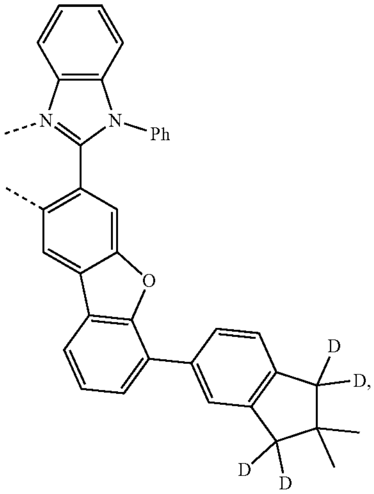

-continued
$L_{a4\text{-}150}$
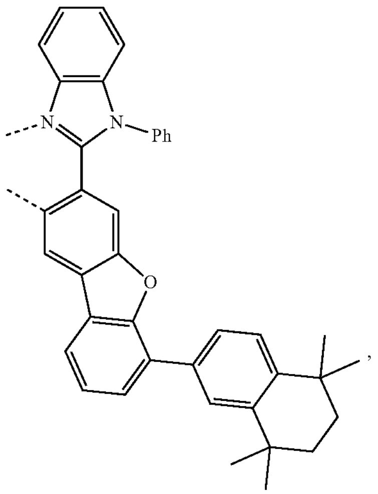
$L_{a4\text{-}151}$
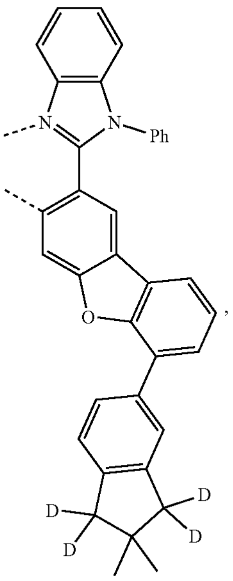
$L_{a4\text{-}152}$
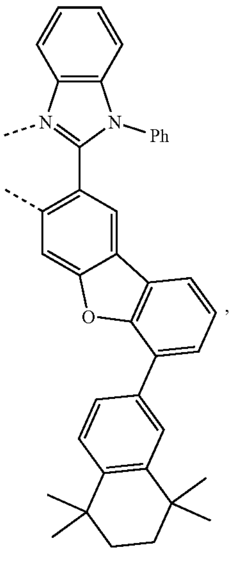
-continued
$L_{a4\text{-}153}$
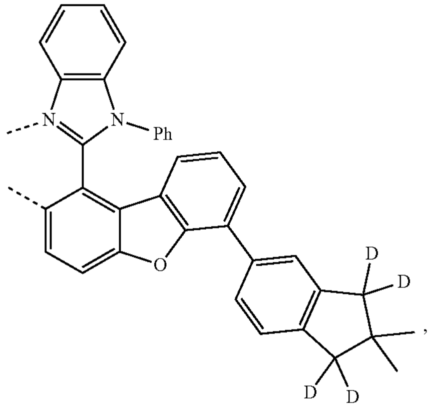
$L_{a4\text{-}154}$
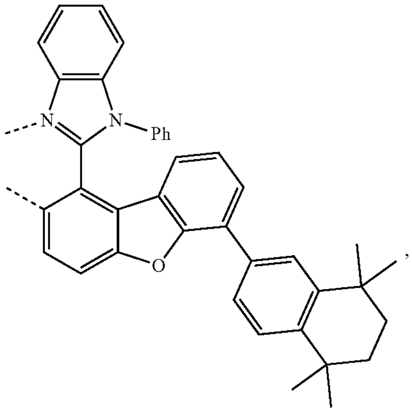
$L_{a4\text{-}155}$
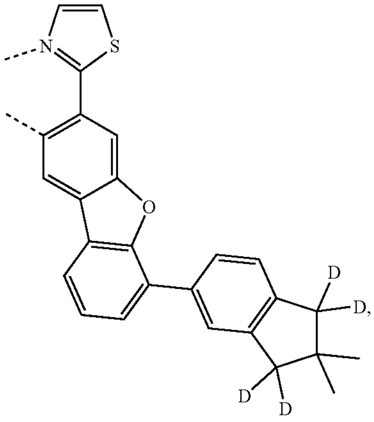
$L_{a4\text{-}156}$
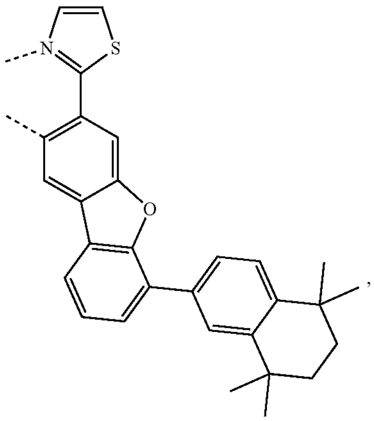

L$_{a4-157}$
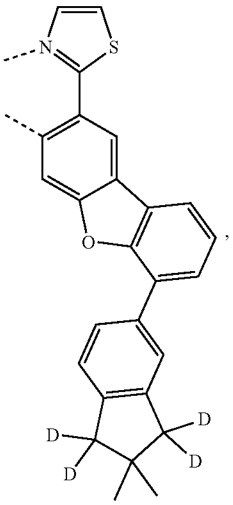
L$_{a4-158}$
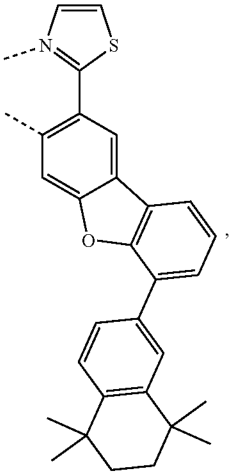
L$_{a4-159}$
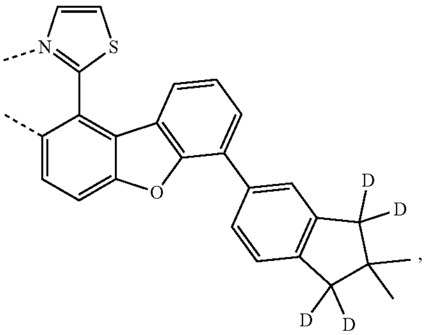
L$_{a4-160}$
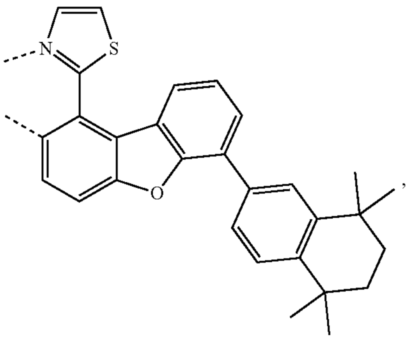
L$_{a4-161}$
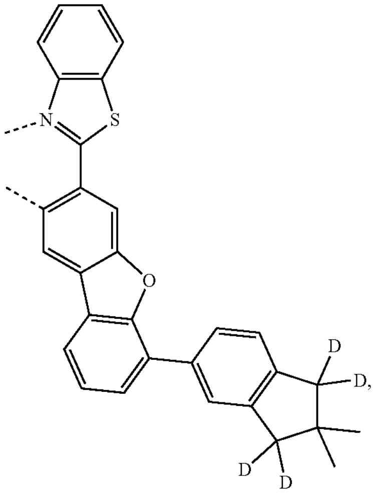
L$_{a4-162}$
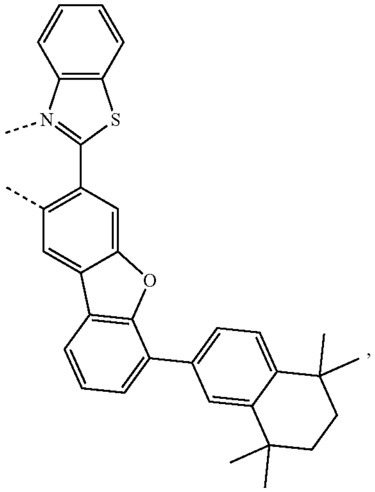

-continued
$L_{a4-163}$
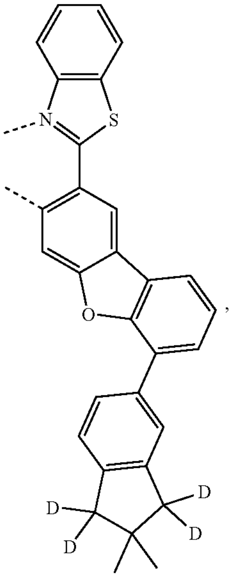
$L_{a4-164}$
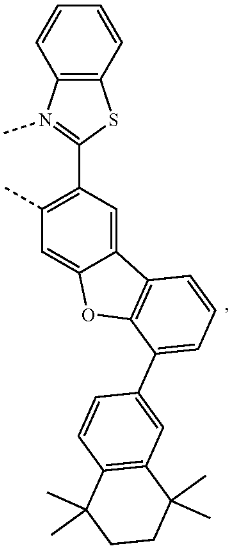
$L_{a4-165}$
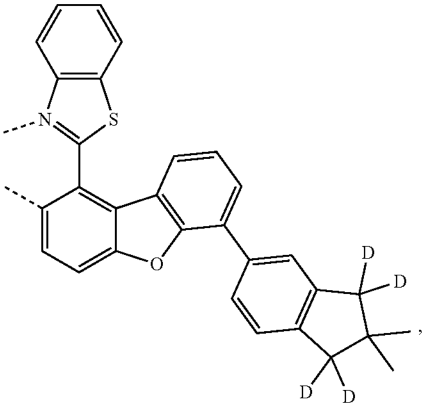
-continued
$L_{a4-166}$
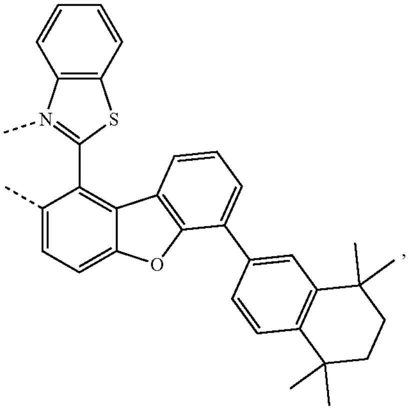
$L_{a4-167}$
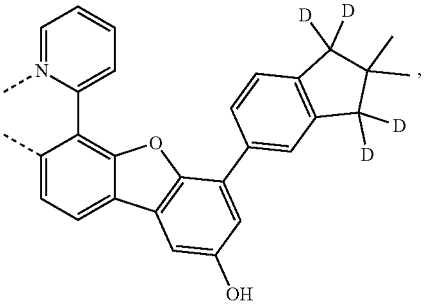
$L_{a4-168}$
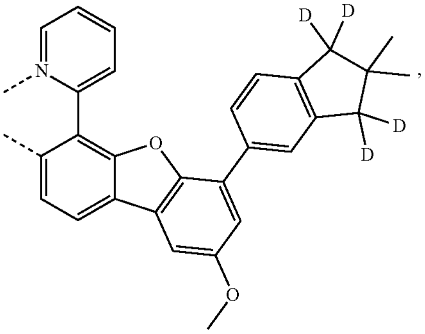
$L_{a4-169}$
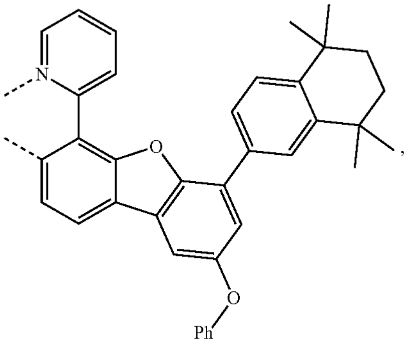

-continued
$L_{a4}$-170
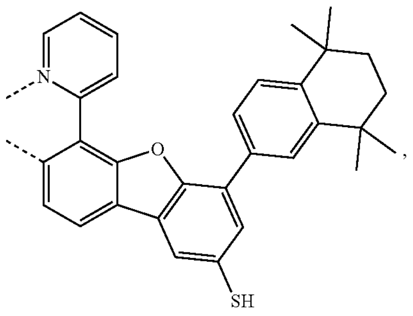
$L_{a4}$-171
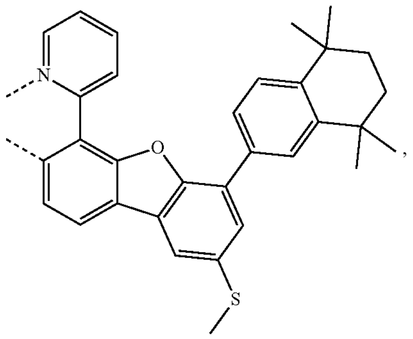
$L_{a4}$-172
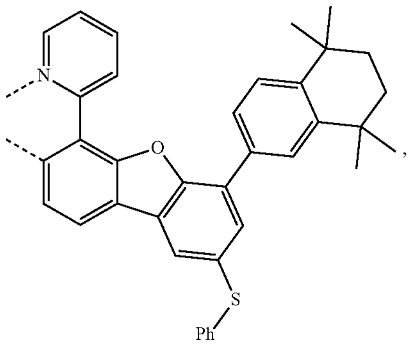
$L_{a4}$-173
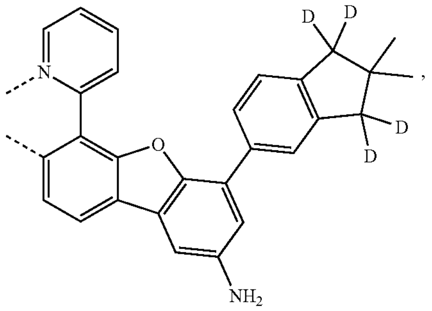
-continued
$L_{a4}$-174
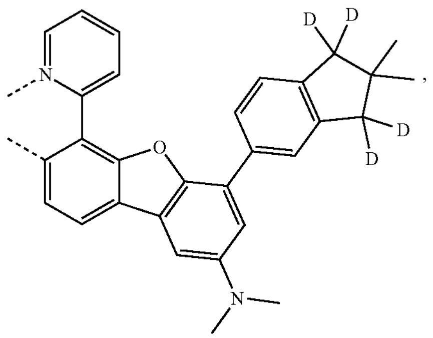
$L_{a4}$-175
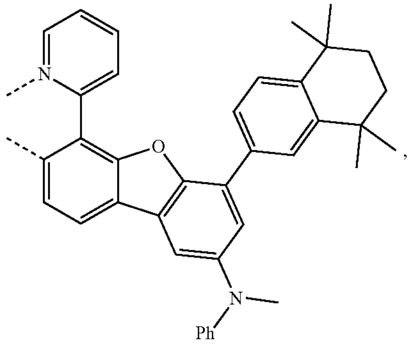
$L_{a4}$-176
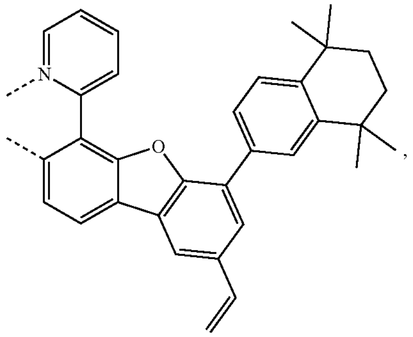
$L_{a4}$-177
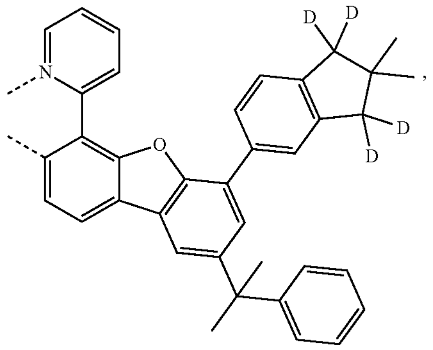

-continued
La4-178
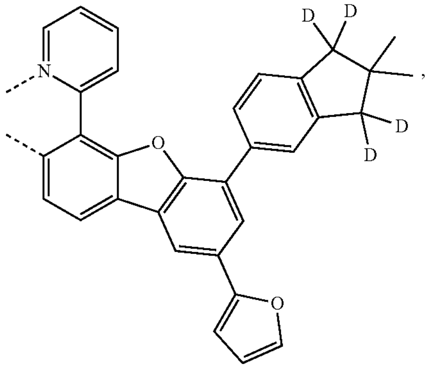
La4-179
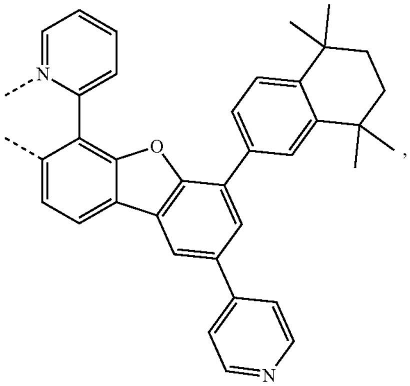
La4-180
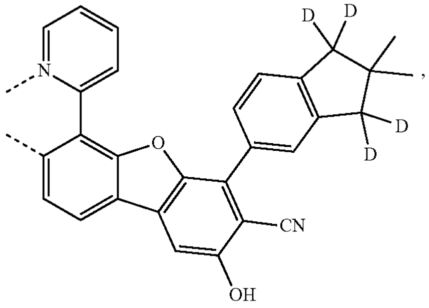
La4-181
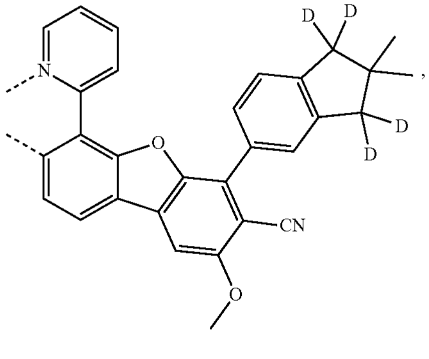
-continued
La4-182
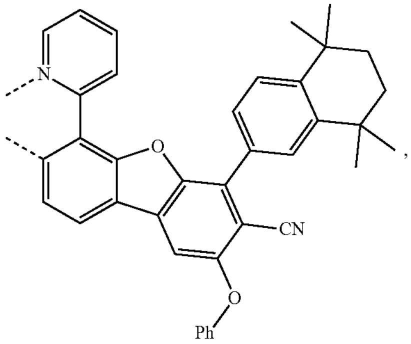
La4-183
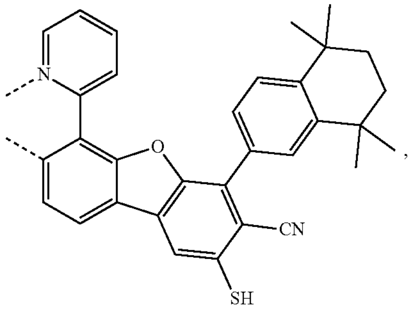
La4-184
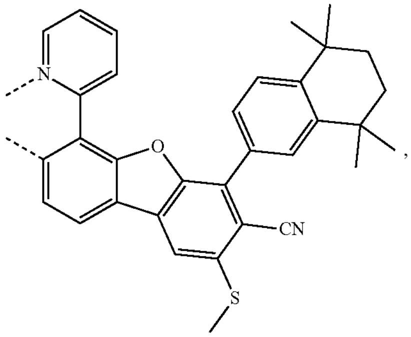
La4-185
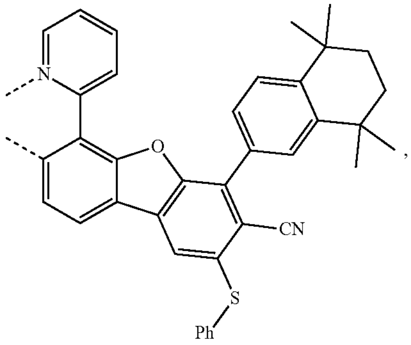

-continued
$L_{a4\text{-}186}$
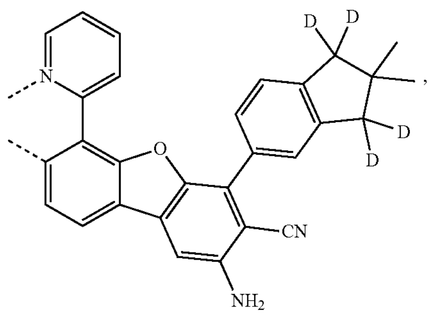
$L_{a4\text{-}187}$
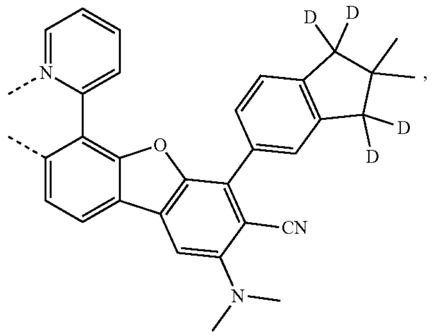
$L_{a4\text{-}188}$
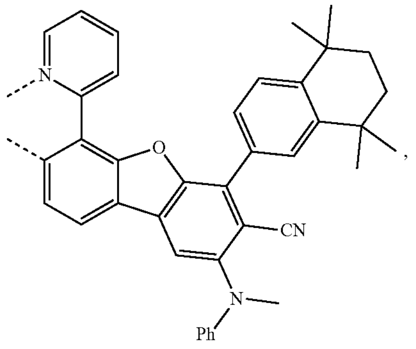
$L_{a4\text{-}189}$
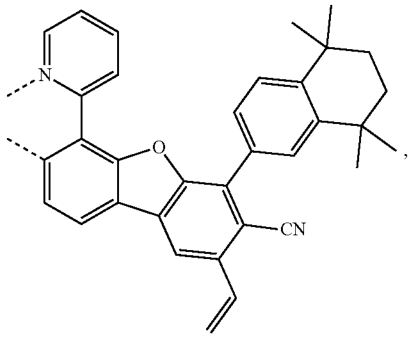
-continued
$L_{a4\text{-}190}$
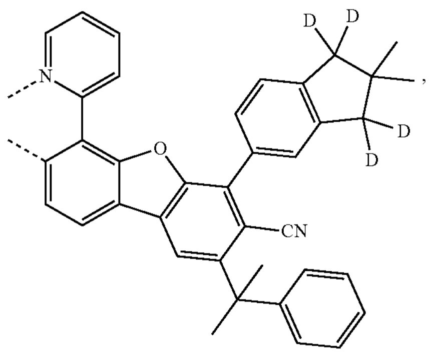
$L_{a4\text{-}191}$
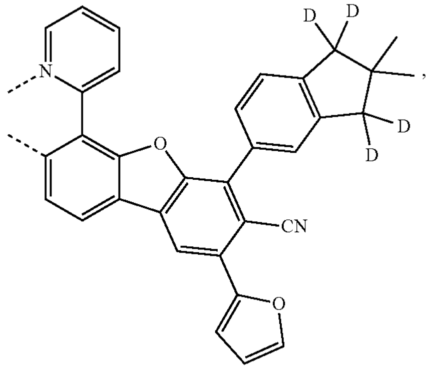
$L_{a4\text{-}192}$
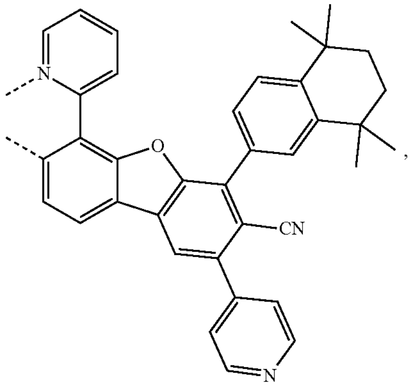
$L_{a4\text{-}193}$
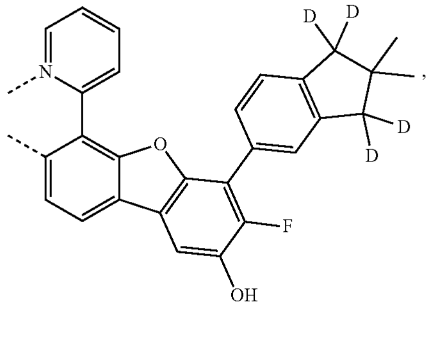

-continued
$L_{a4-194}$
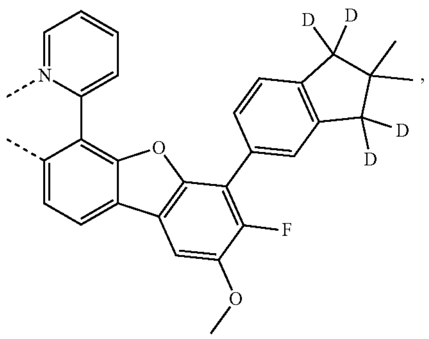
$L_{a4-195}$
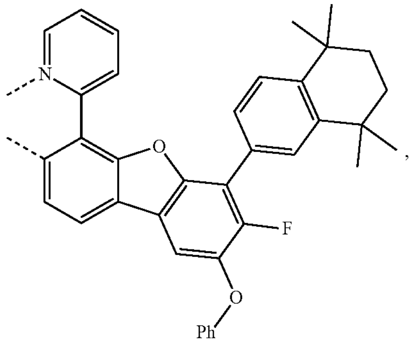
$L_{a4-196}$
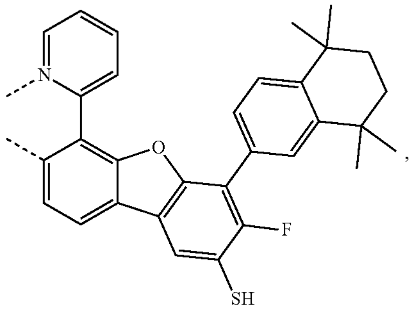
$L_{a4-197}$
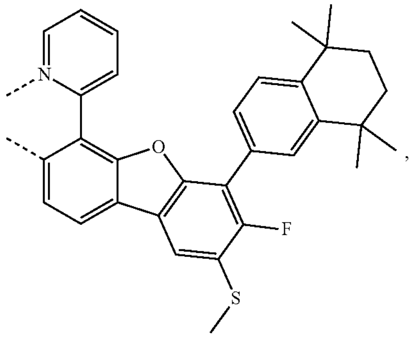
-continued
$L_{a4-198}$
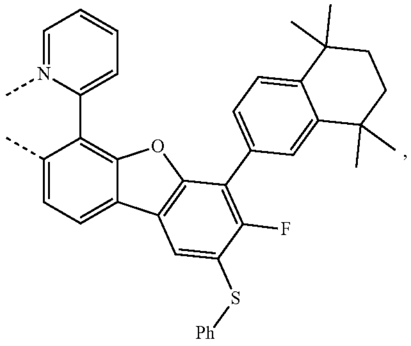
$L_{a4-199}$
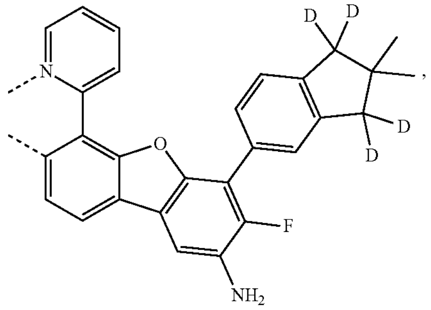
$L_{a4200}$
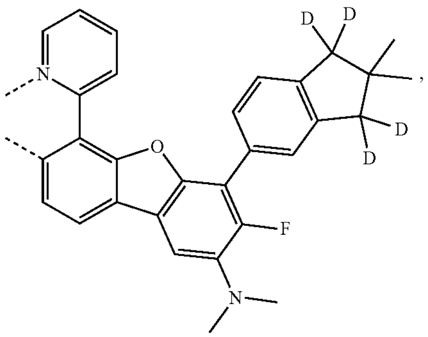
$L_{a4-201}$
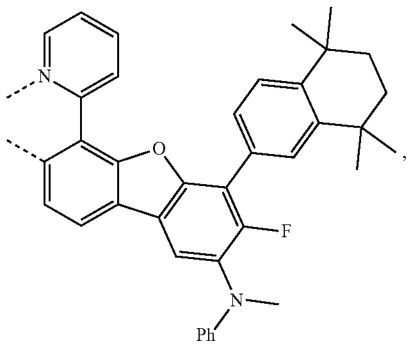

$L_{a4\text{-}202}$
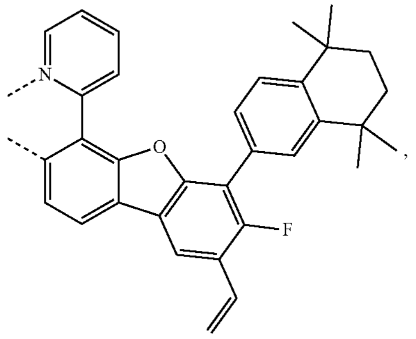
$L_{a4\text{-}203}$
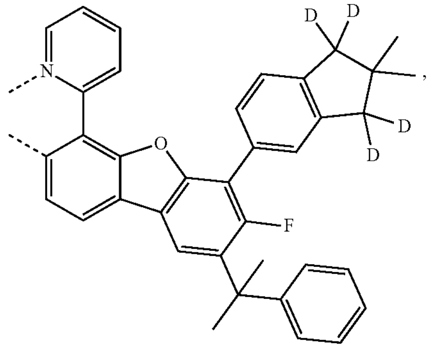
$L_{a4\text{-}204}$
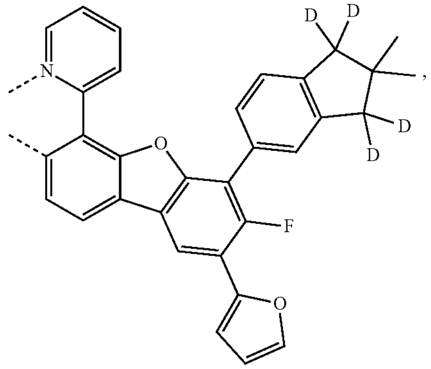
$L_{a4\text{-}205}$
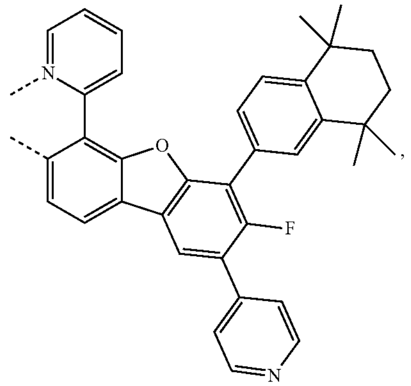
$L_{a4\text{-}206}$
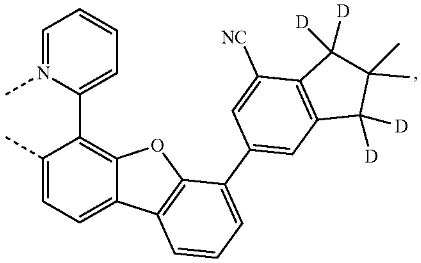
$L_{a4\text{-}207}$
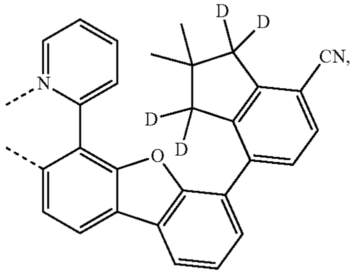
$L_{a4\text{-}208}$
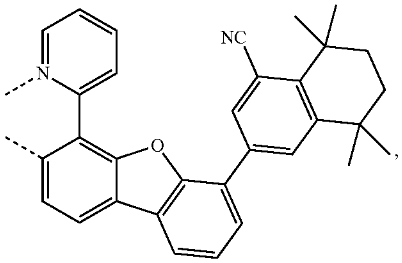
$L_{a4\text{-}209}$
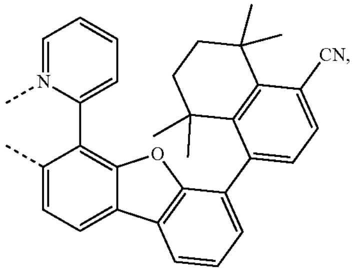
$L_{a4\text{-}210}$
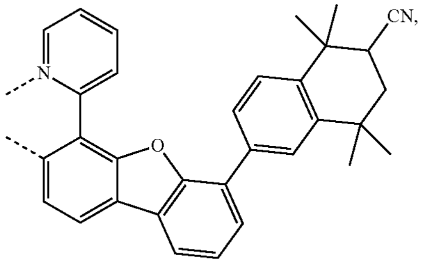

-continued
$L_{a4-213}$
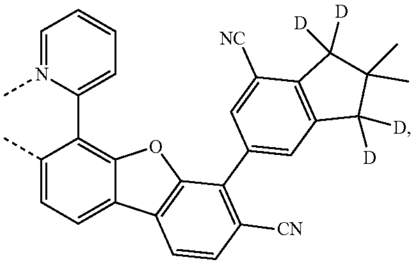
$L_{a4-214}$
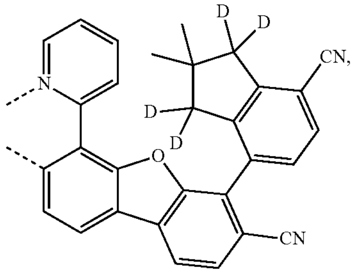
$L_{a4-215}$
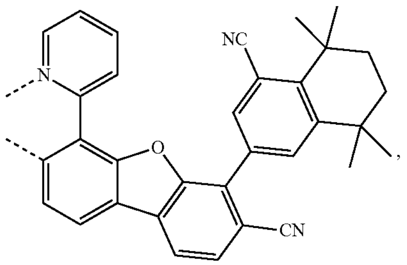
$L_{a4-216}$
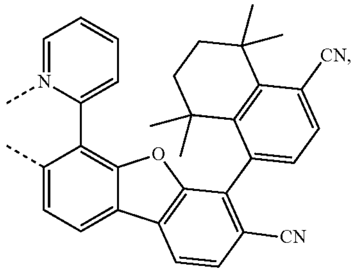
$L_{a4-217}$
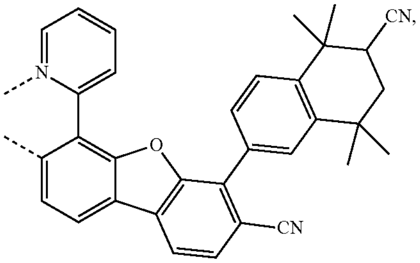
-continued
$L_{a4-220}$
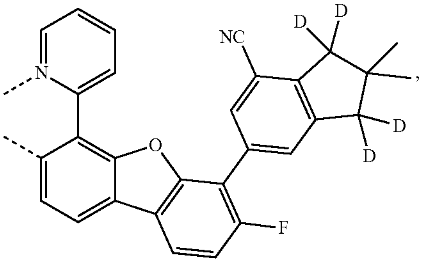
$L_{a4-221}$
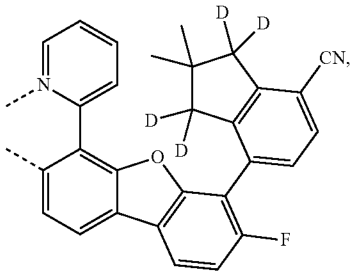
$L_{a4-222}$
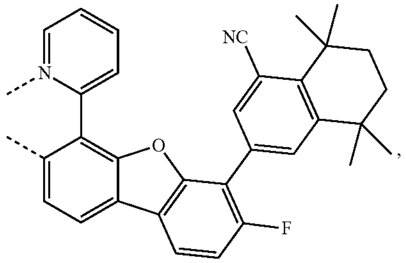
$L_{a4-223}$
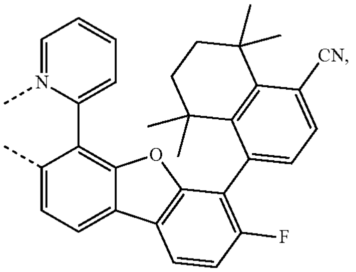
and
$L_{a4-224}$
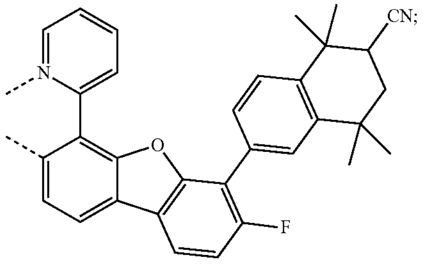
wherein optionally, hydrogens in the above structures of $L_a$ can be partially or fully deuterated.
17. The metal complex of claim 16, wherein $L_b$ is, at each occurrence identically or differently, selected from the group consisting of the following:

-continued
$L_{b1}$
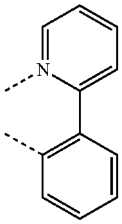
,
$L_{b2}$
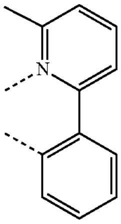
,
$L_{b3}$
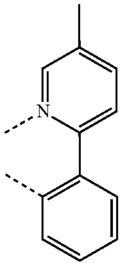
,
$L_{b4}$
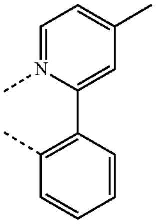
,
$L_{b5}$
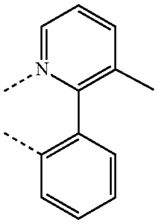
,
$L_{b6}$
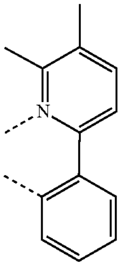
,
$L_{b7}$
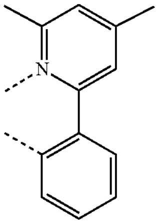
,
$L_{b8}$
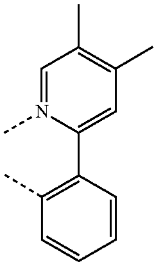
,
$L_{b9}$
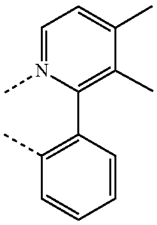
$L_{b10}$
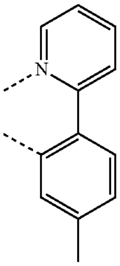
,
$L_{b11}$
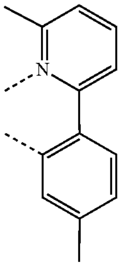
,
$L_{b12}$
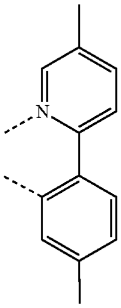
, -continued
$L_{b13}$
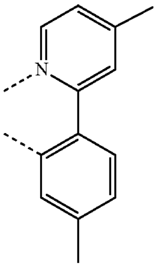
,
$L_{b14}$
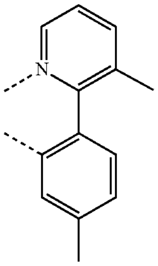
,
$L_{b15}$
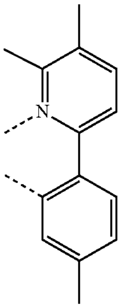
,
$L_{b16}$
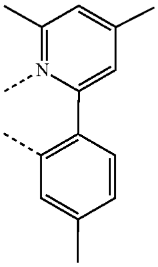
,
$L_{b17}$
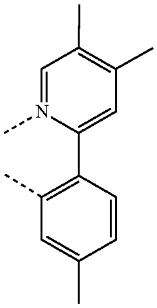
,
-continued
$L_{b18}$
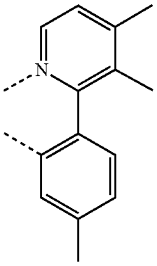
,
$L_{b19}$
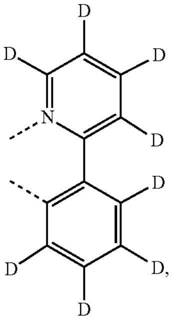
$L_{b20}$
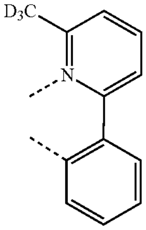
,
$L_{b21}$
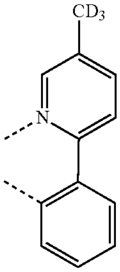
,
$L_{b22}$
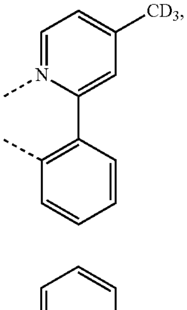
$L_{b23}$
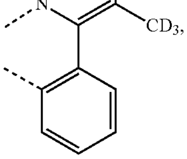

-continued
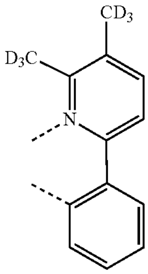
,
$L_{b24}$
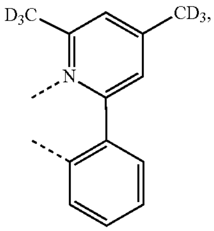
$L_{b25}$
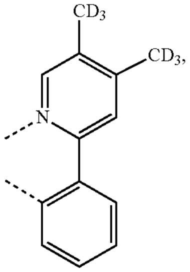
$L_{b26}$
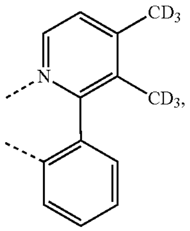
$L_{b27}$
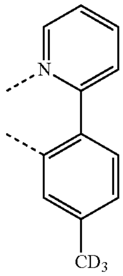
,
$L_{b28}$
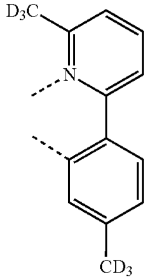
,
$L_{b29}$
-continued
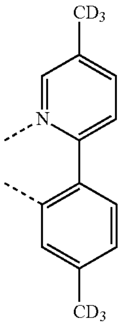
,
$L_{b30}$
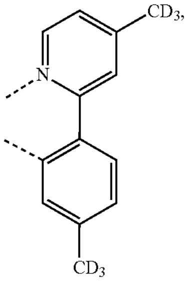
$L_{b31}$
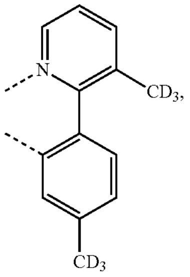
$L_{b32}$
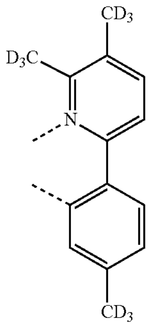
$L_{b33}$
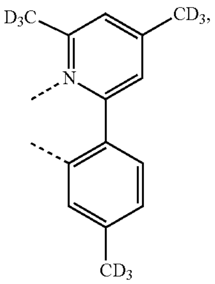
$L_{b34}$ -continued
$L_{b35}$
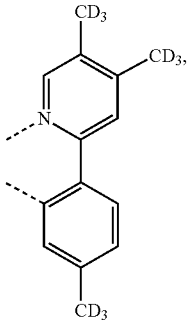
$L_{b36}$
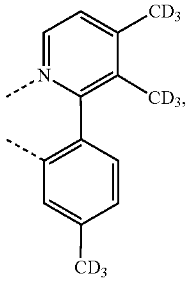
$L_{b37}$
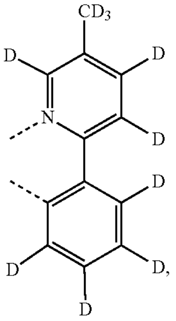
$L_{b38}$
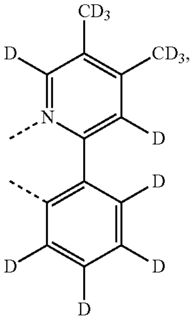
$L_{b39}$
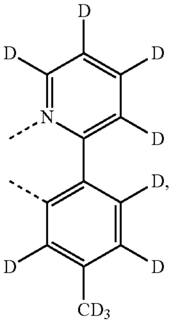
-continued
$L_{b40}$
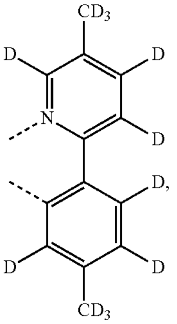
$L_{b41}$
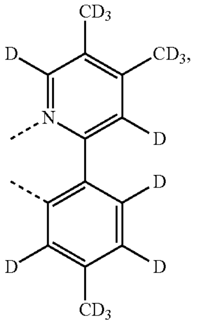
$L_{b42}$
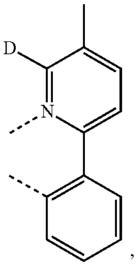
$L_{b43}$
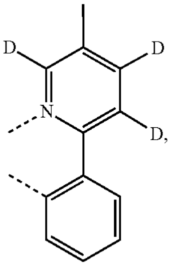
$L_{b44}$
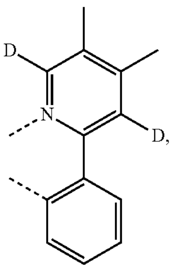

-continued
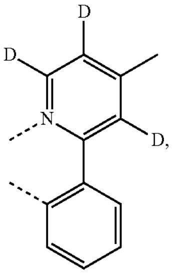
$L_{b45}$
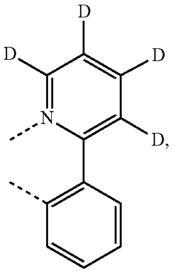
$L_{b46}$
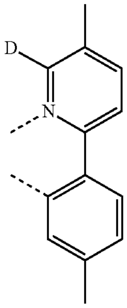
$L_{b47}$
,
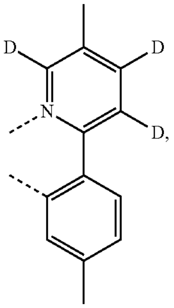
$L_{b48}$
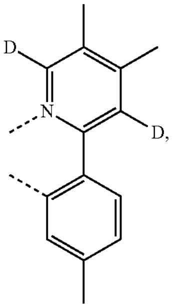
$L_{b49}$
-continued
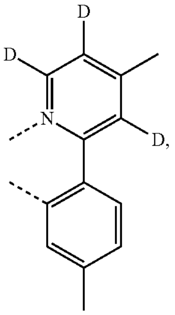
$L_{b50}$
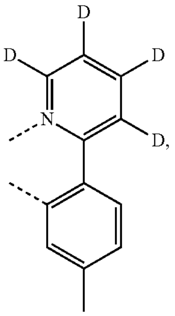
$L_{b51}$
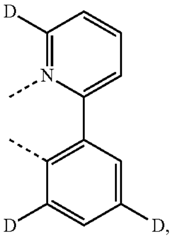
$L_{b52}$
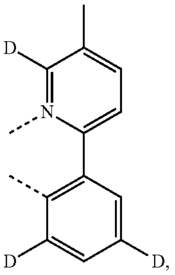
$L_{b53}$
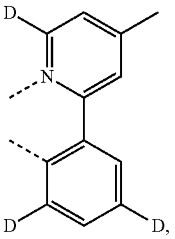
$L_{b54}$ -continued
L$_{b55}$
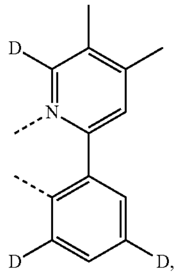
L$_{b56}$
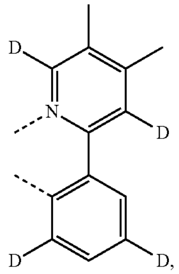
L$_{b57}$
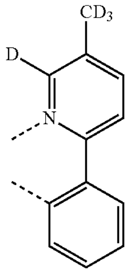
,
L$_{b58}$
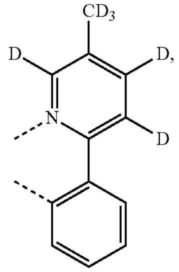
L$_{b59}$
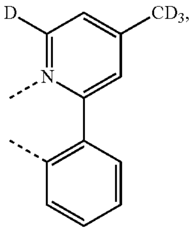
-continued
L$_{b60}$
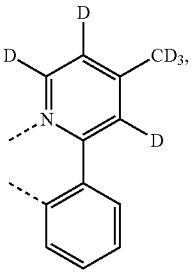
L$_{b61}$
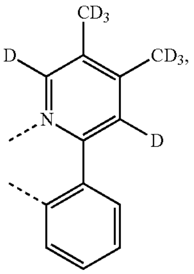
L$_{b62}$
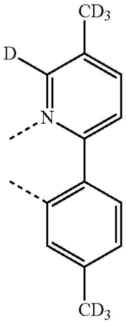
,
L$_{b63}$
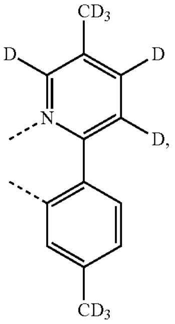
L$_{b64}$
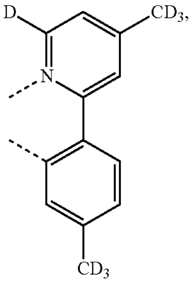

-continued
$L_{b65}$
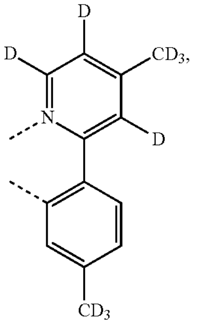
$L_{b66}$
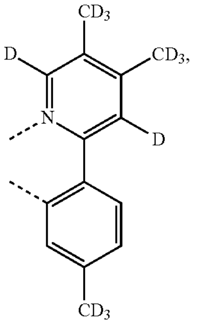
$L_{b67}$
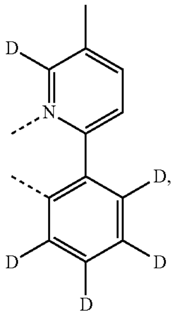
$L_{b68}$
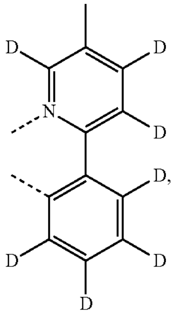
$L_{b69}$
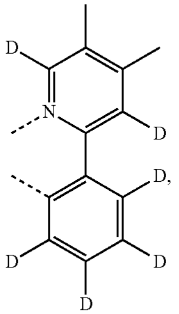
-continued
$L_{b70}$
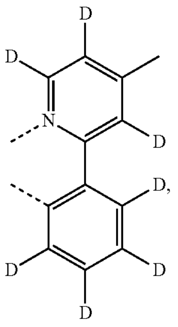
$L_{b71}$
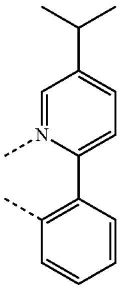
,
$L_{b72}$
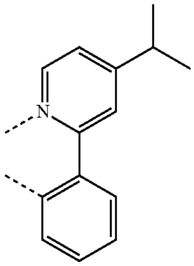
,
$L_{b73}$
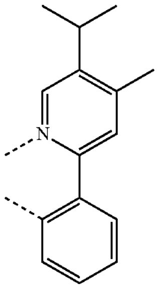
,
$L_{b74}$
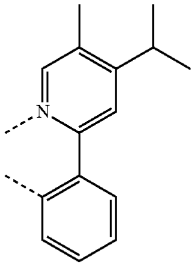
, -continued
$L_{b75}$
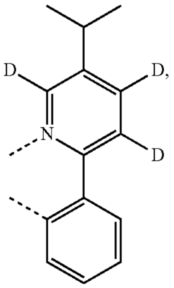
$L_{b76}$
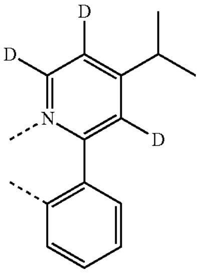
,
$L_{b77}$
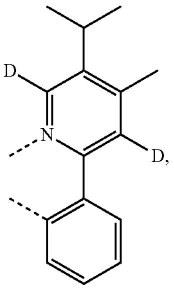
$L_{b78}$
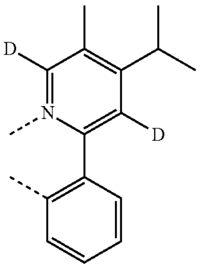
,
$L_{b79}$
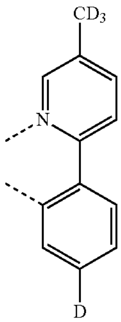
,
-continued
$L_{b80}$
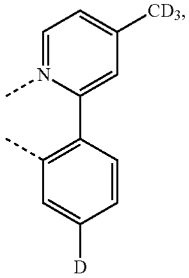
$L_{b81}$
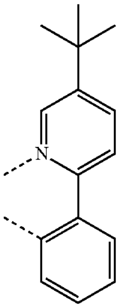
,
$L_{b82}$
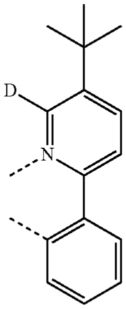
,
$L_{b83}$
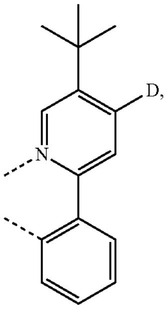
$L_{b84}$
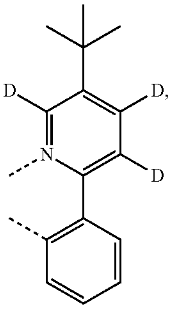

Lb85
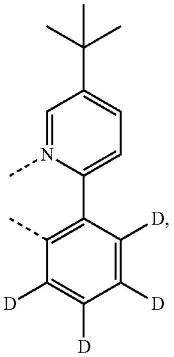
Lb86
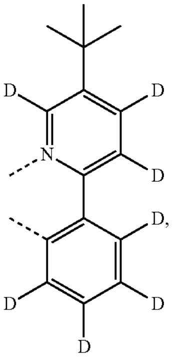
Lb87
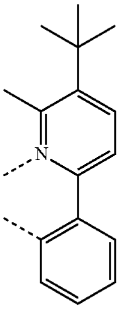
,
Lb88
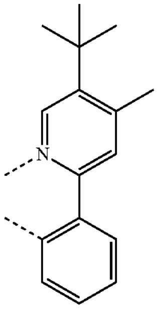
,
Lb89
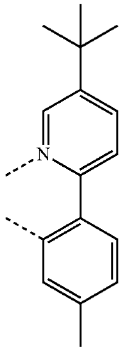
,
Lb90
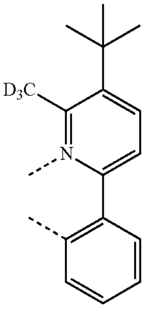
,
Lb91
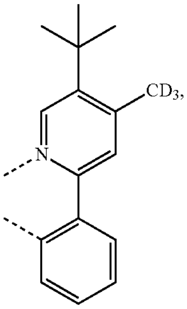
Lb92
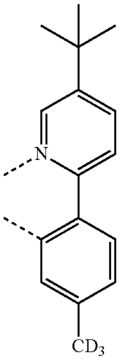
, -continued
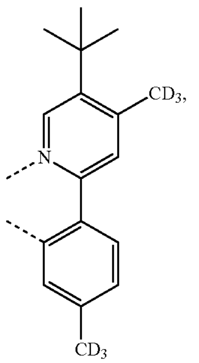
$L_{b93}$
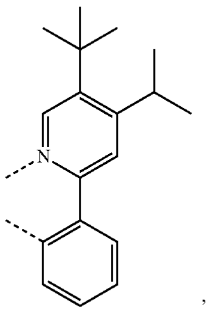
$L_{b94}$
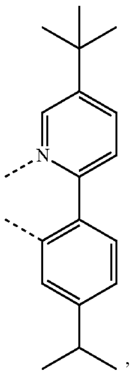
$L_{b95}$
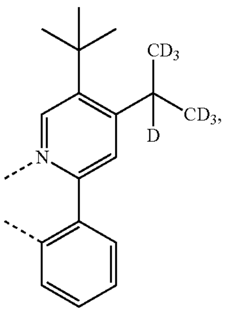
$L_{b96}$
-continued
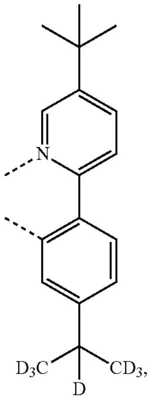
$L_{b97}$
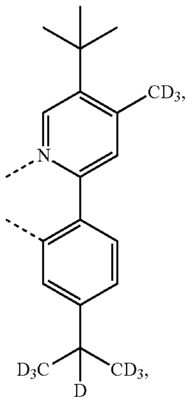
$L_{b98}$
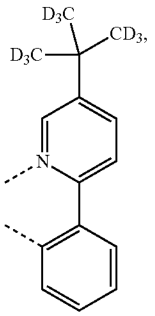
$L_{b99}$
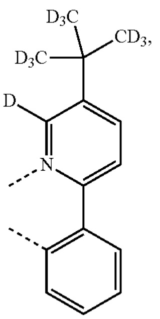
$L_{b100}$ -continued
$L_{b101}$
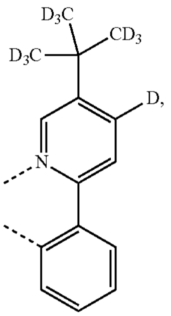
$L_{b102}$
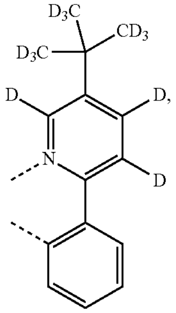
$L_{b103}$
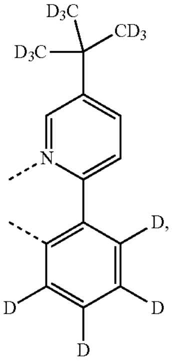
$L_{b104}$
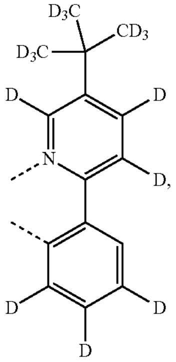
-continued
$L_{b105}$
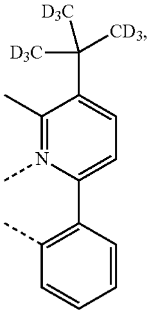
$L_{b106}$
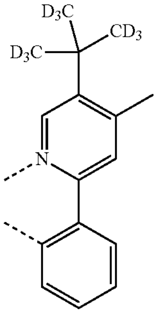
,
$L_{b107}$
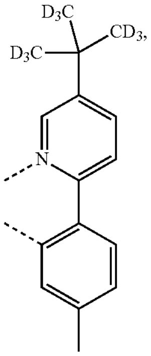
$L_{b108}$
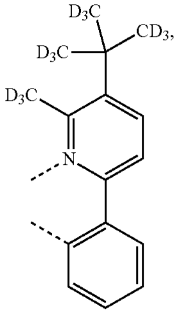
$L_{b109}$
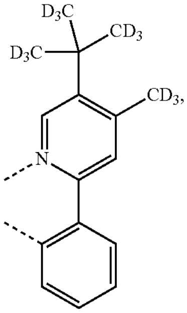

-continued
$L_{b110}$
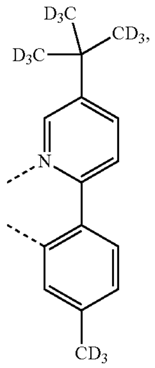
$L_{b111}$
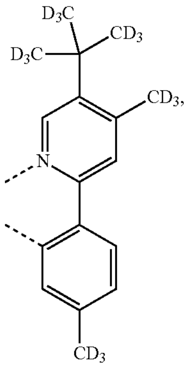
$L_{b112}$
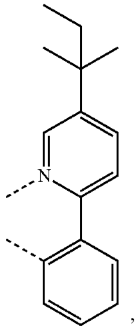
$L_{b113}$
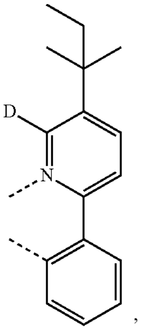
-continued
$L_{b114}$
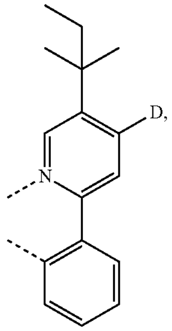
$L_{b115}$
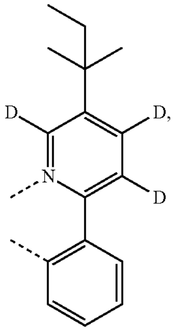
$L_{b116}$
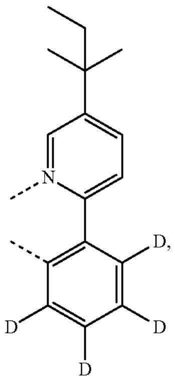
$L_{b117}$
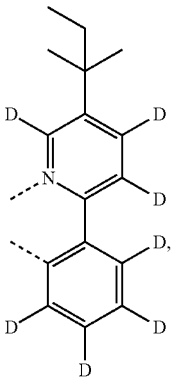

-continued
$L_{b118}$
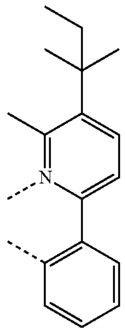
,
$L_{b119}$
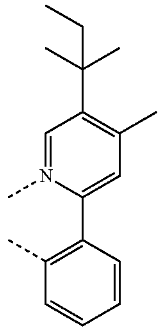
,
$L_{b120}$
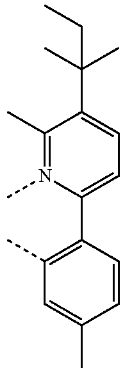
,
$L_{b121}$
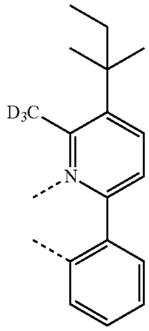
,
-continued
$L_{b122}$
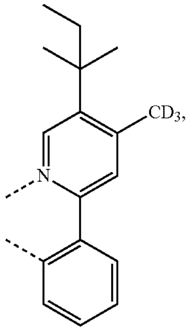
$L_{b123}$
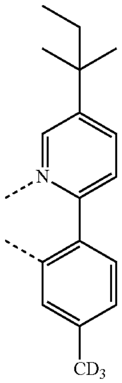
,
$L_{b124}$
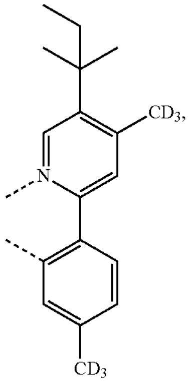
$L_{b125}$
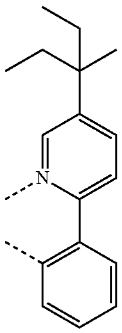
, -continued
$L_{b126}$
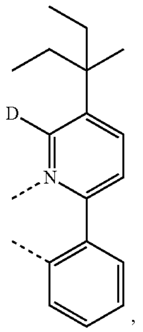
$L_{b127}$
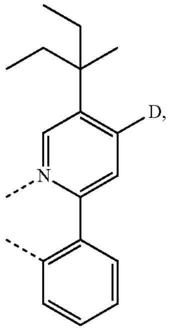
$L_{b128}$
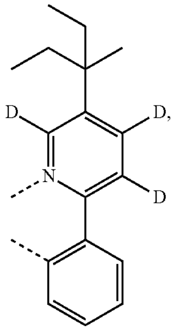
$L_{b129}$
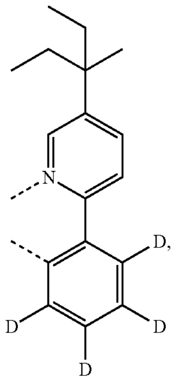
-continued
$L_{b130}$
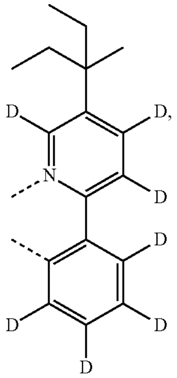
$L_{b131}$
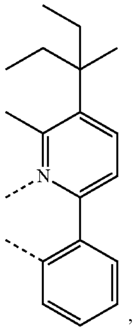
$L_{b132}$
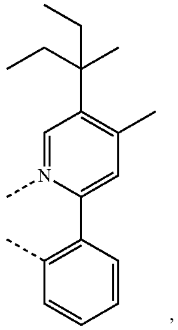
$L_{b133}$
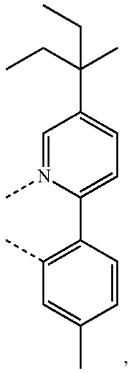

-continued
$L_{b134}$
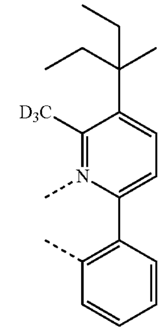
,
$L_{b135}$
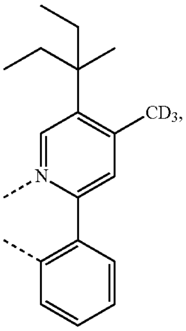
$L_{b136}$
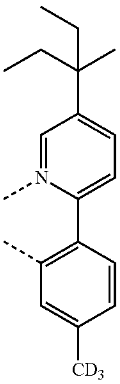
,
$L_{b137}$
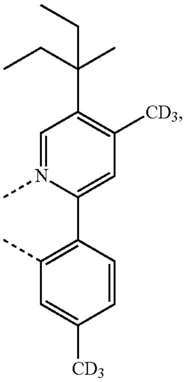
-continued
$L_{b138}$
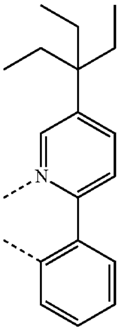
,
$L_{b139}$
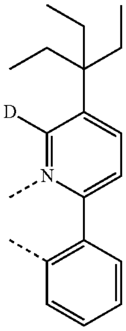
,
$L_{b140}$
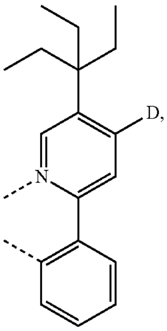
$L_{b141}$
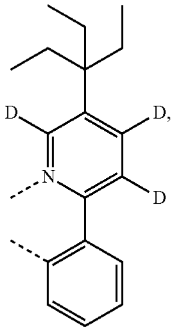

$L_{b142}$
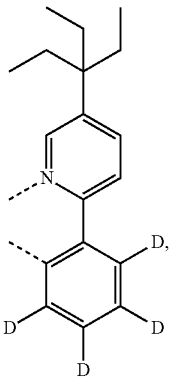
$L_{b143}$
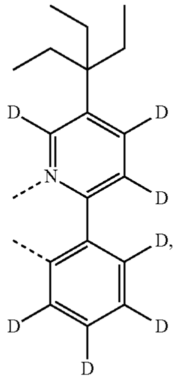
$L_{b144}$
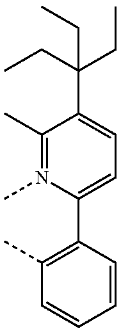
,
$L_{b145}$
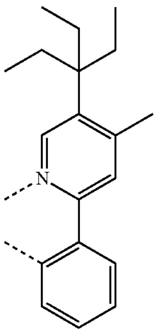
,
$L_{b146}$
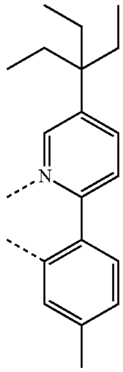
,
$L_{b147}$
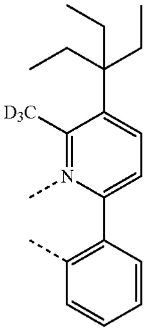
,
$L_{b148}$
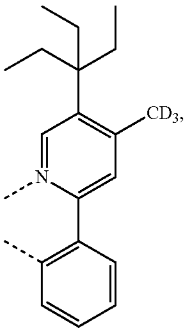
$L_{b149}$
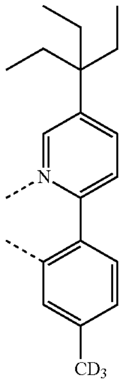
, -continued
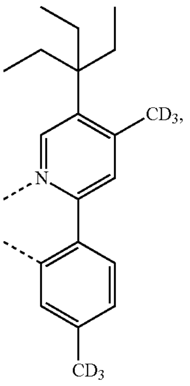
$L_{b150}$
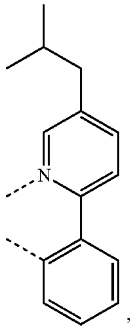
$L_{b151}$
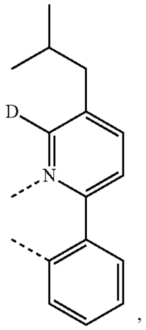
$L_{b152}$
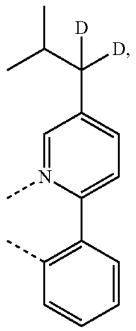
$L_{b153}$
-continued
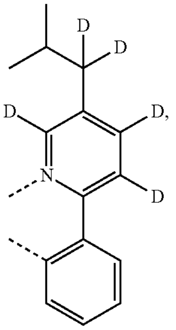
$L_{b154}$
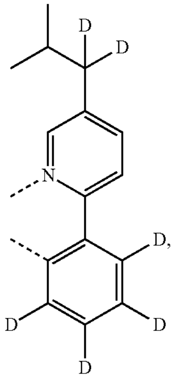
$L_{b155}$
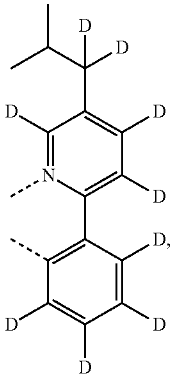
$L_{b156}$
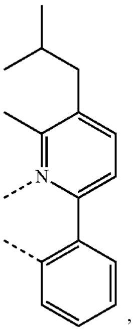
$L_{b157}$ -continued
$L_{b158}$
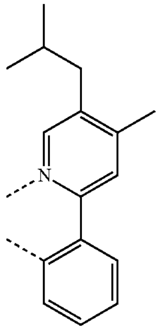
,
$L_{b159}$
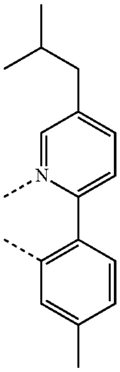
,
$L_{b160}$
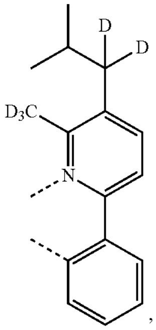
,
$L_{b161}$
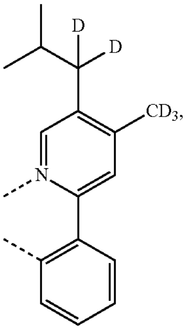
-continued
$L_{b162}$
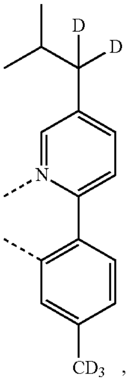
,
$L_{b163}$
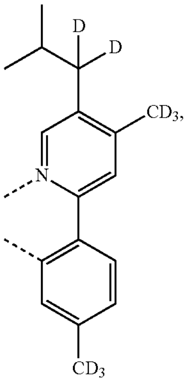
$L_{b164}$
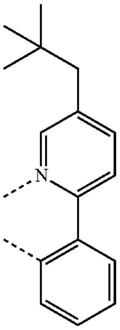
,
$L_{b165}$
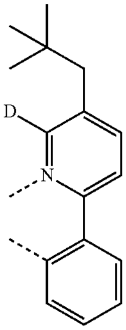
, -continued
$L_{b166}$
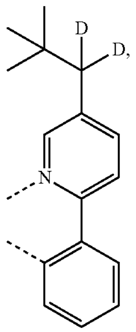
$L_{b167}$
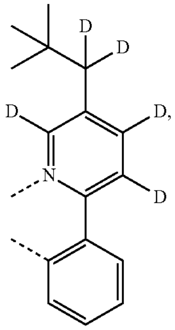
$L_{b168}$
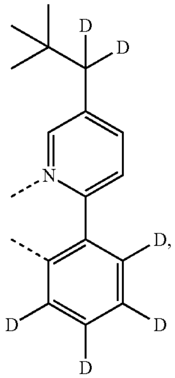
$L_{b169}$
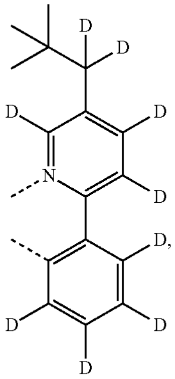
-continued
$L_{b170}$
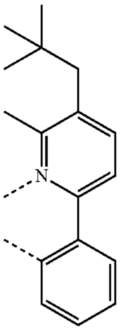
,
$L_{b171}$
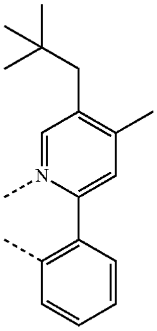
,
$L_{b172}$
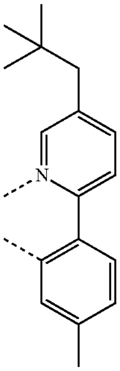
,
$L_{b173}$
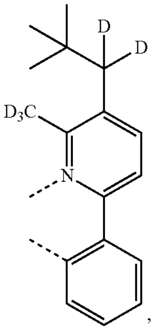
, -continued
$L_{b174}$
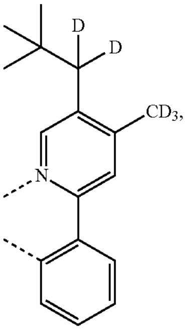
$L_{b175}$
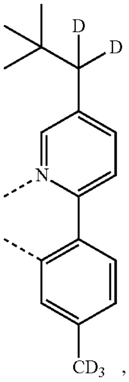
,
$L_{b176}$
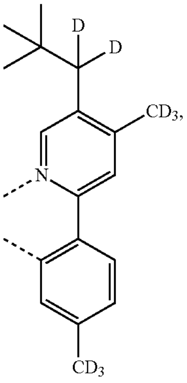
$L_{b177}$
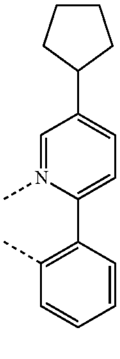
,
-continued
$L_{b178}$
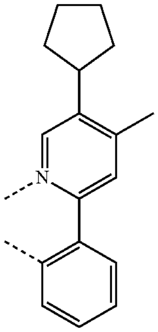
,
$L_{b179}$
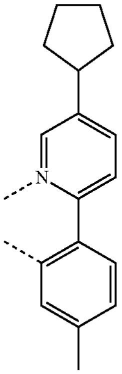
,
$L_{b180}$
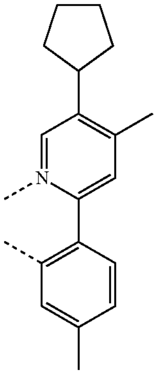
,
$L_{b181}$
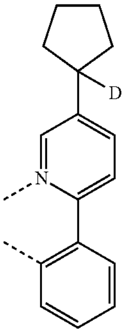
, -continued
$L_{b182}$
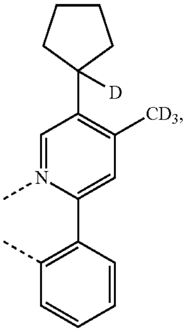
$L_{b183}$
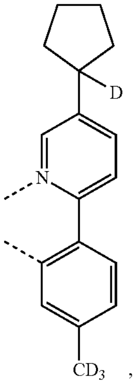
$L_{b184}$
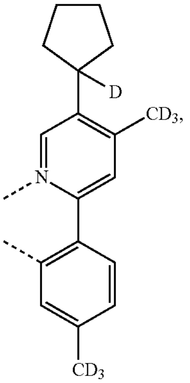
$L_{b185}$
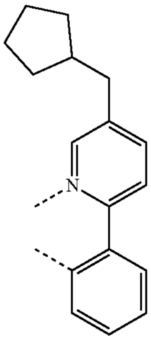
,
-continued
$L_{b186}$
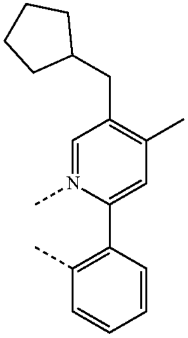
,
$L_{b187}$
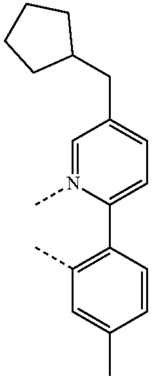
,
$L_{b188}$
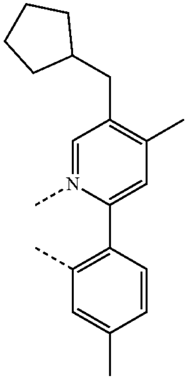
,
$L_{b189}$
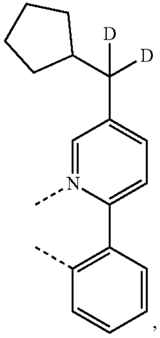
, $L_{b190}$
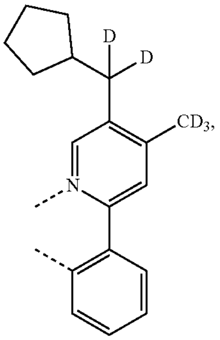
$L_{b191}$
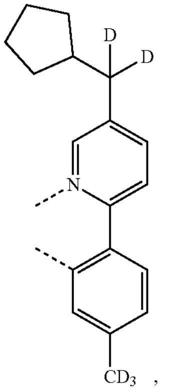
,
$L_{b192}$
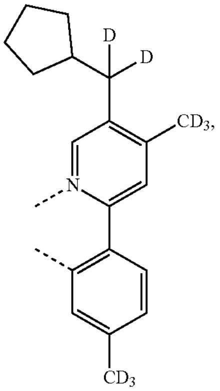
$L_{b193}$
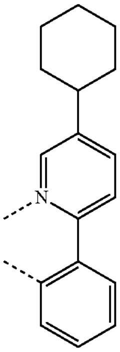
,
$L_{b194}$
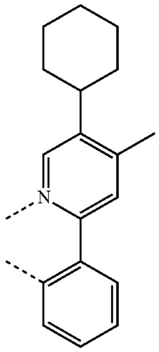
,
$L_{b195}$
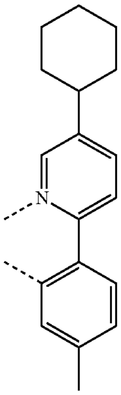
,
$L_{b196}$
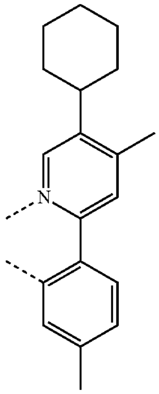
,
$L_{b197}$
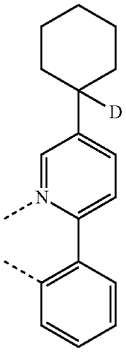
, -continued
$L_{b198}$
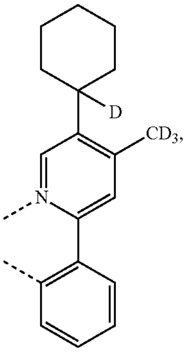
$L_{b199}$
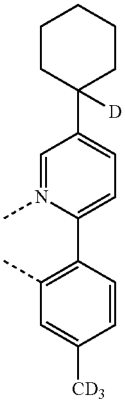
,
$L_{b200}$
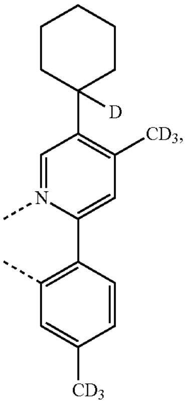
$L_{b201}$
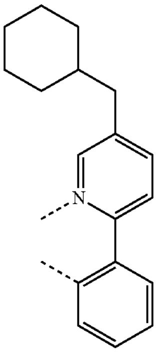
,
-continued
$L_{b202}$
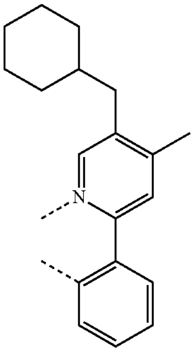
,
$L_{b203}$
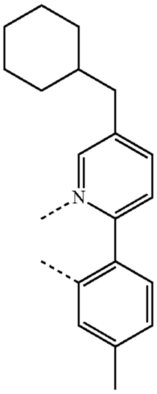
,
$L_{b204}$
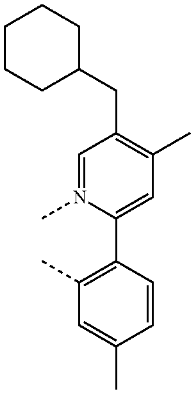
,
$L_{b205}$
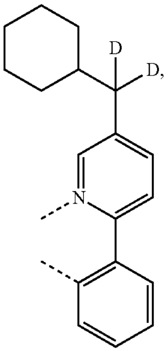

-continued
$L_{b206}$
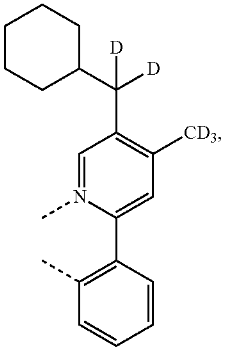
$L_{b207}$
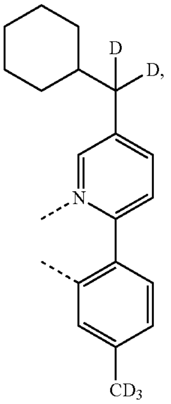
$L_{b208}$
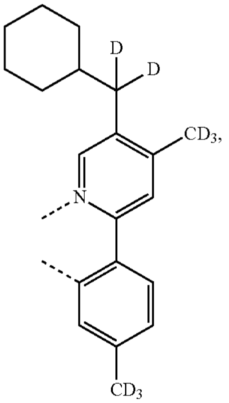
$L_{b209}$
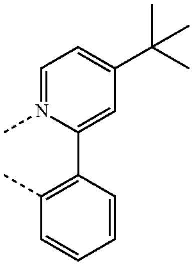
,
-continued
$L_{b210}$
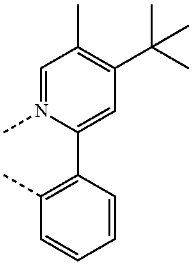
,
$L_{b211}$
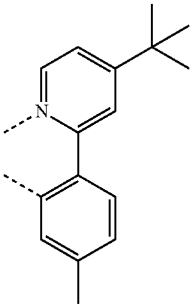
,
$L_{b212}$
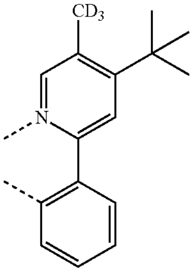
,
$L_{b213}$
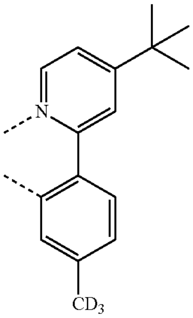
,
$L_{b214}$
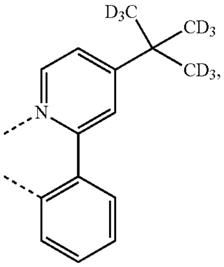

-continued
$L_{b215}$
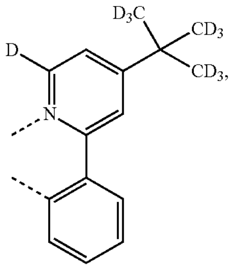
$L_{b216}$
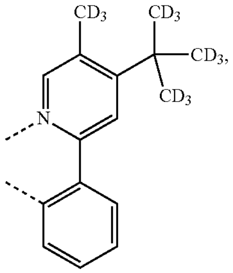
$L_{b217}$
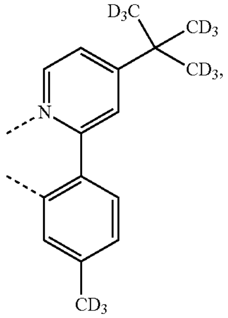
$L_{b218}$
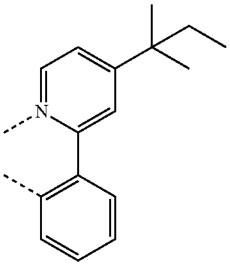
,
$L_{b219}$
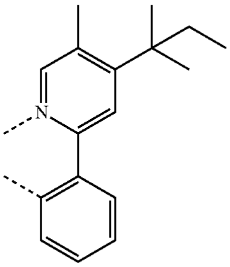
,
-continued
$L_{b220}$
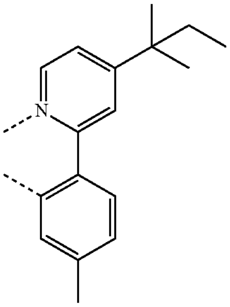
,
$L_{b221}$
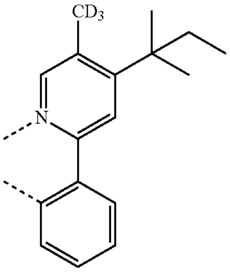
,
$L_{b222}$
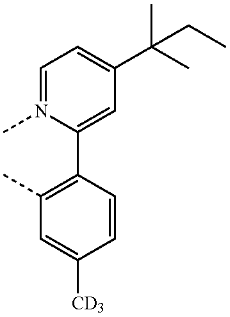
,
$L_{b223}$
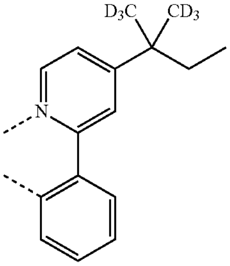
,
$L_{b224}$
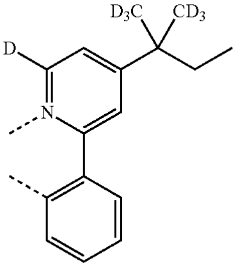
, -continued
$L_{b225}$
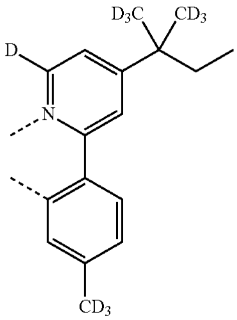
,
$L_{b226}$
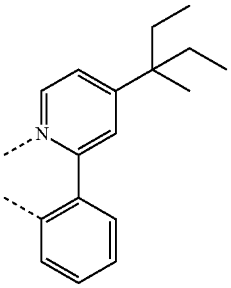
,
$L_{b227}$
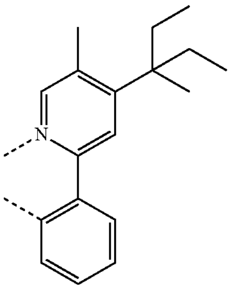
,
$L_{b228}$
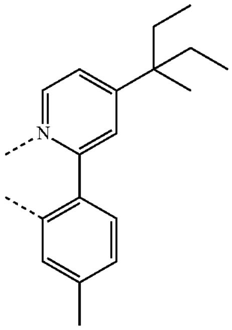
,
$L_{a229}$
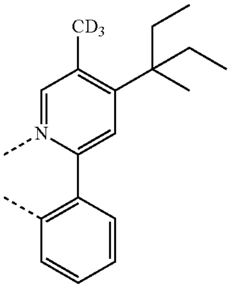
,
-continued
$L_{b230}$
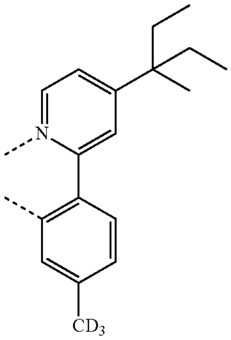
,
$L_{b231}$
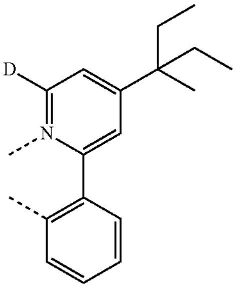
,
$L_{b232}$
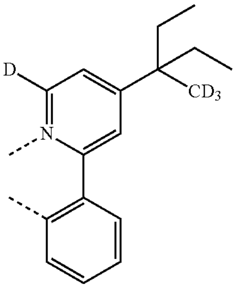
,
$L_{b233}$
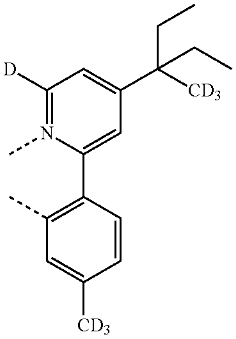
,
$L_{b234}$
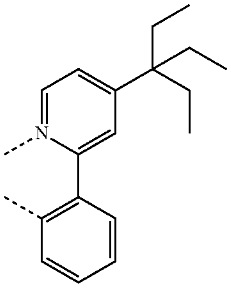
, -continued
$L_{b235}$
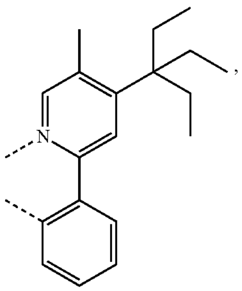
$L_{b236}$
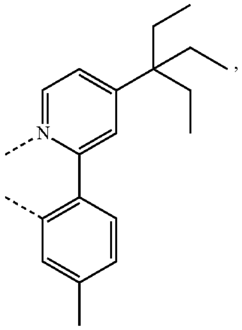
$L_{b237}$
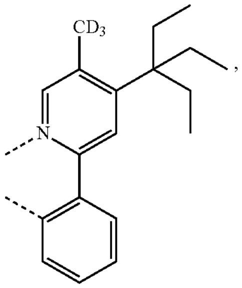
$L_{b238}$
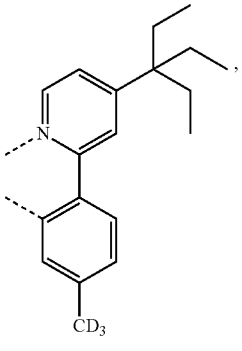
$L_{b239}$
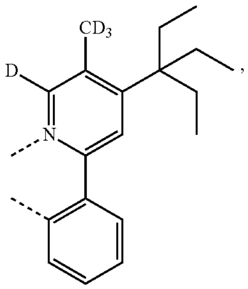
-continued
$L_{b240}$
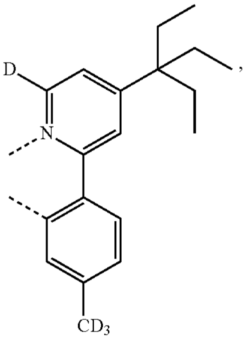
$L_{b241}$
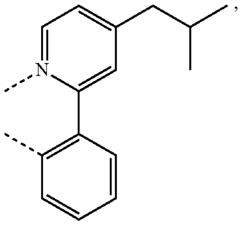
$L_{b242}$
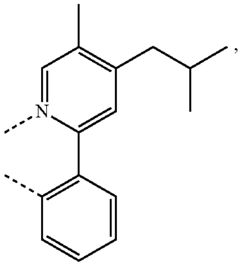
$L_{b243}$
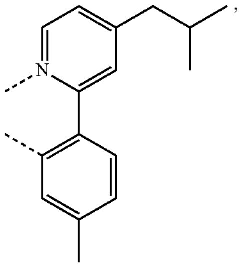
$L_{b244}$
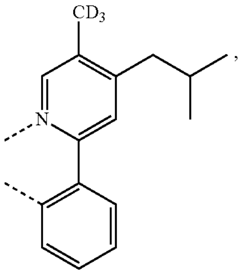

-continued
$L_{b245}$
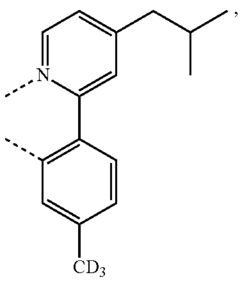
$L_{b246}$
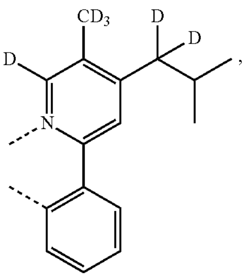
$L_{b247}$
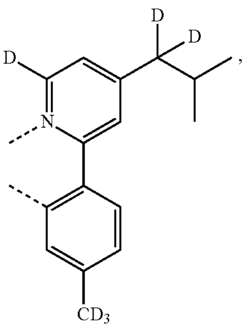
$L_{b248}$
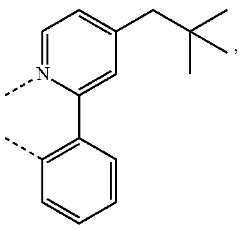
$L_{b249}$
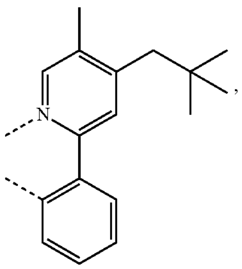
-continued
$L_{b250}$
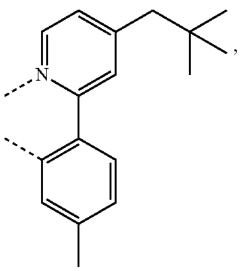
$L_{b251}$
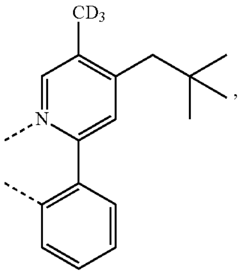
$L_{b252}$
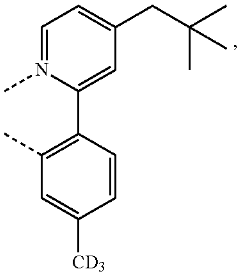
$L_{b253}$
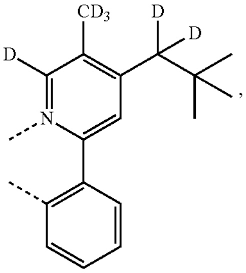
$L_{b254}$
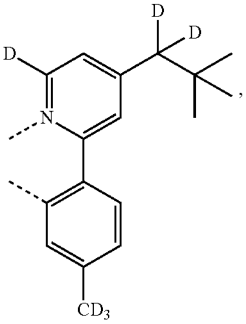

-continued
L$_{b255}$
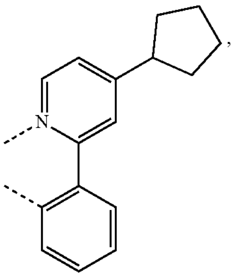
L$_{b256}$
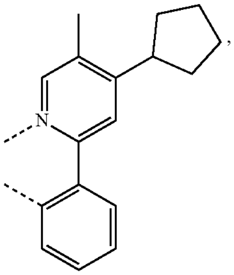
L$_{b257}$
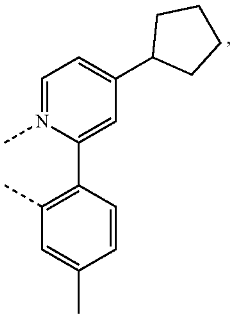
L$_{b258}$
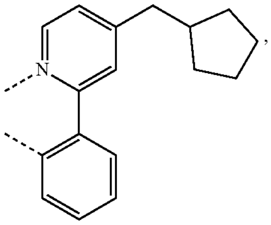
L$_{b259}$
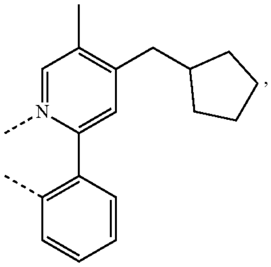
-continued
L$_{b260}$
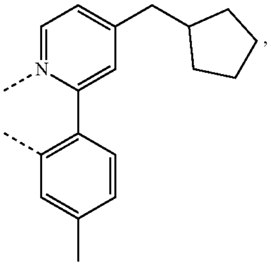
L$_{b261}$
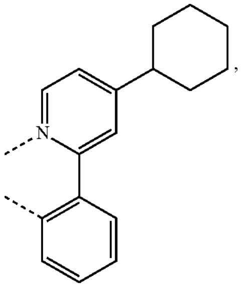
L$_{b262}$
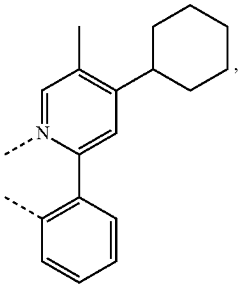
L$_{b263}$
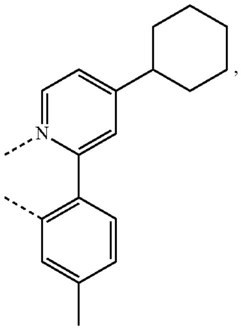
L$_{b264}$
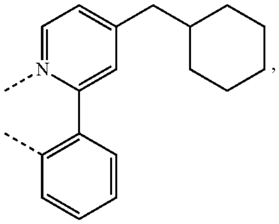

-continued
$L_{b265}$
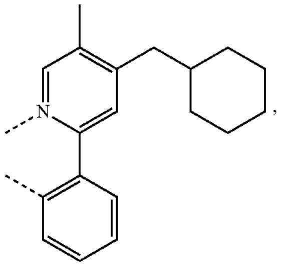
$L_{b266}$
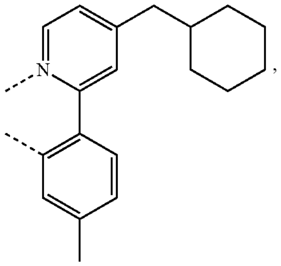
$L_{b267}$
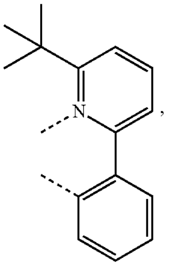
$L_{b268}$
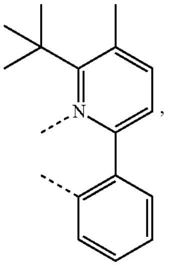
$L_{b269}$
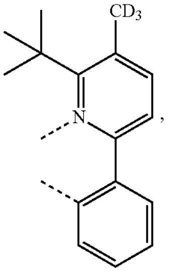
$L_{b270}$
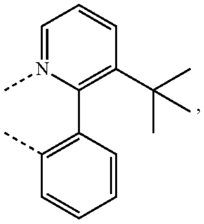
-continued
$L_{b271}$
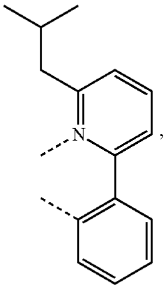
$L_{b272}$
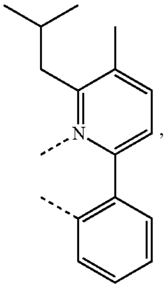
$L_{b273}$
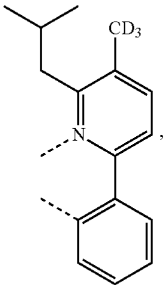
$L_{b274}$
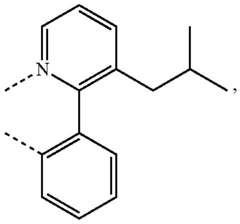
$L_{b275}$
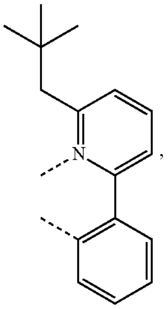

-continued
$L_{b276}$
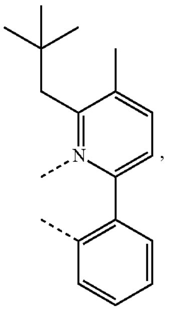
$L_{b277}$
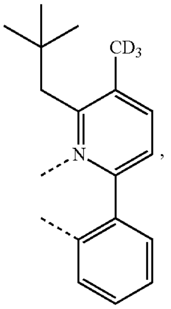
$L_{b278}$
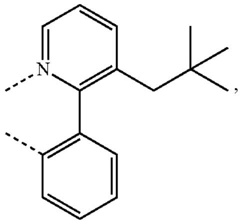
$L_{b279}$
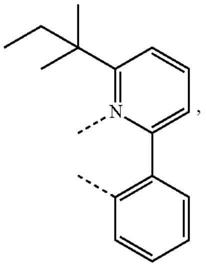
$L_{b280}$
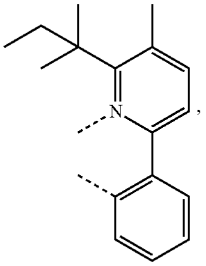
-continued
$L_{b281}$
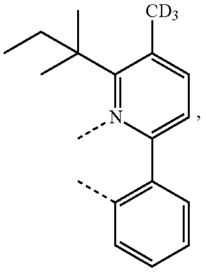
$L_{b282}$
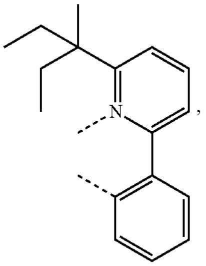
$L_{b283}$
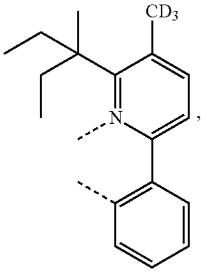
$L_{b284}$
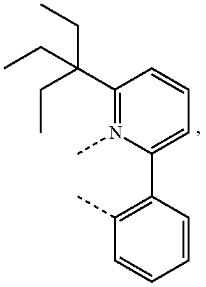
$L_{b285}$
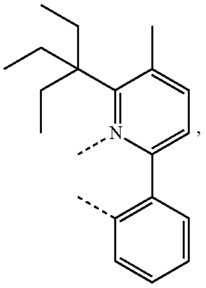

-continued
L_{b286}
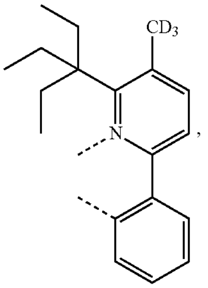
L_{b287}
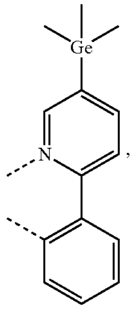
L_{b288}
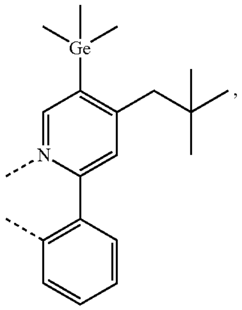
L_{b289}
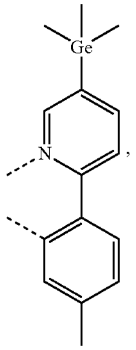
L_{b290}
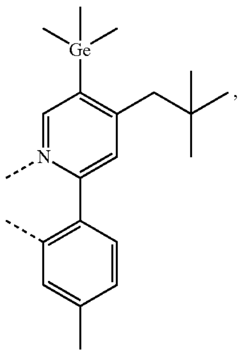
-continued
L_{b291}
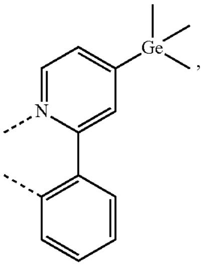
L_{b292}
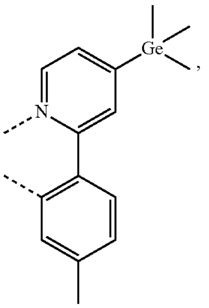
L_{b293}
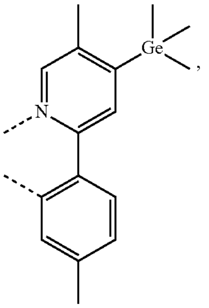
L_{b294}
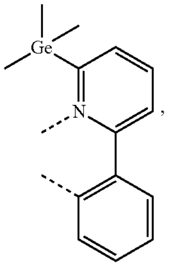
L_{b295}
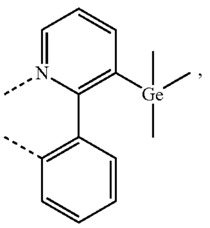

-continued
$L_{b296}$
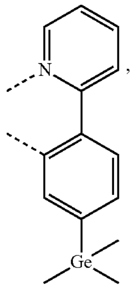
$L_{b297}$
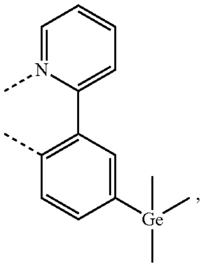
$L_{b298}$
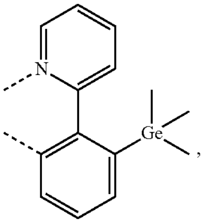
$L_{b299}$
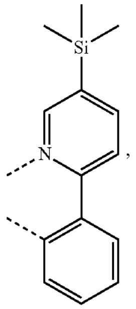
$L_{b300}$
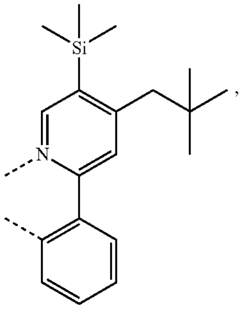
-continued
$L_{b301}$
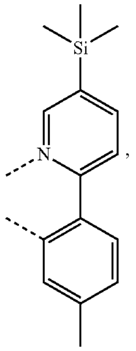
$L_{b302}$
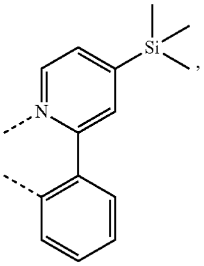
$L_{b303}$
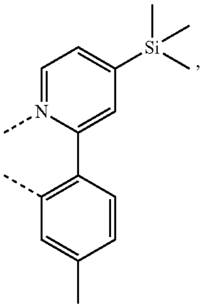
$L_{b304}$
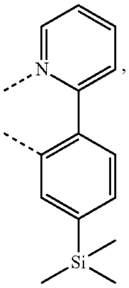
$L_{b305}$
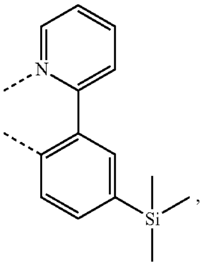

L$_{b306}$
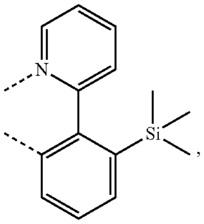
,
L$_{b307}$
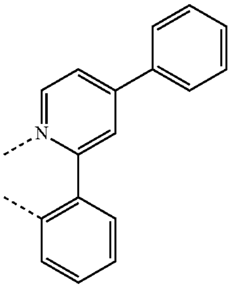
,
L$_{b308}$
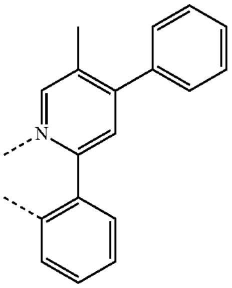
,
L$_{b309}$
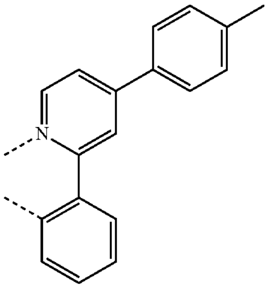
,
L$_{b310}$
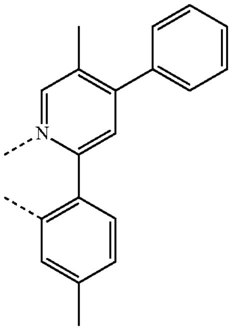
,
L$_{b311}$
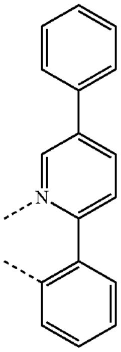
,
L$_{b312}$
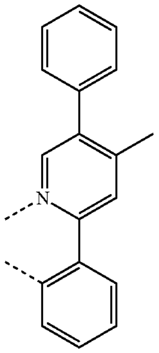
,
L$_{b313}$
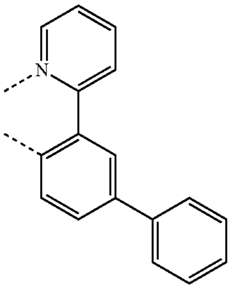
,
L$_{b314}$
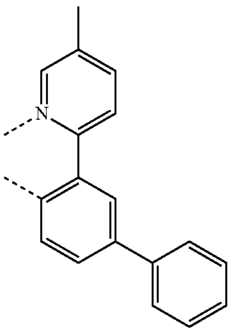
, -continued
$L_{b315}$
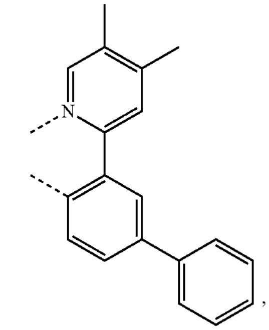
$L_{b316}$
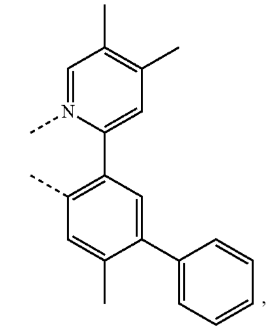
$L_{b317}$
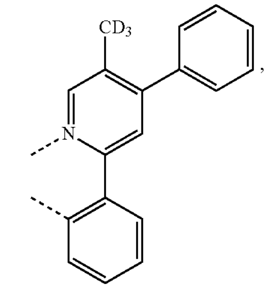
$L_{b318}$
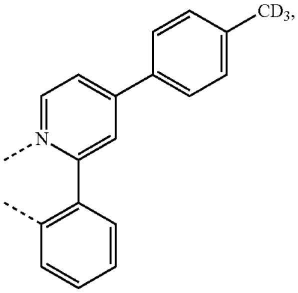
$L_{b319}$
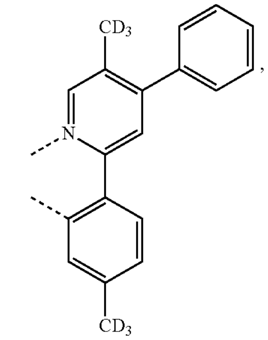
-continued
$L_{b320}$
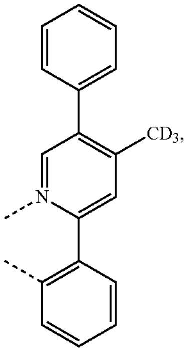
$L_{b321}$
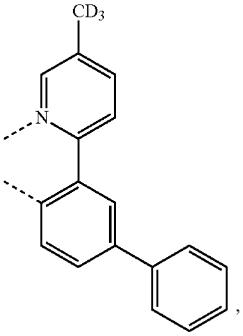
$L_{b322}$
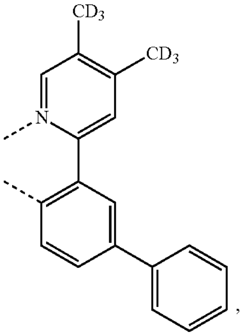
$L_{b323}$
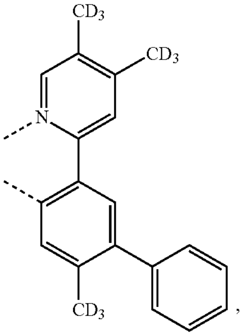

-continued
$L_{b324}$
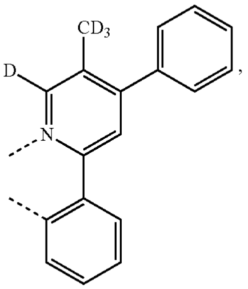
$L_{b325}$
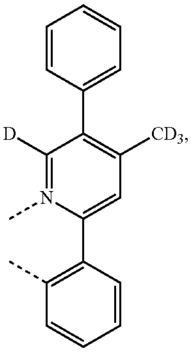
$L_{b326}$
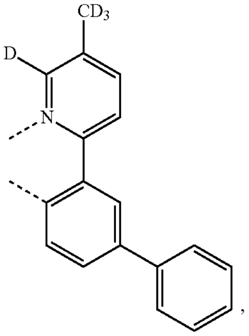
$L_{b327}$
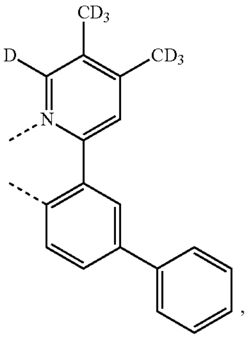
-continued
$L_{b328}$
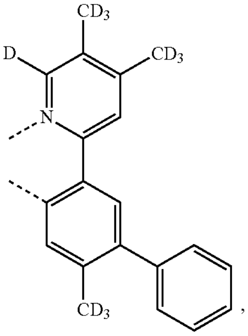
and
$L_{b329}$
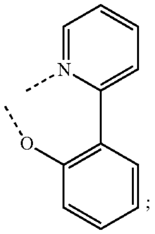
wherein optionally, hydrogens in the structures of $L_{b1}$ to $L_{b329}$ can be partially or fully deuterated.
18. The metal complex of claim 17, wherein $L_c$ is, at each occurrence identically or differently, selected from the group consisting of the following:
$L_{c1}$
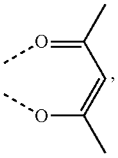
$L_{c2}$
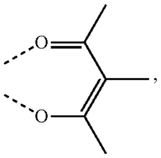
$L_{c3}$
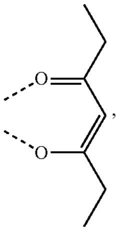
$L_{c4}$
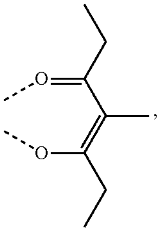

-continued
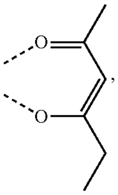
$L_{c5}$
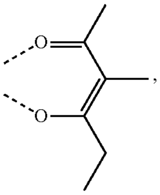
$L_{c6}$
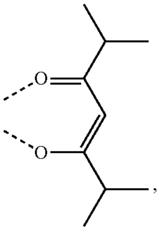
$L_{c7}$
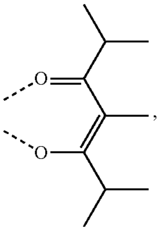
$L_{c8}$
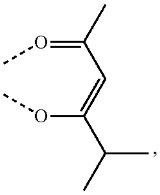
$L_{c9}$
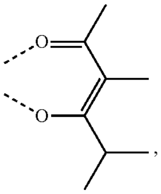
$L_{c10}$
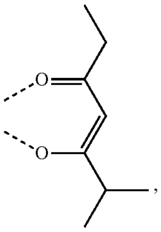
$L_{c11}$
-continued
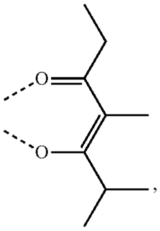
$L_{c12}$
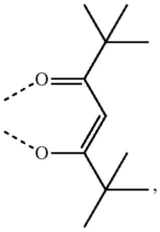
$L_{c13}$
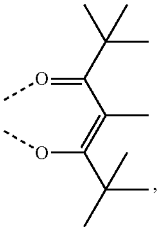
$L_{c14}$
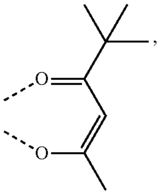
$L_{c15}$
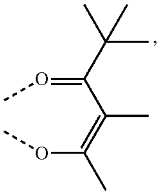
$L_{c16}$
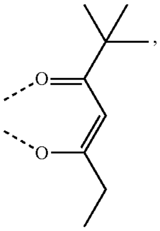
$L_{c17}$
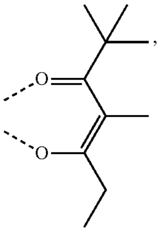
$L_{c18}$ -continued
$L_{c19}$
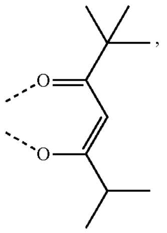
$L_{c20}$
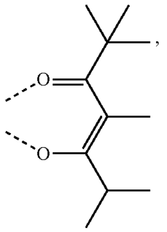
$L_{c21}$
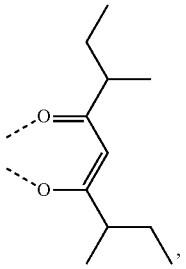
$L_{c22}$
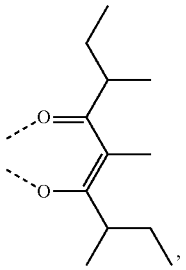
$L_{c23}$
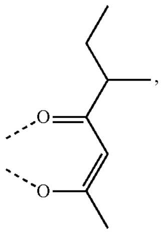
$L_{c24}$
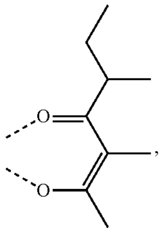
-continued
$L_{c25}$
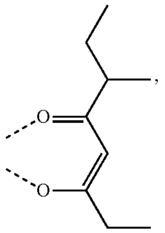
$L_{c26}$
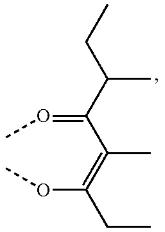
$L_{c27}$
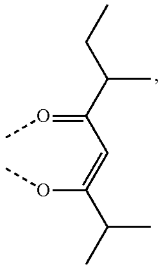
$L_{c28}$
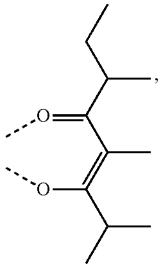
$L_{c29}$
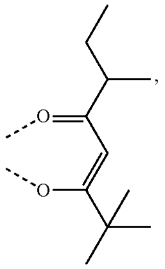
$L_{c30}$
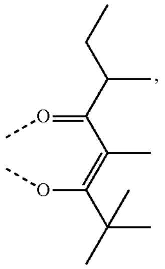

Lc31
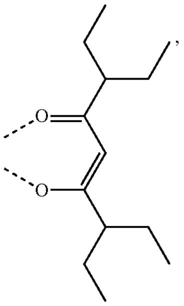
Lc32
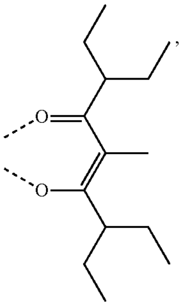
Lc33
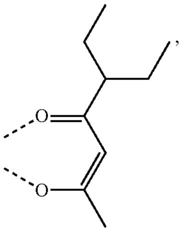
Lc34
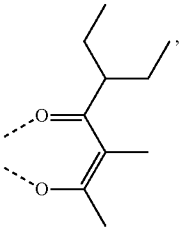
Lc35
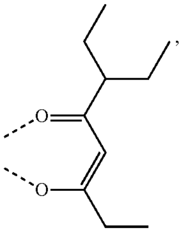
Lc36
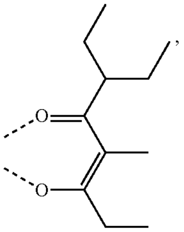
Lc37
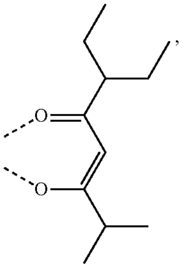
Lc38
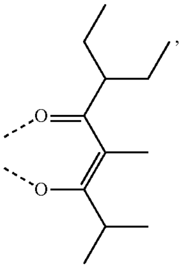
Lc39
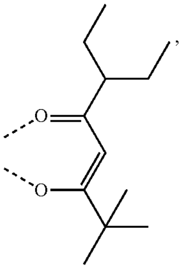
Lc40
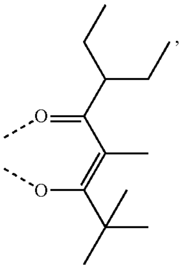
Lc41
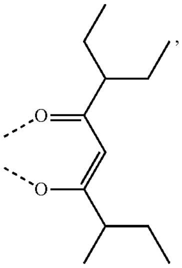

-continued
$L_{c42}$
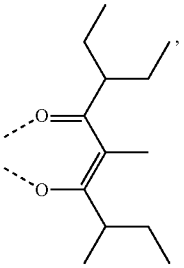
$L_{c43}$
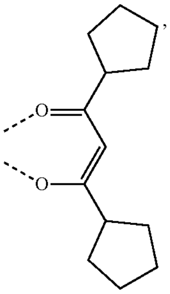
$L_{c44}$
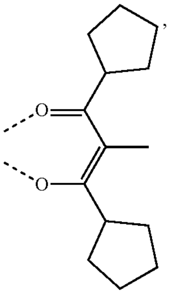
$L_{c45}$
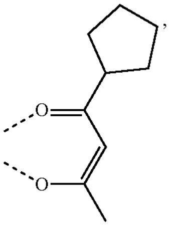
$L_{c46}$
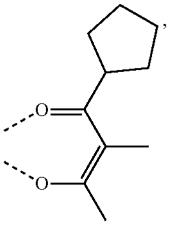
$L_{c47}$
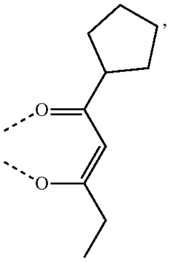
-continued
$L_{c48}$
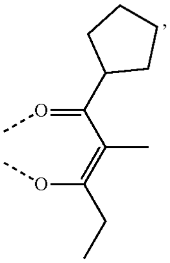
$L_{c49}$
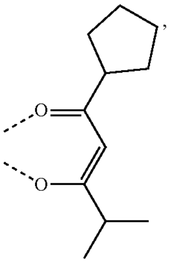
$L_{c50}$
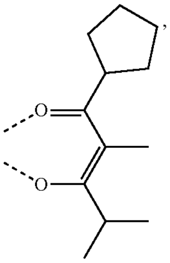
$L_{c51}$
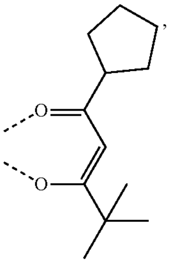
$L_{c52}$
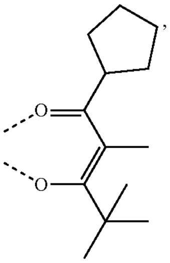
$L_{c53}$
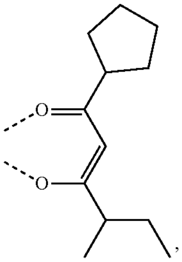

-continued
$L_{c54}$
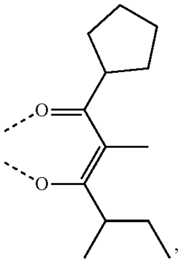
$L_{c55}$
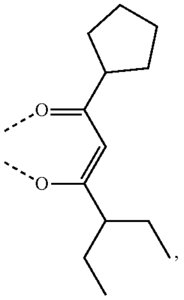
$L_{c56}$
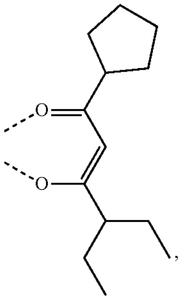
$L_{c57}$
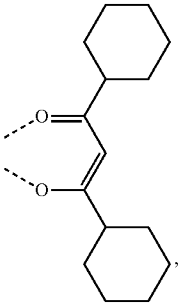
$L_{c58}$
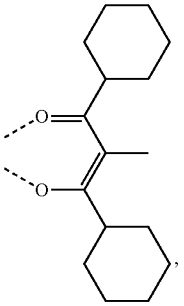
-continued
$L_{c59}$
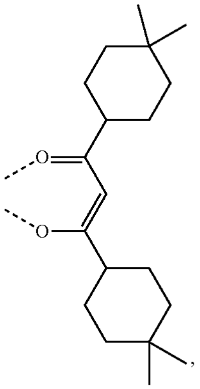
$L_{c60}$
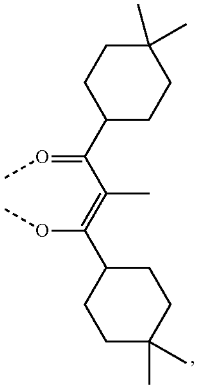
$L_{c61}$
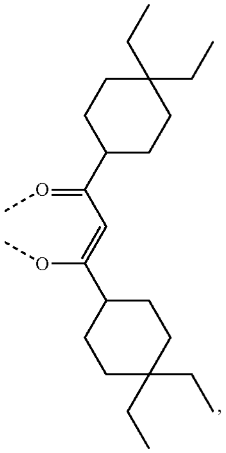

$L_{c62}$
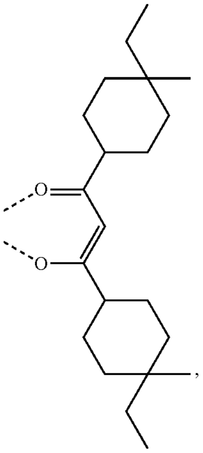
$L_{c63}$
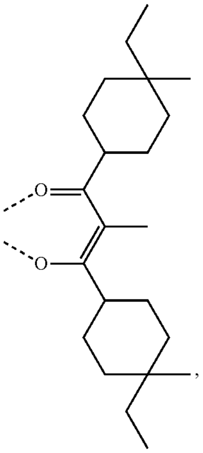
$L_{c64}$
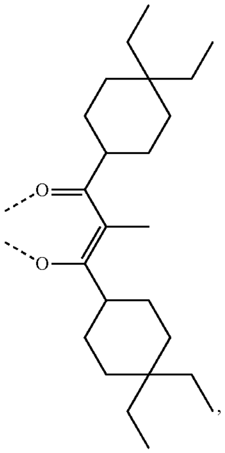
$L_{c65}$
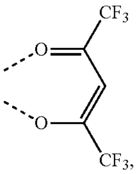
$L_{c66}$
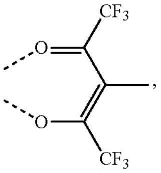
$L_{c67}$
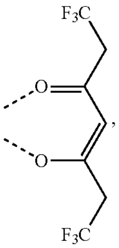
$L_{c68}$
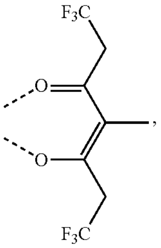
$L_{c69}$
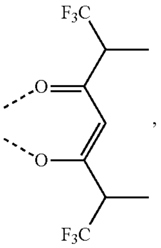
$L_{c70}$
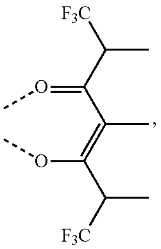
$L_{c71}$
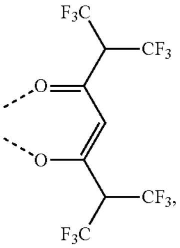

-continued
Lc72
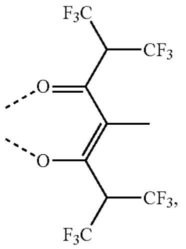
Lc73
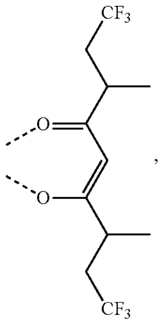
Lc74
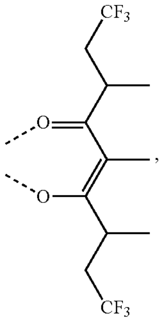
Lc75
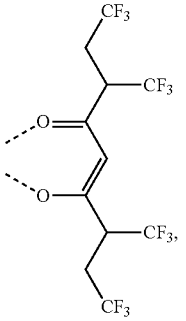
Lc76
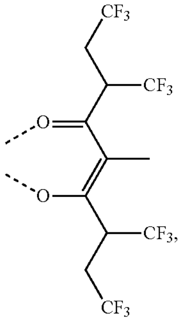
-continued
Lc77
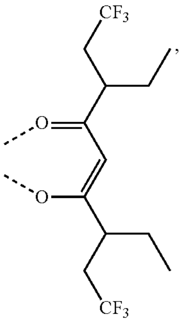
Lc78
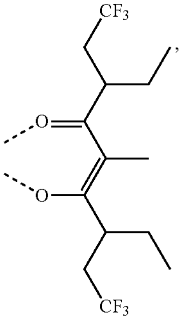
Lc79
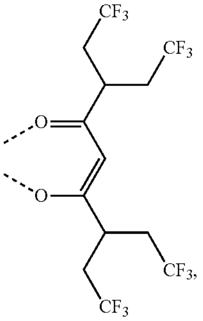
Lc80
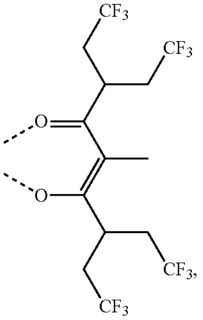
Lc81
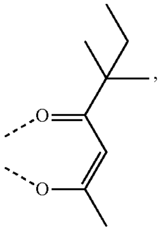

-continued
$L_{c82}$
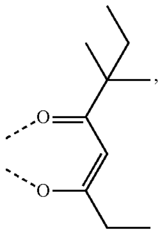
$L_{c83}$
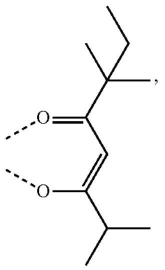
$L_{c84}$
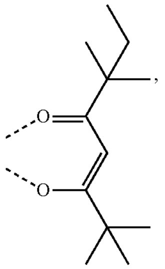
$L_{c85}$
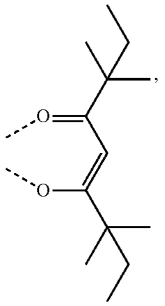
$L_{c86}$
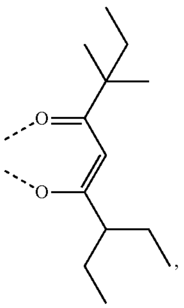
-continued
$L_{c87}$
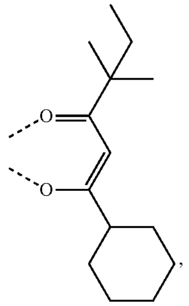
$L_{c88}$
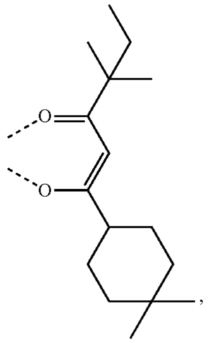
$L_{c89}$
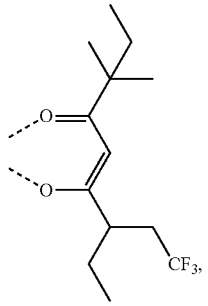
$L_{c90}$
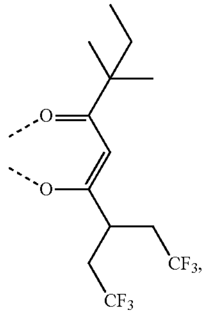
$L_{c91}$
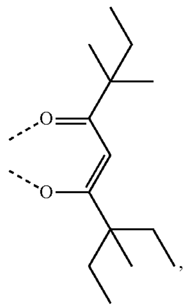

$L_{c92}$
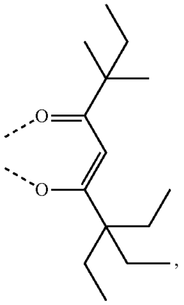
$L_{c93}$
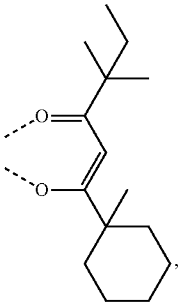
$L_{c94}$
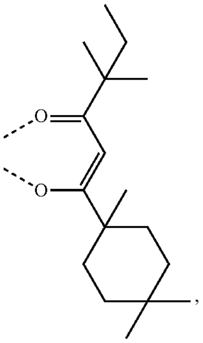
$L_{c95}$
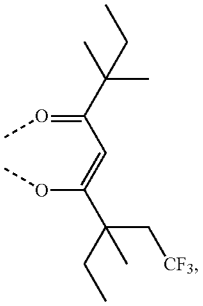
$L_{c96}$
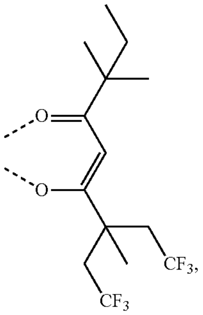
$L_{c97}$
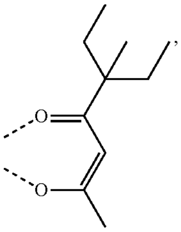
$L_{c98}$
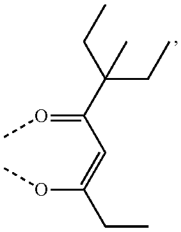
$L_{c99}$
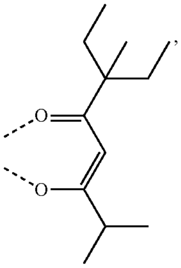
$L_{c100}$
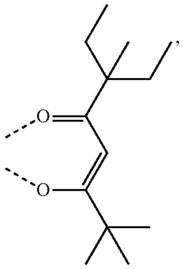
$L_{c101}$
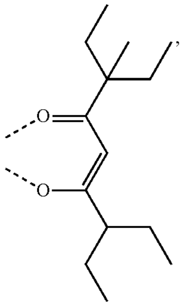

-continued
$L_{c102}$
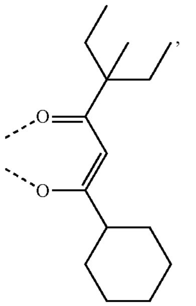
$L_{c103}$
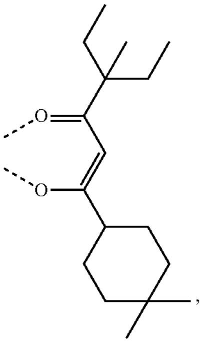
$L_{c104}$
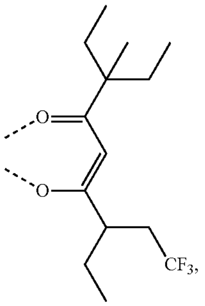
$L_{c105}$
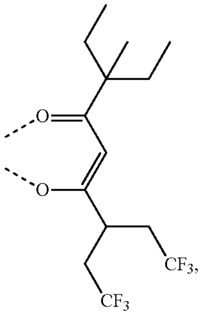
$L_{c106}$
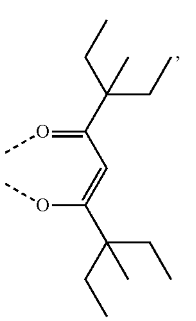
-continued
$L_{c107}$
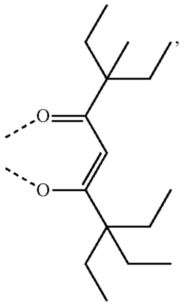
$L_{c108}$
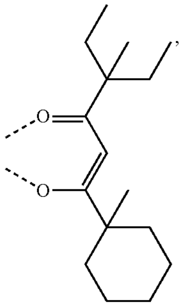
$L_{c109}$
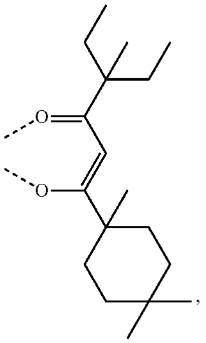
$L_{c110}$
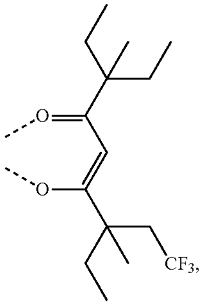
$L_{c111}$
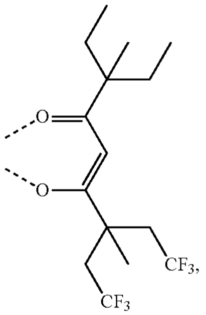

-continued
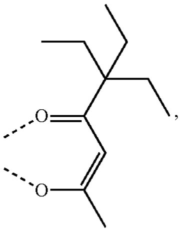
$L_{c112}$
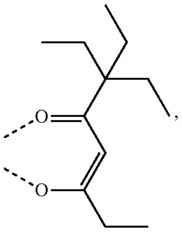
$L_{c113}$
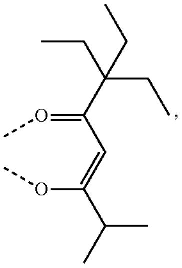
$L_{c114}$
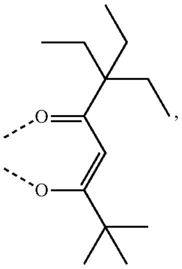
$L_{c115}$
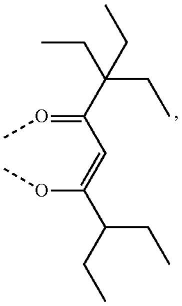
$L_{c116}$
-continued
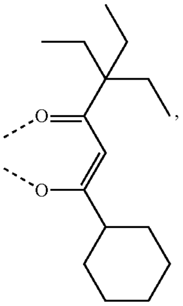
$L_{c117}$
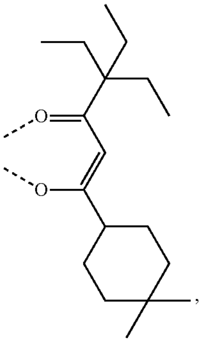
$L_{c118}$
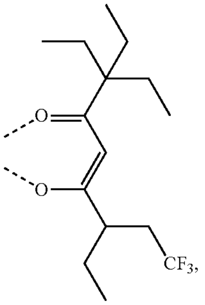
$L_{c119}$
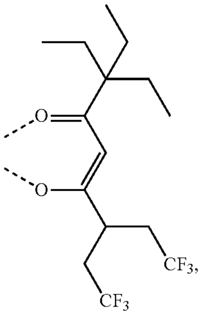
$L_{c120}$
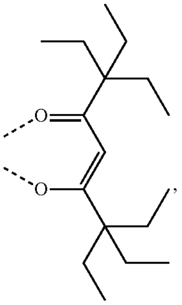
$L_{c121}$ -continued
$L_{c122}$
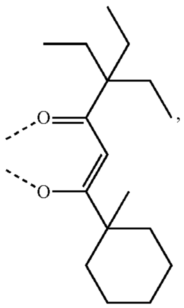
$L_{c123}$
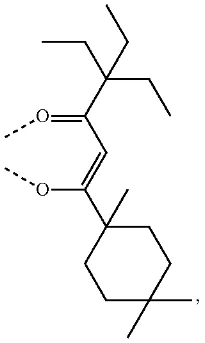
$L_{c124}$
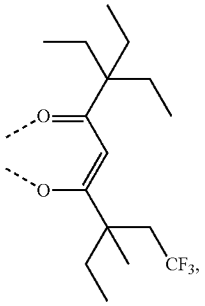
$L_{c125}$
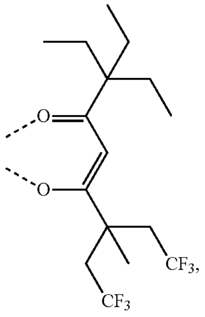
$L_{c126}$
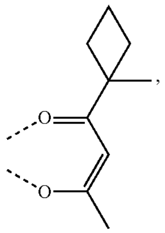
-continued
$L_{c127}$
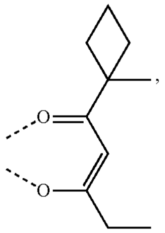
$L_{c128}$
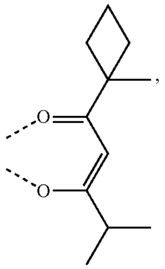
$L_{c129}$
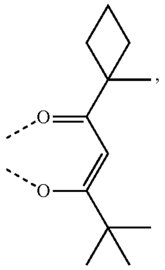
$L_{c130}$
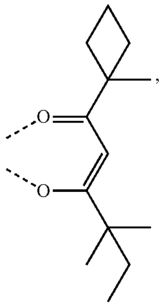
$L_{c131}$
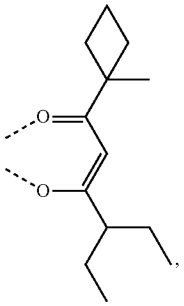

-continued
$L_{c132}$
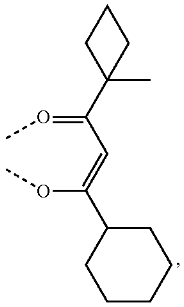
$L_{c133}$
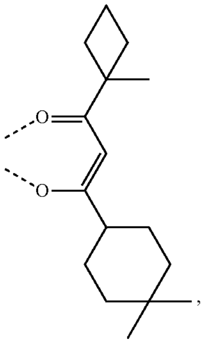
$L_{c134}$
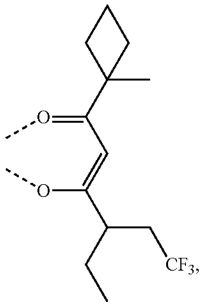
$L_{c135}$
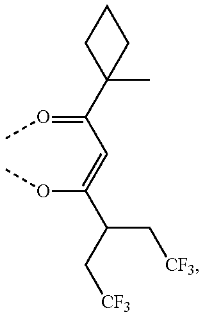
$L_{c136}$
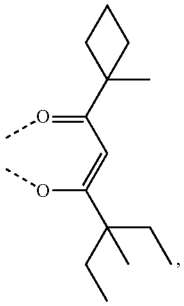
-continued
$L_{c137}$
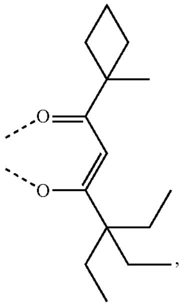
$L_{c138}$
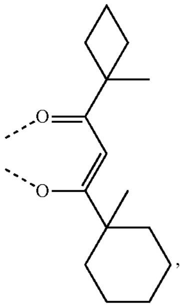
$L_{c139}$
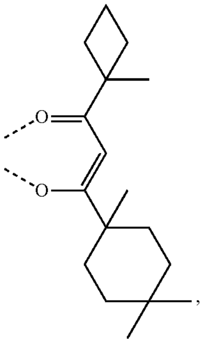
$L_{c140}$
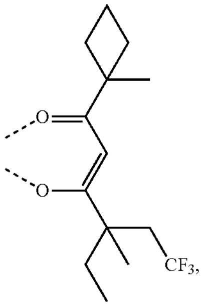
$L_{c141}$
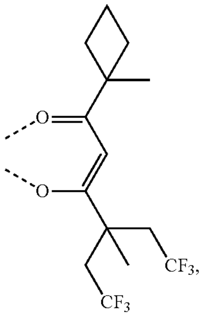

-continued
L$_{c142}$
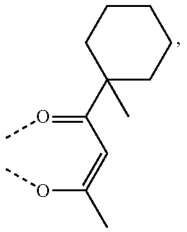
L$_{c143}$
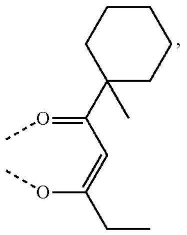
L$_{c144}$
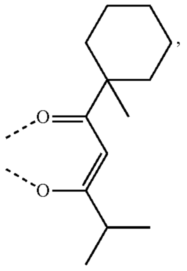
L$_{c145}$
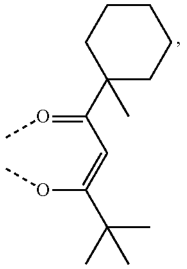
L$_{c146}$
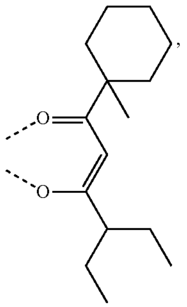
-continued
L$_{c147}$
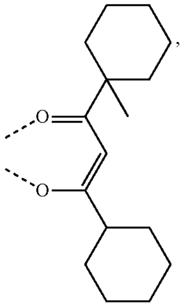
L$_{c148}$
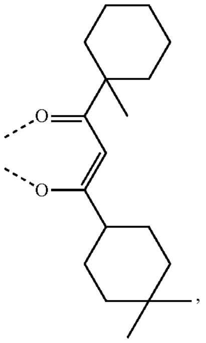
L$_{c149}$
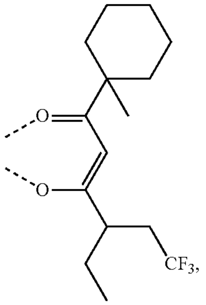
L$_{c150}$
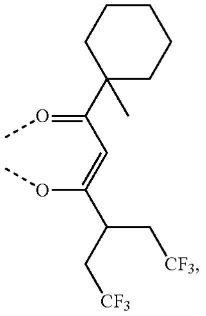
L$_{c151}$
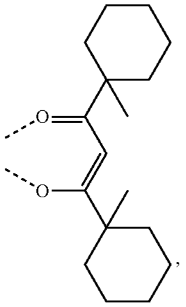

-continued
Lc152
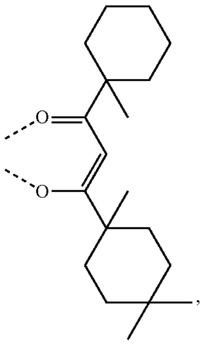
Lc153
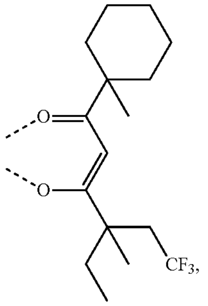
Lc154
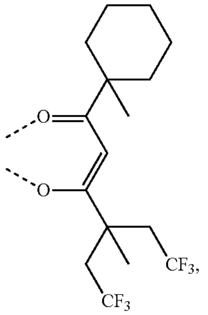
Lc155
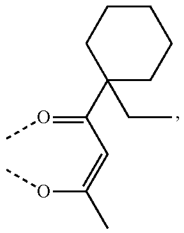
Lc156
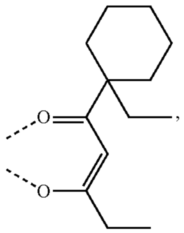
-continued
Lc157
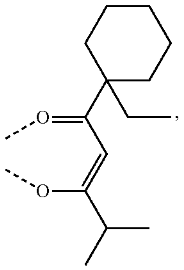
Lc158
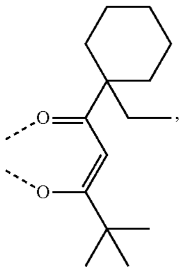
Lc159
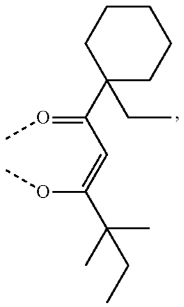
Lc160
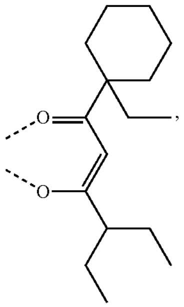
Lc161
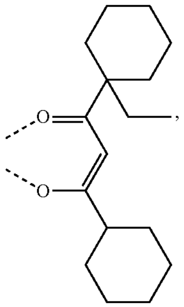

-continued
$L_{c162}$
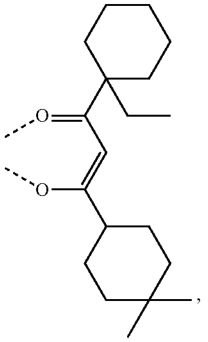
$L_{c163}$
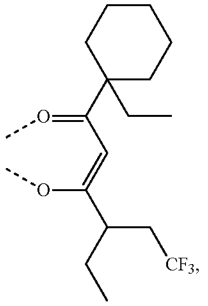
$L_{c164}$
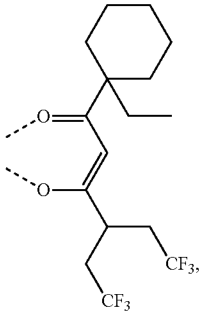
$L_{c165}$
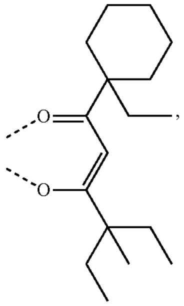
$L_{c166}$
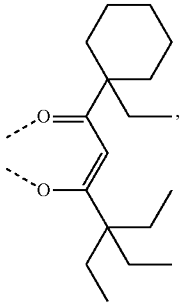
-continued
$L_{c167}$
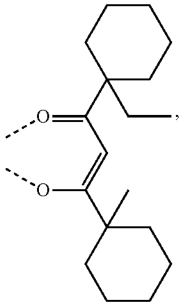
$L_{c168}$
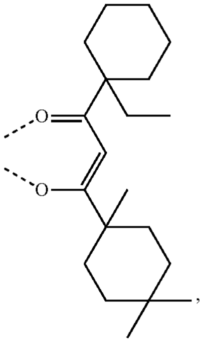
$L_{c169}$
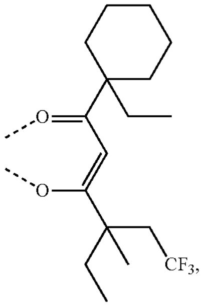
$L_{c170}$
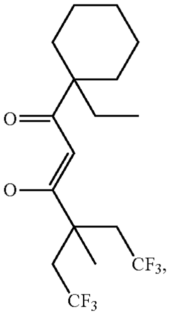
$L_{c171}$
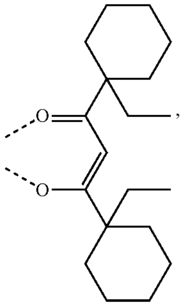

-continued
Lc172
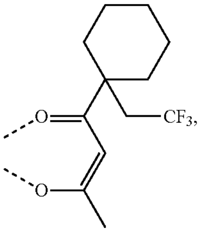
Lc173
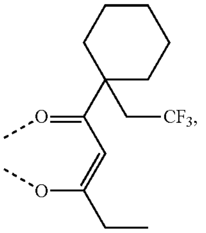
Lc174
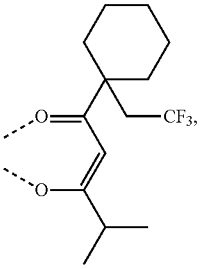
Lc175
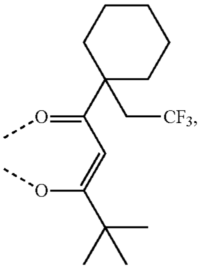
Lc176
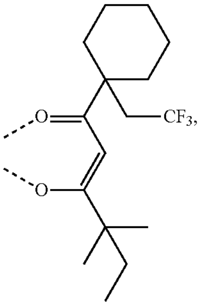
-continued
Lc177
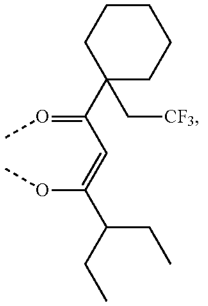
Lc178
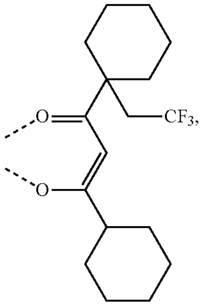
Lc179
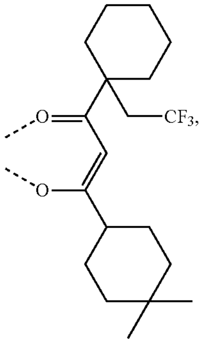
Lc180
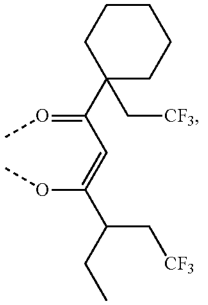
Lc181
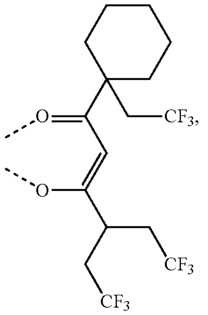

$L_{c182}$
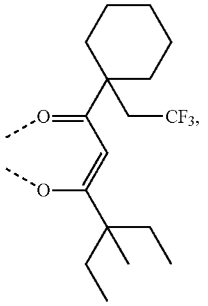
$L_{c183}$
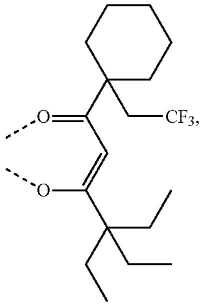
$L_{c184}$
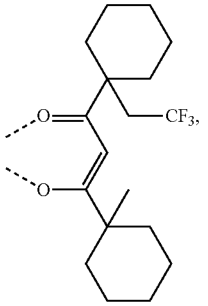
$L_{c185}$
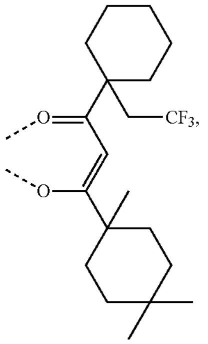
$L_{c186}$
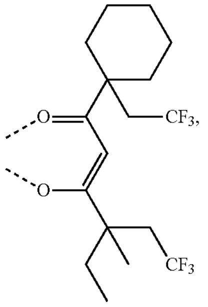
$L_{c187}$
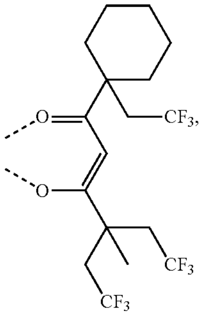
$L_{c188}$
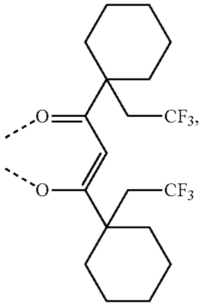
$L_{c189}$
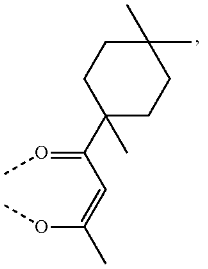
$L_{c190}$
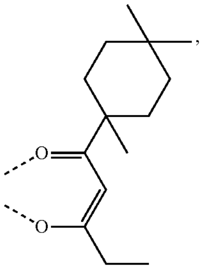
$L_{c191}$
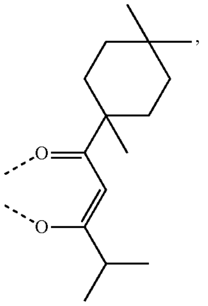

-continued
$L_{c192}$
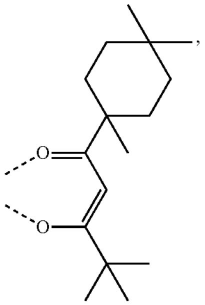
$L_{c193}$
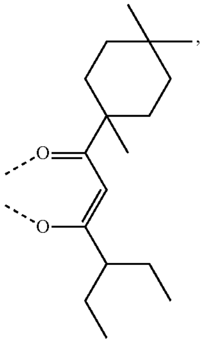
$L_{c194}$
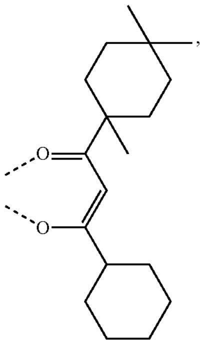
$L_{c195}$
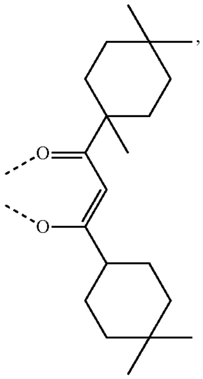
-continued
$L_{c196}$
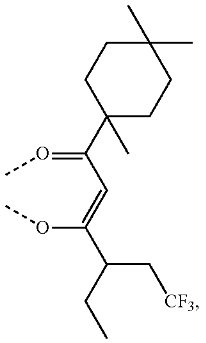
$L_{c197}$
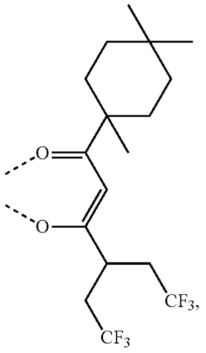
$L_{c198}$
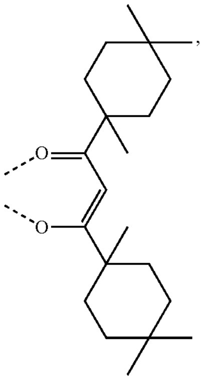
$L_{c199}$
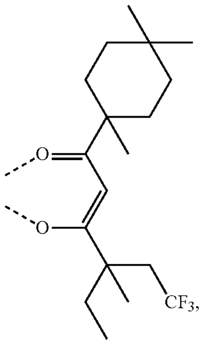

-continued
$L_{c200}$
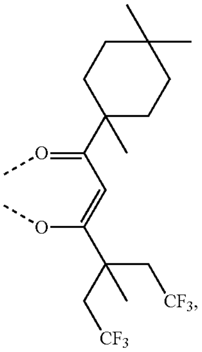
$L_{c201}$
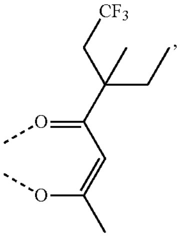
$L_{c202}$
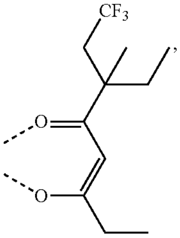
$L_{c203}$
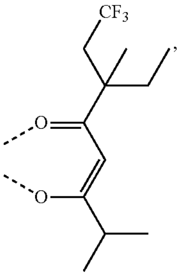
$L_{c204}$
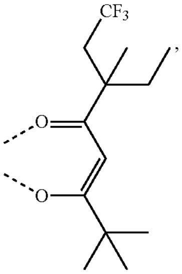
-continued
$L_{c205}$
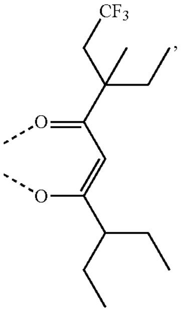
$L_{c206}$
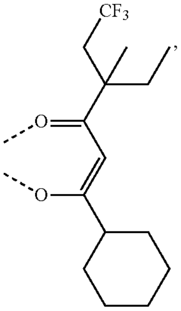
$L_{c207}$
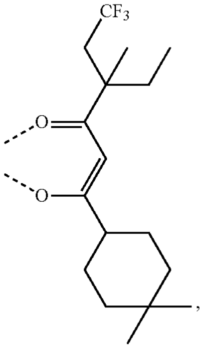
$L_{c208}$
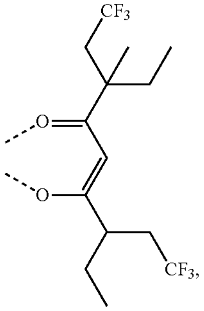
$L_{c209}$
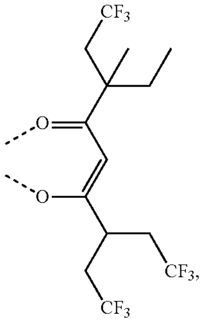

-continued
$L_{c210}$
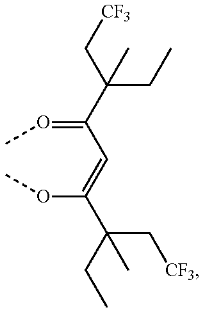
$L_{c211}$
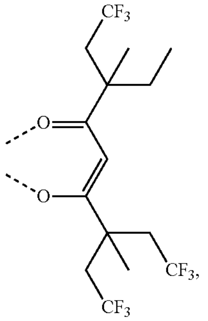
$L_{c212}$
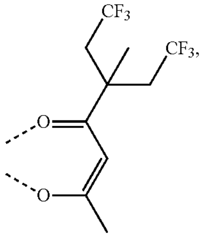
$L_{c213}$
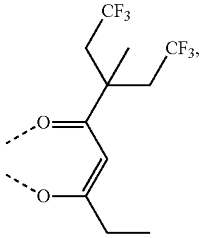
$L_{c214}$
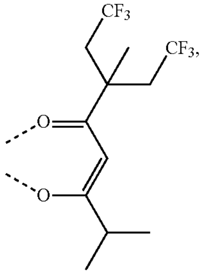
-continued
$L_{c215}$
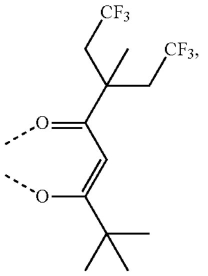
$L_{c216}$
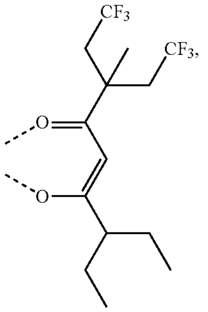
$L_{c217}$
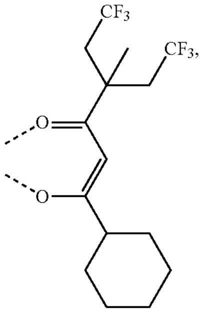
$L_{c218}$
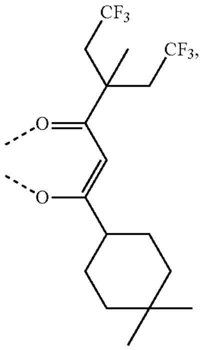
$L_{c219}$
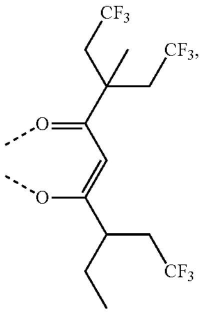

-continued
$L_{c220}$
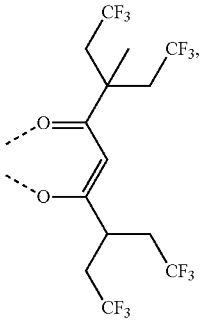
$L_{c221}$
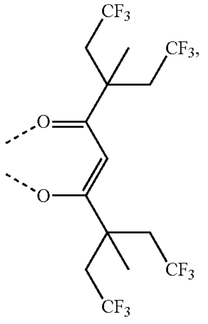
$L_{c222}$
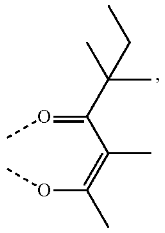
$L_{c223}$
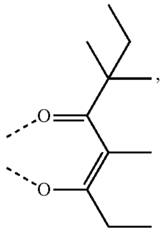
$L_{c224}$
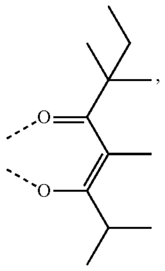
-continued
$L_{c225}$
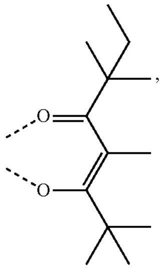
$L_{c226}$
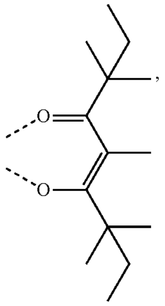
$L_{c227}$
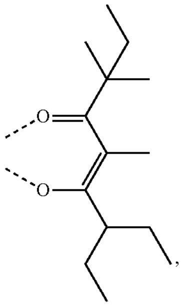
$L_{c228}$
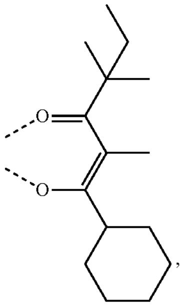
$L_{c229}$
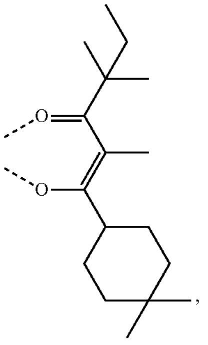

-continued
Lc230
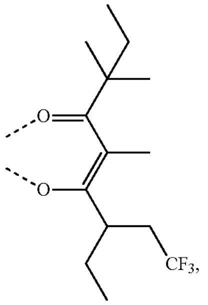
Lc231
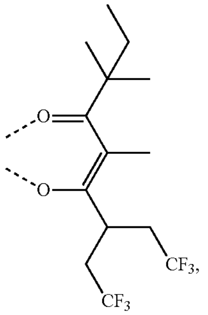
Lc232
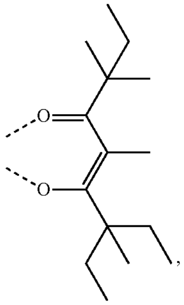
Lc233
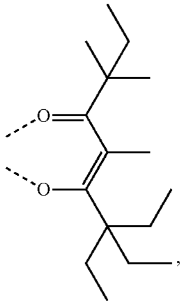
Lc234
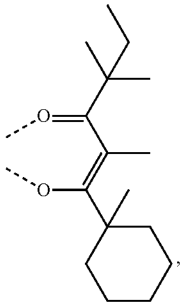
-continued
Lc235
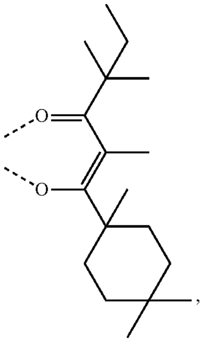
Lc236
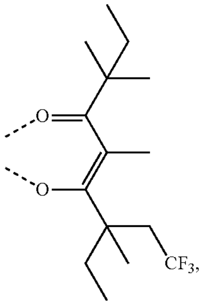
Lc237
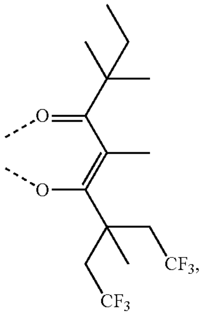
Lc238
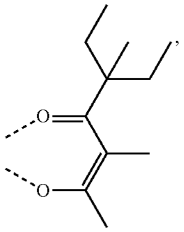
Lc239
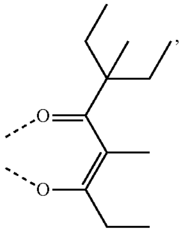

-continued
$L_{c240}$
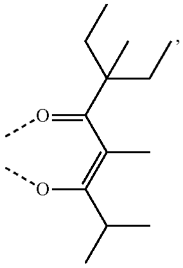
$L_{c241}$
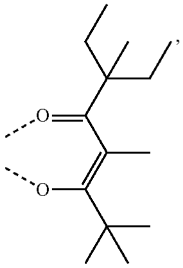
$L_{c242}$
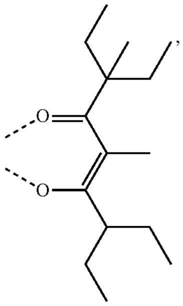
$L_{c243}$
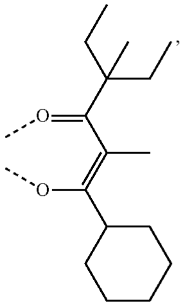
$L_{c244}$
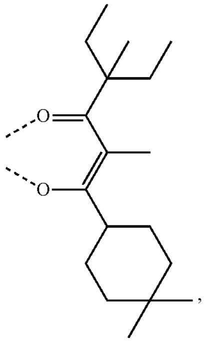
-continued
$L_{c245}$
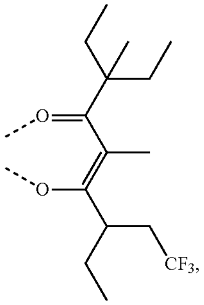
$L_{c246}$
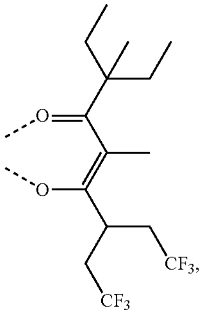
$L_{c247}$
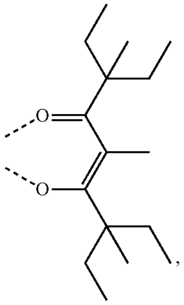
$L_{c248}$
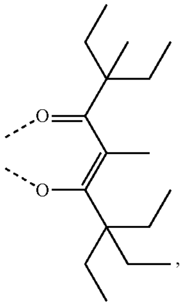
$L_{c249}$
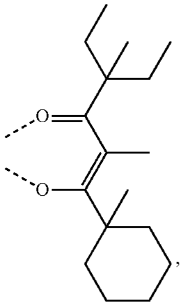

-continued
$L_{c250}$
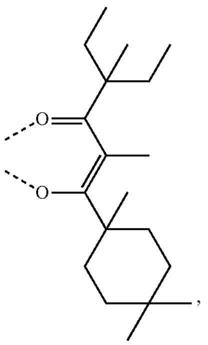
$L_{c251}$
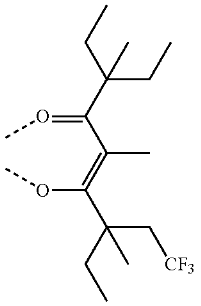
$L_{c252}$
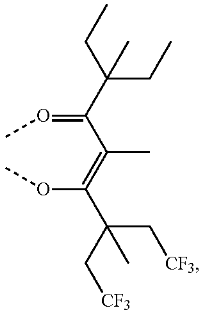
$L_{c253}$
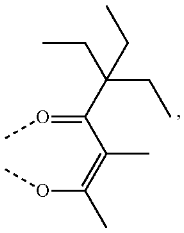
$L_{c254}$
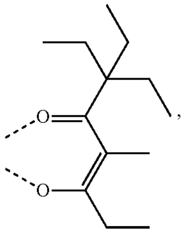
-continued
$L_{c255}$
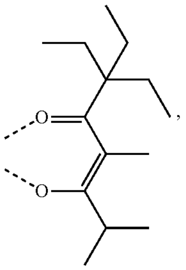
$L_{c256}$
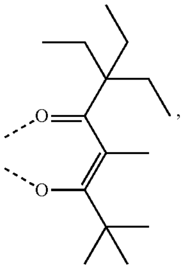
$L_{c257}$
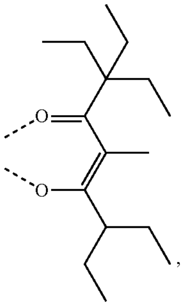
$L_{c258}$
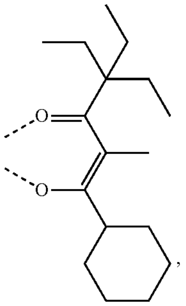
$L_{c259}$
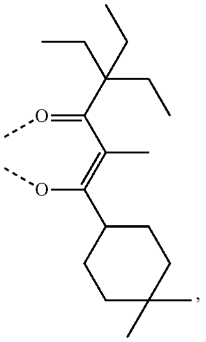

-continued
$L_{c260}$
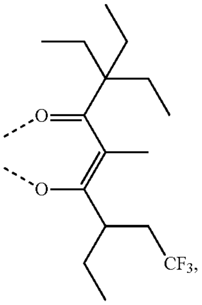
$L_{c261}$
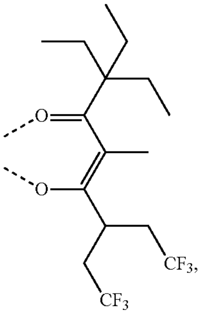
$L_{c262}$
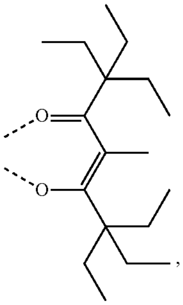
$L_{c263}$
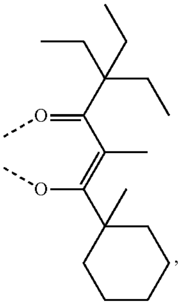
$L_{c264}$
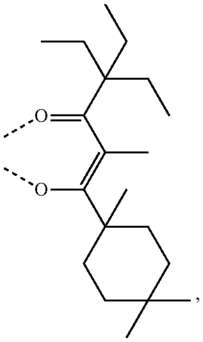
-continued
$L_{c265}$
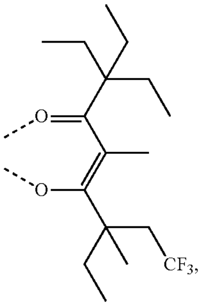
$L_{c266}$
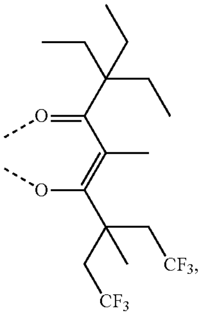
$L_{c267}$
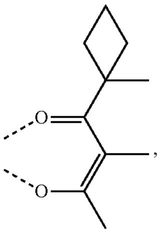
$L_{c268}$
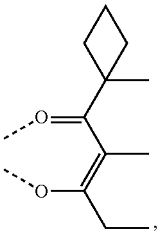
$L_{c269}$
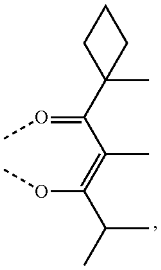

-continued
$L_{c270}$
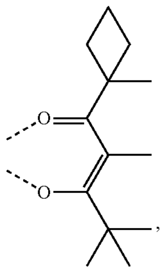
$L_{c271}$
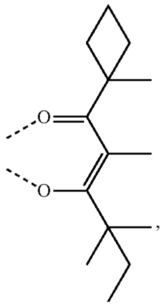
$L_{c272}$
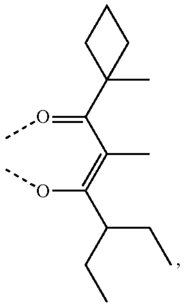
$L_{c273}$
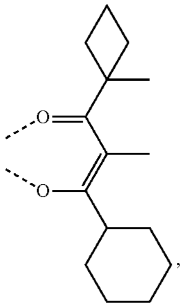
$L_{c274}$
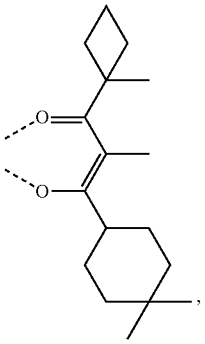
-continued
$L_{c275}$
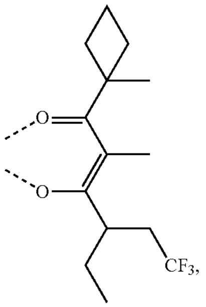
$L_{c276}$
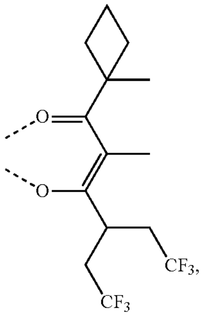
$L_{c277}$
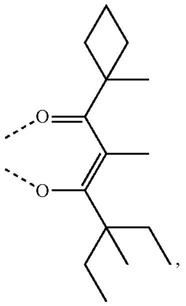
$L_{c278}$
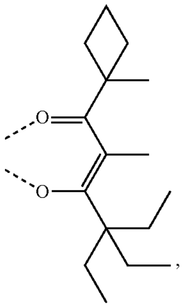
$L_{c279}$
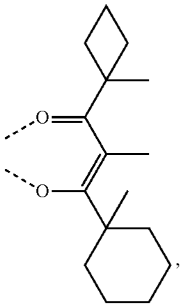

-continued
$L_{c280}$
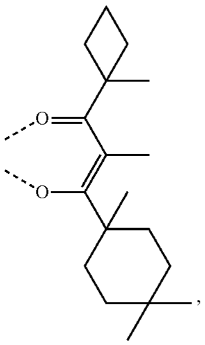
$L_{c281}$
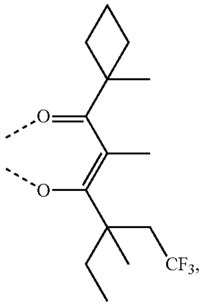
$L_{c282}$
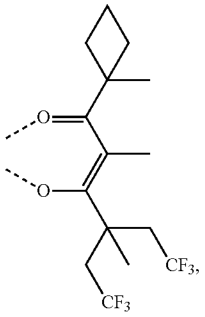
$L_{c283}$
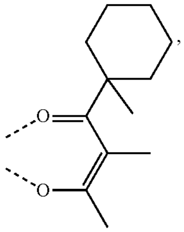
$L_{c284}$
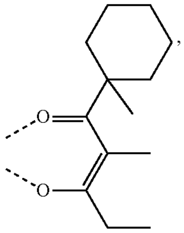
-continued
$L_{c285}$
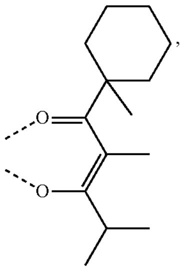
$L_{c286}$
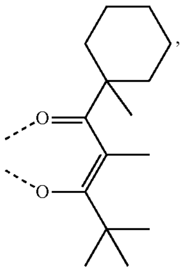
$L_{c287}$
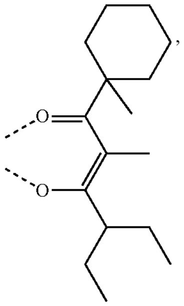
$L_{c288}$
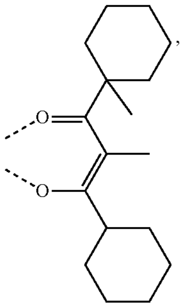
$L_{c289}$
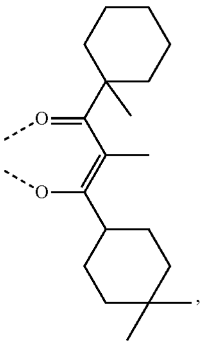

-continued
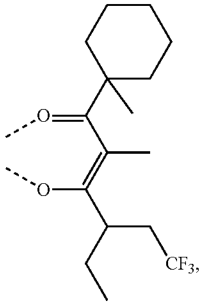
$L_{c290}$
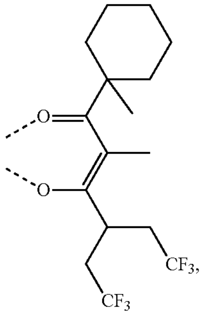
$L_{c291}$
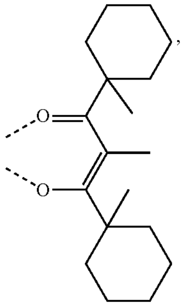
$L_{c292}$
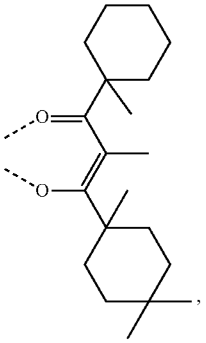
$L_{c293}$
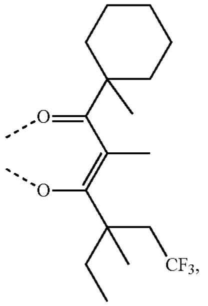
$L_{c294}$
-continued
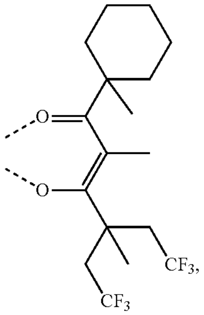
$L_{c295}$
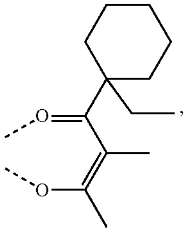
$L_{c296}$
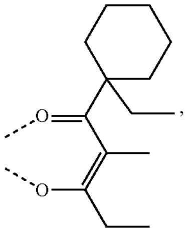
$L_{c297}$
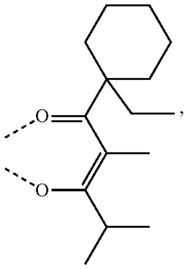
$L_{c298}$
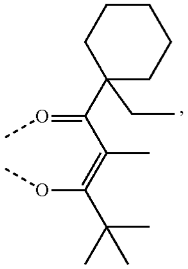
$L_{c299}$ -continued
$L_{c300}$
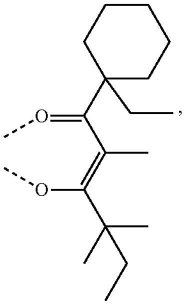
$L_{c301}$
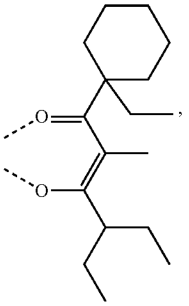
$L_{c302}$
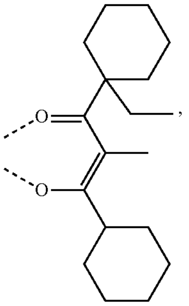
$L_{c303}$
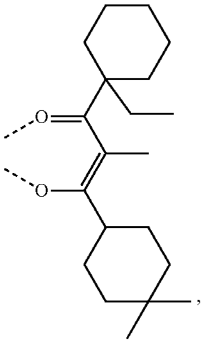
$L_{c304}$
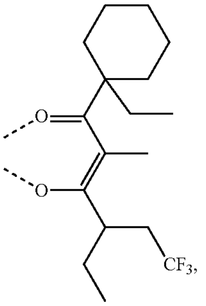
-continued
$L_{c305}$
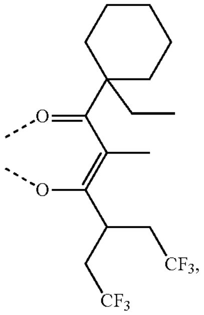
$L_{c306}$
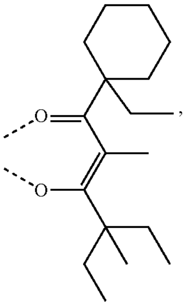
$L_{c307}$
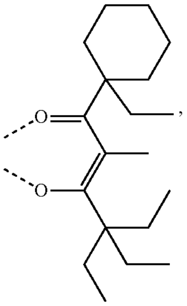
$L_{c308}$
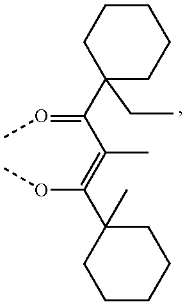
$L_{c309}$
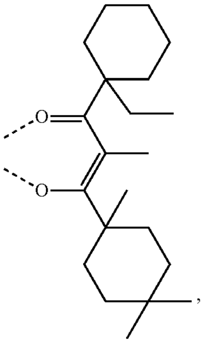

-continued
$L_{c310}$
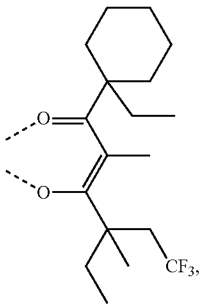
$L_{c311}$
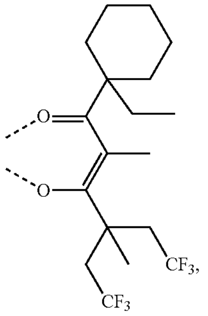
$L_{c312}$
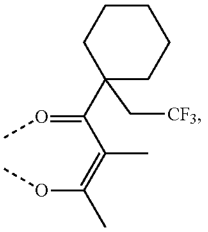
$L_{c313}$
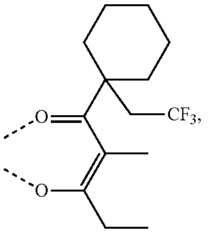
$L_{c314}$
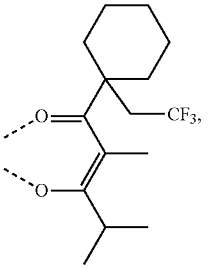
-continued
$L_{c315}$
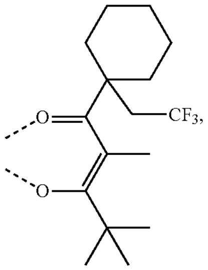
$L_{c316}$
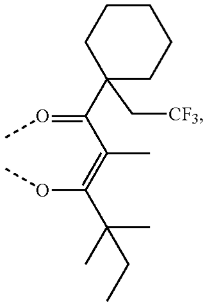
$L_{c317}$
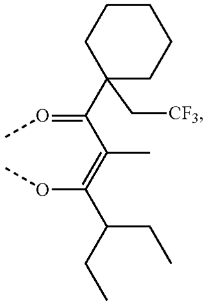
$L_{c318}$
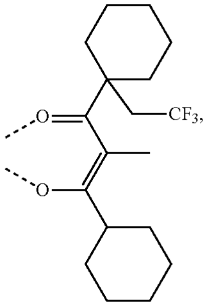
$L_{c319}$
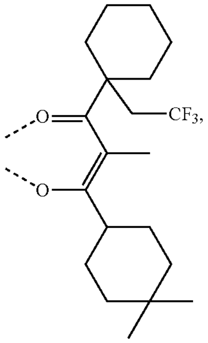

-continued
$L_{c320}$
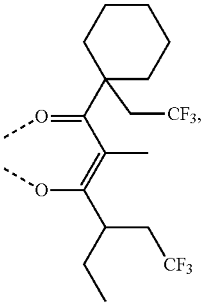
$L_{c321}$
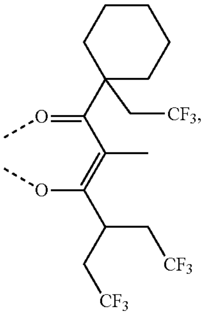
$L_{c322}$
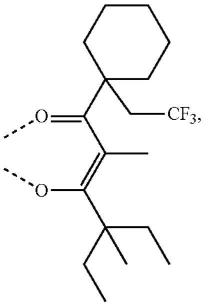
$L_{c323}$
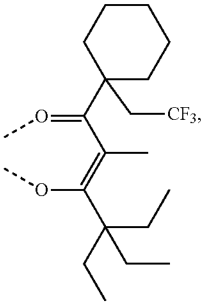
$L_{c324}$
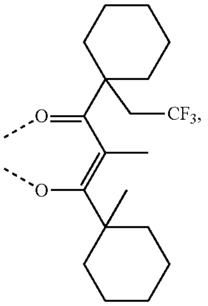
-continued
$L_{c325}$
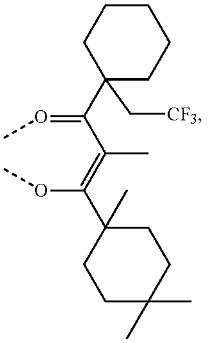
$L_{c326}$
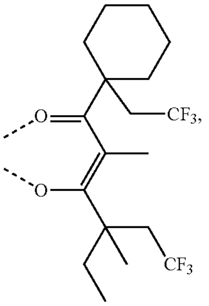
$L_{c327}$
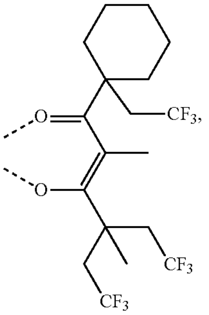
$L_{c328}$
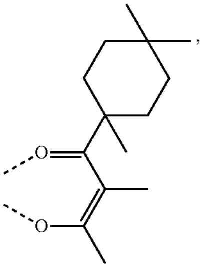
$L_{c329}$
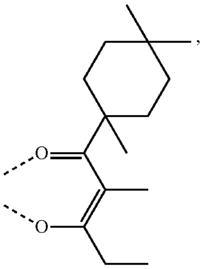

-continued
$L_{c330}$
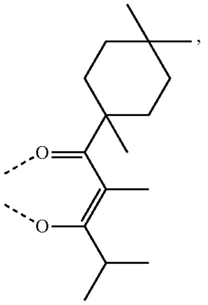
$L_{c331}$
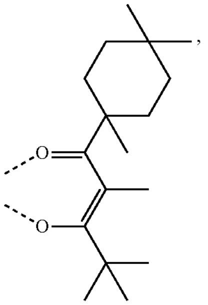
$L_{c332}$
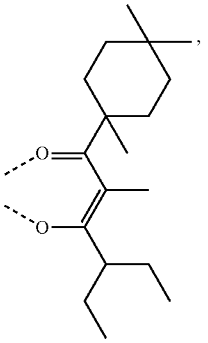
$L_{c333}$
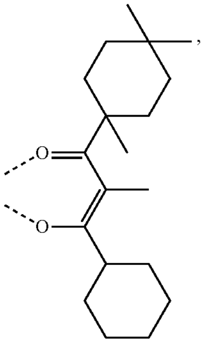
-continued
$L_{c334}$
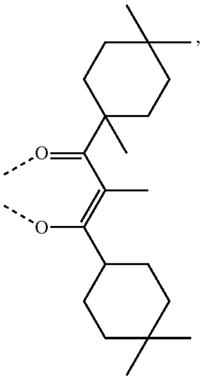
$L_{c335}$
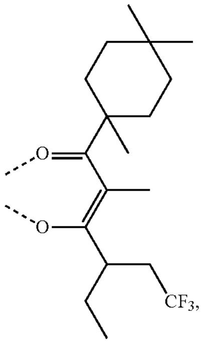
$L_{c336}$
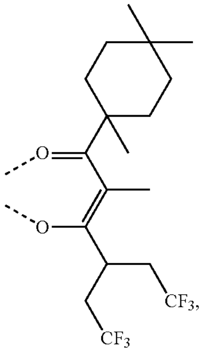
$L_{c337}$
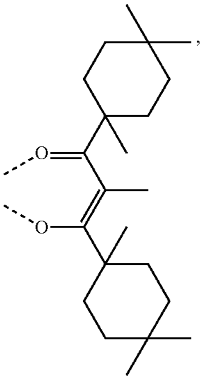

-continued
Lc338
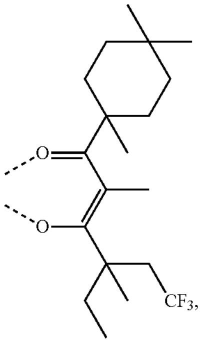
Lc339
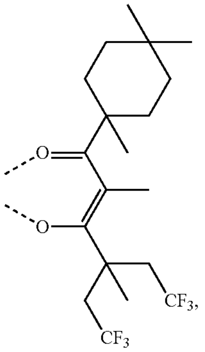
Lc340
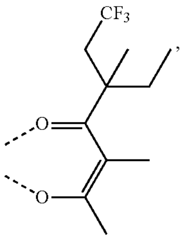
Lc341
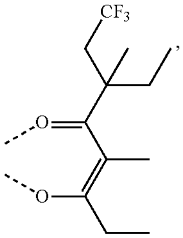
Lc342
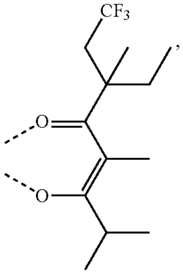
-continued
Lc343
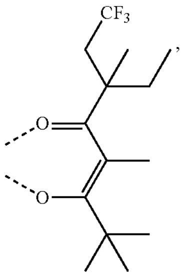
Lc344
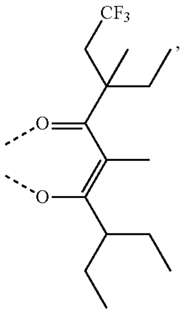
Lc345
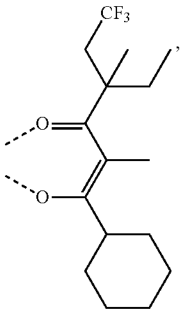
Lc346
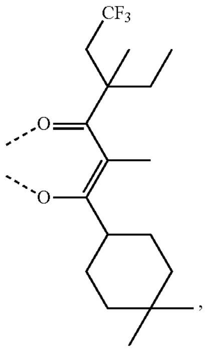
Lc347
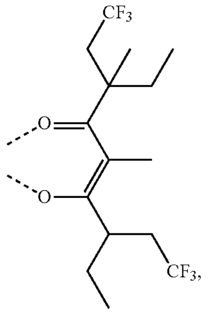

-continued
$L_{c348}$
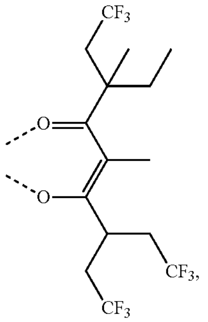
$L_{c349}$
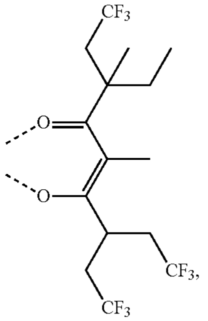
$L_{c350}$
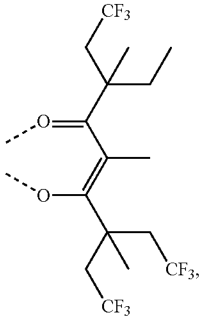
$L_{c351}$
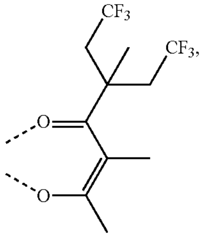
$L_{c352}$
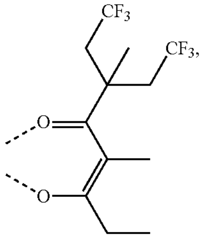
-continued
$L_{c353}$
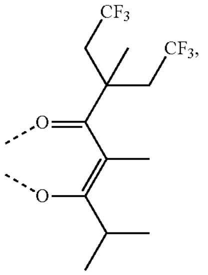
$L_{c354}$
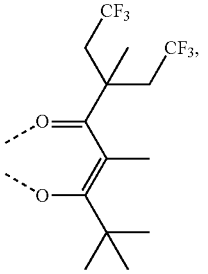
$L_{c355}$
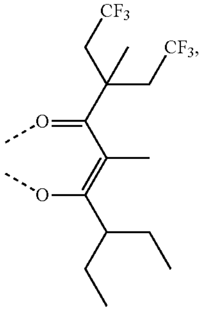
$L_{c356}$
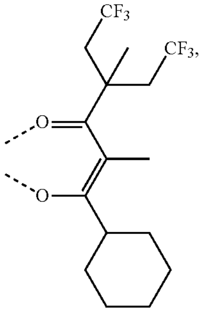
$L_{c357}$
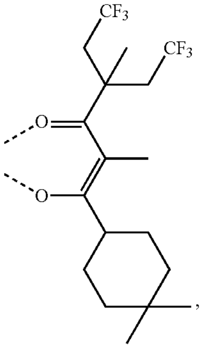

-continued $L_{c358}$

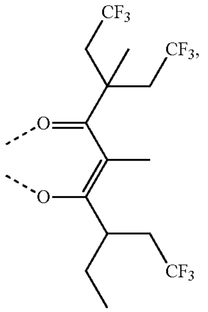

$L_{c359}$

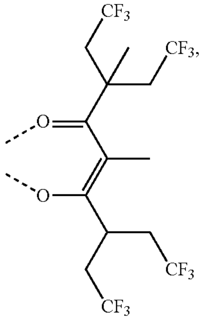

and $L_{c360}$

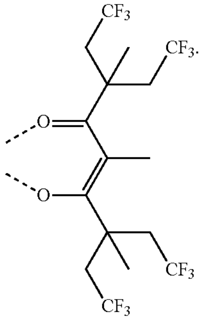

19. The metal complex of claim 18, wherein the metal complex is selected from the group which are described as follows:

the metal complex has a structure of $Ir(L_a)(L_b)_2$, wherein the two $L_b$ have the same structure or different structures, and $L_a$ and the two $L_b$ respectively correspond to the structures listed in the following table:

| Metal Complex | $L_a$ | $L_b$ | $L_b$ |
|---|---|---|---|
| 1 | $L_{a1-58}$ | $L_{b1}$ | $L_{b1}$ |
| 2 | $L_{a1-88}$ | $L_{b1}$ | $L_{b1}$ |
| 3 | $L_{a1-133}$ | $L_{b1}$ | $L_{b1}$ |
| 4 | $L_{a1-146}$ | $L_{b1}$ | $L_{b1}$ |
| 5 | $L_{a1-157}$ | $L_{b1}$ | $L_{b1}$ |
| 6 | $L_{a1-158}$ | $L_{b1}$ | $L_{b1}$ |
| 7 | $L_{a1-164}$ | $L_{b1}$ | $L_{b1}$ |
| 8 | $L_{a1-170}$ | $L_{b1}$ | $L_{b1}$ |
| 9 | $L_{a1-176}$ | $L_{b1}$ | $L_{b1}$ |
| 15 | $L_{a1-333}$ | $L_{b1}$ | $L_{b1}$ |
| 16 | $L_{a1-339}$ | $L_{b1}$ | $L_{b1}$ |
| 17 | $L_{a1-345}$ | $L_{b1}$ | $L_{b1}$ |
| 19 | $L_{a1-400}$ | $L_{b1}$ | $L_{b1}$ |
| 20 | $L_{a1-418}$ | $L_{b1}$ | $L_{b1}$ |
| 27 | $L_{a2-133}$ | $L_{b1}$ | $L_{b1}$ |
| 28 | $L_{a2-146}$ | $L_{b1}$ | $L_{b1}$ |
| 29 | $L_{a2-157}$ | $L_{b1}$ | $L_{b1}$ |
| 30 | $L_{a2-158}$ | $L_{b1}$ | $L_{b1}$ |
| 31 | $L_{a2-164}$ | $L_{b1}$ | $L_{b1}$ |
| 32 | $L_{a2-170}$ | $L_{b1}$ | $L_{b1}$ |
| 33 | $L_{a2-176}$ | $L_{b1}$ | $L_{b1}$ |
| 35 | $L_{a2-224}$ | $L_{b1}$ | $L_{b1}$ |
| 36 | $L_{a2-258}$ | $L_{b1}$ | $L_{b1}$ |
| 37 | $L_{a2-308}$ | $L_{b1}$ | $L_{b1}$ |
| 38 | $L_{a2-321}$ | $L_{b1}$ | $L_{b1}$ |
| 39 | $L_{a2-333}$ | $L_{b1}$ | $L_{b1}$ |
| 40 | $L_{a2-339}$ | $L_{b1}$ | $L_{b1}$ |
| 41 | $L_{a2-345}$ | $L_{b1}$ | $L_{b1}$ |
| 43 | $L_{a2-400}$ | $L_{b1}$ | $L_{b1}$ |
| 44 | $L_{a2-418}$ | $L_{b1}$ | $L_{b1}$ |
| 45 | $L_{a2-419}$ | $L_{b1}$ | $L_{b1}$ |
| 46 | $L_{a2-440}$ | $L_{b1}$ | $L_{b1}$ |
| 47 | $L_{a2-441}$ | $L_{b1}$ | $L_{b1}$ |
| 48 | $L_{a2-446}$ | $L_{b1}$ | $L_{b1}$ |
| 49 | $L_{a3-58}$ | $L_{b1}$ | $L_{b1}$ |
| 50 | $L_{a3-88}$ | $L_{b1}$ | $L_{b1}$ |
| 51 | $L_{a3-133}$ | $L_{b1}$ | $L_{b1}$ |
| 52 | $L_{a3-146}$ | $L_{b1}$ | $L_{b1}$ |
| 53 | $L_{a3-157}$ | $L_{b1}$ | $L_{b1}$ |
| 54 | $L_{a3-158}$ | $L_{b1}$ | $L_{b1}$ |
| 55 | $L_{a3-164}$ | $L_{b1}$ | $L_{b1}$ |
| 56 | $L_{a3-170}$ | $L_{b1}$ | $L_{b1}$ |
| 57 | $L_{a3-176}$ | $L_{b1}$ | $L_{b1}$ |
| 59 | $L_{a3-224}$ | $L_{b1}$ | $L_{b1}$ |
| 60 | $L_{a3-258}$ | $L_{b1}$ | $L_{b1}$ |
| 61 | $L_{a3-308}$ | $L_{b1}$ | $L_{b1}$ |
| 62 | $L_{a3-321}$ | $L_{b1}$ | $L_{b1}$ |
| 63 | $L_{a3-333}$ | $L_{b1}$ | $L_{b1}$ |
| 64 | $L_{a3-339}$ | $L_{b1}$ | $L_{b1}$ |
| 65 | $L_{a3-345}$ | $L_{b1}$ | $L_{b1}$ |
| 67 | $L_{a3-400}$ | $L_{b1}$ | $L_{b1}$ |
| 68 | $L_{a3-418}$ | $L_{b1}$ | $L_{b1}$ |
| 69 | $L_{a3-419}$ | $L_{b1}$ | $L_{b1}$ |
| 70 | $L_{a3-440}$ | $L_{b1}$ | $L_{b1}$ |
| 71 | $L_{a3-441}$ | $L_{b1}$ | $L_{b1}$ |
| 72 | $L_{a3-446}$ | $L_{b1}$ | $L_{b1}$ |
| 73 | $L_{a4-2}$ | $L_{b1}$ | $L_{b1}$ |
| 74 | $L_{a4-4}$ | $L_{b1}$ | $L_{b1}$ |
| 75 | $L_{a4-8}$ | $L_{b1}$ | $L_{b1}$ |
| 76 | $L_{a4-10}$ | $L_{b1}$ | $L_{b1}$ |
| 77 | $L_{a4-14}$ | $L_{b1}$ | $L_{b1}$ |
| 78 | $L_{a4-16}$ | $L_{b1}$ | $L_{b1}$ |
| 79 | $L_{a4-20}$ | $L_{b1}$ | $L_{b1}$ |
| 80 | $L_{a4-22}$ | $L_{b1}$ | $L_{b1}$ |
| 81 | $L_{a4-26}$ | $L_{b1}$ | $L_{b1}$ |
| 82 | $L_{a4-28}$ | $L_{b1}$ | $L_{b1}$ |
| 83 | $L_{a1-58}$ | $L_{b3}$ | $L_{b3}$ |
| 84 | $L_{a1-88}$ | $L_{b3}$ | $L_{b3}$ |
| 85 | $L_{a1-133}$ | $L_{b3}$ | $L_{b3}$ |
| 86 | $L_{a1-146}$ | $L_{b3}$ | $L_{b3}$ |
| 87 | $L_{a1-157}$ | $L_{b3}$ | $L_{b3}$ |
| 88 | $L_{a1-158}$ | $L_{b3}$ | $L_{b3}$ |
| 89 | $L_{a1-164}$ | $L_{b3}$ | $L_{b3}$ |
| 90 | $L_{a1-170}$ | $L_{b3}$ | $L_{b3}$ |
| 91 | $L_{a1-176}$ | $L_{b3}$ | $L_{b3}$ |
| 93 | $L_{a1-224}$ | $L_{b3}$ | $L_{b3}$ |
| 94 | $L_{a1-258}$ | $L_{b3}$ | $L_{b3}$ |
| 95 | $L_{a1-308}$ | $L_{b3}$ | $L_{b3}$ |
| 96 | $L_{a1-321}$ | $L_{b3}$ | $L_{b3}$ |
| 97 | $L_{a1-333}$ | $L_{b3}$ | $L_{b3}$ |
| 98 | $L_{a1-339}$ | $L_{b3}$ | $L_{b3}$ |
| 99 | $L_{a1-345}$ | $L_{b3}$ | $L_{b3}$ |
| 101 | $L_{a1-400}$ | $L_{b3}$ | $L_{b3}$ |
| 102 | $L_{a1-418}$ | $L_{b3}$ | $L_{b3}$ |
| 103 | $L_{a1-419}$ | $L_{b3}$ | $L_{b3}$ |
| 104 | $L_{a1-440}$ | $L_{b3}$ | $L_{b3}$ |
| 105 | $L_{a1-441}$ | $L_{b3}$ | $L_{b3}$ |
| 106 | $L_{a1-446}$ | $L_{b3}$ | $L_{b3}$ |
| 107 | $L_{a2-58}$ | $L_{b3}$ | $L_{b3}$ |
| 108 | $L_{a2-88}$ | $L_{b3}$ | $L_{b3}$ |
| 109 | $L_{a2-133}$ | $L_{b3}$ | $L_{b3}$ |
| 110 | $L_{a2-146}$ | $L_{b3}$ | $L_{b3}$ |
| 111 | $L_{a2-157}$ | $L_{b3}$ | $L_{b3}$ |

-continued

| Metal Complex | $L_a$ | $L_b$ | $L_b$ |
|---|---|---|---|
| 112 | $L_{a2\text{-}158}$ | $L_{b3}$ | $L_{b3}$ |
| 113 | $L_{a2\text{-}164}$ | $L_{b3}$ | $L_{b3}$ |
| 114 | $L_{a2\text{-}170}$ | $L_{b3}$ | $L_{b3}$ |
| 115 | $L_{a2\text{-}176}$ | $L_{b3}$ | $L_{b3}$ |
| 117 | $L_{a2\text{-}224}$ | $L_{b3}$ | $L_{b3}$ |
| 118 | $L_{a2\text{-}258}$ | $L_{b3}$ | $L_{b3}$ |
| 119 | $L_{a2\text{-}308}$ | $L_{b3}$ | $L_{b3}$ |
| 120 | $L_{a2\text{-}321}$ | $L_{b3}$ | $L_{b3}$ |
| 121 | $L_{a2\text{-}333}$ | $L_{b3}$ | $L_{b3}$ |
| 122 | $L_{a2\text{-}339}$ | $L_{b3}$ | $L_{b3}$ |
| 123 | $L_{a2\text{-}345}$ | $L_{b3}$ | $L_{b3}$ |
| 125 | $L_{a2\text{-}400}$ | $L_{b3}$ | $L_{b3}$ |
| 126 | $L_{a2\text{-}418}$ | $L_{b3}$ | $L_{b3}$ |
| 127 | $L_{a2\text{-}419}$ | $L_{b3}$ | $L_{b3}$ |
| 128 | $L_{a2\text{-}440}$ | $L_{b3}$ | $L_{b3}$ |
| 129 | $L_{a2\text{-}441}$ | $L_{b3}$ | $L_{b3}$ |
| 130 | $L_{a2\text{-}446}$ | $L_{b3}$ | $L_{b3}$ |
| 131 | $L_{a3\text{-}58}$ | $L_{b3}$ | $L_{b3}$ |
| 132 | $L_{a3\text{-}88}$ | $L_{b3}$ | $L_{b3}$ |
| 133 | $L_{a3\text{-}133}$ | $L_{b3}$ | $L_{b3}$ |
| 134 | $L_{a3\text{-}146}$ | $L_{b3}$ | $L_{b3}$ |
| 135 | $L_{a3\text{-}157}$ | $L_{b3}$ | $L_{b3}$ |
| 136 | $L_{a3\text{-}158}$ | $L_{b3}$ | $L_{b3}$ |
| 137 | $L_{a3\text{-}164}$ | $L_{b3}$ | $L_{b3}$ |
| 138 | $L_{a3\text{-}170}$ | $L_{b3}$ | $L_{b3}$ |
| 139 | $L_{a3\text{-}176}$ | $L_{b3}$ | $L_{b3}$ |
| 141 | $L_{a3\text{-}224}$ | $L_{b3}$ | $L_{b3}$ |
| 142 | $L_{a3\text{-}258}$ | $L_{b3}$ | $L_{b3}$ |
| 143 | $L_{a3\text{-}308}$ | $L_{b3}$ | $L_{b3}$ |
| 144 | $L_{a3\text{-}321}$ | $L_{b3}$ | $L_{b3}$ |
| 145 | $L_{a3\text{-}333}$ | $L_{b3}$ | $L_{b3}$ |
| 146 | $L_{a3\text{-}339}$ | $L_{b3}$ | $L_{b3}$ |
| 147 | $L_{a3\text{-}345}$ | $L_{b3}$ | $L_{b3}$ |
| 149 | $L_{a3\text{-}400}$ | $L_{b3}$ | $L_{b3}$ |
| 150 | $L_{a3\text{-}418}$ | $L_{b3}$ | $L_{b3}$ |
| 151 | $L_{a3\text{-}419}$ | $L_{b3}$ | $L_{b3}$ |
| 152 | $L_{a3\text{-}440}$ | $L_{b3}$ | $L_{b3}$ |
| 153 | $L_{a3\text{-}441}$ | $L_{b3}$ | $L_{b3}$ |
| 154 | $L_{a3\text{-}446}$ | $L_{b3}$ | $L_{b3}$ |
| 155 | $L_{a4\text{-}2}$ | $L_{b3}$ | $L_{b3}$ |
| 156 | $L_{a4\text{-}4}$ | $L_{b3}$ | $L_{b3}$ |
| 157 | $L_{a4\text{-}8}$ | $L_{b3}$ | $L_{b3}$ |
| 158 | $L_{a4\text{-}10}$ | $L_{b3}$ | $L_{b3}$ |
| 159 | $L_{a4\text{-}14}$ | $L_{b3}$ | $L_{b3}$ |
| 160 | $L_{a4\text{-}16}$ | $L_{b3}$ | $L_{b3}$ |
| 161 | $L_{a4\text{-}20}$ | $L_{b3}$ | $L_{b3}$ |
| 162 | $L_{a4\text{-}22}$ | $L_{b3}$ | $L_{b3}$ |
| 163 | $L_{a4\text{-}26}$ | $L_{b3}$ | $L_{b3}$ |
| 164 | $L_{a4\text{-}28}$ | $L_{b3}$ | $L_{b3}$ |
| 165 | $L_{a1\text{-}58}$ | $L_{b4}$ | $L_{b4}$ |
| 166 | $L_{a1\text{-}88}$ | $L_{b4}$ | $L_{b4}$ |
| 167 | $L_{a1\text{-}133}$ | $L_{b4}$ | $L_{b4}$ |
| 168 | $L_{a1\text{-}146}$ | $L_{b4}$ | $L_{b4}$ |
| 169 | $L_{a1\text{-}157}$ | $L_{b4}$ | $L_{b4}$ |
| 170 | $L_{a1\text{-}158}$ | $L_{b4}$ | $L_{b4}$ |
| 171 | $L_{a1\text{-}164}$ | $L_{b4}$ | $L_{b4}$ |
| 172 | $L_{a1\text{-}170}$ | $L_{b4}$ | $L_{b4}$ |
| 173 | $L_{a1\text{-}176}$ | $L_{b4}$ | $L_{b4}$ |
| 175 | $L_{a1\text{-}224}$ | $L_{b4}$ | $L_{b4}$ |
| 176 | $L_{a1\text{-}258}$ | $L_{b4}$ | $L_{b4}$ |
| 177 | $L_{a1\text{-}308}$ | $L_{b4}$ | $L_{b4}$ |
| 178 | $L_{a1\text{-}321}$ | $L_{b4}$ | $L_{b4}$ |
| 179 | $L_{a1\text{-}333}$ | $L_{b4}$ | $L_{b4}$ |
| 180 | $L_{a1\text{-}339}$ | $L_{b4}$ | $L_{b4}$ |
| 181 | $L_{a1\text{-}345}$ | $L_{b4}$ | $L_{b4}$ |
| 183 | $L_{a1\text{-}400}$ | $L_{b4}$ | $L_{b4}$ |
| 184 | $L_{a1\text{-}418}$ | $L_{b4}$ | $L_{b4}$ |
| 185 | $L_{a1\text{-}419}$ | $L_{b4}$ | $L_{b4}$ |
| 186 | $L_{a1\text{-}440}$ | $L_{b4}$ | $L_{b4}$ |
| 187 | $L_{a1\text{-}441}$ | $L_{b4}$ | $L_{b4}$ |
| 188 | $L_{a1\text{-}446}$ | $L_{b4}$ | $L_{b4}$ |
| 189 | $L_{a2\text{-}58}$ | $L_{b4}$ | $L_{b4}$ |
| 190 | $L_{a2\text{-}88}$ | $L_{b4}$ | $L_{b4}$ |
| 191 | $L_{a2\text{-}133}$ | $L_{b4}$ | $L_{b4}$ |
| 192 | $L_{a2\text{-}146}$ | $L_{b4}$ | $L_{b4}$ |
| 193 | $L_{a2\text{-}157}$ | $L_{b4}$ | $L_{b4}$ |

-continued

| Metal Complex | $L_a$ | $L_b$ | $L_b$ |
|---|---|---|---|
| 194 | $L_{a2\text{-}158}$ | $L_{b4}$ | $L_{b4}$ |
| 195 | $L_{a2\text{-}164}$ | $L_{b4}$ | $L_{b4}$ |
| 196 | $L_{a2\text{-}170}$ | $L_{b4}$ | $L_{b4}$ |
| 197 | $L_{a2\text{-}176}$ | $L_{b4}$ | $L_{b4}$ |
| 199 | $L_{a2\text{-}224}$ | $L_{b4}$ | $L_{b4}$ |
| 200 | $L_{a2\text{-}258}$ | $L_{b4}$ | $L_{b4}$ |
| 201 | $L_{a2\text{-}308}$ | $L_{b4}$ | $L_{b4}$ |
| 202 | $L_{a2\text{-}321}$ | $L_{b4}$ | $L_{b4}$ |
| 203 | $L_{a2\text{-}333}$ | $L_{b4}$ | $L_{b4}$ |
| 204 | $L_{a2\text{-}339}$ | $L_{b4}$ | $L_{b4}$ |
| 205 | $L_{a2\text{-}345}$ | $L_{b4}$ | $L_{b4}$ |
| 207 | $L_{a2\text{-}400}$ | $L_{b4}$ | $L_{b4}$ |
| 208 | $L_{a2\text{-}418}$ | $L_{b4}$ | $L_{b4}$ |
| 209 | $L_{a2\text{-}419}$ | $L_{b4}$ | $L_{b4}$ |
| 210 | $L_{a2\text{-}440}$ | $L_{b4}$ | $L_{b4}$ |
| 211 | $L_{a2\text{-}441}$ | $L_{b4}$ | $L_{b4}$ |
| 212 | $L_{a2\text{-}446}$ | $L_{b4}$ | $L_{b4}$ |
| 213 | $L_{a3\text{-}58}$ | $L_{b4}$ | $L_{b4}$ |
| 214 | $L_{a3\text{-}88}$ | $L_{b4}$ | $L_{b4}$ |
| 215 | $L_{a3\text{-}133}$ | $L_{b4}$ | $L_{b4}$ |
| 216 | $L_{a3\text{-}146}$ | $L_{b4}$ | $L_{b4}$ |
| 217 | $L_{a3\text{-}157}$ | $L_{b4}$ | $L_{b4}$ |
| 218 | $L_{a3\text{-}158}$ | $L_{b4}$ | $L_{b4}$ |
| 219 | $L_{a3\text{-}164}$ | $L_{b4}$ | $L_{b4}$ |
| 220 | $L_{a3\text{-}170}$ | $L_{b4}$ | $L_{b4}$ |
| 221 | $L_{a3\text{-}176}$ | $L_{b4}$ | $L_{b4}$ |
| 223 | $L_{a3\text{-}224}$ | $L_{b4}$ | $L_{b4}$ |
| 224 | $L_{a3\text{-}258}$ | $L_{b4}$ | $L_{b4}$ |
| 225 | $L_{a3\text{-}308}$ | $L_{b4}$ | $L_{b4}$ |
| 226 | $L_{a3\text{-}321}$ | $L_{b4}$ | $L_{b4}$ |
| 227 | $L_{a3\text{-}333}$ | $L_{b4}$ | $L_{b4}$ |
| 228 | $L_{a3\text{-}339}$ | $L_{b4}$ | $L_{b4}$ |
| 229 | $L_{a3\text{-}345}$ | $L_{b4}$ | $L_{b4}$ |
| 231 | $L_{a3\text{-}400}$ | $L_{b4}$ | $L_{b4}$ |
| 232 | $L_{a3\text{-}418}$ | $L_{b4}$ | $L_{b4}$ |
| 233 | $L_{a3\text{-}419}$ | $L_{b4}$ | $L_{b4}$ |
| 234 | $L_{a3\text{-}440}$ | $L_{b4}$ | $L_{b4}$ |
| 235 | $L_{a3\text{-}441}$ | $L_{b4}$ | $L_{b4}$ |
| 236 | $L_{a3\text{-}446}$ | $L_{b4}$ | $L_{b4}$ |
| 237 | $L_{a4\text{-}2}$ | $L_{b8}$ | $L_{b8}$ |
| 238 | $L_{a4\text{-}4}$ | $L_{b8}$ | $L_{b8}$ |
| 239 | $L_{a4\text{-}8}$ | $L_{b8}$ | $L_{b8}$ |
| 240 | $L_{a4\text{-}10}$ | $L_{b8}$ | $L_{b8}$ |
| 241 | $L_{a4\text{-}14}$ | $L_{b8}$ | $L_{b8}$ |
| 242 | $L_{a4\text{-}16}$ | $L_{b8}$ | $L_{b8}$ |
| 243 | $L_{a4\text{-}20}$ | $L_{b8}$ | $L_{b8}$ |
| 244 | $L_{a4\text{-}22}$ | $L_{b8}$ | $L_{b8}$ |
| 245 | $L_{a4\text{-}26}$ | $L_{b8}$ | $L_{b8}$ |
| 246 | $L_{a4\text{-}28}$ | $L_{b8}$ | $L_{b8}$ |
| 247 | $L_{a1\text{-}58}$ | $L_{b8}$ | $L_{b8}$ |
| 248 | $L_{a1\text{-}88}$ | $L_{b8}$ | $L_{b8}$ |
| 249 | $L_{a1\text{-}133}$ | $L_{b8}$ | $L_{b8}$ |
| 250 | $L_{a1\text{-}146}$ | $L_{b8}$ | $L_{b8}$ |
| 251 | $L_{a1\text{-}157}$ | $L_{b8}$ | $L_{b8}$ |
| 252 | $L_{a1\text{-}158}$ | $L_{b8}$ | $L_{b8}$ |
| 253 | $L_{a1\text{-}164}$ | $L_{b8}$ | $L_{b8}$ |
| 254 | $L_{a1\text{-}170}$ | $L_{b8}$ | $L_{b8}$ |
| 255 | $L_{a1\text{-}176}$ | $L_{b8}$ | $L_{b8}$ |
| 257 | $L_{a1\text{-}224}$ | $L_{b8}$ | $L_{b8}$ |
| 258 | $L_{a1\text{-}258}$ | $L_{b8}$ | $L_{b8}$ |
| 259 | $L_{a1\text{-}308}$ | $L_{b8}$ | $L_{b8}$ |
| 260 | $L_{a1\text{-}321}$ | $L_{b8}$ | $L_{b8}$ |
| 261 | $L_{a1\text{-}333}$ | $L_{b8}$ | $L_{b8}$ |
| 262 | $L_{a1\text{-}339}$ | $L_{b8}$ | $L_{b8}$ |
| 263 | $L_{a1\text{-}345}$ | $L_{b8}$ | $L_{b8}$ |
| 265 | $L_{a1\text{-}400}$ | $L_{b8}$ | $L_{b8}$ |
| 266 | $L_{a1\text{-}418}$ | $L_{b8}$ | $L_{b8}$ |
| 267 | $L_{a1\text{-}419}$ | $L_{b8}$ | $L_{b8}$ |
| 268 | $L_{a1\text{-}440}$ | $L_{b8}$ | $L_{b8}$ |
| 269 | $L_{a1\text{-}441}$ | $L_{b8}$ | $L_{b8}$ |
| 270 | $L_{a1\text{-}446}$ | $L_{b8}$ | $L_{b8}$ |
| 271 | $L_{a2\text{-}58}$ | $L_{b8}$ | $L_{b8}$ |
| 272 | $L_{a2\text{-}88}$ | $L_{b8}$ | $L_{b8}$ |
| 273 | $L_{a2\text{-}133}$ | $L_{b8}$ | $L_{b8}$ |
| 274 | $L_{a2\text{-}146}$ | $L_{b8}$ | $L_{b8}$ |
| 275 | $L_{a2\text{-}157}$ | $L_{b8}$ | $L_{b8}$ |

-continued

| Metal Complex | $L_a$ | $L_b$ | $L_b$ |
|---|---|---|---|
| 276 | $L_{a2-158}$ | $L_{b8}$ | $L_{b8}$ |
| 277 | $L_{a2-164}$ | $L_{b8}$ | $L_{b8}$ |
| 278 | $L_{a2-170}$ | $L_{b8}$ | $L_{b8}$ |
| 279 | $L_{a2-176}$ | $L_{b8}$ | $L_{b8}$ |
| 281 | $L_{a2-224}$ | $L_{b8}$ | $L_{b8}$ |
| 282 | $L_{a2-258}$ | $L_{b8}$ | $L_{b8}$ |
| 283 | $L_{a2-308}$ | $L_{b8}$ | $L_{b8}$ |
| 284 | $L_{a2-321}$ | $L_{b8}$ | $L_{b8}$ |
| 285 | $L_{a2-333}$ | $L_{b8}$ | $L_{b8}$ |
| 286 | $L_{a2-339}$ | $L_{b8}$ | $L_{b8}$ |
| 287 | $L_{a2-345}$ | $L_{b8}$ | $L_{b8}$ |
| 289 | $L_{a2-400}$ | $L_{b8}$ | $L_{b8}$ |
| 290 | $L_{a2-418}$ | $L_{b8}$ | $L_{b8}$ |
| 291 | $L_{a2-419}$ | $L_{b8}$ | $L_{b8}$ |
| 292 | $L_{a2-440}$ | $L_{b8}$ | $L_{b8}$ |
| 293 | $L_{a2-441}$ | $L_{b8}$ | $L_{b8}$ |
| 294 | $L_{a2-446}$ | $L_{b8}$ | $L_{b8}$ |
| 295 | $L_{a3-58}$ | $L_{b8}$ | $L_{b8}$ |
| 296 | $L_{a3-88}$ | $L_{b8}$ | $L_{b8}$ |
| 297 | $L_{a3-133}$ | $L_{b8}$ | $L_{b8}$ |
| 298 | $L_{a3-146}$ | $L_{b8}$ | $L_{b8}$ |
| 299 | $L_{a3-157}$ | $L_{b8}$ | $L_{b8}$ |
| 300 | $L_{a3-158}$ | $L_{b8}$ | $L_{b8}$ |
| 301 | $L_{a3-164}$ | $L_{b8}$ | $L_{b8}$ |
| 302 | $L_{a3-170}$ | $L_{b8}$ | $L_{b8}$ |
| 303 | $L_{a3-176}$ | $L_{b8}$ | $L_{b8}$ |
| 305 | $L_{a3-224}$ | $L_{b8}$ | $L_{b8}$ |
| 306 | $L_{a3-258}$ | $L_{b8}$ | $L_{b8}$ |
| 307 | $L_{a3-308}$ | $L_{b8}$ | $L_{b8}$ |
| 308 | $L_{a3-321}$ | $L_{b8}$ | $L_{b8}$ |
| 309 | $L_{a3-333}$ | $L_{b8}$ | $L_{b8}$ |
| 310 | $L_{a3-339}$ | $L_{b8}$ | $L_{b8}$ |
| 311 | $L_{a3-345}$ | $L_{b8}$ | $L_{b8}$ |
| 313 | $L_{a3-400}$ | $L_{b8}$ | $L_{b8}$ |
| 314 | $L_{a3-418}$ | $L_{b8}$ | $L_{b8}$ |
| 315 | $L_{a3-419}$ | $L_{b8}$ | $L_{b8}$ |
| 316 | $L_{a3-440}$ | $L_{b8}$ | $L_{b8}$ |
| 317 | $L_{a3-441}$ | $L_{b8}$ | $L_{b8}$ |
| 318 | $L_{a3-446}$ | $L_{b8}$ | $L_{b8}$ |
| 319 | $L_{a4-2}$ | $L_{b8}$ | $L_{b8}$ |
| 320 | $L_{a4-4}$ | $L_{b8}$ | $L_{b8}$ |
| 321 | $L_{a4-8}$ | $L_{b8}$ | $L_{b8}$ |
| 322 | $L_{a4-10}$ | $L_{b8}$ | $L_{b8}$ |
| 323 | $L_{a4-14}$ | $L_{b8}$ | $L_{b8}$ |
| 324 | $L_{a4-16}$ | $L_{b8}$ | $L_{b8}$ |
| 325 | $L_{a4-20}$ | $L_{b8}$ | $L_{b8}$ |
| 326 | $L_{a4-22}$ | $L_{b8}$ | $L_{b8}$ |
| 327 | $L_{a4-26}$ | $L_{b8}$ | $L_{b8}$ |
| 328 | $L_{a4-28}$ | $L_{b8}$ | $L_{b8}$ |
| 329 | $L_{a1-58}$ | $L_{b10}$ | $L_{b10}$ |
| 330 | $L_{a1-88}$ | $L_{b10}$ | $L_{b10}$ |
| 331 | $L_{a1-133}$ | $L_{b10}$ | $L_{b10}$ |
| 332 | $L_{a1-146}$ | $L_{b10}$ | $L_{b10}$ |
| 333 | $L_{a1-157}$ | $L_{b10}$ | $L_{b10}$ |
| 334 | $L_{a1-158}$ | $L_{b10}$ | $L_{b10}$ |
| 335 | $L_{a1-164}$ | $L_{b10}$ | $L_{b10}$ |
| 336 | $L_{a1-170}$ | $L_{b10}$ | $L_{b10}$ |
| 337 | $L_{a1-176}$ | $L_{b10}$ | $L_{b10}$ |
| 339 | $L_{a1-224}$ | $L_{b10}$ | $L_{b10}$ |
| 340 | $L_{a1-258}$ | $L_{b10}$ | $L_{b10}$ |
| 341 | $L_{a1-308}$ | $L_{b10}$ | $L_{b10}$ |
| 342 | $L_{a1-321}$ | $L_{b10}$ | $L_{b10}$ |
| 343 | $L_{a1-333}$ | $L_{b10}$ | $L_{b10}$ |
| 344 | $L_{a1-339}$ | $L_{b10}$ | $L_{b10}$ |
| 345 | $L_{a1-345}$ | $L_{b10}$ | $L_{b10}$ |
| 347 | $L_{a1-400}$ | $L_{b10}$ | $L_{b10}$ |
| 348 | $L_{a1-418}$ | $L_{b10}$ | $L_{b10}$ |
| 349 | $L_{a1-419}$ | $L_{b10}$ | $L_{b10}$ |
| 350 | $L_{a1-440}$ | $L_{b10}$ | $L_{b10}$ |
| 351 | $L_{a1-441}$ | $L_{b10}$ | $L_{b10}$ |
| 352 | $L_{a1-446}$ | $L_{b10}$ | $L_{b10}$ |
| 353 | $L_{a2-58}$ | $L_{b10}$ | $L_{b10}$ |
| 354 | $L_{a2-88}$ | $L_{b10}$ | $L_{b10}$ |
| 355 | $L_{a2-133}$ | $L_{b10}$ | $L_{b10}$ |
| 356 | $L_{a2-146}$ | $L_{b10}$ | $L_{b10}$ |
| 357 | $L_{a2-157}$ | $L_{b10}$ | $L_{b10}$ |

-continued

| Metal Complex | $L_a$ | $L_b$ | $L_b$ |
|---|---|---|---|
| 358 | $L_{a2-158}$ | $L_{b10}$ | $L_{b10}$ |
| 359 | $L_{a2-164}$ | $L_{b10}$ | $L_{b10}$ |
| 360 | $L_{a2-170}$ | $L_{b10}$ | $L_{b10}$ |
| 361 | $L_{a2-176}$ | $L_{b10}$ | $L_{b10}$ |
| 363 | $L_{a2-224}$ | $L_{b10}$ | $L_{b10}$ |
| 364 | $L_{a2-258}$ | $L_{b10}$ | $L_{b10}$ |
| 365 | $L_{a2-308}$ | $L_{b10}$ | $L_{b10}$ |
| 366 | $L_{a2-321}$ | $L_{b10}$ | $L_{b10}$ |
| 367 | $L_{a2-333}$ | $L_{b10}$ | $L_{b10}$ |
| 368 | $L_{a2-339}$ | $L_{b10}$ | $L_{b10}$ |
| 369 | $L_{a2-345}$ | $L_{b10}$ | $L_{b10}$ |
| 371 | $L_{a2-400}$ | $L_{b10}$ | $L_{b10}$ |
| 372 | $L_{a2-418}$ | $L_{b10}$ | $L_{b10}$ |
| 373 | $L_{a2-419}$ | $L_{b10}$ | $L_{b10}$ |
| 375 | $L_{a2-441}$ | $L_{b10}$ | $L_{b10}$ |
| 374 | $L_{a2-440}$ | $L_{b10}$ | $L_{b10}$ |
| 376 | $L_{a2-446}$ | $L_{b10}$ | $L_{b10}$ |
| 377 | $L_{a3-58}$ | $L_{b10}$ | $L_{b10}$ |
| 378 | $L_{a3-88}$ | $L_{b10}$ | $L_{b10}$ |
| 379 | $L_{a3-133}$ | $L_{b10}$ | $L_{b10}$ |
| 380 | $L_{a3-146}$ | $L_{b10}$ | $L_{b10}$ |
| 381 | $L_{a3-157}$ | $L_{b10}$ | $L_{b10}$ |
| 382 | $L_{a3-158}$ | $L_{b10}$ | $L_{b10}$ |
| 383 | $L_{a3-164}$ | $L_{b10}$ | $L_{b10}$ |
| 384 | $L_{a3-170}$ | $L_{b10}$ | $L_{b10}$ |
| 385 | $L_{a3-176}$ | $L_{b10}$ | $L_{b10}$ |
| 387 | $L_{a3-224}$ | $L_{b10}$ | $L_{b10}$ |
| 388 | $L_{a3-258}$ | $L_{b10}$ | $L_{b10}$ |
| 389 | $L_{a3-308}$ | $L_{b10}$ | $L_{b10}$ |
| 390 | $L_{a3-321}$ | $L_{b10}$ | $L_{b10}$ |
| 391 | $L_{a3-333}$ | $L_{b10}$ | $L_{b10}$ |
| 392 | $L_{a3-339}$ | $L_{b10}$ | $L_{b10}$ |
| 393 | $L_{a3-345}$ | $L_{b10}$ | $L_{b10}$ |
| 395 | $L_{a3-400}$ | $L_{b10}$ | $L_{b10}$ |
| 396 | $L_{a3-418}$ | $L_{b10}$ | $L_{b10}$ |
| 397 | $L_{a3-419}$ | $L_{b10}$ | $L_{b10}$ |
| 398 | $L_{a3-440}$ | $L_{b10}$ | $L_{b10}$ |
| 399 | $L_{a3-441}$ | $L_{b10}$ | $L_{b10}$ |
| 400 | $L_{a3-446}$ | $L_{b10}$ | $L_{b10}$ |
| 401 | $L_{a4-2}$ | $L_{b10}$ | $L_{b10}$ |
| 402 | $L_{a4-4}$ | $L_{b10}$ | $L_{b10}$ |
| 403 | $L_{a4-8}$ | $L_{b10}$ | $L_{b10}$ |
| 404 | $L_{a4-10}$ | $L_{b10}$ | $L_{b10}$ |
| 405 | $L_{a4-14}$ | $L_{b10}$ | $L_{b10}$ |
| 406 | $L_{a4-16}$ | $L_{b10}$ | $L_{b10}$ |
| 407 | $L_{a4-20}$ | $L_{b10}$ | $L_{b10}$ |
| 408 | $L_{a4-22}$ | $L_{b10}$ | $L_{b10}$ |
| 409 | $L_{a4-26}$ | $L_{b10}$ | $L_{b10}$ |
| 410 | $L_{a4-28}$ | $L_{b10}$ | $L_{b10}$ |
| 411 | $L_{a1-58}$ | $L_{b12}$ | $L_{b12}$ |
| 412 | $L_{a1-88}$ | $L_{b12}$ | $L_{b12}$ |
| 413 | $L_{a1-133}$ | $L_{b12}$ | $L_{b12}$ |
| 414 | $L_{a1-146}$ | $L_{b12}$ | $L_{b12}$ |
| 415 | $L_{a1-157}$ | $L_{b12}$ | $L_{b12}$ |
| 416 | $L_{a1-158}$ | $L_{b12}$ | $L_{b12}$ |
| 417 | $L_{a1-164}$ | $L_{b12}$ | $L_{b12}$ |
| 418 | $L_{a1-170}$ | $L_{b12}$ | $L_{b12}$ |
| 419 | $L_{a1-176}$ | $L_{b12}$ | $L_{b12}$ |
| 421 | $L_{a1-224}$ | $L_{b12}$ | $L_{b12}$ |
| 422 | $L_{a1-258}$ | $L_{b12}$ | $L_{b12}$ |
| 423 | $L_{a1-308}$ | $L_{b12}$ | $L_{b12}$ |
| 424 | $L_{a1-321}$ | $L_{b12}$ | $L_{b12}$ |
| 425 | $L_{a1-333}$ | $L_{b12}$ | $L_{b12}$ |
| 426 | $L_{a1-339}$ | $L_{b12}$ | $L_{b12}$ |
| 427 | $L_{a1-345}$ | $L_{b12}$ | $L_{b12}$ |
| 429 | $L_{a1-400}$ | $L_{b12}$ | $L_{b12}$ |
| 430 | $L_{a1-418}$ | $L_{b12}$ | $L_{b12}$ |
| 431 | $L_{a1-419}$ | $L_{b12}$ | $L_{b12}$ |
| 432 | $L_{a1-440}$ | $L_{b12}$ | $L_{b12}$ |
| 433 | $L_{a1-441}$ | $L_{b12}$ | $L_{b12}$ |
| 434 | $L_{a1-446}$ | $L_{b12}$ | $L_{b12}$ |
| 435 | $L_{a2-58}$ | $L_{b12}$ | $L_{b12}$ |
| 436 | $L_{a2-88}$ | $L_{b12}$ | $L_{b12}$ |
| 437 | $L_{a2-133}$ | $L_{b12}$ | $L_{b12}$ |
| 438 | $L_{a2-146}$ | $L_{b12}$ | $L_{b12}$ |
| 439 | $L_{a2-157}$ | $L_{b12}$ | $L_{b12}$ |

-continued

| Metal Complex | $L_a$ | $L_b$ | $L_b$ |
|---|---|---|---|
| 440 | $L_{a2-158}$ | $L_{b12}$ | $L_{b12}$ |
| 441 | $L_{a2-164}$ | $L_{b12}$ | $L_{b12}$ |
| 442 | $L_{a2-170}$ | $L_{b12}$ | $L_{b12}$ |
| 443 | $L_{a2-176}$ | $L_{b12}$ | $L_{b12}$ |
| 445 | $L_{a2-224}$ | $L_{b12}$ | $L_{b12}$ |
| 446 | $L_{a2-258}$ | $L_{b12}$ | $L_{b12}$ |
| 447 | $L_{a2-308}$ | $L_{b12}$ | $L_{b12}$ |
| 448 | $L_{a2-321}$ | $L_{b12}$ | $L_{b12}$ |
| 449 | $L_{a2-333}$ | $L_{b12}$ | $L_{b12}$ |
| 450 | $L_{a2-339}$ | $L_{b12}$ | $L_{b12}$ |
| 451 | $L_{a2-345}$ | $L_{b12}$ | $L_{b12}$ |
| 453 | $L_{a2-400}$ | $L_{b12}$ | $L_{b12}$ |
| 454 | $L_{a2-418}$ | $L_{b12}$ | $L_{b12}$ |
| 455 | $L_{a2-419}$ | $L_{b12}$ | $L_{b12}$ |
| 456 | $L_{a2-440}$ | $L_{b12}$ | $L_{b12}$ |
| 457 | $L_{a2-441}$ | $L_{b12}$ | $L_{b12}$ |
| 458 | $L_{a2-446}$ | $L_{b12}$ | $L_{b12}$ |
| 459 | $L_{a3-58}$ | $L_{b12}$ | $L_{b12}$ |
| 460 | $L_{a3-88}$ | $L_{b12}$ | $L_{b12}$ |
| 461 | $L_{a3-133}$ | $L_{b12}$ | $L_{b12}$ |
| 462 | $L_{a3-146}$ | $L_{b12}$ | $L_{b12}$ |
| 463 | $L_{a3-157}$ | $L_{b12}$ | $L_{b12}$ |
| 464 | $L_{a3-158}$ | $L_{b12}$ | $L_{b12}$ |
| 465 | $L_{a3-164}$ | $L_{b12}$ | $L_{b12}$ |
| 466 | $L_{a3-170}$ | $L_{b12}$ | $L_{b12}$ |
| 467 | $L_{a3-176}$ | $L_{b12}$ | $L_{b12}$ |
| 469 | $L_{a3-224}$ | $L_{b12}$ | $L_{b12}$ |
| 470 | $L_{a3-258}$ | $L_{b12}$ | $L_{b12}$ |
| 471 | $L_{a3-308}$ | $L_{b12}$ | $L_{b12}$ |
| 472 | $L_{a3-321}$ | $L_{b12}$ | $L_{b12}$ |
| 473 | $L_{a3-333}$ | $L_{b12}$ | $L_{b12}$ |
| 474 | $L_{a3-339}$ | $L_{b12}$ | $L_{b12}$ |
| 475 | $L_{a3-345}$ | $L_{b12}$ | $L_{b12}$ |
| 477 | $L_{a3-400}$ | $L_{b12}$ | $L_{b12}$ |
| 478 | $L_{a3-418}$ | $L_{b12}$ | $L_{b12}$ |
| 479 | $L_{a3-419}$ | $L_{b12}$ | $L_{b12}$ |
| 480 | $L_{a3-440}$ | $L_{b12}$ | $L_{b12}$ |
| 481 | $L_{a3-441}$ | $L_{b12}$ | $L_{b12}$ |
| 482 | $L_{a3-446}$ | $L_{b12}$ | $L_{b12}$ |
| 483 | $L_{a4-2}$ | $L_{b12}$ | $L_{b12}$ |
| 484 | $L_{a4-4}$ | $L_{b12}$ | $L_{b12}$ |
| 485 | $L_{a4-8}$ | $L_{b12}$ | $L_{b12}$ |
| 486 | $L_{a4-10}$ | $L_{b12}$ | $L_{b12}$ |
| 487 | $L_{a4-14}$ | $L_{b12}$ | $L_{b12}$ |
| 488 | $L_{a4-16}$ | $L_{b12}$ | $L_{b12}$ |
| 489 | $L_{a4-20}$ | $L_{b12}$ | $L_{b12}$ |
| 490 | $L_{a4-22}$ | $L_{b12}$ | $L_{b12}$ |
| 491 | $L_{a4-26}$ | $L_{b12}$ | $L_{b12}$ |
| 492 | $L_{a4-28}$ | $L_{b12}$ | $L_{b12}$ |
| 493 | $L_{a1-58}$ | $L_{b13}$ | $L_{b13}$ |
| 494 | $L_{a1-88}$ | $L_{b13}$ | $L_{b13}$ |
| 495 | $L_{a1-133}$ | $L_{b13}$ | $L_{b13}$ |
| 496 | $L_{a1-146}$ | $L_{b13}$ | $L_{b13}$ |
| 497 | $L_{a1-157}$ | $L_{b13}$ | $L_{b13}$ |
| 498 | $L_{a1-158}$ | $L_{b13}$ | $L_{b13}$ |
| 499 | $L_{a1-164}$ | $L_{b13}$ | $L_{b13}$ |
| 500 | $L_{a1-170}$ | $L_{b13}$ | $L_{b13}$ |
| 501 | $L_{a1-176}$ | $L_{b13}$ | $L_{b13}$ |
| 503 | $L_{a1-224}$ | $L_{b13}$ | $L_{b13}$ |
| 504 | $L_{a1-258}$ | $L_{b13}$ | $L_{b13}$ |
| 505 | $L_{a1-308}$ | $L_{b13}$ | $L_{b13}$ |
| 506 | $L_{a1-321}$ | $L_{b13}$ | $L_{b13}$ |
| 507 | $L_{a1-333}$ | $L_{b13}$ | $L_{b13}$ |
| 508 | $L_{a1-339}$ | $L_{b13}$ | $L_{b13}$ |
| 509 | $L_{a1-345}$ | $L_{b13}$ | $L_{b13}$ |
| 511 | $L_{a1-400}$ | $L_{b13}$ | $L_{b13}$ |
| 512 | $L_{a1-418}$ | $L_{b13}$ | $L_{b13}$ |
| 513 | $L_{a1-419}$ | $L_{b13}$ | $L_{b13}$ |
| 514 | $L_{a1-440}$ | $L_{b13}$ | $L_{b13}$ |
| 515 | $L_{a1-441}$ | $L_{b13}$ | $L_{b13}$ |
| 516 | $L_{a1-446}$ | $L_{b13}$ | $L_{b13}$ |
| 517 | $L_{a2-58}$ | $L_{b13}$ | $L_{b13}$ |
| 518 | $L_{a2-88}$ | $L_{b13}$ | $L_{b13}$ |
| 519 | $L_{a2-133}$ | $L_{b13}$ | $L_{b13}$ |
| 520 | $L_{a2-146}$ | $L_{b13}$ | $L_{b13}$ |
| 521 | $L_{a2-157}$ | $L_{b13}$ | $L_{b13}$ |

-continued

| Metal Complex | $L_a$ | $L_b$ | $L_b$ |
|---|---|---|---|
| 522 | $L_{a2-158}$ | $L_{b13}$ | $L_{b13}$ |
| 523 | $L_{a2-164}$ | $L_{b13}$ | $L_{b13}$ |
| 524 | $L_{a2-170}$ | $L_{b13}$ | $L_{b13}$ |
| 525 | $L_{a2-176}$ | $L_{b13}$ | $L_{b13}$ |
| 527 | $L_{a2-224}$ | $L_{b13}$ | $L_{b13}$ |
| 528 | $L_{a2-258}$ | $L_{b13}$ | $L_{b13}$ |
| 529 | $L_{a2-308}$ | $L_{b13}$ | $L_{b13}$ |
| 530 | $L_{a2-321}$ | $L_{b13}$ | $L_{b13}$ |
| 531 | $L_{a2-333}$ | $L_{b13}$ | $L_{b13}$ |
| 532 | $L_{a2-339}$ | $L_{b13}$ | $L_{b13}$ |
| 533 | $L_{a2-345}$ | $L_{b13}$ | $L_{b13}$ |
| 535 | $L_{a2-400}$ | $L_{b13}$ | $L_{b13}$ |
| 536 | $L_{a2-418}$ | $L_{b13}$ | $L_{b13}$ |
| 537 | $L_{a2-419}$ | $L_{b13}$ | $L_{b13}$ |
| 538 | $L_{a2-440}$ | $L_{b13}$ | $L_{b13}$ |
| 539 | $L_{a2-441}$ | $L_{b13}$ | $L_{b13}$ |
| 540 | $L_{a2-446}$ | $L_{b13}$ | $L_{b13}$ |
| 541 | $L_{a3-58}$ | $L_{b13}$ | $L_{b13}$ |
| 542 | $L_{a3-88}$ | $L_{b13}$ | $L_{b13}$ |
| 543 | $L_{a3-133}$ | $L_{b13}$ | $L_{b13}$ |
| 544 | $L_{a3-146}$ | $L_{b13}$ | $L_{b13}$ |
| 545 | $L_{a3-157}$ | $L_{b13}$ | $L_{b13}$ |
| 546 | $L_{a3-158}$ | $L_{b13}$ | $L_{b13}$ |
| 547 | $L_{a3-164}$ | $L_{b13}$ | $L_{b13}$ |
| 548 | $L_{a3-170}$ | $L_{b13}$ | $L_{b13}$ |
| 549 | $L_{a3-176}$ | $L_{b13}$ | $L_{b13}$ |
| 551 | $L_{a3-224}$ | $L_{b13}$ | $L_{b13}$ |
| 552 | $L_{a3-258}$ | $L_{b13}$ | $L_{b13}$ |
| 553 | $L_{a3-308}$ | $L_{b13}$ | $L_{b13}$ |
| 554 | $L_{a3-321}$ | $L_{b13}$ | $L_{b13}$ |
| 555 | $L_{a3-333}$ | $L_{b13}$ | $L_{b13}$ |
| 556 | $L_{a3-339}$ | $L_{b13}$ | $L_{b13}$ |
| 557 | $L_{a3-345}$ | $L_{b13}$ | $L_{b13}$ |
| 559 | $L_{a3-400}$ | $L_{b13}$ | $L_{b13}$ |
| 560 | $L_{a3-418}$ | $L_{b13}$ | $L_{b13}$ |
| 561 | $L_{a3-419}$ | $L_{b13}$ | $L_{b13}$ |
| 562 | $L_{a3-440}$ | $L_{b13}$ | $L_{b13}$ |
| 563 | $L_{a3-441}$ | $L_{b13}$ | $L_{b13}$ |
| 564 | $L_{a3-446}$ | $L_{b13}$ | $L_{b13}$ |
| 565 | $L_{a4-2}$ | $L_{b13}$ | $L_{b13}$ |
| 566 | $L_{a4-4}$ | $L_{b13}$ | $L_{b13}$ |
| 567 | $L_{a4-8}$ | $L_{b13}$ | $L_{b13}$ |
| 568 | $L_{a4-10}$ | $L_{b13}$ | $L_{b13}$ |
| 569 | $L_{a4-14}$ | $L_{b13}$ | $L_{b13}$ |
| 570 | $L_{a4-16}$ | $L_{b13}$ | $L_{b13}$ |
| 571 | $L_{a4-20}$ | $L_{b13}$ | $L_{b13}$ |
| 572 | $L_{a4-22}$ | $L_{b13}$ | $L_{b13}$ |
| 573 | $L_{a4-26}$ | $L_{b13}$ | $L_{b13}$ |
| 574 | $L_{a4-28}$ | $L_{b13}$ | $L_{b13}$ |
| 575 | $L_{a1-58}$ | $L_{b17}$ | $L_{b17}$ |
| 576 | $L_{a1-88}$ | $L_{b17}$ | $L_{b17}$ |
| 577 | $L_{a1-133}$ | $L_{b17}$ | $L_{b17}$ |
| 578 | $L_{a1-146}$ | $L_{b17}$ | $L_{b17}$ |
| 579 | $L_{a1-157}$ | $L_{b17}$ | $L_{b17}$ |
| 580 | $L_{a1-158}$ | $L_{b17}$ | $L_{b17}$ |
| 581 | $L_{a1-164}$ | $L_{b17}$ | $L_{b17}$ |
| 582 | $L_{a1-170}$ | $L_{b17}$ | $L_{b17}$ |
| 583 | $L_{a1-176}$ | $L_{b17}$ | $L_{b17}$ |
| 585 | $L_{a1-224}$ | $L_{b17}$ | $L_{b17}$ |
| 586 | $L_{a1-258}$ | $L_{b17}$ | $L_{b17}$ |
| 587 | $L_{a1-308}$ | $L_{b17}$ | $L_{b17}$ |
| 588 | $L_{a1-321}$ | $L_{b17}$ | $L_{b17}$ |
| 589 | $L_{a1-333}$ | $L_{b17}$ | $L_{b17}$ |
| 590 | $L_{a1-339}$ | $L_{b17}$ | $L_{b17}$ |
| 591 | $L_{a1-345}$ | $L_{b17}$ | $L_{b17}$ |
| 593 | $L_{a1-400}$ | $L_{b17}$ | $L_{b17}$ |
| 594 | $L_{a1-418}$ | $L_{b17}$ | $L_{b17}$ |
| 595 | $L_{a1-419}$ | $L_{b17}$ | $L_{b17}$ |
| 596 | $L_{a1-440}$ | $L_{b17}$ | $L_{b17}$ |
| 597 | $L_{a1-441}$ | $L_{b17}$ | $L_{b17}$ |
| 598 | $L_{a1-446}$ | $L_{b17}$ | $L_{b17}$ |
| 599 | $L_{a2-58}$ | $L_{b17}$ | $L_{b17}$ |
| 600 | $L_{a2-88}$ | $L_{b17}$ | $L_{b17}$ |
| 601 | $L_{a2-133}$ | $L_{b17}$ | $L_{b17}$ |
| 602 | $L_{a2-146}$ | $L_{b17}$ | $L_{b17}$ |
| 603 | $L_{a2-157}$ | $L_{b17}$ | $L_{b17}$ |

-continued

| Metal Complex | $L_a$ | $L_b$ | $L_b$ |
|---|---|---|---|
| 604 | $L_{a2-158}$ | $L_{b17}$ | $L_{b17}$ |
| 605 | $L_{a2-164}$ | $L_{b17}$ | $L_{b17}$ |
| 606 | $L_{a2-170}$ | $L_{b17}$ | $L_{b17}$ |
| 607 | $L_{a2-176}$ | $L_{b17}$ | $L_{b17}$ |
| 609 | $L_{a2-224}$ | $L_{b17}$ | $L_{b17}$ |
| 610 | $L_{a2-258}$ | $L_{b17}$ | $L_{b17}$ |
| 611 | $L_{a2-308}$ | $L_{b17}$ | $L_{b17}$ |
| 612 | $L_{a2-321}$ | $L_{b17}$ | $L_{b17}$ |
| 613 | $L_{a2-333}$ | $L_{b17}$ | $L_{b17}$ |
| 614 | $L_{a2-339}$ | $L_{b17}$ | $L_{b17}$ |
| 615 | $L_{a2-345}$ | $L_{b17}$ | $L_{b17}$ |
| 617 | $L_{a2-400}$ | $L_{b17}$ | $L_{b17}$ |
| 618 | $L_{a2-418}$ | $L_{b17}$ | $L_{b17}$ |
| 619 | $L_{a2-419}$ | $L_{b17}$ | $L_{b17}$ |
| 620 | $L_{a2-440}$ | $L_{b17}$ | $L_{b17}$ |
| 621 | $L_{a2-441}$ | $L_{b17}$ | $L_{b17}$ |
| 622 | $L_{a2-446}$ | $L_{b17}$ | $L_{b17}$ |
| 623 | $L_{a3-58}$ | $L_{b17}$ | $L_{b17}$ |
| 624 | $L_{a3-88}$ | $L_{b17}$ | $L_{b17}$ |
| 625 | $L_{a3-133}$ | $L_{b17}$ | $L_{b17}$ |
| 626 | $L_{a3-146}$ | $L_{b17}$ | $L_{b17}$ |
| 627 | $L_{a3-157}$ | $L_{b17}$ | $L_{b17}$ |
| 628 | $L_{a3-158}$ | $L_{b17}$ | $L_{b17}$ |
| 629 | $L_{a3-164}$ | $L_{b17}$ | $L_{b17}$ |
| 630 | $L_{a3-170}$ | $L_{b17}$ | $L_{b17}$ |
| 631 | $L_{a3-176}$ | $L_{b17}$ | $L_{b17}$ |
| 633 | $L_{a3-224}$ | $L_{b17}$ | $L_{b17}$ |
| 634 | $L_{a3-258}$ | $L_{b17}$ | $L_{b17}$ |
| 635 | $L_{a3-308}$ | $L_{b17}$ | $L_{b17}$ |
| 636 | $L_{a3-321}$ | $L_{b17}$ | $L_{b17}$ |
| 637 | $L_{a3-333}$ | $L_{b17}$ | $L_{b17}$ |
| 638 | $L_{a3-339}$ | $L_{b17}$ | $L_{b17}$ |
| 639 | $L_{a3-345}$ | $L_{b17}$ | $L_{b17}$ |
| 641 | $L_{a3-400}$ | $L_{b17}$ | $L_{b17}$ |
| 642 | $L_{a3-418}$ | $L_{b17}$ | $L_{b17}$ |
| 643 | $L_{a3-419}$ | $L_{b17}$ | $L_{b17}$ |
| 644 | $L_{a3-440}$ | $L_{b17}$ | $L_{b17}$ |
| 645 | $L_{a3-441}$ | $L_{b17}$ | $L_{b17}$ |
| 646 | $L_{a3-446}$ | $L_{b17}$ | $L_{b17}$ |
| 647 | $L_{a4-2}$ | $L_{b17}$ | $L_{b17}$ |
| 648 | $L_{a4-4}$ | $L_{b17}$ | $L_{b17}$ |
| 649 | $L_{a4-8}$ | $L_{b17}$ | $L_{b17}$ |
| 650 | $L_{a4-10}$ | $L_{b17}$ | $L_{b17}$ |
| 651 | $L_{a4-14}$ | $L_{b17}$ | $L_{b17}$ |
| 652 | $L_{a4-16}$ | $L_{b17}$ | $L_{b17}$ |
| 653 | $L_{a4-20}$ | $L_{b17}$ | $L_{b17}$ |
| 654 | $L_{a4-22}$ | $L_{b17}$ | $L_{b17}$ |
| 655 | $L_{a4-26}$ | $L_{b17}$ | $L_{b17}$ |
| 656 | $L_{a4-28}$ | $L_{b17}$ | $L_{b17}$ |
| 657 | $L_{a1-58}$ | $L_{b30}$ | $L_{b30}$ |
| 658 | $L_{a1-88}$ | $L_{b30}$ | $L_{b30}$ |
| 659 | $L_{a1-133}$ | $L_{b30}$ | $L_{b30}$ |
| 660 | $L_{a1-146}$ | $L_{b30}$ | $L_{b30}$ |
| 661 | $L_{a1-157}$ | $L_{b30}$ | $L_{b30}$ |
| 662 | $L_{a1-158}$ | $L_{b30}$ | $L_{b30}$ |
| 663 | $L_{a1-164}$ | $L_{b30}$ | $L_{b30}$ |
| 664 | $L_{a1-170}$ | $L_{b30}$ | $L_{b30}$ |
| 665 | $L_{a1-176}$ | $L_{b30}$ | $L_{b30}$ |
| 667 | $L_{a1-224}$ | $L_{b30}$ | $L_{b30}$ |
| 668 | $L_{a1-258}$ | $L_{b30}$ | $L_{b30}$ |
| 669 | $L_{a1-308}$ | $L_{b30}$ | $L_{b30}$ |
| 670 | $L_{a1-321}$ | $L_{b30}$ | $L_{b30}$ |
| 671 | $L_{a1-333}$ | $L_{b30}$ | $L_{b30}$ |
| 672 | $L_{a1-339}$ | $L_{b30}$ | $L_{b30}$ |
| 673 | $L_{a1-345}$ | $L_{b30}$ | $L_{b30}$ |
| 675 | $L_{a1-400}$ | $L_{b30}$ | $L_{b30}$ |
| 676 | $L_{a1-418}$ | $L_{b30}$ | $L_{b30}$ |
| 677 | $L_{a1-419}$ | $L_{b30}$ | $L_{b30}$ |
| 678 | $L_{a1-440}$ | $L_{b30}$ | $L_{b30}$ |
| 679 | $L_{a1-441}$ | $L_{b30}$ | $L_{b30}$ |
| 680 | $L_{a1-446}$ | $L_{b30}$ | $L_{b30}$ |
| 681 | $L_{a2-58}$ | $L_{b30}$ | $L_{b30}$ |
| 682 | $L_{a2-88}$ | $L_{b30}$ | $L_{b30}$ |
| 683 | $L_{a2-133}$ | $L_{b30}$ | $L_{b30}$ |
| 684 | $L_{a2-146}$ | $L_{b30}$ | $L_{b30}$ |
| 685 | $L_{a2-157}$ | $L_{b30}$ | $L_{b30}$ |

-continued

| Metal Complex | $L_a$ | $L_b$ | $L_b$ |
|---|---|---|---|
| 686 | $L_{a2-158}$ | $L_{b30}$ | $L_{b30}$ |
| 687 | $L_{a2-164}$ | $L_{b30}$ | $L_{b30}$ |
| 688 | $L_{a2-170}$ | $L_{b30}$ | $L_{b30}$ |
| 689 | $L_{a2-176}$ | $L_{b30}$ | $L_{b30}$ |
| 691 | $L_{a2-224}$ | $L_{b30}$ | $L_{b30}$ |
| 692 | $L_{a2-258}$ | $L_{b30}$ | $L_{b30}$ |
| 693 | $L_{a2-308}$ | $L_{b30}$ | $L_{b30}$ |
| 694 | $L_{a2-321}$ | $L_{b30}$ | $L_{b30}$ |
| 695 | $L_{a2-333}$ | $L_{b30}$ | $L_{b30}$ |
| 696 | $L_{a2-339}$ | $L_{b30}$ | $L_{b30}$ |
| 697 | $L_{a2-345}$ | $L_{b30}$ | $L_{b30}$ |
| 699 | $L_{a2-400}$ | $L_{b30}$ | $L_{b30}$ |
| 700 | $L_{a2-418}$ | $L_{b30}$ | $L_{b30}$ |
| 701 | $L_{a2-419}$ | $L_{b30}$ | $L_{b30}$ |
| 702 | $L_{a2-440}$ | $L_{b30}$ | $L_{b30}$ |
| 703 | $L_{a2-441}$ | $L_{b30}$ | $L_{b30}$ |
| 704 | $L_{a2-446}$ | $L_{b30}$ | $L_{b30}$ |
| 705 | $L_{a3-58}$ | $L_{b30}$ | $L_{b30}$ |
| 706 | $L_{a3-88}$ | $L_{b30}$ | $L_{b30}$ |
| 707 | $L_{a3-133}$ | $L_{b30}$ | $L_{b30}$ |
| 708 | $L_{a3-146}$ | $L_{b30}$ | $L_{b30}$ |
| 709 | $L_{a3-157}$ | $L_{b30}$ | $L_{b30}$ |
| 710 | $L_{a3-158}$ | $L_{b30}$ | $L_{b30}$ |
| 711 | $L_{a3-164}$ | $L_{b30}$ | $L_{b30}$ |
| 712 | $L_{a3-170}$ | $L_{b30}$ | $L_{b30}$ |
| 713 | $L_{a3-176}$ | $L_{b30}$ | $L_{b30}$ |
| 715 | $L_{a3-224}$ | $L_{b30}$ | $L_{b30}$ |
| 716 | $L_{a3-258}$ | $L_{b30}$ | $L_{b30}$ |
| 717 | $L_{a3-308}$ | $L_{b30}$ | $L_{b30}$ |
| 718 | $L_{a3-321}$ | $L_{b30}$ | $L_{b30}$ |
| 719 | $L_{a3-333}$ | $L_{b30}$ | $L_{b30}$ |
| 720 | $L_{a3-339}$ | $L_{b30}$ | $L_{b30}$ |
| 721 | $L_{a3-345}$ | $L_{b30}$ | $L_{b30}$ |
| 723 | $L_{a3-400}$ | $L_{b30}$ | $L_{b30}$ |
| 724 | $L_{a3-418}$ | $L_{b30}$ | $L_{b30}$ |
| 725 | $L_{a3-419}$ | $L_{b30}$ | $L_{b30}$ |
| 726 | $L_{a3-440}$ | $L_{b30}$ | $L_{b30}$ |
| 727 | $L_{a3-441}$ | $L_{b30}$ | $L_{b30}$ |
| 728 | $L_{a3-446}$ | $L_{b30}$ | $L_{b30}$ |
| 729 | $L_{a4-2}$ | $L_{b30}$ | $L_{b30}$ |
| 730 | $L_{a4-4}$ | $L_{b30}$ | $L_{b30}$ |
| 731 | $L_{a4-8}$ | $L_{b30}$ | $L_{b30}$ |
| 732 | $L_{a4-10}$ | $L_{b30}$ | $L_{b30}$ |
| 733 | $L_{a4-14}$ | $L_{b30}$ | $L_{b30}$ |
| 734 | $L_{a4-16}$ | $L_{b30}$ | $L_{b30}$ |
| 735 | $L_{a4-20}$ | $L_{b30}$ | $L_{b30}$ |
| 736 | $L_{a4-22}$ | $L_{b30}$ | $L_{b30}$ |
| 737 | $L_{a4-26}$ | $L_{b30}$ | $L_{b30}$ |
| 738 | $L_{a4-28}$ | $L_{b30}$ | $L_{b30}$ |
| 739 | $L_{a1-58}$ | $L_{b31}$ | $L_{b31}$ |
| 740 | $L_{a1-88}$ | $L_{b31}$ | $L_{b31}$ |
| 741 | $L_{a1-133}$ | $L_{b31}$ | $L_{b31}$ |
| 742 | $L_{a1-146}$ | $L_{b31}$ | $L_{b31}$ |
| 743 | $L_{a1-157}$ | $L_{b31}$ | $L_{b31}$ |
| 744 | $L_{a1-158}$ | $L_{b31}$ | $L_{b31}$ |
| 745 | $L_{a1-164}$ | $L_{b31}$ | $L_{b31}$ |
| 746 | $L_{a1-170}$ | $L_{b31}$ | $L_{b31}$ |
| 747 | $L_{a1-176}$ | $L_{b31}$ | $L_{b31}$ |
| 749 | $L_{a1-224}$ | $L_{b31}$ | $L_{b31}$ |
| 750 | $L_{a1-258}$ | $L_{b31}$ | $L_{b31}$ |
| 751 | $L_{a1-308}$ | $L_{b31}$ | $L_{b31}$ |
| 752 | $L_{a1-321}$ | $L_{b31}$ | $L_{b31}$ |
| 753 | $L_{a1-333}$ | $L_{b31}$ | $L_{b31}$ |
| 754 | $L_{a1-339}$ | $L_{b31}$ | $L_{b31}$ |
| 755 | $L_{a1-345}$ | $L_{b31}$ | $L_{b31}$ |
| 757 | $L_{a1-400}$ | $L_{b31}$ | $L_{b31}$ |
| 758 | $L_{a1-418}$ | $L_{b31}$ | $L_{b31}$ |
| 759 | $L_{a1-419}$ | $L_{b31}$ | $L_{b31}$ |
| 760 | $L_{a1-440}$ | $L_{b31}$ | $L_{b31}$ |
| 761 | $L_{a1-441}$ | $L_{b31}$ | $L_{b31}$ |
| 762 | $L_{a1-446}$ | $L_{b31}$ | $L_{b31}$ |
| 763 | $L_{a2-58}$ | $L_{b31}$ | $L_{b31}$ |
| 764 | $L_{a2-88}$ | $L_{b31}$ | $L_{b31}$ |
| 765 | $L_{a2-133}$ | $L_{b31}$ | $L_{b31}$ |
| 766 | $L_{a2-146}$ | $L_{b31}$ | $L_{b31}$ |
| 767 | $L_{a2-157}$ | $L_{b31}$ | $L_{b31}$ |

-continued

| Metal Complex | $L_a$ | $L_b$ | $L_b$ |
|---|---|---|---|
| 768 | $L_{a2\text{-}158}$ | $L_{b31}$ | $L_{b31}$ |
| 769 | $L_{a2\text{-}164}$ | $L_{b31}$ | $L_{b31}$ |
| 770 | $L_{a2\text{-}170}$ | $L_{b31}$ | $L_{b31}$ |
| 771 | $L_{a2\text{-}176}$ | $L_{b31}$ | $L_{b31}$ |
| 773 | $L_{a2\text{-}224}$ | $L_{b31}$ | $L_{b31}$ |
| 774 | $L_{a2\text{-}258}$ | $L_{b31}$ | $L_{b31}$ |
| 775 | $L_{a2\text{-}308}$ | $L_{b31}$ | $L_{b31}$ |
| 776 | $L_{a2\text{-}321}$ | $L_{b31}$ | $L_{b31}$ |
| 777 | $L_{a2\text{-}333}$ | $L_{b31}$ | $L_{b31}$ |
| 778 | $L_{a2\text{-}339}$ | $L_{b31}$ | $L_{b31}$ |
| 779 | $L_{a2\text{-}345}$ | $L_{b31}$ | $L_{b31}$ |
| 781 | $L_{a2\text{-}400}$ | $L_{b31}$ | $L_{b31}$ |
| 782 | $L_{a2\text{-}418}$ | $L_{b31}$ | $L_{b31}$ |
| 783 | $L_{a2\text{-}419}$ | $L_{b31}$ | $L_{b31}$ |
| 784 | $L_{a2\text{-}440}$ | $L_{b31}$ | $L_{b31}$ |
| 785 | $L_{a2\text{-}441}$ | $L_{b31}$ | $L_{b31}$ |
| 786 | $L_{a2\text{-}446}$ | $L_{b31}$ | $L_{b31}$ |
| 787 | $L_{a3\text{-}58}$ | $L_{b31}$ | $L_{b31}$ |
| 788 | $L_{a3\text{-}88}$ | $L_{b31}$ | $L_{b31}$ |
| 789 | $L_{a3\text{-}133}$ | $L_{b31}$ | $L_{b31}$ |
| 790 | $L_{a3\text{-}146}$ | $L_{b31}$ | $L_{b31}$ |
| 791 | $L_{a3\text{-}157}$ | $L_{b31}$ | $L_{b31}$ |
| 792 | $L_{a3\text{-}158}$ | $L_{b31}$ | $L_{b31}$ |
| 793 | $L_{a3\text{-}164}$ | $L_{b31}$ | $L_{b31}$ |
| 794 | $L_{a3\text{-}170}$ | $L_{b31}$ | $L_{b31}$ |
| 795 | $L_{a3\text{-}176}$ | $L_{b31}$ | $L_{b31}$ |
| 797 | $L_{a3\text{-}224}$ | $L_{b31}$ | $L_{b31}$ |
| 798 | $L_{a3\text{-}258}$ | $L_{b31}$ | $L_{b31}$ |
| 799 | $L_{a3\text{-}308}$ | $L_{b31}$ | $L_{b31}$ |
| 800 | $L_{a3\text{-}321}$ | $L_{b31}$ | $L_{b31}$ |
| 801 | $L_{a3\text{-}333}$ | $L_{b31}$ | $L_{b31}$ |
| 802 | $L_{a3\text{-}339}$ | $L_{b31}$ | $L_{b31}$ |
| 803 | $L_{a3\text{-}345}$ | $L_{b31}$ | $L_{b31}$ |
| 805 | $L_{a3\text{-}400}$ | $L_{b31}$ | $L_{b31}$ |
| 806 | $L_{a3\text{-}418}$ | $L_{b31}$ | $L_{b31}$ |
| 807 | $L_{a3\text{-}419}$ | $L_{b31}$ | $L_{b31}$ |
| 808 | $L_{a3\text{-}440}$ | $L_{b31}$ | $L_{b31}$ |
| 809 | $L_{a3\text{-}441}$ | $L_{b31}$ | $L_{b31}$ |
| 810 | $L_{a3\text{-}446}$ | $L_{b31}$ | $L_{b31}$ |
| 811 | $L_{a4\text{-}2}$ | $L_{b31}$ | $L_{b31}$ |
| 812 | $L_{a4\text{-}4}$ | $L_{b31}$ | $L_{b31}$ |
| 813 | $L_{a4\text{-}8}$ | $L_{b31}$ | $L_{b31}$ |
| 814 | $L_{a4\text{-}10}$ | $L_{b31}$ | $L_{b31}$ |
| 815 | $L_{a4\text{-}14}$ | $L_{b31}$ | $L_{b31}$ |
| 816 | $L_{a4\text{-}16}$ | $L_{b31}$ | $L_{b31}$ |
| 817 | $L_{a4\text{-}20}$ | $L_{b31}$ | $L_{b31}$ |
| 818 | $L_{a4\text{-}22}$ | $L_{b31}$ | $L_{b31}$ |
| 819 | $L_{a4\text{-}26}$ | $L_{b31}$ | $L_{b31}$ |
| 820 | $L_{a4\text{-}28}$ | $L_{b31}$ | $L_{b31}$ |
| 821 | $L_{a1\text{-}58}$ | $L_{b35}$ | $L_{b35}$ |
| 822 | $L_{a1\text{-}88}$ | $L_{b35}$ | $L_{b35}$ |
| 823 | $L_{a1\text{-}133}$ | $L_{b35}$ | $L_{b35}$ |
| 824 | $L_{a1\text{-}146}$ | $L_{b35}$ | $L_{b35}$ |
| 825 | $L_{a1\text{-}157}$ | $L_{b35}$ | $L_{b35}$ |
| 826 | $L_{a1\text{-}158}$ | $L_{b35}$ | $L_{b35}$ |
| 827 | $L_{a1\text{-}164}$ | $L_{b35}$ | $L_{b35}$ |
| 828 | $L_{a1\text{-}170}$ | $L_{b35}$ | $L_{b35}$ |
| 829 | $L_{a1\text{-}176}$ | $L_{b35}$ | $L_{b35}$ |
| 831 | $L_{a1\text{-}224}$ | $L_{b35}$ | $L_{b35}$ |
| 832 | $L_{a1\text{-}258}$ | $L_{b35}$ | $L_{b35}$ |
| 833 | $L_{a1\text{-}308}$ | $L_{b35}$ | $L_{b35}$ |
| 834 | $L_{a1\text{-}321}$ | $L_{b35}$ | $L_{b35}$ |
| 835 | $L_{a1\text{-}333}$ | $L_{b35}$ | $L_{b35}$ |
| 836 | $L_{a1\text{-}339}$ | $L_{b35}$ | $L_{b35}$ |
| 837 | $L_{a1\text{-}345}$ | $L_{b35}$ | $L_{b35}$ |
| 839 | $L_{a1\text{-}400}$ | $L_{b35}$ | $L_{b35}$ |
| 840 | $L_{a1\text{-}418}$ | $L_{b35}$ | $L_{b35}$ |
| 841 | $L_{a1\text{-}419}$ | $L_{b35}$ | $L_{b35}$ |
| 842 | $L_{a1\text{-}440}$ | $L_{b35}$ | $L_{b35}$ |
| 843 | $L_{a1\text{-}441}$ | $L_{b35}$ | $L_{b35}$ |
| 844 | $L_{a1\text{-}446}$ | $L_{b35}$ | $L_{b35}$ |
| 845 | $L_{a2\text{-}58}$ | $L_{b35}$ | $L_{b35}$ |
| 846 | $L_{a2\text{-}88}$ | $L_{b35}$ | $L_{b35}$ |
| 847 | $L_{a2\text{-}133}$ | $L_{b35}$ | $L_{b35}$ |
| 848 | $L_{a2\text{-}146}$ | $L_{b35}$ | $L_{b35}$ |
| 849 | $L_{a2\text{-}157}$ | $L_{b35}$ | $L_{b35}$ |

-continued

| Metal Complex | $L_a$ | $L_b$ | $L_b$ |
|---|---|---|---|
| 850 | $L_{a2\text{-}158}$ | $L_{b35}$ | $L_{b35}$ |
| 851 | $L_{a2\text{-}164}$ | $L_{b35}$ | $L_{b35}$ |
| 852 | $L_{a2\text{-}170}$ | $L_{b35}$ | $L_{b35}$ |
| 853 | $L_{a2\text{-}176}$ | $L_{b35}$ | $L_{b35}$ |
| 855 | $L_{a2\text{-}224}$ | $L_{b35}$ | $L_{b35}$ |
| 856 | $L_{a2\text{-}258}$ | $L_{b35}$ | $L_{b35}$ |
| 857 | $L_{a2\text{-}308}$ | $L_{b35}$ | $L_{b35}$ |
| 858 | $L_{a2\text{-}321}$ | $L_{b35}$ | $L_{b35}$ |
| 859 | $L_{a2\text{-}333}$ | $L_{b35}$ | $L_{b35}$ |
| 860 | $L_{a2\text{-}339}$ | $L_{b35}$ | $L_{b35}$ |
| 861 | $L_{a2\text{-}345}$ | $L_{b35}$ | $L_{b35}$ |
| 863 | $L_{a2\text{-}400}$ | $L_{b35}$ | $L_{b35}$ |
| 864 | $L_{a2\text{-}418}$ | $L_{b35}$ | $L_{b35}$ |
| 865 | $L_{a2\text{-}419}$ | $L_{b35}$ | $L_{b35}$ |
| 866 | $L_{a2\text{-}440}$ | $L_{b35}$ | $L_{b35}$ |
| 867 | $L_{a2\text{-}441}$ | $L_{b35}$ | $L_{b35}$ |
| 868 | $L_{a2\text{-}446}$ | $L_{b35}$ | $L_{b35}$ |
| 869 | $L_{a3\text{-}58}$ | $L_{b35}$ | $L_{b35}$ |
| 870 | $L_{a3\text{-}88}$ | $L_{b35}$ | $L_{b35}$ |
| 871 | $L_{a3\text{-}133}$ | $L_{b35}$ | $L_{b35}$ |
| 872 | $L_{a3\text{-}146}$ | $L_{b35}$ | $L_{b35}$ |
| 873 | $L_{a3\text{-}157}$ | $L_{b35}$ | $L_{b35}$ |
| 874 | $L_{a3\text{-}158}$ | $L_{b35}$ | $L_{b35}$ |
| 875 | $L_{a3\text{-}164}$ | $L_{b35}$ | $L_{b35}$ |
| 876 | $L_{a3\text{-}170}$ | $L_{b35}$ | $L_{b35}$ |
| 877 | $L_{a3\text{-}176}$ | $L_{b35}$ | $L_{b35}$ |
| 879 | $L_{a3\text{-}224}$ | $L_{b35}$ | $L_{b35}$ |
| 880 | $L_{a3\text{-}258}$ | $L_{b35}$ | $L_{b35}$ |
| 881 | $L_{a3\text{-}308}$ | $L_{b35}$ | $L_{b35}$ |
| 882 | $L_{a3\text{-}321}$ | $L_{b35}$ | $L_{b35}$ |
| 883 | $L_{a3\text{-}333}$ | $L_{b35}$ | $L_{b35}$ |
| 884 | $L_{a3\text{-}339}$ | $L_{b35}$ | $L_{b35}$ |
| 885 | $L_{a3\text{-}345}$ | $L_{b35}$ | $L_{b35}$ |
| 887 | $L_{a3\text{-}400}$ | $L_{b35}$ | $L_{b35}$ |
| 888 | $L_{a3\text{-}418}$ | $L_{b35}$ | $L_{b35}$ |
| 889 | $L_{a3\text{-}419}$ | $L_{b35}$ | $L_{b35}$ |
| 890 | $L_{a3\text{-}440}$ | $L_{b35}$ | $L_{b35}$ |
| 891 | $L_{a3\text{-}441}$ | $L_{b35}$ | $L_{b35}$ |
| 892 | $L_{a3\text{-}446}$ | $L_{b35}$ | $L_{b35}$ |
| 893 | $L_{a4\text{-}2}$ | $L_{b35}$ | $L_{b35}$ |
| 894 | $L_{a4\text{-}4}$ | $L_{b35}$ | $L_{b35}$ |
| 895 | $L_{a4\text{-}8}$ | $L_{b35}$ | $L_{b35}$ |
| 896 | $L_{a4\text{-}10}$ | $L_{b35}$ | $L_{b35}$ |
| 897 | $L_{a4\text{-}14}$ | $L_{b35}$ | $L_{b35}$ |
| 898 | $L_{a4\text{-}16}$ | $L_{b35}$ | $L_{b35}$ |
| 899 | $L_{a4\text{-}20}$ | $L_{b35}$ | $L_{b35}$ |
| 900 | $L_{a4\text{-}22}$ | $L_{b35}$ | $L_{b35}$ |
| 901 | $L_{a4\text{-}26}$ | $L_{b35}$ | $L_{b35}$ |
| 902 | $L_{a4\text{-}28}$ | $L_{b35}$ | $L_{b35}$ |
| 903 | $L_{a1\text{-}58}$ | $L_{b37}$ | $L_{b37}$ |
| 904 | $L_{a1\text{-}88}$ | $L_{b37}$ | $L_{b37}$ |
| 905 | $L_{a1\text{-}133}$ | $L_{b37}$ | $L_{b37}$ |
| 906 | $L_{a1\text{-}146}$ | $L_{b37}$ | $L_{b37}$ |
| 907 | $L_{a1\text{-}157}$ | $L_{b37}$ | $L_{b37}$ |
| 908 | $L_{a1\text{-}158}$ | $L_{b37}$ | $L_{b37}$ |
| 909 | $L_{a1\text{-}164}$ | $L_{b37}$ | $L_{b37}$ |
| 910 | $L_{a1\text{-}170}$ | $L_{b37}$ | $L_{b37}$ |
| 911 | $L_{a1\text{-}176}$ | $L_{b37}$ | $L_{b37}$ |
| 913 | $L_{a1\text{-}224}$ | $L_{b37}$ | $L_{b37}$ |
| 914 | $L_{a1\text{-}258}$ | $L_{b37}$ | $L_{b37}$ |
| 915 | $L_{a1\text{-}308}$ | $L_{b37}$ | $L_{b37}$ |
| 916 | $L_{a1\text{-}321}$ | $L_{b37}$ | $L_{b37}$ |
| 917 | $L_{a1\text{-}333}$ | $L_{b37}$ | $L_{b37}$ |
| 918 | $L_{a1\text{-}339}$ | $L_{b37}$ | $L_{b37}$ |
| 919 | $L_{a1\text{-}345}$ | $L_{b37}$ | $L_{b37}$ |
| 921 | $L_{a1\text{-}400}$ | $L_{b37}$ | $L_{b37}$ |
| 922 | $L_{a1\text{-}418}$ | $L_{b37}$ | $L_{b37}$ |
| 923 | $L_{a1\text{-}419}$ | $L_{b37}$ | $L_{b37}$ |
| 924 | $L_{a1\text{-}440}$ | $L_{b37}$ | $L_{b37}$ |
| 925 | $L_{a1\text{-}441}$ | $L_{b37}$ | $L_{b37}$ |
| 926 | $L_{a1\text{-}446}$ | $L_{b37}$ | $L_{b37}$ |
| 927 | $L_{a2\text{-}58}$ | $L_{b37}$ | $L_{b37}$ |
| 928 | $L_{a2\text{-}88}$ | $L_{b37}$ | $L_{b37}$ |
| 929 | $L_{a2\text{-}133}$ | $L_{b37}$ | $L_{b37}$ |
| 930 | $L_{a2\text{-}146}$ | $L_{b37}$ | $L_{b37}$ |
| 931 | $L_{a2\text{-}157}$ | $L_{b37}$ | $L_{b37}$ |

-continued

| Metal Complex | $L_a$ | $L_b$ | $L_b$ |
|---|---|---|---|
| 932 | $L_{a2-158}$ | $L_{b37}$ | $L_{b37}$ |
| 933 | $L_{a2-164}$ | $L_{b37}$ | $L_{b37}$ |
| 934 | $L_{a2-170}$ | $L_{b37}$ | $L_{b37}$ |
| 935 | $L_{a2-176}$ | $L_{b37}$ | $L_{b37}$ |
| 937 | $L_{a2-224}$ | $L_{b37}$ | $L_{b37}$ |
| 938 | $L_{a2-258}$ | $L_{b37}$ | $L_{b37}$ |
| 939 | $L_{a2-308}$ | $L_{b37}$ | $L_{b37}$ |
| 940 | $L_{a2-321}$ | $L_{b37}$ | $L_{b37}$ |
| 941 | $L_{a2-333}$ | $L_{b37}$ | $L_{b37}$ |
| 942 | $L_{a2-339}$ | $L_{b37}$ | $L_{b37}$ |
| 943 | $L_{a2-345}$ | $L_{b37}$ | $L_{b37}$ |
| 945 | $L_{a2-400}$ | $L_{b37}$ | $L_{b37}$ |
| 946 | $L_{a2-418}$ | $L_{b37}$ | $L_{b37}$ |
| 947 | $L_{a2-419}$ | $L_{b37}$ | $L_{b37}$ |
| 948 | $L_{a2-440}$ | $L_{b37}$ | $L_{b37}$ |
| 949 | $L_{a2-441}$ | $L_{b37}$ | $L_{b37}$ |
| 950 | $L_{a2-446}$ | $L_{b37}$ | $L_{b37}$ |
| 951 | $L_{a3-58}$ | $L_{b37}$ | $L_{b37}$ |
| 952 | $L_{a3-88}$ | $L_{b37}$ | $L_{b37}$ |
| 953 | $L_{a3-133}$ | $L_{b37}$ | $L_{b37}$ |
| 954 | $L_{a3-146}$ | $L_{b37}$ | $L_{b37}$ |
| 955 | $L_{a3-157}$ | $L_{b37}$ | $L_{b37}$ |
| 956 | $L_{a3-158}$ | $L_{b37}$ | $L_{b37}$ |
| 957 | $L_{a3-164}$ | $L_{b37}$ | $L_{b37}$ |
| 958 | $L_{a3-170}$ | $L_{b37}$ | $L_{b37}$ |
| 959 | $L_{a3-176}$ | $L_{b37}$ | $L_{b37}$ |
| 961 | $L_{a3-224}$ | $L_{b37}$ | $L_{b37}$ |
| 962 | $L_{a3-258}$ | $L_{b37}$ | $L_{b37}$ |
| 963 | $L_{a3-308}$ | $L_{b37}$ | $L_{b37}$ |
| 964 | $L_{a3-321}$ | $L_{b37}$ | $L_{b37}$ |
| 965 | $L_{a3-333}$ | $L_{b37}$ | $L_{b37}$ |
| 966 | $L_{a3-339}$ | $L_{b37}$ | $L_{b37}$ |
| 967 | $L_{a3-345}$ | $L_{b37}$ | $L_{b37}$ |
| 969 | $L_{a3-400}$ | $L_{b37}$ | $L_{b37}$ |
| 970 | $L_{a3-418}$ | $L_{b37}$ | $L_{b37}$ |
| 971 | $L_{a3-419}$ | $L_{b37}$ | $L_{b37}$ |
| 972 | $L_{a3-440}$ | $L_{b37}$ | $L_{b37}$ |
| 973 | $L_{a3-441}$ | $L_{b37}$ | $L_{b37}$ |
| 974 | $L_{a3-446}$ | $L_{b37}$ | $L_{b37}$ |
| 975 | $L_{a4-2}$ | $L_{b37}$ | $L_{b37}$ |
| 976 | $L_{a4-4}$ | $L_{b37}$ | $L_{b37}$ |
| 977 | $L_{a4-8}$ | $L_{b37}$ | $L_{b37}$ |
| 978 | $L_{a4-10}$ | $L_{b37}$ | $L_{b37}$ |
| 979 | $L_{a4-14}$ | $L_{b37}$ | $L_{b37}$ |
| 980 | $L_{a4-16}$ | $L_{b37}$ | $L_{b37}$ |
| 981 | $L_{a4-20}$ | $L_{b37}$ | $L_{b37}$ |
| 982 | $L_{a4-22}$ | $L_{b37}$ | $L_{b37}$ |
| 983 | $L_{a4-26}$ | $L_{b37}$ | $L_{b37}$ |
| 984 | $L_{a4-28}$ | $L_{b37}$ | $L_{b37}$ |
| 985 | $L_{a1-58}$ | $L_{b38}$ | $L_{b38}$ |
| 986 | $L_{a1-88}$ | $L_{b38}$ | $L_{b38}$ |
| 987 | $L_{a1-133}$ | $L_{b38}$ | $L_{b38}$ |
| 988 | $L_{a1-146}$ | $L_{b38}$ | $L_{b38}$ |
| 989 | $L_{a1-157}$ | $L_{b38}$ | $L_{b38}$ |
| 990 | $L_{a1-158}$ | $L_{b38}$ | $L_{b38}$ |
| 991 | $L_{a1-164}$ | $L_{b38}$ | $L_{b38}$ |
| 992 | $L_{a1-170}$ | $L_{b38}$ | $L_{b38}$ |
| 993 | $L_{a1-176}$ | $L_{b38}$ | $L_{b38}$ |
| 995 | $L_{a1-224}$ | $L_{b38}$ | $L_{b38}$ |
| 996 | $L_{a1-258}$ | $L_{b38}$ | $L_{b38}$ |
| 997 | $L_{a1-308}$ | $L_{b38}$ | $L_{b38}$ |
| 998 | $L_{a1-321}$ | $L_{b38}$ | $L_{b38}$ |
| 999 | $L_{a1-333}$ | $L_{b38}$ | $L_{b38}$ |
| 1000 | $L_{a1-339}$ | $L_{b38}$ | $L_{b38}$ |
| 1001 | $L_{a1-345}$ | $L_{b38}$ | $L_{b38}$ |
| 1003 | $L_{a1-400}$ | $L_{b38}$ | $L_{b38}$ |
| 1004 | $L_{a1-418}$ | $L_{b38}$ | $L_{b38}$ |
| 1005 | $L_{a1-419}$ | $L_{b38}$ | $L_{b38}$ |
| 1006 | $L_{a1-440}$ | $L_{b38}$ | $L_{b38}$ |
| 1007 | $L_{a1-441}$ | $L_{b38}$ | $L_{b38}$ |
| 1008 | $L_{a1-446}$ | $L_{b38}$ | $L_{b38}$ |
| 1009 | $L_{a2-58}$ | $L_{b38}$ | $L_{b38}$ |
| 1010 | $L_{a2-88}$ | $L_{b38}$ | $L_{b38}$ |
| 1011 | $L_{a2-133}$ | $L_{b38}$ | $L_{b38}$ |
| 1012 | $L_{a2-146}$ | $L_{b38}$ | $L_{b38}$ |
| 1013 | $L_{a2-157}$ | $L_{b38}$ | $L_{b38}$ |

-continued

| Metal Complex | $L_a$ | $L_b$ | $L_b$ |
|---|---|---|---|
| 1014 | $L_{a2-158}$ | $L_{b38}$ | $L_{b38}$ |
| 1015 | $L_{a2-164}$ | $L_{b38}$ | $L_{b38}$ |
| 1016 | $L_{a2-170}$ | $L_{b38}$ | $L_{b38}$ |
| 1017 | $L_{a2-176}$ | $L_{b38}$ | $L_{b38}$ |
| 1019 | $L_{a2-224}$ | $L_{b38}$ | $L_{b38}$ |
| 1020 | $L_{a2-258}$ | $L_{b38}$ | $L_{b38}$ |
| 1021 | $L_{a2-308}$ | $L_{b38}$ | $L_{b38}$ |
| 1022 | $L_{a2-321}$ | $L_{b38}$ | $L_{b38}$ |
| 1023 | $L_{a2-333}$ | $L_{b38}$ | $L_{b38}$ |
| 1024 | $L_{a2-339}$ | $L_{b38}$ | $L_{b38}$ |
| 1025 | $L_{a2-345}$ | $L_{b38}$ | $L_{b38}$ |
| 1027 | $L_{a2-400}$ | $L_{b38}$ | $L_{b38}$ |
| 1028 | $L_{a2-418}$ | $L_{b38}$ | $L_{b38}$ |
| 1029 | $L_{a2-419}$ | $L_{b38}$ | $L_{b38}$ |
| 1030 | $L_{a2-440}$ | $L_{b38}$ | $L_{b38}$ |
| 1031 | $L_{a2-441}$ | $L_{b38}$ | $L_{b38}$ |
| 1032 | $L_{a2-446}$ | $L_{b38}$ | $L_{b38}$ |
| 1033 | $L_{a3-58}$ | $L_{b38}$ | $L_{b38}$ |
| 1034 | $L_{a3-88}$ | $L_{b38}$ | $L_{b38}$ |
| 1035 | $L_{a3-133}$ | $L_{b38}$ | $L_{b38}$ |
| 1036 | $L_{a3-146}$ | $L_{b38}$ | $L_{b38}$ |
| 1037 | $L_{a3-157}$ | $L_{b38}$ | $L_{b38}$ |
| 1038 | $L_{a3-158}$ | $L_{b38}$ | $L_{b38}$ |
| 1039 | $L_{a3-164}$ | $L_{b38}$ | $L_{b38}$ |
| 1040 | $L_{a3-170}$ | $L_{b38}$ | $L_{b38}$ |
| 1041 | $L_{a3-176}$ | $L_{b38}$ | $L_{b38}$ |
| 1043 | $L_{a3-224}$ | $L_{b38}$ | $L_{b38}$ |
| 1044 | $L_{a3-258}$ | $L_{b38}$ | $L_{b38}$ |
| 1045 | $L_{a3-308}$ | $L_{b38}$ | $L_{b38}$ |
| 1046 | $L_{a3-321}$ | $L_{b38}$ | $L_{b38}$ |
| 1047 | $L_{a3-333}$ | $L_{b38}$ | $L_{b38}$ |
| 1048 | $L_{a3-339}$ | $L_{b38}$ | $L_{b38}$ |
| 1049 | $L_{a3-345}$ | $L_{b38}$ | $L_{b38}$ |
| 1051 | $L_{a3-400}$ | $L_{b38}$ | $L_{b38}$ |
| 1052 | $L_{a3-418}$ | $L_{b38}$ | $L_{b38}$ |
| 1053 | $L_{a3-419}$ | $L_{b38}$ | $L_{b38}$ |
| 1054 | $L_{a3-440}$ | $L_{b38}$ | $L_{b38}$ |
| 1055 | $L_{a3-441}$ | $L_{b38}$ | $L_{b38}$ |
| 1056 | $L_{a3-446}$ | $L_{b38}$ | $L_{b38}$ |
| 1057 | $L_{a4-2}$ | $L_{b38}$ | $L_{b38}$ |
| 1058 | $L_{a4-4}$ | $L_{b38}$ | $L_{b38}$ |
| 1059 | $L_{a4-8}$ | $L_{b38}$ | $L_{b38}$ |
| 1060 | $L_{a4-10}$ | $L_{b38}$ | $L_{b38}$ |
| 1061 | $L_{a4-14}$ | $L_{b38}$ | $L_{b38}$ |
| 1062 | $L_{a4-16}$ | $L_{b38}$ | $L_{b38}$ |
| 1063 | $L_{a4-20}$ | $L_{b38}$ | $L_{b38}$ |
| 1064 | $L_{a4-22}$ | $L_{b38}$ | $L_{b38}$ |
| 1065 | $L_{a4-26}$ | $L_{b38}$ | $L_{b38}$ |
| 1066 | $L_{a4-28}$ | $L_{b38}$ | $L_{b38}$ |
| 1067 | $L_{a1-58}$ | $L_{b40}$ | $L_{b40}$ |
| 1068 | $L_{a1-88}$ | $L_{b40}$ | $L_{b40}$ |
| 1069 | $L_{a1-133}$ | $L_{b40}$ | $L_{b40}$ |
| 1070 | $L_{a1-146}$ | $L_{b40}$ | $L_{b40}$ |
| 1071 | $L_{a1-157}$ | $L_{b40}$ | $L_{b40}$ |
| 1072 | $L_{a1-158}$ | $L_{b40}$ | $L_{b40}$ |
| 1073 | $L_{a1-164}$ | $L_{b40}$ | $L_{b40}$ |
| 1074 | $L_{a1-170}$ | $L_{b40}$ | $L_{b40}$ |
| 1075 | $L_{a1-176}$ | $L_{b40}$ | $L_{b40}$ |
| 1077 | $L_{a1-224}$ | $L_{b40}$ | $L_{b40}$ |
| 1078 | $L_{a1-258}$ | $L_{b40}$ | $L_{b40}$ |
| 1079 | $L_{a1-308}$ | $L_{b40}$ | $L_{b40}$ |
| 1080 | $L_{a1-321}$ | $L_{b40}$ | $L_{b40}$ |
| 1081 | $L_{a1-333}$ | $L_{b40}$ | $L_{b40}$ |
| 1082 | $L_{a1-339}$ | $L_{b40}$ | $L_{b40}$ |
| 1083 | $L_{a1-345}$ | $L_{b40}$ | $L_{b40}$ |
| 1085 | $L_{a1-400}$ | $L_{b40}$ | $L_{b40}$ |
| 1086 | $L_{a1-418}$ | $L_{b40}$ | $L_{b40}$ |
| 1087 | $L_{a1-419}$ | $L_{b40}$ | $L_{b40}$ |
| 1088 | $L_{a1-440}$ | $L_{b40}$ | $L_{b40}$ |
| 1089 | $L_{a1-441}$ | $L_{b40}$ | $L_{b40}$ |
| 1090 | $L_{a1-446}$ | $L_{b40}$ | $L_{b40}$ |
| 1091 | $L_{a2-58}$ | $L_{b40}$ | $L_{b40}$ |
| 1092 | $L_{a2-88}$ | $L_{b40}$ | $L_{b40}$ |
| 1093 | $L_{a2-133}$ | $L_{b40}$ | $L_{b40}$ |
| 1094 | $L_{a2-146}$ | $L_{b40}$ | $L_{b40}$ |
| 1095 | $L_{a2-157}$ | $L_{b40}$ | $L_{b40}$ |

-continued

| Metal Complex | $L_a$ | $L_b$ | $L_b$ |
|---|---|---|---|
| 1096 | $L_{a2-158}$ | $L_{b40}$ | $L_{b40}$ |
| 1097 | $L_{a2-164}$ | $L_{b40}$ | $L_{b40}$ |
| 1098 | $L_{a2-170}$ | $L_{b40}$ | $L_{b40}$ |
| 1099 | $L_{a2-176}$ | $L_{b40}$ | $L_{b40}$ |
| 1101 | $L_{a2-224}$ | $L_{b40}$ | $L_{b40}$ |
| 1102 | $L_{a2-258}$ | $L_{b40}$ | $L_{b40}$ |
| 1103 | $L_{a2-308}$ | $L_{b40}$ | $L_{b40}$ |
| 1104 | $L_{a2-321}$ | $L_{b40}$ | $L_{b40}$ |
| 1105 | $L_{a2-333}$ | $L_{b40}$ | $L_{b40}$ |
| 1106 | $L_{a2-339}$ | $L_{b40}$ | $L_{b40}$ |
| 1107 | $L_{a2-345}$ | $L_{b40}$ | $L_{b40}$ |
| 1109 | $L_{a2-400}$ | $L_{b40}$ | $L_{b40}$ |
| 1110 | $L_{a2-418}$ | $L_{b40}$ | $L_{b40}$ |
| 1111 | $L_{a2-419}$ | $L_{b40}$ | $L_{b40}$ |
| 1112 | $L_{a2-440}$ | $L_{b40}$ | $L_{b40}$ |
| 1113 | $L_{a2-441}$ | $L_{b40}$ | $L_{b40}$ |
| 1114 | $L_{a2-446}$ | $L_{b40}$ | $L_{b40}$ |
| 1115 | $L_{a3-58}$ | $L_{b40}$ | $L_{b40}$ |
| 1116 | $L_{a3-88}$ | $L_{b40}$ | $L_{b40}$ |
| 1117 | $L_{a3-133}$ | $L_{b40}$ | $L_{b40}$ |
| 1118 | $L_{a3-146}$ | $L_{b40}$ | $L_{b40}$ |
| 1119 | $L_{a3-157}$ | $L_{b40}$ | $L_{b40}$ |
| 1120 | $L_{a3-158}$ | $L_{b40}$ | $L_{b40}$ |
| 1121 | $L_{a3-164}$ | $L_{b40}$ | $L_{b40}$ |
| 1122 | $L_{a3-170}$ | $L_{b40}$ | $L_{b40}$ |
| 1123 | $L_{a3-176}$ | $L_{b40}$ | $L_{b40}$ |
| 1125 | $L_{a3-224}$ | $L_{b40}$ | $L_{b40}$ |
| 1126 | $L_{a3-258}$ | $L_{b40}$ | $L_{b40}$ |
| 1127 | $L_{a3-308}$ | $L_{b40}$ | $L_{b40}$ |
| 1128 | $L_{a3-321}$ | $L_{b40}$ | $L_{b40}$ |
| 1129 | $L_{a3-333}$ | $L_{b40}$ | $L_{b40}$ |
| 1130 | $L_{a3-339}$ | $L_{b40}$ | $L_{b40}$ |
| 1131 | $L_{a3-345}$ | $L_{b40}$ | $L_{b40}$ |
| 1133 | $L_{a3-400}$ | $L_{b40}$ | $L_{b40}$ |
| 1134 | $L_{a3-418}$ | $L_{b40}$ | $L_{b40}$ |
| 1135 | $L_{a3-419}$ | $L_{b40}$ | $L_{b40}$ |
| 1136 | $L_{a3-440}$ | $L_{b40}$ | $L_{b40}$ |
| 1137 | $L_{a3-441}$ | $L_{b40}$ | $L_{b40}$ |
| 1138 | $L_{a3-446}$ | $L_{b40}$ | $L_{b40}$ |
| 1139 | $L_{a4-2}$ | $L_{b40}$ | $L_{b40}$ |
| 1140 | $L_{a4-4}$ | $L_{b40}$ | $L_{b40}$ |
| 1141 | $L_{a4-8}$ | $L_{b40}$ | $L_{b40}$ |
| 1142 | $L_{a4-10}$ | $L_{b40}$ | $L_{b40}$ |
| 1143 | $L_{a4-14}$ | $L_{b40}$ | $L_{b40}$ |
| 1144 | $L_{a4-16}$ | $L_{b40}$ | $L_{b40}$ |
| 1145 | $L_{a4-20}$ | $L_{b40}$ | $L_{b40}$ |
| 1146 | $L_{a4-22}$ | $L_{b40}$ | $L_{b40}$ |
| 1147 | $L_{a4-26}$ | $L_{b40}$ | $L_{b40}$ |
| 1148 | $L_{a4-28}$ | $L_{b40}$ | $L_{b40}$ |
| 1149 | $L_{a1-58}$ | $L_{b71}$ | $L_{b71}$ |
| 1150 | $L_{a1-88}$ | $L_{b71}$ | $L_{b71}$ |
| 1151 | $L_{a1-133}$ | $L_{b71}$ | $L_{b71}$ |
| 1152 | $L_{a1-146}$ | $L_{b71}$ | $L_{b71}$ |
| 1153 | $L_{a1-157}$ | $L_{b71}$ | $L_{b71}$ |
| 1154 | $L_{a1-158}$ | $L_{b71}$ | $L_{b71}$ |
| 1155 | $L_{a1-164}$ | $L_{b71}$ | $L_{b71}$ |
| 1156 | $L_{a1-170}$ | $L_{b71}$ | $L_{b71}$ |
| 1157 | $L_{a1-176}$ | $L_{b71}$ | $L_{b71}$ |
| 1159 | $L_{a1-224}$ | $L_{b71}$ | $L_{b71}$ |
| 1160 | $L_{a1-258}$ | $L_{b71}$ | $L_{b71}$ |
| 1161 | $L_{a1-308}$ | $L_{b71}$ | $L_{b71}$ |
| 1162 | $L_{a1-321}$ | $L_{b71}$ | $L_{b71}$ |
| 1163 | $L_{a1-333}$ | $L_{b71}$ | $L_{b71}$ |
| 1164 | $L_{a1-339}$ | $L_{b71}$ | $L_{b71}$ |
| 1165 | $L_{a1-345}$ | $L_{b71}$ | $L_{b71}$ |
| 1167 | $L_{a1-400}$ | $L_{b71}$ | $L_{b71}$ |
| 1168 | $L_{a1-418}$ | $L_{b71}$ | $L_{b71}$ |
| 1169 | $L_{a1-419}$ | $L_{b71}$ | $L_{b71}$ |
| 1170 | $L_{a1-440}$ | $L_{b71}$ | $L_{b71}$ |
| 1171 | $L_{a1-441}$ | $L_{b71}$ | $L_{b71}$ |
| 1172 | $L_{a1-446}$ | $L_{b71}$ | $L_{b71}$ |
| 1173 | $L_{a2-58}$ | $L_{b71}$ | $L_{b71}$ |
| 1174 | $L_{a2-88}$ | $L_{b71}$ | $L_{b71}$ |
| 1175 | $L_{a2-133}$ | $L_{b71}$ | $L_{b71}$ |
| 1176 | $L_{a2-146}$ | $L_{b71}$ | $L_{b71}$ |
| 1177 | $L_{a2-157}$ | $L_{b71}$ | $L_{b71}$ |

-continued

| Metal Complex | $L_a$ | $L_b$ | $L_b$ |
|---|---|---|---|
| 1178 | $L_{a2-158}$ | $L_{b71}$ | $L_{b71}$ |
| 1179 | $L_{a2-164}$ | $L_{b71}$ | $L_{b71}$ |
| 1180 | $L_{a2-170}$ | $L_{b71}$ | $L_{b71}$ |
| 1181 | $L_{a2-176}$ | $L_{b71}$ | $L_{b71}$ |
| 1183 | $L_{a2-224}$ | $L_{b71}$ | $L_{b71}$ |
| 1184 | $L_{a2-258}$ | $L_{b71}$ | $L_{b71}$ |
| 1185 | $L_{a2-308}$ | $L_{b71}$ | $L_{b71}$ |
| 1186 | $L_{a2-321}$ | $L_{b71}$ | $L_{b71}$ |
| 1187 | $L_{a2-333}$ | $L_{b71}$ | $L_{b71}$ |
| 1188 | $L_{a2-339}$ | $L_{b71}$ | $L_{b71}$ |
| 1189 | $L_{a2-345}$ | $L_{b71}$ | $L_{b71}$ |
| 1191 | $L_{a2-400}$ | $L_{b71}$ | $L_{b71}$ |
| 1192 | $L_{a2-418}$ | $L_{b71}$ | $L_{b71}$ |
| 1193 | $L_{a2-419}$ | $L_{b71}$ | $L_{b71}$ |
| 1194 | $L_{a2-440}$ | $L_{b71}$ | $L_{b71}$ |
| 1195 | $L_{a2-441}$ | $L_{b71}$ | $L_{b71}$ |
| 1196 | $L_{a2-446}$ | $L_{b71}$ | $L_{b71}$ |
| 1197 | $L_{a3-58}$ | $L_{b71}$ | $L_{b71}$ |
| 1198 | $L_{a3-88}$ | $L_{b71}$ | $L_{b71}$ |
| 1199 | $L_{a3-133}$ | $L_{b71}$ | $L_{b71}$ |
| 1200 | $L_{a3-146}$ | $L_{b71}$ | $L_{b71}$ |
| 1201 | $L_{a3-157}$ | $L_{b71}$ | $L_{b71}$ |
| 1202 | $L_{a3-158}$ | $L_{b71}$ | $L_{b71}$ |
| 1203 | $L_{a3-164}$ | $L_{b71}$ | $L_{b71}$ |
| 1204 | $L_{a3-170}$ | $L_{b71}$ | $L_{b71}$ |
| 1205 | $L_{a3-176}$ | $L_{b71}$ | $L_{b71}$ |
| 1207 | $L_{a3-224}$ | $L_{b71}$ | $L_{b71}$ |
| 1208 | $L_{a3-258}$ | $L_{b71}$ | $L_{b71}$ |
| 1209 | $L_{a3-308}$ | $L_{b71}$ | $L_{b71}$ |
| 1210 | $L_{a3-321}$ | $L_{b71}$ | $L_{b71}$ |
| 1211 | $L_{a3-333}$ | $L_{b71}$ | $L_{b71}$ |
| 1212 | $L_{a3-339}$ | $L_{b71}$ | $L_{b71}$ |
| 1213 | $L_{a3-345}$ | $L_{b71}$ | $L_{b71}$ |
| 1215 | $L_{a3-400}$ | $L_{b71}$ | $L_{b71}$ |
| 1216 | $L_{a3-418}$ | $L_{b71}$ | $L_{b71}$ |
| 1217 | $L_{a3-419}$ | $L_{b71}$ | $L_{b71}$ |
| 1218 | $L_{a3-440}$ | $L_{b71}$ | $L_{b71}$ |
| 1219 | $L_{a3-441}$ | $L_{b71}$ | $L_{b71}$ |
| 1220 | $L_{a3-446}$ | $L_{b71}$ | $L_{b71}$ |
| 1221 | $L_{a4-2}$ | $L_{b71}$ | $L_{b71}$ |
| 1222 | $L_{a4-4}$ | $L_{b71}$ | $L_{b71}$ |
| 1223 | $L_{a4-8}$ | $L_{b71}$ | $L_{b71}$ |
| 1224 | $L_{a4-10}$ | $L_{b71}$ | $L_{b71}$ |
| 1225 | $L_{a4-14}$ | $L_{b71}$ | $L_{b71}$ |
| 1226 | $L_{a4-16}$ | $L_{b71}$ | $L_{b71}$ |
| 1227 | $L_{a4-20}$ | $L_{b71}$ | $L_{b71}$ |
| 1228 | $L_{a4-22}$ | $L_{b71}$ | $L_{b71}$ |
| 1229 | $L_{a4-26}$ | $L_{b71}$ | $L_{b71}$ |
| 1230 | $L_{a4-28}$ | $L_{b71}$ | $L_{b71}$ |
| 1231 | $L_{a1-58}$ | $L_{b72}$ | $L_{b72}$ |
| 1232 | $L_{a1-88}$ | $L_{b72}$ | $L_{b72}$ |
| 1233 | $L_{a1-133}$ | $L_{b72}$ | $L_{b72}$ |
| 1234 | $L_{a1-146}$ | $L_{b72}$ | $L_{b72}$ |
| 1235 | $L_{a1-157}$ | $L_{b72}$ | $L_{b72}$ |
| 1236 | $L_{a1-158}$ | $L_{b72}$ | $L_{b72}$ |
| 1237 | $L_{a1-164}$ | $L_{b72}$ | $L_{b72}$ |
| 1238 | $L_{a1-170}$ | $L_{b72}$ | $L_{b72}$ |
| 1239 | $L_{a1-176}$ | $L_{b72}$ | $L_{b72}$ |
| 1241 | $L_{a1-224}$ | $L_{b72}$ | $L_{b72}$ |
| 1242 | $L_{a1-258}$ | $L_{b72}$ | $L_{b72}$ |
| 1243 | $L_{a1-308}$ | $L_{b72}$ | $L_{b72}$ |
| 1244 | $L_{a1-321}$ | $L_{b72}$ | $L_{b72}$ |
| 1245 | $L_{a1-333}$ | $L_{b72}$ | $L_{b72}$ |
| 1246 | $L_{a1-339}$ | $L_{b72}$ | $L_{b72}$ |
| 1247 | $L_{a1-345}$ | $L_{b72}$ | $L_{b72}$ |
| 1249 | $L_{a1-400}$ | $L_{b72}$ | $L_{b72}$ |
| 1250 | $L_{a1-418}$ | $L_{b72}$ | $L_{b72}$ |
| 1251 | $L_{a1-419}$ | $L_{b72}$ | $L_{b72}$ |
| 1252 | $L_{a1-440}$ | $L_{b72}$ | $L_{b72}$ |
| 1253 | $L_{a1-441}$ | $L_{b72}$ | $L_{b72}$ |
| 1254 | $L_{a1-446}$ | $L_{b72}$ | $L_{b72}$ |
| 1255 | $L_{a2-58}$ | $L_{b72}$ | $L_{b72}$ |
| 1256 | $L_{a2-88}$ | $L_{b72}$ | $L_{b72}$ |
| 1257 | $L_{a2-133}$ | $L_{b72}$ | $L_{b72}$ |
| 1258 | $L_{a2-146}$ | $L_{b72}$ | $L_{b72}$ |
| 1259 | $L_{a2-157}$ | $L_{b72}$ | $L_{b72}$ |

-continued

| Metal Complex | $L_a$ | $L_b$ | $L_b$ |
|---|---|---|---|
| 1260 | $L_{a2\text{-}158}$ | $L_{b72}$ | $L_{b72}$ |
| 1261 | $L_{a2\text{-}164}$ | $L_{b72}$ | $L_{b72}$ |
| 1262 | $L_{a2\text{-}170}$ | $L_{b72}$ | $L_{b72}$ |
| 1263 | $L_{a2\text{-}176}$ | $L_{b72}$ | $L_{b72}$ |
| 1265 | $L_{a2\text{-}224}$ | $L_{b72}$ | $L_{b72}$ |
| 1266 | $L_{a2\text{-}258}$ | $L_{b72}$ | $L_{b72}$ |
| 1267 | $L_{a2\text{-}308}$ | $L_{b72}$ | $L_{b72}$ |
| 1268 | $L_{a2\text{-}321}$ | $L_{b72}$ | $L_{b72}$ |
| 1269 | $L_{a2\text{-}333}$ | $L_{b72}$ | $L_{b72}$ |
| 1270 | $L_{a2\text{-}339}$ | $L_{b72}$ | $L_{b72}$ |
| 1271 | $L_{a2\text{-}345}$ | $L_{b72}$ | $L_{b72}$ |
| 1273 | $L_{a2\text{-}400}$ | $L_{b72}$ | $L_{b72}$ |
| 1274 | $L_{a2\text{-}418}$ | $L_{b72}$ | $L_{b72}$ |
| 1275 | $L_{a2\text{-}419}$ | $L_{b72}$ | $L_{b72}$ |
| 1276 | $L_{a2\text{-}440}$ | $L_{b72}$ | $L_{b72}$ |
| 1277 | $L_{a2\text{-}441}$ | $L_{b72}$ | $L_{b72}$ |
| 1278 | $L_{a2\text{-}446}$ | $L_{b72}$ | $L_{b72}$ |
| 1279 | $L_{a3\text{-}58}$ | $L_{b72}$ | $L_{b72}$ |
| 1280 | $L_{a3\text{-}88}$ | $L_{b72}$ | $L_{b72}$ |
| 1281 | $L_{a3\text{-}133}$ | $L_{b72}$ | $L_{b72}$ |
| 1282 | $L_{a3\text{-}146}$ | $L_{b72}$ | $L_{b72}$ |
| 1283 | $L_{a3\text{-}157}$ | $L_{b72}$ | $L_{b72}$ |
| 1284 | $L_{a3\text{-}158}$ | $L_{b72}$ | $L_{b72}$ |
| 1285 | $L_{a3\text{-}164}$ | $L_{b72}$ | $L_{b72}$ |
| 1286 | $L_{a3\text{-}170}$ | $L_{b72}$ | $L_{b72}$ |
| 1287 | $L_{a3\text{-}176}$ | $L_{b72}$ | $L_{b72}$ |
| 1289 | $L_{a3\text{-}224}$ | $L_{b72}$ | $L_{b72}$ |
| 1290 | $L_{a3\text{-}258}$ | $L_{b72}$ | $L_{b72}$ |
| 1291 | $L_{a3\text{-}308}$ | $L_{b72}$ | $L_{b72}$ |
| 1292 | $L_{a3\text{-}321}$ | $L_{b72}$ | $L_{b72}$ |
| 1293 | $L_{a3\text{-}333}$ | $L_{b72}$ | $L_{b72}$ |
| 1294 | $L_{a3\text{-}339}$ | $L_{b72}$ | $L_{b72}$ |
| 1295 | $L_{a3\text{-}345}$ | $L_{b72}$ | $L_{b72}$ |
| 1297 | $L_{a3\text{-}400}$ | $L_{b72}$ | $L_{b72}$ |
| 1298 | $L_{a3\text{-}418}$ | $L_{b72}$ | $L_{b72}$ |
| 1299 | $L_{a3\text{-}419}$ | $L_{b72}$ | $L_{b72}$ |
| 1300 | $L_{a3\text{-}440}$ | $L_{b72}$ | $L_{b72}$ |
| 1301 | $L_{a3\text{-}441}$ | $L_{b72}$ | $L_{b72}$ |
| 1302 | $L_{a3\text{-}446}$ | $L_{b72}$ | $L_{b72}$ |
| 1303 | $L_{a4\text{-}2}$ | $L_{b72}$ | $L_{b72}$ |
| 1304 | $L_{a4\text{-}4}$ | $L_{b72}$ | $L_{b72}$ |
| 1305 | $L_{a4\text{-}8}$ | $L_{b72}$ | $L_{b72}$ |
| 1306 | $L_{a4\text{-}10}$ | $L_{b72}$ | $L_{b72}$ |
| 1307 | $L_{a4\text{-}14}$ | $L_{b72}$ | $L_{b72}$ |
| 1308 | $L_{a4\text{-}16}$ | $L_{b72}$ | $L_{b72}$ |
| 1309 | $L_{a4\text{-}20}$ | $L_{b72}$ | $L_{b72}$ |
| 1310 | $L_{a4\text{-}22}$ | $L_{b72}$ | $L_{b72}$ |
| 1311 | $L_{a4\text{-}26}$ | $L_{b72}$ | $L_{b72}$ |
| 1312 | $L_{a4\text{-}28}$ | $L_{b72}$ | $L_{b72}$ |
| 1313 | $L_{a1\text{-}58}$ | $L_{b79}$ | $L_{b79}$ |
| 1314 | $L_{a1\text{-}88}$ | $L_{b79}$ | $L_{b79}$ |
| 1315 | $L_{a1\text{-}133}$ | $L_{b79}$ | $L_{b79}$ |
| 1316 | $L_{a1\text{-}146}$ | $L_{b79}$ | $L_{b79}$ |
| 1317 | $L_{a1\text{-}157}$ | $L_{b79}$ | $L_{b79}$ |
| 1318 | $L_{a1\text{-}158}$ | $L_{b79}$ | $L_{b79}$ |
| 1319 | $L_{a1\text{-}164}$ | $L_{b79}$ | $L_{b79}$ |
| 1320 | $L_{a1\text{-}170}$ | $L_{b79}$ | $L_{b79}$ |
| 1321 | $L_{a1\text{-}176}$ | $L_{b79}$ | $L_{b79}$ |
| 1323 | $L_{a1\text{-}224}$ | $L_{b79}$ | $L_{b79}$ |
| 1324 | $L_{a1\text{-}258}$ | $L_{b79}$ | $L_{b79}$ |
| 1325 | $L_{a1\text{-}308}$ | $L_{b79}$ | $L_{b79}$ |
| 1326 | $L_{a1\text{-}321}$ | $L_{b79}$ | $L_{b79}$ |
| 1327 | $L_{a1\text{-}333}$ | $L_{b79}$ | $L_{b79}$ |
| 1328 | $L_{a1\text{-}339}$ | $L_{b79}$ | $L_{b79}$ |
| 1329 | $L_{a1\text{-}345}$ | $L_{b79}$ | $L_{b79}$ |
| 1331 | $L_{a1\text{-}400}$ | $L_{b79}$ | $L_{b79}$ |
| 1332 | $L_{a1\text{-}418}$ | $L_{b79}$ | $L_{b79}$ |
| 1333 | $L_{a1\text{-}419}$ | $L_{b79}$ | $L_{b79}$ |
| 1334 | $L_{a1\text{-}440}$ | $L_{b79}$ | $L_{b79}$ |
| 1335 | $L_{a1\text{-}441}$ | $L_{b79}$ | $L_{b79}$ |
| 1336 | $L_{a1\text{-}446}$ | $L_{b79}$ | $L_{b79}$ |
| 1337 | $L_{a2\text{-}58}$ | $L_{b79}$ | $L_{b79}$ |
| 1338 | $L_{a2\text{-}88}$ | $L_{b79}$ | $L_{b79}$ |
| 1339 | $L_{a2\text{-}133}$ | $L_{b79}$ | $L_{b79}$ |
| 1340 | $L_{a2\text{-}146}$ | $L_{b79}$ | $L_{b79}$ |
| 1341 | $L_{a2\text{-}157}$ | $L_{b79}$ | $L_{b79}$ |

-continued

| Metal Complex | $L_a$ | $L_b$ | $L_b$ |
|---|---|---|---|
| 1342 | $L_{a2\text{-}158}$ | $L_{b79}$ | $L_{b79}$ |
| 1343 | $L_{a2\text{-}164}$ | $L_{b79}$ | $L_{b79}$ |
| 1344 | $L_{a2\text{-}170}$ | $L_{b79}$ | $L_{b79}$ |
| 1345 | $L_{a2\text{-}176}$ | $L_{b79}$ | $L_{b79}$ |
| 1347 | $L_{a2\text{-}224}$ | $L_{b79}$ | $L_{b79}$ |
| 1348 | $L_{a2\text{-}258}$ | $L_{b79}$ | $L_{b79}$ |
| 1349 | $L_{a2\text{-}308}$ | $L_{b79}$ | $L_{b79}$ |
| 1350 | $L_{a2\text{-}321}$ | $L_{b79}$ | $L_{b79}$ |
| 1351 | $L_{a2\text{-}333}$ | $L_{b79}$ | $L_{b79}$ |
| 1352 | $L_{a2\text{-}339}$ | $L_{b79}$ | $L_{b79}$ |
| 1353 | $L_{a2\text{-}345}$ | $L_{b79}$ | $L_{b79}$ |
| 1355 | $L_{a2\text{-}400}$ | $L_{b79}$ | $L_{b79}$ |
| 1356 | $L_{a2\text{-}418}$ | $L_{b79}$ | $L_{b79}$ |
| 1357 | $L_{a2\text{-}419}$ | $L_{b79}$ | $L_{b79}$ |
| 1358 | $L_{a2\text{-}440}$ | $L_{b79}$ | $L_{b79}$ |
| 1359 | $L_{a2\text{-}441}$ | $L_{b79}$ | $L_{b79}$ |
| 1360 | $L_{a2\text{-}446}$ | $L_{b79}$ | $L_{b79}$ |
| 1361 | $L_{a3\text{-}58}$ | $L_{b79}$ | $L_{b79}$ |
| 1362 | $L_{a3\text{-}88}$ | $L_{b79}$ | $L_{b79}$ |
| 1363 | $L_{a3\text{-}133}$ | $L_{b79}$ | $L_{b79}$ |
| 1364 | $L_{a3\text{-}146}$ | $L_{b79}$ | $L_{b79}$ |
| 1365 | $L_{a3\text{-}157}$ | $L_{b79}$ | $L_{b79}$ |
| 1366 | $L_{a3\text{-}158}$ | $L_{b79}$ | $L_{b79}$ |
| 1367 | $L_{a3\text{-}164}$ | $L_{b79}$ | $L_{b79}$ |
| 1368 | $L_{a3\text{-}170}$ | $L_{b79}$ | $L_{b79}$ |
| 1369 | $L_{a3\text{-}176}$ | $L_{b79}$ | $L_{b79}$ |
| 1371 | $L_{a3\text{-}224}$ | $L_{b79}$ | $L_{b79}$ |
| 1372 | $L_{a3\text{-}258}$ | $L_{b79}$ | $L_{b79}$ |
| 1373 | $L_{a3\text{-}308}$ | $L_{b79}$ | $L_{b79}$ |
| 1374 | $L_{a3\text{-}321}$ | $L_{b79}$ | $L_{b79}$ |
| 1375 | $L_{a3\text{-}333}$ | $L_{b79}$ | $L_{b79}$ |
| 1376 | $L_{a3\text{-}339}$ | $L_{b79}$ | $L_{b79}$ |
| 1377 | $L_{a3\text{-}345}$ | $L_{b79}$ | $L_{b79}$ |
| 1379 | $L_{a3\text{-}400}$ | $L_{b79}$ | $L_{b79}$ |
| 1380 | $L_{a3\text{-}418}$ | $L_{b79}$ | $L_{b79}$ |
| 1381 | $L_{a3\text{-}419}$ | $L_{b79}$ | $L_{b79}$ |
| 1382 | $L_{a3\text{-}440}$ | $L_{b79}$ | $L_{b79}$ |
| 1383 | $L_{a3\text{-}441}$ | $L_{b79}$ | $L_{b79}$ |
| 1384 | $L_{a3\text{-}446}$ | $L_{b79}$ | $L_{b79}$ |
| 1385 | $L_{a4\text{-}2}$ | $L_{b79}$ | $L_{b79}$ |
| 1386 | $L_{a4\text{-}4}$ | $L_{b79}$ | $L_{b79}$ |
| 1387 | $L_{a4\text{-}8}$ | $L_{b79}$ | $L_{b79}$ |
| 1388 | $L_{a4\text{-}10}$ | $L_{b79}$ | $L_{b79}$ |
| 1389 | $L_{a4\text{-}14}$ | $L_{b79}$ | $L_{b79}$ |
| 1390 | $L_{a4\text{-}16}$ | $L_{b79}$ | $L_{b79}$ |
| 1391 | $L_{a4\text{-}20}$ | $L_{b79}$ | $L_{b79}$ |
| 1392 | $L_{a4\text{-}22}$ | $L_{b79}$ | $L_{b79}$ |
| 1393 | $L_{a4\text{-}26}$ | $L_{b79}$ | $L_{b79}$ |
| 1394 | $L_{a4\text{-}28}$ | $L_{b79}$ | $L_{b79}$ |
| 1395 | $L_{a1\text{-}58}$ | $L_{b80}$ | $L_{b80}$ |
| 1396 | $L_{a1\text{-}88}$ | $L_{b80}$ | $L_{b80}$ |
| 1397 | $L_{a1\text{-}133}$ | $L_{b80}$ | $L_{b80}$ |
| 1398 | $L_{a1\text{-}146}$ | $L_{b80}$ | $L_{b80}$ |
| 1399 | $L_{a1\text{-}157}$ | $L_{b80}$ | $L_{b80}$ |
| 1400 | $L_{a1\text{-}158}$ | $L_{b80}$ | $L_{b80}$ |
| 1401 | $L_{a1\text{-}164}$ | $L_{b80}$ | $L_{b80}$ |
| 1402 | $L_{a1\text{-}170}$ | $L_{b80}$ | $L_{b80}$ |
| 1403 | $L_{a1\text{-}176}$ | $L_{b80}$ | $L_{b80}$ |
| 1405 | $L_{a1\text{-}224}$ | $L_{b80}$ | $L_{b80}$ |
| 1406 | $L_{a1\text{-}258}$ | $L_{b80}$ | $L_{b80}$ |
| 1407 | $L_{a1\text{-}308}$ | $L_{b80}$ | $L_{b80}$ |
| 1408 | $L_{a1\text{-}321}$ | $L_{b80}$ | $L_{b80}$ |
| 1409 | $L_{a1\text{-}333}$ | $L_{b80}$ | $L_{b80}$ |
| 1410 | $L_{a1\text{-}339}$ | $L_{b80}$ | $L_{b80}$ |
| 1411 | $L_{a1\text{-}345}$ | $L_{b80}$ | $L_{b80}$ |
| 1413 | $L_{a1\text{-}400}$ | $L_{b80}$ | $L_{b80}$ |
| 1414 | $L_{a1\text{-}418}$ | $L_{b80}$ | $L_{b80}$ |
| 1415 | $L_{a1\text{-}419}$ | $L_{b80}$ | $L_{b80}$ |
| 1416 | $L_{a1\text{-}440}$ | $L_{b80}$ | $L_{b80}$ |
| 1417 | $L_{a1\text{-}441}$ | $L_{b80}$ | $L_{b80}$ |
| 1418 | $L_{a1\text{-}446}$ | $L_{b80}$ | $L_{b80}$ |
| 1419 | $L_{a2\text{-}58}$ | $L_{b80}$ | $L_{b80}$ |
| 1420 | $L_{a2\text{-}88}$ | $L_{b80}$ | $L_{b80}$ |
| 1421 | $L_{a2\text{-}133}$ | $L_{b80}$ | $L_{b80}$ |
| 1422 | $L_{a2\text{-}146}$ | $L_{b80}$ | $L_{b80}$ |
| 1423 | $L_{a2\text{-}157}$ | $L_{b80}$ | $L_{b80}$ |

-continued

| Metal Complex | $L_a$ | $L_b$ | $L_b$ |
|---|---|---|---|
| 1424 | $L_{a2-158}$ | $L_{b80}$ | $L_{b80}$ |
| 1425 | $L_{a2-164}$ | $L_{b80}$ | $L_{b80}$ |
| 1426 | $L_{a2-170}$ | $L_{b80}$ | $L_{b80}$ |
| 1427 | $L_{a2-176}$ | $L_{b80}$ | $L_{b80}$ |
| 1429 | $L_{a2-224}$ | $L_{b80}$ | $L_{b80}$ |
| 1430 | $L_{a2-258}$ | $L_{b80}$ | $L_{b80}$ |
| 1431 | $L_{a2-308}$ | $L_{b80}$ | $L_{b80}$ |
| 1432 | $L_{a2-321}$ | $L_{b80}$ | $L_{b80}$ |
| 1433 | $L_{a2-333}$ | $L_{b80}$ | $L_{b80}$ |
| 1434 | $L_{a2-339}$ | $L_{b80}$ | $L_{b80}$ |
| 1435 | $L_{a2-345}$ | $L_{b80}$ | $L_{b80}$ |
| 1437 | $L_{a2-400}$ | $L_{b80}$ | $L_{b80}$ |
| 1438 | $L_{a2-418}$ | $L_{b80}$ | $L_{b80}$ |
| 1439 | $L_{a2-419}$ | $L_{b80}$ | $L_{b80}$ |
| 1440 | $L_{a2-440}$ | $L_{b80}$ | $L_{b80}$ |
| 1441 | $L_{a2-441}$ | $L_{b80}$ | $L_{b80}$ |
| 1442 | $L_{a2-446}$ | $L_{b80}$ | $L_{b80}$ |
| 1443 | $L_{a3-58}$ | $L_{b80}$ | $L_{b80}$ |
| 1444 | $L_{a3-88}$ | $L_{b80}$ | $L_{b80}$ |
| 1445 | $L_{a3-133}$ | $L_{b80}$ | $L_{b80}$ |
| 1446 | $L_{a3-146}$ | $L_{b80}$ | $L_{b80}$ |
| 1447 | $L_{a3-157}$ | $L_{b80}$ | $L_{b80}$ |
| 1448 | $L_{a3-158}$ | $L_{b80}$ | $L_{b80}$ |
| 1449 | $L_{a3-164}$ | $L_{b80}$ | $L_{b80}$ |
| 1450 | $L_{a3-170}$ | $L_{b80}$ | $L_{b80}$ |
| 1451 | $L_{a3-176}$ | $L_{b80}$ | $L_{b80}$ |
| 1453 | $L_{a3-224}$ | $L_{b80}$ | $L_{b80}$ |
| 1454 | $L_{a3-258}$ | $L_{b80}$ | $L_{b80}$ |
| 1455 | $L_{a3-308}$ | $L_{b80}$ | $L_{b80}$ |
| 1456 | $L_{a3-321}$ | $L_{b80}$ | $L_{b80}$ |
| 1457 | $L_{a3-333}$ | $L_{b80}$ | $L_{b80}$ |
| 1458 | $L_{a3-339}$ | $L_{b80}$ | $L_{b80}$ |
| 1459 | $L_{a3-345}$ | $L_{b80}$ | $L_{b80}$ |
| 1461 | $L_{a3-400}$ | $L_{b80}$ | $L_{b80}$ |
| 1462 | $L_{a3-418}$ | $L_{b80}$ | $L_{b80}$ |
| 1463 | $L_{a3-419}$ | $L_{b80}$ | $L_{b80}$ |
| 1464 | $L_{a3-440}$ | $L_{b80}$ | $L_{b80}$ |
| 1465 | $L_{a3-441}$ | $L_{b80}$ | $L_{b80}$ |
| 1466 | $L_{a3-446}$ | $L_{b80}$ | $L_{b80}$ |
| 1467 | $L_{a4-2}$ | $L_{b80}$ | $L_{b80}$ |
| 1468 | $L_{a4-4}$ | $L_{b80}$ | $L_{b80}$ |
| 1469 | $L_{a4-8}$ | $L_{b80}$ | $L_{b80}$ |
| 1470 | $L_{a4-10}$ | $L_{b80}$ | $L_{b80}$ |
| 1471 | $L_{a4-14}$ | $L_{b80}$ | $L_{b80}$ |
| 1472 | $L_{a4-16}$ | $L_{b80}$ | $L_{b80}$ |
| 1473 | $L_{a4-20}$ | $L_{b80}$ | $L_{b80}$ |
| 1474 | $L_{a4-22}$ | $L_{b80}$ | $L_{b80}$ |
| 1475 | $L_{a4-26}$ | $L_{b80}$ | $L_{b80}$ |
| 1476 | $L_{a4-28}$ | $L_{b80}$ | $L_{b80}$ |
| 1477 | $L_{a1-58}$ | $L_{b81}$ | $L_{b81}$ |
| 1478 | $L_{a1-88}$ | $L_{b81}$ | $L_{b81}$ |
| 1479 | $L_{a1-133}$ | $L_{b81}$ | $L_{b81}$ |
| 1480 | $L_{a1-146}$ | $L_{b81}$ | $L_{b81}$ |
| 1481 | $L_{a1-157}$ | $L_{b81}$ | $L_{b81}$ |
| 1482 | $L_{a1-158}$ | $L_{b81}$ | $L_{b81}$ |
| 1483 | $L_{a1-164}$ | $L_{b81}$ | $L_{b81}$ |
| 1484 | $L_{a1-170}$ | $L_{b81}$ | $L_{b81}$ |
| 1485 | $L_{a1-176}$ | $L_{b81}$ | $L_{b81}$ |
| 1487 | $L_{a1-224}$ | $L_{b81}$ | $L_{b81}$ |
| 1488 | $L_{a1-258}$ | $L_{b81}$ | $L_{b81}$ |
| 1489 | $L_{a1-308}$ | $L_{b81}$ | $L_{b81}$ |
| 1490 | $L_{a1-321}$ | $L_{b81}$ | $L_{b81}$ |
| 1491 | $L_{a1-333}$ | $L_{b81}$ | $L_{b81}$ |
| 1492 | $L_{a1-339}$ | $L_{b81}$ | $L_{b81}$ |
| 1493 | $L_{a1-345}$ | $L_{b81}$ | $L_{b81}$ |
| 1495 | $L_{a1-400}$ | $L_{b81}$ | $L_{b81}$ |
| 1496 | $L_{a1-418}$ | $L_{b81}$ | $L_{b81}$ |
| 1497 | $L_{a1-419}$ | $L_{b81}$ | $L_{b81}$ |
| 1498 | $L_{a1-440}$ | $L_{b81}$ | $L_{b81}$ |
| 1499 | $L_{a1-441}$ | $L_{b81}$ | $L_{b81}$ |
| 1500 | $L_{a1-446}$ | $L_{b81}$ | $L_{b81}$ |
| 1501 | $L_{a2-58}$ | $L_{b81}$ | $L_{b81}$ |
| 1502 | $L_{a2-88}$ | $L_{b81}$ | $L_{b81}$ |
| 1503 | $L_{a2-133}$ | $L_{b81}$ | $L_{b81}$ |
| 1504 | $L_{a2-146}$ | $L_{b81}$ | $L_{b81}$ |
| 1505 | $L_{a2-157}$ | $L_{b81}$ | $L_{b81}$ |

-continued

| Metal Complex | $L_a$ | $L_b$ | $L_b$ |
|---|---|---|---|
| 1506 | $L_{a2-158}$ | $L_{b81}$ | $L_{b81}$ |
| 1507 | $L_{a2-164}$ | $L_{b81}$ | $L_{b81}$ |
| 1508 | $L_{a2-170}$ | $L_{b81}$ | $L_{b81}$ |
| 1509 | $L_{a2-176}$ | $L_{b81}$ | $L_{b81}$ |
| 1511 | $L_{a2-224}$ | $L_{b81}$ | $L_{b81}$ |
| 1512 | $L_{a2-258}$ | $L_{b81}$ | $L_{b81}$ |
| 1513 | $L_{a2-308}$ | $L_{b81}$ | $L_{b81}$ |
| 1514 | $L_{a2-321}$ | $L_{b81}$ | $L_{b81}$ |
| 1515 | $L_{a2-333}$ | $L_{b81}$ | $L_{b81}$ |
| 1516 | $L_{a2-339}$ | $L_{b81}$ | $L_{b81}$ |
| 1517 | $L_{a2-345}$ | $L_{b81}$ | $L_{b81}$ |
| 1519 | $L_{a2-400}$ | $L_{b81}$ | $L_{b81}$ |
| 1520 | $L_{a2-418}$ | $L_{b81}$ | $L_{b81}$ |
| 1521 | $L_{a2-419}$ | $L_{b81}$ | $L_{b81}$ |
| 1522 | $L_{a2-440}$ | $L_{b81}$ | $L_{b81}$ |
| 1523 | $L_{a2-441}$ | $L_{b81}$ | $L_{b81}$ |
| 1524 | $L_{a2-446}$ | $L_{b81}$ | $L_{b81}$ |
| 1525 | $L_{a3-58}$ | $L_{b81}$ | $L_{b81}$ |
| 1526 | $L_{a3-88}$ | $L_{b81}$ | $L_{b81}$ |
| 1527 | $L_{a3-133}$ | $L_{b81}$ | $L_{b81}$ |
| 1528 | $L_{a3-146}$ | $L_{b81}$ | $L_{b81}$ |
| 1529 | $L_{a3-157}$ | $L_{b81}$ | $L_{b81}$ |
| 1530 | $L_{a3-158}$ | $L_{b81}$ | $L_{b81}$ |
| 1531 | $L_{a3-164}$ | $L_{b81}$ | $L_{b81}$ |
| 1532 | $L_{a3-170}$ | $L_{b81}$ | $L_{b81}$ |
| 1533 | $L_{a3-176}$ | $L_{b81}$ | $L_{b81}$ |
| 1535 | $L_{a3-224}$ | $L_{b81}$ | $L_{b81}$ |
| 1536 | $L_{a3-258}$ | $L_{b81}$ | $L_{b81}$ |
| 1537 | $L_{a3-308}$ | $L_{b81}$ | $L_{b81}$ |
| 1538 | $L_{a3-321}$ | $L_{b81}$ | $L_{b81}$ |
| 1539 | $L_{a3-333}$ | $L_{b81}$ | $L_{b81}$ |
| 1540 | $L_{a3-339}$ | $L_{b81}$ | $L_{b81}$ |
| 1541 | $L_{a3-345}$ | $L_{b81}$ | $L_{b81}$ |
| 1543 | $L_{a3-400}$ | $L_{b81}$ | $L_{b81}$ |
| 1544 | $L_{a3-418}$ | $L_{b81}$ | $L_{b81}$ |
| 1545 | $L_{a3-419}$ | $L_{b81}$ | $L_{b81}$ |
| 1546 | $L_{a3-440}$ | $L_{b81}$ | $L_{b81}$ |
| 1547 | $L_{a3-441}$ | $L_{b81}$ | $L_{b81}$ |
| 1548 | $L_{a3-446}$ | $L_{b81}$ | $L_{b81}$ |
| 1549 | $L_{a4-2}$ | $L_{b81}$ | $L_{b81}$ |
| 1550 | $L_{a4-4}$ | $L_{b81}$ | $L_{b81}$ |
| 1551 | $L_{a4-8}$ | $L_{b81}$ | $L_{b81}$ |
| 1552 | $L_{a4-10}$ | $L_{b81}$ | $L_{b81}$ |
| 1553 | $L_{a4-14}$ | $L_{b81}$ | $L_{b81}$ |
| 1554 | $L_{a4-16}$ | $L_{b81}$ | $L_{b81}$ |
| 1555 | $L_{a4-20}$ | $L_{b81}$ | $L_{b81}$ |
| 1556 | $L_{a4-22}$ | $L_{b81}$ | $L_{b81}$ |
| 1557 | $L_{a4-26}$ | $L_{b81}$ | $L_{b81}$ |
| 1558 | $L_{a4-28}$ | $L_{b81}$ | $L_{b81}$ |
| 1559 | $L_{a1-58}$ | $L_{b99}$ | $L_{b99}$ |
| 1560 | $L_{a1-88}$ | $L_{b99}$ | $L_{b99}$ |
| 1561 | $L_{a1-133}$ | $L_{b99}$ | $L_{b99}$ |
| 1562 | $L_{a1-146}$ | $L_{b99}$ | $L_{b99}$ |
| 1563 | $L_{a1-157}$ | $L_{b99}$ | $L_{b99}$ |
| 1564 | $L_{a1-158}$ | $L_{b99}$ | $L_{b99}$ |
| 1565 | $L_{a1-164}$ | $L_{b99}$ | $L_{b99}$ |
| 1566 | $L_{a1-170}$ | $L_{b99}$ | $L_{b99}$ |
| 1567 | $L_{a1-176}$ | $L_{b99}$ | $L_{b99}$ |
| 1569 | $L_{a1-224}$ | $L_{b99}$ | $L_{b99}$ |
| 1570 | $L_{a1-258}$ | $L_{b99}$ | $L_{b99}$ |
| 1571 | $L_{a1-308}$ | $L_{b99}$ | $L_{b99}$ |
| 1572 | $L_{a1-321}$ | $L_{b99}$ | $L_{b99}$ |
| 1573 | $L_{a1-333}$ | $L_{b99}$ | $L_{b99}$ |
| 1574 | $L_{a1-339}$ | $L_{b99}$ | $L_{b99}$ |
| 1575 | $L_{a1-345}$ | $L_{b99}$ | $L_{b99}$ |
| 1577 | $L_{a1-400}$ | $L_{b99}$ | $L_{b99}$ |
| 1578 | $L_{a1-418}$ | $L_{b99}$ | $L_{b99}$ |
| 1579 | $L_{a1-419}$ | $L_{b99}$ | $L_{b99}$ |
| 1580 | $L_{a1-440}$ | $L_{b99}$ | $L_{b99}$ |
| 1581 | $L_{a1-441}$ | $L_{b99}$ | $L_{b99}$ |
| 1582 | $L_{a1-446}$ | $L_{b99}$ | $L_{b99}$ |
| 1583 | $L_{a2-58}$ | $L_{b99}$ | $L_{b99}$ |
| 1584 | $L_{a2-88}$ | $L_{b99}$ | $L_{b99}$ |
| 1585 | $L_{a2-133}$ | $L_{b99}$ | $L_{b99}$ |
| 1586 | $L_{a2-146}$ | $L_{b99}$ | $L_{b99}$ |
| 1587 | $L_{a2-157}$ | $L_{b99}$ | $L_{b99}$ |

-continued

| Metal Complex | $L_a$ | $L_b$ | $L_b$ |
|---|---|---|---|
| 1588 | $L_{a2-158}$ | $L_{b99}$ | $L_{b99}$ |
| 1589 | $L_{a2-164}$ | $L_{b99}$ | $L_{b99}$ |
| 1590 | $L_{a2-170}$ | $L_{b99}$ | $L_{b99}$ |
| 1591 | $L_{a2-176}$ | $L_{b99}$ | $L_{b99}$ |
| 1593 | $L_{a2-224}$ | $L_{b99}$ | $L_{b99}$ |
| 1594 | $L_{a2-258}$ | $L_{b99}$ | $L_{b99}$ |
| 1595 | $L_{a2-308}$ | $L_{b99}$ | $L_{b99}$ |
| 1596 | $L_{a2-321}$ | $L_{b99}$ | $L_{b99}$ |
| 1597 | $L_{a2-333}$ | $L_{b99}$ | $L_{b99}$ |
| 1598 | $L_{a2-339}$ | $L_{b99}$ | $L_{b99}$ |
| 1599 | $L_{a2-345}$ | $L_{b99}$ | $L_{b99}$ |
| 1601 | $L_{a2-400}$ | $L_{b99}$ | $L_{b99}$ |
| 1602 | $L_{a2-418}$ | $L_{b99}$ | $L_{b99}$ |
| 1603 | $L_{a2-419}$ | $L_{b99}$ | $L_{b99}$ |
| 1604 | $L_{a2-440}$ | $L_{b99}$ | $L_{b99}$ |
| 1605 | $L_{a2-441}$ | $L_{b99}$ | $L_{b99}$ |
| 1606 | $L_{a2-446}$ | $L_{b99}$ | $L_{b99}$ |
| 1607 | $L_{a3-58}$ | $L_{b99}$ | $L_{b99}$ |
| 1608 | $L_{a3-88}$ | $L_{b99}$ | $L_{b99}$ |
| 1609 | $L_{a3-133}$ | $L_{b99}$ | $L_{b99}$ |
| 1610 | $L_{a3-146}$ | $L_{b99}$ | $L_{b99}$ |
| 1611 | $L_{a3-157}$ | $L_{b99}$ | $L_{b99}$ |
| 1612 | $L_{a3-158}$ | $L_{b99}$ | $L_{b99}$ |
| 1613 | $L_{a3-164}$ | $L_{b99}$ | $L_{b99}$ |
| 1614 | $L_{a3-170}$ | $L_{b99}$ | $L_{b99}$ |
| 1615 | $L_{a3-176}$ | $L_{b99}$ | $L_{b99}$ |
| 1617 | $L_{a3-224}$ | $L_{b99}$ | $L_{b99}$ |
| 1618 | $L_{a3-258}$ | $L_{b99}$ | $L_{b99}$ |
| 1619 | $L_{a3-308}$ | $L_{b99}$ | $L_{b99}$ |
| 1620 | $L_{a3-321}$ | $L_{b99}$ | $L_{b99}$ |
| 1621 | $L_{a3-333}$ | $L_{b99}$ | $L_{b99}$ |
| 1622 | $L_{a3-339}$ | $L_{b99}$ | $L_{b99}$ |
| 1623 | $L_{a3-345}$ | $L_{b99}$ | $L_{b99}$ |
| 1625 | $L_{a3-400}$ | $L_{b99}$ | $L_{b99}$ |
| 1626 | $L_{a3-418}$ | $L_{b99}$ | $L_{b99}$ |
| 1627 | $L_{a3-419}$ | $L_{b99}$ | $L_{b99}$ |
| 1628 | $L_{a3-440}$ | $L_{b99}$ | $L_{b99}$ |
| 1629 | $L_{a3-441}$ | $L_{b99}$ | $L_{b99}$ |
| 1630 | $L_{a3-446}$ | $L_{b99}$ | $L_{b99}$ |
| 1631 | $L_{a4-2}$ | $L_{b99}$ | $L_{b99}$ |
| 1632 | $L_{a4-4}$ | $L_{b99}$ | $L_{b99}$ |
| 1633 | $L_{a4-8}$ | $L_{b99}$ | $L_{b99}$ |
| 1634 | $L_{a4-10}$ | $L_{b99}$ | $L_{b99}$ |
| 1635 | $L_{a4-14}$ | $L_{b99}$ | $L_{b99}$ |
| 1636 | $L_{a4-16}$ | $L_{b99}$ | $L_{b99}$ |
| 1637 | $L_{a4-20}$ | $L_{b99}$ | $L_{b99}$ |
| 1638 | $L_{a4-22}$ | $L_{b99}$ | $L_{b99}$ |
| 1639 | $L_{a4-26}$ | $L_{b99}$ | $L_{b99}$ |
| 1640 | $L_{a4-28}$ | $L_{b99}$ | $L_{b99}$ |
| 1641 | $L_{a1-58}$ | $L_{b112}$ | $L_{b112}$ |
| 1642 | $L_{a1-88}$ | $L_{b112}$ | $L_{b112}$ |
| 1643 | $L_{a1-133}$ | $L_{b112}$ | $L_{b112}$ |
| 1644 | $L_{a1-146}$ | $L_{b112}$ | $L_{b112}$ |
| 1645 | $L_{a1-157}$ | $L_{b112}$ | $L_{b112}$ |
| 1646 | $L_{a1-158}$ | $L_{b112}$ | $L_{b112}$ |
| 1647 | $L_{a1-164}$ | $L_{b112}$ | $L_{b112}$ |
| 1648 | $L_{a1-170}$ | $L_{b112}$ | $L_{b112}$ |
| 1649 | $L_{a1-176}$ | $L_{b112}$ | $L_{b112}$ |
| 1651 | $L_{a1-224}$ | $L_{b112}$ | $L_{b112}$ |
| 1652 | $L_{a1-258}$ | $L_{b112}$ | $L_{b112}$ |
| 1653 | $L_{a1-308}$ | $L_{b112}$ | $L_{b112}$ |
| 1654 | $L_{a1-321}$ | $L_{b112}$ | $L_{b112}$ |
| 1655 | $L_{a1-333}$ | $L_{b112}$ | $L_{b112}$ |
| 1656 | $L_{a1-339}$ | $L_{b112}$ | $L_{b112}$ |
| 1657 | $L_{a1-345}$ | $L_{b112}$ | $L_{b112}$ |
| 1659 | $L_{a1-400}$ | $L_{b112}$ | $L_{b112}$ |
| 1660 | $L_{a1-418}$ | $L_{b112}$ | $L_{b112}$ |
| 1661 | $L_{a1-419}$ | $L_{b112}$ | $L_{b112}$ |
| 1662 | $L_{a1-440}$ | $L_{b112}$ | $L_{b112}$ |
| 1663 | $L_{a1-441}$ | $L_{b112}$ | $L_{b112}$ |
| 1664 | $L_{a1-446}$ | $L_{b112}$ | $L_{b112}$ |
| 1665 | $L_{a2-58}$ | $L_{b112}$ | $L_{b112}$ |
| 1666 | $L_{a2-88}$ | $L_{b112}$ | $L_{b112}$ |
| 1667 | $L_{a2-133}$ | $L_{b112}$ | $L_{b112}$ |
| 1668 | $L_{a2-146}$ | $L_{b112}$ | $L_{b112}$ |
| 1669 | $L_{a2-157}$ | $L_{b112}$ | $L_{b112}$ |

-continued

| Metal Complex | $L_a$ | $L_b$ | $L_b$ |
|---|---|---|---|
| 1670 | $L_{a2-158}$ | $L_{b112}$ | $L_{b112}$ |
| 1671 | $L_{a2-164}$ | $L_{b112}$ | $L_{b112}$ |
| 1672 | $L_{a2-170}$ | $L_{b112}$ | $L_{b112}$ |
| 1673 | $L_{a2-176}$ | $L_{b112}$ | $L_{b112}$ |
| 1675 | $L_{a2-224}$ | $L_{b112}$ | $L_{b112}$ |
| 1676 | $L_{a2-258}$ | $L_{b112}$ | $L_{b112}$ |
| 1677 | $L_{a2-308}$ | $L_{b112}$ | $L_{b112}$ |
| 1678 | $L_{a2-321}$ | $L_{b112}$ | $L_{b112}$ |
| 1679 | $L_{a2-333}$ | $L_{b112}$ | $L_{b112}$ |
| 1680 | $L_{a2-339}$ | $L_{b112}$ | $L_{b112}$ |
| 1681 | $L_{a2-345}$ | $L_{b112}$ | $L_{b112}$ |
| 1683 | $L_{a2-400}$ | $L_{b112}$ | $L_{b112}$ |
| 1684 | $L_{a2-418}$ | $L_{b112}$ | $L_{b112}$ |
| 1685 | $L_{a2-419}$ | $L_{b112}$ | $L_{b112}$ |
| 1686 | $L_{a2-440}$ | $L_{b112}$ | $L_{b112}$ |
| 1687 | $L_{a2-441}$ | $L_{b112}$ | $L_{b112}$ |
| 1688 | $L_{a2-446}$ | $L_{b112}$ | $L_{b112}$ |
| 1689 | $L_{a3-58}$ | $L_{b112}$ | $L_{b112}$ |
| 1690 | $L_{a3-88}$ | $L_{b112}$ | $L_{b112}$ |
| 1691 | $L_{a3-133}$ | $L_{b112}$ | $L_{b112}$ |
| 1692 | $L_{a3-146}$ | $L_{b112}$ | $L_{b112}$ |
| 1693 | $L_{a3-157}$ | $L_{b112}$ | $L_{b112}$ |
| 1694 | $L_{a3-158}$ | $L_{b112}$ | $L_{b112}$ |
| 1695 | $L_{a3-164}$ | $L_{b112}$ | $L_{b112}$ |
| 1696 | $L_{a3-170}$ | $L_{b112}$ | $L_{b112}$ |
| 1697 | $L_{a3-176}$ | $L_{b112}$ | $L_{b112}$ |
| 1699 | $L_{a3-224}$ | $L_{b112}$ | $L_{b112}$ |
| 1700 | $L_{a3-258}$ | $L_{b112}$ | $L_{b112}$ |
| 1701 | $L_{a3-308}$ | $L_{b112}$ | $L_{b112}$ |
| 1702 | $L_{a3-321}$ | $L_{b112}$ | $L_{b112}$ |
| 1703 | $L_{a3-333}$ | $L_{b112}$ | $L_{b112}$ |
| 1704 | $L_{a3-339}$ | $L_{b112}$ | $L_{b112}$ |
| 1705 | $L_{a3-345}$ | $L_{b112}$ | $L_{b112}$ |
| 1707 | $L_{a3-400}$ | $L_{b112}$ | $L_{b112}$ |
| 1709 | $L_{a3-419}$ | $L_{b112}$ | $L_{b112}$ |
| 1708 | $L_{a3-418}$ | $L_{b112}$ | $L_{b112}$ |
| 1710 | $L_{a3-440}$ | $L_{b112}$ | $L_{b112}$ |
| 1711 | $L_{a3-441}$ | $L_{b112}$ | $L_{b112}$ |
| 1712 | $L_{a3-446}$ | $L_{b112}$ | $L_{b112}$ |
| 1713 | $L_{a4-2}$ | $L_{b112}$ | $L_{b112}$ |
| 1714 | $L_{a4-4}$ | $L_{b112}$ | $L_{b112}$ |
| 1715 | $L_{a4-8}$ | $L_{b112}$ | $L_{b112}$ |
| 1716 | $L_{a4-10}$ | $L_{b112}$ | $L_{b112}$ |
| 1717 | $L_{a4-14}$ | $L_{b112}$ | $L_{b112}$ |
| 1718 | $L_{a4-16}$ | $L_{b112}$ | $L_{b112}$ |
| 1719 | $L_{a4-20}$ | $L_{b112}$ | $L_{b112}$ |
| 1720 | $L_{a4-22}$ | $L_{b112}$ | $L_{b112}$ |
| 1721 | $L_{a4-26}$ | $L_{b112}$ | $L_{b112}$ |
| 1722 | $L_{a4-28}$ | $L_{b112}$ | $L_{b112}$ |
| 1723 | $L_{a1-58}$ | $L_{b151}$ | $L_{b151}$ |
| 1724 | $L_{a1-88}$ | $L_{b151}$ | $L_{b151}$ |
| 1725 | $L_{a1-133}$ | $L_{b151}$ | $L_{b151}$ |
| 1726 | $L_{a1-146}$ | $L_{b151}$ | $L_{b151}$ |
| 1727 | $L_{a1-157}$ | $L_{b151}$ | $L_{b151}$ |
| 1728 | $L_{a1-158}$ | $L_{b151}$ | $L_{b151}$ |
| 1729 | $L_{a1-164}$ | $L_{b151}$ | $L_{b151}$ |
| 1730 | $L_{a1-170}$ | $L_{b151}$ | $L_{b151}$ |
| 1731 | $L_{a1-176}$ | $L_{b151}$ | $L_{b151}$ |
| 1733 | $L_{a1-224}$ | $L_{b151}$ | $L_{b151}$ |
| 1734 | $L_{a1-258}$ | $L_{b151}$ | $L_{b151}$ |
| 1735 | $L_{a1-308}$ | $L_{b151}$ | $L_{b151}$ |
| 1736 | $L_{a1-321}$ | $L_{b151}$ | $L_{b151}$ |
| 1737 | $L_{a1-333}$ | $L_{b151}$ | $L_{b151}$ |
| 1738 | $L_{a1-339}$ | $L_{b151}$ | $L_{b151}$ |
| 1739 | $L_{a1-345}$ | $L_{b151}$ | $L_{b151}$ |
| 1741 | $L_{a1-400}$ | $L_{b151}$ | $L_{b151}$ |
| 1742 | $L_{a1-418}$ | $L_{b151}$ | $L_{b151}$ |
| 1743 | $L_{a1-419}$ | $L_{b151}$ | $L_{b151}$ |
| 1744 | $L_{a1-440}$ | $L_{b151}$ | $L_{b151}$ |
| 1745 | $L_{a1-441}$ | $L_{b151}$ | $L_{b151}$ |
| 1746 | $L_{a1-446}$ | $L_{b151}$ | $L_{b151}$ |
| 1747 | $L_{a2-58}$ | $L_{b151}$ | $L_{b151}$ |
| 1748 | $L_{a2-88}$ | $L_{b151}$ | $L_{b151}$ |
| 1749 | $L_{a2-133}$ | $L_{b151}$ | $L_{b151}$ |
| 1750 | $L_{a2-146}$ | $L_{b151}$ | $L_{b151}$ |
| 1751 | $L_{a2-157}$ | $L_{b151}$ | $L_{b151}$ |

-continued

| Metal Complex | $L_a$ | $L_b$ | $L_b$ |
|---|---|---|---|
| 1752 | $L_{a2\text{-}158}$ | $L_{b151}$ | $L_{b151}$ |
| 1753 | $L_{a2\text{-}164}$ | $L_{b151}$ | $L_{b151}$ |
| 1754 | $L_{a2\text{-}170}$ | $L_{b151}$ | $L_{b151}$ |
| 1755 | $L_{a2\text{-}176}$ | $L_{b151}$ | $L_{b151}$ |
| 1757 | $L_{a2\text{-}224}$ | $L_{b151}$ | $L_{b151}$ |
| 1758 | $L_{a2\text{-}258}$ | $L_{b151}$ | $L_{b151}$ |
| 1759 | $L_{a2\text{-}308}$ | $L_{b151}$ | $L_{b151}$ |
| 1760 | $L_{a2\text{-}321}$ | $L_{b151}$ | $L_{b151}$ |
| 1761 | $L_{a2\text{-}333}$ | $L_{b151}$ | $L_{b151}$ |
| 1762 | $L_{a2\text{-}339}$ | $L_{b151}$ | $L_{b151}$ |
| 1763 | $L_{a2\text{-}345}$ | $L_{b151}$ | $L_{b151}$ |
| 1765 | $L_{a2\text{-}400}$ | $L_{b151}$ | $L_{b151}$ |
| 1766 | $L_{a2\text{-}418}$ | $L_{b151}$ | $L_{b151}$ |
| 1767 | $L_{a2\text{-}419}$ | $L_{b151}$ | $L_{b151}$ |
| 1768 | $L_{a2\text{-}440}$ | $L_{b151}$ | $L_{b151}$ |
| 1769 | $L_{a2\text{-}441}$ | $L_{b151}$ | $L_{b151}$ |
| 1770 | $L_{a2\text{-}446}$ | $L_{b151}$ | $L_{b151}$ |
| 1771 | $L_{a3\text{-}58}$ | $L_{b151}$ | $L_{b151}$ |
| 1772 | $L_{a3\text{-}88}$ | $L_{b151}$ | $L_{b151}$ |
| 1773 | $L_{a3\text{-}133}$ | $L_{b151}$ | $L_{b151}$ |
| 1774 | $L_{a3\text{-}146}$ | $L_{b151}$ | $L_{b151}$ |
| 1775 | $L_{a3\text{-}157}$ | $L_{b151}$ | $L_{b151}$ |
| 1776 | $L_{a3\text{-}158}$ | $L_{b151}$ | $L_{b151}$ |
| 1777 | $L_{a3\text{-}164}$ | $L_{b151}$ | $L_{b151}$ |
| 1778 | $L_{a3\text{-}170}$ | $L_{b151}$ | $L_{b151}$ |
| 1779 | $L_{a3\text{-}176}$ | $L_{b151}$ | $L_{b151}$ |
| 1781 | $L_{a3\text{-}224}$ | $L_{b151}$ | $L_{b151}$ |
| 1782 | $L_{a3\text{-}258}$ | $L_{b151}$ | $L_{b151}$ |
| 1783 | $L_{a3\text{-}308}$ | $L_{b151}$ | $L_{b151}$ |
| 1784 | $L_{a3\text{-}321}$ | $L_{b151}$ | $L_{b151}$ |
| 1785 | $L_{a3\text{-}333}$ | $L_{b151}$ | $L_{b151}$ |
| 1786 | $L_{a3\text{-}339}$ | $L_{b151}$ | $L_{b151}$ |
| 1787 | $L_{a3\text{-}345}$ | $L_{b151}$ | $L_{b151}$ |
| 1789 | $L_{a3\text{-}400}$ | $L_{b151}$ | $L_{b151}$ |
| 1790 | $L_{a3\text{-}418}$ | $L_{b151}$ | $L_{b151}$ |
| 1791 | $L_{a3\text{-}419}$ | $L_{b151}$ | $L_{b151}$ |
| 1792 | $L_{a3\text{-}440}$ | $L_{b151}$ | $L_{b151}$ |
| 1793 | $L_{a3\text{-}441}$ | $L_{b151}$ | $L_{b151}$ |
| 1794 | $L_{a3\text{-}446}$ | $L_{b151}$ | $L_{b151}$ |
| 1795 | $L_{a4\text{-}2}$ | $L_{b151}$ | $L_{b151}$ |
| 1796 | $L_{a4\text{-}4}$ | $L_{b151}$ | $L_{b151}$ |
| 1797 | $L_{a4\text{-}8}$ | $L_{b151}$ | $L_{b151}$ |
| 1798 | $L_{a4\text{-}10}$ | $L_{b151}$ | $L_{b151}$ |
| 1799 | $L_{a4\text{-}14}$ | $L_{b151}$ | $L_{b151}$ |
| 1800 | $L_{a4\text{-}16}$ | $L_{b151}$ | $L_{b151}$ |
| 1801 | $L_{a4\text{-}20}$ | $L_{b151}$ | $L_{b151}$ |
| 1802 | $L_{a4\text{-}22}$ | $L_{b151}$ | $L_{b151}$ |
| 1803 | $L_{a4\text{-}26}$ | $L_{b151}$ | $L_{b151}$ |
| 1804 | $L_{a4\text{-}28}$ | $L_{b151}$ | $L_{b151}$ |
| 1805 | $L_{a1\text{-}58}$ | $L_{b153}$ | $L_{b153}$ |
| 1806 | $L_{a1\text{-}88}$ | $L_{b153}$ | $L_{b153}$ |
| 1807 | $L_{a1\text{-}133}$ | $L_{b153}$ | $L_{b153}$ |
| 1808 | $L_{a1\text{-}146}$ | $L_{b153}$ | $L_{b153}$ |
| 1809 | $L_{a1\text{-}157}$ | $L_{b153}$ | $L_{b153}$ |
| 1810 | $L_{a1\text{-}158}$ | $L_{b153}$ | $L_{b153}$ |
| 1811 | $L_{a1\text{-}164}$ | $L_{b153}$ | $L_{b153}$ |
| 1812 | $L_{a1\text{-}170}$ | $L_{b153}$ | $L_{b153}$ |
| 1813 | $L_{a1\text{-}176}$ | $L_{b153}$ | $L_{b153}$ |
| 1815 | $L_{a1\text{-}224}$ | $L_{b153}$ | $L_{b153}$ |
| 1816 | $L_{a1\text{-}258}$ | $L_{b153}$ | $L_{b153}$ |
| 1817 | $L_{a1\text{-}308}$ | $L_{b153}$ | $L_{b153}$ |
| 1818 | $L_{a1\text{-}321}$ | $L_{b153}$ | $L_{b153}$ |
| 1819 | $L_{a1\text{-}333}$ | $L_{b153}$ | $L_{b153}$ |
| 1820 | $L_{a1\text{-}339}$ | $L_{b153}$ | $L_{b153}$ |
| 1821 | $L_{a1\text{-}345}$ | $L_{b153}$ | $L_{b153}$ |
| 1823 | $L_{a1\text{-}400}$ | $L_{b153}$ | $L_{b153}$ |
| 1824 | $L_{a1\text{-}418}$ | $L_{b153}$ | $L_{b153}$ |
| 1825 | $L_{a1\text{-}419}$ | $L_{b153}$ | $L_{b153}$ |
| 1826 | $L_{a1\text{-}440}$ | $L_{b153}$ | $L_{b153}$ |
| 1827 | $L_{a1\text{-}441}$ | $L_{b153}$ | $L_{b153}$ |
| 1828 | $L_{a1\text{-}446}$ | $L_{b153}$ | $L_{b153}$ |
| 1829 | $L_{a2\text{-}58}$ | $L_{b153}$ | $L_{b153}$ |
| 1830 | $L_{a2\text{-}88}$ | $L_{b153}$ | $L_{b153}$ |
| 1831 | $L_{a2\text{-}133}$ | $L_{b153}$ | $L_{b153}$ |
| 1832 | $L_{a2\text{-}146}$ | $L_{b153}$ | $L_{b153}$ |
| 1833 | $L_{a2\text{-}157}$ | $L_{b153}$ | $L_{b153}$ |

-continued

| Metal Complex | $L_a$ | $L_b$ | $L_b$ |
|---|---|---|---|
| 1834 | $L_{a2\text{-}158}$ | $L_{b153}$ | $L_{b153}$ |
| 1835 | $L_{a2\text{-}164}$ | $L_{b153}$ | $L_{b153}$ |
| 1836 | $L_{a2\text{-}170}$ | $L_{b153}$ | $L_{b153}$ |
| 1837 | $L_{a2\text{-}176}$ | $L_{b153}$ | $L_{b153}$ |
| 1839 | $L_{a2\text{-}224}$ | $L_{b153}$ | $L_{b153}$ |
| 1840 | $L_{a2\text{-}258}$ | $L_{b153}$ | $L_{b153}$ |
| 1841 | $L_{a2\text{-}308}$ | $L_{b153}$ | $L_{b153}$ |
| 1842 | $L_{a2\text{-}321}$ | $L_{b153}$ | $L_{b153}$ |
| 1843 | $L_{a2\text{-}333}$ | $L_{b153}$ | $L_{b153}$ |
| 1844 | $L_{a2\text{-}339}$ | $L_{b153}$ | $L_{b153}$ |
| 1845 | $L_{a2\text{-}345}$ | $L_{b153}$ | $L_{b153}$ |
| 1847 | $L_{a2\text{-}400}$ | $L_{b153}$ | $L_{b153}$ |
| 1848 | $L_{a2\text{-}418}$ | $L_{b153}$ | $L_{b153}$ |
| 1849 | $L_{a2\text{-}419}$ | $L_{b153}$ | $L_{b153}$ |
| 1850 | $L_{a2\text{-}440}$ | $L_{b153}$ | $L_{b153}$ |
| 1851 | $L_{a2\text{-}441}$ | $L_{b153}$ | $L_{b153}$ |
| 1852 | $L_{a2\text{-}446}$ | $L_{b153}$ | $L_{b153}$ |
| 1853 | $L_{a3\text{-}58}$ | $L_{b153}$ | $L_{b153}$ |
| 1854 | $L_{a3\text{-}88}$ | $L_{b153}$ | $L_{b153}$ |
| 1855 | $L_{a3\text{-}133}$ | $L_{b153}$ | $L_{b153}$ |
| 1856 | $L_{a3\text{-}146}$ | $L_{b153}$ | $L_{b153}$ |
| 1857 | $L_{a3\text{-}157}$ | $L_{b153}$ | $L_{b153}$ |
| 1858 | $L_{a3\text{-}158}$ | $L_{b153}$ | $L_{b153}$ |
| 1859 | $L_{a3\text{-}164}$ | $L_{b153}$ | $L_{b153}$ |
| 1860 | $L_{a3\text{-}170}$ | $L_{b153}$ | $L_{b153}$ |
| 1861 | $L_{a3\text{-}176}$ | $L_{b153}$ | $L_{b153}$ |
| 1863 | $L_{a3\text{-}224}$ | $L_{b153}$ | $L_{b153}$ |
| 1864 | $L_{a3\text{-}258}$ | $L_{b153}$ | $L_{b153}$ |
| 1865 | $L_{a3\text{-}308}$ | $L_{b153}$ | $L_{b153}$ |
| 1866 | $L_{a3\text{-}321}$ | $L_{b153}$ | $L_{b153}$ |
| 1867 | $L_{a3\text{-}333}$ | $L_{b153}$ | $L_{b153}$ |
| 1868 | $L_{a3\text{-}339}$ | $L_{b153}$ | $L_{b153}$ |
| 1869 | $L_{a3\text{-}345}$ | $L_{b153}$ | $L_{b153}$ |
| 1871 | $L_{a3\text{-}400}$ | $L_{b153}$ | $L_{b153}$ |
| 1872 | $L_{a3\text{-}418}$ | $L_{b153}$ | $L_{b153}$ |
| 1873 | $L_{a3\text{-}419}$ | $L_{b153}$ | $L_{b153}$ |
| 1874 | $L_{a3\text{-}440}$ | $L_{b153}$ | $L_{b153}$ |
| 1875 | $L_{a3\text{-}441}$ | $L_{b153}$ | $L_{b153}$ |
| 1876 | $L_{a3\text{-}446}$ | $L_{b153}$ | $L_{b153}$ |
| 1877 | $L_{a4\text{-}2}$ | $L_{b153}$ | $L_{b153}$ |
| 1878 | $L_{a4\text{-}4}$ | $L_{b153}$ | $L_{b153}$ |
| 1879 | $L_{a4\text{-}8}$ | $L_{b153}$ | $L_{b153}$ |
| 1880 | $L_{a4\text{-}10}$ | $L_{b153}$ | $L_{b153}$ |
| 1881 | $L_{a4\text{-}14}$ | $L_{b153}$ | $L_{b153}$ |
| 1882 | $L_{a4\text{-}16}$ | $L_{b153}$ | $L_{b153}$ |
| 1883 | $L_{a4\text{-}20}$ | $L_{b153}$ | $L_{b153}$ |
| 1884 | $L_{a4\text{-}22}$ | $L_{b153}$ | $L_{b153}$ |
| 1885 | $L_{a4\text{-}26}$ | $L_{b153}$ | $L_{b153}$ |
| 1886 | $L_{a4\text{-}28}$ | $L_{b153}$ | $L_{b153}$ |
| 1887 | $L_{a1\text{-}58}$ | $L_{b164}$ | $L_{b164}$ |
| 1888 | $L_{a1\text{-}88}$ | $L_{b164}$ | $L_{b164}$ |
| 1889 | $L_{a1\text{-}133}$ | $L_{b164}$ | $L_{b164}$ |
| 1890 | $L_{a1\text{-}146}$ | $L_{b164}$ | $L_{b164}$ |
| 1891 | $L_{a1\text{-}157}$ | $L_{b164}$ | $L_{b164}$ |
| 1892 | $L_{a1\text{-}158}$ | $L_{b164}$ | $L_{b164}$ |
| 1893 | $L_{a1\text{-}164}$ | $L_{b164}$ | $L_{b164}$ |
| 1894 | $L_{a1\text{-}170}$ | $L_{b164}$ | $L_{b164}$ |
| 1895 | $L_{a1\text{-}176}$ | $L_{b164}$ | $L_{b164}$ |
| 1897 | $L_{a1\text{-}224}$ | $L_{b164}$ | $L_{b164}$ |
| 1898 | $L_{a1\text{-}258}$ | $L_{b164}$ | $L_{b164}$ |
| 1899 | $L_{a1\text{-}308}$ | $L_{b164}$ | $L_{b164}$ |
| 1900 | $L_{a1\text{-}321}$ | $L_{b164}$ | $L_{b164}$ |
| 1901 | $L_{a1\text{-}333}$ | $L_{b164}$ | $L_{b164}$ |
| 1902 | $L_{a1\text{-}339}$ | $L_{b164}$ | $L_{b164}$ |
| 1903 | $L_{a1\text{-}345}$ | $L_{b164}$ | $L_{b164}$ |
| 1905 | $L_{a1\text{-}400}$ | $L_{b164}$ | $L_{b164}$ |
| 1906 | $L_{a1\text{-}418}$ | $L_{b164}$ | $L_{b164}$ |
| 1907 | $L_{a1\text{-}419}$ | $L_{b164}$ | $L_{b164}$ |
| 1908 | $L_{a1\text{-}440}$ | $L_{b164}$ | $L_{b164}$ |
| 1909 | $L_{a1\text{-}441}$ | $L_{b164}$ | $L_{b164}$ |
| 1910 | $L_{a1\text{-}446}$ | $L_{b164}$ | $L_{b164}$ |
| 1911 | $L_{a2\text{-}58}$ | $L_{b164}$ | $L_{b164}$ |
| 1912 | $L_{a2\text{-}88}$ | $L_{b164}$ | $L_{b164}$ |
| 1913 | $L_{a2\text{-}133}$ | $L_{b164}$ | $L_{b164}$ |
| 1914 | $L_{a2\text{-}146}$ | $L_{b164}$ | $L_{b164}$ |
| 1915 | $L_{a2\text{-}157}$ | $L_{b164}$ | $L_{b164}$ |

-continued

| Metal Complex | $L_a$ | $L_b$ | $L_b$ |
|---|---|---|---|
| 1916 | $L_{a2\text{-}158}$ | $L_{b164}$ | $L_{b164}$ |
| 1917 | $L_{a2\text{-}164}$ | $L_{b164}$ | $L_{b164}$ |
| 1918 | $L_{a2\text{-}170}$ | $L_{b164}$ | $L_{b164}$ |
| 1919 | $L_{a2\text{-}176}$ | $L_{b164}$ | $L_{b164}$ |
| 1921 | $L_{a2\text{-}224}$ | $L_{b164}$ | $L_{b164}$ |
| 1922 | $L_{a2\text{-}258}$ | $L_{b164}$ | $L_{b164}$ |
| 1923 | $L_{a2\text{-}308}$ | $L_{b164}$ | $L_{b164}$ |
| 1924 | $L_{a2\text{-}321}$ | $L_{b164}$ | $L_{b164}$ |
| 1925 | $L_{a2\text{-}333}$ | $L_{b164}$ | $L_{b164}$ |
| 1926 | $L_{a2\text{-}339}$ | $L_{b164}$ | $L_{b164}$ |
| 1927 | $L_{a2\text{-}345}$ | $L_{b164}$ | $L_{b164}$ |
| 1929 | $L_{a2\text{-}400}$ | $L_{b164}$ | $L_{b164}$ |
| 1930 | $L_{a2\text{-}418}$ | $L_{b164}$ | $L_{b164}$ |
| 1931 | $L_{a2\text{-}419}$ | $L_{b164}$ | $L_{b164}$ |
| 1932 | $L_{a2\text{-}440}$ | $L_{b164}$ | $L_{b164}$ |
| 1933 | $L_{a2\text{-}441}$ | $L_{b164}$ | $L_{b164}$ |
| 1934 | $L_{a2\text{-}446}$ | $L_{b164}$ | $L_{b164}$ |
| 1935 | $L_{a3\text{-}58}$ | $L_{b164}$ | $L_{b164}$ |
| 1936 | $L_{a3\text{-}88}$ | $L_{b164}$ | $L_{b164}$ |
| 1937 | $L_{a3\text{-}133}$ | $L_{b164}$ | $L_{b164}$ |
| 1938 | $L_{a3\text{-}146}$ | $L_{b164}$ | $L_{b164}$ |
| 1939 | $L_{a3\text{-}157}$ | $L_{b164}$ | $L_{b164}$ |
| 1940 | $L_{a3\text{-}158}$ | $L_{b164}$ | $L_{b164}$ |
| 1941 | $L_{a3\text{-}164}$ | $L_{b164}$ | $L_{b164}$ |
| 1942 | $L_{a3\text{-}170}$ | $L_{b164}$ | $L_{b164}$ |
| 1943 | $L_{a3\text{-}176}$ | $L_{b164}$ | $L_{b164}$ |
| 1945 | $L_{a3\text{-}224}$ | $L_{b164}$ | $L_{b164}$ |
| 1946 | $L_{a3\text{-}258}$ | $L_{b164}$ | $L_{b164}$ |
| 1947 | $L_{a3\text{-}308}$ | $L_{b164}$ | $L_{b164}$ |
| 1948 | $L_{a3\text{-}321}$ | $L_{b164}$ | $L_{b164}$ |
| 1949 | $L_{a3\text{-}333}$ | $L_{b164}$ | $L_{b164}$ |
| 1950 | $L_{a3\text{-}339}$ | $L_{b164}$ | $L_{b164}$ |
| 1951 | $L_{a3\text{-}345}$ | $L_{b164}$ | $L_{b164}$ |
| 1953 | $L_{a3\text{-}400}$ | $L_{b164}$ | $L_{b164}$ |
| 1954 | $L_{a3\text{-}418}$ | $L_{b164}$ | $L_{b164}$ |
| 1955 | $L_{a3\text{-}419}$ | $L_{b164}$ | $L_{b164}$ |
| 1956 | $L_{a3\text{-}440}$ | $L_{b164}$ | $L_{b164}$ |
| 1957 | $L_{a3\text{-}441}$ | $L_{b164}$ | $L_{b164}$ |
| 1958 | $L_{a3\text{-}446}$ | $L_{b164}$ | $L_{b164}$ |
| 1959 | $L_{a4\text{-}2}$ | $L_{b164}$ | $L_{b164}$ |
| 1960 | $L_{a4\text{-}4}$ | $L_{b164}$ | $L_{b164}$ |
| 1961 | $L_{a4\text{-}8}$ | $L_{b164}$ | $L_{b164}$ |
| 1962 | $L_{a4\text{-}10}$ | $L_{b164}$ | $L_{b164}$ |
| 1963 | $L_{a4\text{-}14}$ | $L_{b164}$ | $L_{b164}$ |
| 1964 | $L_{a4\text{-}16}$ | $L_{b164}$ | $L_{b164}$ |
| 1965 | $L_{a4\text{-}20}$ | $L_{b164}$ | $L_{b164}$ |
| 1966 | $L_{a4\text{-}22}$ | $L_{b164}$ | $L_{b164}$ |
| 1967 | $L_{a4\text{-}26}$ | $L_{b164}$ | $L_{b164}$ |
| 1968 | $L_{a4\text{-}28}$ | $L_{b164}$ | $L_{b164}$ |
| 1969 | $L_{a1\text{-}58}$ | $L_{b166}$ | $L_{b166}$ |
| 1970 | $L_{a1\text{-}88}$ | $L_{b166}$ | $L_{b166}$ |
| 1971 | $L_{a1\text{-}133}$ | $L_{b166}$ | $L_{b166}$ |
| 1972 | $L_{a1\text{-}146}$ | $L_{b166}$ | $L_{b166}$ |
| 1973 | $L_{a1\text{-}157}$ | $L_{b166}$ | $L_{b166}$ |
| 1974 | $L_{a1\text{-}158}$ | $L_{b166}$ | $L_{b166}$ |
| 1975 | $L_{a1\text{-}164}$ | $L_{b166}$ | $L_{b166}$ |
| 1976 | $L_{a1\text{-}170}$ | $L_{b166}$ | $L_{b166}$ |
| 1977 | $L_{a1\text{-}176}$ | $L_{b166}$ | $L_{b166}$ |
| 1979 | $L_{a1\text{-}224}$ | $L_{b166}$ | $L_{b166}$ |
| 1980 | $L_{a1\text{-}258}$ | $L_{b166}$ | $L_{b166}$ |
| 1981 | $L_{a1\text{-}308}$ | $L_{b166}$ | $L_{b166}$ |
| 1982 | $L_{a1\text{-}321}$ | $L_{b166}$ | $L_{b166}$ |
| 1983 | $L_{a1\text{-}333}$ | $L_{b166}$ | $L_{b166}$ |
| 1984 | $L_{a1\text{-}339}$ | $L_{b166}$ | $L_{b166}$ |
| 1985 | $L_{a1\text{-}345}$ | $L_{b166}$ | $L_{b166}$ |
| 1987 | $L_{a1\text{-}400}$ | $L_{b166}$ | $L_{b166}$ |
| 1988 | $L_{a1\text{-}418}$ | $L_{b166}$ | $L_{b166}$ |
| 1989 | $L_{a1\text{-}419}$ | $L_{b166}$ | $L_{b166}$ |
| 1990 | $L_{a1\text{-}440}$ | $L_{b166}$ | $L_{b166}$ |
| 1991 | $L_{a1\text{-}441}$ | $L_{b166}$ | $L_{b166}$ |
| 1992 | $L_{a1\text{-}446}$ | $L_{b166}$ | $L_{b166}$ |
| 1993 | $L_{a2\text{-}58}$ | $L_{b166}$ | $L_{b166}$ |
| 1994 | $L_{a2\text{-}88}$ | $L_{b166}$ | $L_{b166}$ |
| 1995 | $L_{a2\text{-}133}$ | $L_{b166}$ | $L_{b166}$ |
| 1996 | $L_{a2\text{-}146}$ | $L_{b166}$ | $L_{b166}$ |
| 1997 | $L_{a2\text{-}157}$ | $L_{b166}$ | $L_{b166}$ |

-continued

| Metal Complex | $L_a$ | $L_b$ | $L_b$ |
|---|---|---|---|
| 1998 | $L_{a2\text{-}158}$ | $L_{b166}$ | $L_{b166}$ |
| 1999 | $L_{a2\text{-}164}$ | $L_{b166}$ | $L_{b166}$ |
| 2000 | $L_{a2\text{-}170}$ | $L_{b166}$ | $L_{b166}$ |
| 2001 | $L_{a2\text{-}176}$ | $L_{b166}$ | $L_{b166}$ |
| 2003 | $L_{a2\text{-}224}$ | $L_{b166}$ | $L_{b166}$ |
| 2004 | $L_{a2\text{-}258}$ | $L_{b166}$ | $L_{b166}$ |
| 2005 | $L_{a2\text{-}308}$ | $L_{b166}$ | $L_{b166}$ |
| 2006 | $L_{a2\text{-}321}$ | $L_{b166}$ | $L_{b166}$ |
| 2007 | $L_{a2\text{-}333}$ | $L_{b166}$ | $L_{b166}$ |
| 2008 | $L_{a2\text{-}339}$ | $L_{b166}$ | $L_{b166}$ |
| 2009 | $L_{a2\text{-}345}$ | $L_{b166}$ | $L_{b166}$ |
| 2011 | $L_{a2\text{-}400}$ | $L_{b166}$ | $L_{b166}$ |
| 2012 | $L_{a2\text{-}418}$ | $L_{b166}$ | $L_{b166}$ |
| 2013 | $L_{a2\text{-}419}$ | $L_{b166}$ | $L_{b166}$ |
| 2014 | $L_{a2\text{-}440}$ | $L_{b166}$ | $L_{b166}$ |
| 2015 | $L_{a2\text{-}441}$ | $L_{b166}$ | $L_{b166}$ |
| 2016 | $L_{a2\text{-}446}$ | $L_{b166}$ | $L_{b166}$ |
| 2017 | $L_{a3\text{-}58}$ | $L_{b166}$ | $L_{b166}$ |
| 2018 | $L_{a3\text{-}88}$ | $L_{b166}$ | $L_{b166}$ |
| 2019 | $L_{a3\text{-}133}$ | $L_{b166}$ | $L_{b166}$ |
| 2020 | $L_{a3\text{-}146}$ | $L_{b166}$ | $L_{b166}$ |
| 2021 | $L_{a3\text{-}157}$ | $L_{b166}$ | $L_{b166}$ |
| 2022 | $L_{a3\text{-}158}$ | $L_{b166}$ | $L_{b166}$ |
| 2023 | $L_{a3\text{-}164}$ | $L_{b166}$ | $L_{b166}$ |
| 2024 | $L_{a3\text{-}170}$ | $L_{b166}$ | $L_{b166}$ |
| 2025 | $L_{a3\text{-}176}$ | $L_{b166}$ | $L_{b166}$ |
| 2027 | $L_{a3\text{-}224}$ | $L_{b166}$ | $L_{b166}$ |
| 2028 | $L_{a3\text{-}258}$ | $L_{b166}$ | $L_{b166}$ |
| 2029 | $L_{a3\text{-}308}$ | $L_{b166}$ | $L_{b166}$ |
| 2030 | $L_{a3\text{-}321}$ | $L_{b166}$ | $L_{b166}$ |
| 2031 | $L_{a3\text{-}333}$ | $L_{b166}$ | $L_{b166}$ |
| 2032 | $L_{a3\text{-}339}$ | $L_{b166}$ | $L_{b166}$ |
| 2033 | $L_{a3\text{-}345}$ | $L_{b166}$ | $L_{b166}$ |
| 2035 | $L_{a3\text{-}400}$ | $L_{b166}$ | $L_{b166}$ |
| 2036 | $L_{a3\text{-}418}$ | $L_{b166}$ | $L_{b166}$ |
| 2037 | $L_{a3\text{-}419}$ | $L_{b166}$ | $L_{b166}$ |
| 2038 | $L_{a3\text{-}440}$ | $L_{b166}$ | $L_{b166}$ |
| 2039 | $L_{a3\text{-}441}$ | $L_{b166}$ | $L_{b166}$ |
| 2040 | $L_{a3\text{-}446}$ | $L_{b166}$ | $L_{b166}$ |
| 2041 | $L_{a4\text{-}2}$ | $L_{b166}$ | $L_{b166}$ |
| 2042 | $L_{a4\text{-}4}$ | $L_{b166}$ | $L_{b166}$ |
| 2043 | $L_{a4\text{-}8}$ | $L_{b166}$ | $L_{b166}$ |
| 2044 | $L_{a4\text{-}10}$ | $L_{b166}$ | $L_{b166}$ |
| 2045 | $L_{a4\text{-}14}$ | $L_{b166}$ | $L_{b166}$ |
| 2046 | $L_{a4\text{-}16}$ | $L_{b166}$ | $L_{b166}$ |
| 2047 | $L_{a4\text{-}20}$ | $L_{b166}$ | $L_{b166}$ |
| 2048 | $L_{a4\text{-}22}$ | $L_{b166}$ | $L_{b166}$ |
| 2049 | $L_{a4\text{-}26}$ | $L_{b166}$ | $L_{b166}$ |
| 2050 | $L_{a4\text{-}28}$ | $L_{b166}$ | $L_{b166}$ |
| 2051 | $L_{a1\text{-}58}$ | $L_{b209}$ | $L_{b209}$ |
| 2052 | $L_{a1\text{-}88}$ | $L_{b209}$ | $L_{b209}$ |
| 2053 | $L_{a1\text{-}133}$ | $L_{b209}$ | $L_{b209}$ |
| 2054 | $L_{a1\text{-}146}$ | $L_{b209}$ | $L_{b209}$ |
| 2055 | $L_{a1\text{-}157}$ | $L_{b209}$ | $L_{b209}$ |
| 2056 | $L_{a1\text{-}158}$ | $L_{b209}$ | $L_{b209}$ |
| 2057 | $L_{a1\text{-}164}$ | $L_{b209}$ | $L_{b209}$ |
| 2058 | $L_{a1\text{-}170}$ | $L_{b209}$ | $L_{b209}$ |
| 2059 | $L_{a1\text{-}176}$ | $L_{b209}$ | $L_{b209}$ |
| 2061 | $L_{a1\text{-}224}$ | $L_{b209}$ | $L_{b209}$ |
| 2062 | $L_{a1\text{-}258}$ | $L_{b209}$ | $L_{b209}$ |
| 2063 | $L_{a1\text{-}308}$ | $L_{b209}$ | $L_{b209}$ |
| 2064 | $L_{a1\text{-}321}$ | $L_{b209}$ | $L_{b209}$ |
| 2065 | $L_{a1\text{-}333}$ | $L_{b209}$ | $L_{b209}$ |
| 2066 | $L_{a1\text{-}339}$ | $L_{b209}$ | $L_{b209}$ |
| 2067 | $L_{a1\text{-}345}$ | $L_{b209}$ | $L_{b209}$ |
| 2069 | $L_{a1\text{-}400}$ | $L_{b209}$ | $L_{b209}$ |
| 2070 | $L_{a1\text{-}418}$ | $L_{b209}$ | $L_{b209}$ |
| 2071 | $L_{a1\text{-}419}$ | $L_{b209}$ | $L_{b209}$ |
| 2072 | $L_{a1\text{-}440}$ | $L_{b209}$ | $L_{b209}$ |
| 2073 | $L_{a1\text{-}441}$ | $L_{b209}$ | $L_{b209}$ |
| 2074 | $L_{a1\text{-}446}$ | $L_{b209}$ | $L_{b209}$ |
| 2075 | $L_{a2\text{-}58}$ | $L_{b209}$ | $L_{b209}$ |
| 2076 | $L_{a2\text{-}88}$ | $L_{b209}$ | $L_{b209}$ |
| 2077 | $L_{a2\text{-}133}$ | $L_{b209}$ | $L_{b209}$ |
| 2078 | $L_{a2\text{-}146}$ | $L_{b209}$ | $L_{b209}$ |
| 2079 | $L_{a2\text{-}157}$ | $L_{b209}$ | $L_{b209}$ |

-continued

| Metal Complex | $L_a$ | $L_b$ | $L_b$ |
|---|---|---|---|
| 2080 | $L_{a2-158}$ | $L_{b209}$ | $L_{b209}$ |
| 2081 | $L_{a2-164}$ | $L_{b209}$ | $L_{b209}$ |
| 2082 | $L_{a2-170}$ | $L_{b209}$ | $L_{b209}$ |
| 2083 | $L_{a2-176}$ | $L_{b209}$ | $L_{b209}$ |
| 2085 | $L_{a2-224}$ | $L_{b209}$ | $L_{b209}$ |
| 2086 | $L_{a2-258}$ | $L_{b209}$ | $L_{b209}$ |
| 2087 | $L_{a2-308}$ | $L_{b209}$ | $L_{b209}$ |
| 2088 | $L_{a2-321}$ | $L_{b209}$ | $L_{b209}$ |
| 2089 | $L_{a2-333}$ | $L_{b209}$ | $L_{b209}$ |
| 2090 | $L_{a2-339}$ | $L_{b209}$ | $L_{b209}$ |
| 2091 | $L_{a2-345}$ | $L_{b209}$ | $L_{b209}$ |
| 2093 | $L_{a2-400}$ | $L_{b209}$ | $L_{b209}$ |
| 2094 | $L_{a2-418}$ | $L_{b209}$ | $L_{b209}$ |
| 2095 | $L_{a2-419}$ | $L_{b209}$ | $L_{b209}$ |
| 2096 | $L_{a2-440}$ | $L_{b209}$ | $L_{b209}$ |
| 2097 | $L_{a2-441}$ | $L_{b209}$ | $L_{b209}$ |
| 2098 | $L_{a2-446}$ | $L_{b209}$ | $L_{b209}$ |
| 2099 | $L_{a3-58}$ | $L_{b209}$ | $L_{b209}$ |
| 2100 | $L_{a3-88}$ | $L_{b209}$ | $L_{b209}$ |
| 2101 | $L_{a3-133}$ | $L_{b209}$ | $L_{b209}$ |
| 2102 | $L_{a3-146}$ | $L_{b209}$ | $L_{b209}$ |
| 2103 | $L_{a3-157}$ | $L_{b209}$ | $L_{b209}$ |
| 2104 | $L_{a3-158}$ | $L_{b209}$ | $L_{b209}$ |
| 2105 | $L_{a3-164}$ | $L_{b209}$ | $L_{b209}$ |
| 2106 | $L_{a3-170}$ | $L_{b209}$ | $L_{b209}$ |
| 2107 | $L_{a3-176}$ | $L_{b209}$ | $L_{b209}$ |
| 2109 | $L_{a3-224}$ | $L_{b209}$ | $L_{b209}$ |
| 2110 | $L_{a3-258}$ | $L_{b209}$ | $L_{b209}$ |
| 2111 | $L_{a3-308}$ | $L_{b209}$ | $L_{b209}$ |
| 2112 | $L_{a3-321}$ | $L_{b209}$ | $L_{b209}$ |
| 2113 | $L_{a3-333}$ | $L_{b209}$ | $L_{b209}$ |
| 2114 | $L_{a3-339}$ | $L_{b209}$ | $L_{b209}$ |
| 2115 | $L_{a3-345}$ | $L_{b209}$ | $L_{b209}$ |
| 2117 | $L_{a3-400}$ | $L_{b209}$ | $L_{b209}$ |
| 2118 | $L_{a3-418}$ | $L_{b209}$ | $L_{b209}$ |
| 2119 | $L_{a3-419}$ | $L_{b209}$ | $L_{b209}$ |
| 2120 | $L_{a3-440}$ | $L_{b209}$ | $L_{b209}$ |
| 2121 | $L_{a3-441}$ | $L_{b209}$ | $L_{b209}$ |
| 2122 | $L_{a3-446}$ | $L_{b209}$ | $L_{b209}$ |
| 2123 | $L_{a4-2}$ | $L_{b209}$ | $L_{b209}$ |
| 2124 | $L_{a4-4}$ | $L_{b209}$ | $L_{b209}$ |
| 2125 | $L_{a4-8}$ | $L_{b209}$ | $L_{b209}$ |
| 2126 | $L_{a4-10}$ | $L_{b209}$ | $L_{b209}$ |
| 2127 | $L_{a4-14}$ | $L_{b209}$ | $L_{b209}$ |
| 2128 | $L_{a4-16}$ | $L_{b209}$ | $L_{b209}$ |
| 2129 | $L_{a4-20}$ | $L_{b209}$ | $L_{b209}$ |
| 2130 | $L_{a4-22}$ | $L_{b209}$ | $L_{b209}$ |
| 2131 | $L_{a4-26}$ | $L_{b209}$ | $L_{b209}$ |
| 2132 | $L_{a4-28}$ | $L_{b209}$ | $L_{b209}$ |
| 2133 | $L_{a1-58}$ | $L_{b287}$ | $L_{b287}$ |
| 2134 | $L_{a1-88}$ | $L_{b287}$ | $L_{b287}$ |
| 2135 | $L_{a1-133}$ | $L_{b287}$ | $L_{b287}$ |
| 2136 | $L_{a1-146}$ | $L_{b287}$ | $L_{b287}$ |
| 2137 | $L_{a1-157}$ | $L_{b287}$ | $L_{b287}$ |
| 2138 | $L_{a1-158}$ | $L_{b287}$ | $L_{b287}$ |
| 2139 | $L_{a1-164}$ | $L_{b287}$ | $L_{b287}$ |
| 2140 | $L_{a1-170}$ | $L_{b287}$ | $L_{b287}$ |
| 2141 | $L_{a1-176}$ | $L_{b287}$ | $L_{b287}$ |
| 2143 | $L_{a1-224}$ | $L_{b287}$ | $L_{b287}$ |
| 2144 | $L_{a1-258}$ | $L_{b287}$ | $L_{b287}$ |
| 2145 | $L_{a1-308}$ | $L_{b287}$ | $L_{b287}$ |
| 2146 | $L_{a1-321}$ | $L_{b287}$ | $L_{b287}$ |
| 2147 | $L_{a1-333}$ | $L_{b287}$ | $L_{b287}$ |
| 2148 | $L_{a1-339}$ | $L_{b287}$ | $L_{b287}$ |
| 2149 | $L_{a1-345}$ | $L_{b287}$ | $L_{b287}$ |
| 2151 | $L_{a1-400}$ | $L_{b287}$ | $L_{b287}$ |
| 2152 | $L_{a1-418}$ | $L_{b287}$ | $L_{b287}$ |
| 2153 | $L_{a1-419}$ | $L_{b287}$ | $L_{b287}$ |
| 2154 | $L_{a1-440}$ | $L_{b287}$ | $L_{b287}$ |
| 2155 | $L_{a1-441}$ | $L_{b287}$ | $L_{b287}$ |
| 2156 | $L_{a1-446}$ | $L_{b287}$ | $L_{b287}$ |
| 2157 | $L_{a2-58}$ | $L_{b287}$ | $L_{b287}$ |
| 2158 | $L_{a2-88}$ | $L_{b287}$ | $L_{b287}$ |
| 2159 | $L_{a2-133}$ | $L_{b287}$ | $L_{b287}$ |
| 2160 | $L_{a2-146}$ | $L_{b287}$ | $L_{b287}$ |
| 2161 | $L_{a2-157}$ | $L_{b287}$ | $L_{b287}$ |

-continued

| Metal Complex | $L_a$ | $L_b$ | $L_b$ |
|---|---|---|---|
| 2162 | $L_{a2-158}$ | $L_{b287}$ | $L_{b287}$ |
| 2163 | $L_{a2-164}$ | $L_{b287}$ | $L_{b287}$ |
| 2164 | $L_{a2-170}$ | $L_{b287}$ | $L_{b287}$ |
| 2165 | $L_{a2-176}$ | $L_{b287}$ | $L_{b287}$ |
| 2167 | $L_{a2-224}$ | $L_{b287}$ | $L_{b287}$ |
| 2168 | $L_{a2-258}$ | $L_{b287}$ | $L_{b287}$ |
| 2169 | $L_{a2-308}$ | $L_{b287}$ | $L_{b287}$ |
| 2170 | $L_{a2-321}$ | $L_{b287}$ | $L_{b287}$ |
| 2171 | $L_{a2-333}$ | $L_{b287}$ | $L_{b287}$ |
| 2172 | $L_{a2-339}$ | $L_{b287}$ | $L_{b287}$ |
| 2173 | $L_{a2-345}$ | $L_{b287}$ | $L_{b287}$ |
| 2175 | $L_{a2-400}$ | $L_{b287}$ | $L_{b287}$ |
| 2176 | $L_{a2-418}$ | $L_{b287}$ | $L_{b287}$ |
| 2177 | $L_{a2-419}$ | $L_{b287}$ | $L_{b287}$ |
| 2178 | $L_{a2-440}$ | $L_{b287}$ | $L_{b287}$ |
| 2179 | $L_{a2-441}$ | $L_{b287}$ | $L_{b287}$ |
| 2180 | $L_{a2-446}$ | $L_{b287}$ | $L_{b287}$ |
| 2181 | $L_{a3-58}$ | $L_{b287}$ | $L_{b287}$ |
| 2182 | $L_{a3-88}$ | $L_{b287}$ | $L_{b287}$ |
| 2183 | $L_{a3-133}$ | $L_{b287}$ | $L_{b287}$ |
| 2184 | $L_{a3-146}$ | $L_{b287}$ | $L_{b287}$ |
| 2185 | $L_{a3-157}$ | $L_{b287}$ | $L_{b287}$ |
| 2186 | $L_{a3-158}$ | $L_{b287}$ | $L_{b287}$ |
| 2187 | $L_{a3-164}$ | $L_{b287}$ | $L_{b287}$ |
| 2188 | $L_{a3-170}$ | $L_{b287}$ | $L_{b287}$ |
| 2189 | $L_{a3-176}$ | $L_{b287}$ | $L_{b287}$ |
| 2191 | $L_{a3-224}$ | $L_{b287}$ | $L_{b287}$ |
| 2192 | $L_{a3-258}$ | $L_{b287}$ | $L_{b287}$ |
| 2193 | $L_{a3-308}$ | $L_{b287}$ | $L_{b287}$ |
| 2194 | $L_{a3-321}$ | $L_{b287}$ | $L_{b287}$ |
| 2195 | $L_{a3-333}$ | $L_{b287}$ | $L_{b287}$ |
| 2196 | $L_{a3-339}$ | $L_{b287}$ | $L_{b287}$ |
| 2197 | $L_{a3-345}$ | $L_{b287}$ | $L_{b287}$ |
| 2199 | $L_{a3-400}$ | $L_{b287}$ | $L_{b287}$ |
| 2200 | $L_{a3-418}$ | $L_{b287}$ | $L_{b287}$ |
| 2201 | $L_{a3-419}$ | $L_{b287}$ | $L_{b287}$ |
| 2202 | $L_{a3-440}$ | $L_{b287}$ | $L_{b287}$ |
| 2203 | $L_{a3-441}$ | $L_{b287}$ | $L_{b287}$ |
| 2204 | $L_{a3-446}$ | $L_{b287}$ | $L_{b287}$ |
| 2205 | $L_{a4-2}$ | $L_{b287}$ | $L_{b287}$ |
| 2206 | $L_{a4-4}$ | $L_{b287}$ | $L_{b287}$ |
| 2207 | $L_{a4-8}$ | $L_{b287}$ | $L_{b287}$ |
| 2208 | $L_{a4-10}$ | $L_{b287}$ | $L_{b287}$ |
| 2209 | $L_{a4-14}$ | $L_{b287}$ | $L_{b287}$ |
| 2210 | $L_{a4-16}$ | $L_{b287}$ | $L_{b287}$ |
| 2211 | $L_{a4-20}$ | $L_{b287}$ | $L_{b287}$ |
| 2212 | $L_{a4-22}$ | $L_{b287}$ | $L_{b287}$ |
| 2213 | $L_{a4-26}$ | $L_{b287}$ | $L_{b287}$ |
| 2214 | $L_{a4-28}$ | $L_{b287}$ | $L_{b287}$ |
| 2215 | $L_{a1-58}$ | $L_{b289}$ | $L_{b289}$ |
| 2216 | $L_{a1-88}$ | $L_{b289}$ | $L_{b289}$ |
| 2217 | $L_{a1-133}$ | $L_{b289}$ | $L_{b289}$ |
| 2218 | $L_{a1-146}$ | $L_{b289}$ | $L_{b289}$ |
| 2219 | $L_{a1-157}$ | $L_{b289}$ | $L_{b289}$ |
| 2220 | $L_{a1-158}$ | $L_{b289}$ | $L_{b289}$ |
| 2221 | $L_{a1-164}$ | $L_{b289}$ | $L_{b289}$ |
| 2222 | $L_{a1-170}$ | $L_{b289}$ | $L_{b289}$ |
| 2223 | $L_{a1-176}$ | $L_{b289}$ | $L_{b289}$ |
| 2225 | $L_{a1-224}$ | $L_{b289}$ | $L_{b289}$ |
| 2226 | $L_{a1-258}$ | $L_{b289}$ | $L_{b289}$ |
| 2227 | $L_{a1-308}$ | $L_{b289}$ | $L_{b289}$ |
| 2228 | $L_{a1-321}$ | $L_{b289}$ | $L_{b289}$ |
| 2229 | $L_{a1-333}$ | $L_{b289}$ | $L_{b289}$ |
| 2230 | $L_{a1-339}$ | $L_{b289}$ | $L_{b289}$ |
| 2231 | $L_{a1-345}$ | $L_{b289}$ | $L_{b289}$ |
| 2233 | $L_{a1-400}$ | $L_{b289}$ | $L_{b289}$ |
| 2234 | $L_{a1-418}$ | $L_{b289}$ | $L_{b289}$ |
| 2235 | $L_{a1-419}$ | $L_{b289}$ | $L_{b289}$ |
| 2236 | $L_{a1-440}$ | $L_{b289}$ | $L_{b289}$ |
| 2237 | $L_{a1-441}$ | $L_{b289}$ | $L_{b289}$ |
| 2238 | $L_{a1-446}$ | $L_{b289}$ | $L_{b289}$ |
| 2239 | $L_{a2-58}$ | $L_{b289}$ | $L_{b289}$ |
| 2240 | $L_{a2-88}$ | $L_{b289}$ | $L_{b289}$ |
| 2241 | $L_{a2-133}$ | $L_{b289}$ | $L_{b289}$ |
| 2242 | $L_{a2-146}$ | $L_{b289}$ | $L_{b289}$ |
| 2243 | $L_{a2-157}$ | $L_{b289}$ | $L_{b289}$ |

-continued

| Metal Complex | $L_a$ | $L_b$ | $L_b$ |
|---|---|---|---|
| 2244 | $L_{a2-158}$ | $L_{b289}$ | $L_{b289}$ |
| 2245 | $L_{a2-164}$ | $L_{b289}$ | $L_{b289}$ |
| 2246 | $L_{a2-170}$ | $L_{b289}$ | $L_{b289}$ |
| 2247 | $L_{a2-176}$ | $L_{b289}$ | $L_{b289}$ |
| 2249 | $L_{a2-224}$ | $L_{b289}$ | $L_{b289}$ |
| 2250 | $L_{a2-258}$ | $L_{b289}$ | $L_{b289}$ |
| 2251 | $L_{a2-308}$ | $L_{b289}$ | $L_{b289}$ |
| 2252 | $L_{a2-321}$ | $L_{b289}$ | $L_{b289}$ |
| 2253 | $L_{a2-333}$ | $L_{b289}$ | $L_{b289}$ |
| 2254 | $L_{a2-339}$ | $L_{b289}$ | $L_{b289}$ |
| 2255 | $L_{a2-345}$ | $L_{b289}$ | $L_{b289}$ |
| 2257 | $L_{a2-400}$ | $L_{b289}$ | $L_{b289}$ |
| 2258 | $L_{a2-418}$ | $L_{b289}$ | $L_{b289}$ |
| 2259 | $L_{a2-419}$ | $L_{b289}$ | $L_{b289}$ |
| 2260 | $L_{a2-440}$ | $L_{b289}$ | $L_{b289}$ |
| 2261 | $L_{a2-441}$ | $L_{b289}$ | $L_{b289}$ |
| 2262 | $L_{a2-446}$ | $L_{b289}$ | $L_{b289}$ |
| 2263 | $L_{a3-58}$ | $L_{b289}$ | $L_{b289}$ |
| 2264 | $L_{a3-88}$ | $L_{b289}$ | $L_{b289}$ |
| 2265 | $L_{a3-133}$ | $L_{b289}$ | $L_{b289}$ |
| 2266 | $L_{a3-146}$ | $L_{b289}$ | $L_{b289}$ |
| 2267 | $L_{a3-157}$ | $L_{b289}$ | $L_{b289}$ |
| 2268 | $L_{a3-158}$ | $L_{b289}$ | $L_{b289}$ |
| 2269 | $L_{a3-164}$ | $L_{b289}$ | $L_{b289}$ |
| 2270 | $L_{a3-170}$ | $L_{b289}$ | $L_{b289}$ |
| 2271 | $L_{a3-176}$ | $L_{b289}$ | $L_{b289}$ |
| 2273 | $L_{a3-224}$ | $L_{b289}$ | $L_{b289}$ |
| 2274 | $L_{a3-258}$ | $L_{b289}$ | $L_{b289}$ |
| 2275 | $L_{a3-308}$ | $L_{b289}$ | $L_{b289}$ |
| 2276 | $L_{a3-321}$ | $L_{b289}$ | $L_{b289}$ |
| 2277 | $L_{a3-333}$ | $L_{b289}$ | $L_{b289}$ |
| 2278 | $L_{a3-339}$ | $L_{b289}$ | $L_{b289}$ |
| 2279 | $L_{a3-345}$ | $L_{b289}$ | $L_{b289}$ |
| 2281 | $L_{a3-400}$ | $L_{b289}$ | $L_{b289}$ |
| 2282 | $L_{a3-418}$ | $L_{b289}$ | $L_{b289}$ |
| 2283 | $L_{a3-419}$ | $L_{b289}$ | $L_{b289}$ |
| 2284 | $L_{a3-440}$ | $L_{b289}$ | $L_{b289}$ |
| 2285 | $L_{a3-441}$ | $L_{b289}$ | $L_{b289}$ |
| 2286 | $L_{a3-446}$ | $L_{b289}$ | $L_{b289}$ |
| 2287 | $L_{a4-2}$ | $L_{b289}$ | $L_{b289}$ |
| 2288 | $L_{a4-4}$ | $L_{b289}$ | $L_{b289}$ |
| 2289 | $L_{a4-8}$ | $L_{b289}$ | $L_{b289}$ |
| 2290 | $L_{a4-10}$ | $L_{b289}$ | $L_{b289}$ |
| 2291 | $L_{a4-14}$ | $L_{b289}$ | $L_{b289}$ |
| 2292 | $L_{a4-16}$ | $L_{b289}$ | $L_{b289}$ |
| 2293 | $L_{a4-20}$ | $L_{b289}$ | $L_{b289}$ |
| 2294 | $L_{a4-22}$ | $L_{b289}$ | $L_{b289}$ |
| 2295 | $L_{a4-26}$ | $L_{b289}$ | $L_{b289}$ |
| 2296 | $L_{a4-28}$ | $L_{b289}$ | $L_{b289}$ |
| 2297 | $L_{a2-146}$ | $L_{b1}$ | $L_{ba3}$ |
| 2298 | $L_{a2-146}$ | $L_{b1}$ | $L_{b81}$ |
| 2299 | $L_{a2-146}$ | $L_{b3}$ | $L_{b12}$ |

-continued

| Metal Complex | $L_a$ | $L_b$ | $L_b$ |
|---|---|---|---|
| 2300 | $L_{a2-146}$ | $L_{b3}$ | $L_{b81}$ |
| 2301 | $L_{a2-158}$ | $L_{b1}$ | $L_{b3}$ |
| 2302 | $L_{a2-158}$ | $L_{b1}$ | $L_{b3}$ |
| 2303 | $L_{a2-158}$ | $L_{b3}$ | $L_{b12}$ |
| 2304 | $L_{a2-158}$ | $L_{b3}$ | $L_{b12}$ |
| 2305 | $L_{a2-164}$ | $L_{b1}$ | $L_{b3}$ |
| 2306 | $L_{a2-164}$ | $L_{b1}$ | $L_{b3}$ |
| 2307 | $L_{a2-164}$ | $L_{b3}$ | $L_{b12}$ |
| 2308 | $L_{a2-164}$ | $L_{b3}$ | $L_{b12}$ |
| 2309 | $L_{a2-176}$ | $L_{b1}$ | $L_{b3}$ |
| 2310 | $L_{a2-176}$ | $L_{b1}$ | $L_{b3}$ |
| 2311 | $L_{a2-176}$ | $L_{b3}$ | $L_{b12}$ |
| 2312 | $L_{a2-176}$ | $L_{b3}$ | $L_{b12}$ |
| 2313 | $L_{a2-321}$ | $L_{b1}$ | $L_{b3}$ |
| 2314 | $L_{a2-321}$ | $L_{b1}$ | $L_{b3}$ |
| 2315 | $L_{a2-321}$ | $L_{b3}$ | $L_{b12}$ |
| 2316 | $L_{a2-321}$ | $L_{b3}$ | $L_{b12}$ |
| 2317 | $L_{a2-345}$ | $L_{b1}$ | $L_{b3}$ |
| 2318 | $L_{a2-345}$ | $L_{b1}$ | $L_{b3}$ |
| 2319 | $L_{a2-345}$ | $L_{b3}$ | $L_{b12}$ |
| 2320 | $L_{a2-345}$ | $L_{b3}$ | $L_{b12}$ |
| 2321 | $L_{a3-146}$ | $L_{b1}$ | $L_{b3}$ |
| 2322 | $L_{a3-146}$ | $L_{b1}$ | $L_{b3}$ |
| 2323 | $L_{a3-146}$ | $L_{b3}$ | $L_{b12}$ |
| 2324 | $L_{a3-146}$ | $L_{b3}$ | $L_{b12}$ |
| 2325 | $L_{a3-158}$ | $L_{b1}$ | $L_{b3}$ |
| 2326 | $L_{a3-158}$ | $L_{b1}$ | $L_{b3}$ |
| 2327 | $L_{a3-158}$ | $L_{b3}$ | $L_{b12}$ |
| 2328 | $L_{a3-158}$ | $L_{b3}$ | $L_{b12}$ |
| 2329 | $L_{a3-164}$ | $L_{b1}$ | $L_{b3}$ |
| 2330 | $L_{a3-164}$ | $L_{b1}$ | $L_{b3}$ |
| 2331 | $L_{a3-164}$ | $L_{b3}$ | $L_{b12}$ |
| 2332 | $L_{a3-164}$ | $L_{b3}$ | $L_{b12}$ |
| 2333 | $L_{a3-176}$ | $L_{b1}$ | $L_{b3}$ |
| 2334 | $L_{a3-176}$ | $L_{b1}$ | $L_{b3}$ |
| 2335 | $L_{a3-176}$ | $L_{b3}$ | $L_{b12}$ |
| 2336 | $L_{a3-176}$ | $L_{b3}$ | $L_{b12}$ |
| 2337 | $L_{a3-321}$ | $L_{b1}$ | $L_{b3}$ |
| 2338 | $L_{a3-321}$ | $L_{b1}$ | $L_{b3}$ |
| 2339 | $L_{a3-321}$ | $L_{b3}$ | $L_{b12}$ |
| 2340 | $L_{a3-321}$ | $L_{b3}$ | $L_{b12}$ |
| 2341 | $L_{a3-345}$ | $L_{b1}$ | $L_{b3}$ |
| 2342 | $L_{a3-345}$ | $L_{b1}$ | $L_{b3}$ |
| 2343 | $L_{a3-345}$ | $L_{b3}$ | $L_{b12}$ |
| 2344 | $L_{a3-345}$ | $L_{b3}$ | $L_{b12}$; |

Metal Complex 2345 to Metal Complex 2384 each have a structure of $Ir(L_a)_2L_b$, wherein the two $L_a$ are the same or different, and the two $L_a$ and $L_b$ respectively correspond to the structures listed in the following table:

| Metal Complex | $L_a$ | $L_a$ | $L_b$ | Metal Complex | $L_a$ | $L_a$ | $L_b$ |
|---|---|---|---|---|---|---|---|
| 2345 | $L_{a1-146}$ | $L_{a1-146}$ | $L_{b3}$ | 2346 | $L_{a1-158}$ | $L_{a1-158}$ | $L_{b3}$ |
| 2347 | $L_{a1-164}$ | $L_{a1-164}$ | $L_{b3}$ | 2348 | $L_{a1-176}$ | $L_{a1-176}$ | $L_{b3}$ |
| 2349 | $L_{a1-321}$ | $L_{a1-321}$ | $L_{b3}$ | 2350 | $L_{a1-345}$ | $L_{a1-345}$ | $L_{b3}$ |
| 2351 | $L_{a1-146}$ | $L_{a1-146}$ | $L_{b81}$ | 2352 | $L_{a1-158}$ | $L_{a1-158}$ | $L_{b81}$ |
| 2353 | $L_{a1-164}$ | $L_{a1-164}$ | $L_{b81}$ | 2354 | $L_{a1-176}$ | $L_{a1-176}$ | $L_{b81}$ |
| 2355 | $L_{a1-321}$ | $L_{a1-321}$ | $L_{b81}$ | 2356 | $L_{a1-345}$ | $L_{a1-345}$ | $L_{b81}$ |
| 2357 | $L_{a2-146}$ | $L_{a2-146}$ | $L_{b3}$ | 2358 | $L_{a2-158}$ | $L_{a2-158}$ | $L_{b3}$ |
| 2359 | $L_{a2-164}$ | $L_{a2-164}$ | $L_{b3}$ | 2360 | $L_{a2-176}$ | $L_{a2-176}$ | $L_{b3}$ |
| 2361 | $L_{a2-321}$ | $L_{a2-321}$ | $L_{b3}$ | 2362 | $L_{a2-345}$ | $L_{a2-345}$ | $L_{b3}$ |
| 2363 | $L_{a2-146}$ | $L_{a2-146}$ | $L_{b81}$ | 2364 | $L_{a2-158}$ | $L_{a2-158}$ | $L_{b81}$ |
| 2365 | $L_{a2-164}$ | $L_{a2-164}$ | $L_{b81}$ | 2366 | $L_{a2-176}$ | $L_{a2-176}$ | $L_{b81}$ |
| 2367 | $L_{a2-321}$ | $L_{a2-321}$ | $L_{b81}$ | 2368 | $L_{a2-345}$ | $L_{a2-345}$ | $L_{b81}$ |
| 2369 | $L_{a3-146}$ | $L_{a3-146}$ | $L_{b3}$ | 2370 | $L_{a3-158}$ | $L_{a3-158}$ | $L_{b3}$ |
| 2371 | $L_{a3-164}$ | $L_{a3-164}$ | $L_{b3}$ | 2372 | $L_{a3-176}$ | $L_{a3-176}$ | $L_{b3}$ |
| 2373 | $L_{a3-321}$ | $L_{a3-321}$ | $L_{b3}$ | 2374 | $L_{a3-345}$ | $L_{a3-345}$ | $L_{b3}$ |
| 2375 | $L_{a3-146}$ | $L_{a3-146}$ | $L_{b81}$ | 2376 | $L_{a3-158}$ | $L_{a3-158}$ | $L_{b81}$ |
| 2377 | $L_{a3-164}$ | $L_{a3-164}$ | $L_{b81}$ | 2378 | $L_{a3-176}$ | $L_{a3-176}$ | $L_{b81}$ |
| 2379 | $L_{a3-321}$ | $L_{a3-321}$ | $L_{b81}$ | 2380 | $L_{a3-345}$ | $L_{a3-345}$ | $L_{b81}$ |

-continued

| Metal Complex | $L_a$ | $L_a$ | $L_b$ | Metal Complex | $L_a$ | $L_a$ | $L_b$ |
|---|---|---|---|---|---|---|---|
| 2381 | $L_{a2-164}$ | $L_{a2-176}$ | $L_{b3}$ | 2382 | $L_{a2-176}$ | $L_{a3-345}$ | $L_{b3}$ |
| 2383 | $L_{a2-164}$ | $L_{a2-176}$ | $L_{b81}$ | 2384 | $L_{a2-164}$ | $L_{a2-176}$ | $L_{b81}$; |

Metal Complex 2385 to Metal Complex 2424 each have a structure of $Ir(L_a)_2L_c$, wherein the two $L_a$ are the same or different, and the two $L_a$ and $L_c$ respectively correspond to the structures listed in the following table:

| Metal Complex | $L_a$ | $L_a$ | $L_c$ | Metal Complex | $L_a$ | $L_a$ | $L_c$ |
|---|---|---|---|---|---|---|---|
| 2385 | $L_{a1-146}$ | $L_{a1-146}$ | $L_{c1}$ | 2386 | $L_{a1-158}$ | $L_{a1-158}$ | $L_{c1}$ |
| 2387 | $L_{a1-164}$ | $L_{a1-164}$ | $L_{c1}$ | 2388 | $L_{a1-176}$ | $L_{a1-176}$ | $L_{c1}$ |
| 2389 | $L_{a1-321}$ | $L_{a1-321}$ | $L_{c1}$ | 2390 | $L_{a1-345}$ | $L_{a1-345}$ | $L_{c1}$ |
| 2391 | $L_{a1-146}$ | $L_{a1-146}$ | $L_{c31}$ | 2392 | $L_{a1-158}$ | $L_{a1-158}$ | $L_{c31}$ |
| 2393 | $L_{a1-164}$ | $L_{a1-164}$ | $L_{c31}$ | 2394 | $L_{a1-176}$ | $L_{a1-176}$ | $L_{c31}$ |
| 2395 | $L_{a1-321}$ | $L_{a1-321}$ | $L_{c31}$ | 2396 | $L_{a1-345}$ | $L_{a1-345}$ | $L_{c31}$ |
| 2397 | $L_{a2-146}$ | $L_{a2-146}$ | $L_{c1}$ | 2398 | $L_{a2-158}$ | $L_{a2-158}$ | $L_{c1}$ |
| 2399 | $L_{a2-164}$ | $L_{a2-164}$ | $L_{c1}$ | 2400 | $L_{a2-176}$ | $L_{a2-176}$ | $L_{c1}$ |
| 2401 | $L_{a2-321}$ | $L_{a2-321}$ | $L_{c1}$ | 2402 | $L_{a2-345}$ | $L_{a2-345}$ | $L_{c1}$ |
| 2403 | $L_{a2-146}$ | $L_{a2-146}$ | $L_{c31}$ | 2404 | $L_{a2-158}$ | $L_{a2-158}$ | $L_{c31}$ |
| 2405 | $L_{a2-164}$ | $L_{a2-164}$ | $L_{c31}$ | 2406 | $L_{a2-176}$ | $L_{a2-176}$ | $L_{c31}$ |
| 2407 | $L_{a2-321}$ | $L_{a2-321}$ | $L_{c31}$ | 2408 | $L_{a2-345}$ | $L_{a2-345}$ | $L_{c31}$ |
| 2409 | $L_{a3-146}$ | $L_{a3-146}$ | $L_{c1}$ | 2410 | $L_{a3-158}$ | $L_{a3-158}$ | $L_{c1}$ |
| 2411 | $L_{a3-164}$ | $L_{a3-164}$ | $L_{c1}$ | 2412 | $L_{a3-176}$ | $L_{a3-176}$ | $L_{c1}$ |
| 2413 | $L_{a3-321}$ | $L_{a3-321}$ | $L_{c1}$ | 2414 | $L_{a3-345}$ | $L_{a3-345}$ | $L_{c1}$ |
| 2415 | $L_{a3-146}$ | $L_{a3-146}$ | $L_{c31}$ | 2416 | $L_{a3-158}$ | $L_{a3-158}$ | $L_{c31}$ |
| 2417 | $L_{a3-164}$ | $L_{a3-164}$ | $L_{c31}$ | 2418 | $L_{a3-176}$ | $L_{a3-176}$ | $L_{c31}$ |
| 2419 | $L_{a3-321}$ | $L_{a3-321}$ | $L_{c31}$ | 2420 | $L_{a3-345}$ | $L_{a3-345}$ | $L_{c31}$ |
| 2421 | $L_{a2-164}$ | $L_{a2-176}$ | $L_{c1}$ | 2422 | $L_{a2-176}$ | $L_{a3-345}$ | $L_{c1}$ |
| 2423 | $L_{a2-164}$ | $L_{a2-176}$ | $L_{c31}$ | 2424 | $L_{a2-164}$ | $L_{a2-176}$ | $L_{c31}$; |

Metal Complex 2425 to Metal Complex 2433, Metal Complex 2435, Metal Complex 2437, and Metal Complex 2439 each have a structure of $Ir(L_a)(L_b)(L_c)$, wherein $L_a$, $L_b$ and $L_c$ respectively correspond to the structures listed in the following table:

| Metal Complex | $L_a$ | $L_b$ | $L_c$ |
|---|---|---|---|
| 2425 | $L_{a1-164}$ | $L_{b3}$ | $L_{c1}$ |
| 2426 | $L_{a1-176}$ | $L_{b3}$ | $L_{c1}$ |
| 2427 | $L_{a1-321}$ | $L_{b3}$ | $L_{c1}$ |
| 2428 | $L_{a1-345}$ | $L_{b3}$ | $L_{c1}$ |
| 2429 | $L_{a1-164}$ | $L_{b81}$ | $L_{c1}$ |
| 2430 | $L_{a1-176}$ | $L_{b81}$ | $L_{c1}$ |

-continued

| Metal Complex | $L_a$ | $L_b$ | $L_c$ |
|---|---|---|---|
| 2431 | $L_{a1-321}$ | $L_{b81}$ | $L_{c1}$ |
| 2432 | $L_{a1-345}$ | $L_{b81}$ | $L_{c1}$ |
| 2433 | $L_{a1-164}$ | $L_{b3}$ | $L_{c31}$ |
| 2435 | $L_{a1-321}$ | $L_{b3}$ | $L_{c31}$ |
| 2437 | $L_{a2-146}$ | $L_{b81}$ | $L_{c31}$ |
| 2439 | $L_{a2-164}$ | $L_{b81}$ | $L_{c31}$; |

Metal Complex 2441 to Metal Complex 2454 each have a structure of $Ir(L_a)_3$, wherein the three $L_a$ are the same or different, and the three $L_a$ respectively correspond to the structures listed in the following table:

| Metal Complex | $L_a$ | $L_a$ | $L_a$ | Metal Complex | $L_a$ | $L_a$ | $L_a$ |
|---|---|---|---|---|---|---|---|
| 2441 | $L_{a1-164}$ | $L_{a1-164}$ | $L_{a1-164}$ | 2442 | $L_{a1-176}$ | $L_{a1-176}$ | $L_{a1-176}$ |
| 2443 | $L_{a1-321}$ | $L_{a1-321}$ | $L_{a1-321}$ | 2444 | $L_{a1-345}$ | $L_{a1-345}$ | $L_{a1-345}$ |
| 2445 | $L_{a2-164}$ | $L_{a2-164}$ | $L_{a2-164}$ | 2446 | $L_{a2-176}$ | $L_{a2-176}$ | $L_{a2-176}$ |
| 2447 | $L_{a2-321}$ | $L_{a2-321}$ | $L_{a2-321}$ | 2448 | $L_{a2-345}$ | $L_{a2-345}$ | $L_{a2-345}$ |
| 2449 | $L_{a3-164}$ | $L_{a3-164}$ | $L_{a3-164}$ | 2450 | $L_{a3-176}$ | $L_{a3-176}$ | $L_{a3-176}$ |
| 2451 | $L_{a3-321}$ | $L_{a3-321}$ | $L_{a3-321}$ | 2452 | $L_{a3-345}$ | $L_{a3-345}$ | $L_{a3-345}$ |
| 2453 | $L_{a1-164}$ | $L_{a1-164}$ | $L_{a2-164}$ | 2454 | $L_{a1-176}$ | $L_{a1-176}$ | $L_{a2-176}$ |
| 2455 | $L_{a1-321}$ | $L_{a1-321}$ | $L_{a3-321}$ | 2456 | $L_{a1-345}$ | $L_{a1-345}$ | $L_{a3-321}$ |
| 2453 | $L_{a1-164}$ | $L_{a2-321}$ | $L_{a3-321}$ | 2454 | $L_{a1-176}$ | $L_{a3-345}$ | $L_{a3-321}$ |
| 2455 | $L_{a1-345}$ | $L_{a2-321}$ | $L_{a3-176}$ | 2456 | $L_{a2-321}$ | $L_{a2-345}$ | $L_{a3-345}$ |
| 2453 | $L_{a2-321}$ | $L_{a3-164}$ | $L_{a3-321}$ | 2454 | $L_{a2-345}$ | $L_{a3-176}$ | $L_{a3-345}$. |

20. An electroluminescent device, comprising:

an anode, a cathode, and an organic layer disposed between the anode and the cathode, wherein the organic layer comprises the metal complex of claim 1.

21. The electroluminescent device of claim 20, wherein the organic layer comprising the metal complex is a light-emitting layer.

22. The electroluminescent device of claim 21, wherein the electroluminescent device emits green light or white light.

23. The electroluminescent device of claim 21, wherein the light-emitting layer comprises a first host compound;

the light-emitting layer further comprises a second host compound;

the first host compound and/or the second host compound comprise at least one chemical group selected from the group consisting of: benzene, pyridine, pyrimidine, triazine, carbazole, azacarbazole, indolocarbazole, dibenzothiophene, aza-dibenzothiophene, dibenzofuran, azadibenzofuran, dibenzoselenophene, triphenylene, azatriphenylene, fluorene, silafluorene, naphthalene, quinoline, isoquinoline, quinazoline, quinoxaline, phenanthrene, azaphenanthrene and combinations thereof.

24. The electroluminescent device of claim 23, wherein the first host compound has a structure represented by Formula 4:

Formula 4

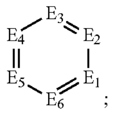

wherein $E_1$ to $E_6$ are, at each occurrence identically or differently, selected from C, $CR_c$ or N, at least two of $E_1$ to $E_6$ are N, and at least one of $E_1$ to $E_6$ is C and joined to Formula A;

Formula A

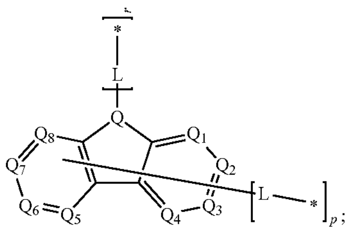

wherein

Q is, at each occurrence identically or differently, selected from the group consisting of O, S, Se, N, NR''', CR'''R''', SiR'''R''', GeR'''R''' and R'''C═CR'''; when two R''' are present at the same time, the two R''' may be the same or different;

p is 0 or 1; r is 0 or 1;

when Q is selected from N, p is 0 and r is 1;

when Q is selected from the group consisting of O, S, Se, NR''', CR'''R''', SiR'''R''', GeR'''R''' and R'''C═CR''', p is 1 and r is 0;

L is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

$Q_1$ to $Q_8$ are, at each occurrence identically or differently, selected from C, $CR_q$ or N;

$R_c$, R''' and $R_q$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

"*" represents a position where Formula A is joined to Formula 4; and adjacent substituents $R_c$, R''', $R_q$ can be optionally joined to form a ring.

25. The electroluminescent device of claim 23, wherein the second host compound has a structure represented by Formula 5:

Formula 5

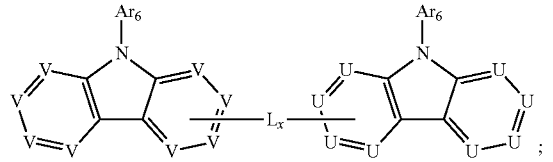

wherein $L_x$ is, at each occurrence identically or differently, selected from a single bond, substituted or unsubstituted alkylene having 1 to 20 carbon atoms, substituted or unsubstituted cycloalkylene having 3 to 20 carbon atoms, substituted or unsubstituted arylene having 6 to 20 carbon atoms, substituted or unsubstituted heteroarylene having 3 to 20 carbon atoms or a combination thereof;

V is, at each occurrence identically or differently, selected from C, $CR_v$ or N, and at least one of V is C and joined to $L_x$, U is, at each occurrence identically or differently, selected from C, $CR_u$ or N, and at least one of U is C and joined to $L_x$;

$R_v$ and $R_u$ are, at each occurrence identically or differently, selected from the group consisting of: hydrogen, deuterium, halogen, substituted or unsubstituted alkyl having 1 to 20 carbon atoms, substituted or unsubstituted cycloalkyl having 3 to 20 ring carbon atoms, substituted or unsubstituted heteroalkyl having 1 to 20 carbon atoms, a substituted or unsubstituted heterocyclic group having 3 to 20 ring atoms, substituted or unsubstituted arylalkyl having 7 to 30 carbon atoms, substituted or unsubstituted alkoxy having 1 to 20 carbon atoms, substituted or unsubstituted aryloxy having 6 to 30 carbon atoms, substituted or unsubstituted alkenyl having 2 to 20 carbon atoms, substituted or unsubstituted alkynyl having 2 to 20 carbon atoms, substituted or unsubstituted aryl having 6 to 30 carbon atoms, substituted or unsubstituted heteroaryl having 3 to 30 carbon atoms, substituted or unsubstituted alkylsilyl having 3 to 20 carbon atoms, substituted or unsubstituted arylsilyl having 6 to 20 carbon atoms, substituted or unsubstituted alkylgermanyl having 3 to 20 carbon atoms, substituted or unsubstituted arylgermanyl having 6 to 20 carbon atoms, substituted or unsubstituted amino having 0 to 20 carbon atoms, an acyl group, a carbonyl group, a carboxylic acid group, an ester group, a cyano group, an isocyano group, a hydroxyl group, a sulfanyl group, a sulfinyl group, a sulfonyl group, a phosphino group and combinations thereof;

$Ar_6$ is, at each occurrence identically or differently, selected from substituted or unsubstituted aryl having 6 to 30 carbon atoms, substituted or unsubstituted heteroaryl having 3 to 30 carbon atoms or a combination thereof; and adjacent substituents $R_v$ and $R_u$ can be optionally joined to form a ring.

26. The electroluminescent device of claim 23, wherein the metal complex is doped in the first host compound and the second host compound, and the weight of the metal complex accounts for 3% to 13% of the total weight of the light-emitting layer.

27. A compound combination, comprising the metal complex of claim 1.

28. The metal complex of claim 1, wherein $R_x$ is, at each occurrence identically or differently, selected from the group consisting of: hydrogen, deuterium, fluorine, cyano, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, phenyl, pyridyl, trimethylsilyl, trimethylgermanyl and combinations thereof.

29. The metal complex of claim 4, wherein $X_7$ is selected from $CR_x$, and $R_x$ is cyano or fluorine.

30. The metal complex of claim 1, wherein the ring $A_1$ is selected from benzene, naphthalene, phenanthrene, triphenylene, pyridine, pyrimidine, pyrazine, pyridazine, triazine, pyrrole, furan, thiophene, imidazole, thiazole or oxazole; and the ring $A_2$ is selected from cyclopentane, cyclopentene, cyclohexane, cyclohexene, cycloheptane, cycloheptene.

31. The metal complex of claim 1, wherein $R_{a1}$ and $R_{a2}$ are, at each occurrence identically or differently, selected from the group consisting of: hydrogen, deuterium, cyano, methyl, ethyl, propyl, isopropyl, n-butyl, isobutyl, t-butyl, cyclopentyl, cyclohexyl, deuterated methyl, deuterated ethyl, deuterated propyl, deuterated isopropyl, deuterated n-butyl, deuterated isobutyl, deuterated t-butyl, deuterated cyclopentyl, deuterated cyclohexyl, trimethylsilyl and combinations thereof.

32. The metal complex of claim 4, wherein at least one, at least two, at least three or all of $R_2$, $R_3$, $R_6$ and $R_7$ are selected from the group consisting of: deuterium, methyl, ethyl, propyl, isopropyl, n-butyl, isobutyl, t-butyl, cyclopentyl, cyclohexyl, neopentyl, t-pentyl and combinations thereof; optionally, hydrogens in the above groups can be partially or fully deuterated.

33. The electroluminescent device of claim 23, wherein the first host compound is selected from the group consisting of the following:

H-1

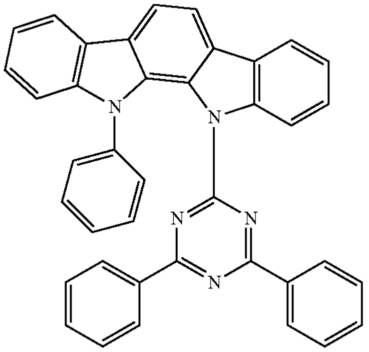

,

H-2

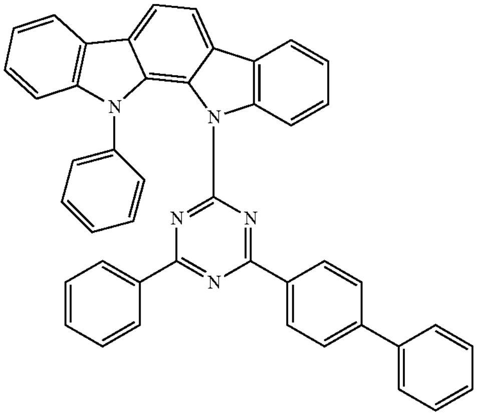

,

-continued
H-3
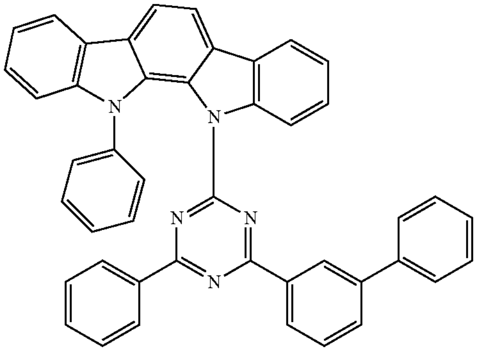
,
H-4
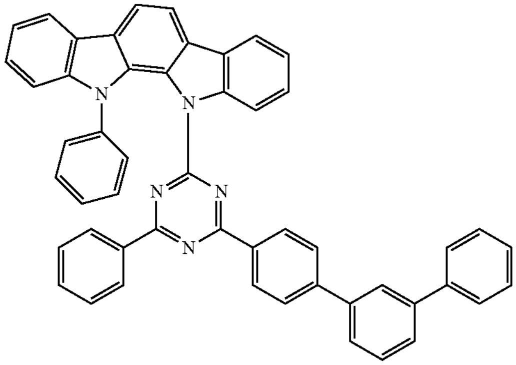
,
H-5
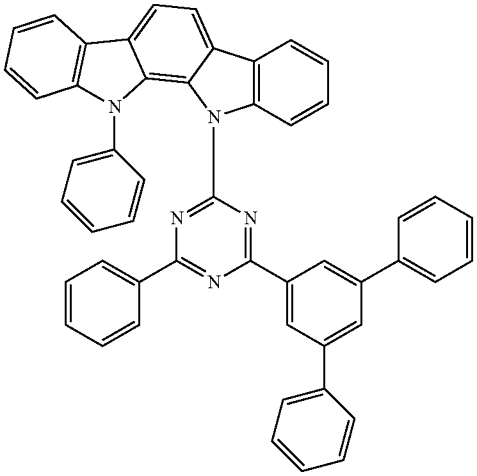
,
H-6
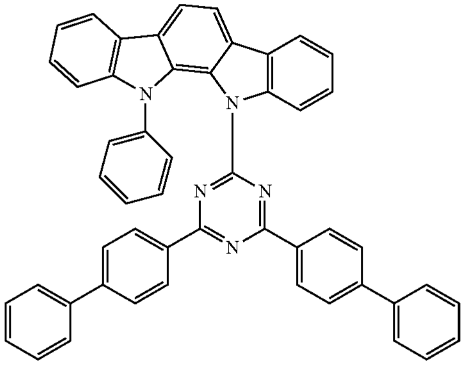
,
H-7
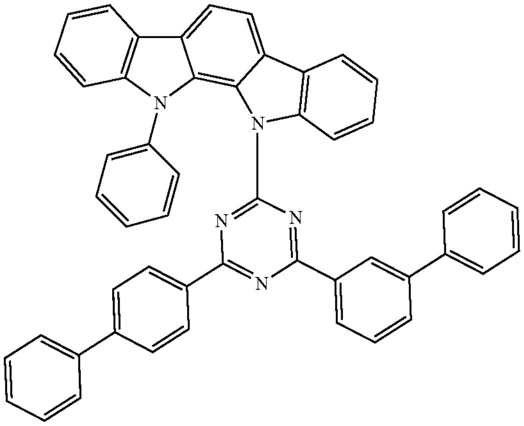
,
H-8
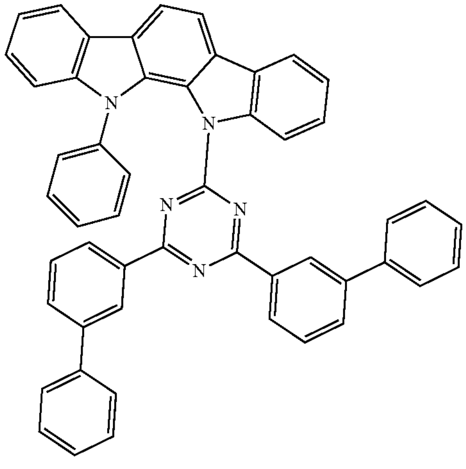
, -continued
H-9
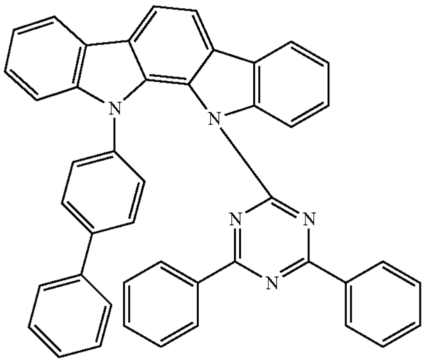
,
H-10
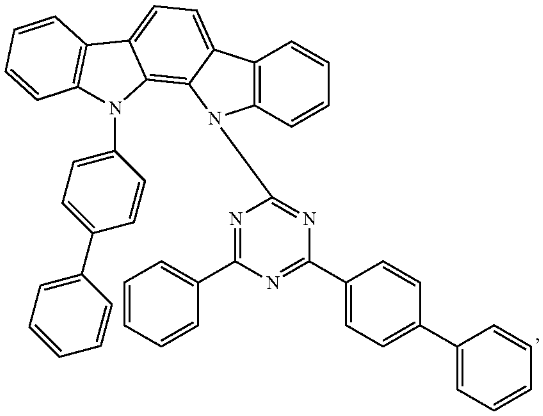
,
H-11
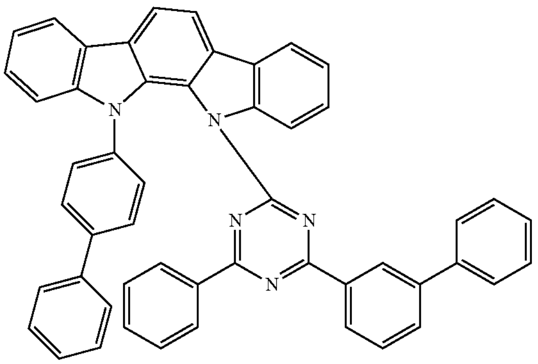
,
H-12
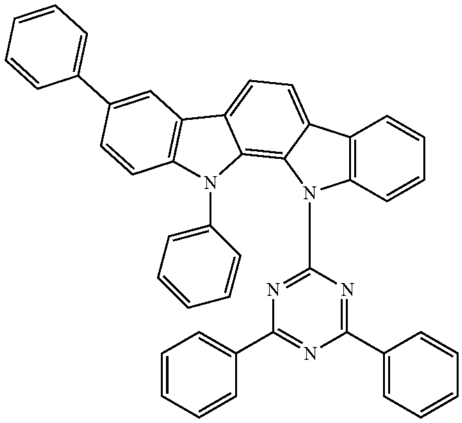
,
H-13
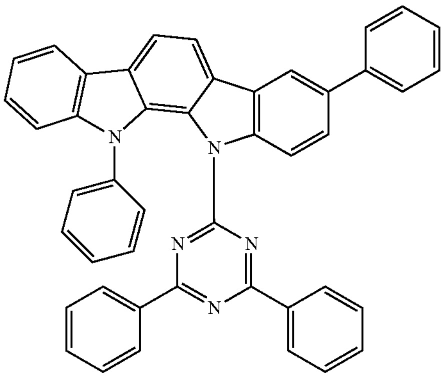
,
H-14
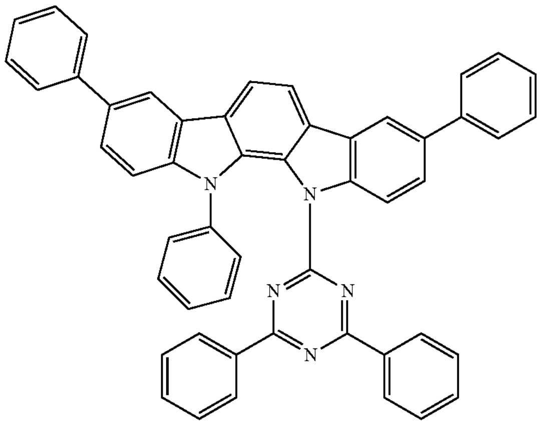
, -continued
H-15
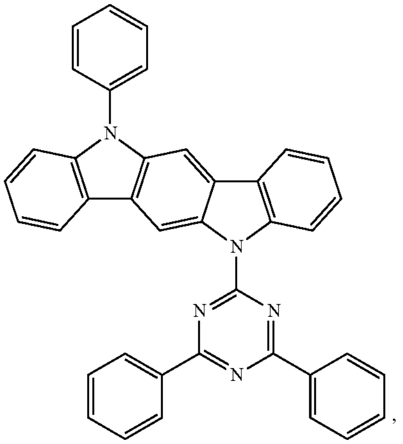
H-16
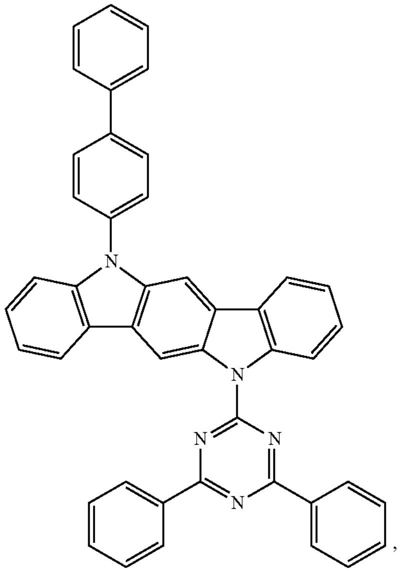
H-17
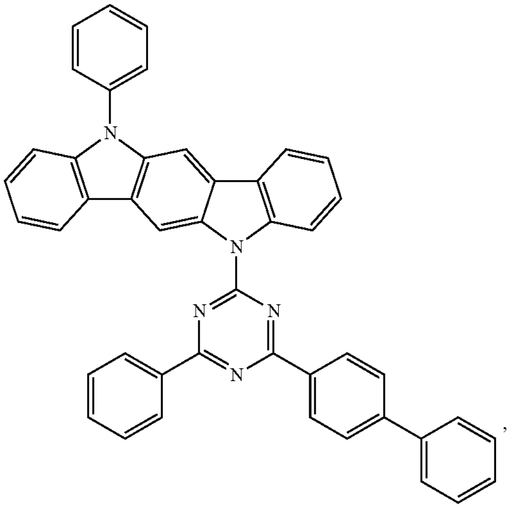
H-18
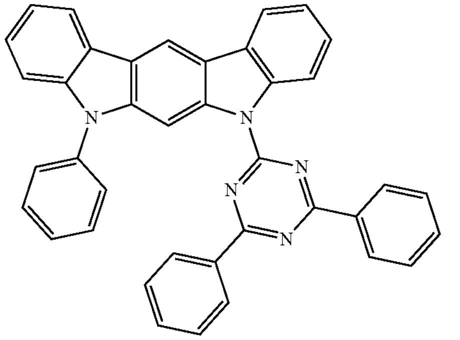
H-19
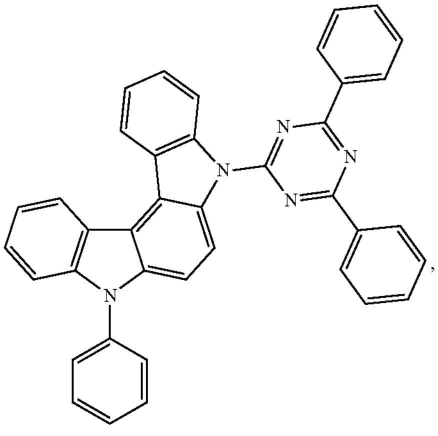
H-20
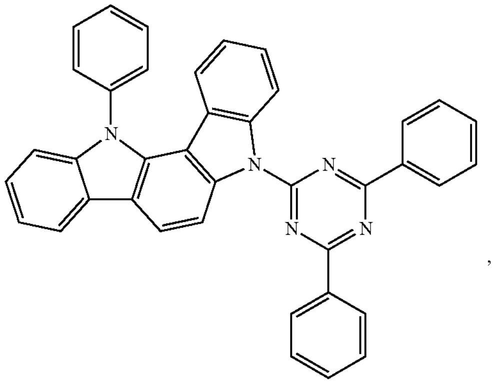

-continued
H-21
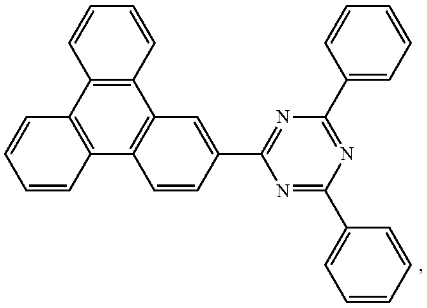
H-22
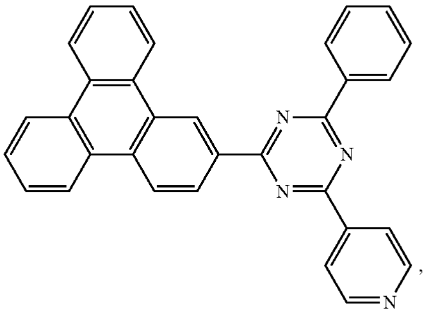
H-23
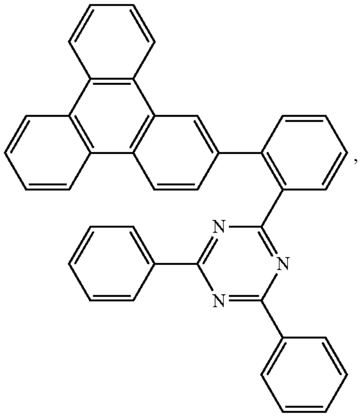
H-24
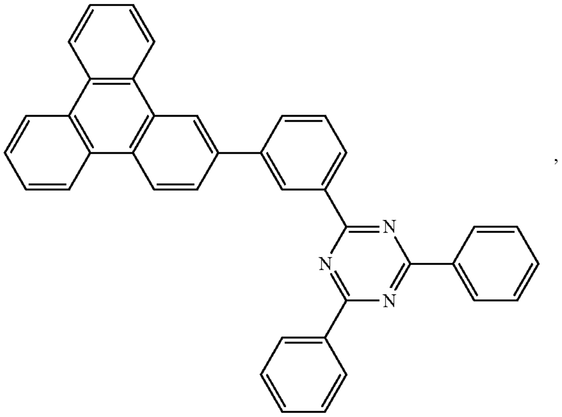
H-25
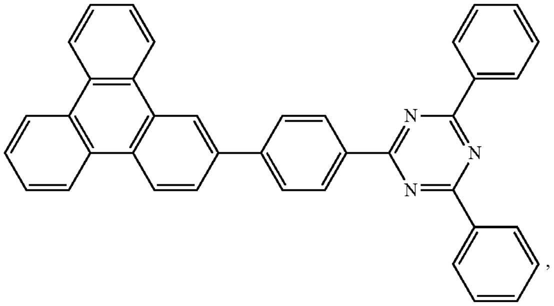
H-26
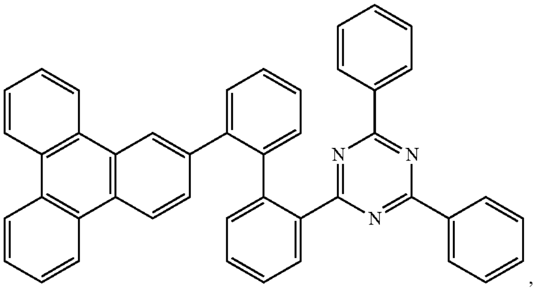
H-27
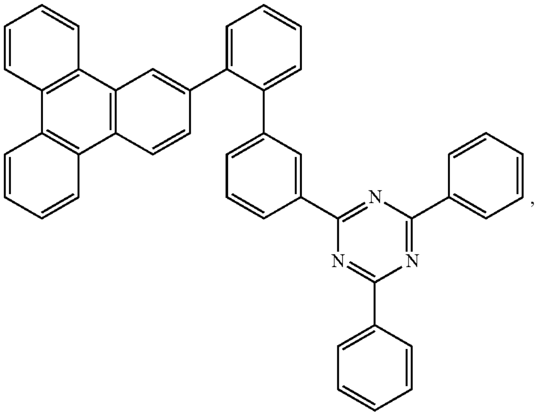
H-28
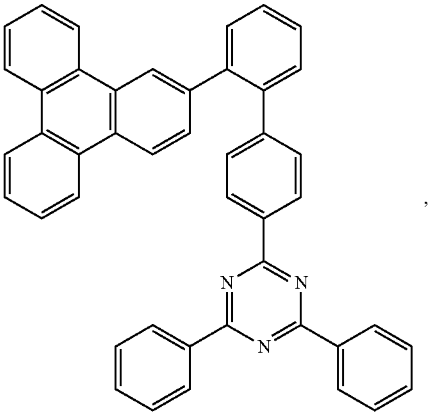

-continued
H-29
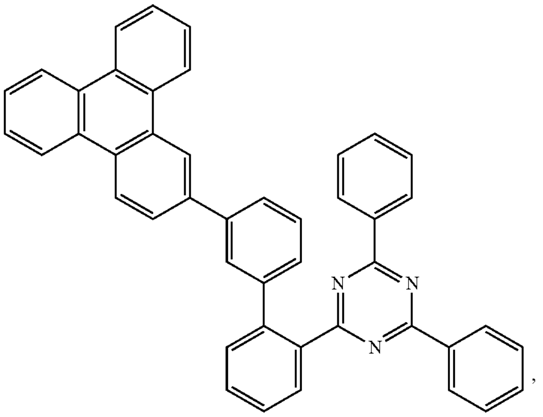
H-30
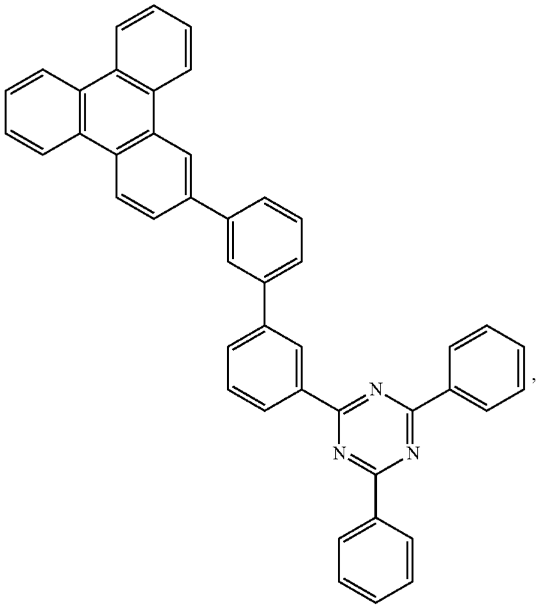
H-31
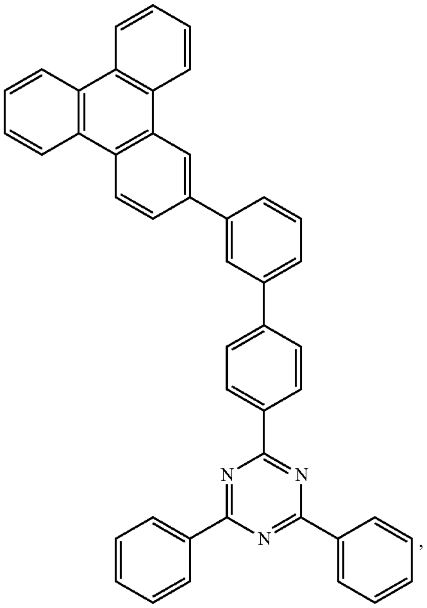
H-32
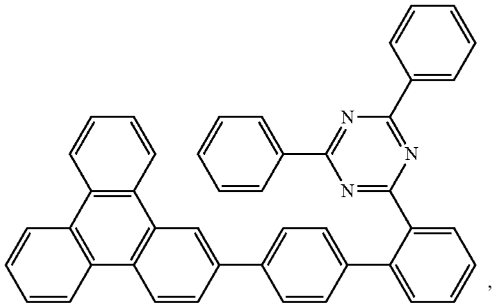
H-33
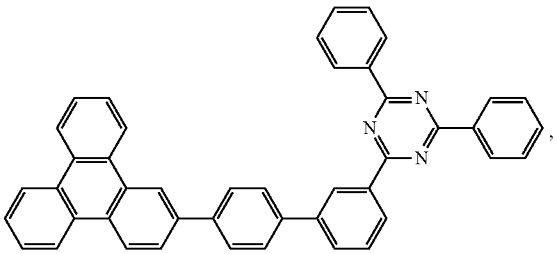
H-34
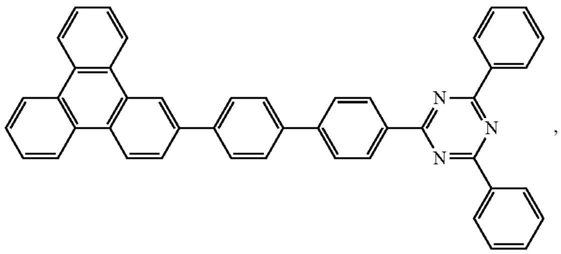

-continued
H-35
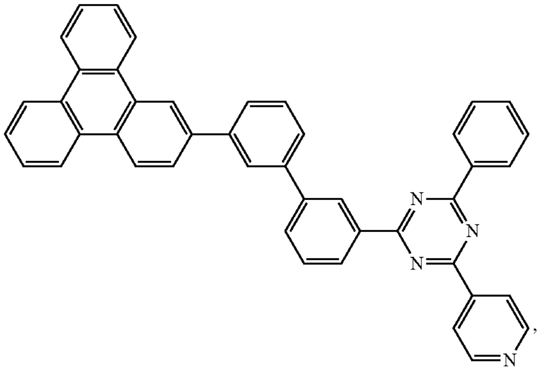
H-36
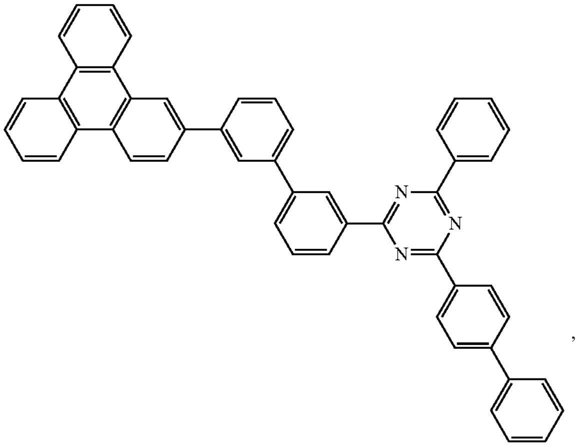
H-37
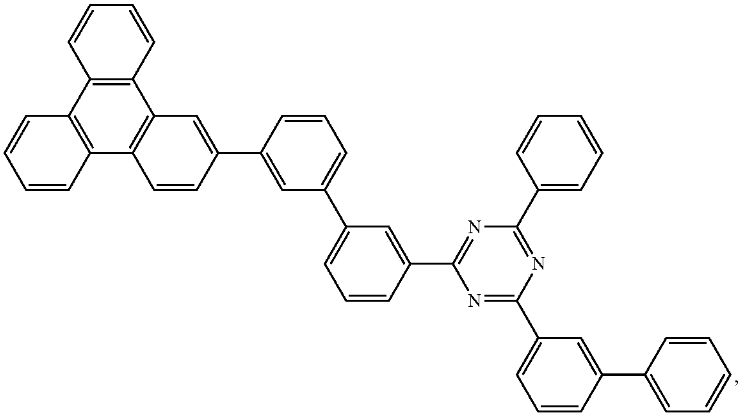
H-38
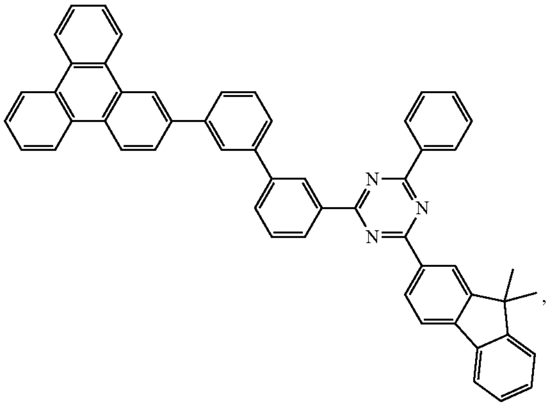
H-39
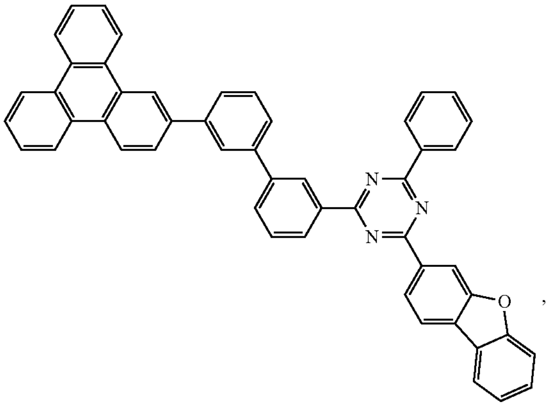

-continued
H-40
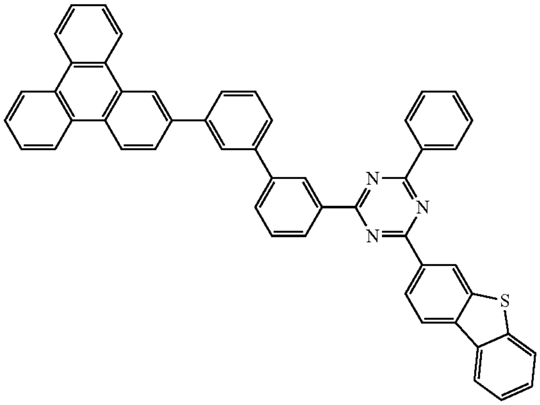
,
H-41
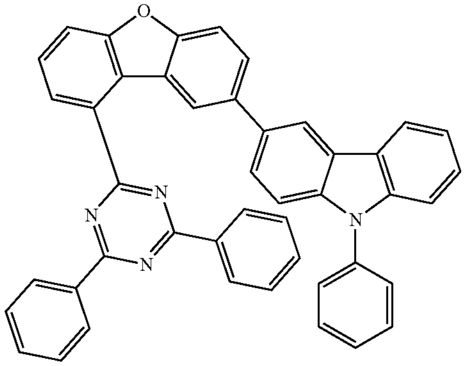
,
H-42
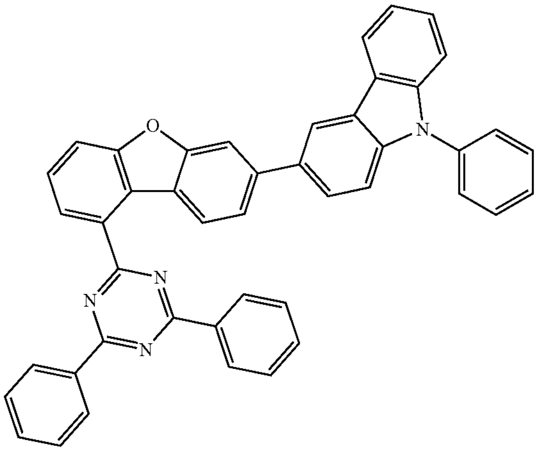
,
H-43
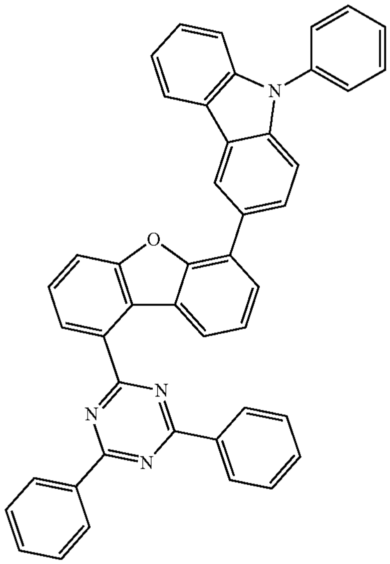
,
H-44
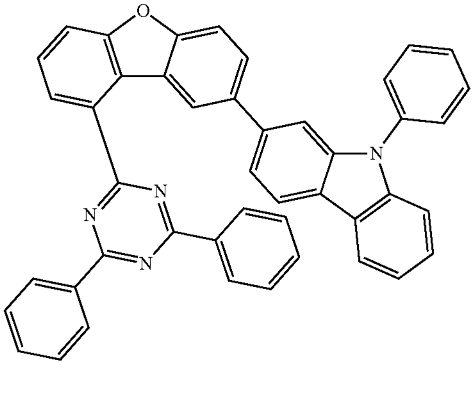
,
H-45
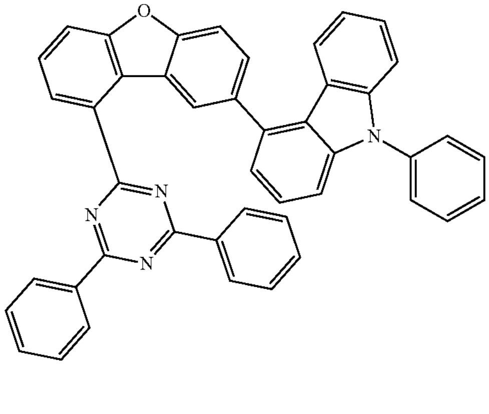
, -continued
H-46
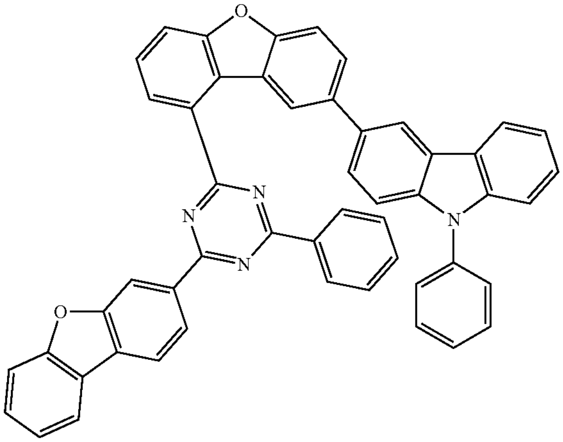
,
H-47
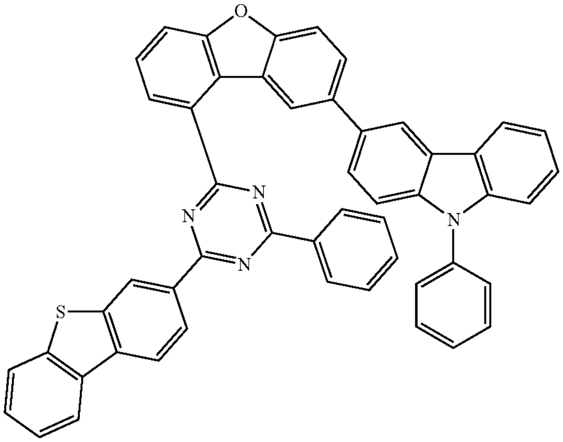
,
H-48
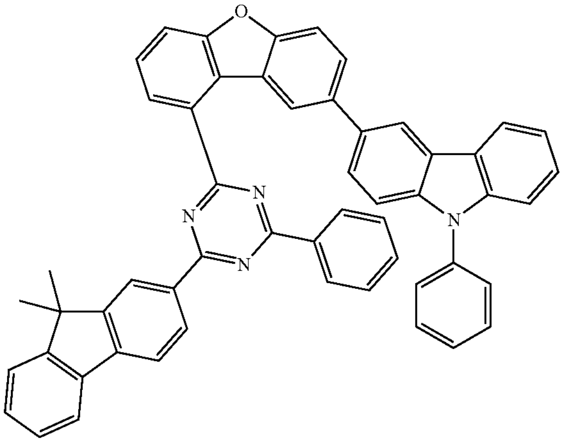
,
H-49
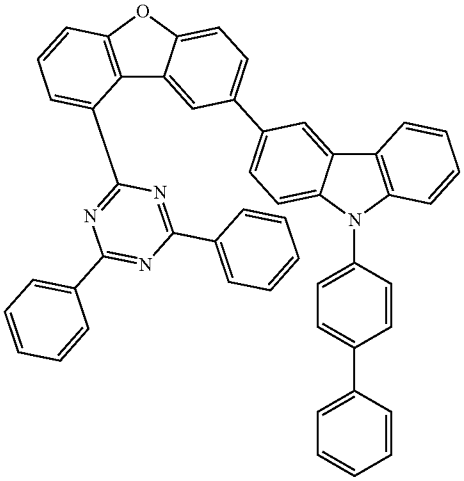
,
H-50
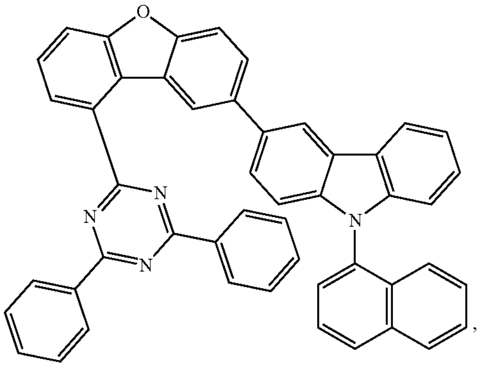
,
H-51
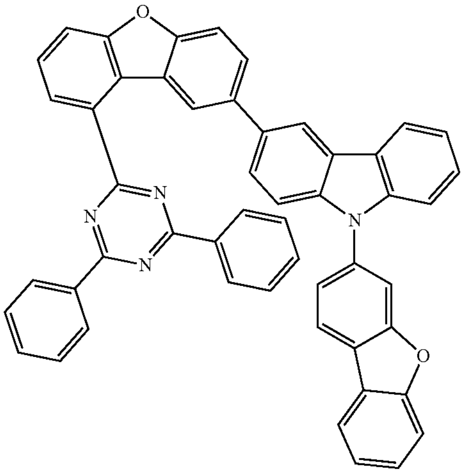
, -continued
H-52
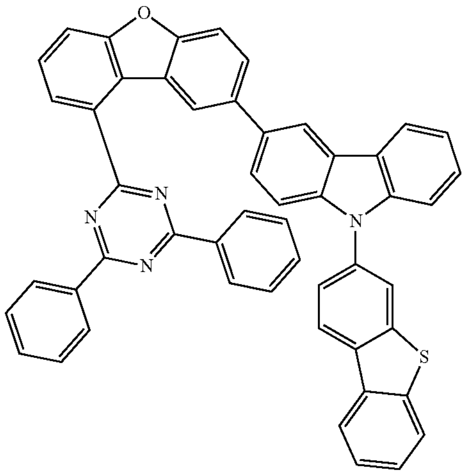
,
H-53
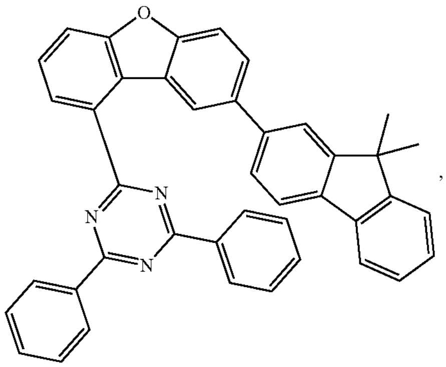
,
H-54
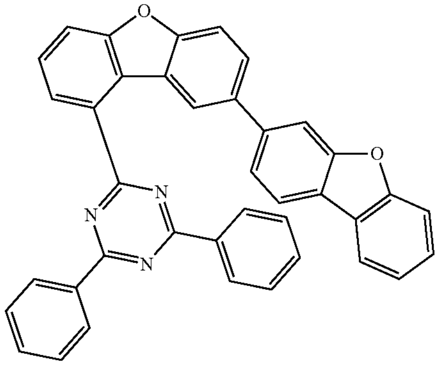
,
H-55
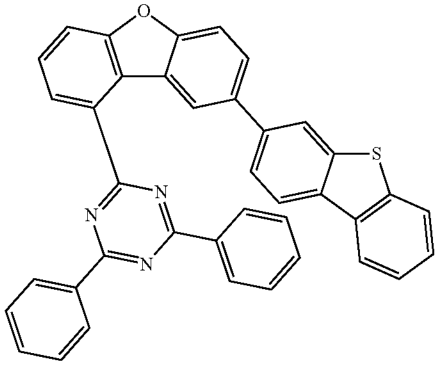
,
H-56
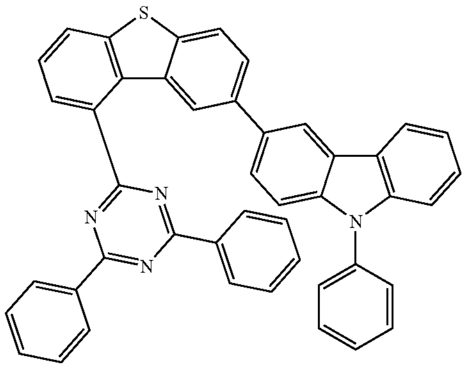
,
H-57
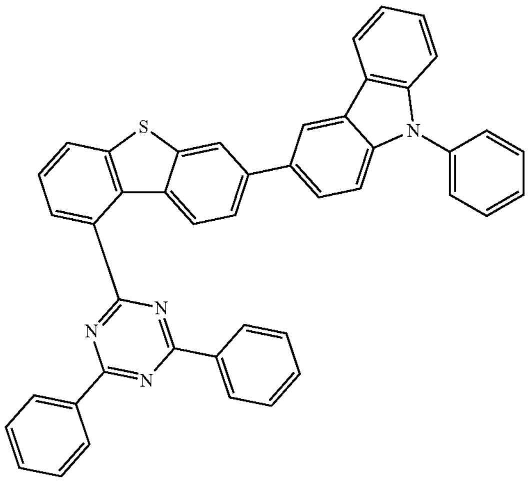
, -continued
H-58
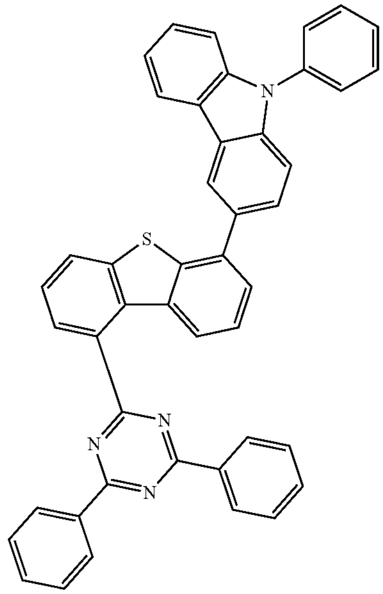
,
H-59
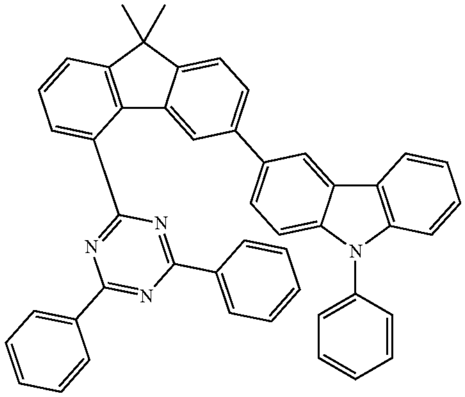
,
H-60
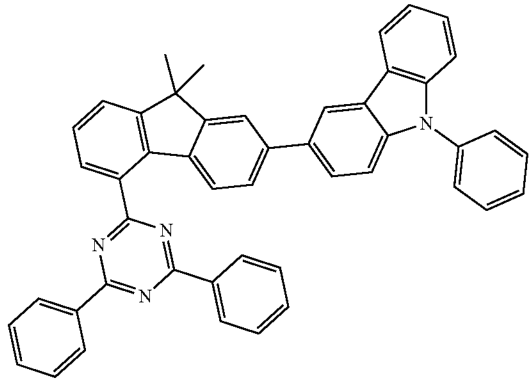
,
H-61
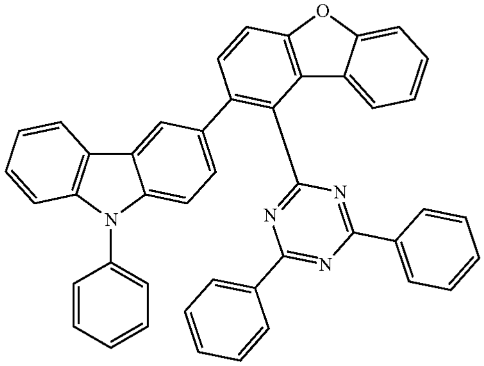
,
H-62
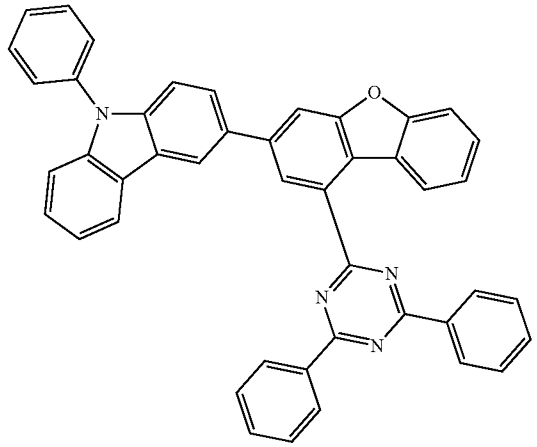
,
H-63
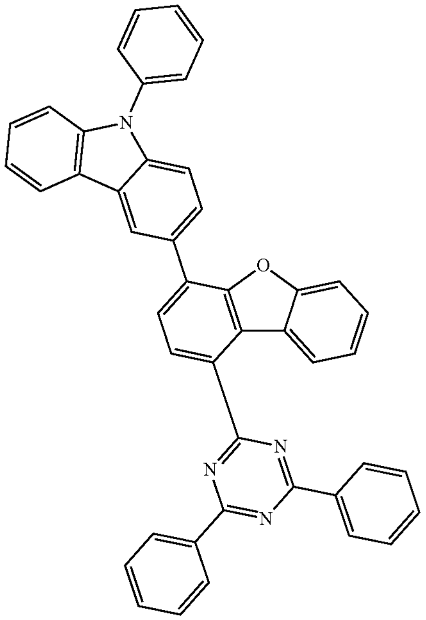
, -continued
H-64
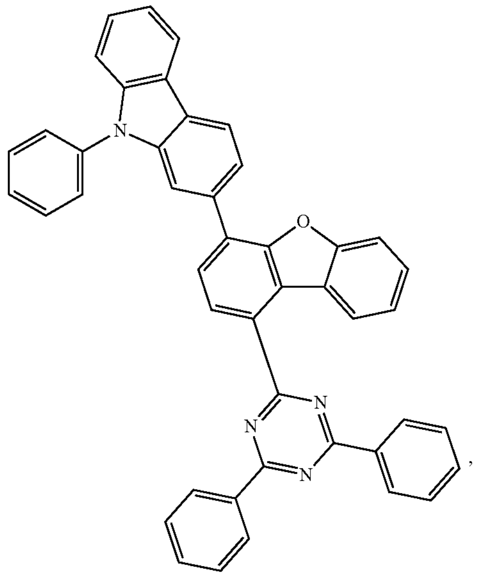
H-65
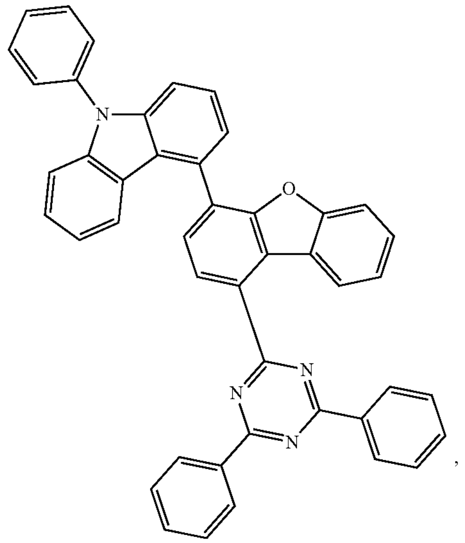
H-66
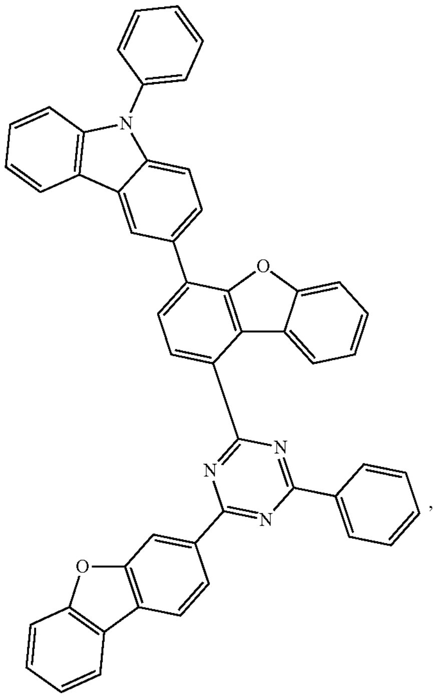

-continued
H-67
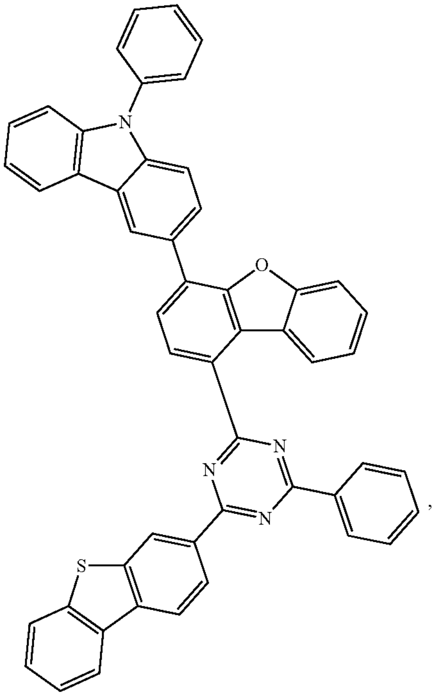
,
H-68
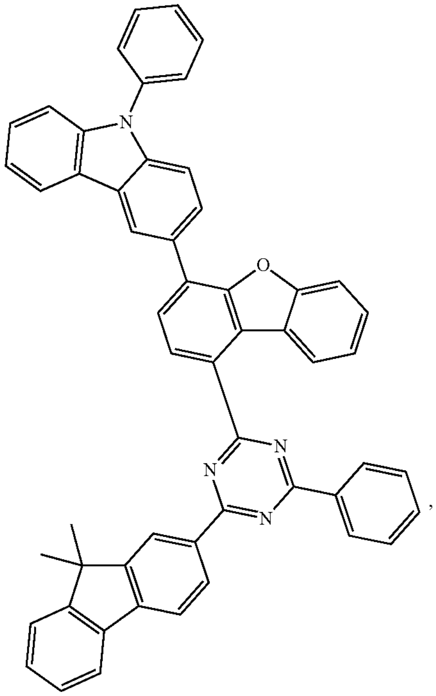
,
H-69
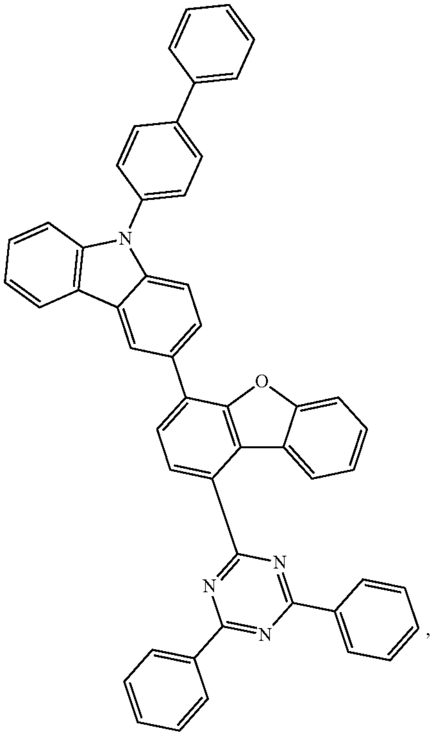
,
H-70
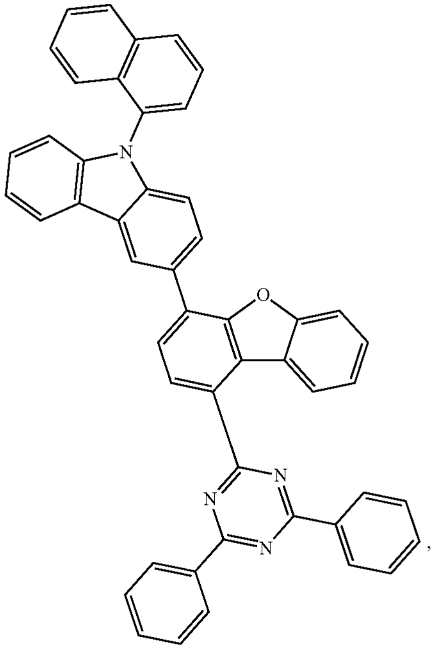
, -continued
H-71
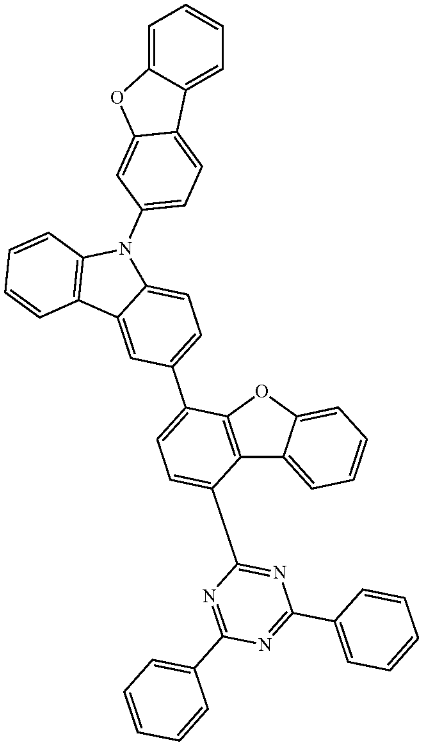
,
H-72
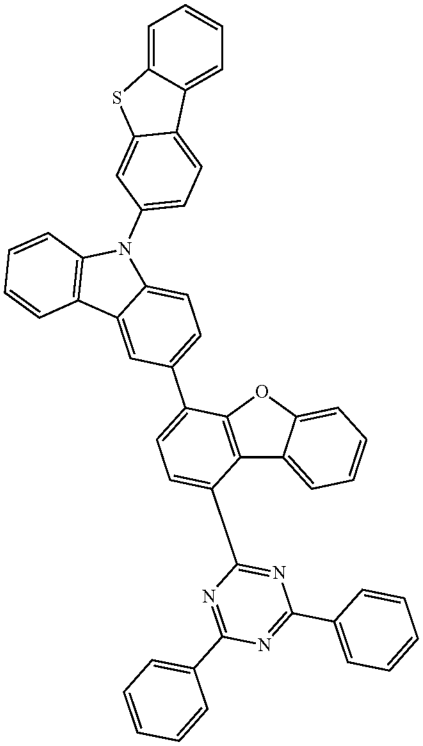
,
H-73
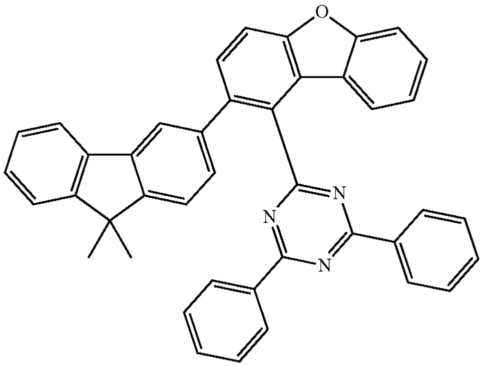
,
H-74
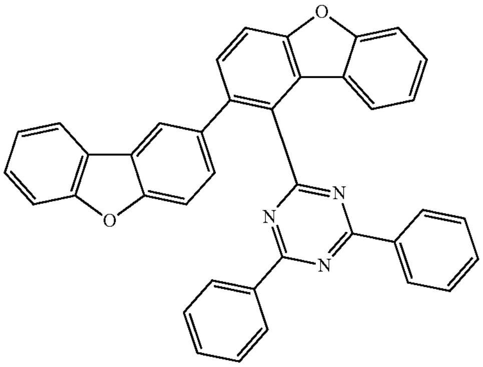
,
H-75
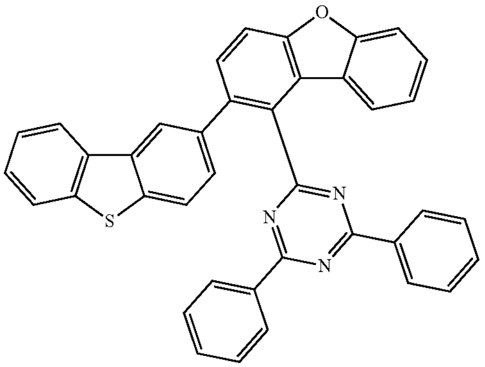
,
H-76
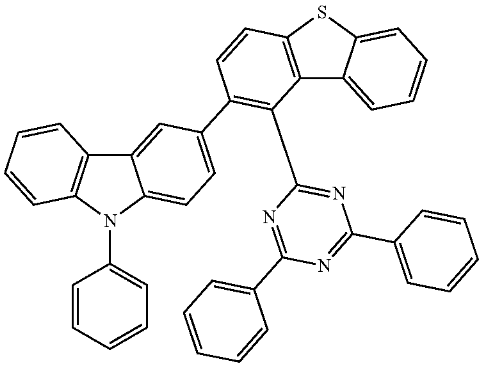
, -continued
H-77
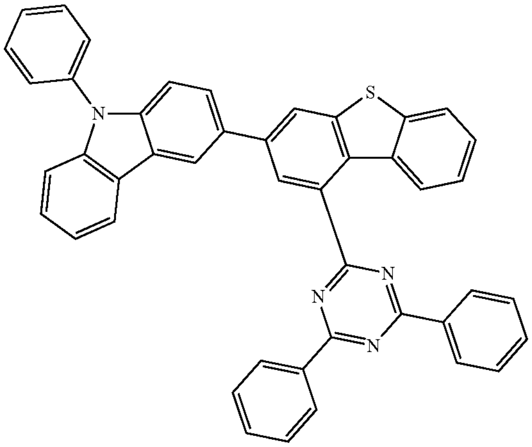
,
H-78
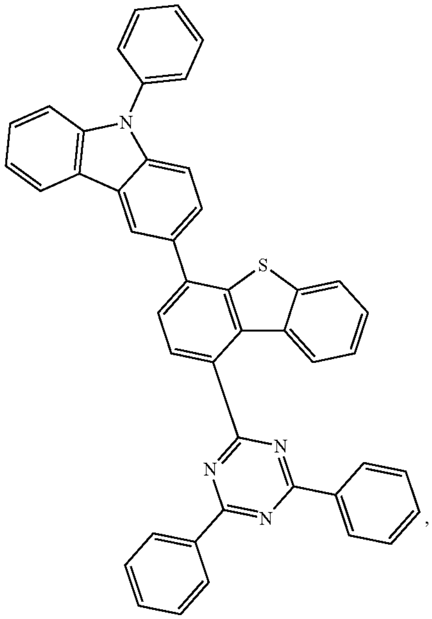
,
H-79
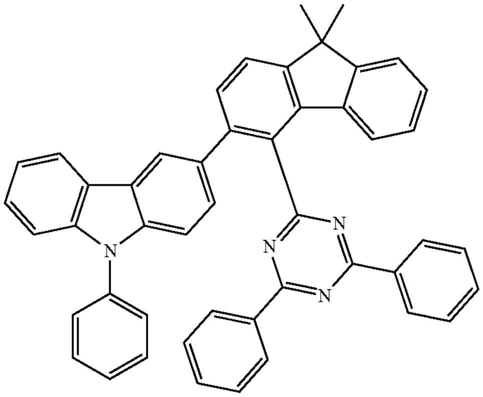
,
H-80
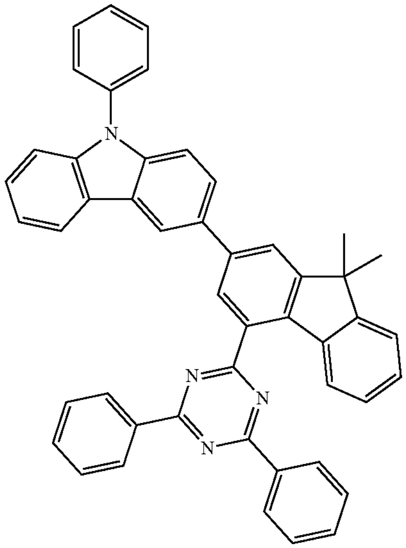
,
H-81
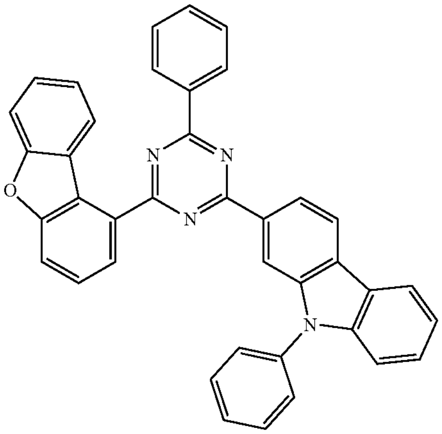
,
H-82
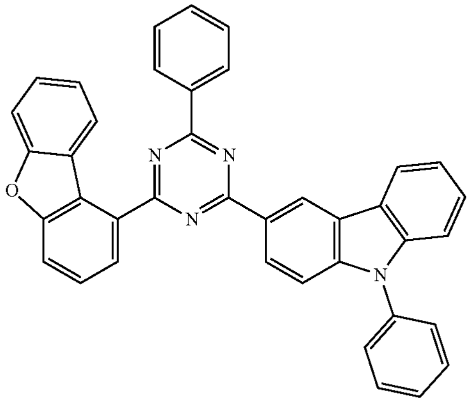
, -continued
H-83
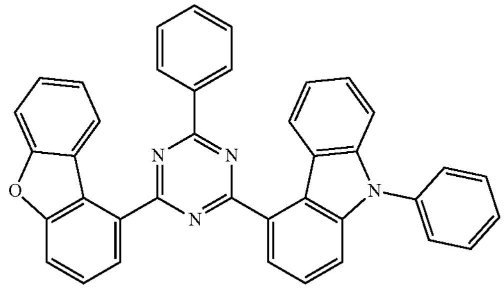
,
H-84
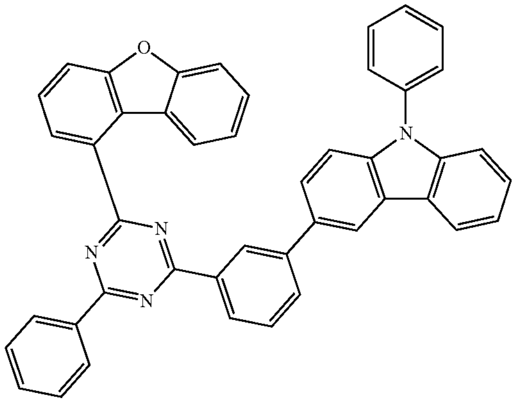
,
H-85
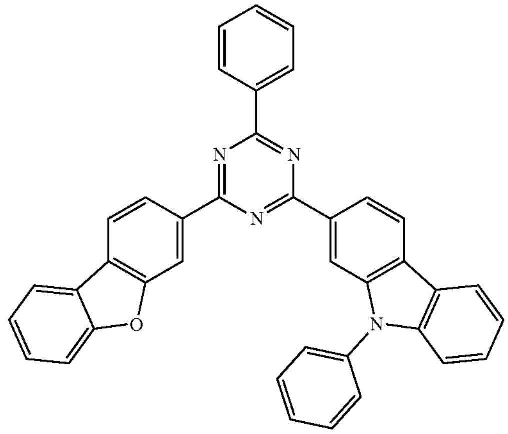
,
H-86
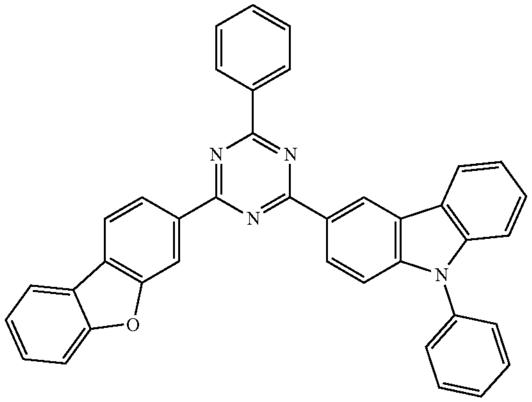
,
H-87
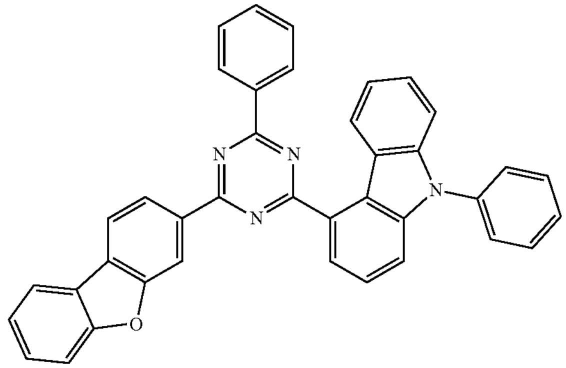
,
H-88
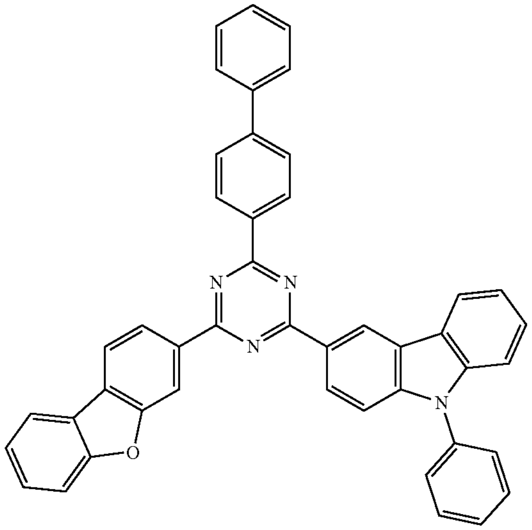
, -continued
H-89
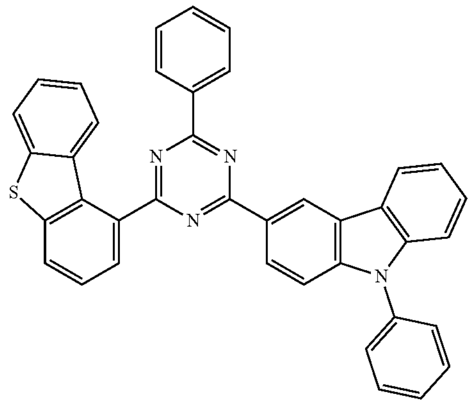
,
H-90
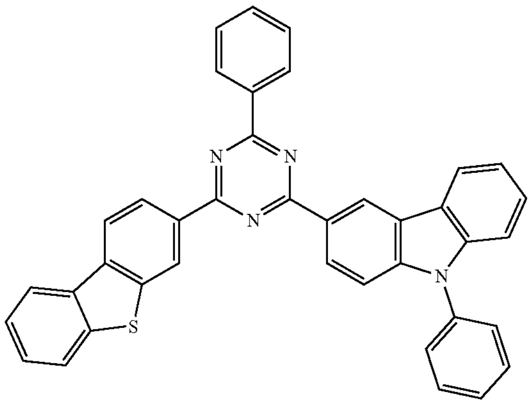
,
H-91
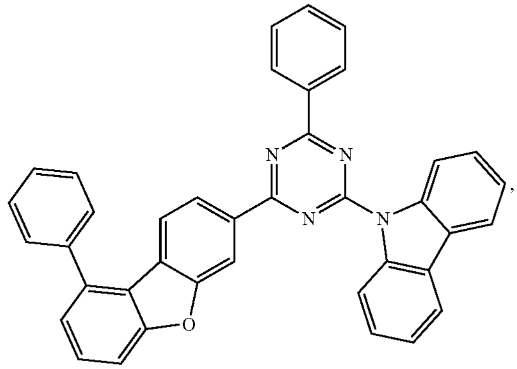
,
H-92
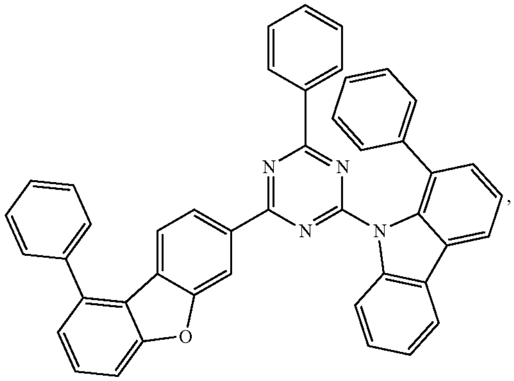
,
H-93
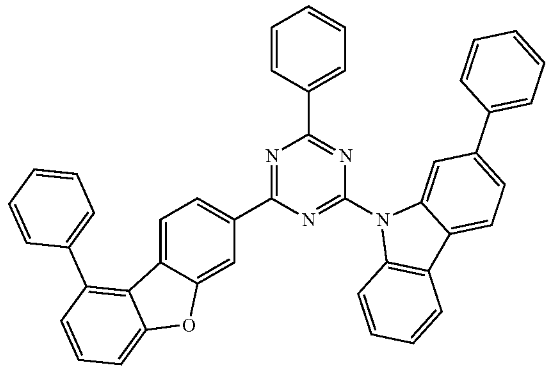
,
H-94
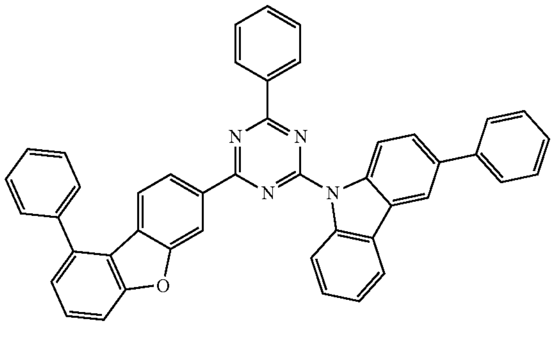
,
H-95
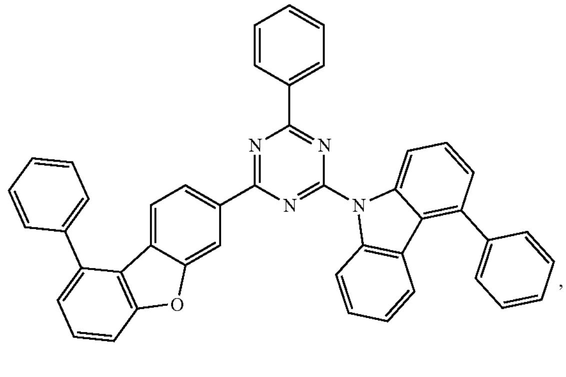
,
H-96
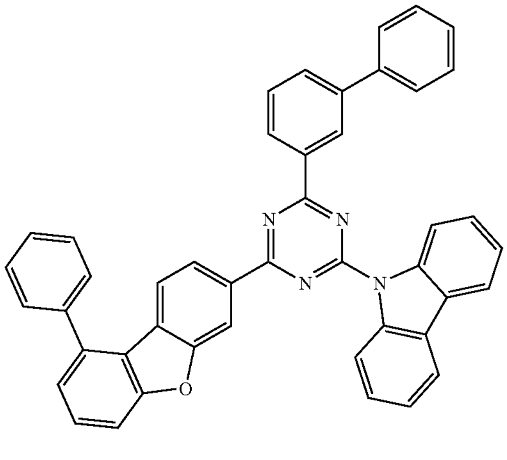
, -continued
H-97
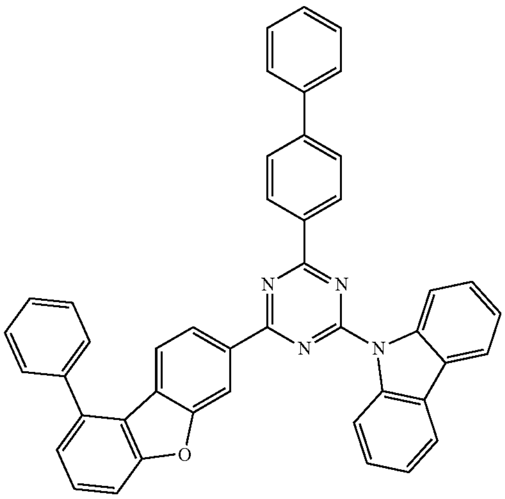
,
H-98
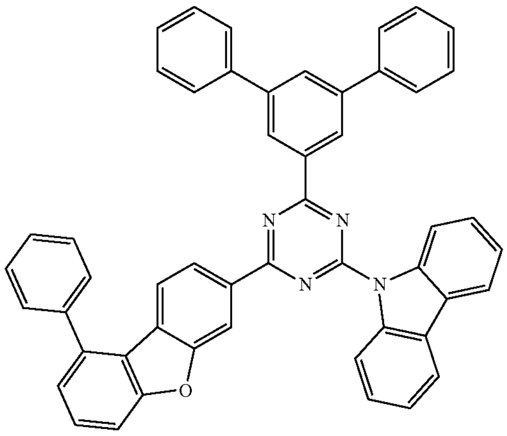
,
H-99
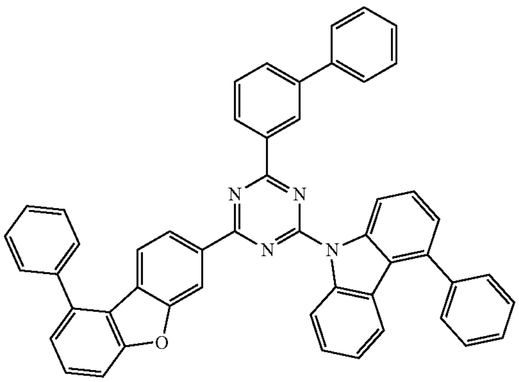
,
H-100
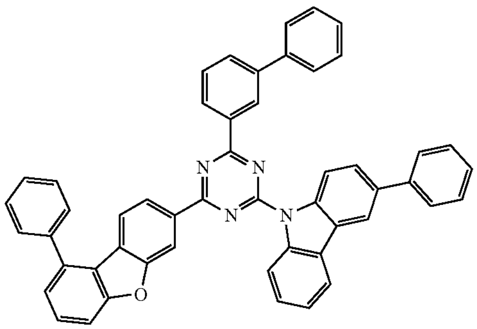
,
H-101
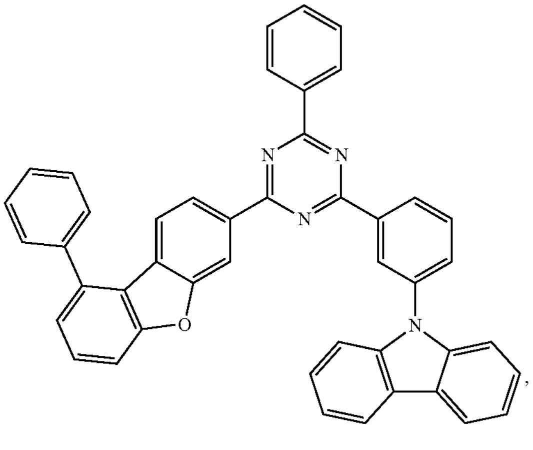
,
H-102
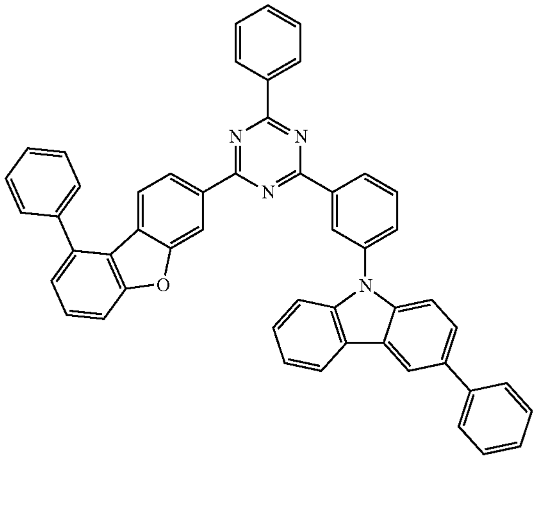
, -continued
H-103
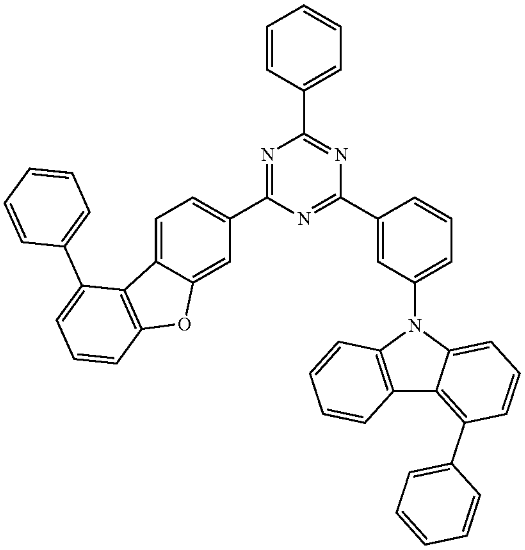
,
H-104
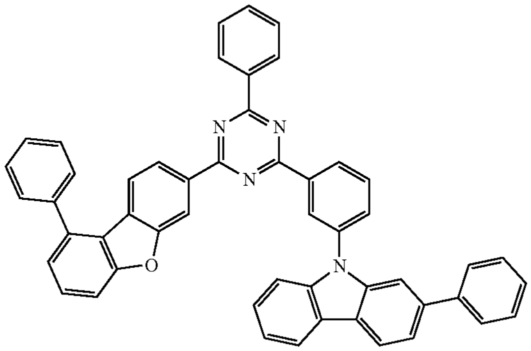
,
H-105
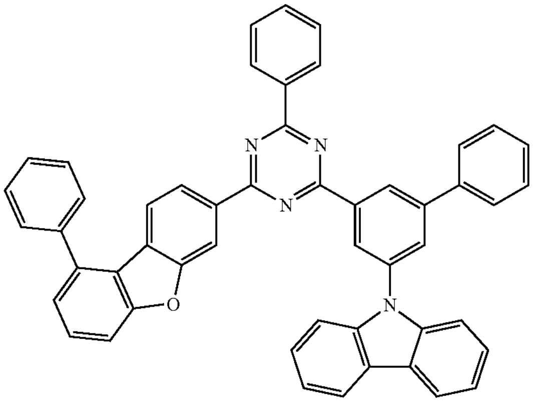
,
H-106
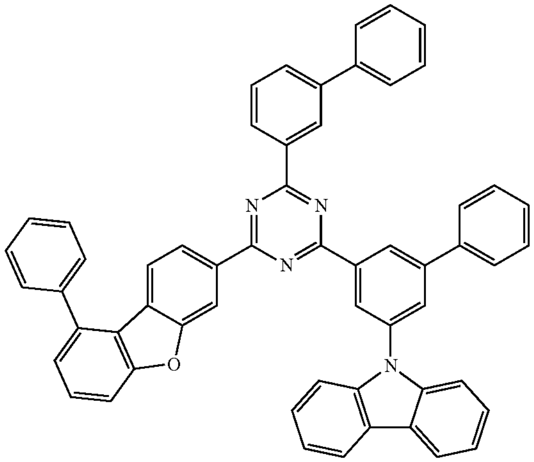
,
H-107
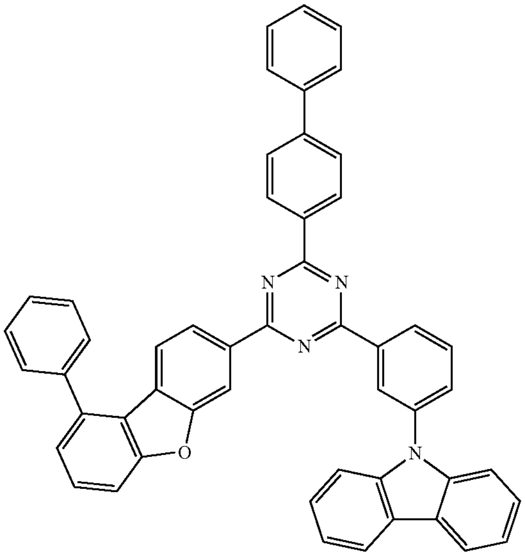
,
H-108
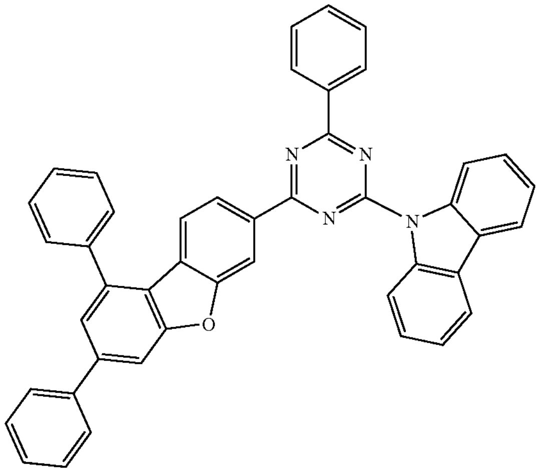
, -continued
H-109
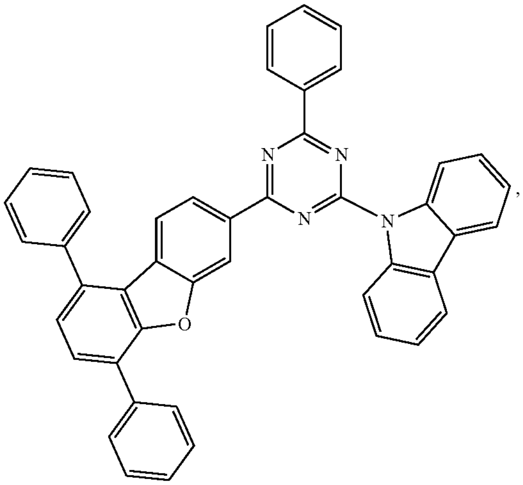
,
H-110
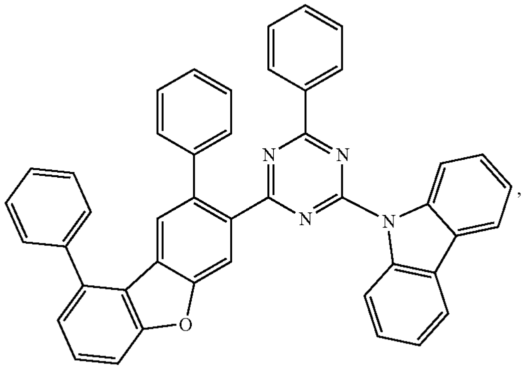
,
H-111
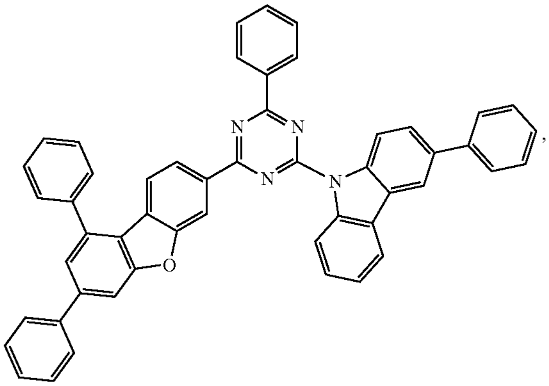
,
H-112
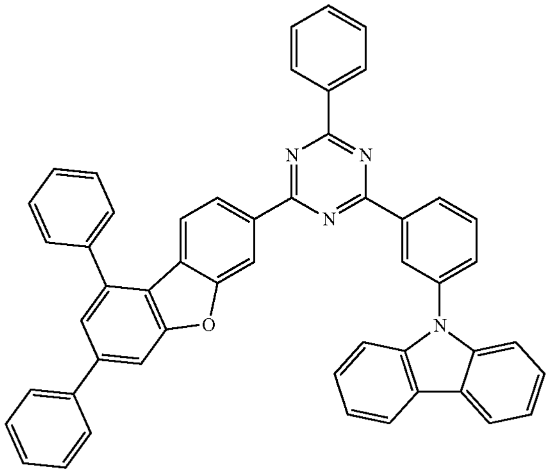
,
H-113
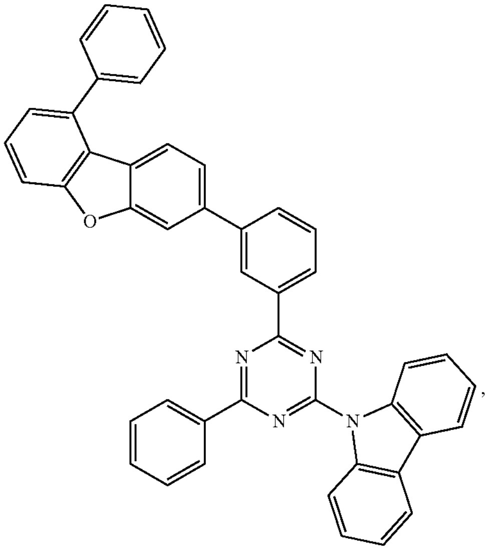
,
H-114
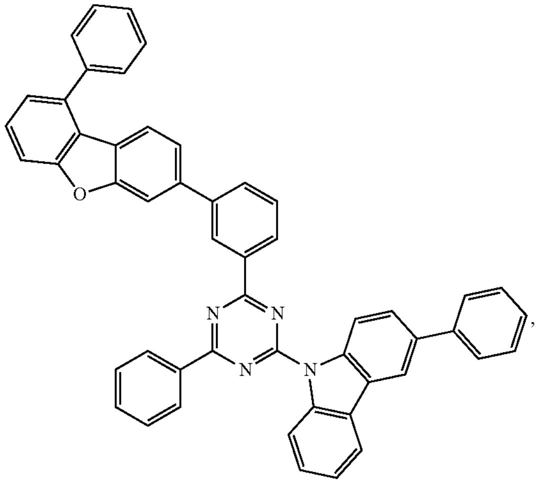
, -continued
H-115
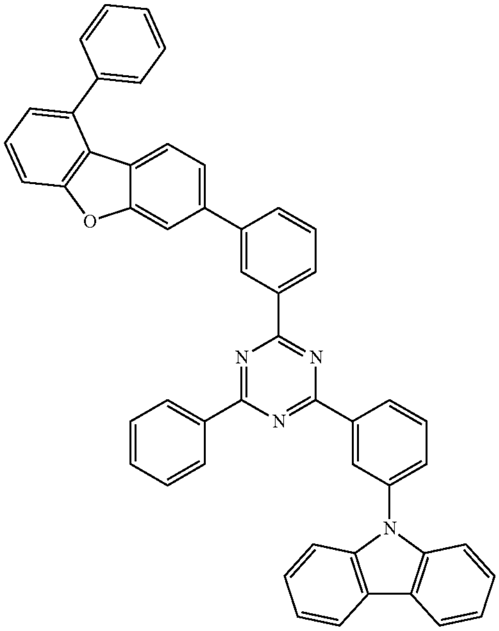
,
H-116
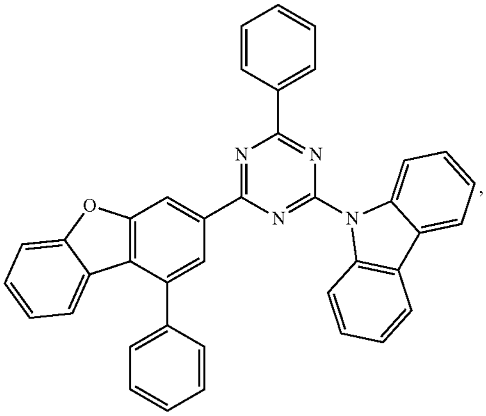
,
H-117
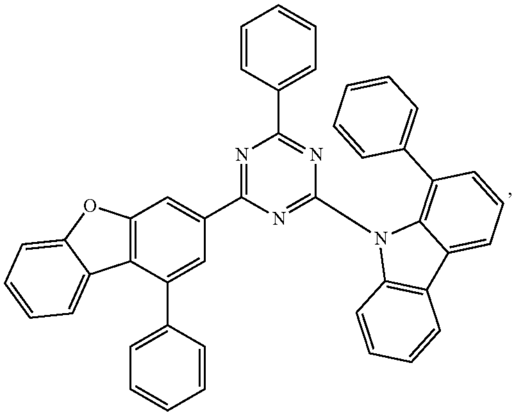
,
H-118
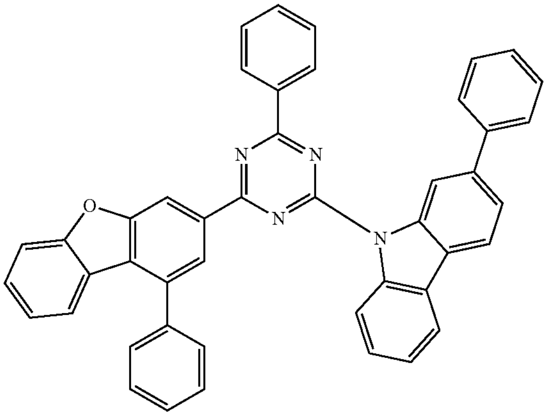
,
H-119
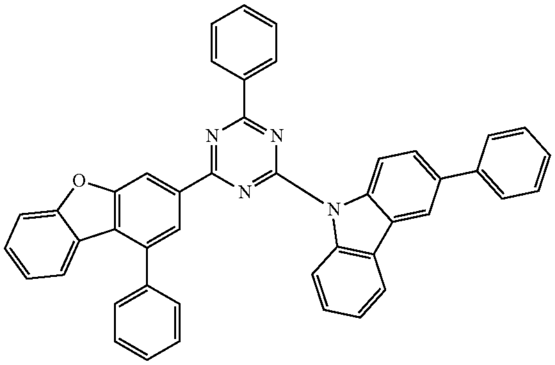
,
H-120
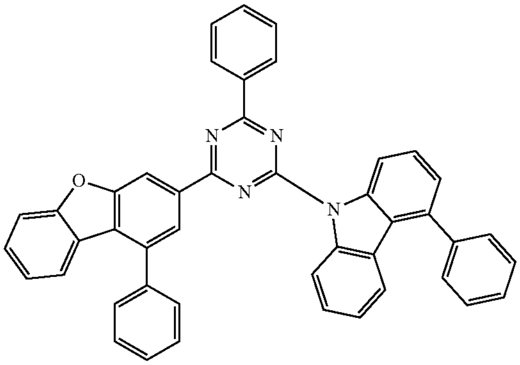
, -continued
H-121
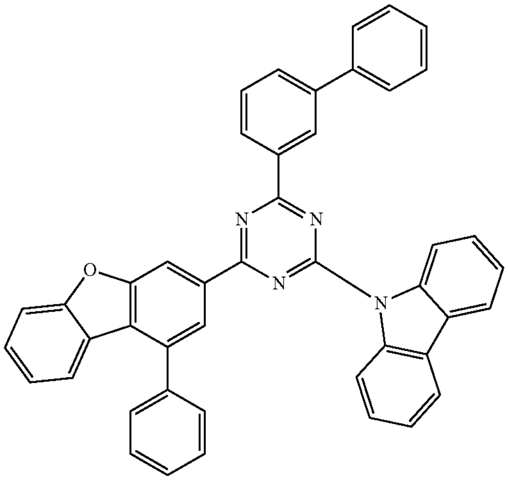
,
H-122
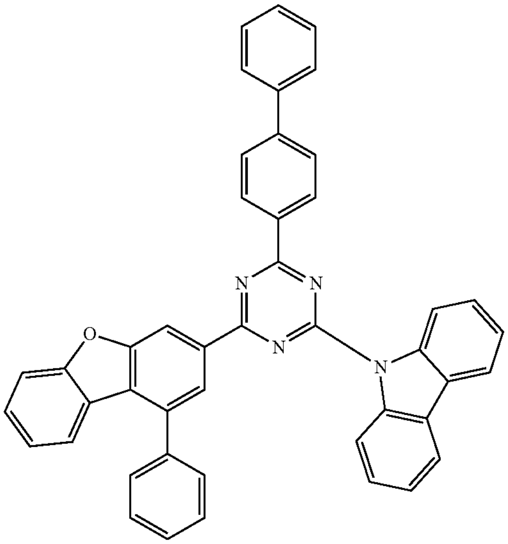
,
H-123
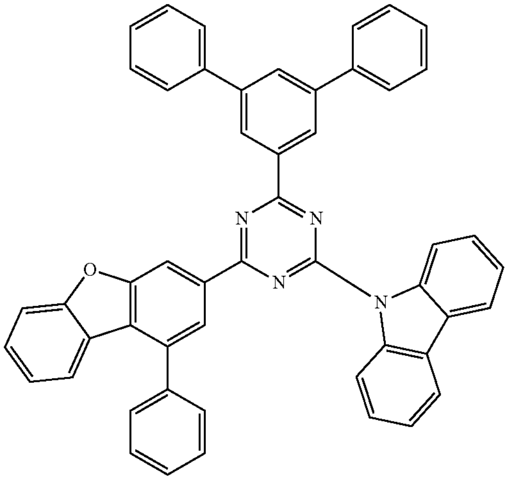
,
H-124
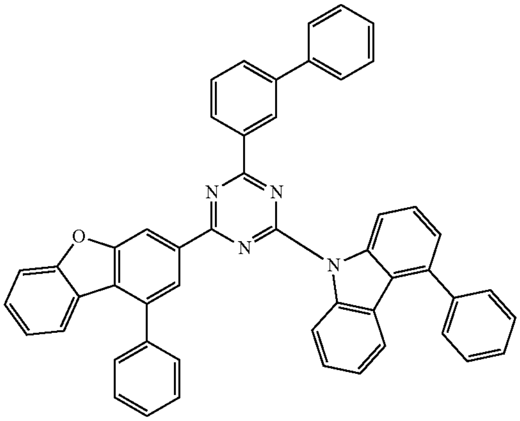
,
H-125
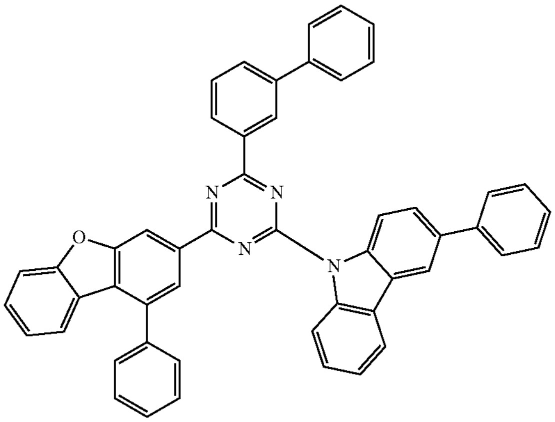
,
H-126
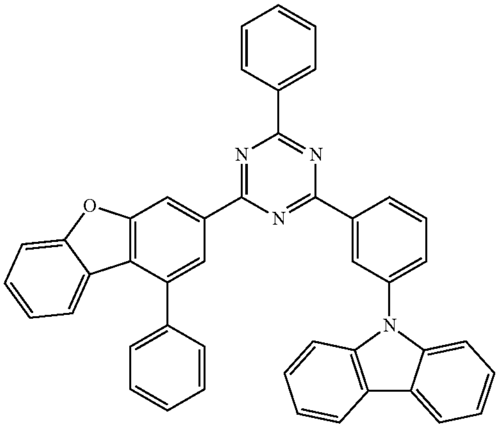
, -continued
H-127
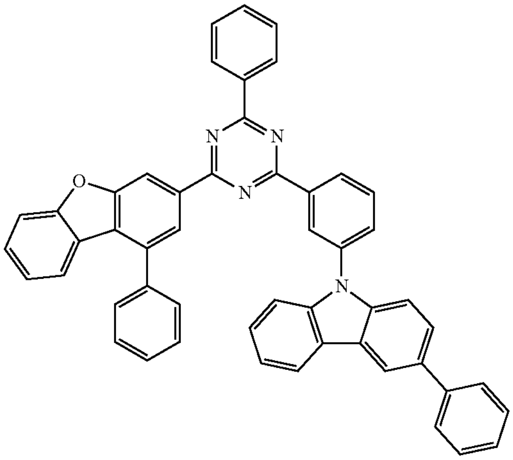
,
H-128
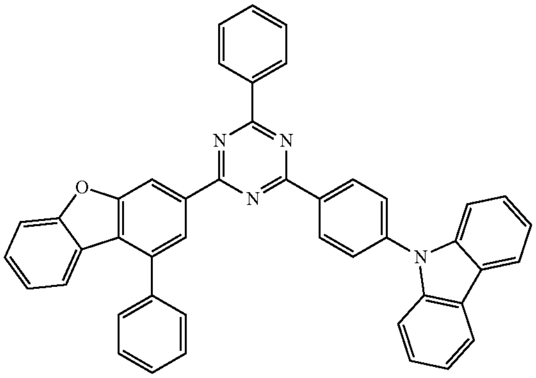
,
H-129
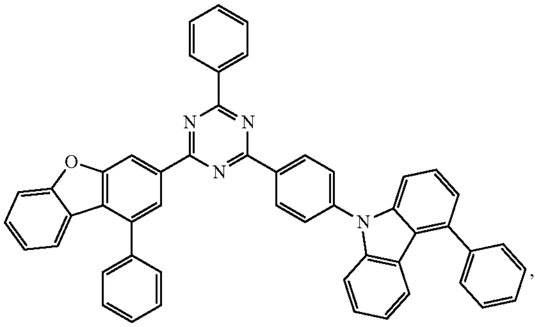
,
H-130
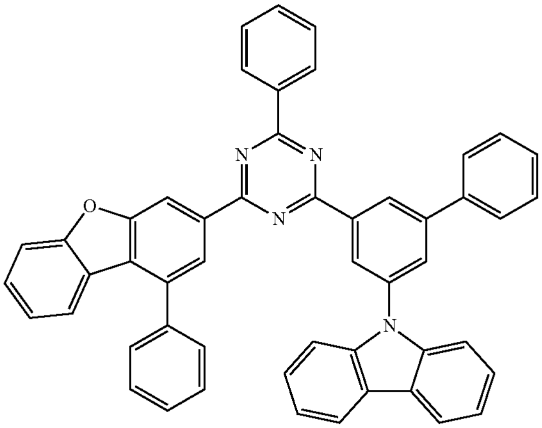
,
H-131
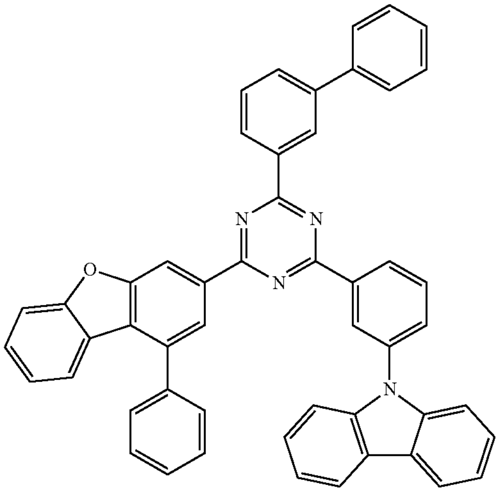
,
H-132
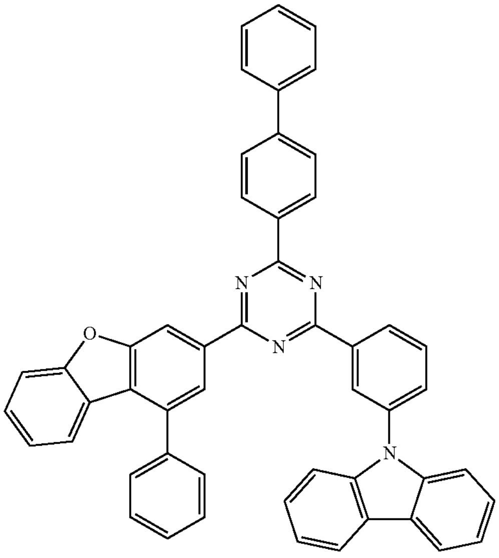
, -continued
H-133
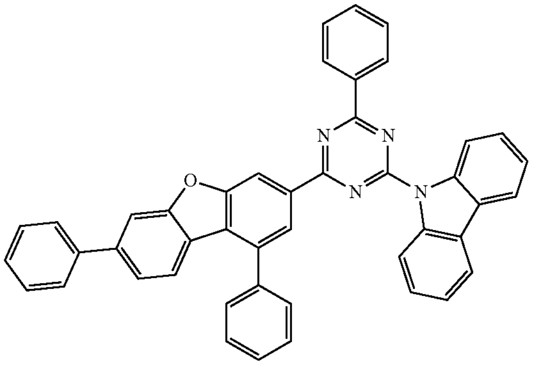
,
H-134
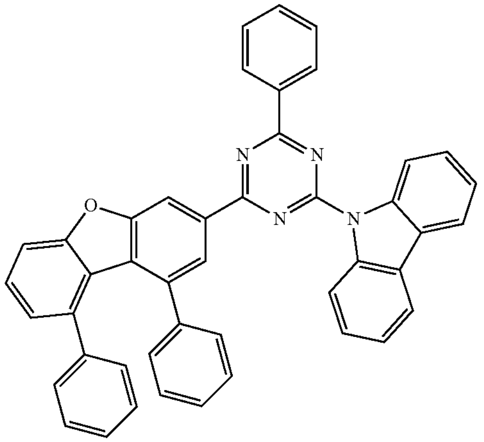
,
H-135
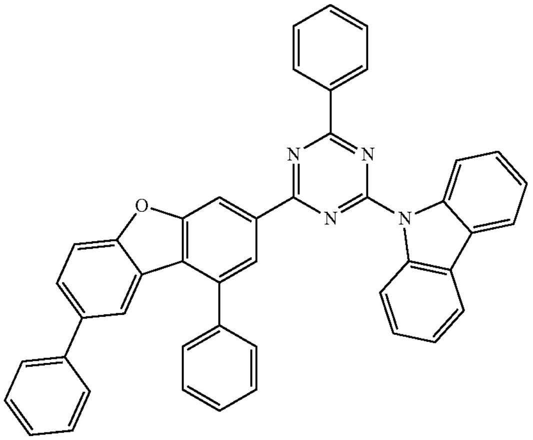
,
H-136
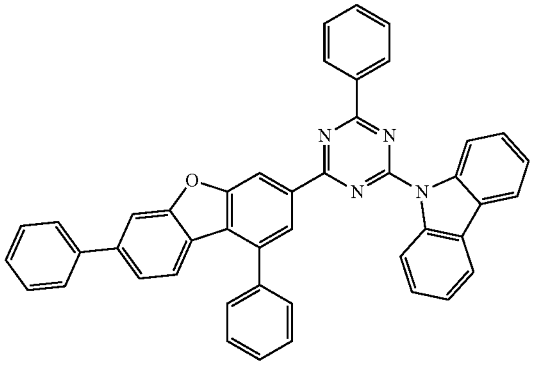
,
H-137
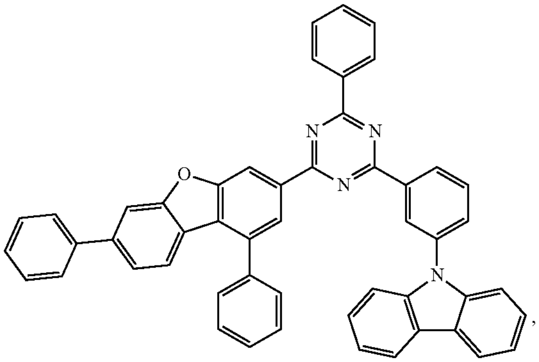
,
H-138
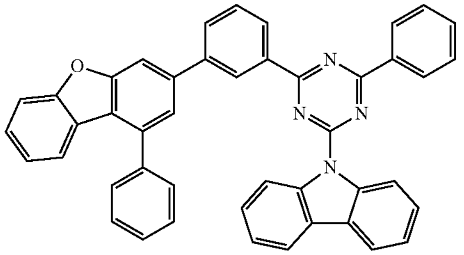
, -continued
H-139
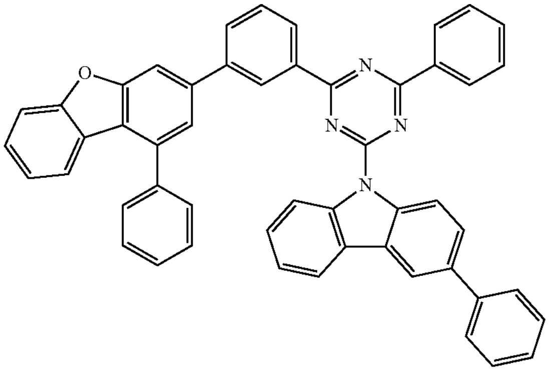
,
H-140
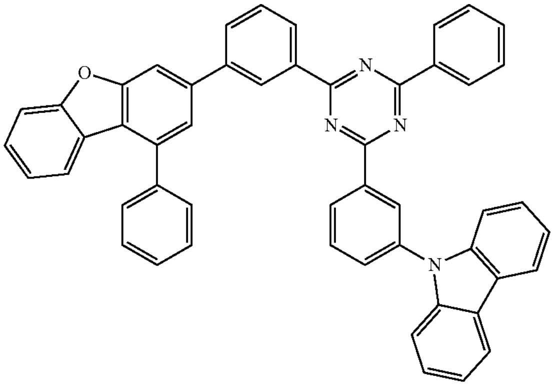
,
H-141
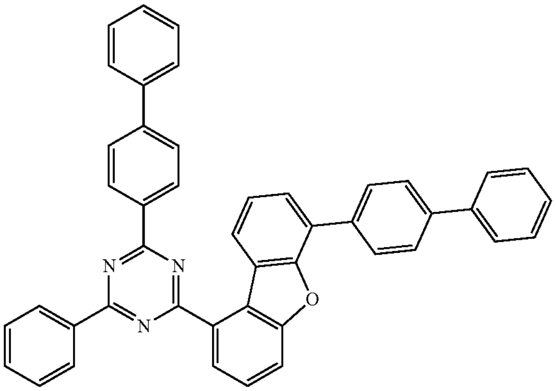
,
H-142
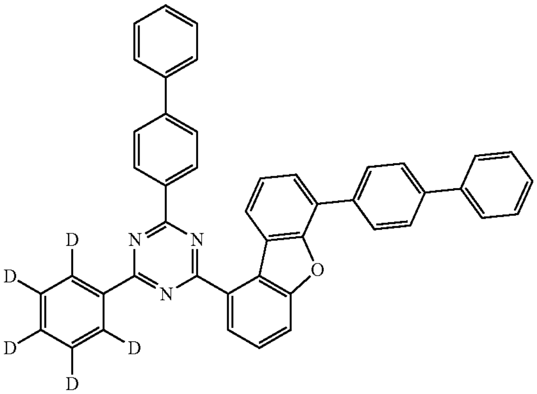
,
H-143
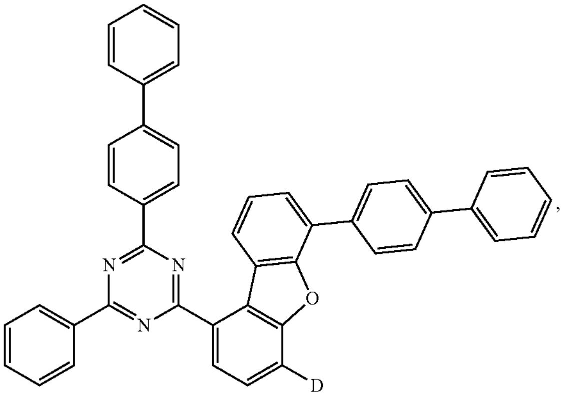
,
H-144
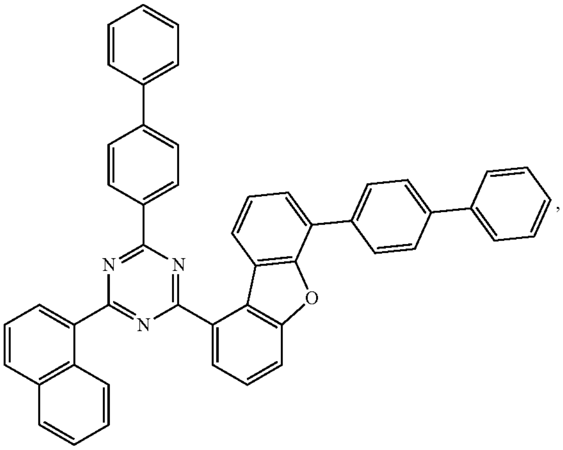
, -continued
H-145
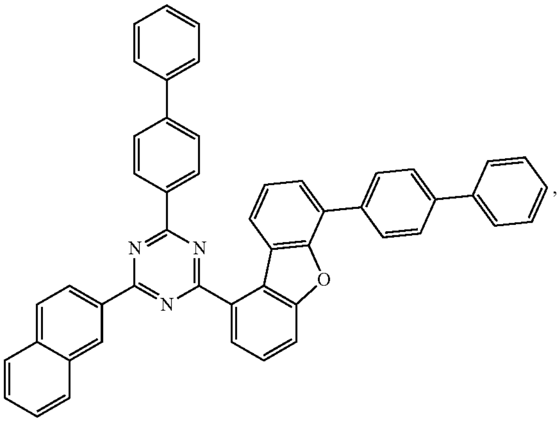
,
H-146
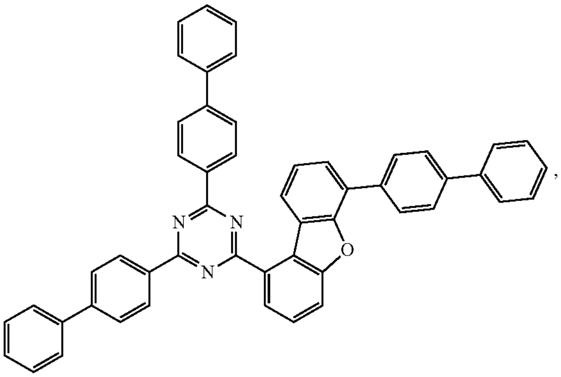
,
H-147
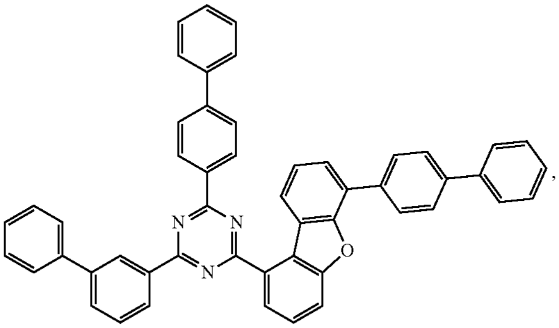
,
H-148
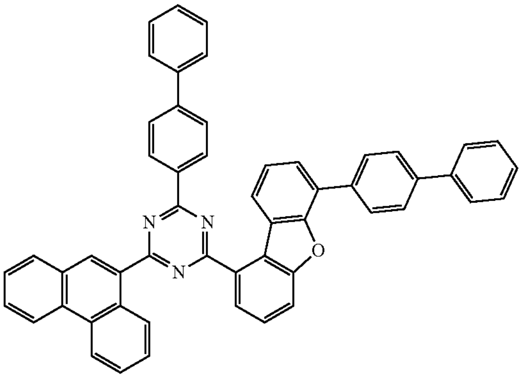
,
H-149
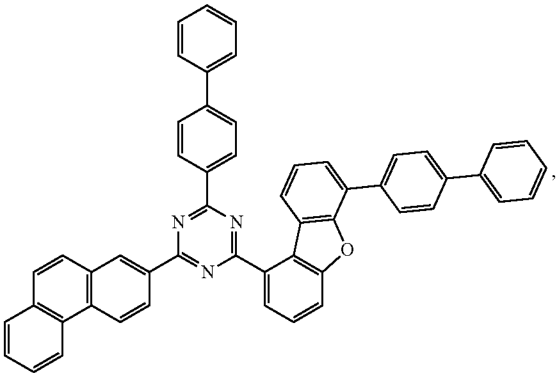
, -continued
H-150
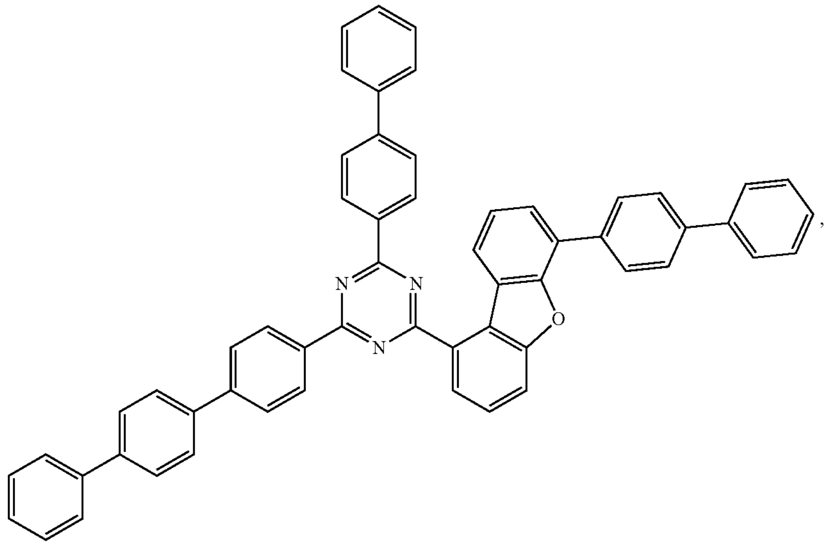,
H-151
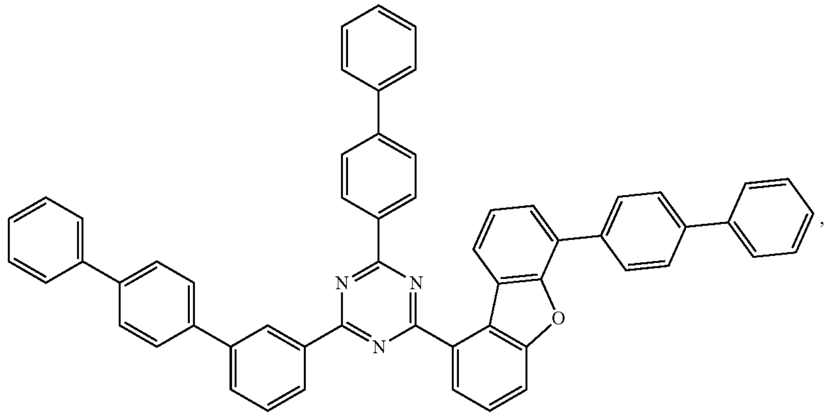,
H-152
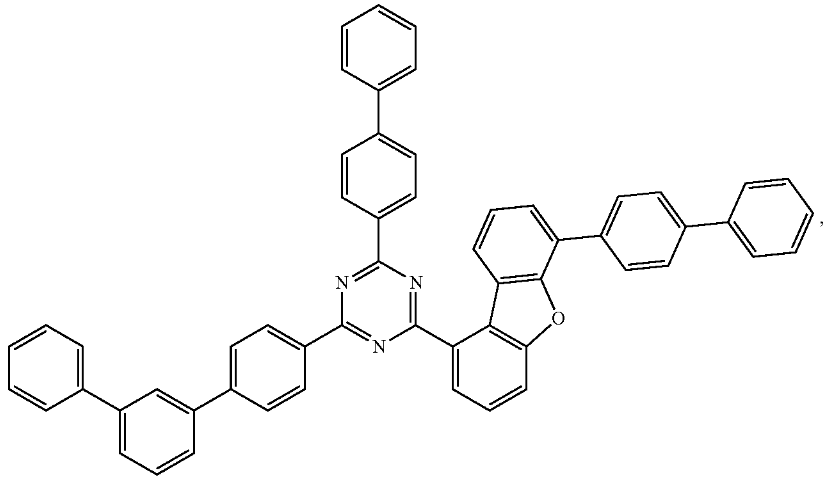, -continued
H-153
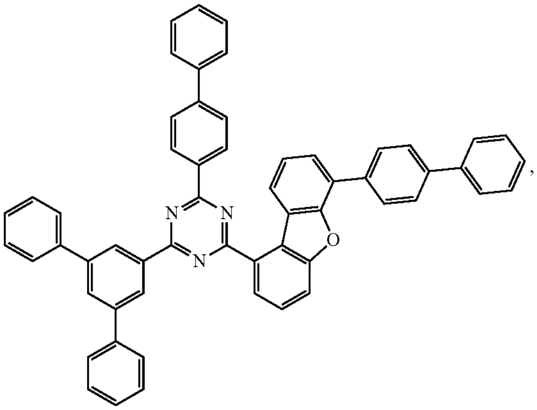
,
H-154
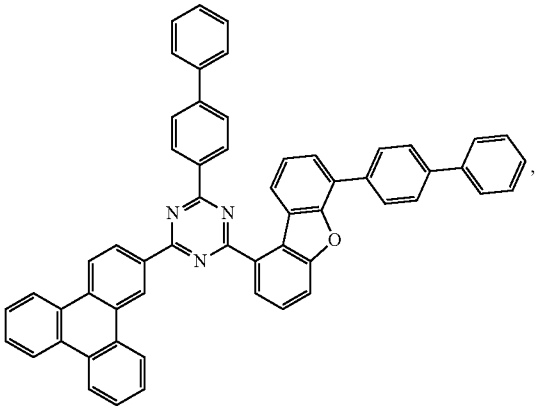
,
H-155
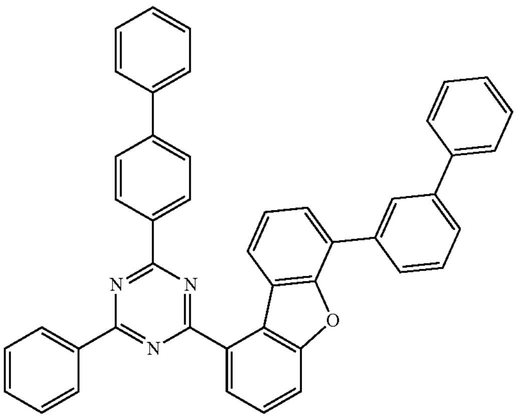
,
H-156
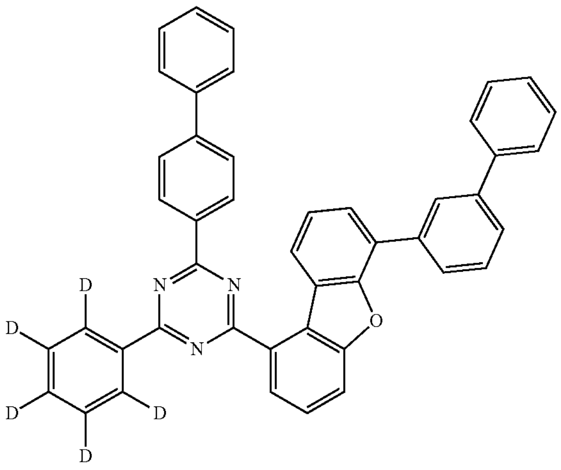
,
H-157
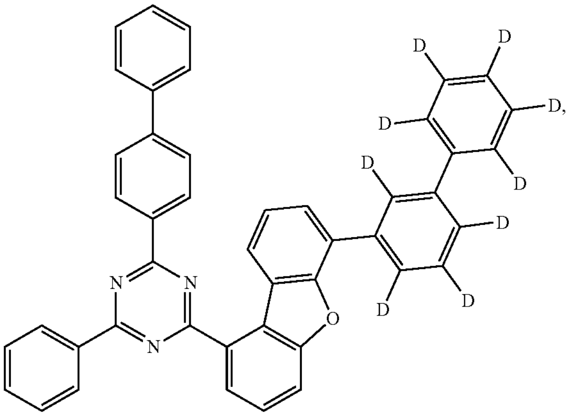
,
H-158
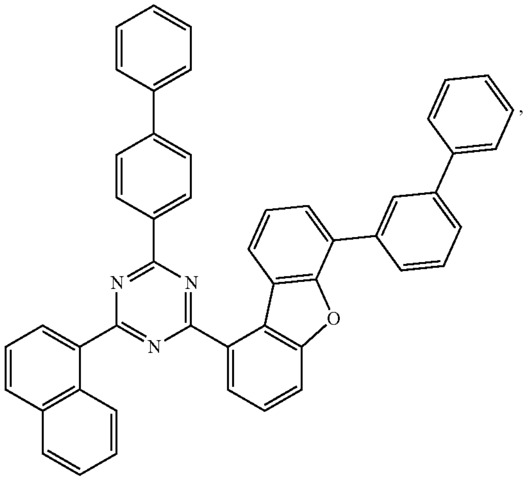
, -continued
H-159
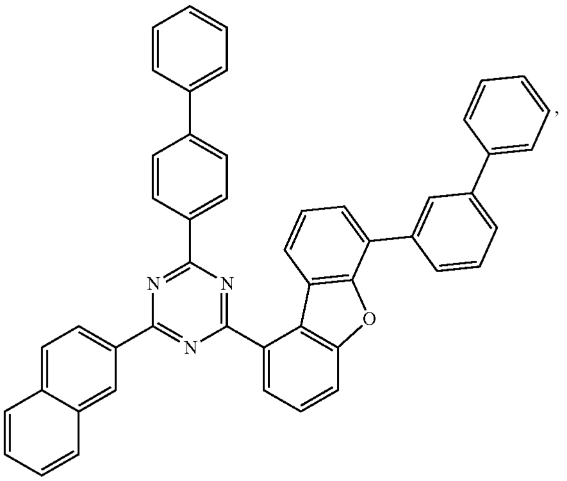
H-160
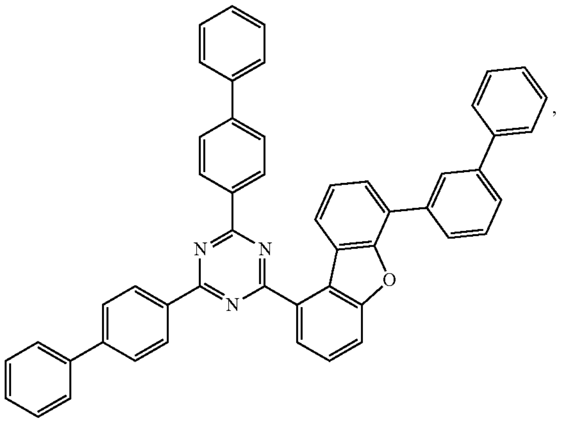
H-161
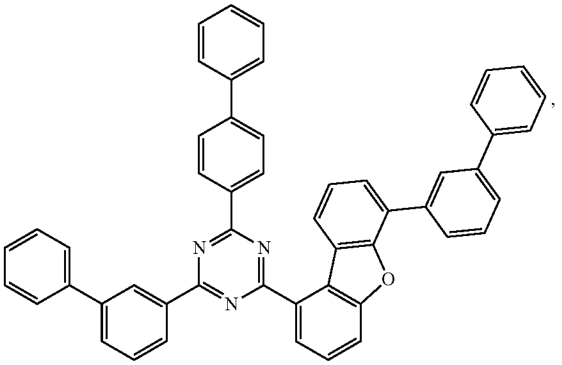
H-162
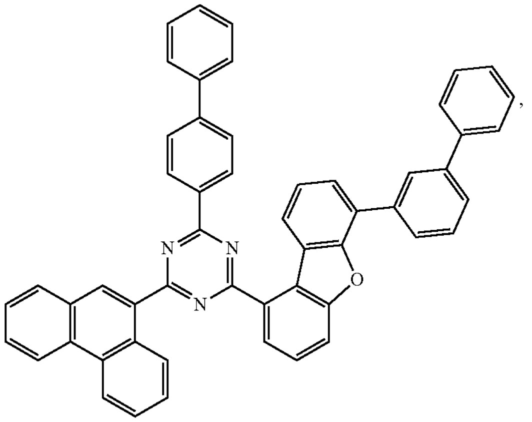
H-163
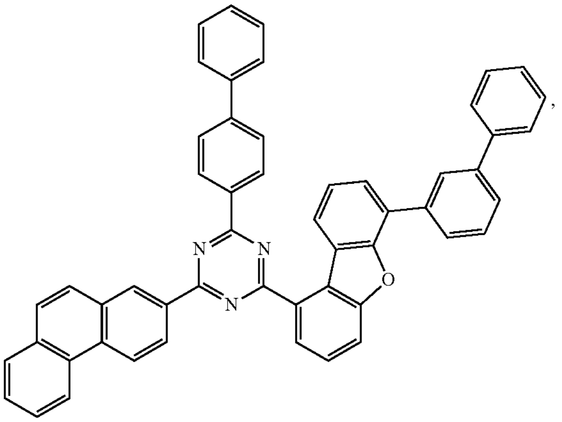
H-164
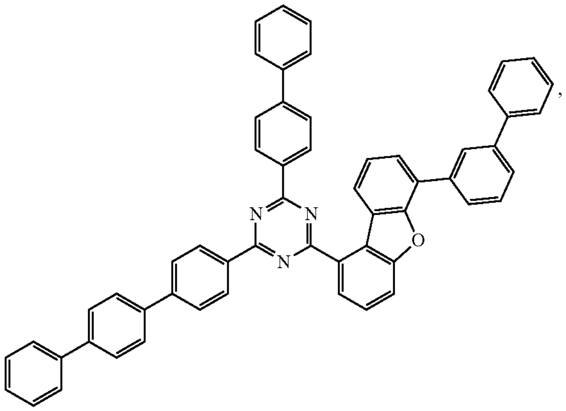

-continued
H-165
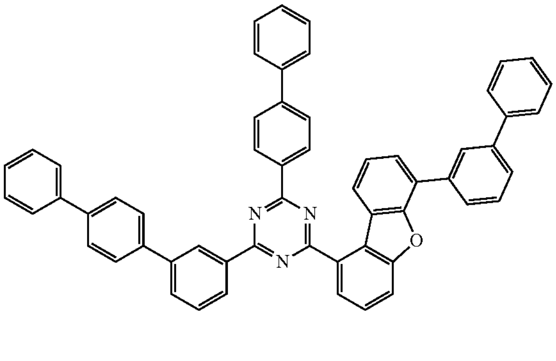
,
H-166
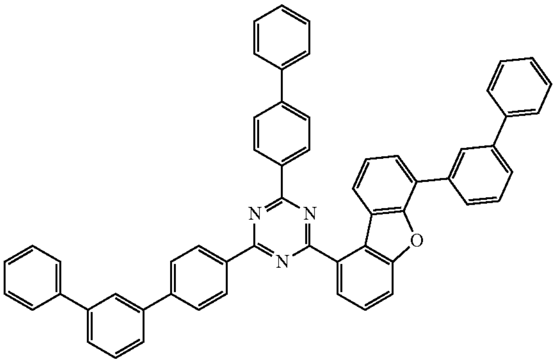
,
H-167
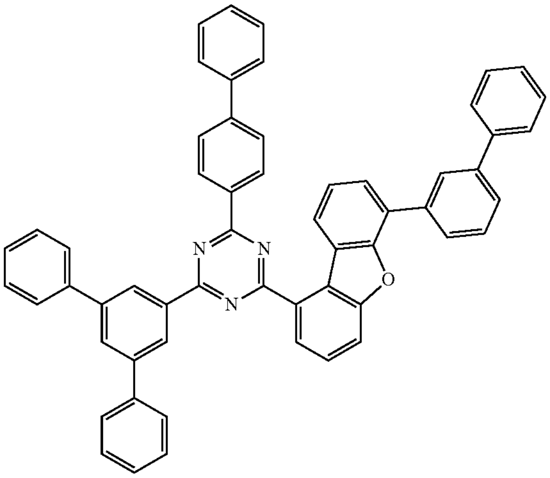
,
H-168
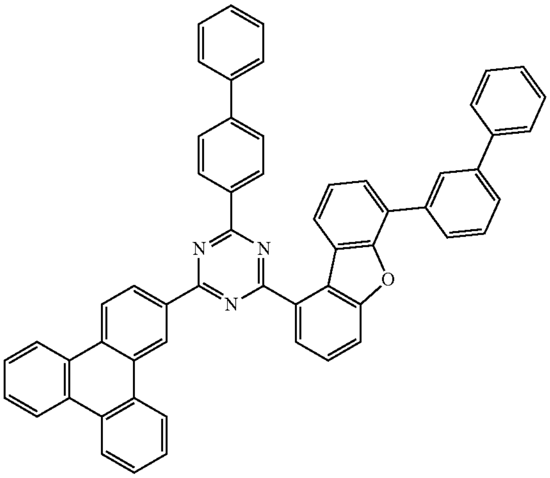
,
H-169
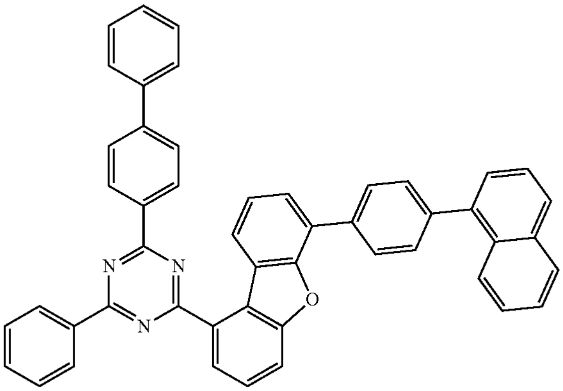
,
H-170
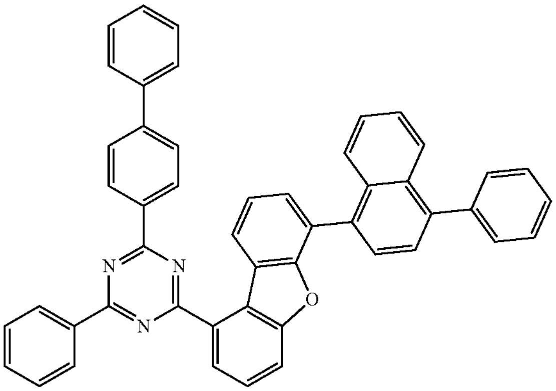
, -continued
H-171
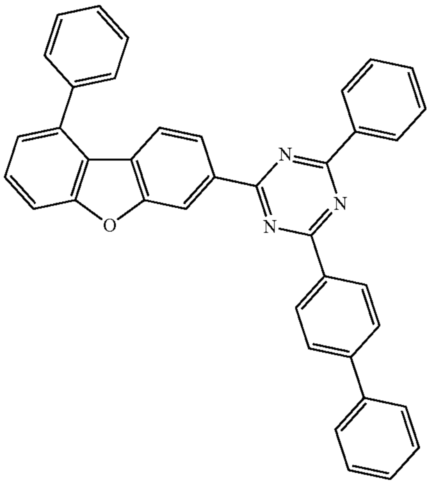,
H-172
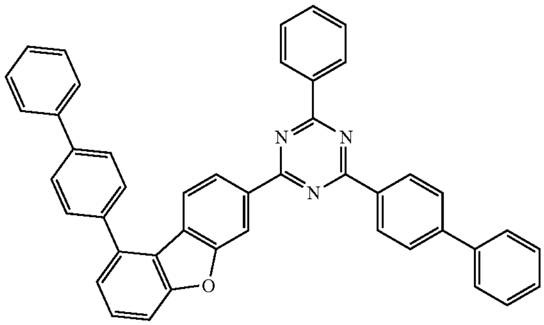,
H-173
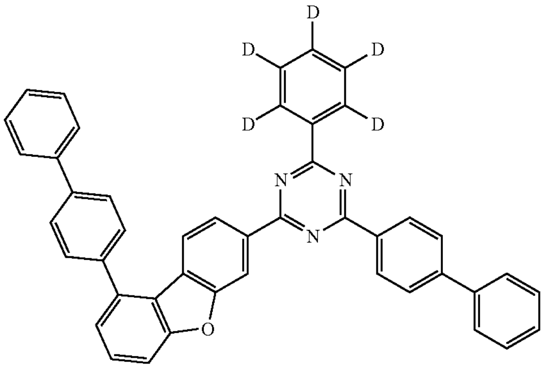,
H-174
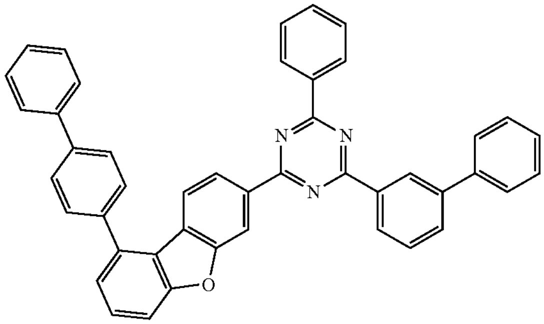,
H-175
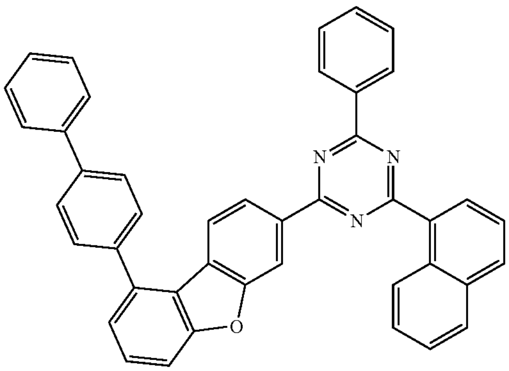,
H-176
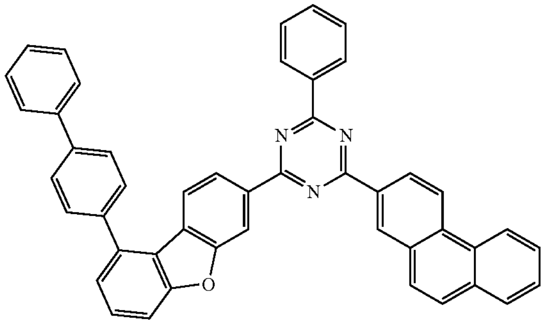,
H-177
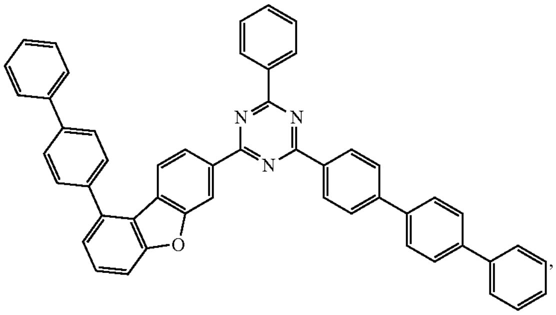,
H-178
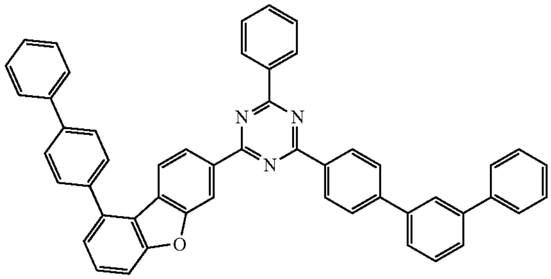, -continued
H-179
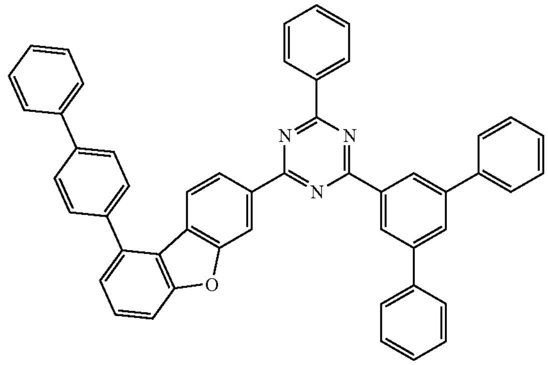
,
H-180
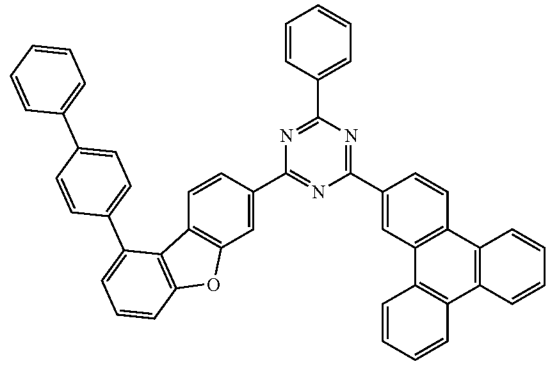
,
H-181
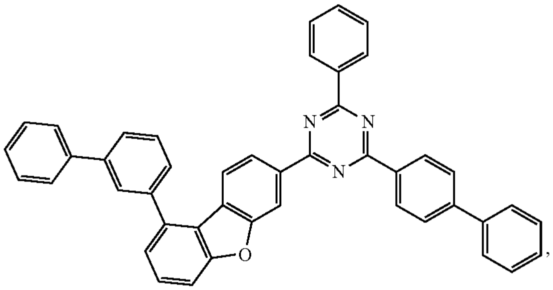
,
H-182
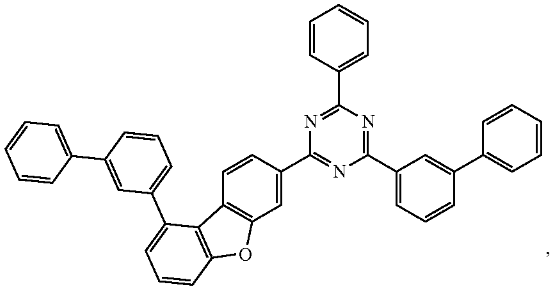
,
H-183
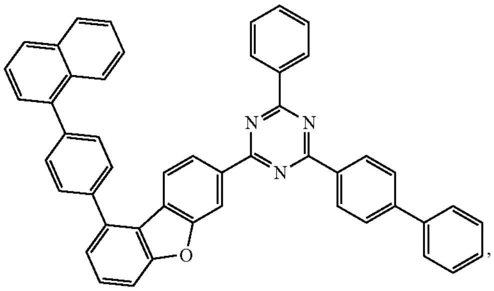
,
H-184
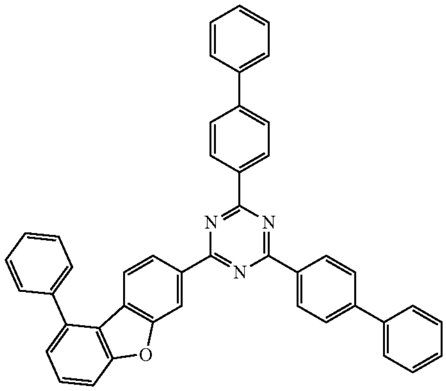
,
H-185
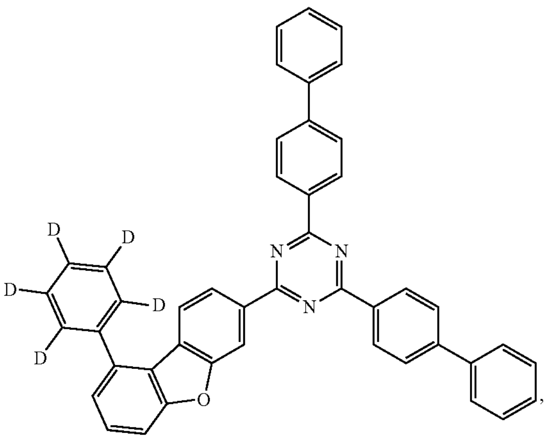
,
H-186
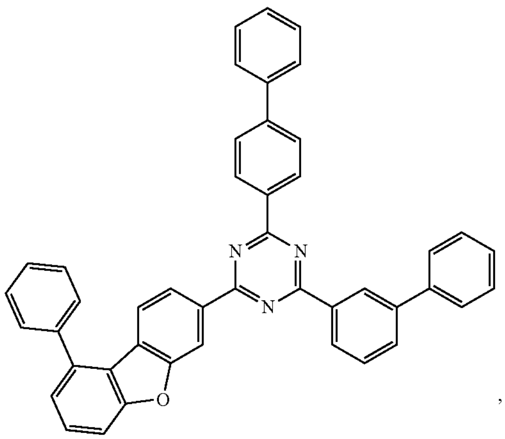
, -continued
H-187
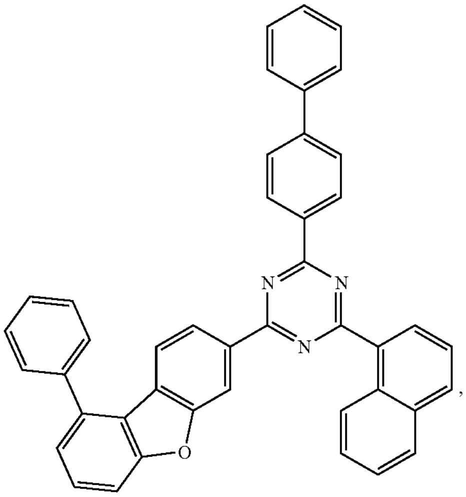
H-188
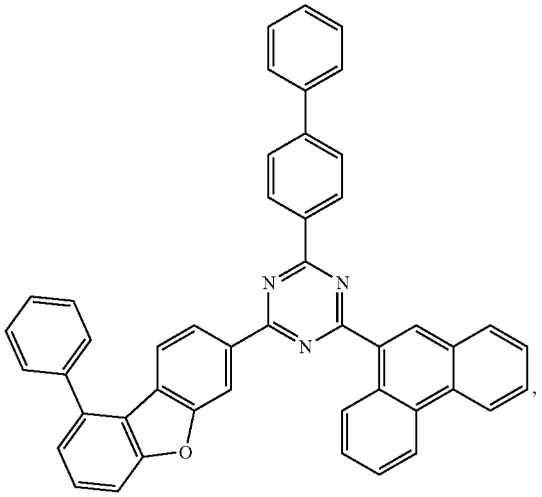
H-189
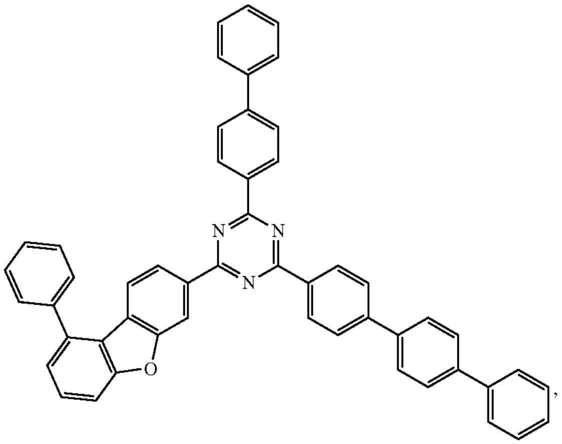
H-190
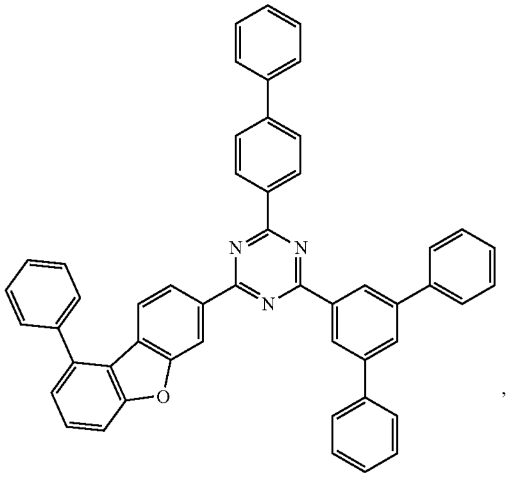
H-191
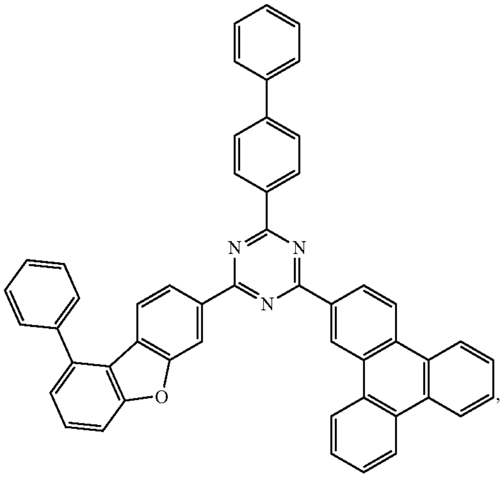
H-192
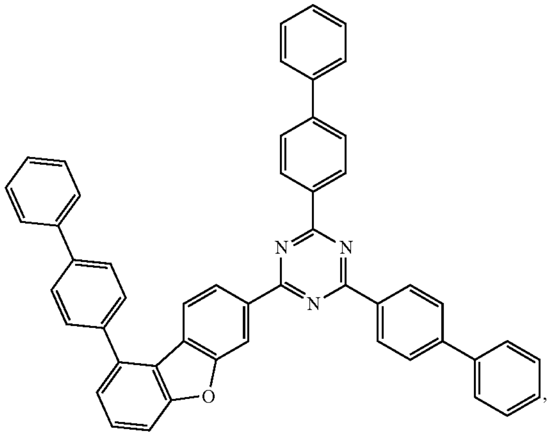

-continued
H-193
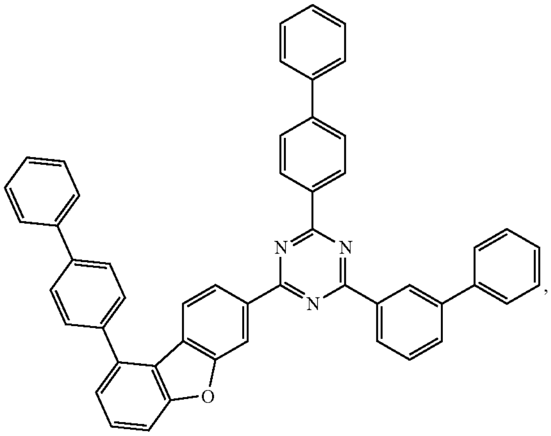
,
H-194
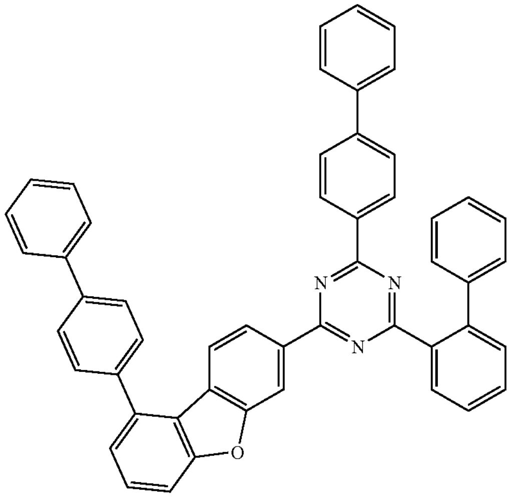
,
H-195
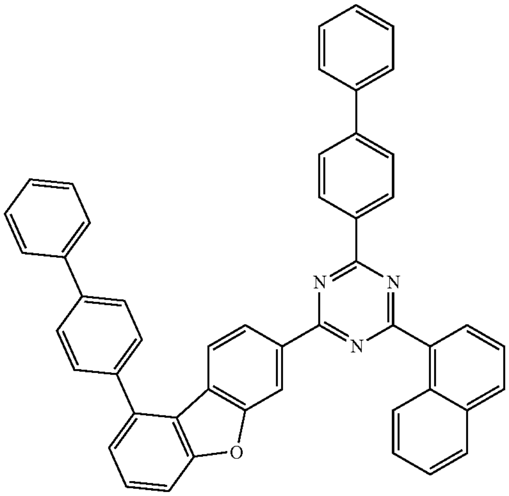
,
H-196
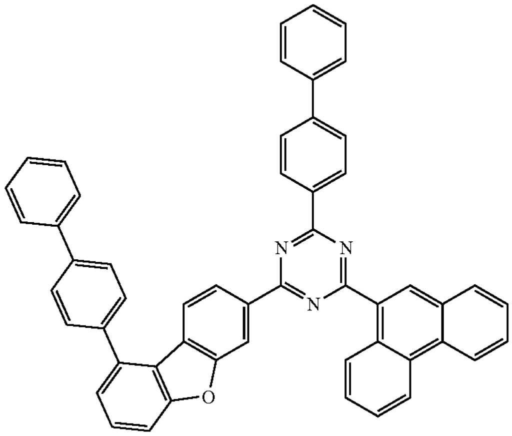
,
H-197
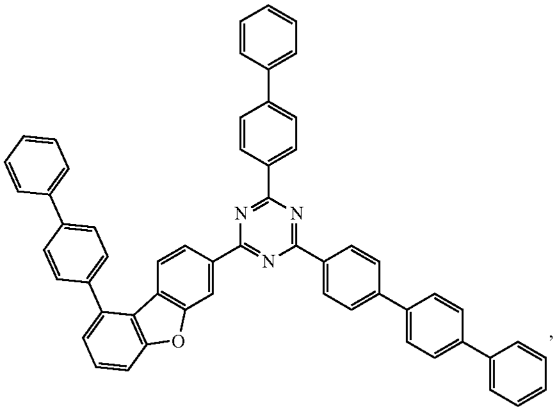
,
H-198
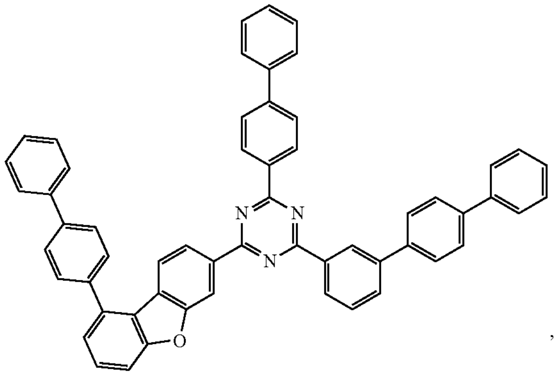
, -continued
H-199
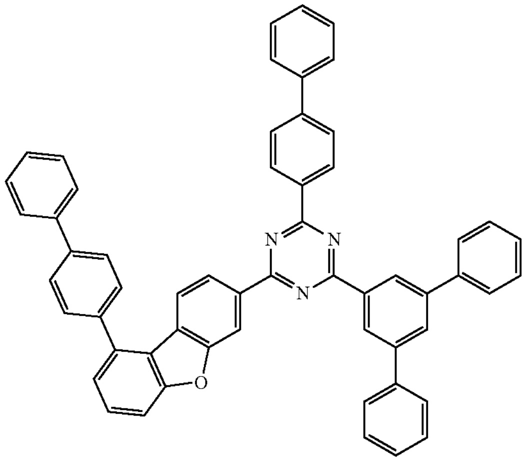
,
H-200
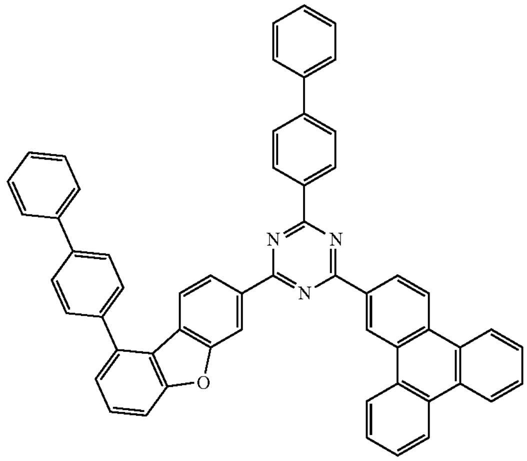
,
H-201
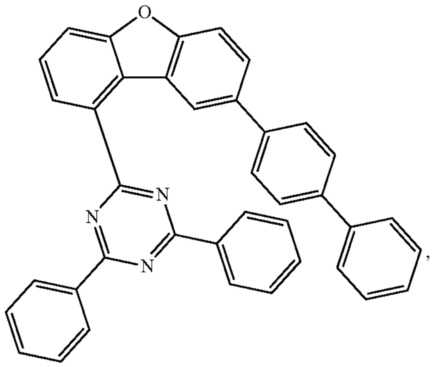
,
H-202
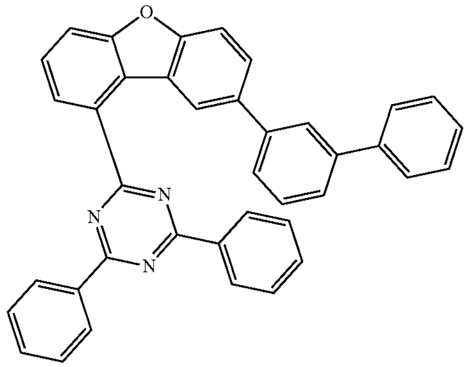
,
H-203
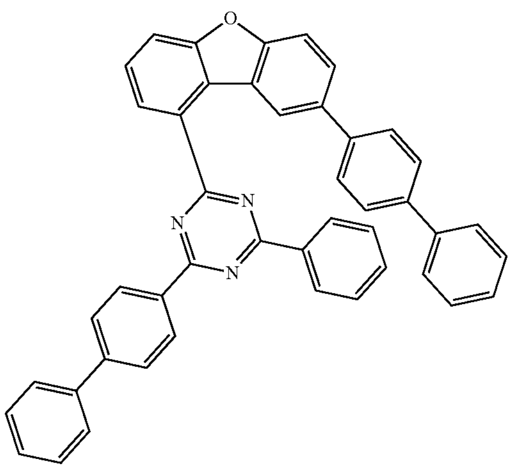
,
H-204
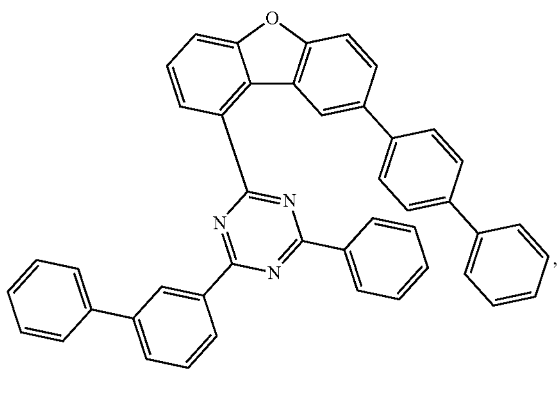
, -continued
H-205
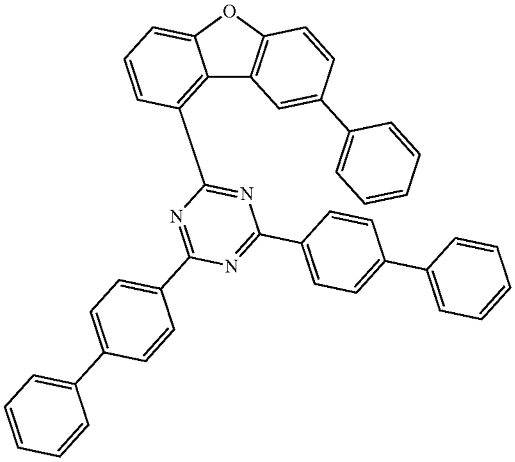
,
H-206
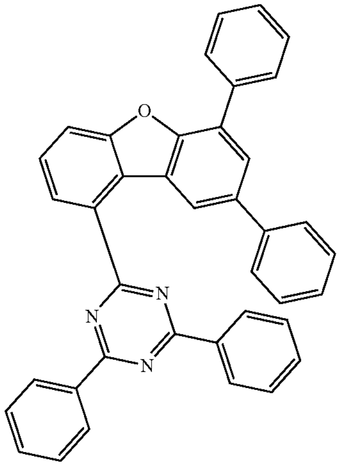
,
H-207
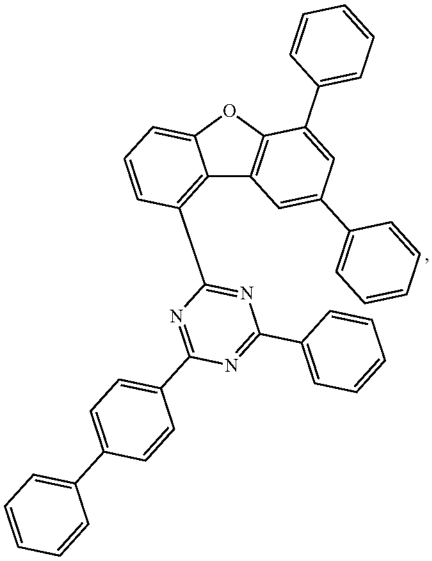
,
H-208
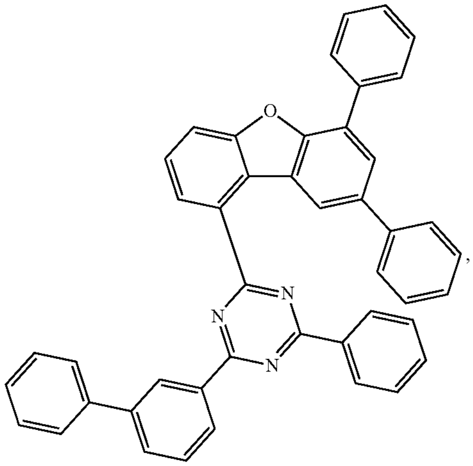
,
H-209
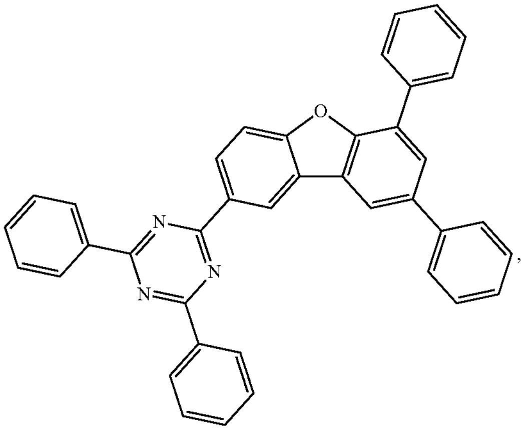
,
H-210
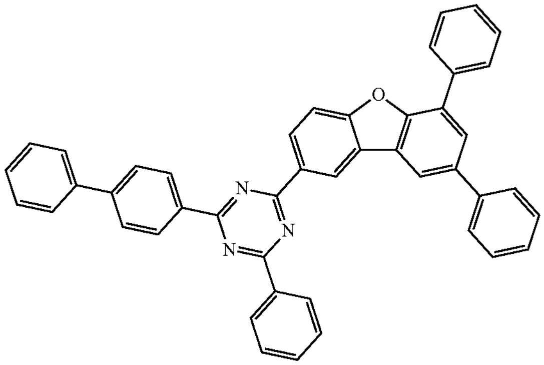
, -continued
H-211
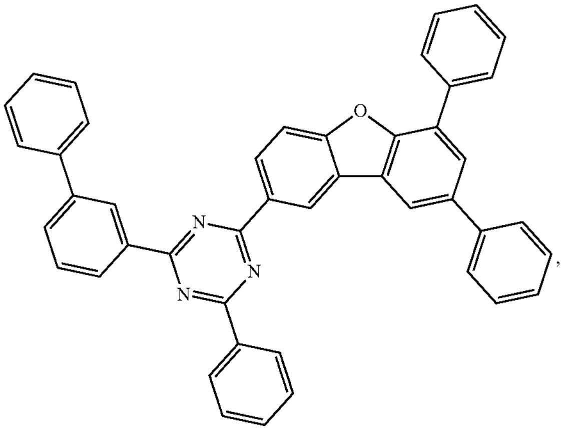
H-212
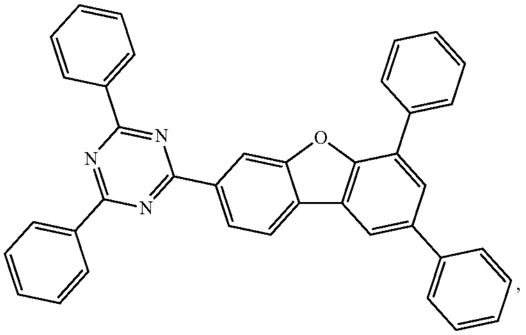
H-213
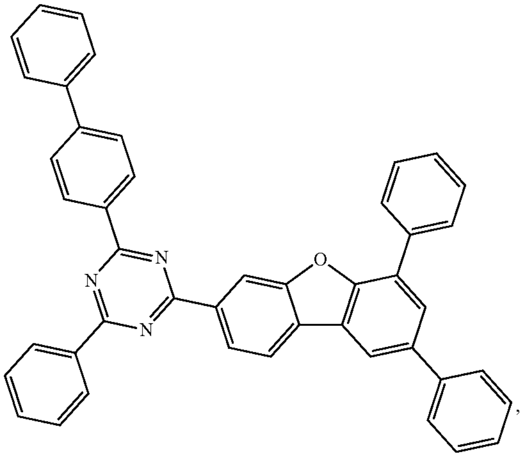
H-214
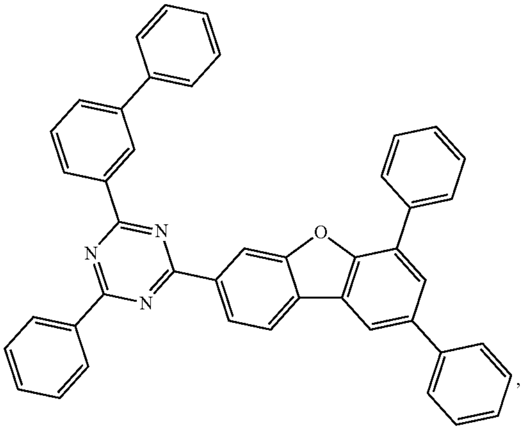
H-215
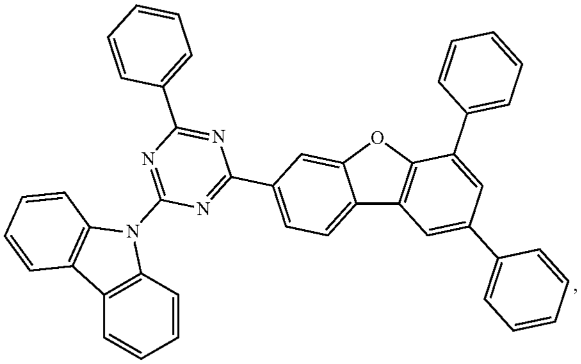
H-216
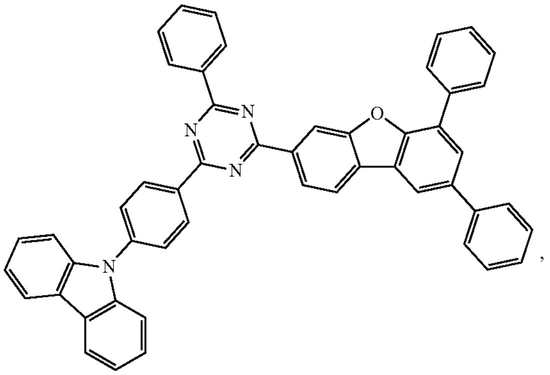

-continued
H-217
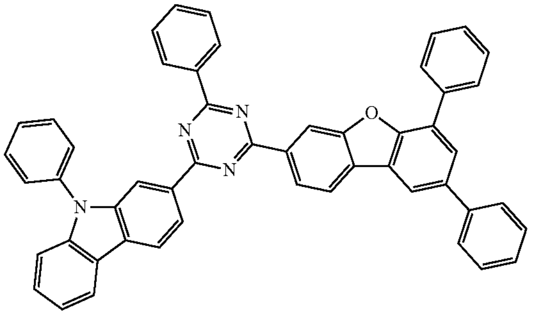
,
H-218
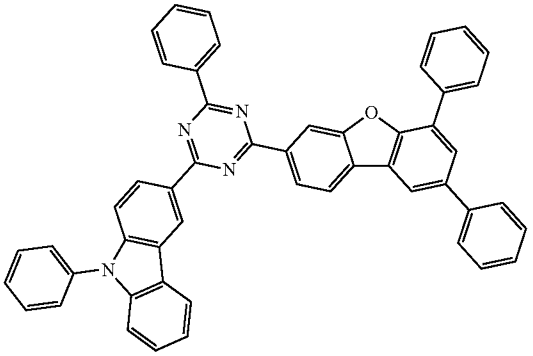
,
H-219
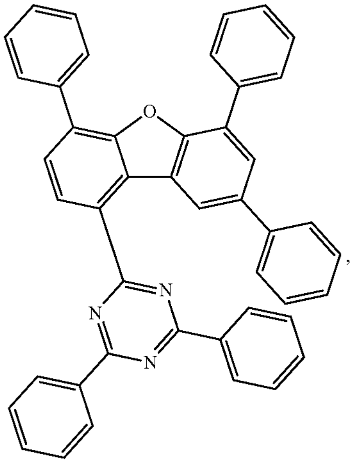
,
H-220
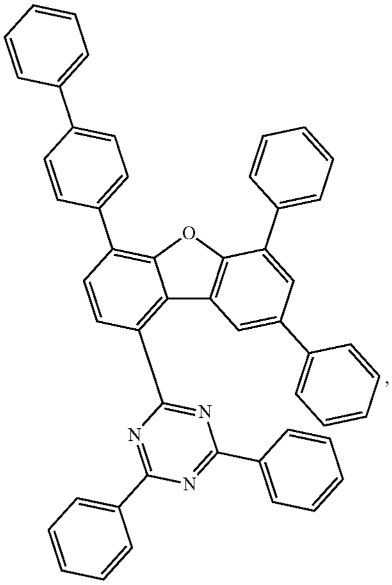
,
H-221
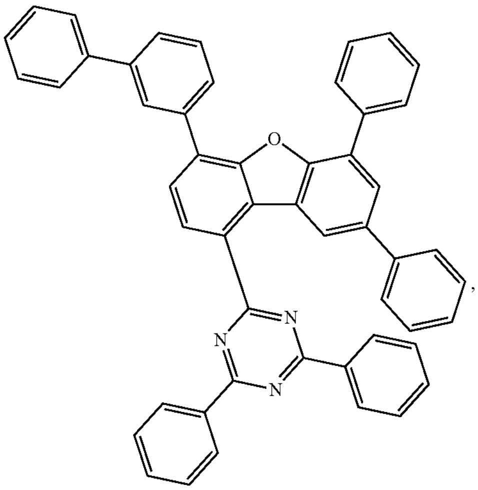
,
H-222
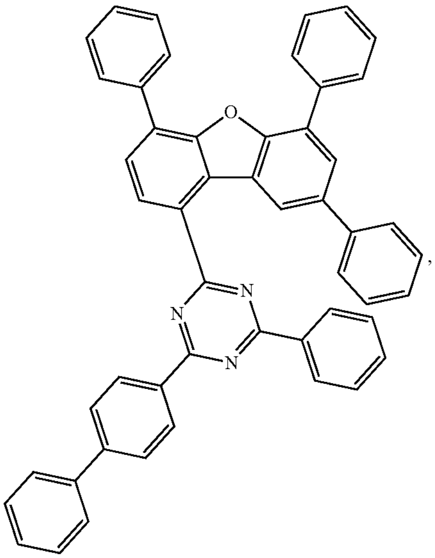
, -continued
H-223
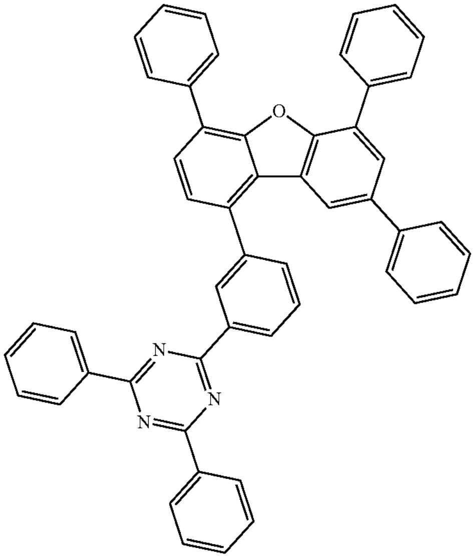
,
H-224
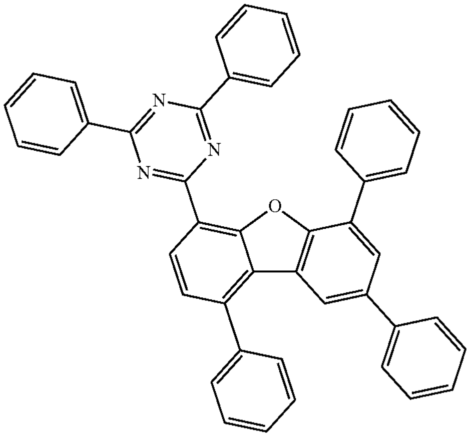
,
H-225
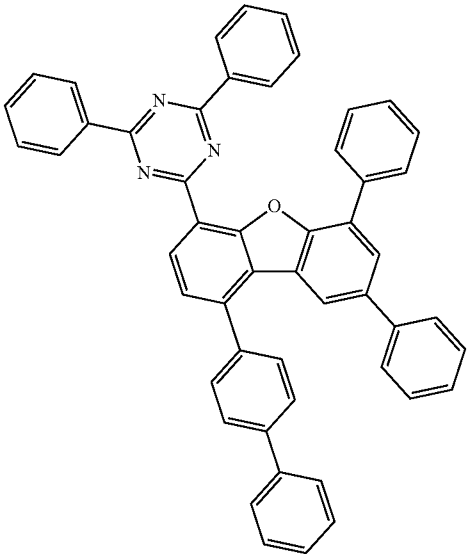
,
H-226
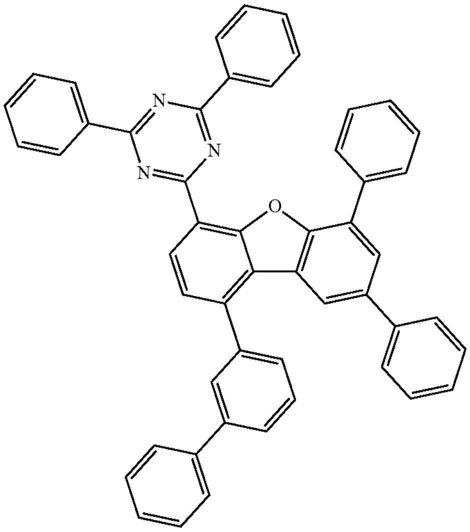
,
H-227
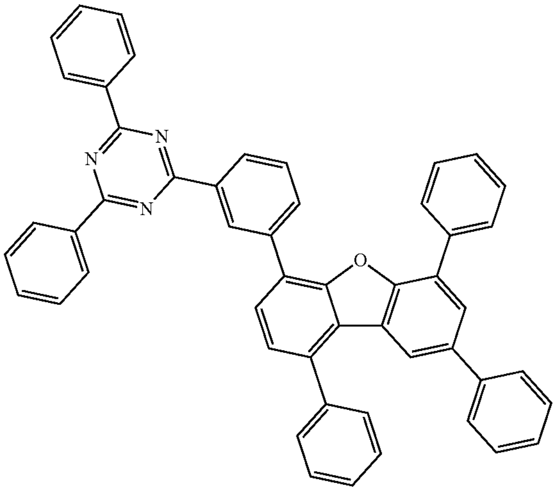
,
H-228
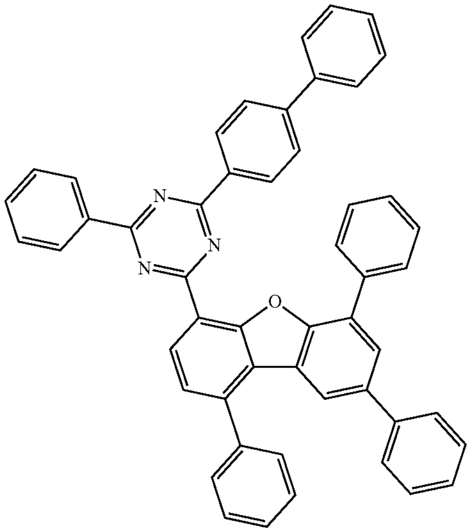
, -continued
H-229
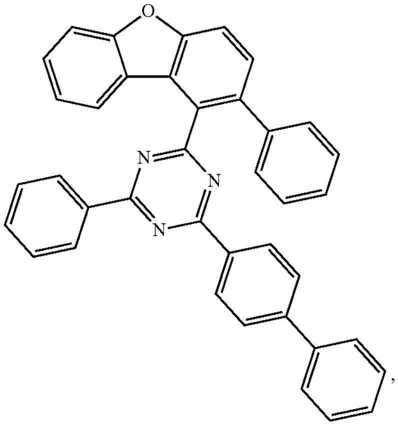,
H-230
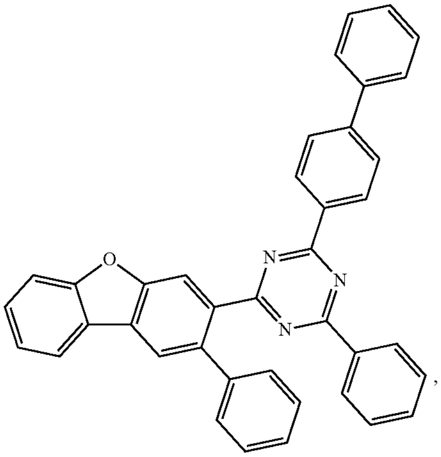,
H-231
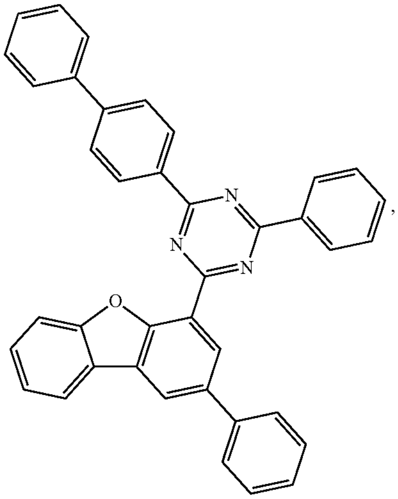,
H-232
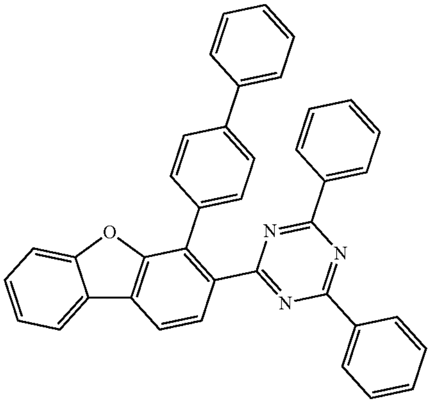,
H-233
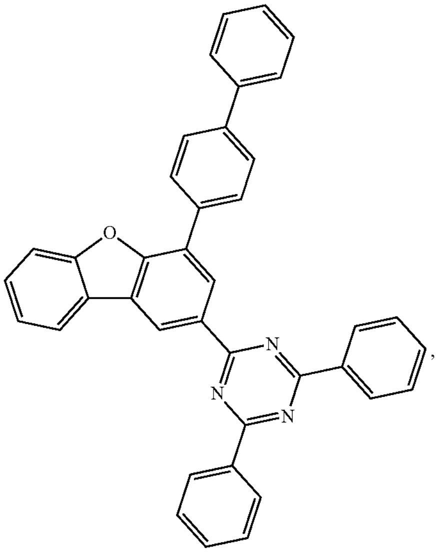, -continued
H-234
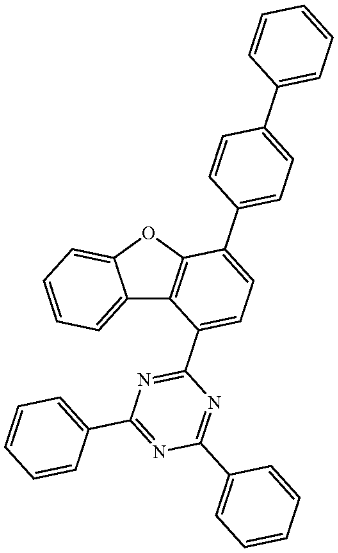
,
H-235
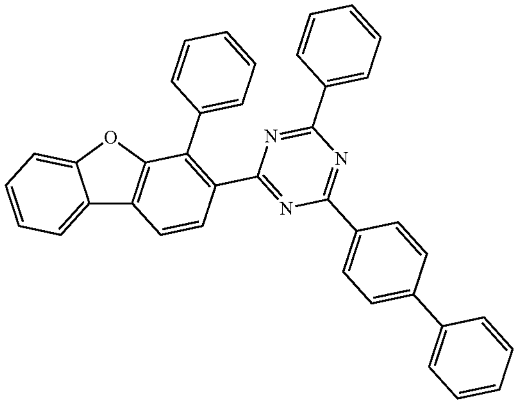
,
H-236
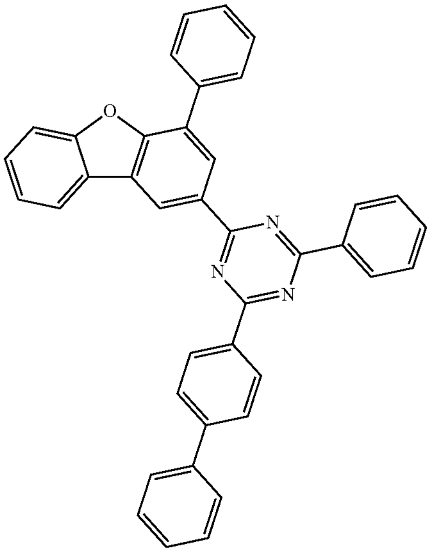
,
H-237
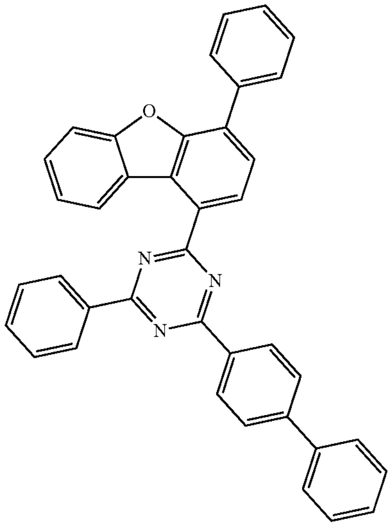
,
H-238
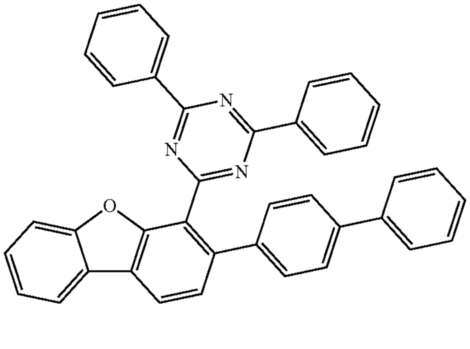
,
H-239
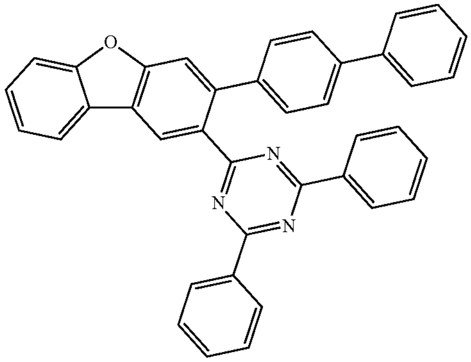
, -continued
H-240
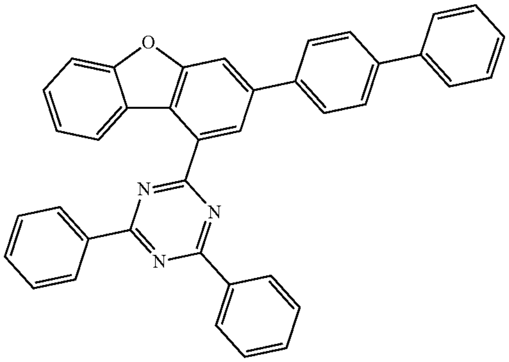
,
H-241
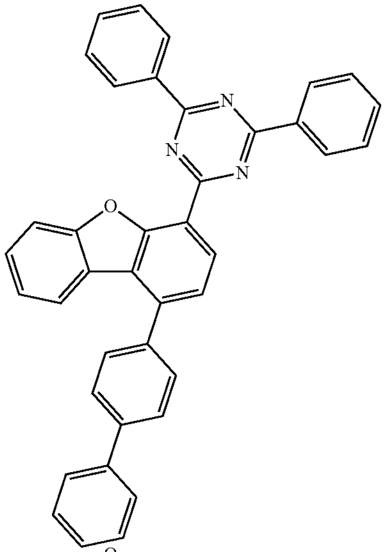
,
H-242
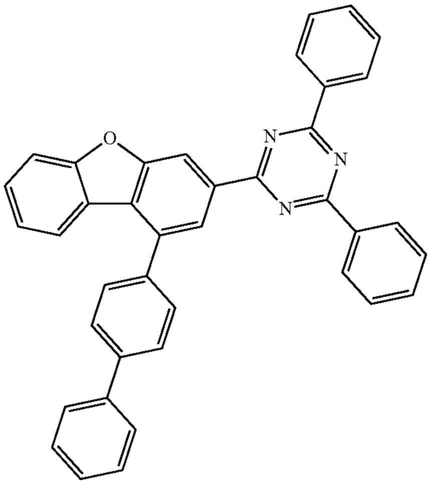
, and
H-243
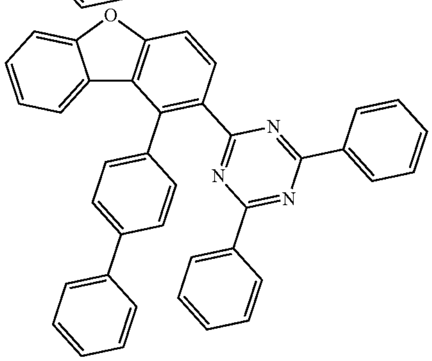
.
34. The electroluminescent device of claim 23, wherein the second host compound is selected from the group consisting of the following:
X-1
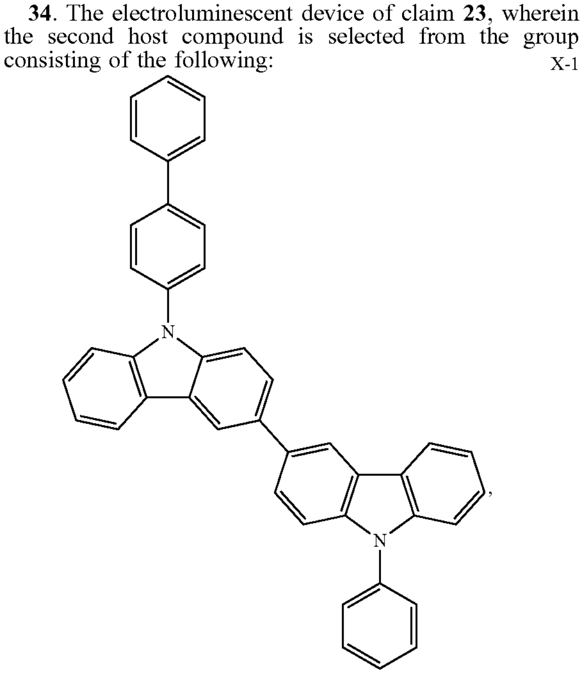
,
-continued
X-2
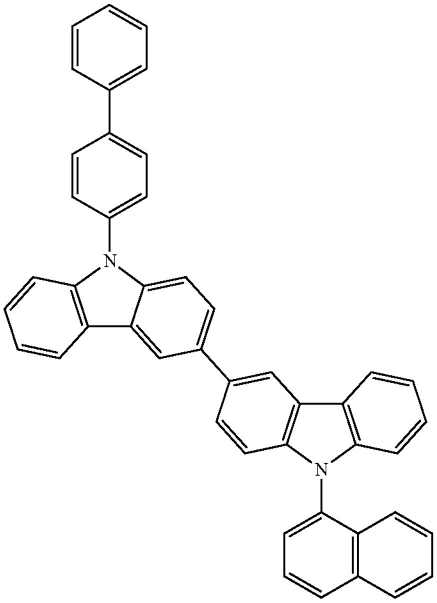
, -continued
X-3
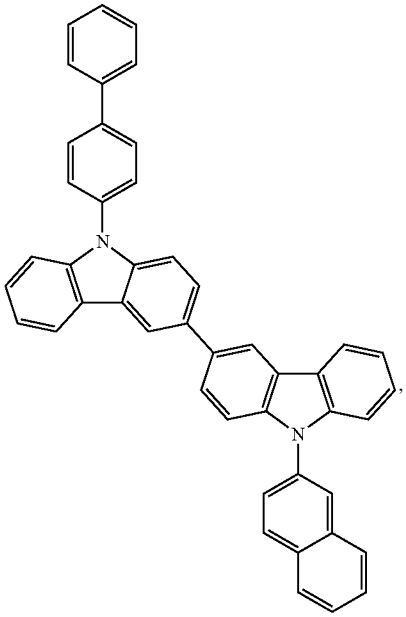
,
X-4
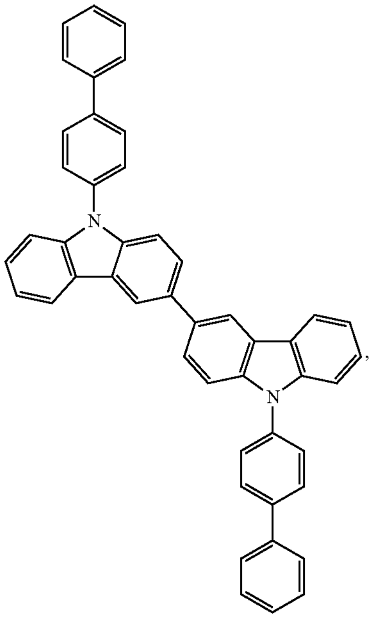
,
-continued
X-5
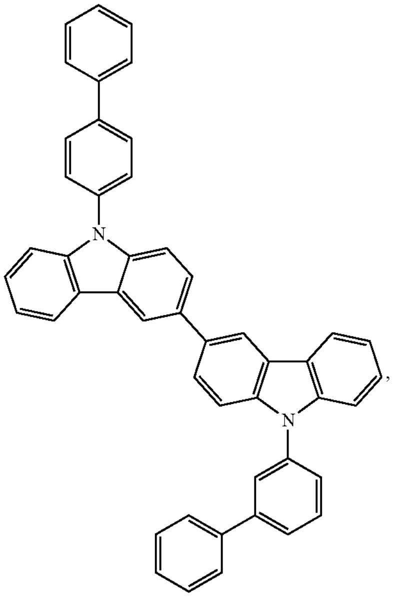
,
X-6
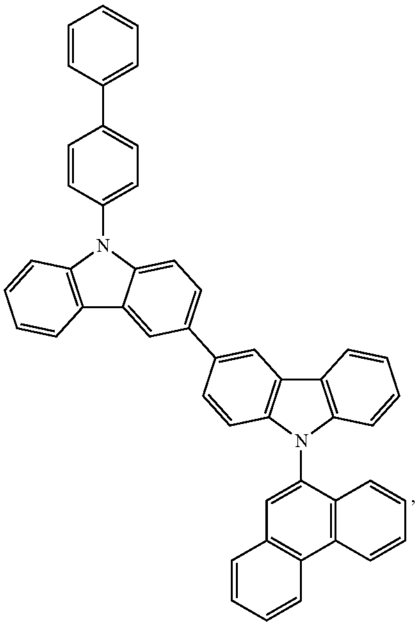
, -continued
X-7
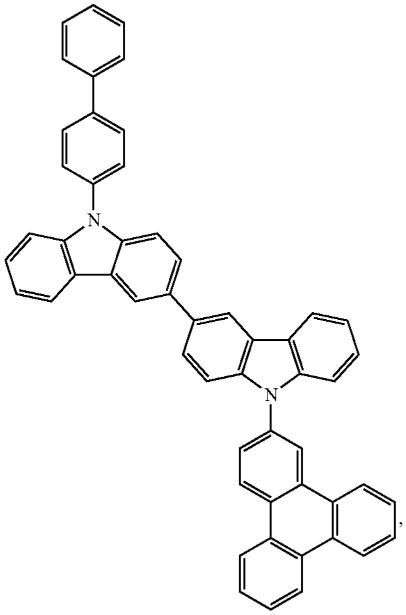
,
X-9
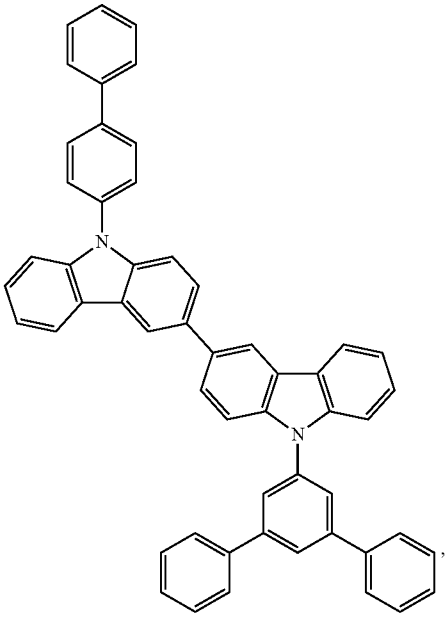
,
X-8
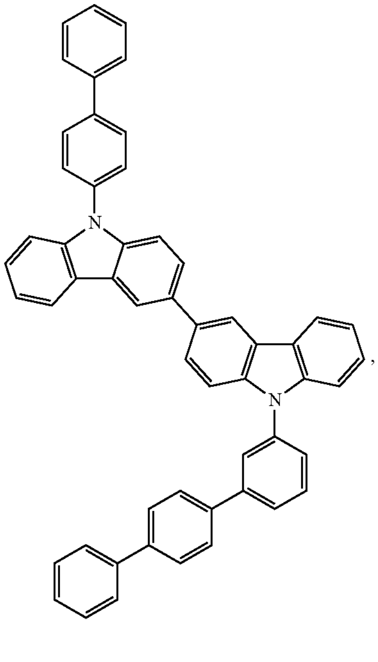
,
X-10
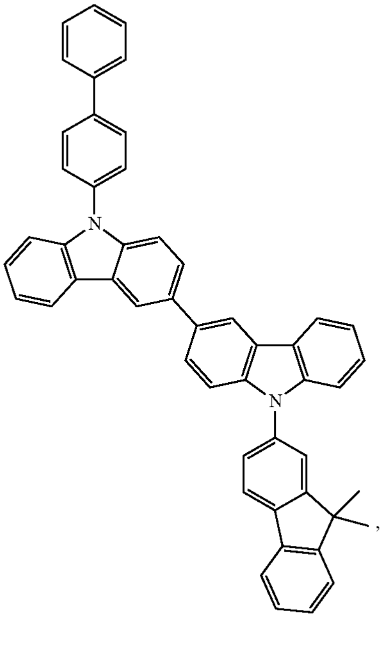
, X-11
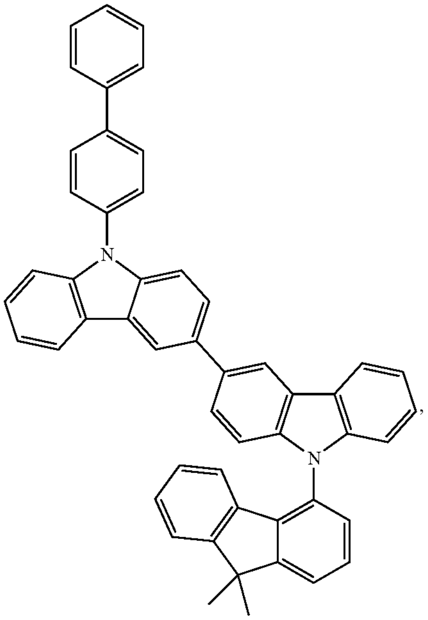
X-12
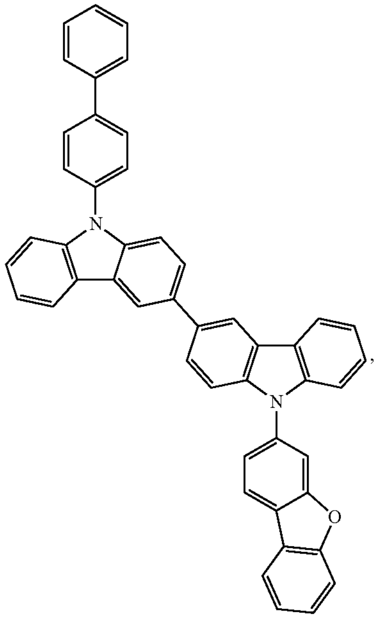
X-13
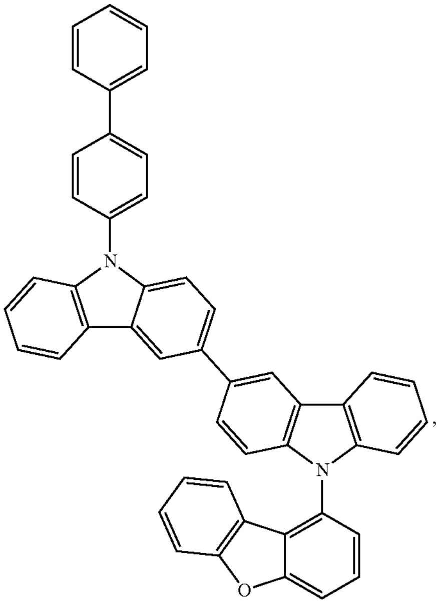
X-14
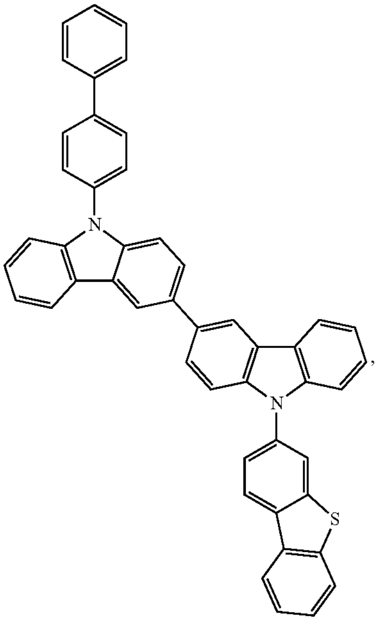

-continued
X-15
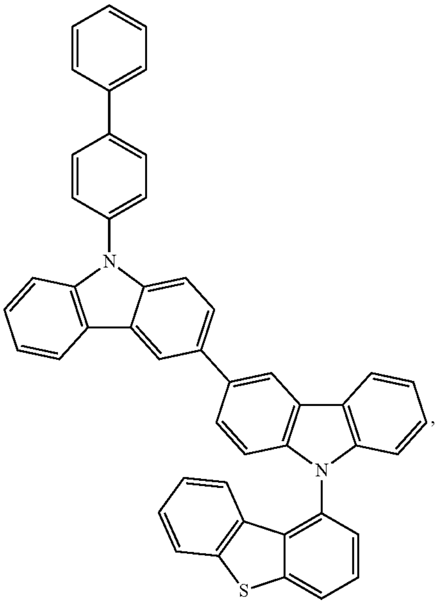
X-16
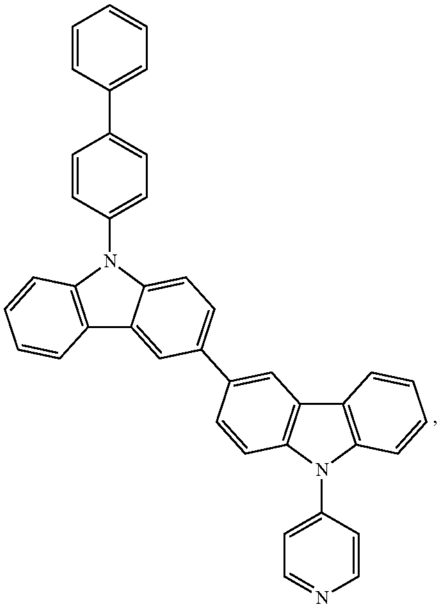
-continued
X-17
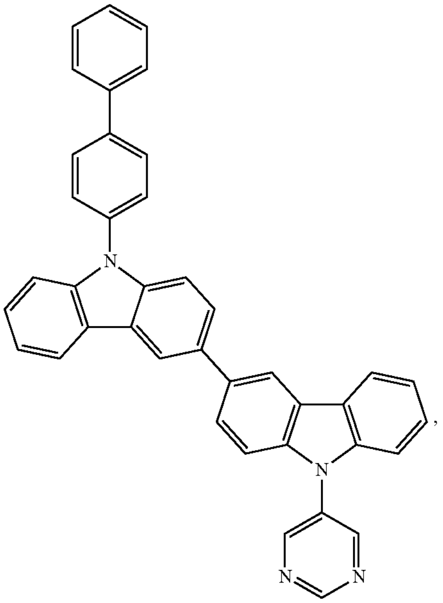
X-18
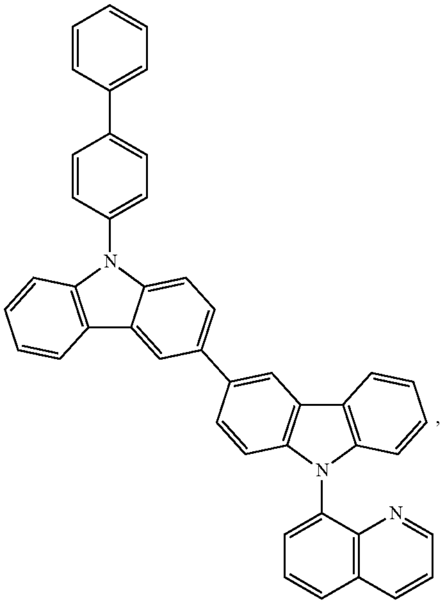

-continued
X-19
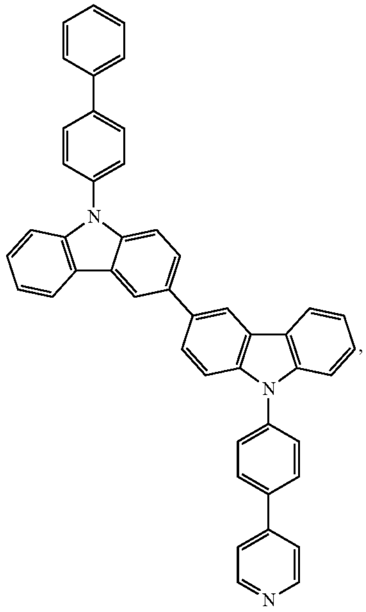
,
X-20
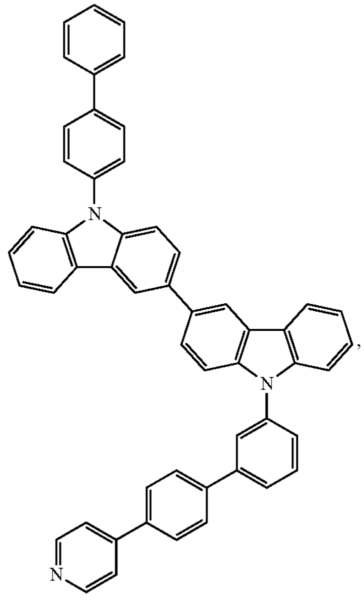
,
-continued
X-21
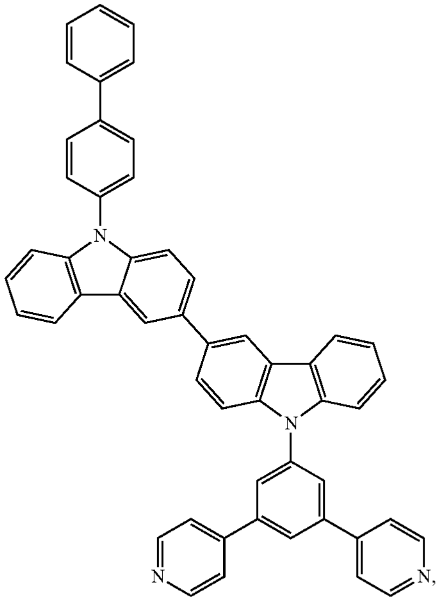
,
X-22
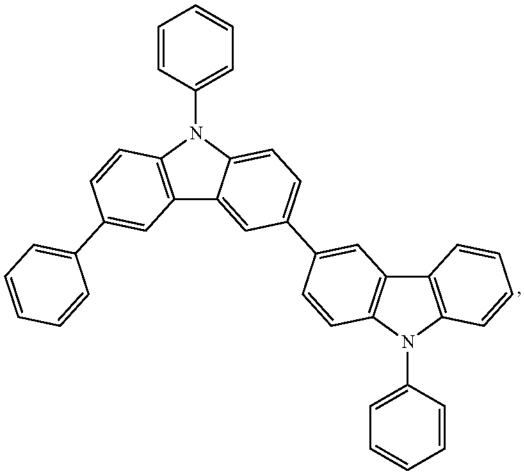
,
X-23
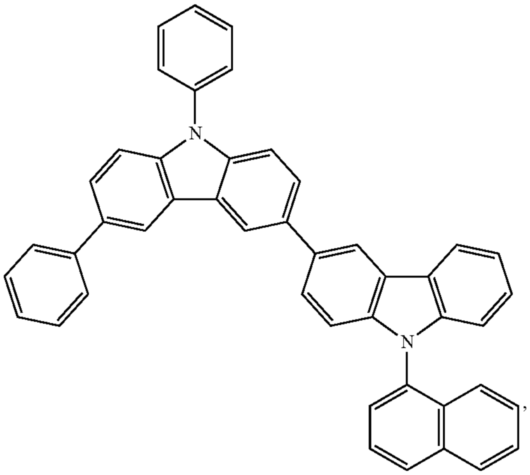
, -continued
X-24
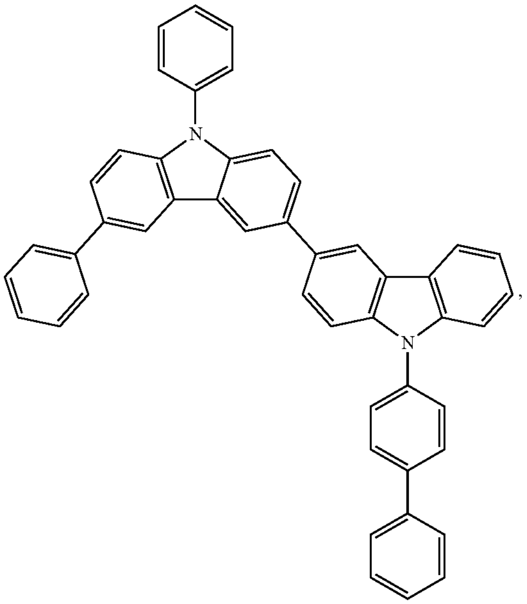
X-25
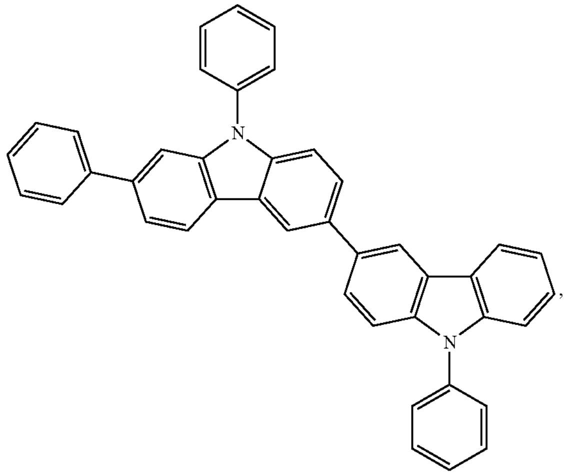
X-26
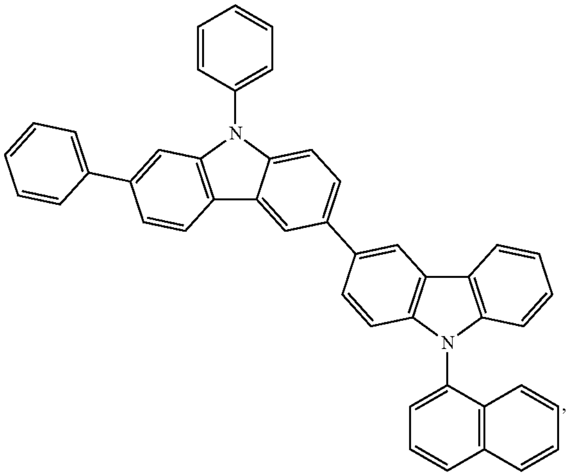
-continued
X-27
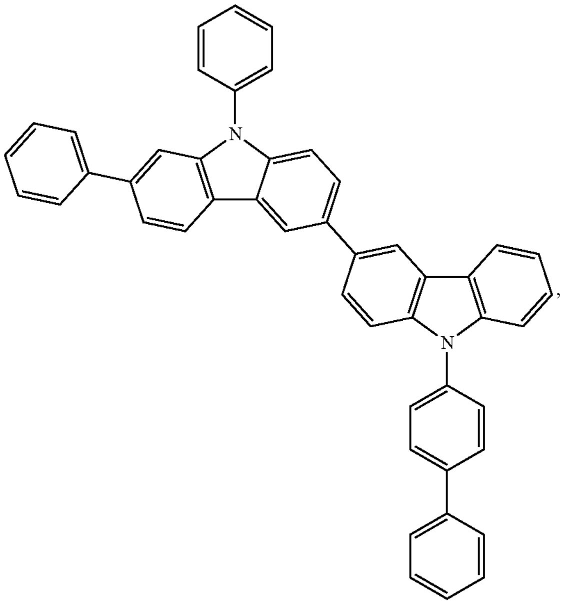
X-28
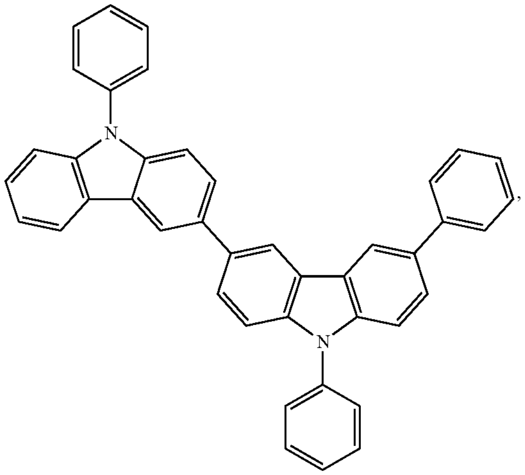
X-29
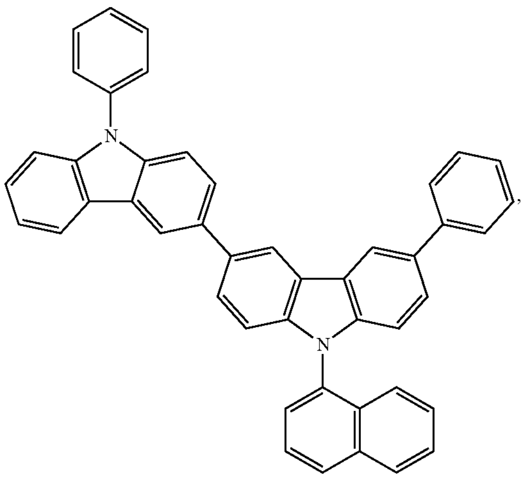

-continued
X-30
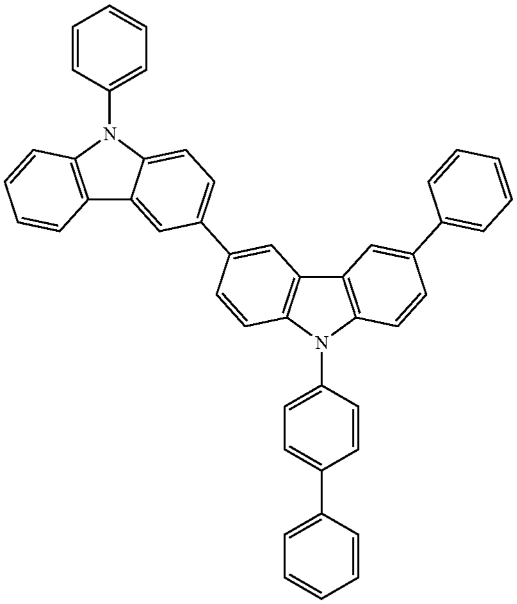
,
X-31
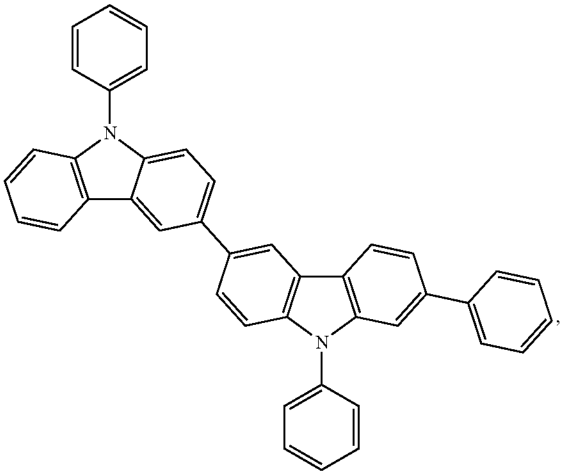
,
X-32
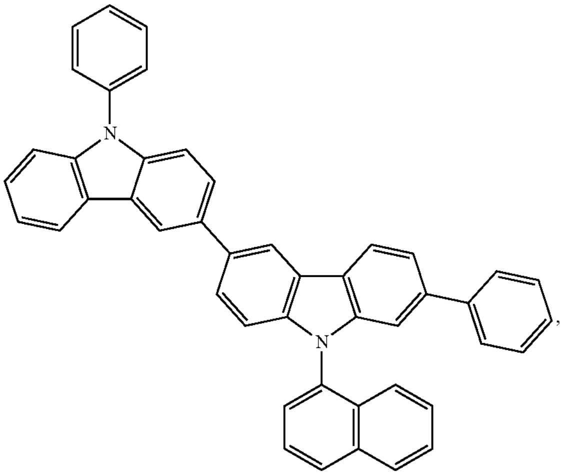
,
-continued
X-33
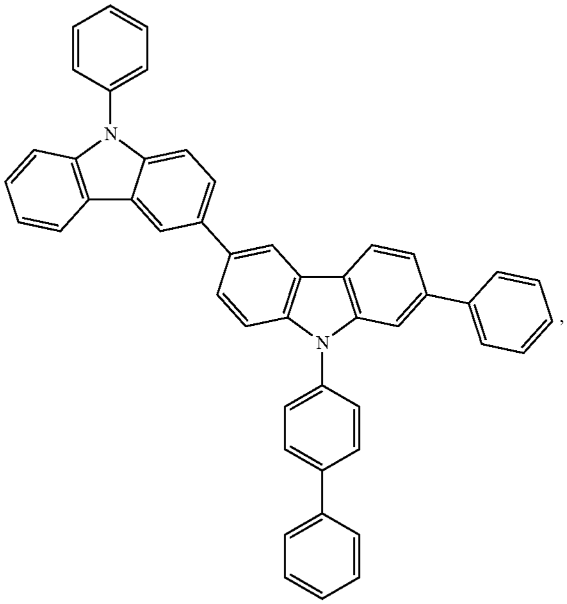
,
X-34
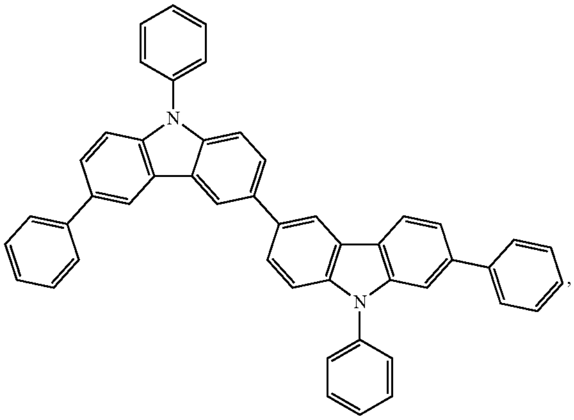
,
X-35
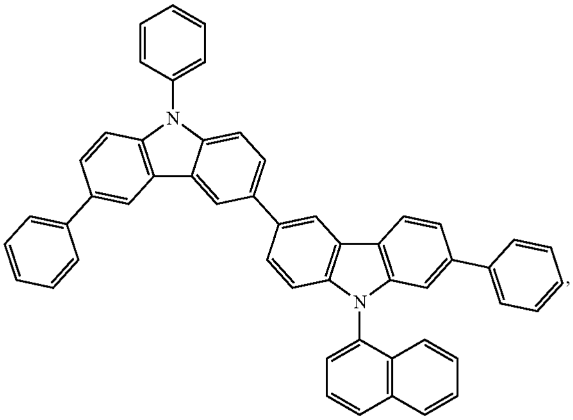
, -continued
X-36
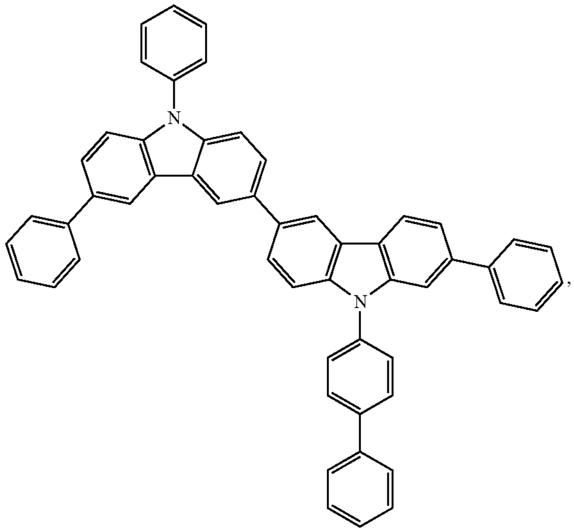
,
X-37
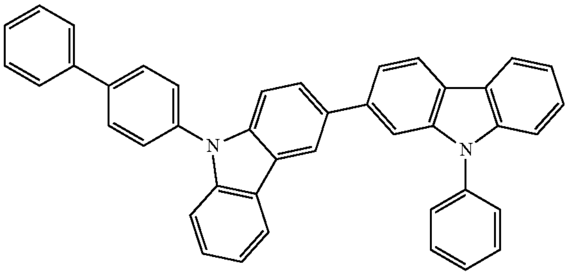
,
X-38
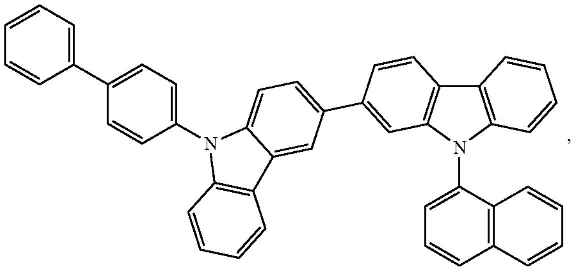
,
X-39
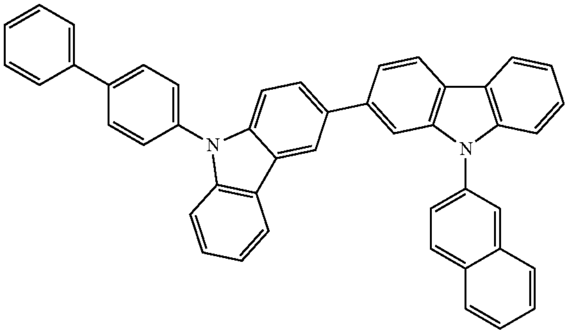
,
-continued
X-40
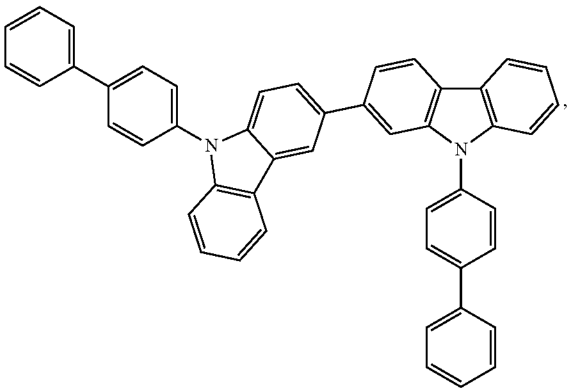
,
X-41
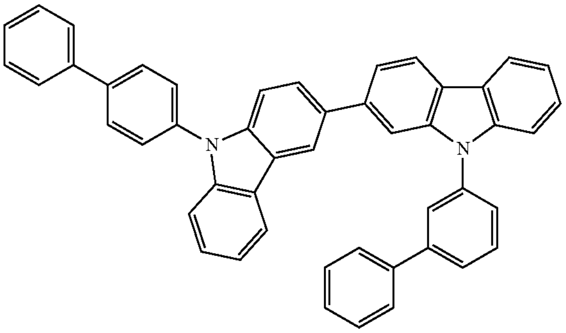
,
X-42
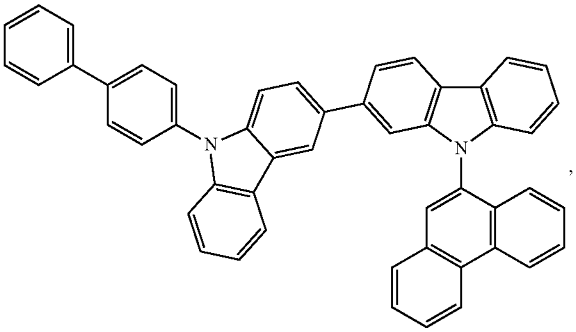
,
X-43
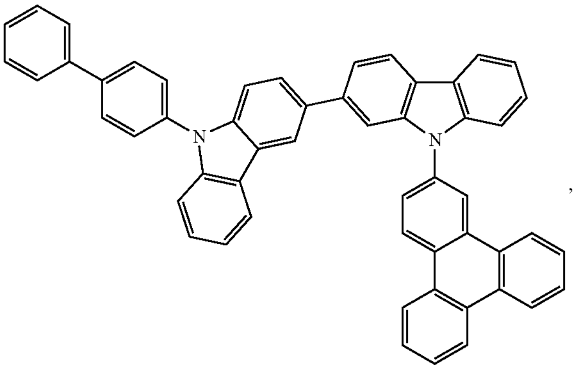
, -continued
X-44
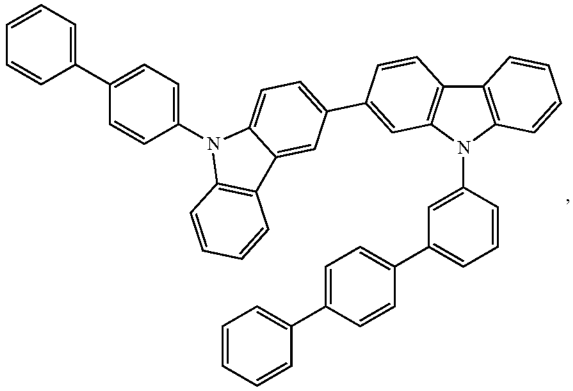
,
X-45
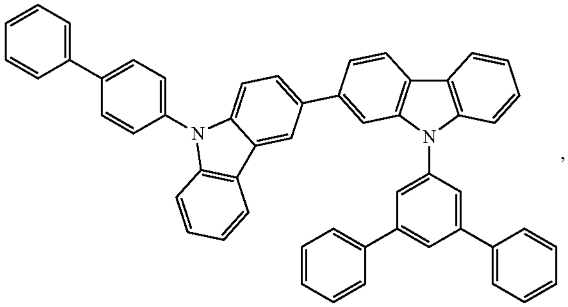
,
X-46
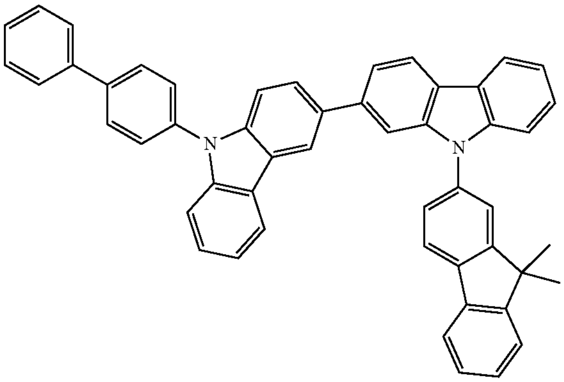
,
X-47
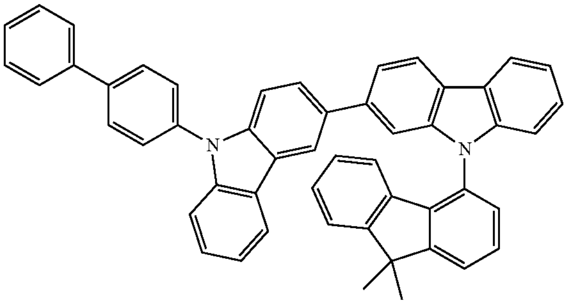
,
-continued
X-48
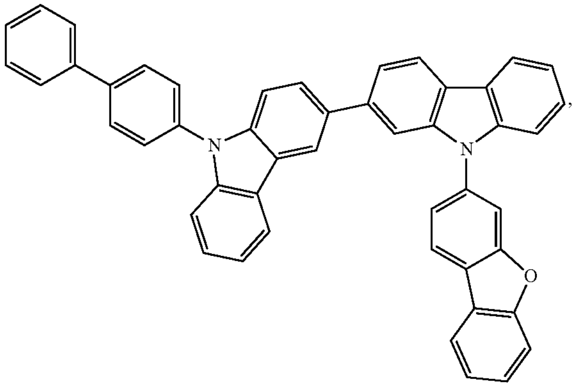
,
X-49
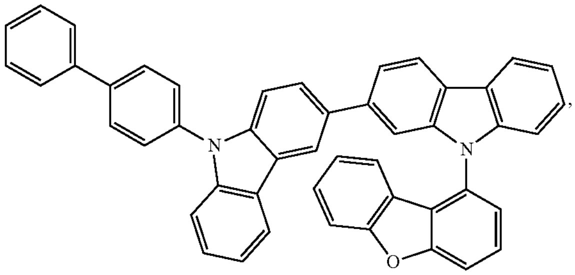
,
X-50
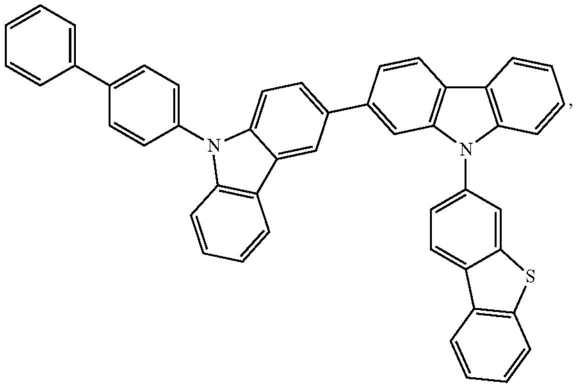
,
X-51
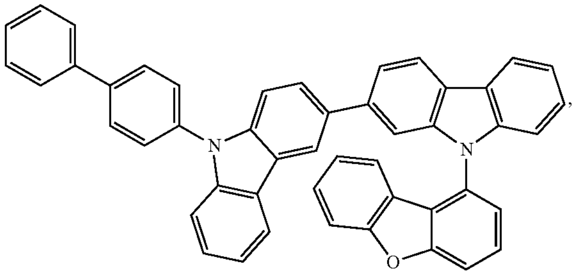
, -continued
X-52
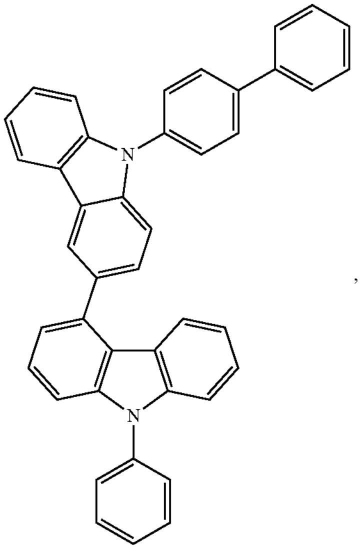
,
X-53
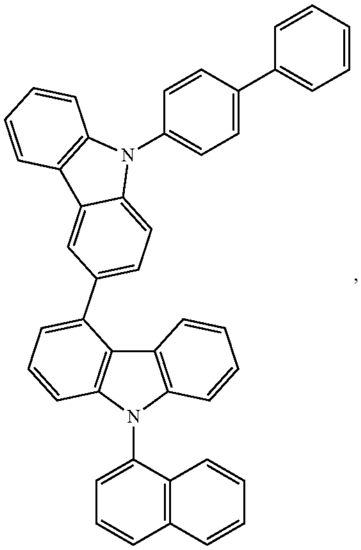
,
-continued
X-54
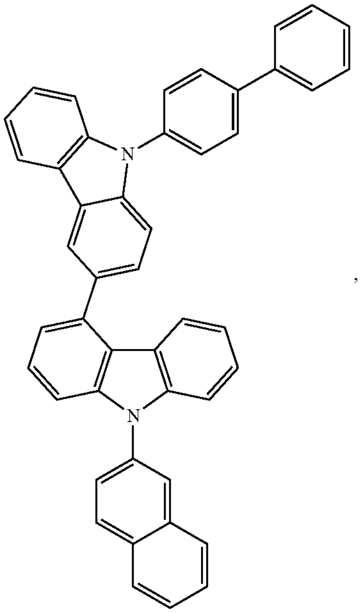
,
X-55
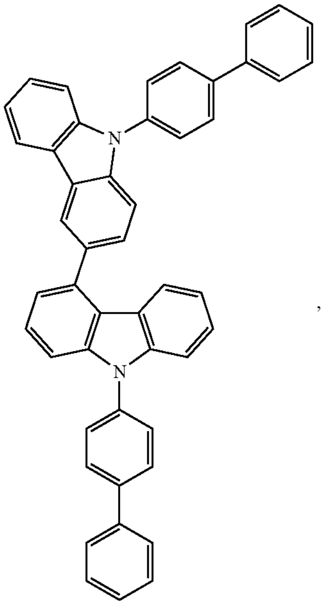
, -continued
X-56
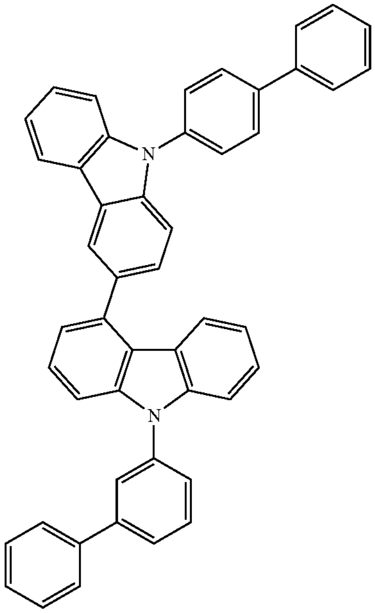
,
X-57
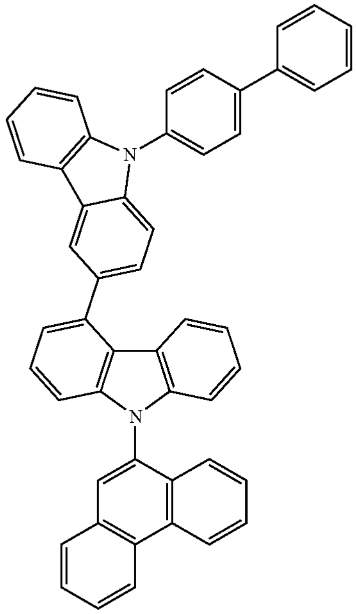
,
-continued
X-58
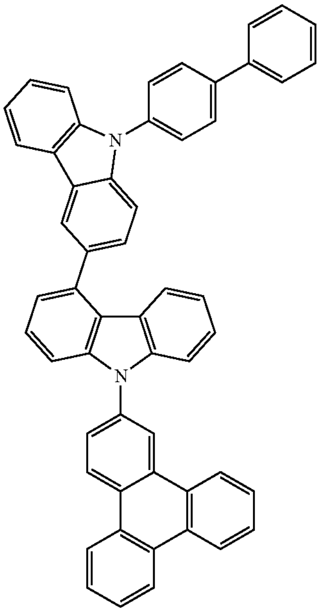
,
X-59
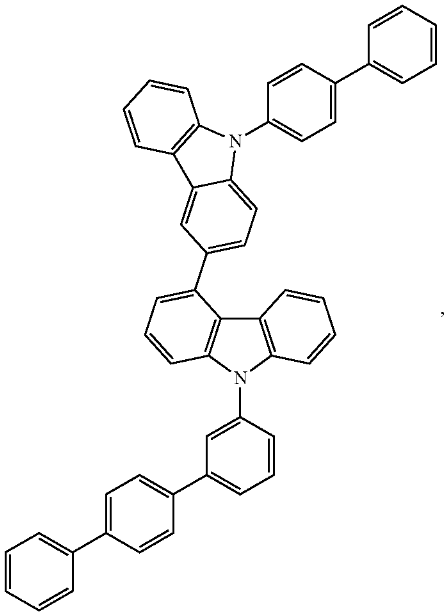
, -continued
X-60
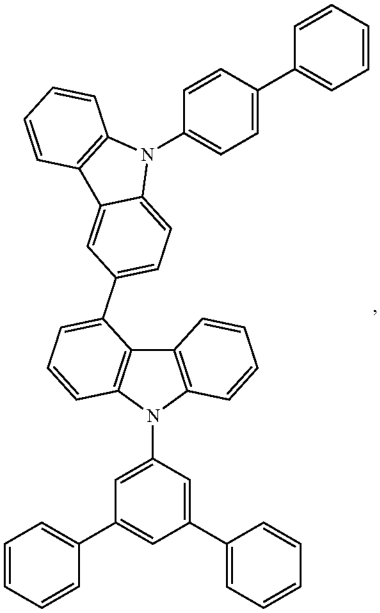
,
X-61
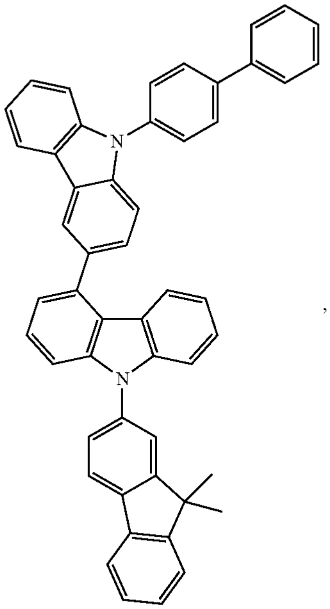
,
-continued
X-62
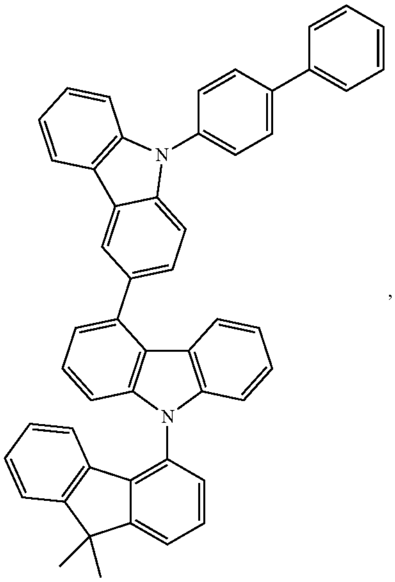
,
X-63
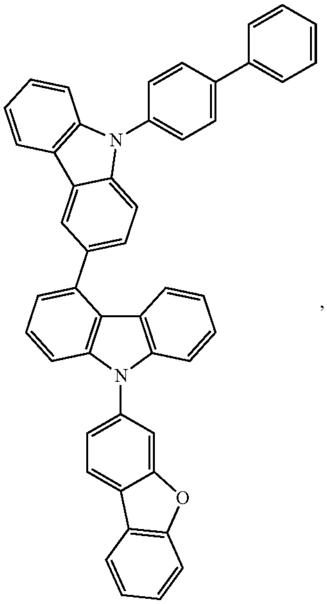
, -continued
X-64
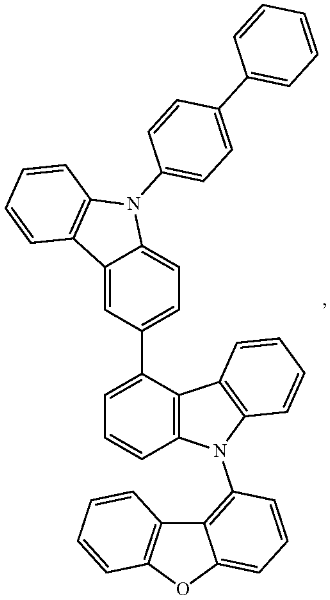
,
X-65
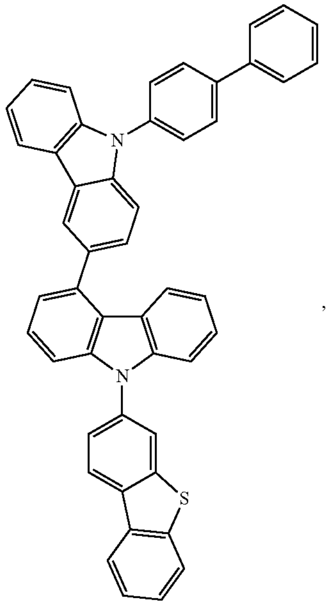
,
-continued
X-66
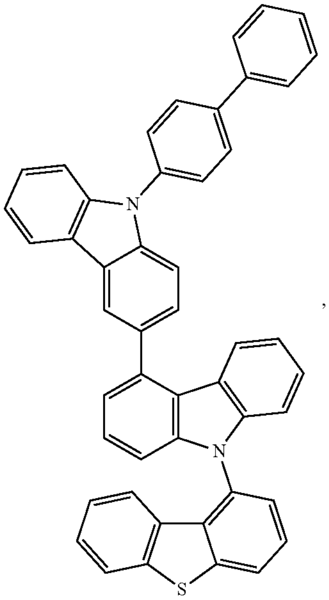
,
X-67
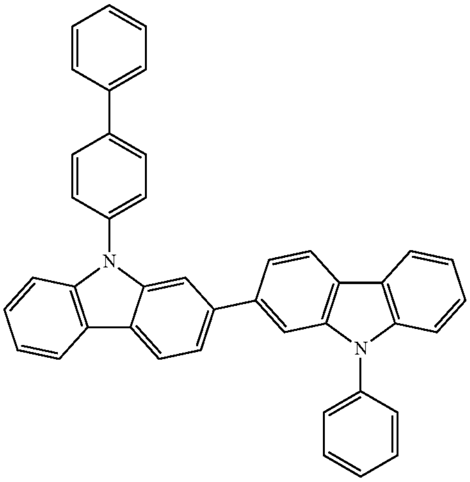
,
X-68
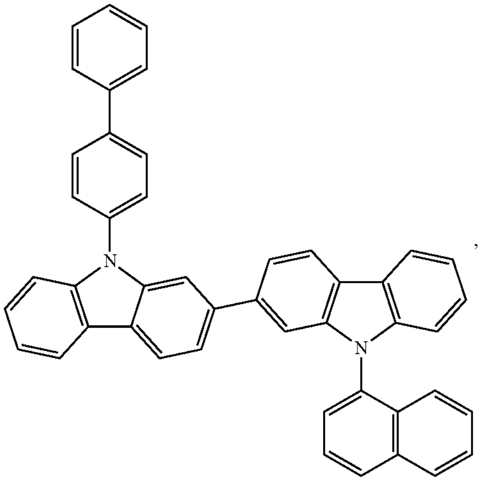
, -continued
X-69
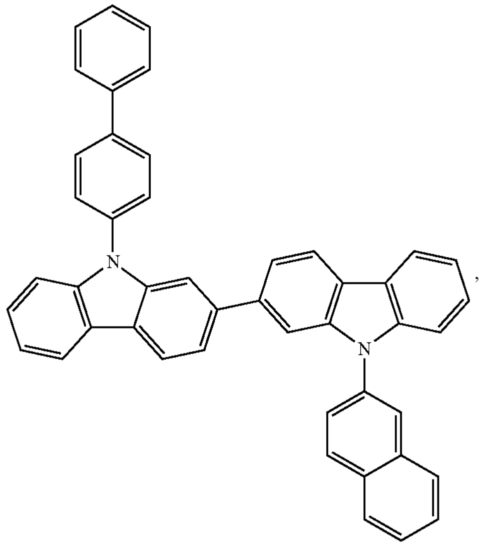
,
X-70
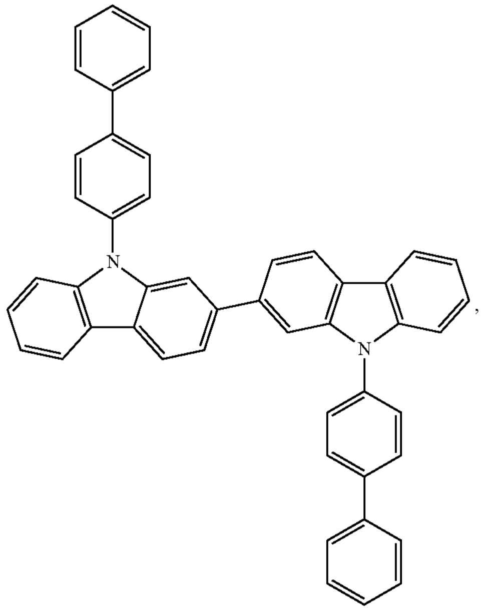
,
-continued
X-71
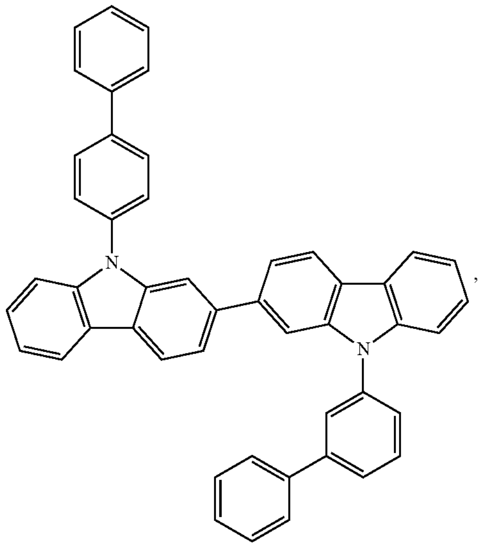
,
X-72
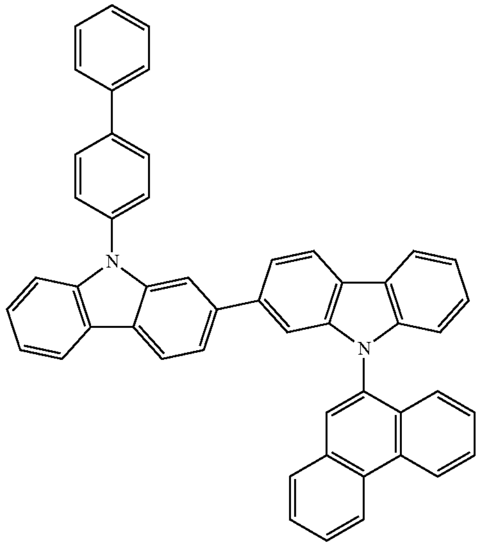
, -continued
X-73
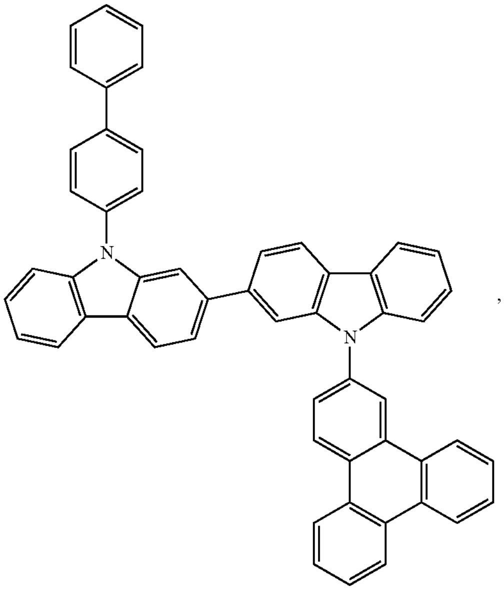
,
X-74
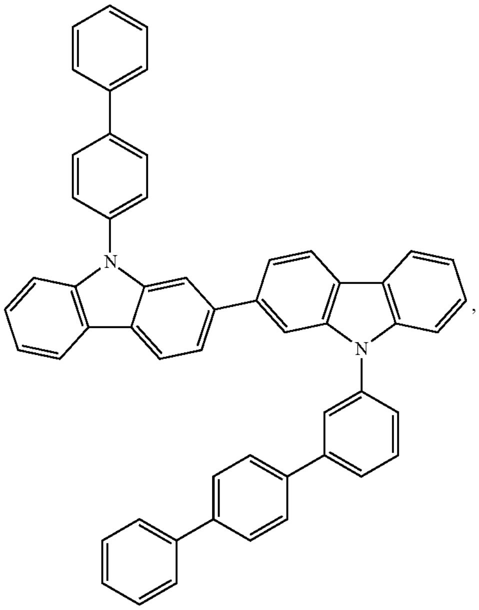
,
-continued
X-75
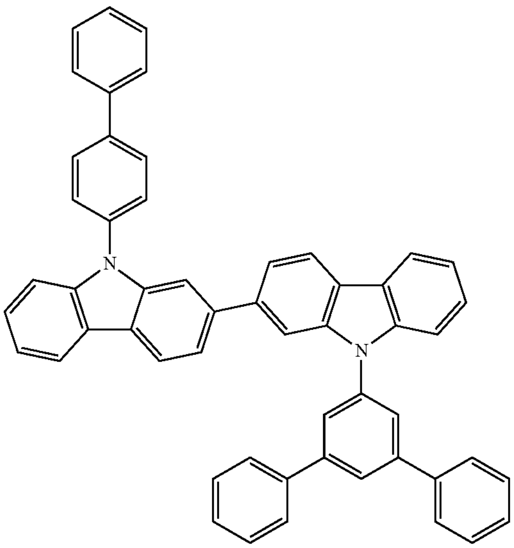
,
X-76
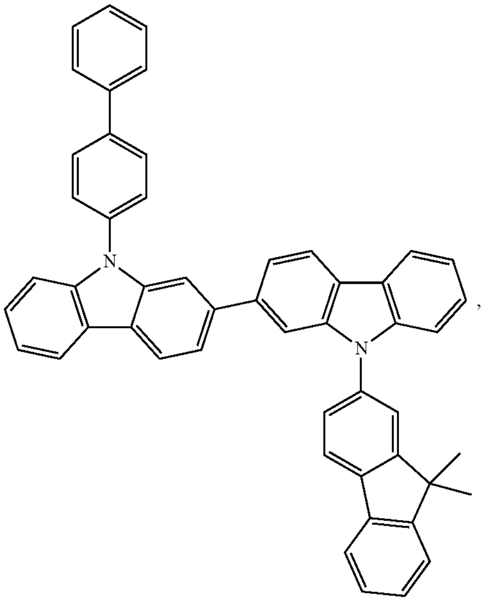
, -continued
X-77
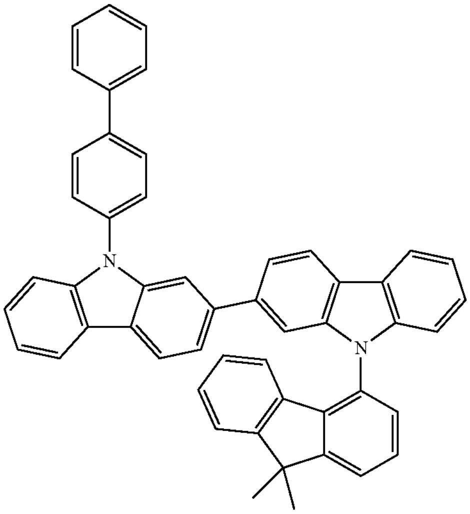
,
X-78
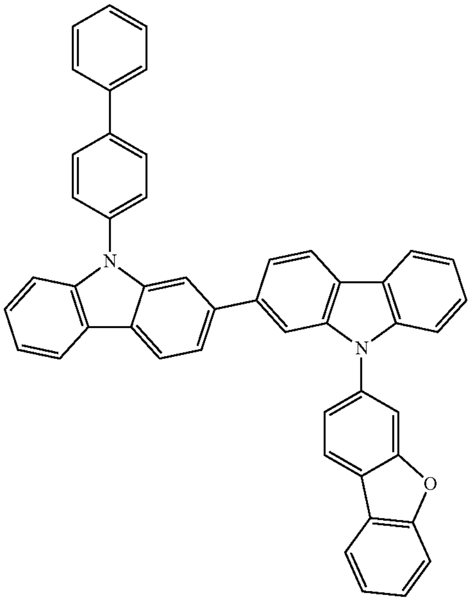
,
X-79
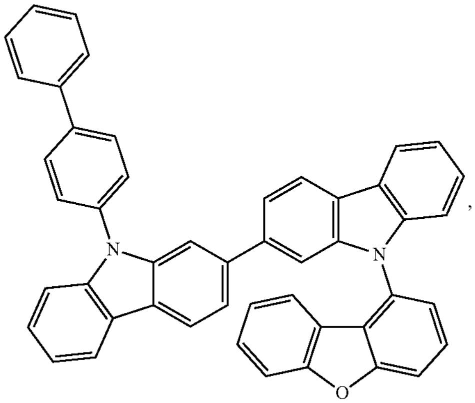
,
-continued
X-80
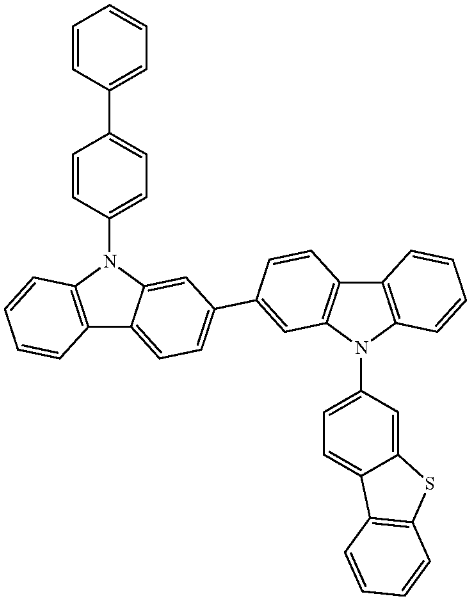
,
X-81
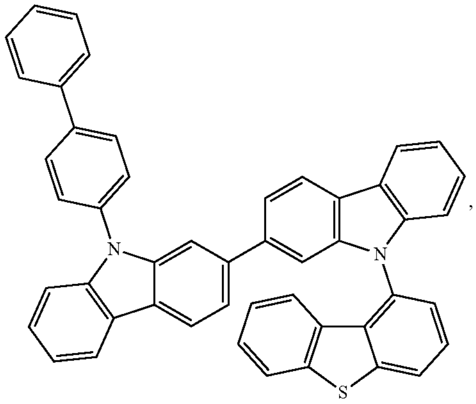
,
X-82
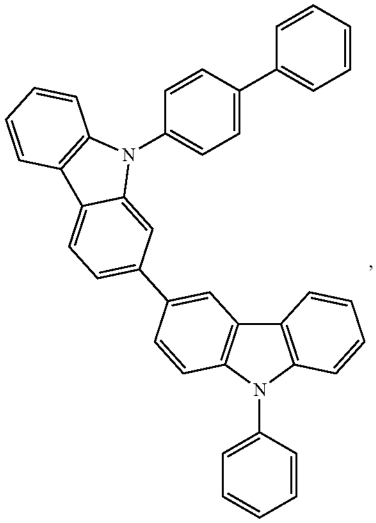
, -continued
X-83
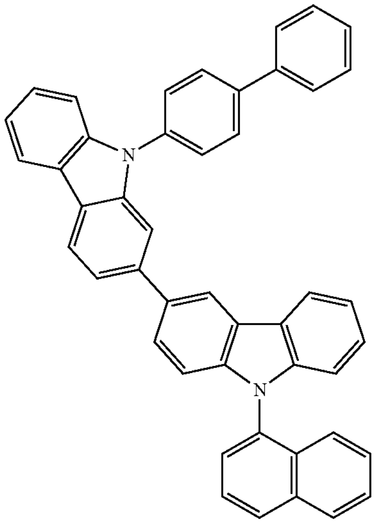
,
X-84
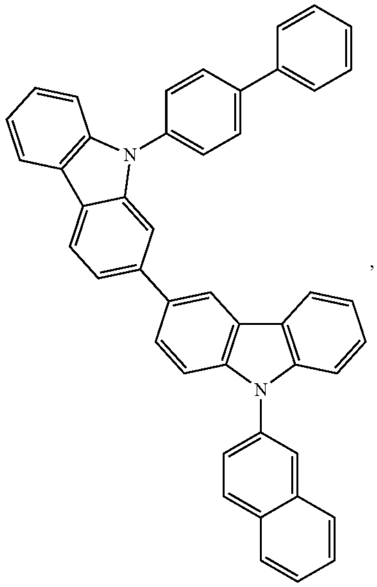
,
-continued
X-85
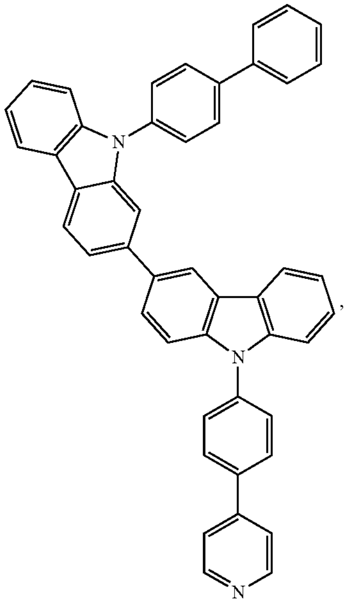
,
X-86
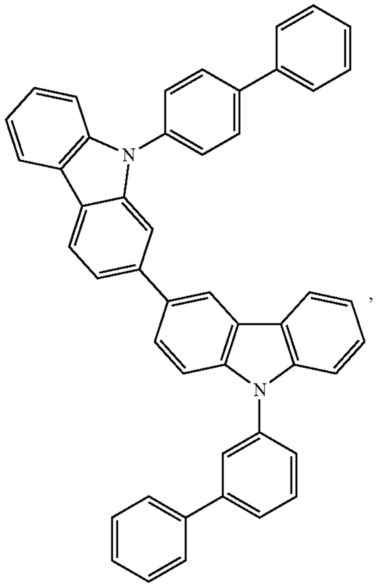
, -continued
X-87
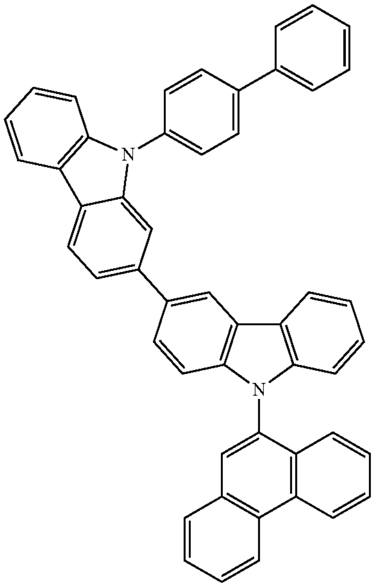
,
-continued
X-89
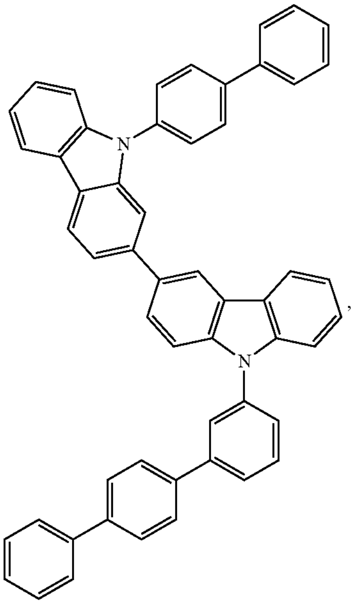
,
X-88
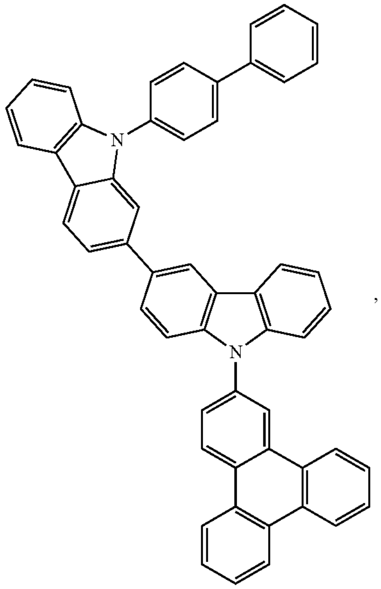
,
X-90
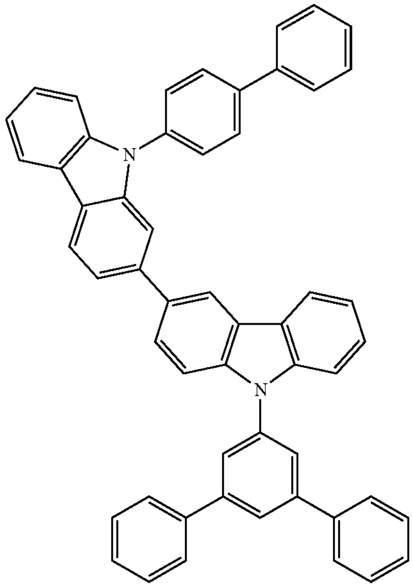
, -continued
X-91
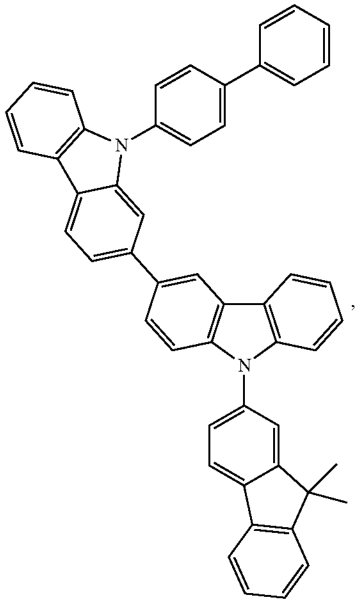
,
X-92
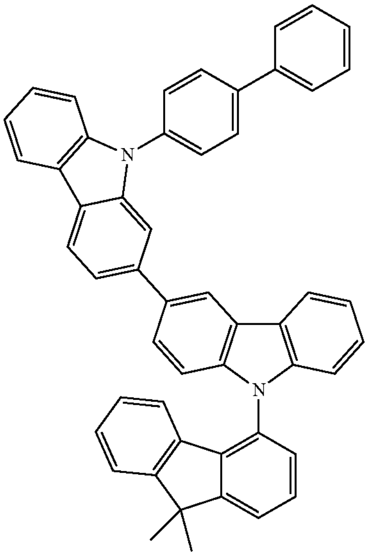
,
-continued
X-93
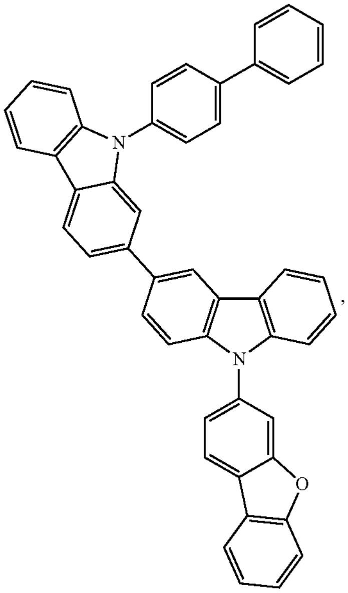
,
X-94
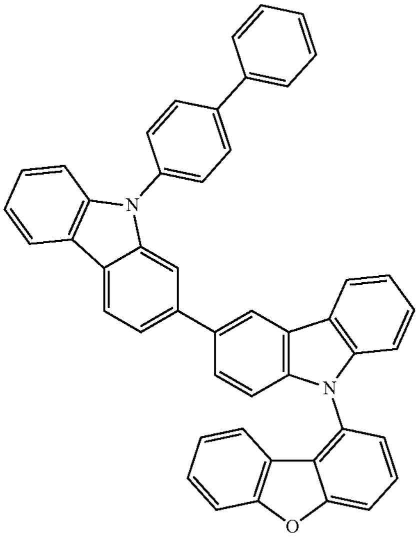
, -continued
X-95
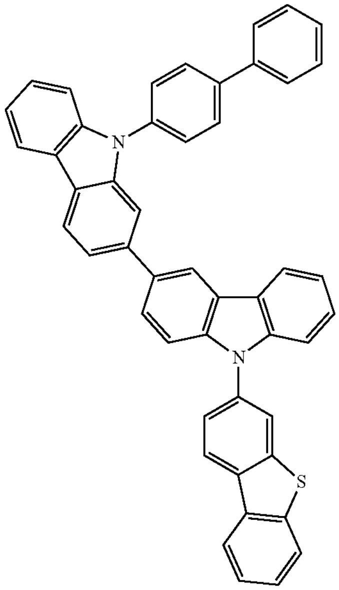
,
X-96
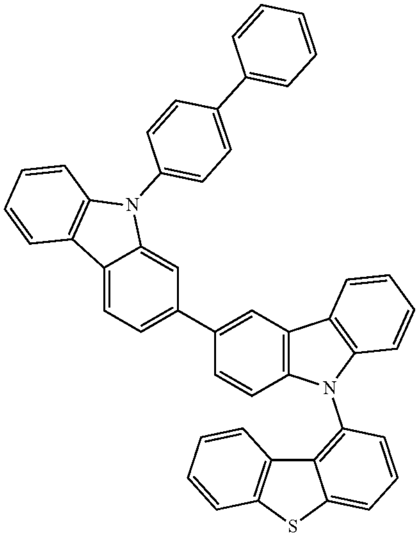
,
X-97
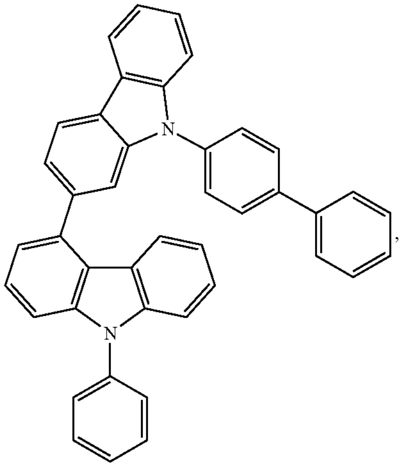
,
-continued
X-98
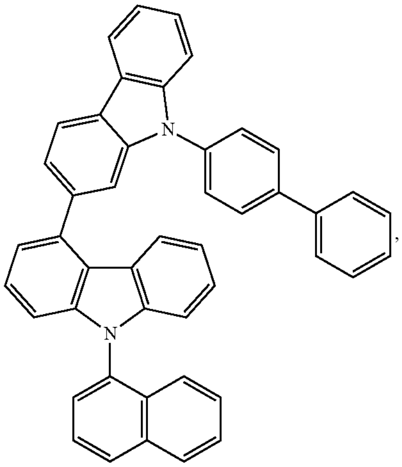
,
X-99
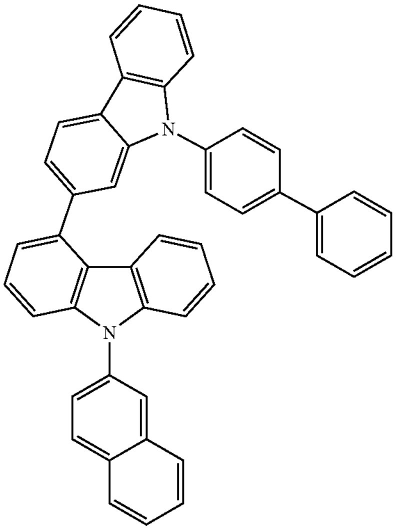
,
X-100
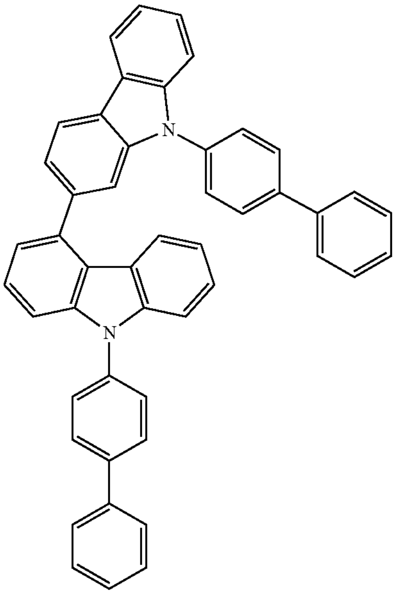
, -continued
X-101
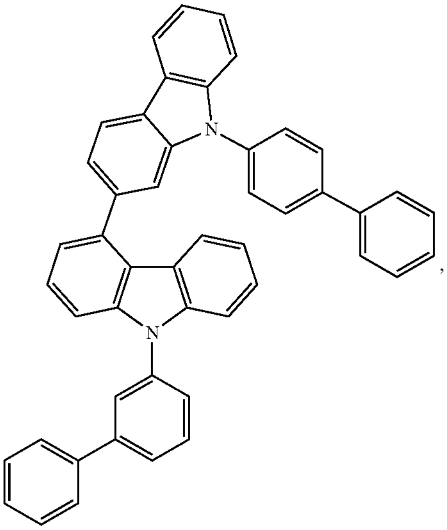
,
X-102
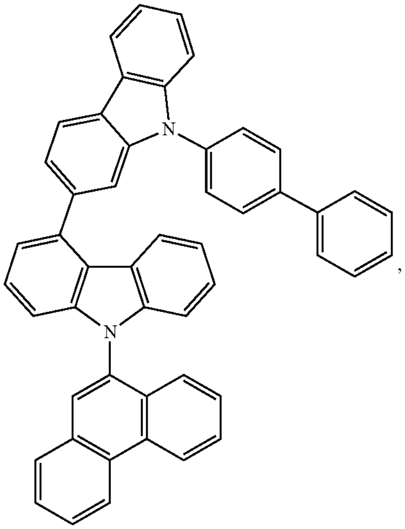
,
X-103
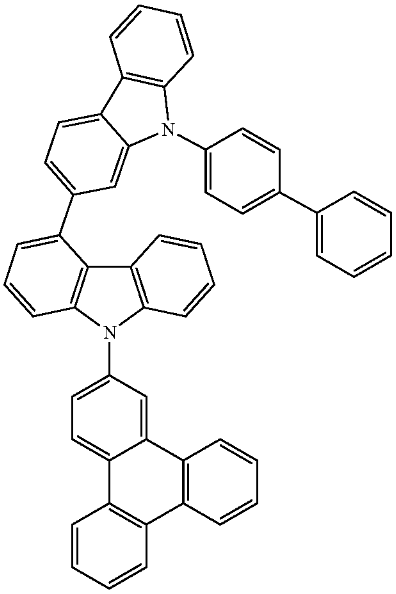
,
-continued
X-104
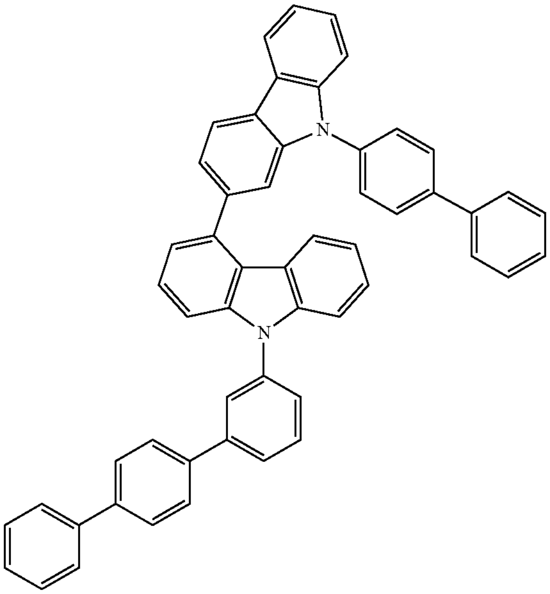
,
X-105
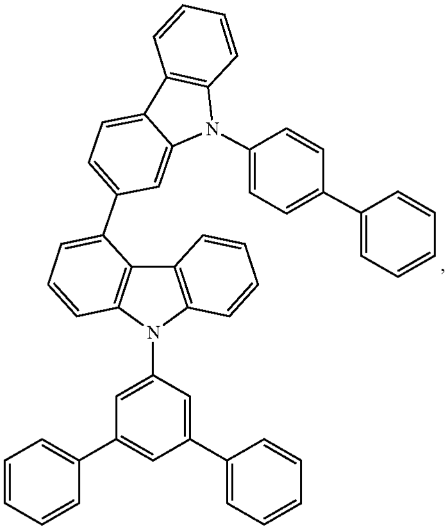
, -continued
X-106
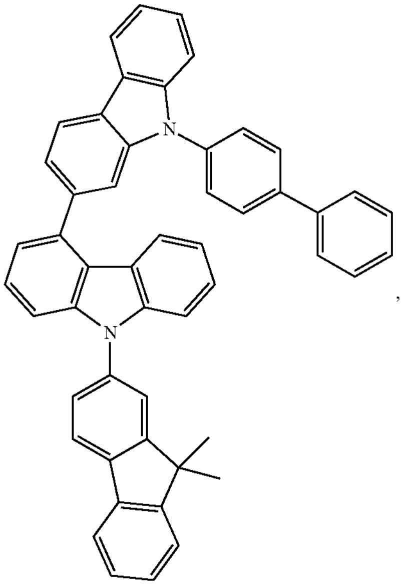
,
X-107
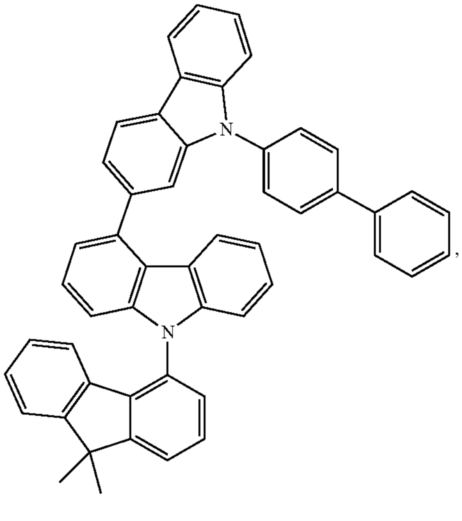
,
-continued
X-108
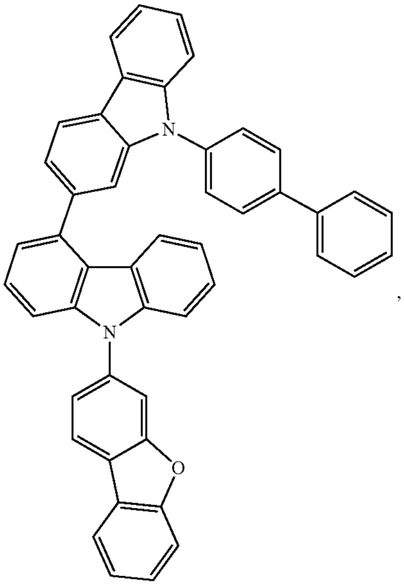
,
X-109
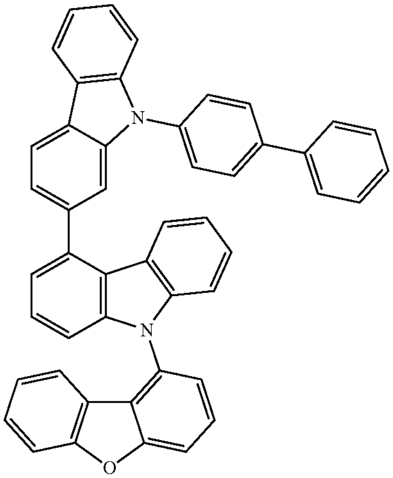
,
X-110
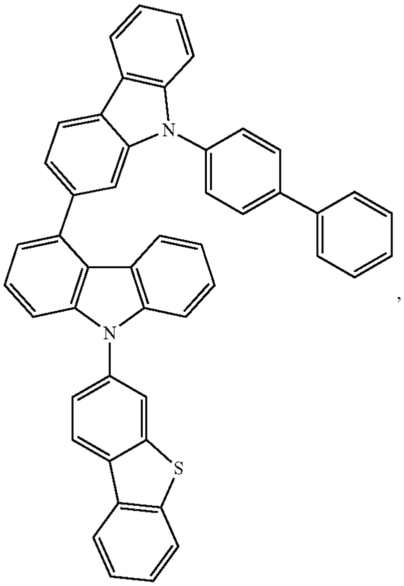
, -continued
X-111
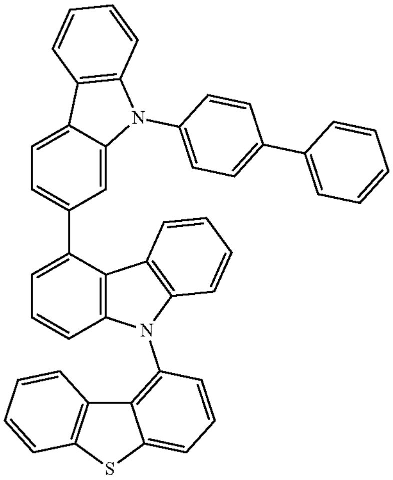
,
X-112
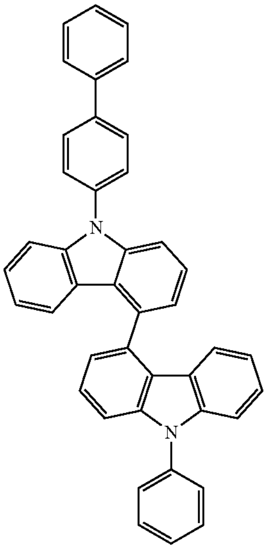
,
X-113
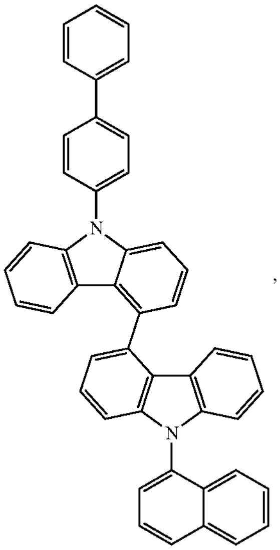
,
-continued
X-114
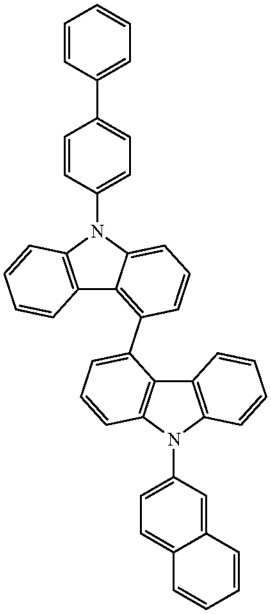
,
X-115
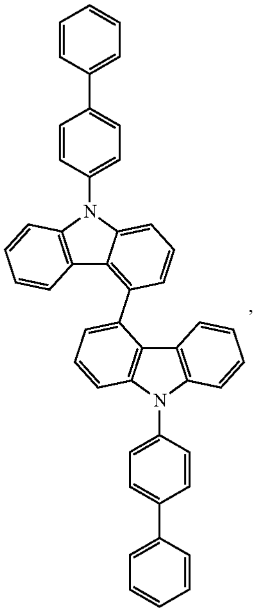
, -continued
X-116
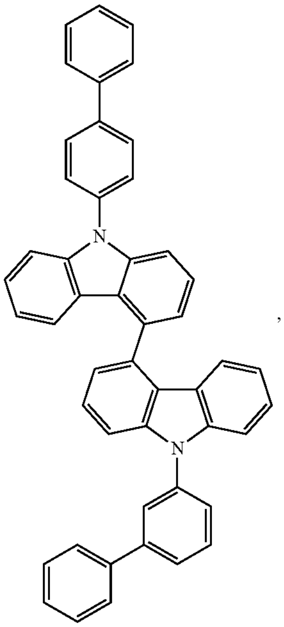
,
X-117
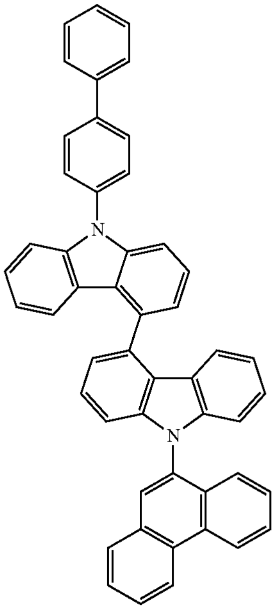
,
-continued
X-118
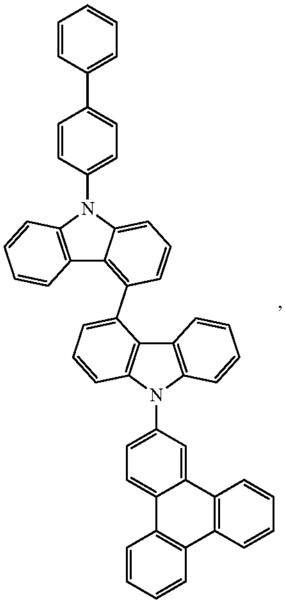
,
X-119
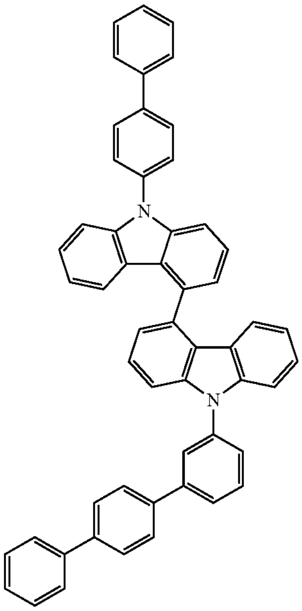
, X-120
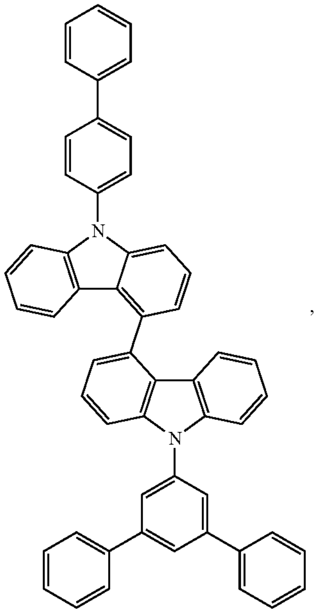
,
X-121
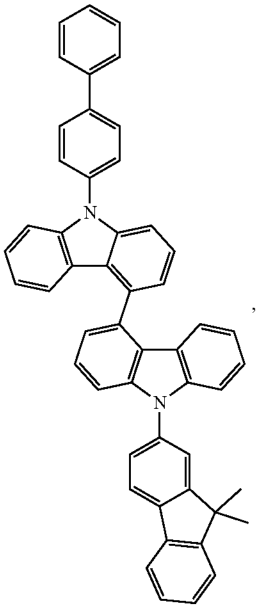
,
X-122
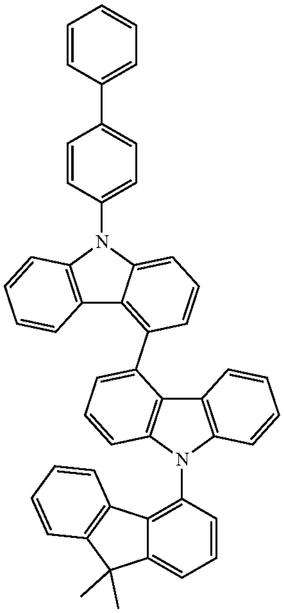
,
X-123
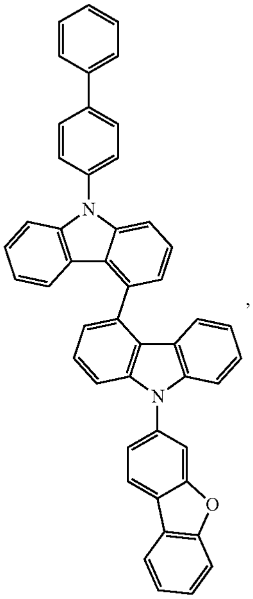
, -continued
X-124
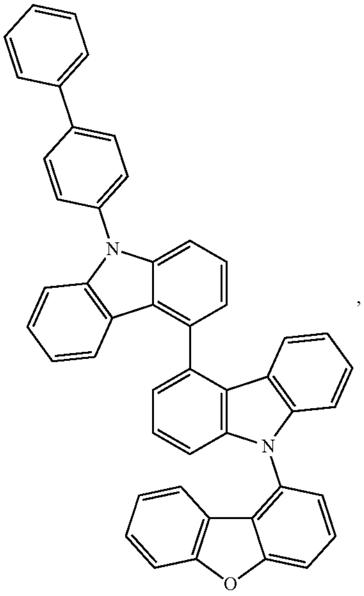
,
X-125
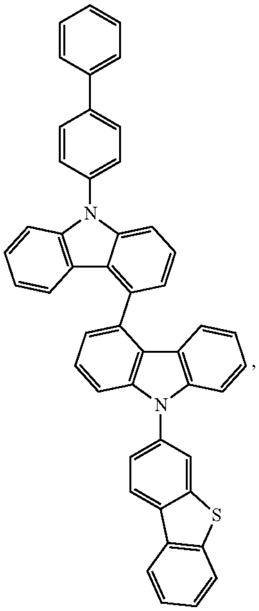
,
-continued
X-126
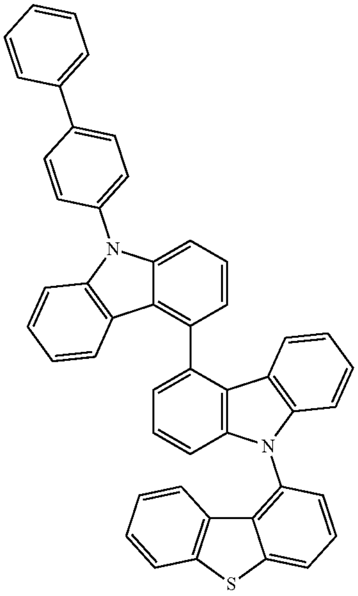
,
X-127
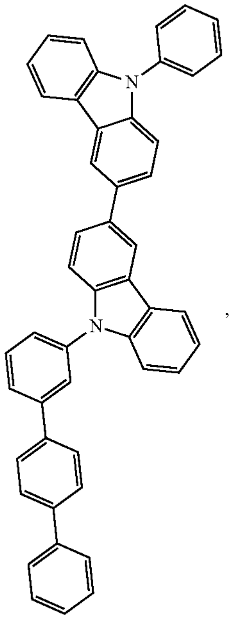
, -continued
X-128
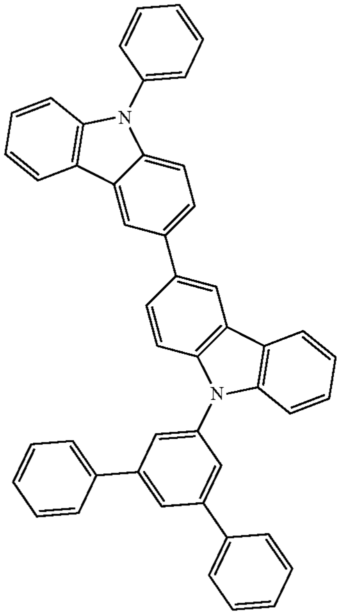
,
X-129
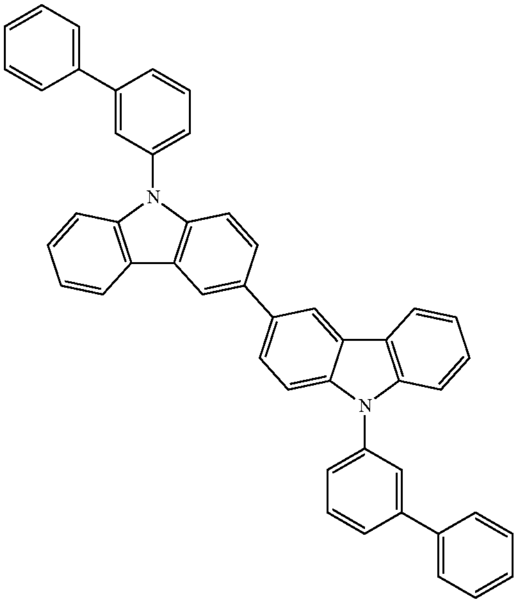
,
-continued
X-130
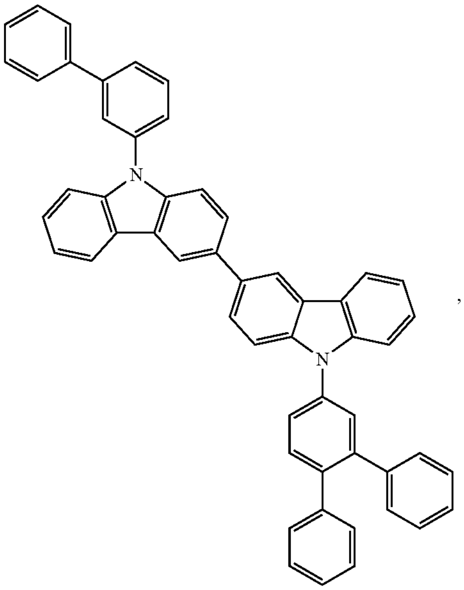
,
X-131
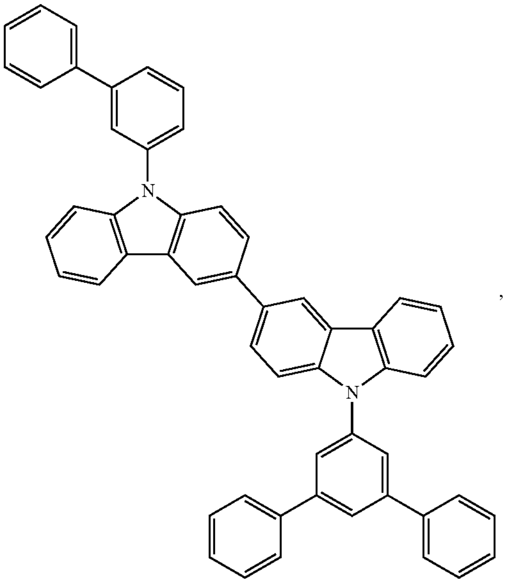
, -continued
X-132
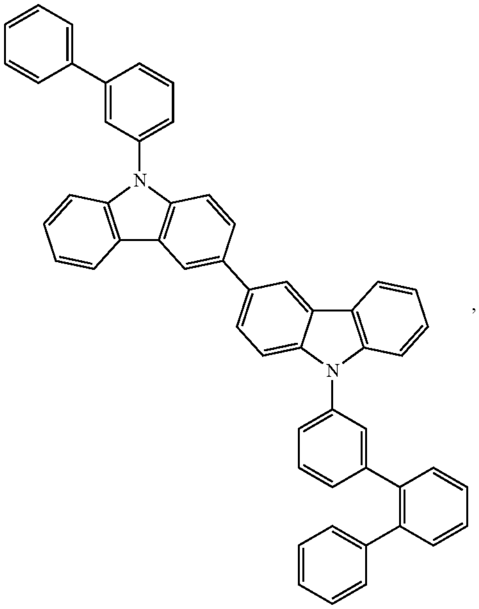
,
X-133
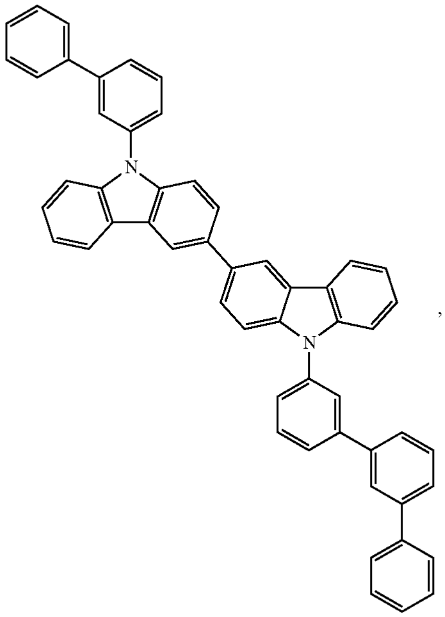
,
-continued
X-134
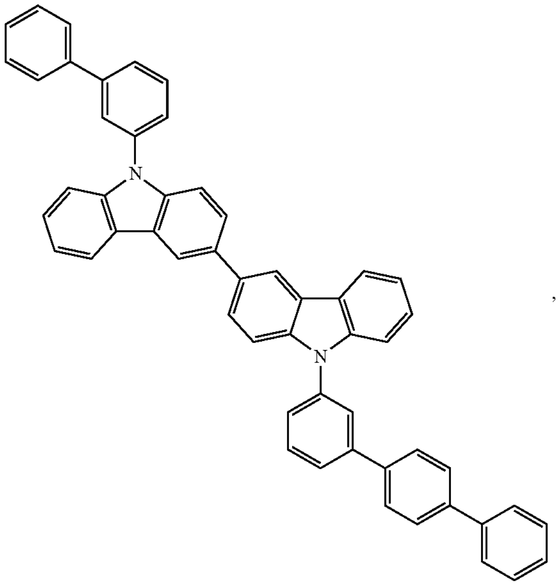
,
X-135
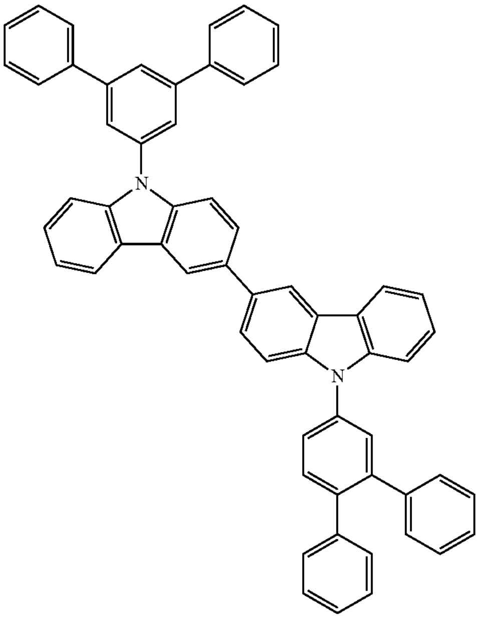
, -continued
X-136
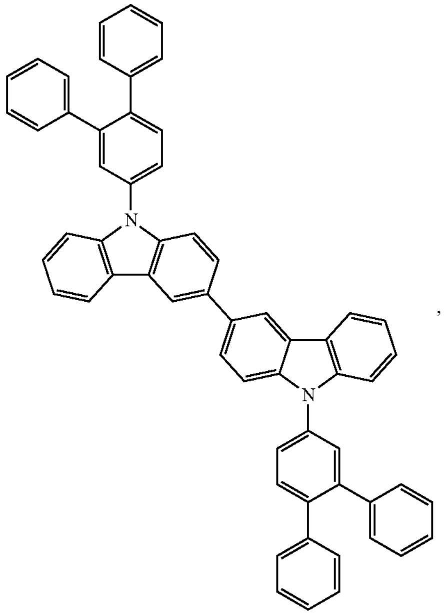
,
X-137
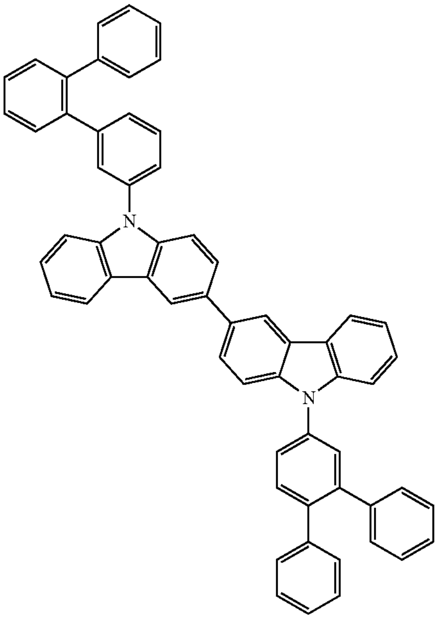
,
-continued
X-138
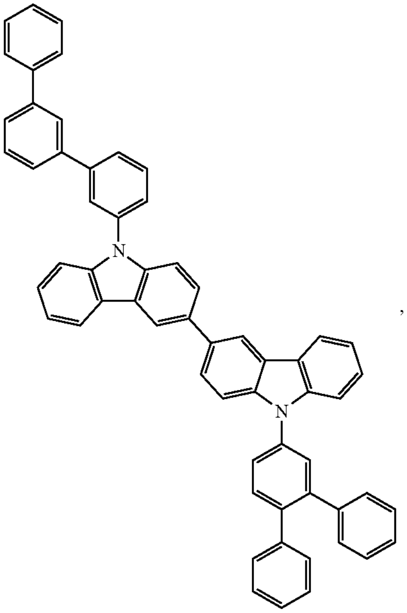
,
X-139
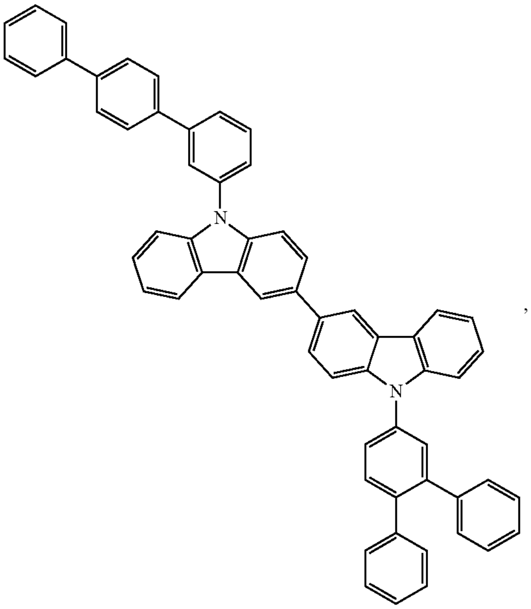
, -continued
X-140
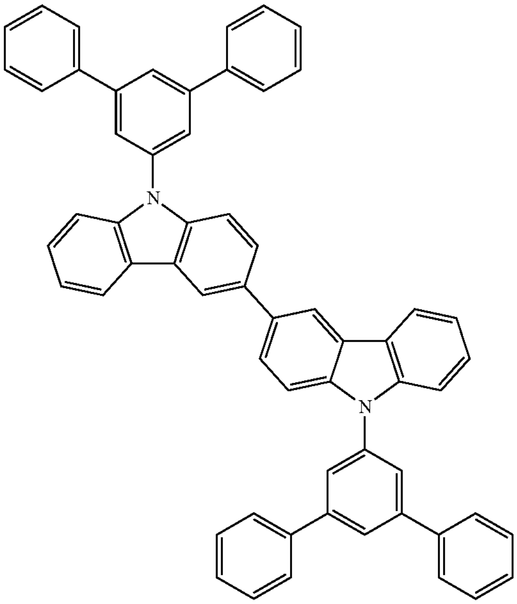
,
X-141
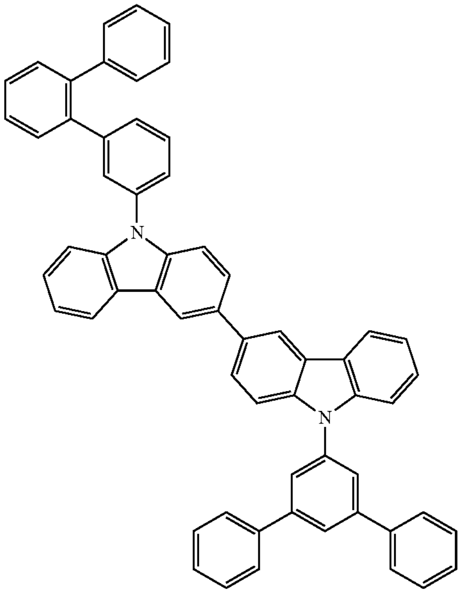
,
-continued
X-142
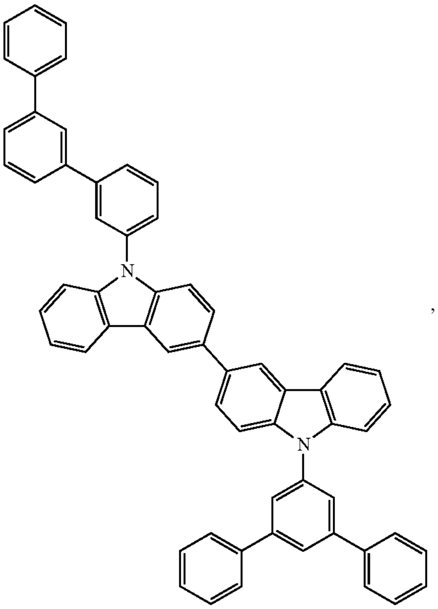
,
X-143
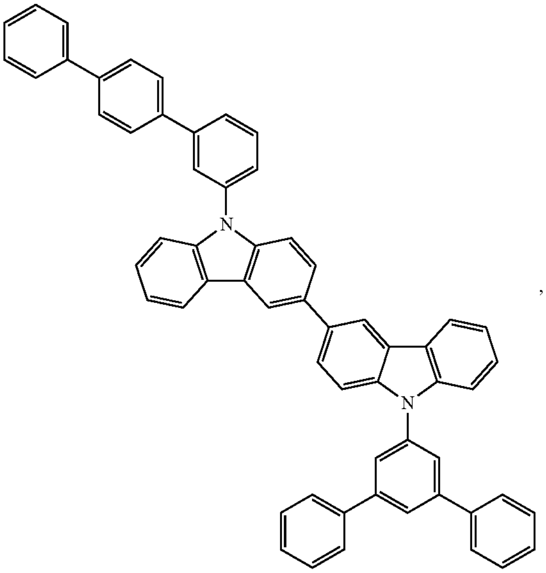
, -continued
X-144
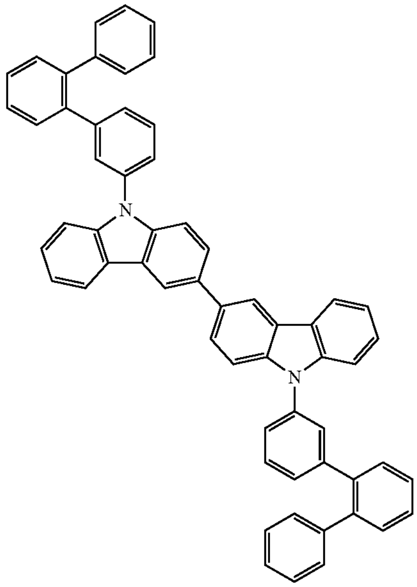
,
X-145
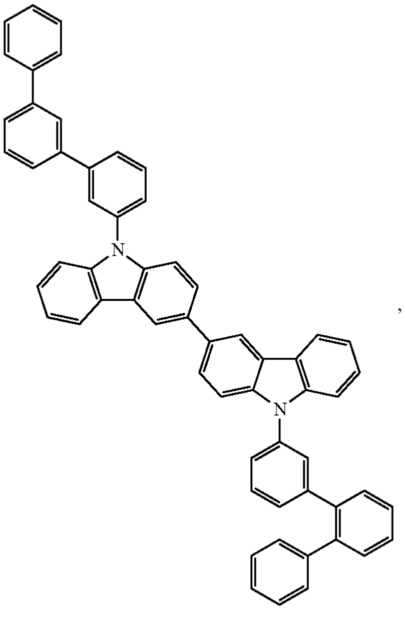
,
-continued
X-146
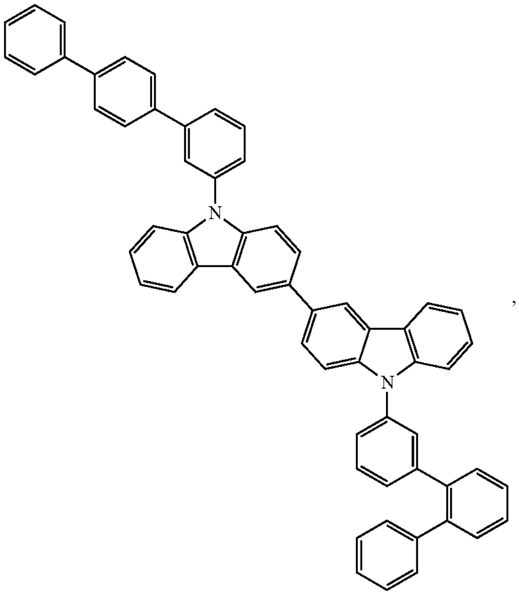
,
X-147
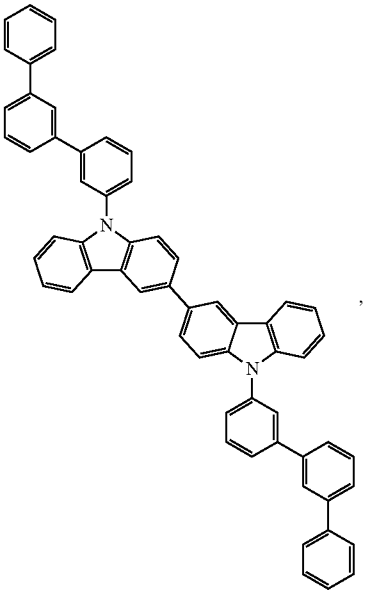
, -continued

X-148

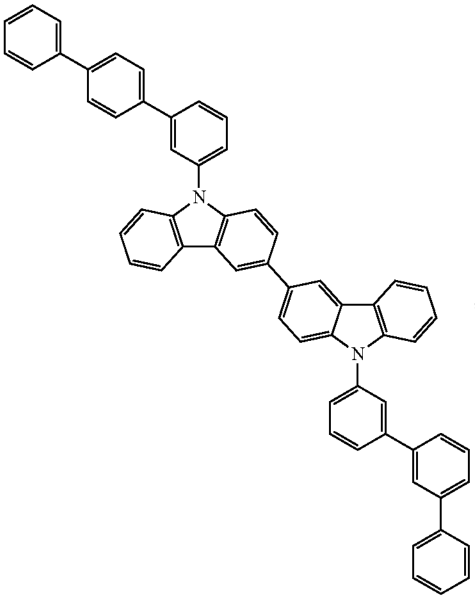

,

X-149

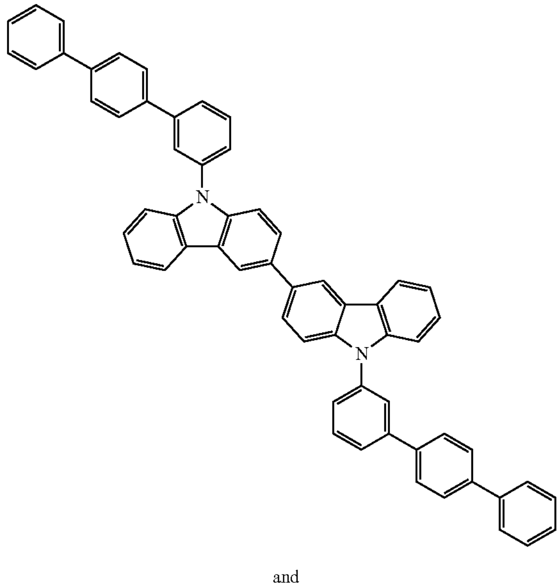

and

-continued

X-150

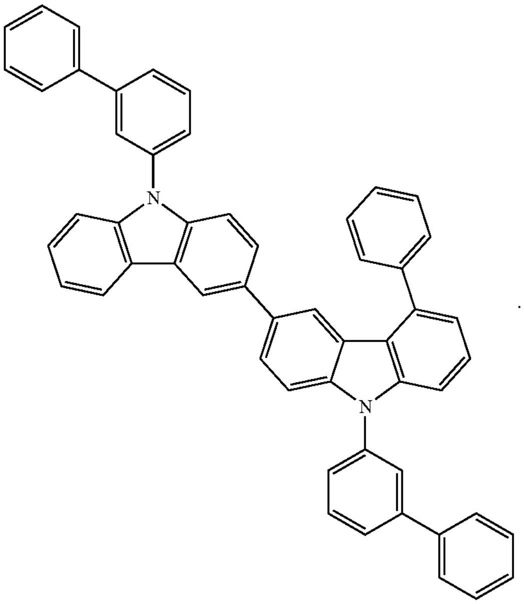

.

35. The metal complex of claim 17, wherein the metal complex has a structure of $Ir(L_a)_2(L_b)$ or $Ir(L_a)(L_b)_2$ or $Ir(L_a)_3$, wherein $L_a$ is, at each occurrence identically or differently, selected from any one, any two or any three of the group consisting of $L_{a1-5}$ to $L_{a1-11}$, $L_{a1-16}$ to $L_{a1-22}$, $L_{a1-27}$ to $L_{a1-33}$, $L_{a1-38}$ to $L_{a1-99}$, $L_{a1-133}$ to $L_{a1-187}$, $L_{a1-221}$ to $L_{a1-275}$, $L_{a1-308}$ to $L_{a1-356}$, $L_{a1-359}$ to $L_{a1-362}$, $L_{a1-395}$, $L_{a1-398}$, $L_{a1-400}$, $L_{a1-414}$ to $L_{a1-419}$, $L_{a1-438}$ to $L_{a1-497}$, $L_{a2-5}$ to $L_{a2-11}$, $L_{a2-16}$ to $L_{a2-22}$, $L_{a2-27}$ to $L_{a2-33}$, $L_{a2-38}$ to $L_{a2-99}$, $L_{a2-133}$ to $L_{a2-187}$, $L_{a2-221}$ to $L_{a2-275}$, $L_{a2-308}$ to $L_{a2-356}$, $L_{a2-359}$ to $L_{a2-362}$, $L_{a2-395}$, $L_{a2-398}$, $L_{a2-400}$, $L_{a2-414}$ to $L_{a2-419}$, $L_{a2-438}$ to $L_{a2-485}$, $L_{a3-5}$ to $L_{a3-11}$, $L_{a3-16}$ to $L_{a3-22}$, $L_{a3-27}$ to $L_{a3-33}$, $L_{a3-38}$ to $L_{a3-99}$, $L_{a3-133}$ to $L_{a3-187}$, $L_{a3-221}$ to $L_{a3-275}$, $L_{a3-308}$ to $L_{a3-356}$, $L_{a3-359}$ to $L_{a3-362}$, $L_{a3-395}$, $L_{a3-398}$, $L_{a3-400}$, $L_{a3-414}$ to $L_{a3-419}$, $L_{a3-438}$ to $L_{a3-485}$, $L_{a4-1}$ to $L_{a4-210}$, $L_{a4-213}$ to $L_{a4-217}$ and $L_{a4-220}$ to $L_{a4-224}$, and $L_b$ is selected from any one or any two of the group consisting of $L_{b1}$ to $L_{b329}$.

36. The metal complex of claim 18, wherein the metal complex has a structure of $Ir(L_a)_2(L_c)$ or $Ir(L_a)(L_c)_2$, wherein $L_a$ is, at each occurrence identically or differently, selected from any one or any two of the group consisting of $L_{a1-5}$ to $L_{a1-11}$, $L_{a1-16}$ to $L_{a1-22}$, $L_{a1-27}$ to $L_{a1-33}$, $L_{a1-38}$ to $L_{a1-99}$, $L_{a1-133}$ to $L_{a1-187}$, $L_{a1-221}$ to $L_{a1-275}$, $L_{a1-308}$ to $L_{a1-356}$, $L_{a1-359}$ to $L_{a1-362}$, $L_{a1-395}$, $L_{a1-398}$, $L_{a1-400}$, $L_{a1-414}$ to $L_{a1-419}$, $L_{a1-438}$ to $L_{a1-497}$, $L_{a2-5}$ to $L_{a2-11}$, $L_{a2-16}$ to $L_{a2-22}$, $L_{a2-27}$ to $L_{a2-33}$, $L_{a2-38}$ to $L_{a2-99}$, $L_{a2-133}$ to $L_{a2-187}$, $L_{a2-221}$ to $L_{a2-275}$, $L_{a2-308}$ to $L_{a2-356}$, $L_{a2-359}$ to $L_{a2-362}$, $L_{a2-395}$, $L_{a2-398}$, $L_{a2-400}$, $L_{a2-414}$ to $L_{a2-419}$, $L_{a2-438}$ to $L_{a2-485}$, $L_{a3-5}$ to $L_{a3-11}$, $L_{a3-16}$ to $L_{a3-22}$, $L_{a3-27}$ to $L_{a3-33}$, $L_{a3-38}$ to $L_{a3-99}$, $L_{a3-133}$ to $L_{a3-187}$, $L_{a3-221}$ to $L_{a3-275}$, $L_{a3-308}$ to $L_{a3-356}$, $L_{a3-359}$ to $L_{a3-362}$, $L_{a3-395}$, $L_{a3-398}$, $L_{a3-400}$, $L_{a3-414}$ to $L_{a3-419}$, $L_{a3-438}$ to $L_{a3-485}$, $L_{a4-1}$ to $L_{a4-210}$, $L_{a4-213}$ to $L_{a4-217}$ and $L_{a4-220}$ to $L_{a4-224}$, and $L_c$ is selected from any one or any two of the group consisting of $L_{c1}$ to $L_{c360}$.

37. The metal complex of claim 18, wherein the metal complex has a structure of $Ir(L_a)(L_b)(L_c)$, wherein $L_a$ is, at each occurrence identically or differently, selected from any one of the group consisting of $L_{a1-5}$ to $L_{a1-11}$, $L_{a1-16}$ to $L_{a1-22}$, $L_{a1-27}$ to $L_{a1-33}$, $L_{a1-38}$ to $L_{a1-99}$, $L_{a1-133}$ to $L_{a1-187}$, $L_{a1-221}$ to $L_{a1-275}$, $L_{a1-308}$ to $L_{a1-356}$, $L_{a1-359}$ to $L_{a1-362}$, $L_{a1-395}$, $L_{a1-398}$, $L_{a1-400}$, $L_{a1-414}$ to $L_{a1-419}$, $L_{a1-438}$ to $L_{a1-497}$, $L_{a2-5}$ to $L_{a2-11}$, $L_{a2-16}$ to $L_{a2-22}$, $L_{a2-27}$ to $L_{a2-33}$, $L_{a2-38}$ to $L_{a2-99}$, $L_{a2-133}$ to $L_{a2-187}$, $L_{a2-221}$ to $L_{a2-275}$, $L_{a2-308}$ to $L_{a2-356}$, $L_{a2-359}$ to $L_{a2-362}$, $L_{a2-395}$, $L_{a2-398}$, $L_{a2-400}$, $L_{a2-414}$ to $L_{a2-419}$, $L_{a2-438}$ to $L_{a2-485}$, $L_{a3-5}$ to $L_{a3-11}$, $L_{a3-16}$ to $L_{a3-22}$, $L_{a3-27}$ to $L_{a3-33}$, $L_{a3-38}$ to $L_{a3-99}$, $L_{a3-133}$ to $L_{a3-187}$, $L_{a3-221}$ to $L_{a3-275}$, $L_{a3-308}$ to $L_{a3-356}$, $L_{a3-359}$ to $L_{a3-362}$, $L_{a3-395}$, $L_{a3-398}$, $L_{a3-400}$, $L_{a3-414}$ to $L_{a3-419}$, $L_{a3-438}$ to $L_{a3-485}$, $L_{a4-1}$ to $L_{a4-210}$, $L_{a4-213}$ to $L_{a4-217}$ and $L_{a4-220}$ to $L_{a4-224}$, $L_b$ is selected from any one of the group consisting of $L_{b1}$ to $L_{b329}$, and $L_c$ is selected from any one of the group consisting of $L_{c1}$ to $L_{c360}$.

* * * * *